US007220365B2

(12) United States Patent
Qu et al.

(10) Patent No.: US 7,220,365 B2
(45) **Date of Patent: *May 22, 2007**

(54) DEVICES USING A MEDIUM HAVING A HIGH HEAT TRANSFER RATE

(75) Inventors: YuZhi Qu, San Jose, CA (US); ZhiPeng Qu, Industrial (CN); Jason Chao, San Jose, CA (US); YuFu Li, Industrial (CN); Peng Chen, Industrial (CN); JunHua Yan, Industrial (CN); Hong Yuan Yang, Industrial (CN); Qi Feng Wei, Industrial (CN)

(73) Assignee: New Qu Energy Ltd., Wanchai (HK)

( * ) Notice: Subject to any disclaimer, the term of this patent is extended or adjusted under 35 U.S.C. 154(b) by 840 days.

This patent is subject to a terminal disclaimer.

(21) Appl. No.: 09/928,883

(22) Filed: Aug. 13, 2001

(65) Prior Publication Data

US 2003/0066638 A1 Apr. 10, 2003

(51) Int. Cl.
*C09K 5/14* (2006.01)

(52) U.S. Cl. .................. 252/70; 165/104.15; 165/185; 165/905; 428/34.6; 428/469; 428/470; 428/471; 428/472; 428/699; 428/701; 428/702

(58) Field of Classification Search ................. 252/71; 165/104.15, 185, 905

See application file for complete search history.

(56) References Cited

U.S. PATENT DOCUMENTS 5,542,471 A 8/1996 Dickinson
5,889,769 A 3/1999 Mizuno
5,896,373 A 4/1999 Mitts et al.
5,940,371 A 8/1999 Mitts et al.
6,128,488 A 10/2000 Sauvageot et al.
6,132,823 A 10/2000 Qu
6,230,013 B1 5/2001 Wallentin et al.
6,278,880 B1 8/2001 Sipila et al.
6,301,479 B1 10/2001 Roobol et al.
6,811,720 B2 * 11/2004 Qu ............................ 252/70

FOREIGN PATENT DOCUMENTS

WO WO-03/016044 A2 2/2003
WO WO-03/016044 A3 2/2003
WO WO-03/016811 A2 2/2003
WO WO-03/016811 A3 2/2003

* cited by examiner

*Primary Examiner*—Necholus Ogden
(74) *Attorney, Agent, or Firm*—Morrison & Foerster LLP

(57) ABSTRACT

Disclosed is a heat transfer medium having high heat transfer rate, being useful in even wider fields, simple in structure, easy to made, environmentally sound, and capable of rapidly conducting heat and preserving heat in a highly efficient manner. Further disclosed are a heat transfer surface and a heat transfer element utilizing the heat transfer medium. Further disclosed are applications of the heat transfer element.

276 Claims, 318 Drawing Sheets

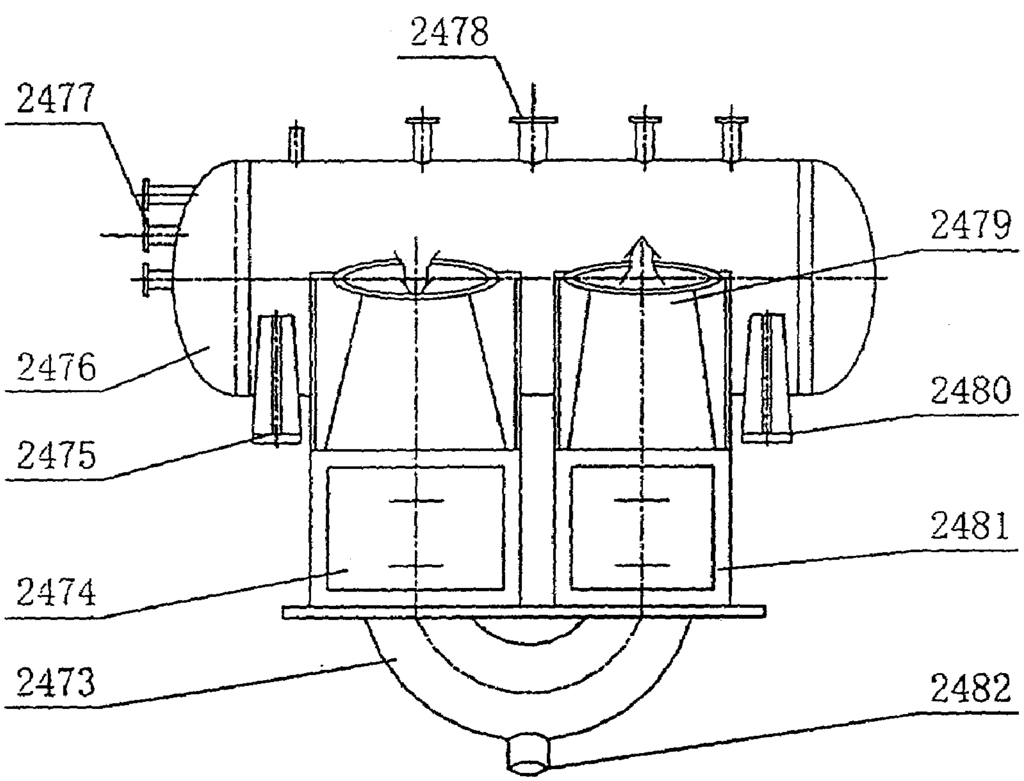
Fig. 5ZNC

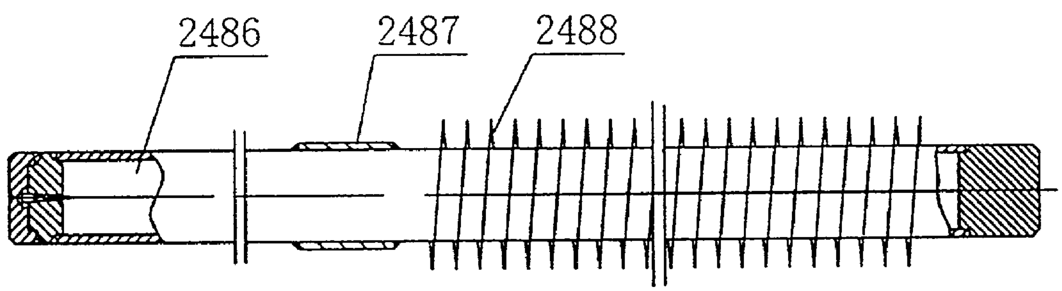
Fig. 5ZND

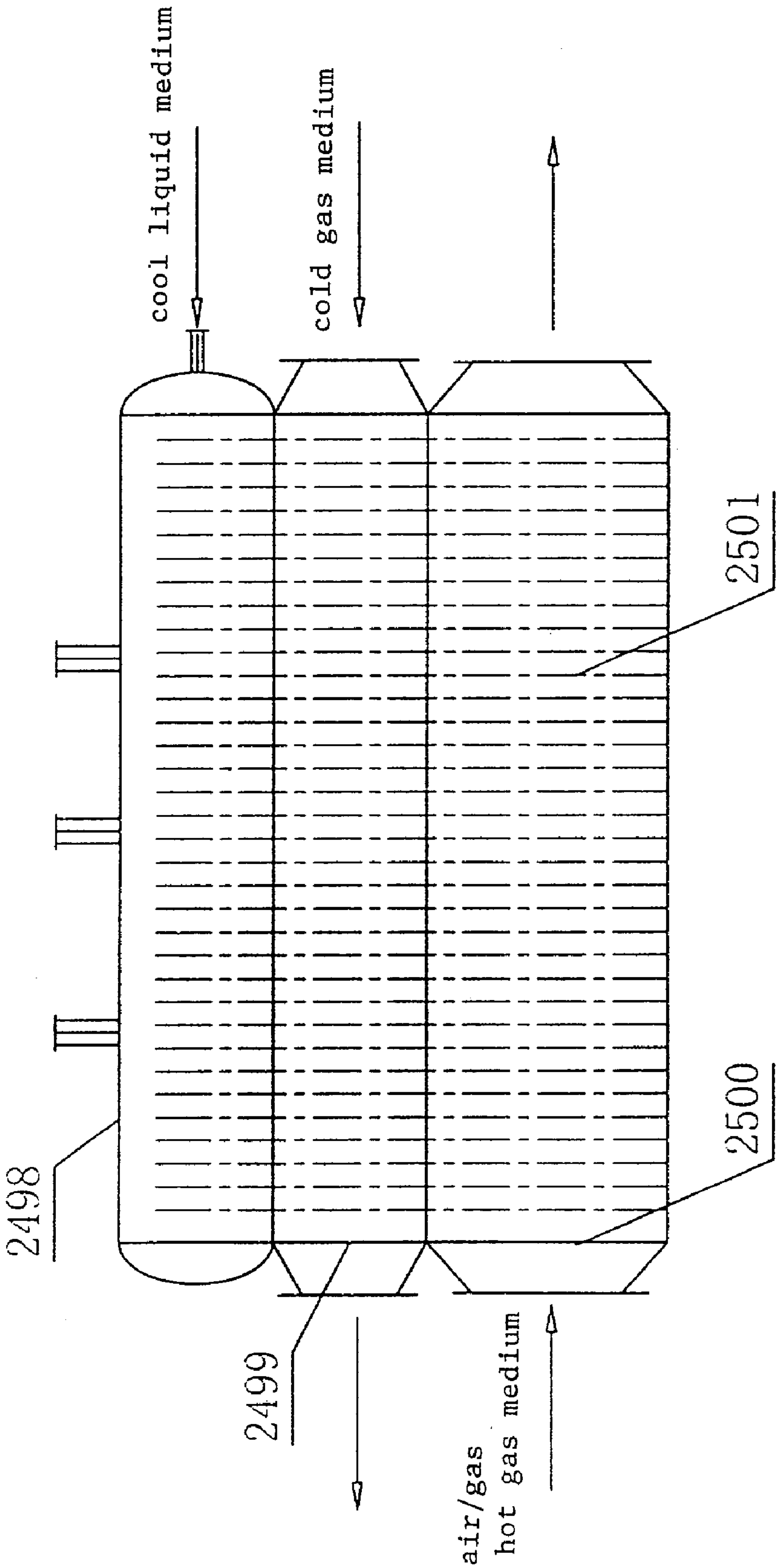
Fig. 5ZNE

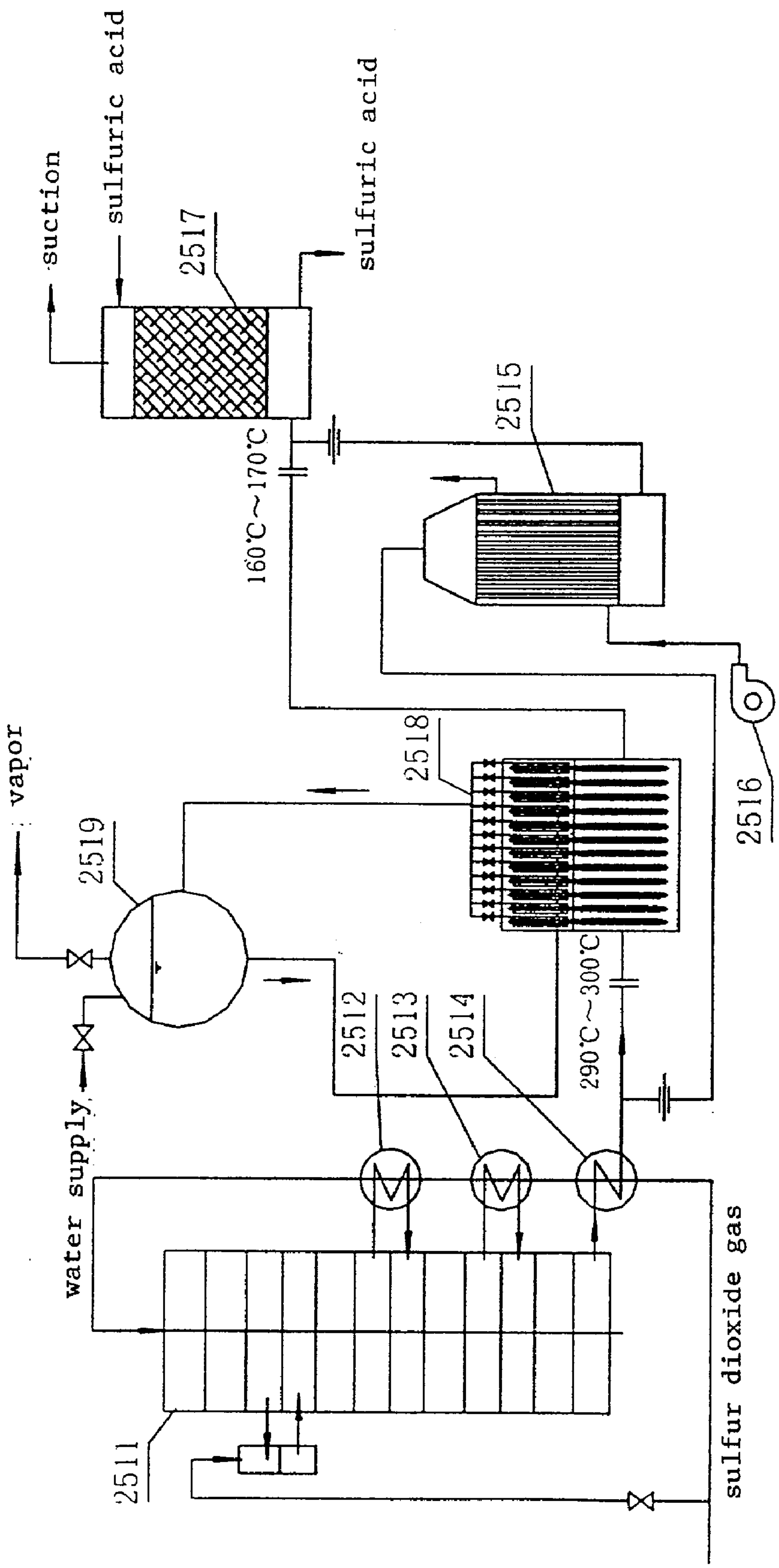
Fig. 5ZNG

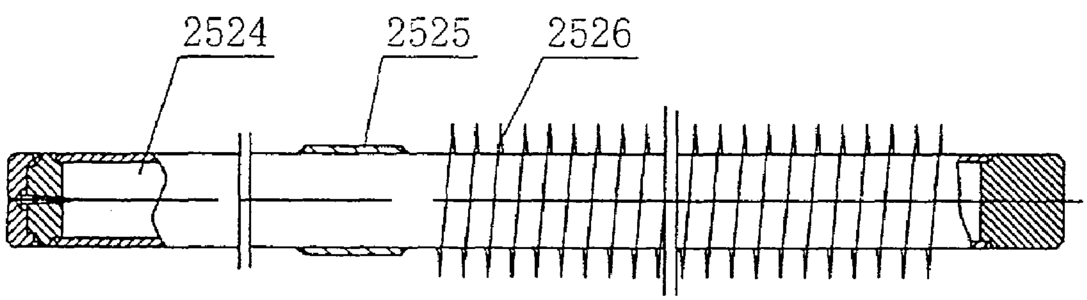
Fig. 5ZNH

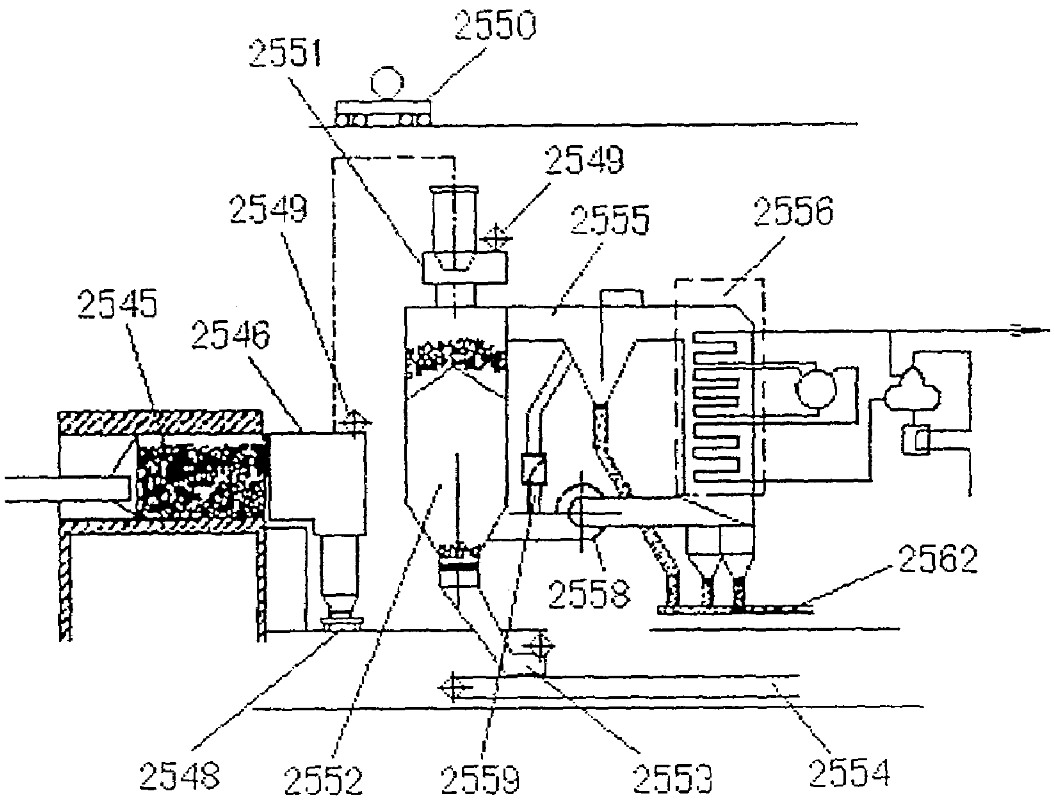
Fig. 5ZNI

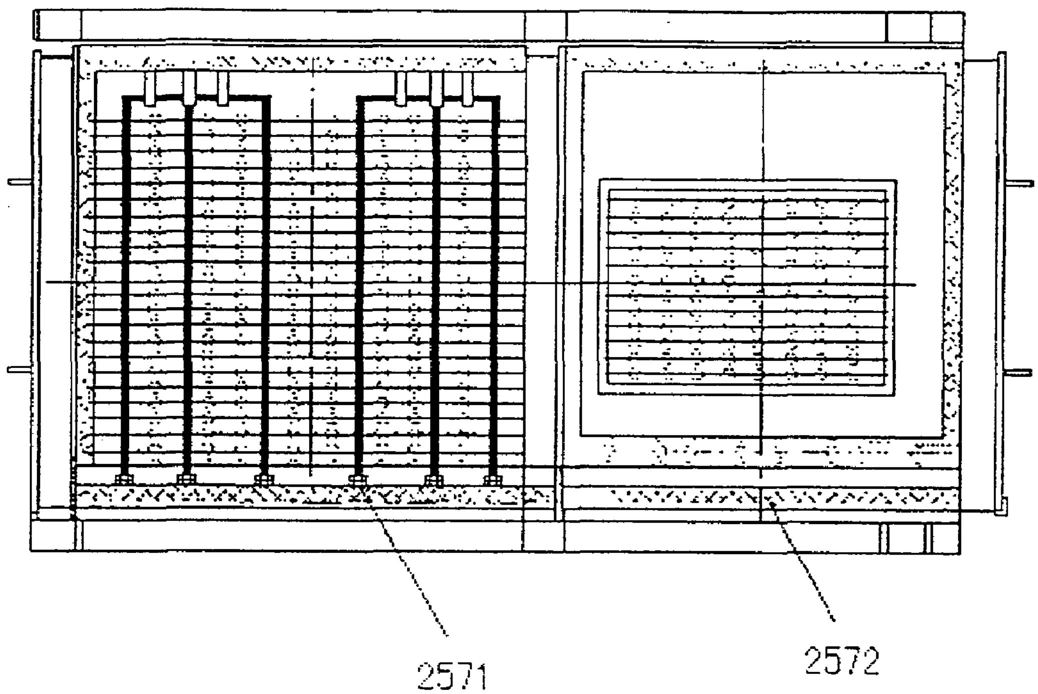
Fig. 5ZNJ

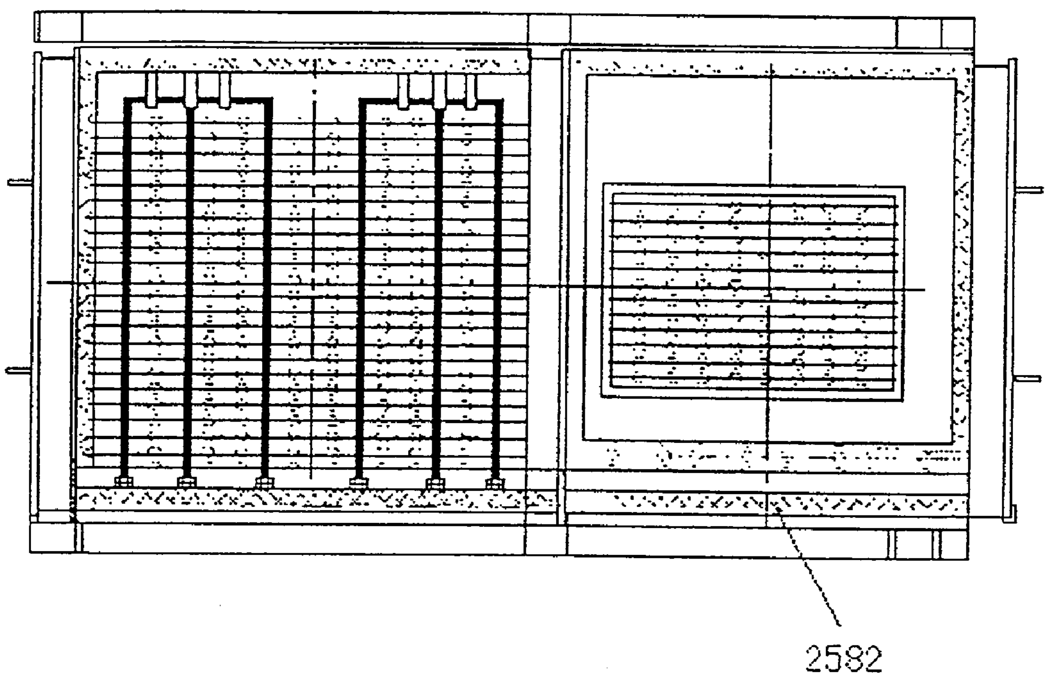
Fig. 5ZNK

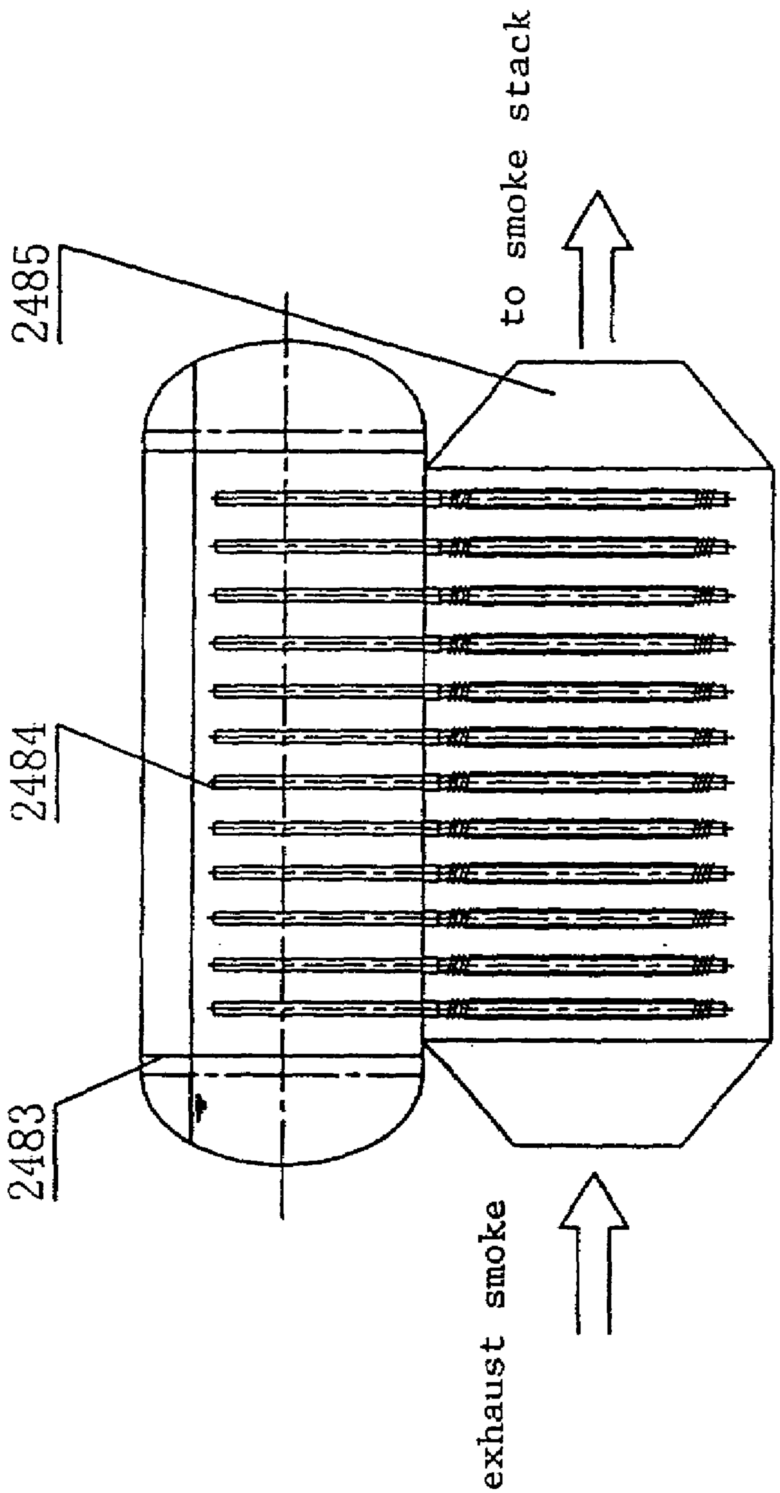
Fig. 5Z0C

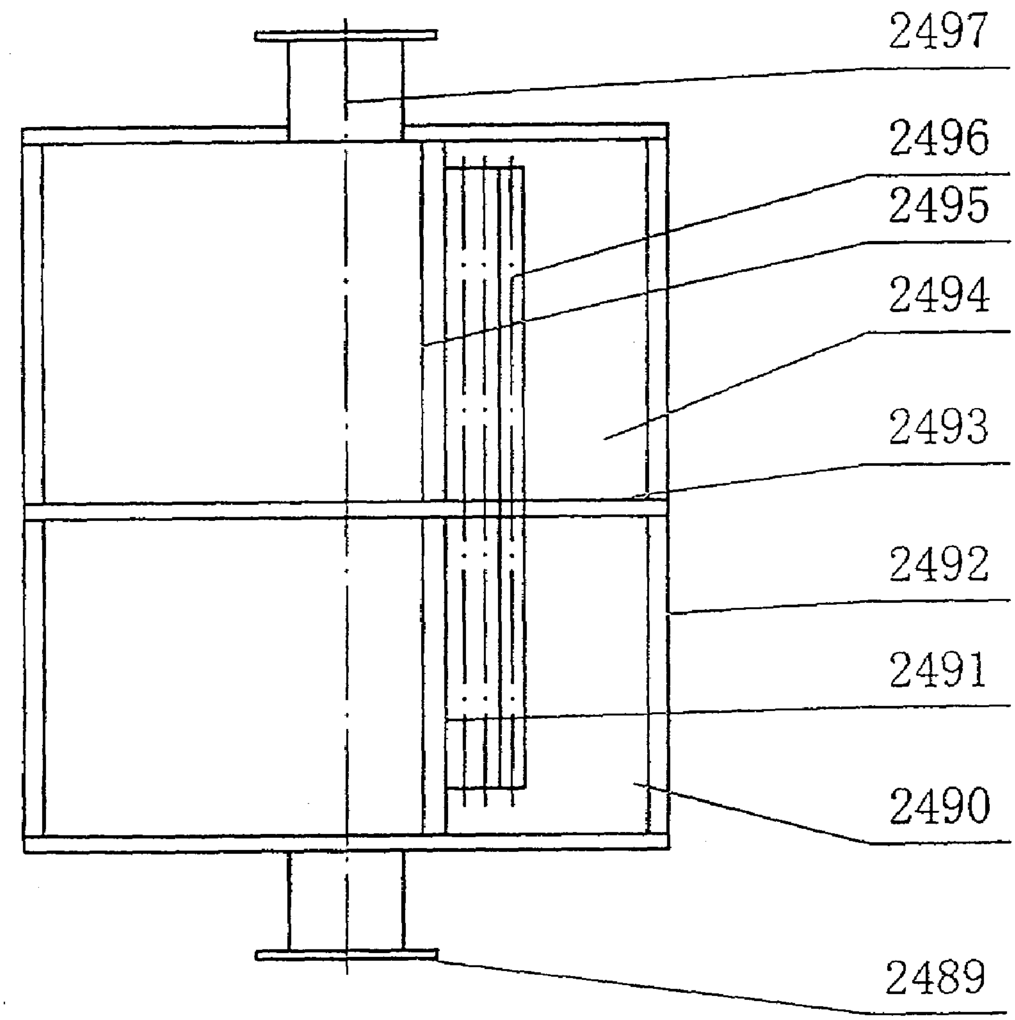
Fig. 5Z0D

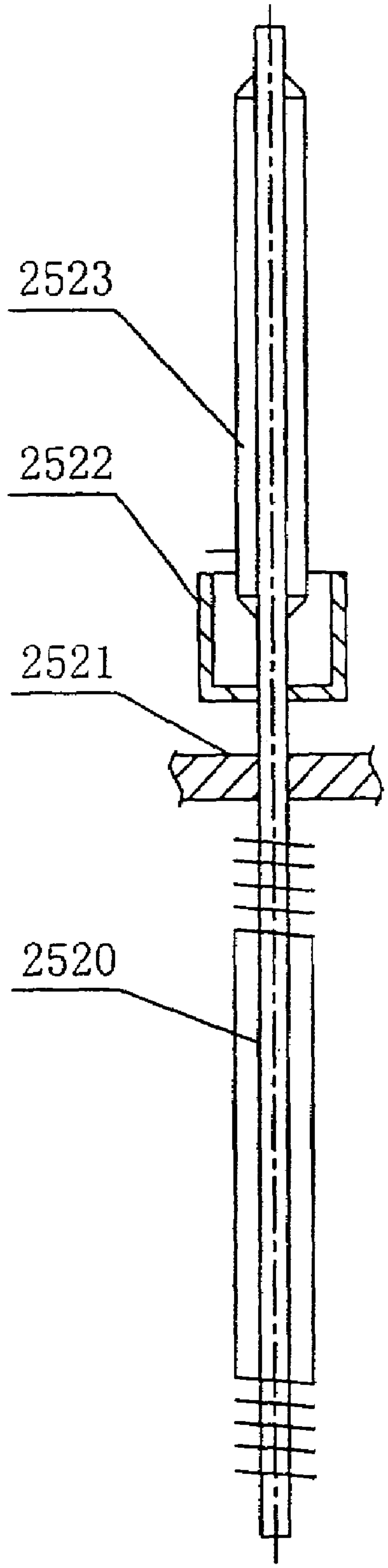
Fig. 5Z0G

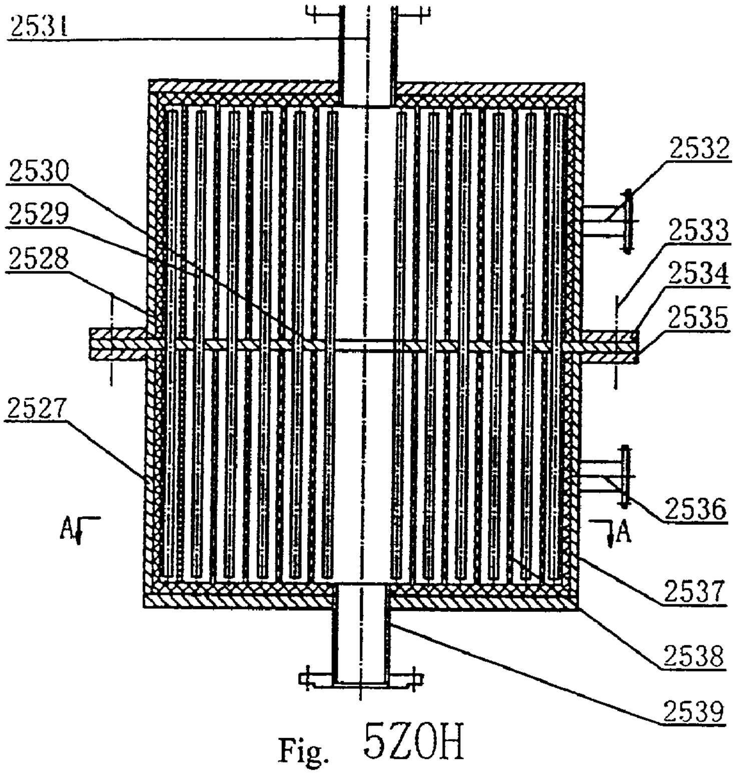
Fig. 5ZOH
A-A
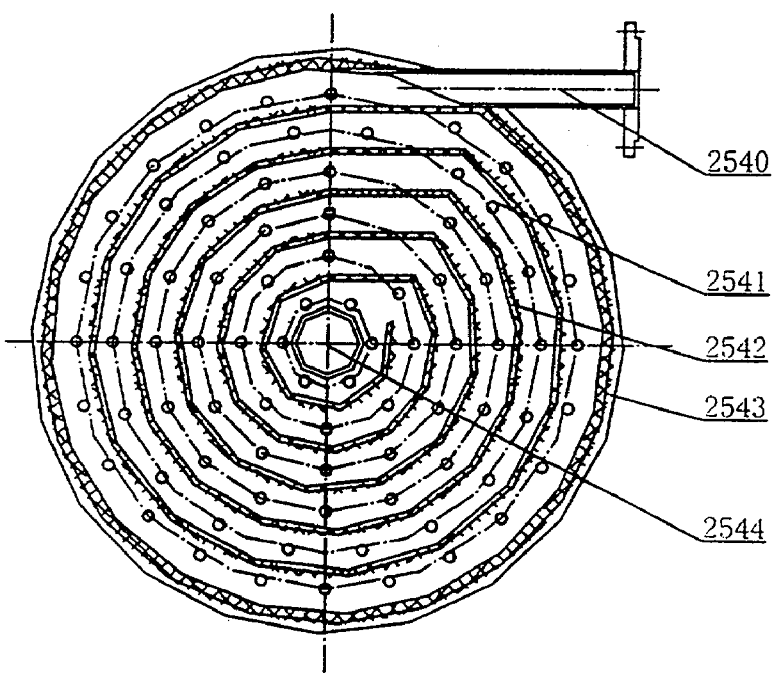
Fig. 5ZPH

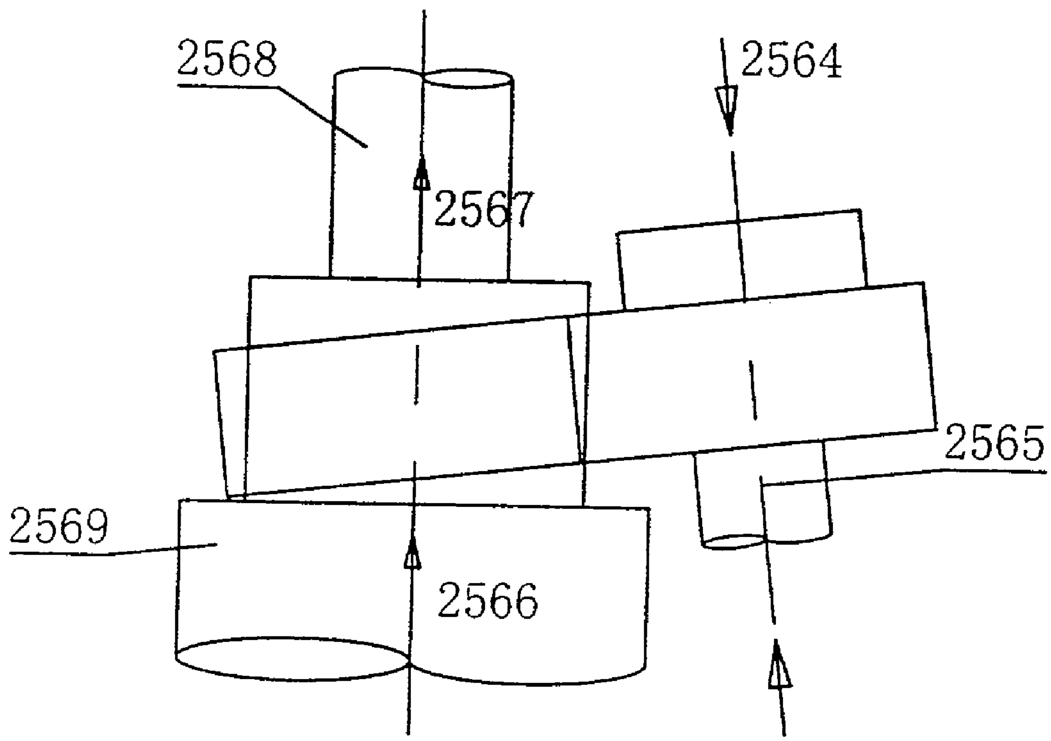
Fig. 5Z0J

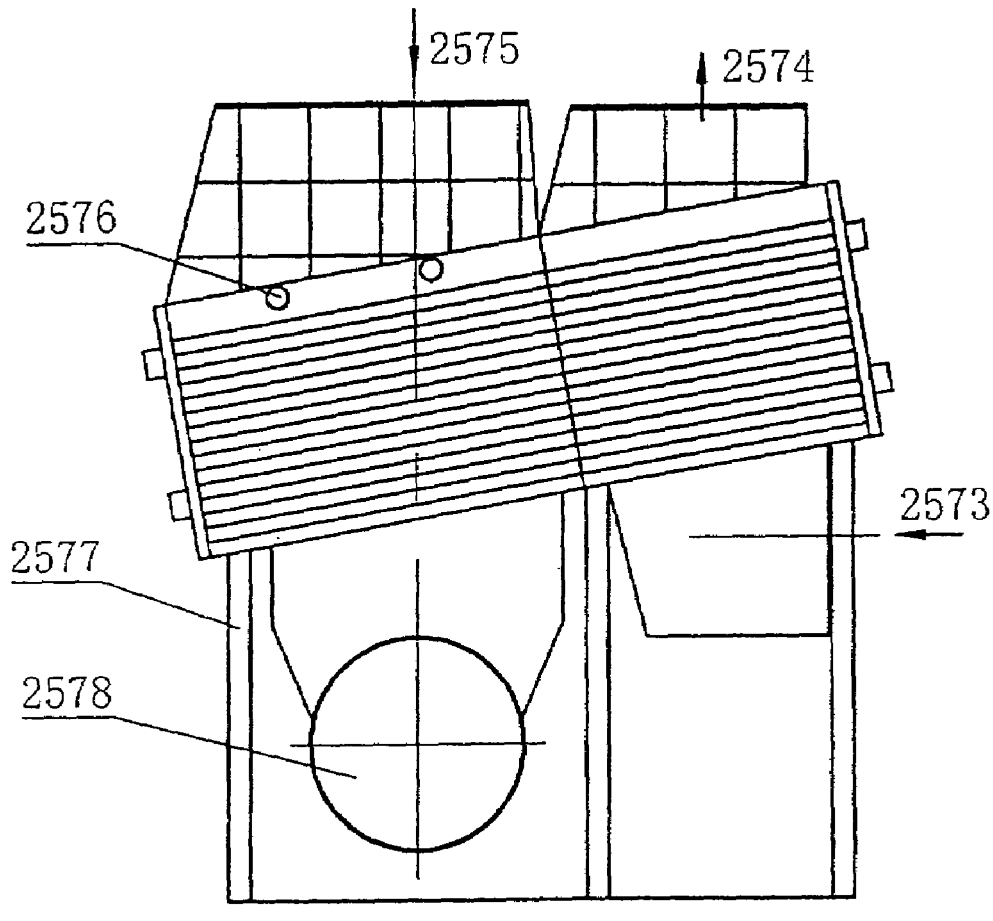
Fig. 5Z0K

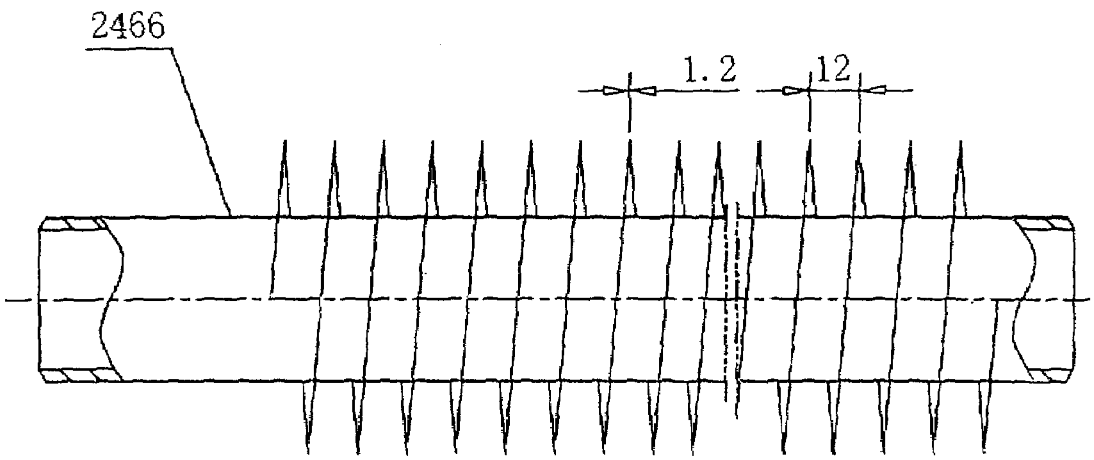
Fig. 5ZPA

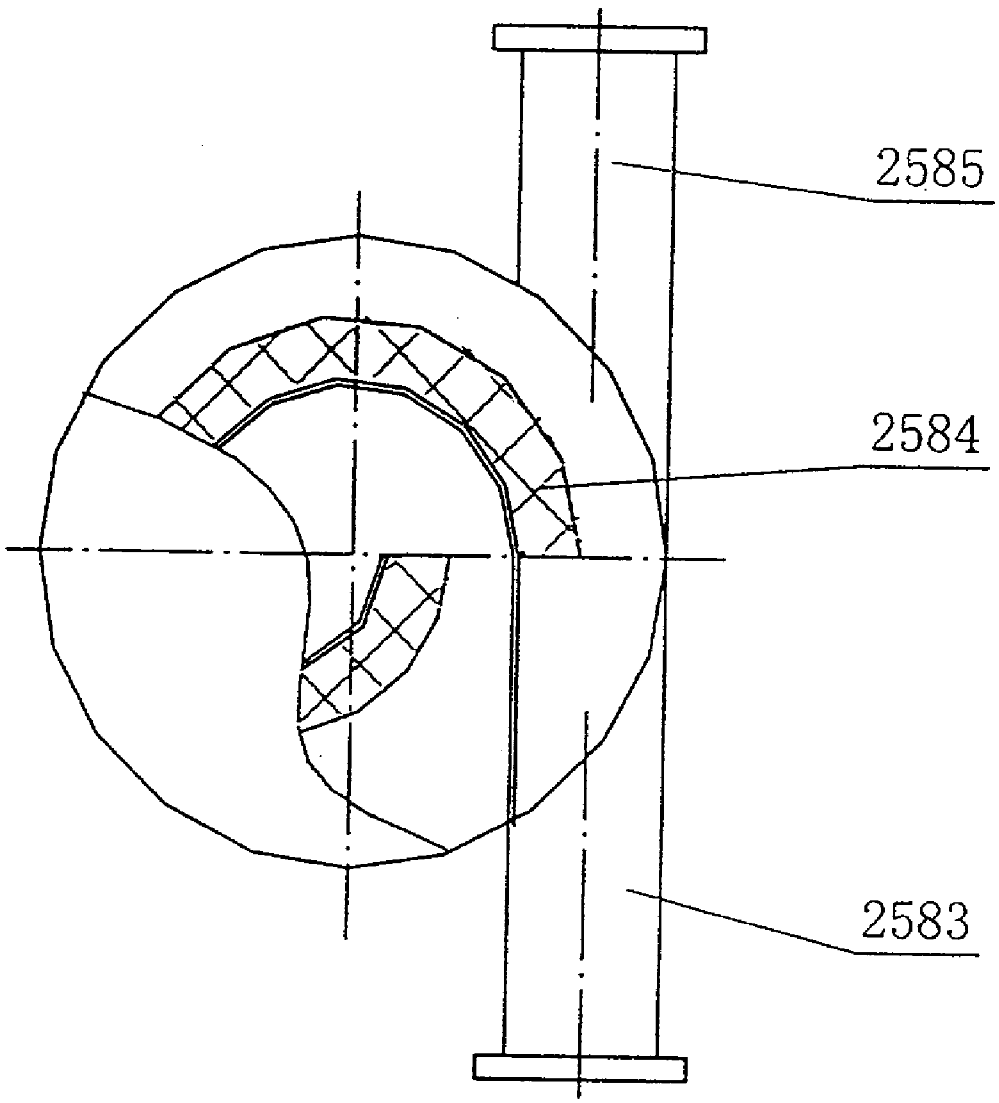
Fig. 5ZPD

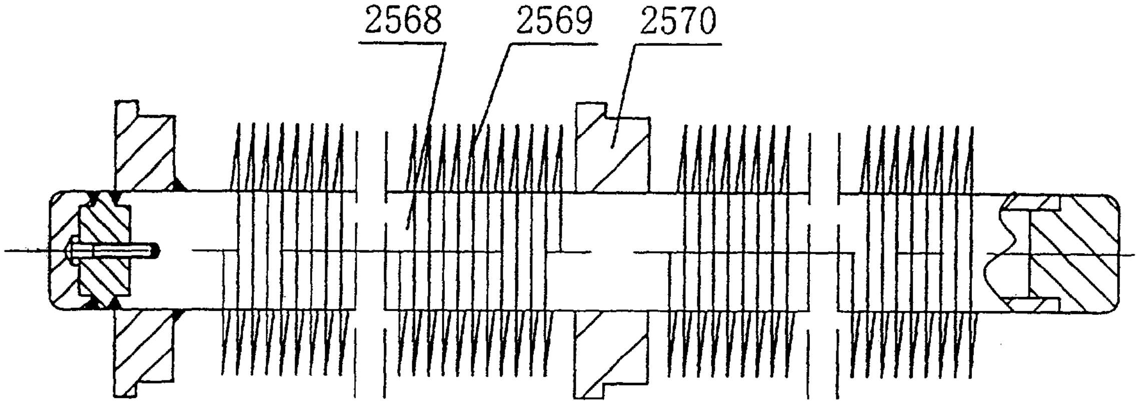
Fig. 5ZPJ

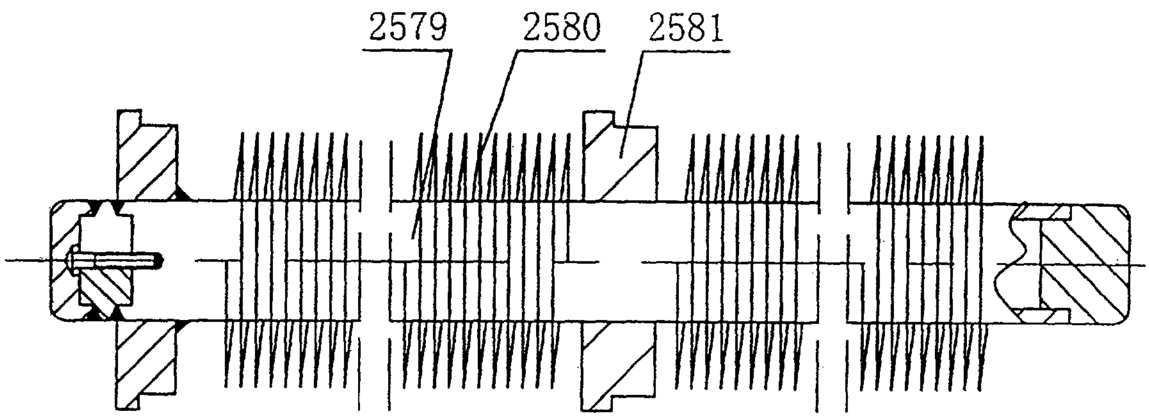
Fig. 5ZPK

A
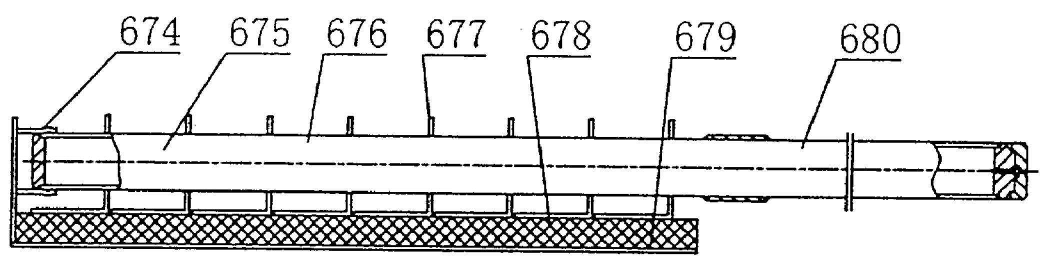
B
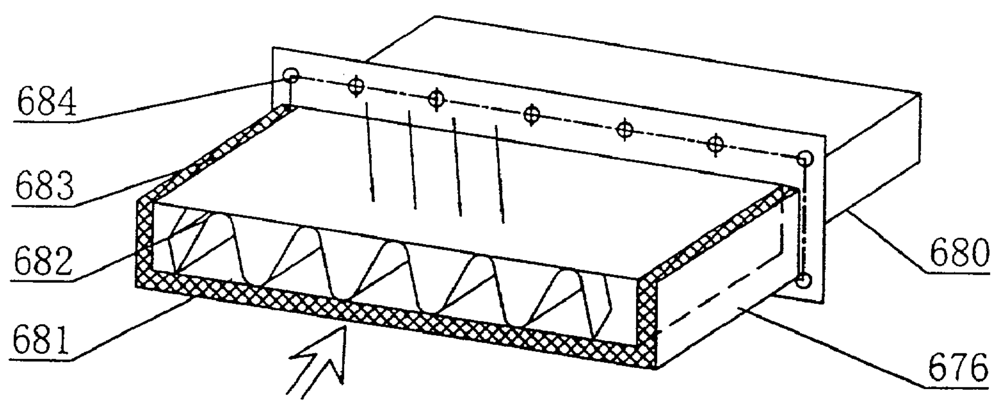
Fig. 60

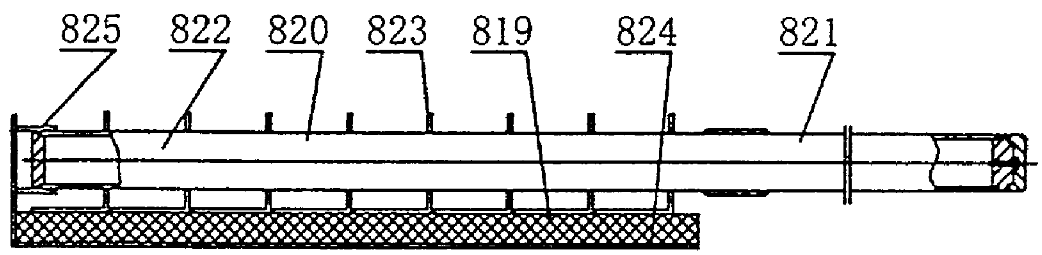
(a)
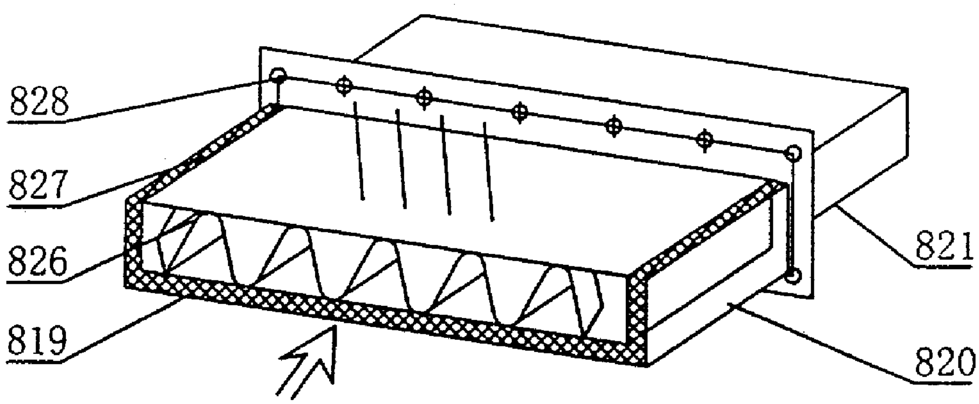
(b)
Fig. 8D

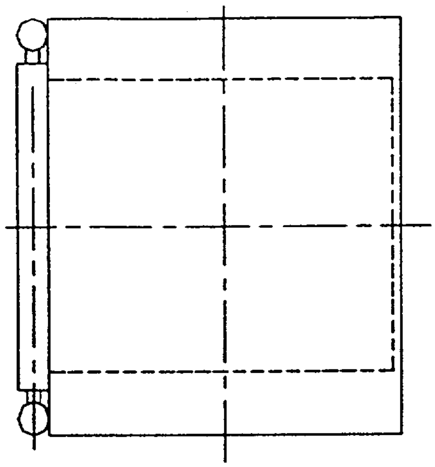
Fig. 12R''
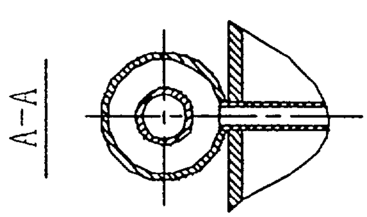
Fig. 12R''''
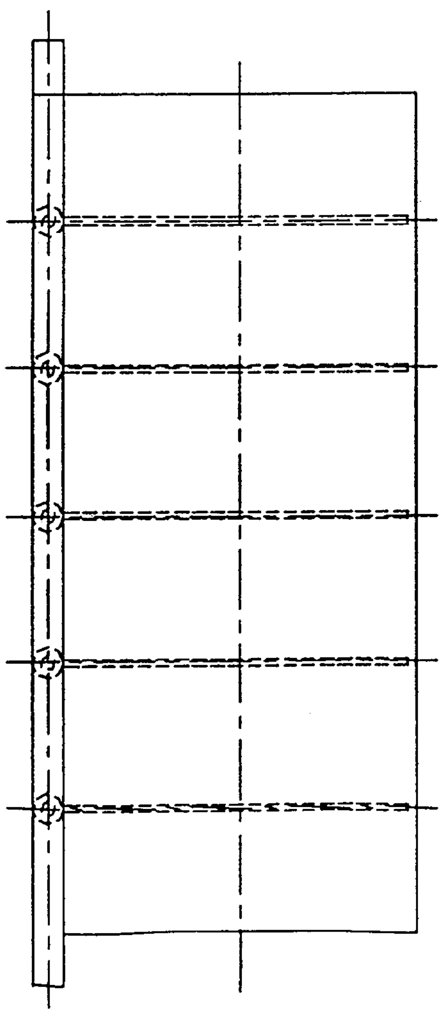
Fig. 12R'
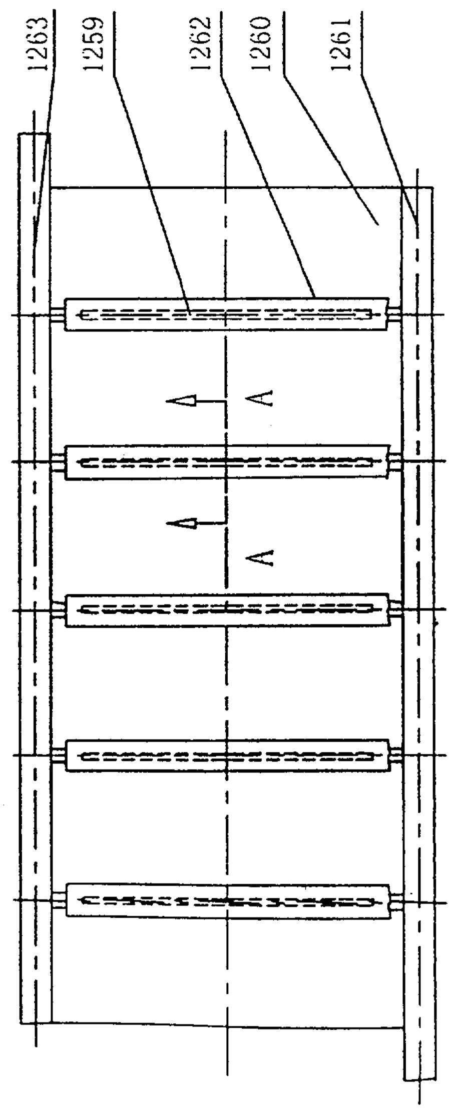
Fig. 12R'''

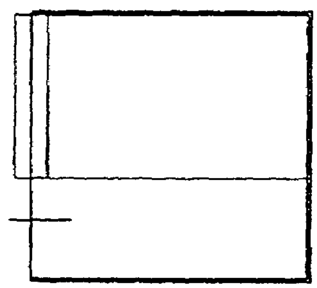
Fig. 12T''
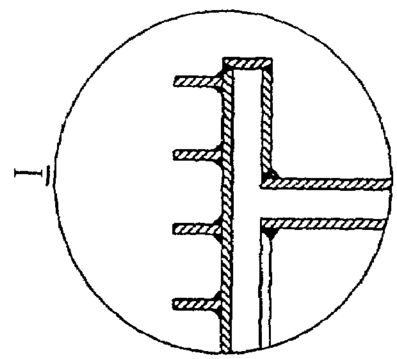
Fig. 12T''''
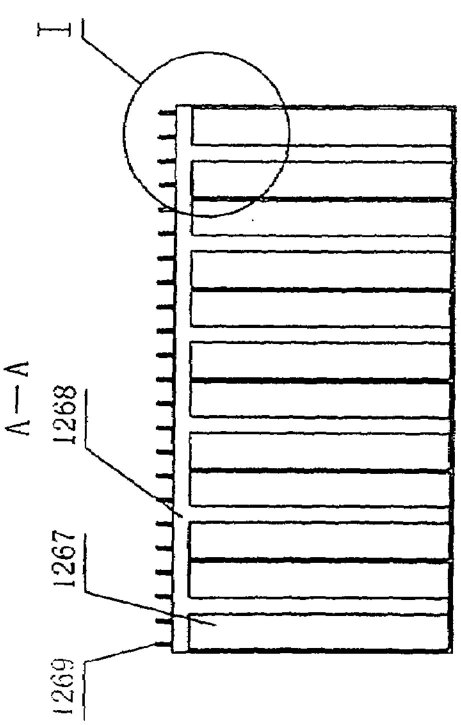
Fig. 12T'
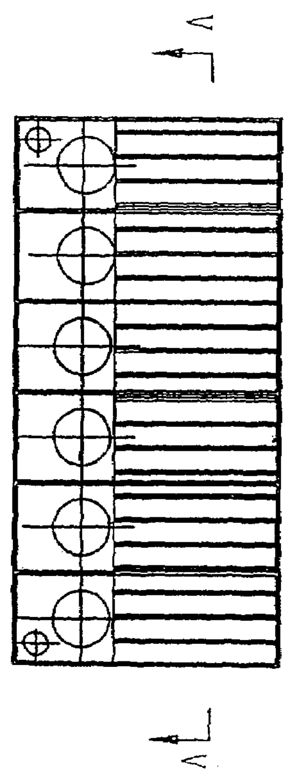
Fig. 12T'''

DEVICES USING A MEDIUM HAVING A HIGH HEAT TRANSFER RATE

BACKGROUND OF THE INVENTION

1. Field of the Invention

The present invention relates to a heat transfer medium with a high heat transfer rate, a heat transfer surface, and a heat transfer element and device using the heat transfer medium.

2. Background of the Invention

Efficiently transporting heat from one location to another always has been a problem. Some applications, such as keeping a semiconductor chip cool, require rapid transfer and removal of heat, while other applications, such as dispersing heat from a furnace, require rapid transfer and retention of heat. Whether removing or retaining heat, the heat transfer abilities of the material utilized define the efficiency of the heat transfer.

For example, it is well known to utilize a heat pipe for heat transfer. The heat pipe operates on the principle of transferring heat through mass transfer of a fluid carrier contained therein and phase change of the carrier from the liquid state to the vapor state within a closed circuit pipe. Heat is absorbed at one end of the pipe by vaporization of the carrier and released at the other end by condensation of the carrier vapor. Although the heat pipe improves thermal transfer efficiency as compared to solid metal rods, the heat pipe requires the circulatory flow of the liquid/vapor carrier and is limited by the association temperatures of vaporization and condensation of the carrier. As a result, the heat pipe's axial heat conductive speed is further limited by the amount of latent heat of liquid vaporization and on the speed of circular transformation between liquid and vapor states. Further, the heat pipe is convectional in nature and suffers from thermal losses, thereby reducing the thermal efficiency. It is generally accepted that when two substances having different temperatures are brought together, the temperature of the warmer substance decreases and the temperature of the cooler substance increases. As the heat travels along a heat-transfer tube from a warm end to a cool end, available heat is lost due to the heat transfer capacity of the tube material, the process of warming the cooler portions of the tube and thermal losses to the atmosphere.

To overcome the intrinsic limit of the materials, the inventor discloses a composition and the method for preparation in U.S. Pat. No. 6,132,823, issued Oct. 17, 2000.

In that Patent, the heat transfer medium was made up of three layers deposited on a substrate. The first two layers were prepared from solutions that are exposed to the inner wall of the tube. The third layer was a powder comprising various combinations. The first layer was placed onto an inner tube surface, the second layer was then placed on top of the first layer to form a film over than inner conduit surface. The third layer was a powder preferably evenly distributed over the inner conduit surface.

The first layer was nominated an anti-corrosion layer to prevent etching of inner conduit surface. The second layer was said to prevent the production of elemental hydrogen and oxygen, thus restraining oxidation between oxygen atoms and the conduit material. The third layer is called the "black powder" layer. It is said that the layer can be activated once it is exposed to thermal activation point 38° C. Thus it is said that removing any of the three layers of the heat transfer medium in the previous patent will cause an adverse impact on heat transfer performance.

In addition, the method for preparing the prior medium was complicated and cumbersome. For instances, formation of the first layer may involve nine chemical compounds prepared in seven steps. Formation of the second layer may involve fourteen compounds prepared in thirteen steps. Formation of the third layer may involve twelve compounds prepared in twelve steps. In addition, if the components of each layer are combined in an order not consistent with the listed sequence and conforming to the exceptions noted in my patent, the solutions made for such preparation were potentially unstable.

Generally, the heat transfer medium used by the present invention eliminates or improves upon many of the noted shortcomings and disadvantages. The preferable heat transfer medium of this invention was made up of one layer deposited on a substrate while the most preferable one is one single layer. The layer was prepared from a group of twelve inorganic compounds selected from the list below and formed in a single layer. The improved medium not only reduces the number and types of compounds used in the medium, but also effectively reduces the number of steps required for the preparation of the medium without compromising heat transfer efficiency.

SUMMARY OF THE INVENTION

In accordance with the present invention and these contemplated problems to be solved, the present invention utilizes a heat transfer medium with a high heat transfer rate that is useful in even wider fields, simple in structure, easy to made, environmentally sound, and rapidly conducts heat and preserves heat in a highly efficient manner.

The heat transfer medium used in the present invention provides, typically in an inorganic nature, which is a composition. The composition comprises or, in the alternative, consists essentially of the following compounds mixed together in the ratios or amounts shown below. The amounts may be scaled up or down as needed to produce a selected amount. Although the compounds are preferably mixed in the order shown, they need not be mixed in that order.

- Cobaltic Oxide ($Co_2O_3$), 0.5%–1.0%, preferably 0.7–0.8%, most preferably 0.723%;
- Boron Oxide ($B_2O_3$), 1.0%–2.0%, preferably 1.4–1.6%, most preferably 1.4472%;
- Calcium Dichromate ($CaCr_2O_7$), 1.0%–2.0%, preferably 1.4–1.6%, most preferably 1.4472%;
- Magnesium Dichromate ($Mg_2Cr_2O_7.6H_2O$), 10.0%–20.0%, preferably 14.0–16.0%, most preferably 14.472%;
- Potassium Dichromate ($K_2Cr_2O_7$), 40.0%–80.0%, preferably 56.0–64.0%, most preferably 57.888%
- Sodium Dichromate ($Na_2Cr_2O_7$), 10.0%–20.0%, preferably 14.0–16.0%, most preferably 14.472%;
- Beryllium Oxide (BeO), 0.05%–0.10%, preferably 0.07–0.08%, most preferably 0.0723%;
- Titanium Diboride ($TiB_2$), 0.5%–1.0%, preferably 0.7–0.8%, most preferably 0.723%;
- Potassium Peroxide ($K_2O_2$), 0.05%–0.10%, preferably 0.07–0.08%, most preferably 0.0723%;
- A selected metal or ammonium Dichromate ($MCr_2O_7$), 5.0%–10.0%, preferably 7.0–8.0%, most preferably 7.23%, where "M" is selected from the group consisting of potassium, sodium, silver, and ammonium.
- Strontium Chromate ($SrCrO_4$), 0.5%–1.0%, preferably 0.7–0.8%, most preferably 0.723%; and,
- Silver Dichromate ($Ag_2Cr_2O_7$), 0.5%–1.0%, preferably 0.7–0.8%, most preferably 0.723%.

The percentages expressed just above are weight percentages of the final composition once the composition has been dried to remove the added water.

The present invention also provides a heat transfer surface comprising a surface substrate covered at least in part by the heat transfer medium with a high heat transfer rate.

The present invention also provides a heat transfer element comprising the heat transfer medium with a high heat transfer rate that is positioned on a substrate.

The present invention also provides applications of the heat transfer element, such as heating element, heat-dissipating (or cooling) element and heat exchange element (i.e. element combining heating and heat-dissipating functions). The elements can be used independently or assembled for a variety of applications such as agriculture & fishery, computers & peripherals, electronic device or electric appliance, medical instruments, everyday necessity, mechanical processing devices, AV apparatus, heat recovery system, energy collection system, machinery and electronic equipment, civil engineering construction, metal fusing equipment, dryers, thermostat and chemical engineering apparatus. Heat sources could be electricity, geothermal energy, solar power, nuclear power and recovered heat. With assistance of liquid or solid media, the heat exchange can be enhanced. The objects and advantages of the present invention will become apparent from the following detailed description of the preferred embodiments thereof in connection with the accompanying drawings, in which like numerals designate like elements, and in which:

BRIEF DESCRIPTION OF THE DRAWINGS

FIG. 1CA shows the basic pipe element with attachments to improve heat exchange efficiency.

FIG. 1CB shows a heat transfer pipe element in cured shape.

FIG. 1CC shows a pipe element in spiral shape according to the present invention.

FIG. 1EA shows a top view of the assembled plate-plate heat transfer pipe elements.

FIG. 1EB shows a side view of the assembled plate-plate heat transfer pipe elements.

FIG. 1I is a plot of the steady-state temperature difference (sensor T° minus ambient T°) for each of the sensors and their mean value versus input power.

FIG. 5AB shows a partial zoom-in view of a heat transfer pipe with high heat transfer rate.

FIG. 5AC shows front and partially cross-sectional views of an air pre-heater with high heat transfer rate.

FIG. 5BB shows partially cross-sectional and zoom-in views along the broken line A—A in FIG. 5BA.

FIG. 5CB shows front and partially cross-sectional views of an integrated air pre-heater with high heat transfer rate.

FIG. 5CC shows a partially zoom-in view of aheat transfer pipe with high heat transfer rate.

FIG. 5EB shows a symmetrical afterheat boiler with high heat transfer rate.

FIG. 5IB shows a stream generator with high heat transfer rate in a cement kiln.

FIG. 5IC shows a water heating system with high heat transfer rate in a cement kiln.

FIG. 5ID shows an air dryer and heater with high heat transfer rate.

FIG. 5IE shows an afterheat boiler with high heat transfer rate for ships.

FIG. 5IF shows a car exhaust heater with high heat transfer rate.

FIG. 5IG shows a seawater distiller for oceangoing vessels with high heat transfer rate.

FIG. 5IH shows a schematic view of a symmetrical afterheat boiler with a steam separator with high heat transfer rate.

FIG. 5II shows a schematic view of a horizontal-pipe type horizontal afterheat boiler with high heat transfer rate.

FIGS. 5IJ shows a schematic drawing of an eccentric afterheat boiler with high heat transfer rate.

FIG. 5IK shows a schematic view of an inorganic high heat transfer symmetrical afterheat boiler.

FIG. 5IL shows a schematic view of the appearance and the whole structure of an electric boiler air pre-heater with high heat transfer rate.

FIG. 5IM shows a partially cross-sectional view of a boiler fuel heating system with high heat transfer rate in power plant.

FIG. 5IN shows a partially cross-sectional view of aheater with high heat transfer rate in the power plant boiler.

FIG. 5JE shows a schematic view of an afterheat boiler with high heat transfer rate for ships.

FIG. 5JF is a sectional view of a car exhaust heater with high heat transfer rate.

FIG. 5JG shows a high heat transfer rate pipe.

FIG. 5JI shows a schematic view of a vertical-pipe horizontal afterheat boiler with high heat transfer rate.

FIG. 5JM shows schematic front and partially cross-sectional views of a fuel heating system with high heat transfer rate in power plant boiler.

FIG. 5JN shows schematic front and partially cross-sectional views of a water heater with high heat transfer rate in the power plant boiler.

FIG. 5KM shows a schematic view of a high heat transfer rate tube bank.

FIG. 5KN shows an inorganic high heat transfer tube bank.

FIG. 5QB shows a heating system with the afterheat water heater according to the present invention.

FIG. 5QC shows a schematic front view of a high heat transfer rate air pre-heater according to the present invention.

FIG. 5QD shows a schematic front view of a dual gas heater with the high heat transfer rate element according to the present invention.

FIG. 5RB shows another schematic view of an afterheat boiler with the high heat transfer rate element according to the present invention, which is also used in magnesium plants.

FIG. 5RC shows a schematic view of an afterheat boiler for the sintering machine with the high heat transfer rate element according to the present invention.

FIG. 5UB shows the structure of the high heat transfer rate element shown in FIG. 5UA.

FIG. 5ZA shows front and cross-sectional views of an air re-heater with high heat transfer rate according to the propane de-asphalt furnace of the present invention.

FIG. 5ZB shows a front view of an air re-heater of the molecular screen de-wax carrier furnace.

FIG. 5ZC shows a schematic view of an air pre-heater with high heat transfer rate in a chemical fertilizer manufacturing system.

FIG. 5ZD shows a schematic view of an air pre-heater with high heat transfer rate in a platinum resetting heater.

FIG. 5ZE shows a schematic view of an air pre-heater with high heat transfer rate in an Arene device constant depressurizing carrier furnace.

FIG. 5ZF shows a gas sensible heat device adopting a coke furnace lift pipe with high heat transfer rate element according to the present invention.

FIG. 5ZG shows a high heat transfer rate recovery device installed on the continuous casting billet cold table of a continuous casting machine in the steel plant.

FIG. 5ZH shows a schematic view of an air pre-heater with high heat transfer rate in a glass kiln.

FIG. 5ZJ shows a schematic view of an air pre-heater with high heat transfer rate installed on the top of a crude oil heater.

FIG. 5ZK shows a schematic view of an air pre-heater with high heat transfer rate in a stream instilling boiler.

FIG. 5ZL shows a schematic view of a water pre-heater with high heat transfer rate in a stream instilling boiler.

FIG. 5ZM shows a schematic view of an afterheat boiler with high heat transfer rate in a heating furnace.

FIG. 5ZNA shows a schematic view of the structure of an anti-dew-point corrosion air pre-heater with high heat transfer rate.

FIG. 5ZNB shows a soft water boiler system with high heat transfer rate.

FIG. 5ZNC shows a bridge double channel afterheat recovery device with high heat transfer rate.

FIG. 5ZND shows a schematic view of a high heat transfer rate pipe.

FIG. 5ZHE shows a schematic view of an air-air/air-liquid combined heat exchanger with high heat transfer rate.

FIG. 5ZNF is a schematic workflow of asynthetic ammonia technique gas afterheat recovery device with high heat transfer rate.

FIG. 5ZNG shows the workflow of a sulfur trioxide heat exchanger.

FIG. 5ZNH shows a schematic view of a high heat transfer rate pipe.

FIG. 5ZNI shows a schematic view of a recovery technology with high heat transfer rate used in dry coke technique.

FIG. 5ZNJ shows schematic top and partially cross-sectional views of a combined air pre-heater in a constant depressurizing furnace.

FIG. 5ZNK shows schematic top and partially cross-sectional views of a combined air pre-heater in a constant depressurizing furnace.

FIG. 5ZOA shows a schematic view of the appearance and the whole structure of a heat pipe of an anti-dew-point corrosion air pre-heater with high heat transfer rate.

FIG. 5ZOB is a high heat transfer rate element in a soft water heater.

Figure 5A:
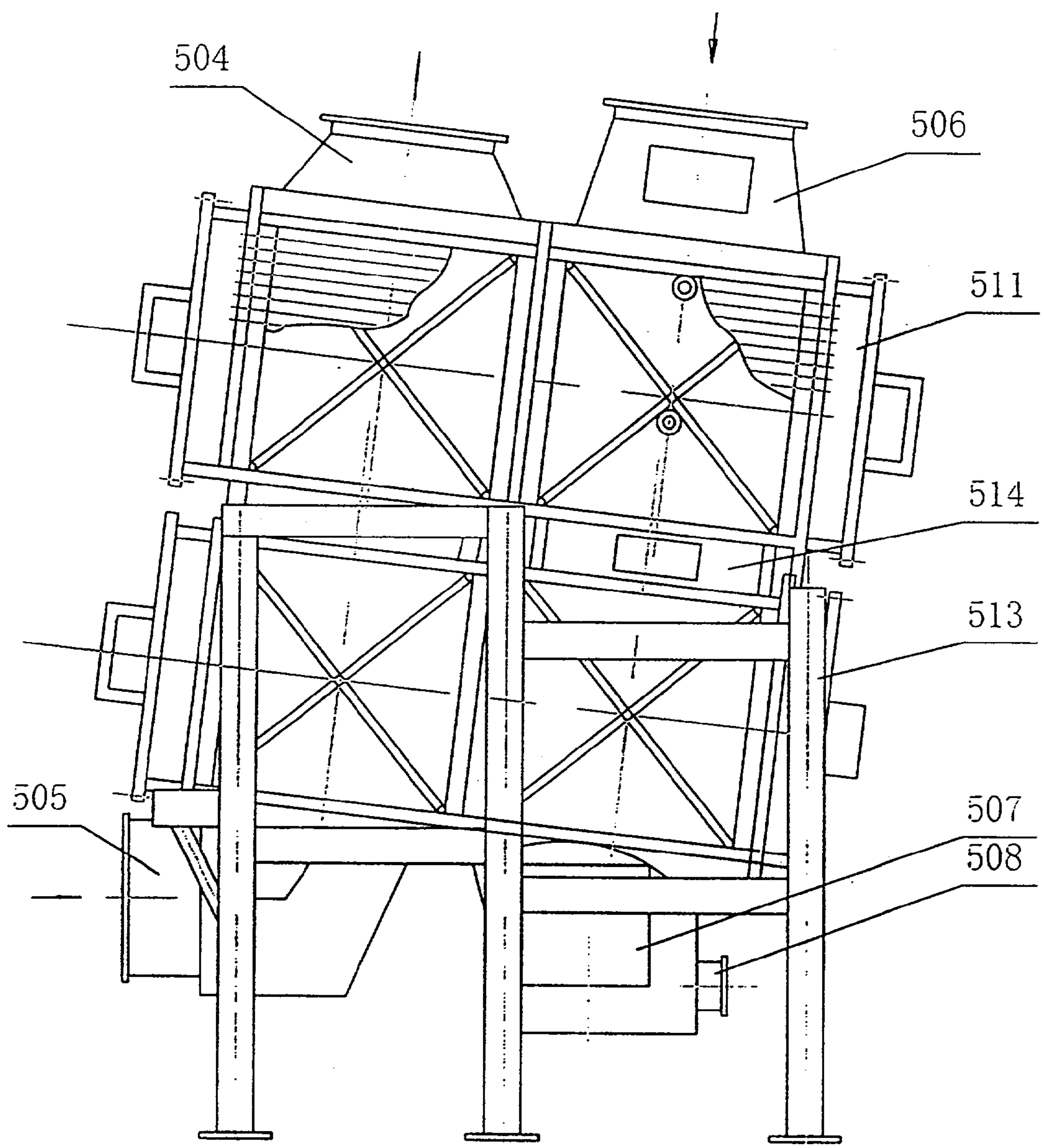
FIG. 5AA shows top and partially cross-sectional views of an air pre-heater with high heat transfer rate.
Figure 5A:
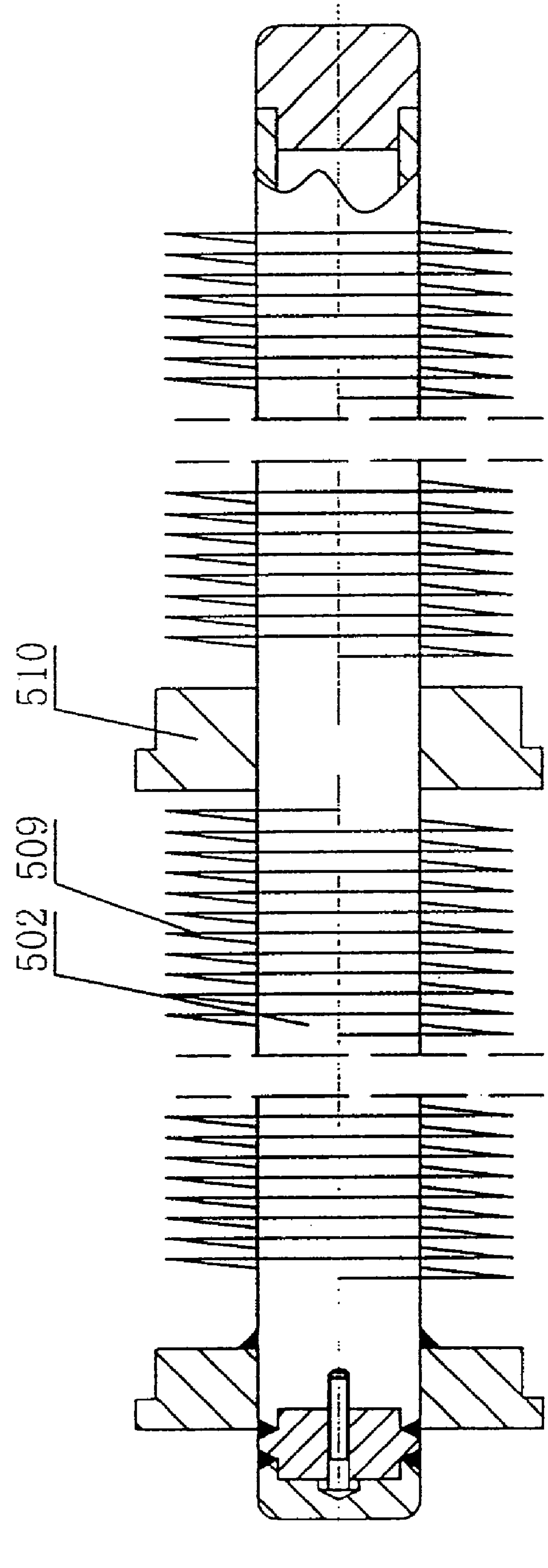
Figure 5A:
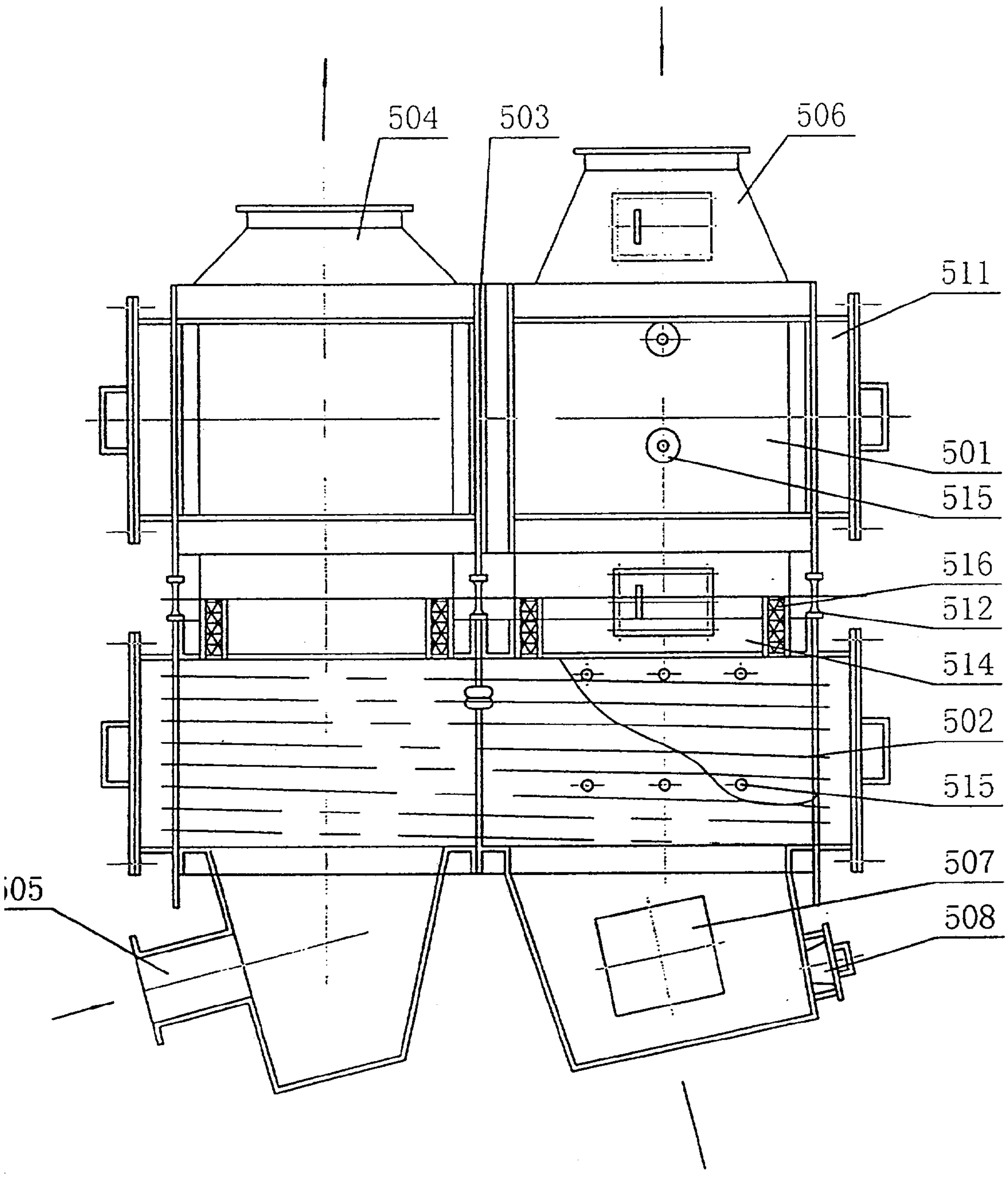
Figure 5B:
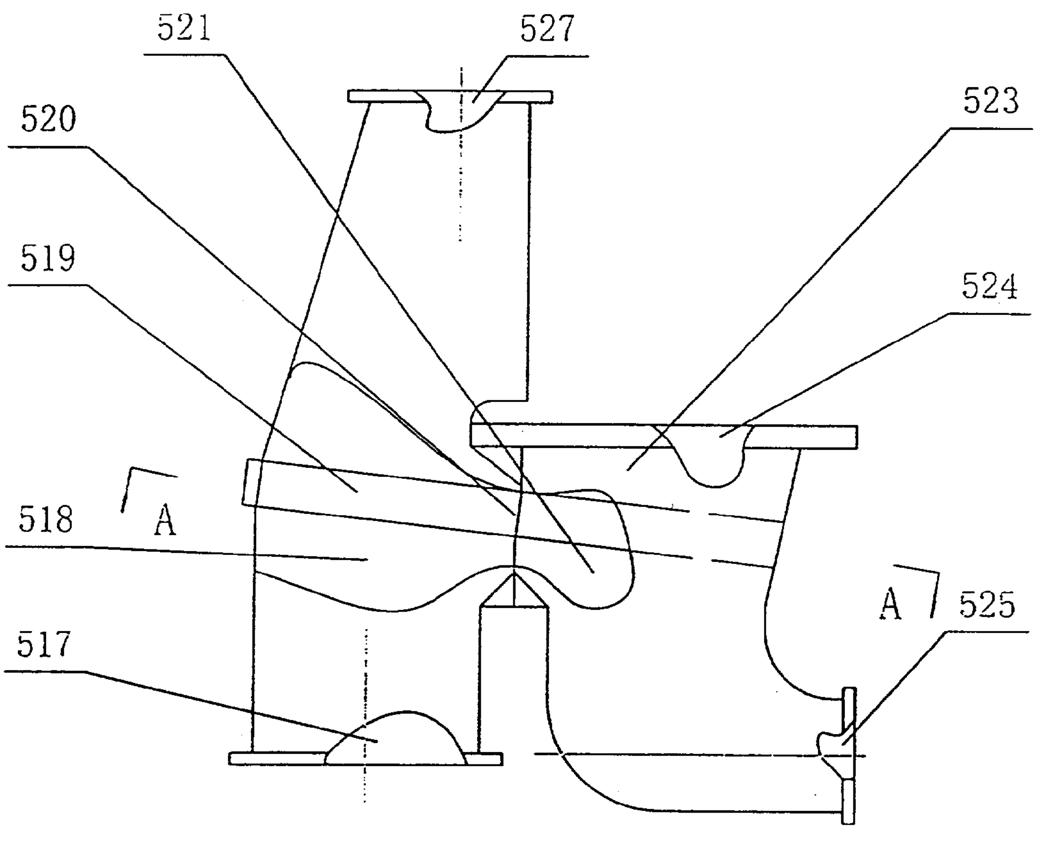
FIG. 5BA shows an appearance of an air pre-heater with high heat transfer rate in a coke furnace.
Figure 5B:
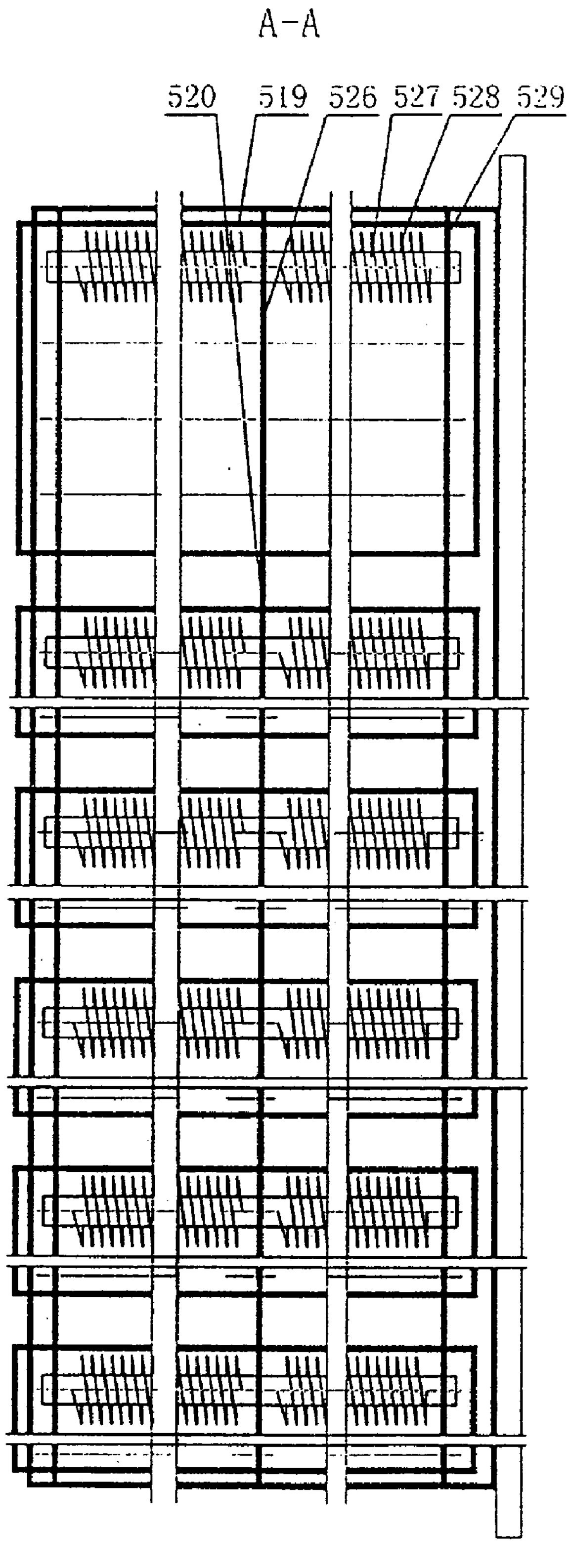
Figure 5C:
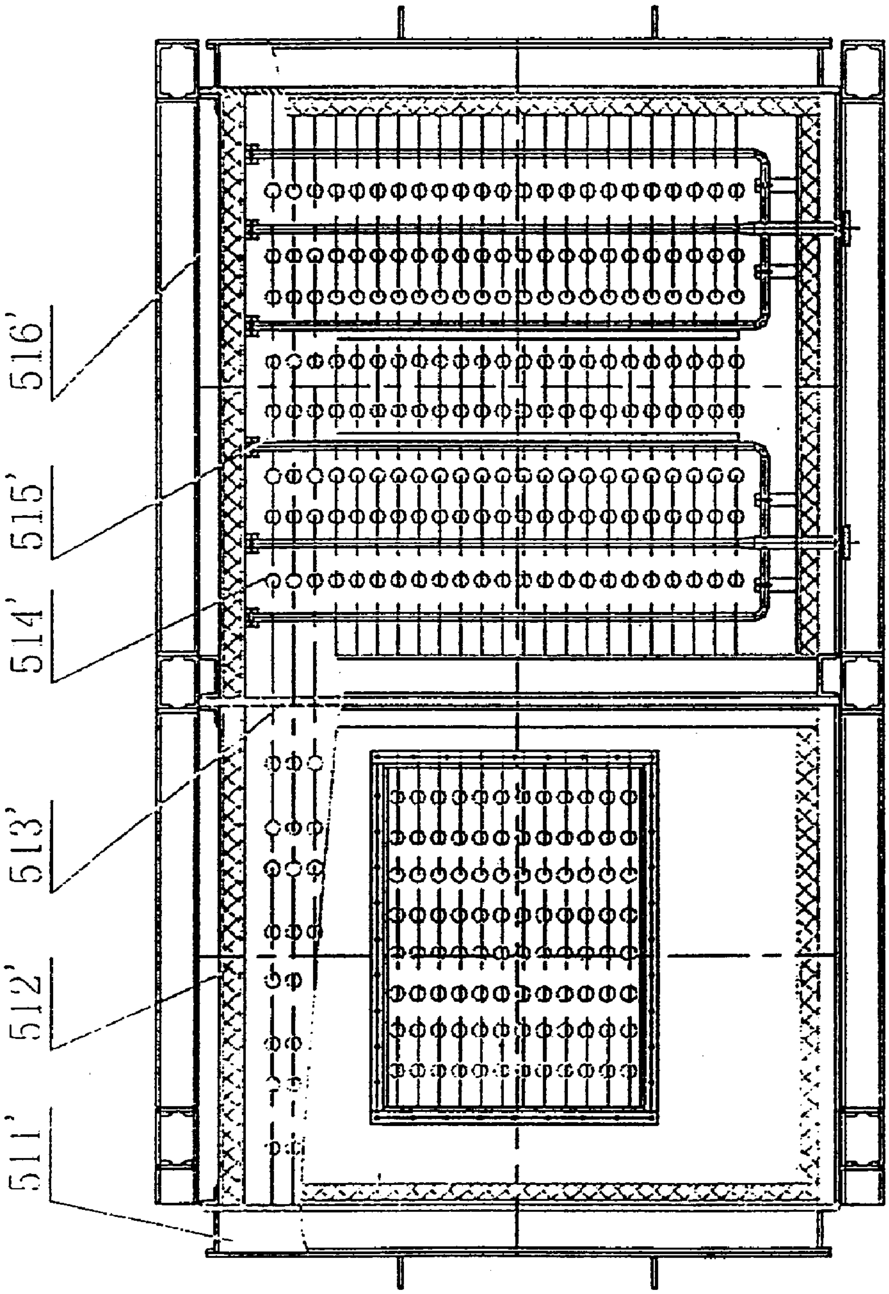
FIG. 5CA shows top and partially cross-sectional views of an integrated air pre-heater with high heat transfer rate.
Figure 5C:
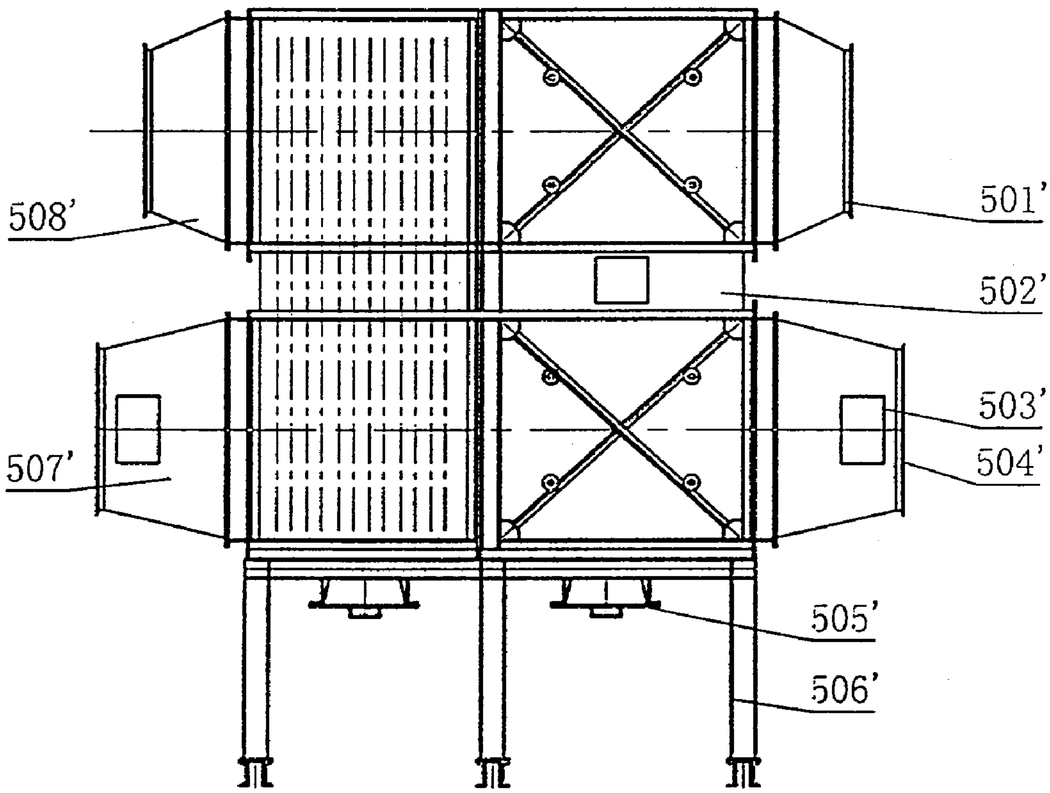
Figure 5C:
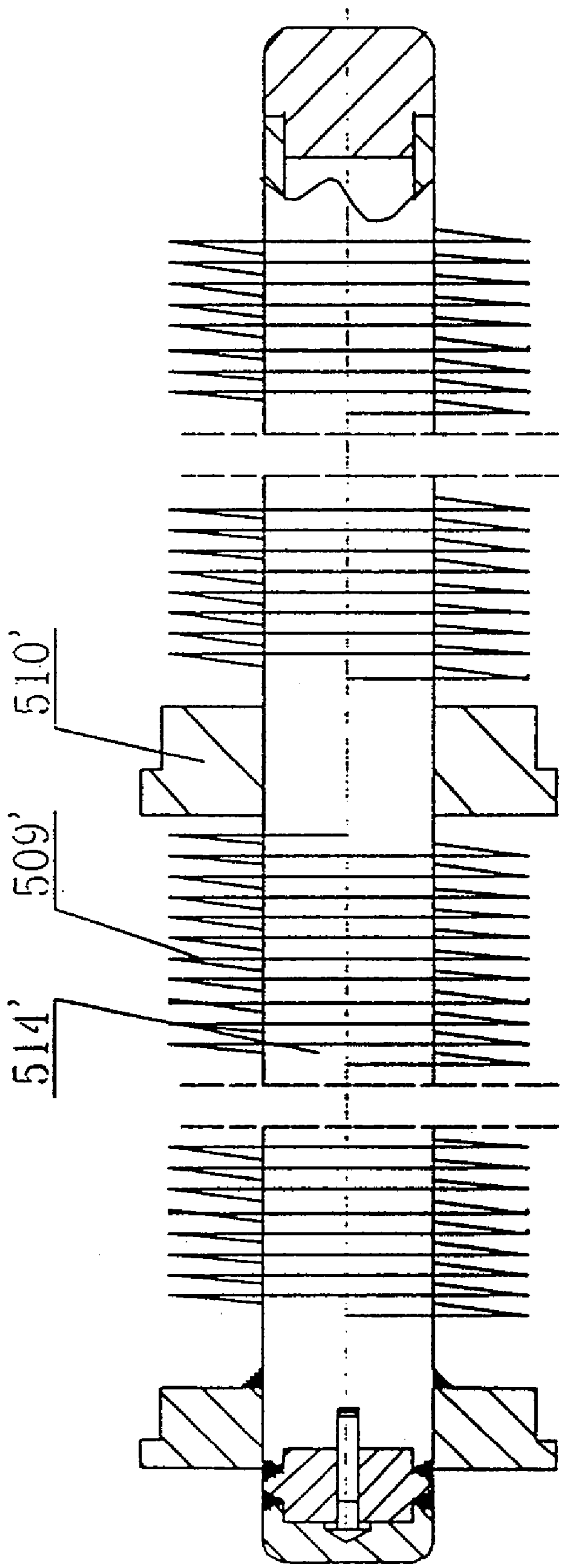
Figure 5D:
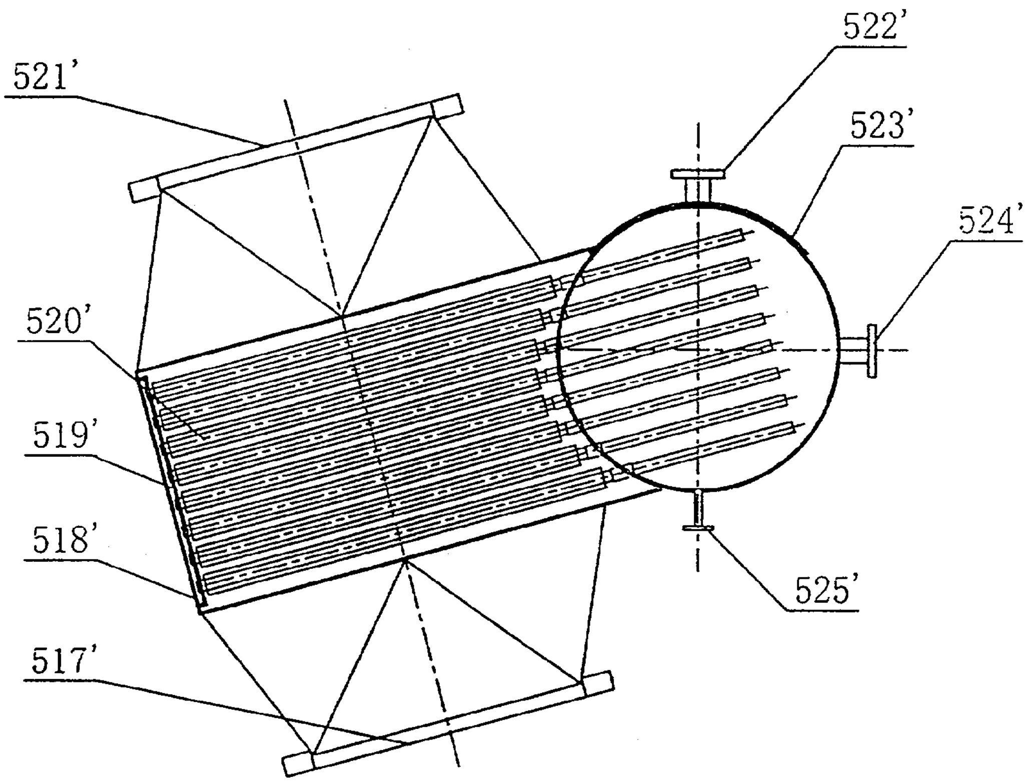
FIG. 5D shows a zoom-in view of a horizontal afterheat boiler with high heat transfer rate.
Figure 5E:
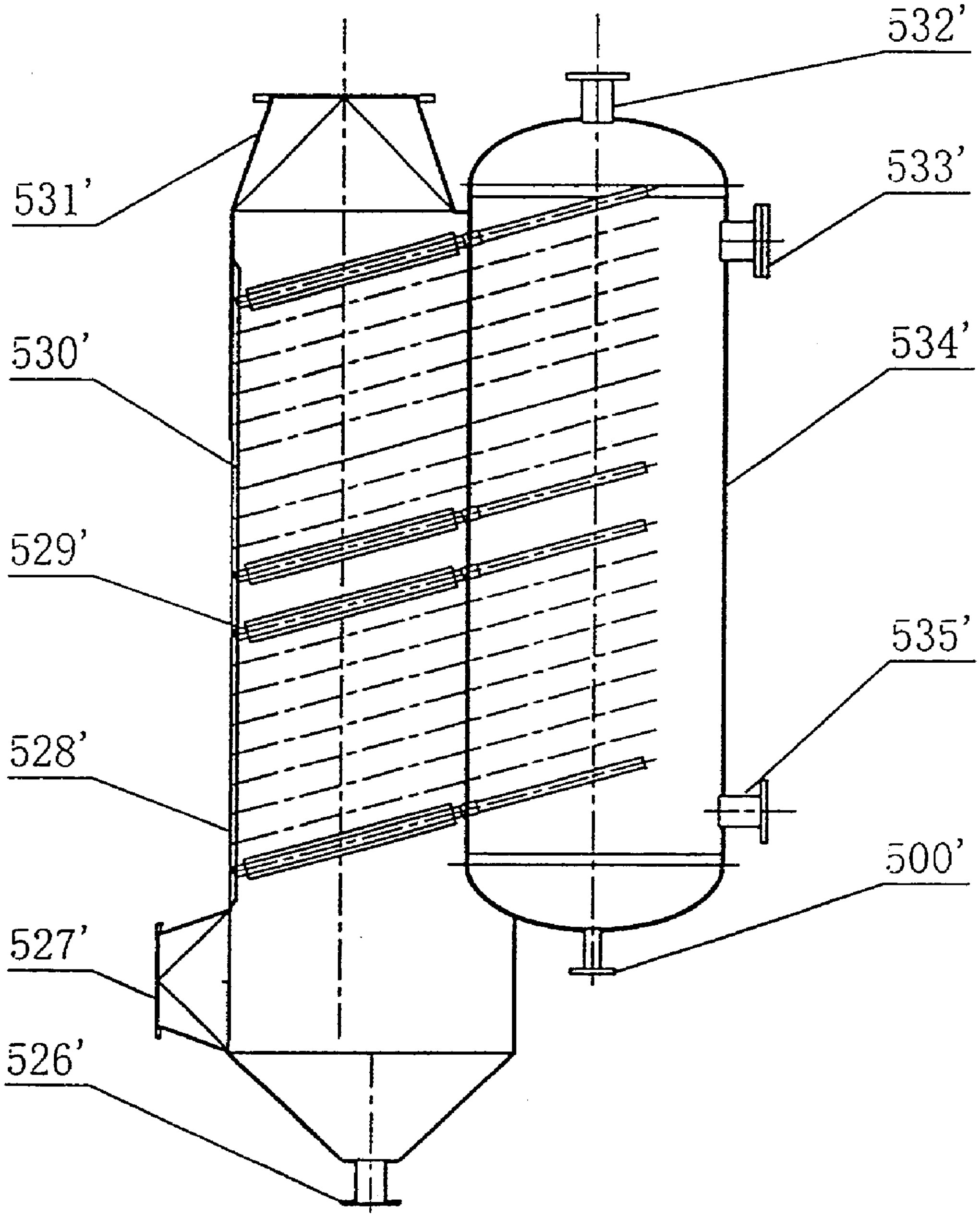
FIG. 5EA shows an eccentric afterheat boiler with high heat transfer rate.
Figure 5E:
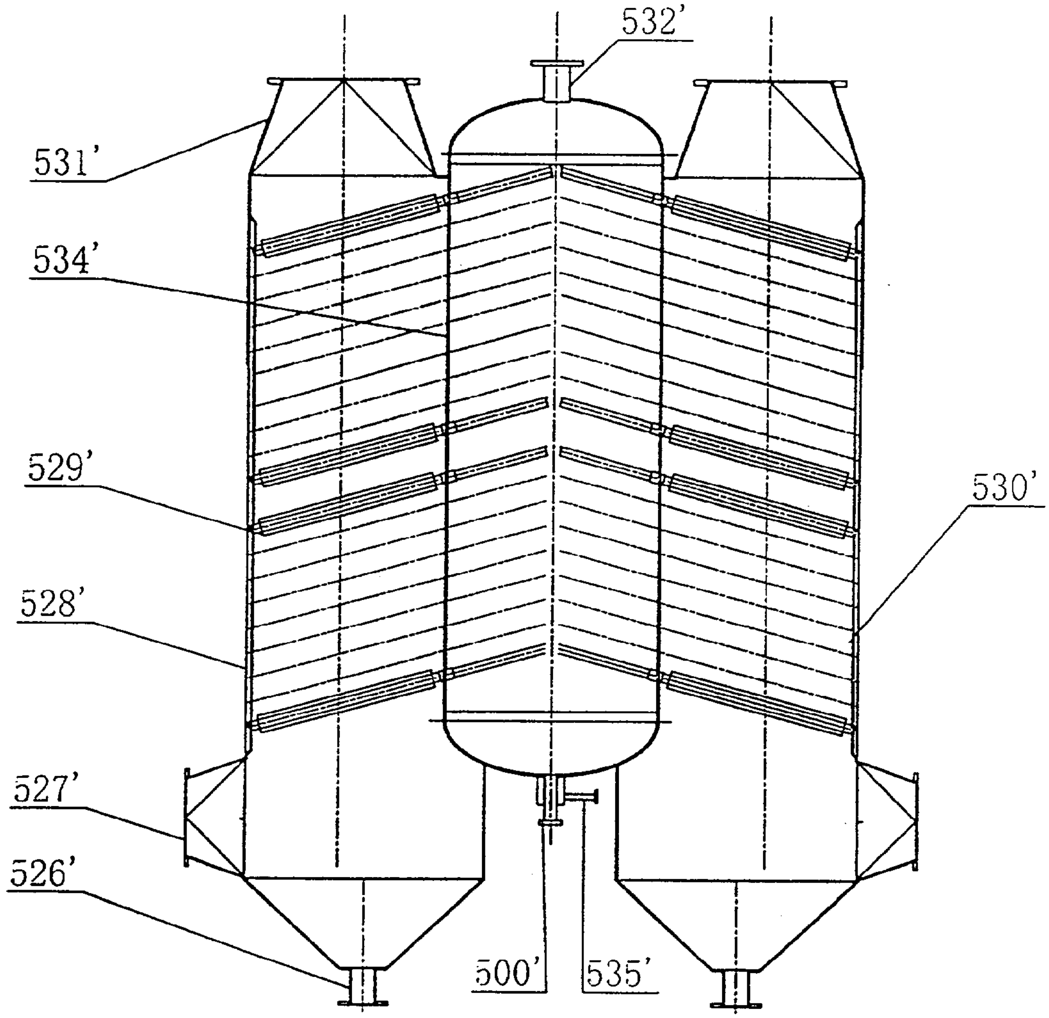
Figure 51A:
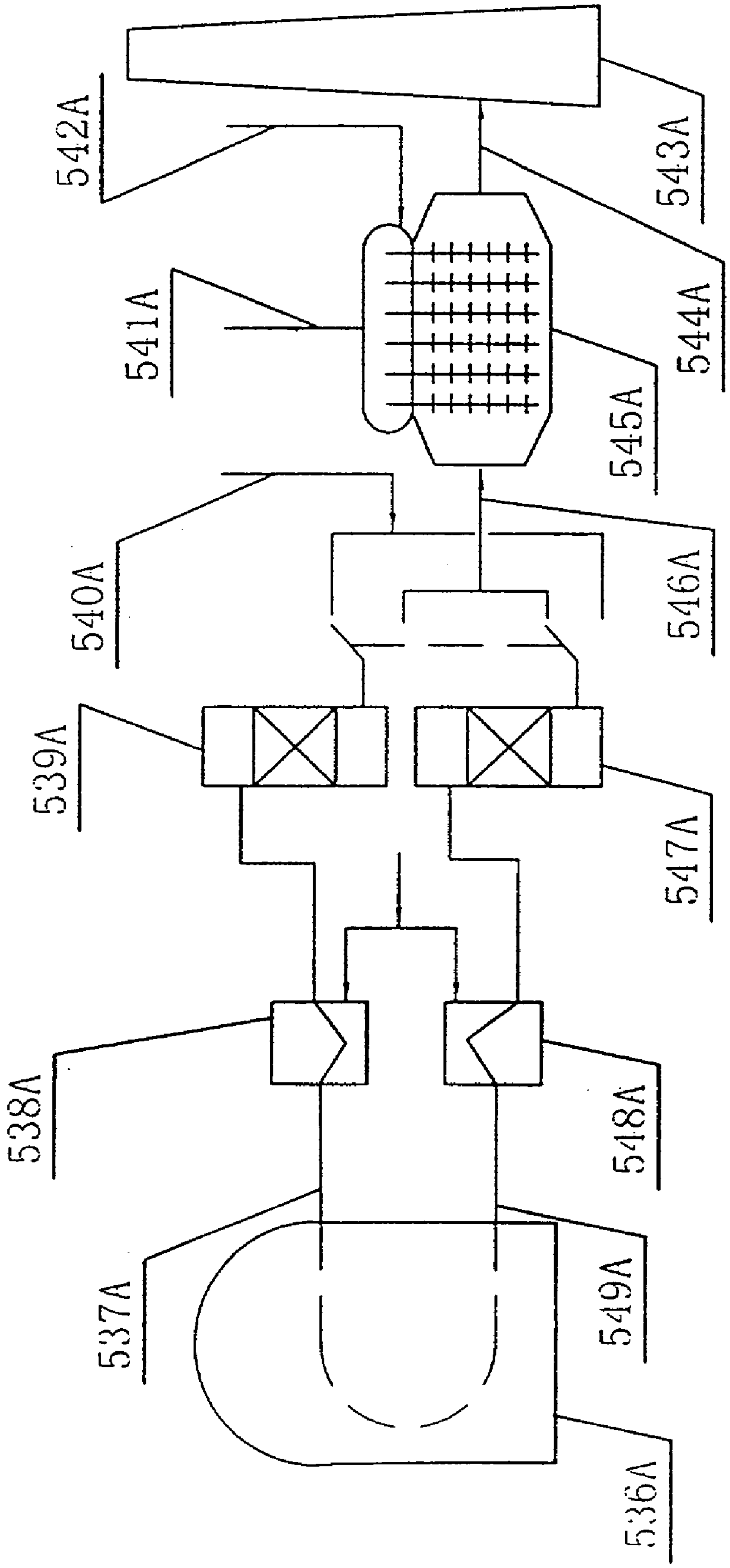
Figure 51B:
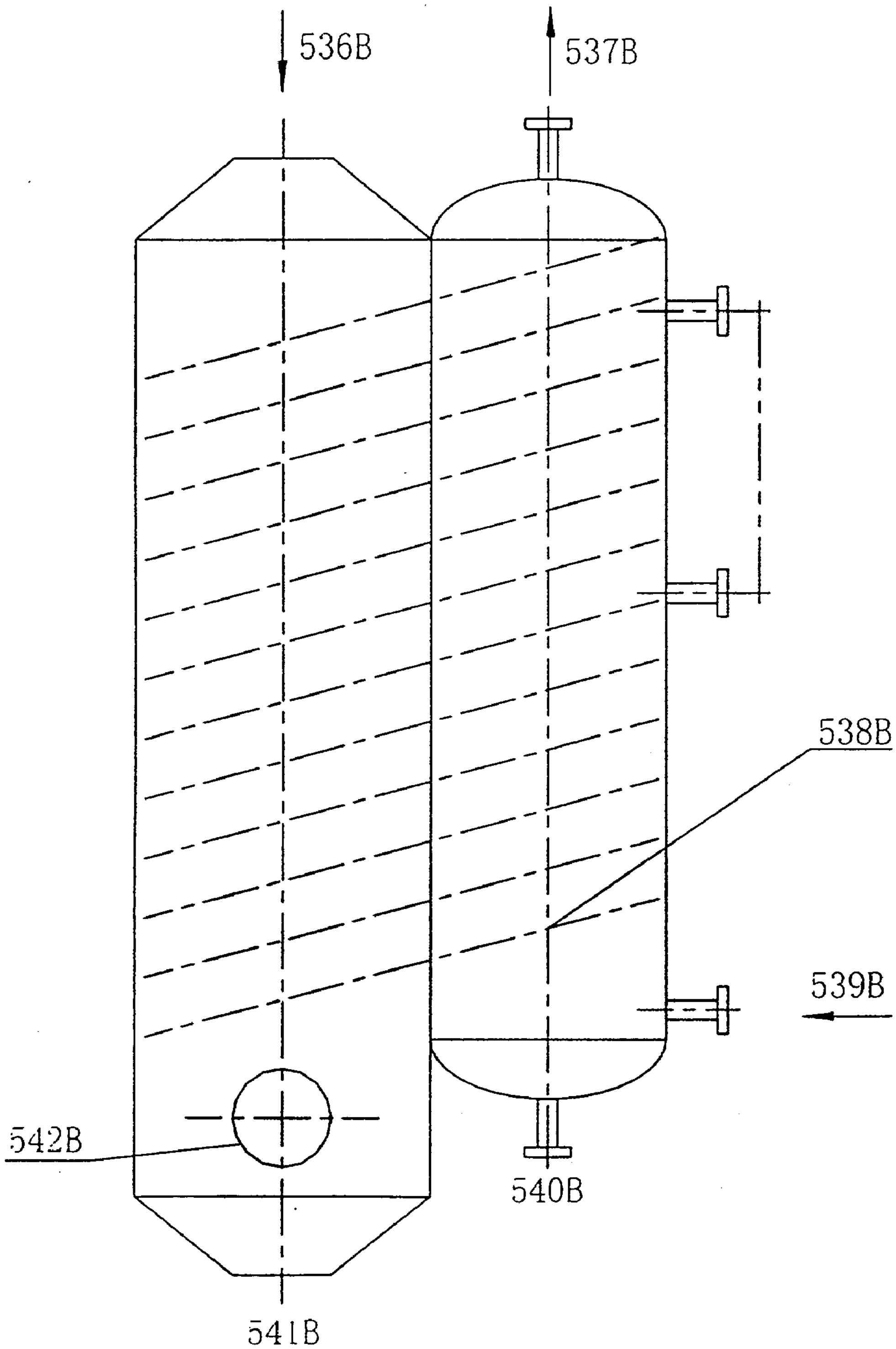
Figure 51C:
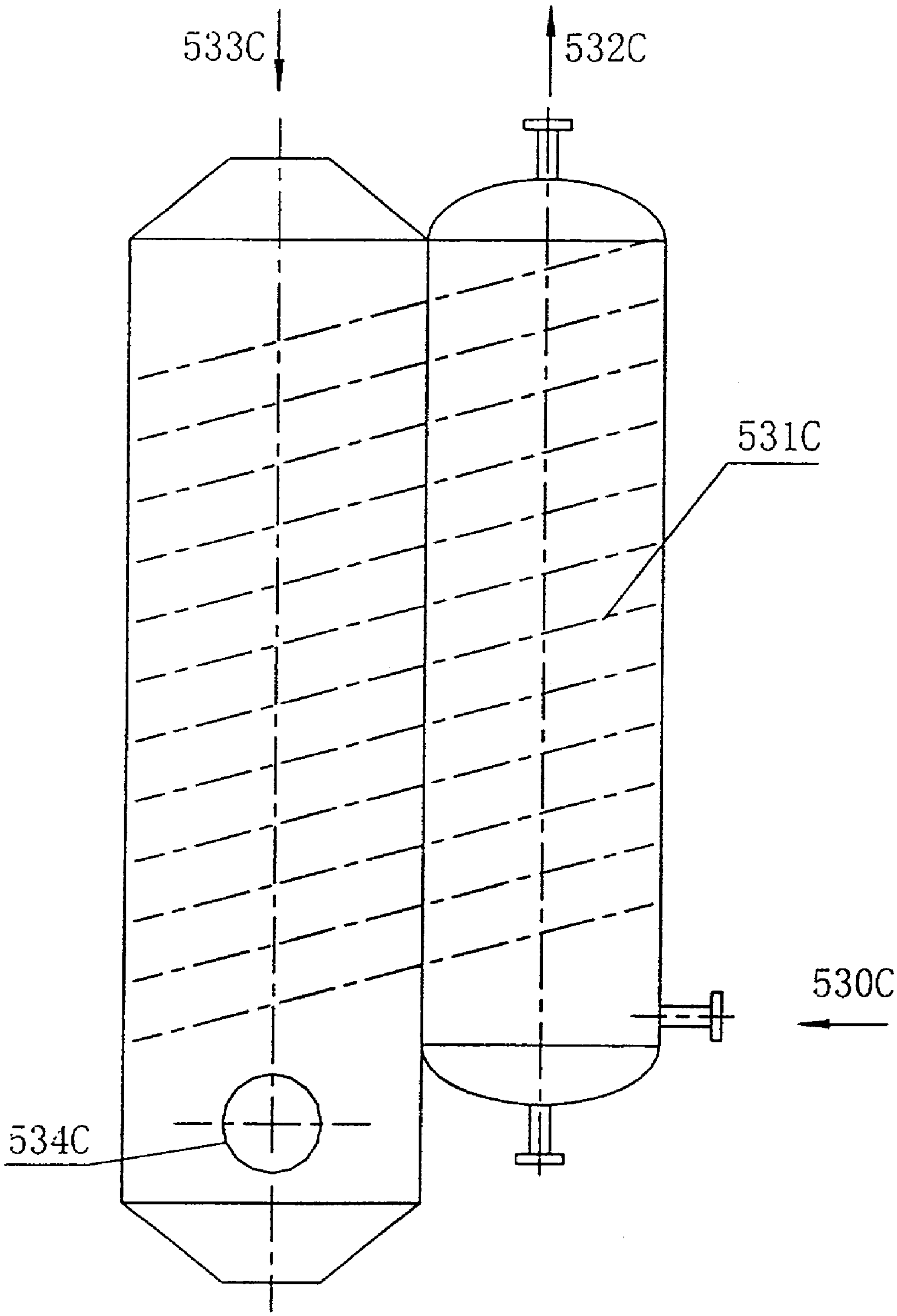
Figure 51D:
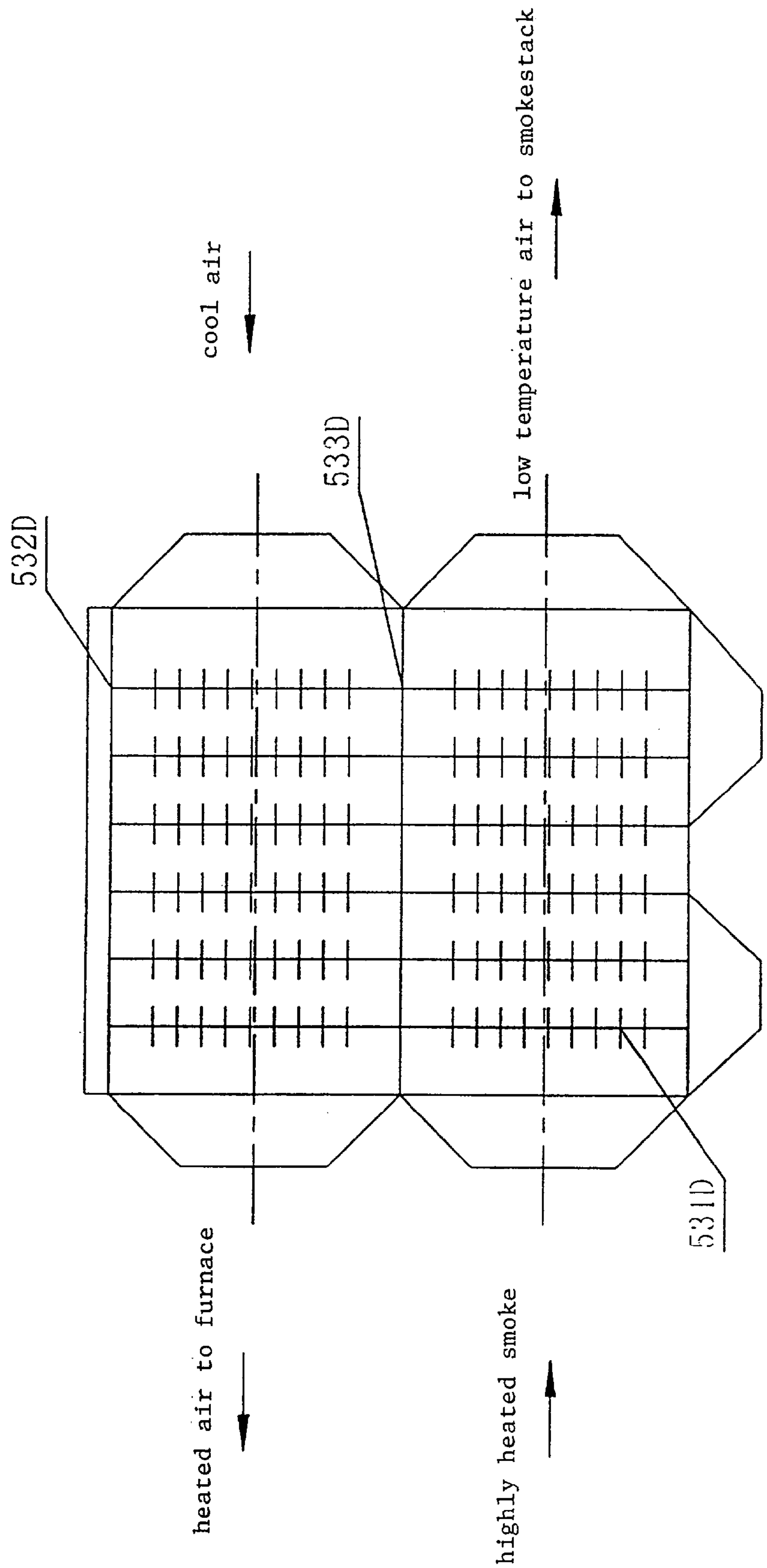
Figure 51E:
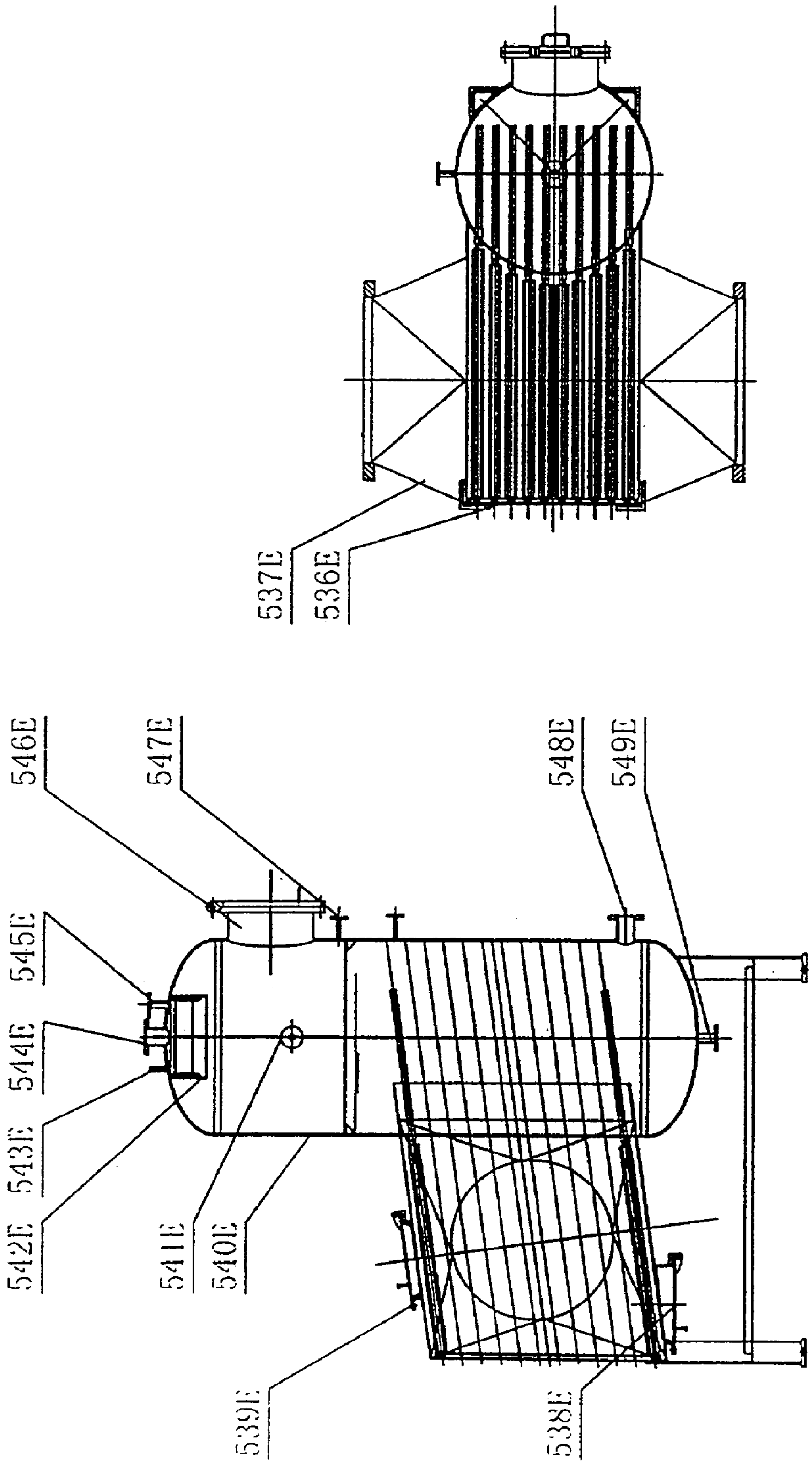
Figure 51F:
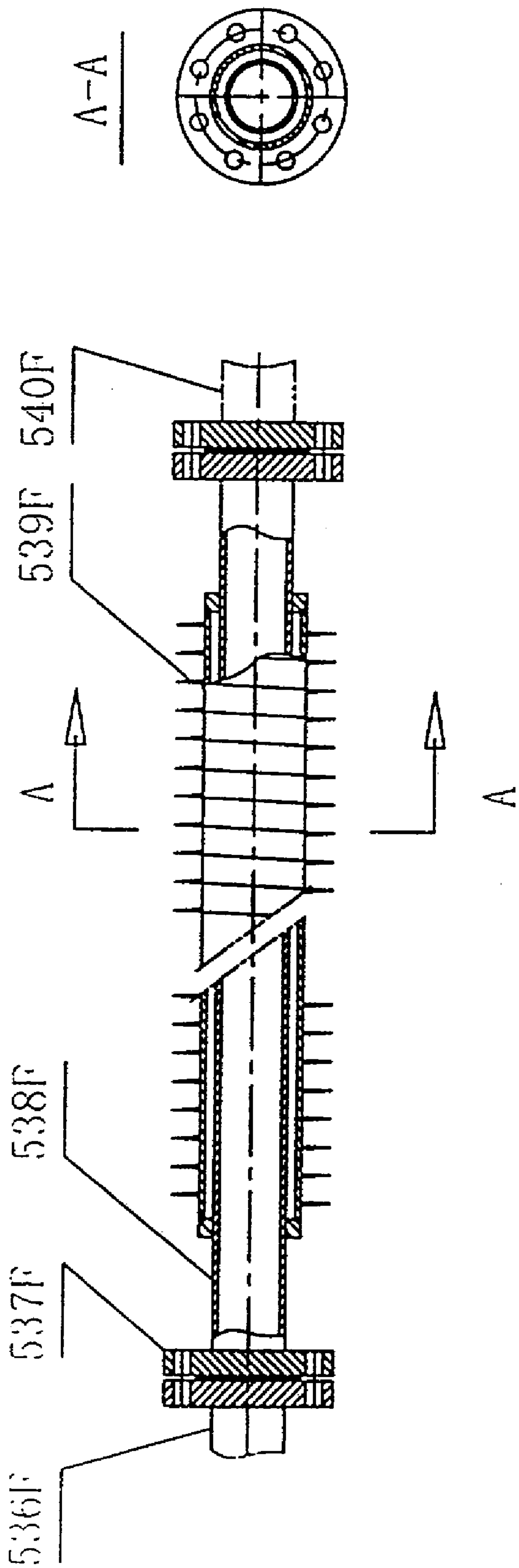
Figure 51G:
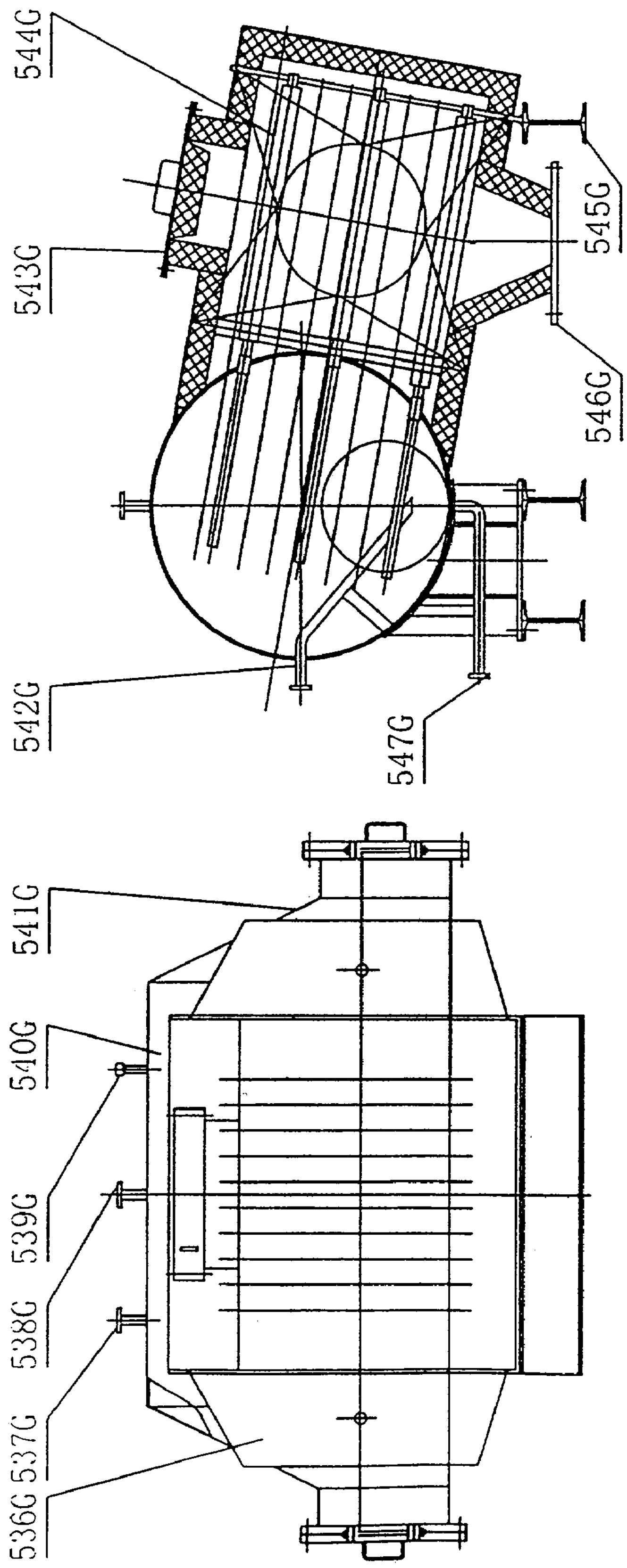
Figure 5I:
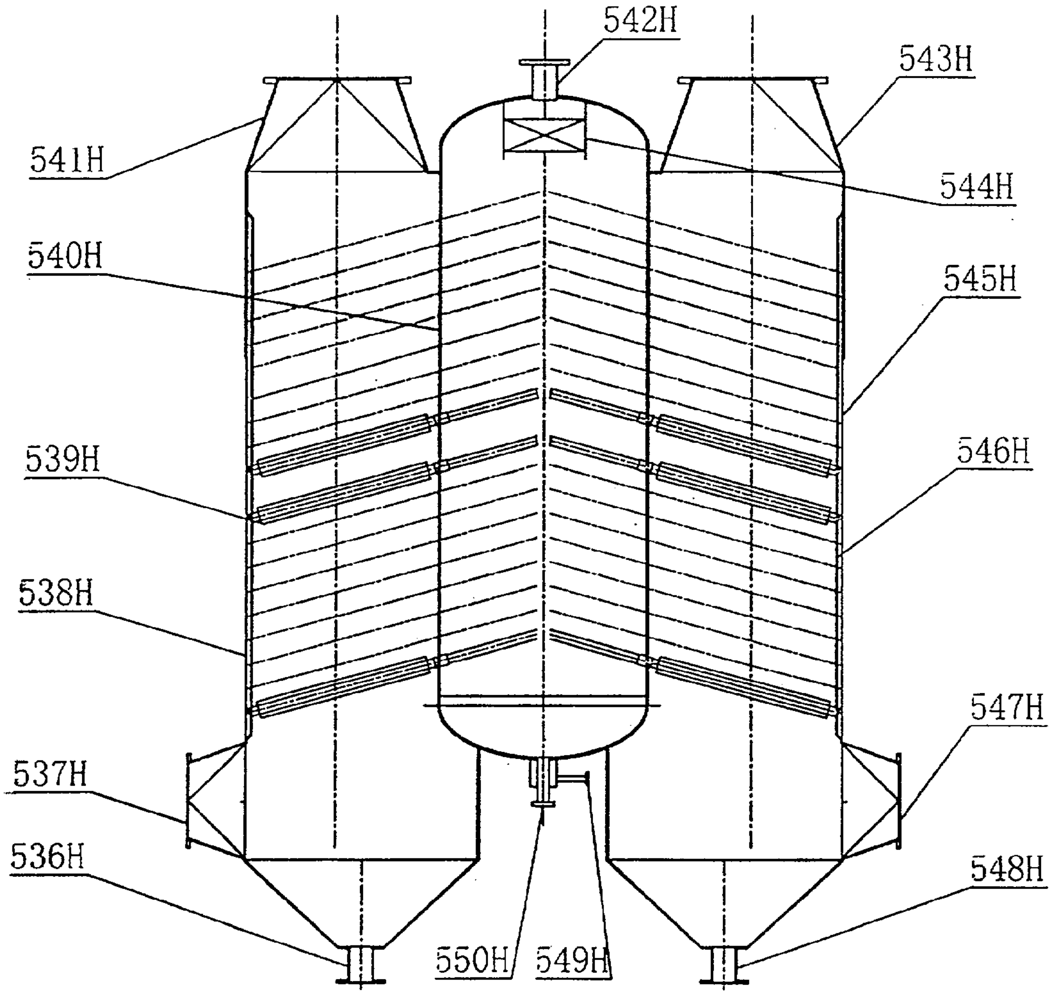
FIG. 5IA shows the process of an air pre-heater in the glass kiln.
Figure 5I:
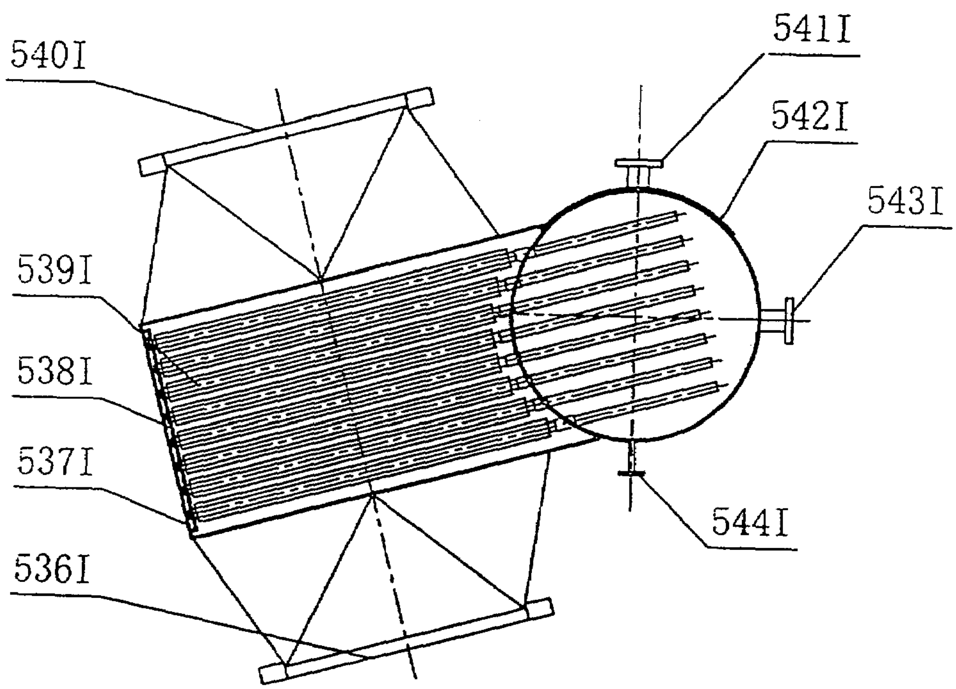
Figure 51J:
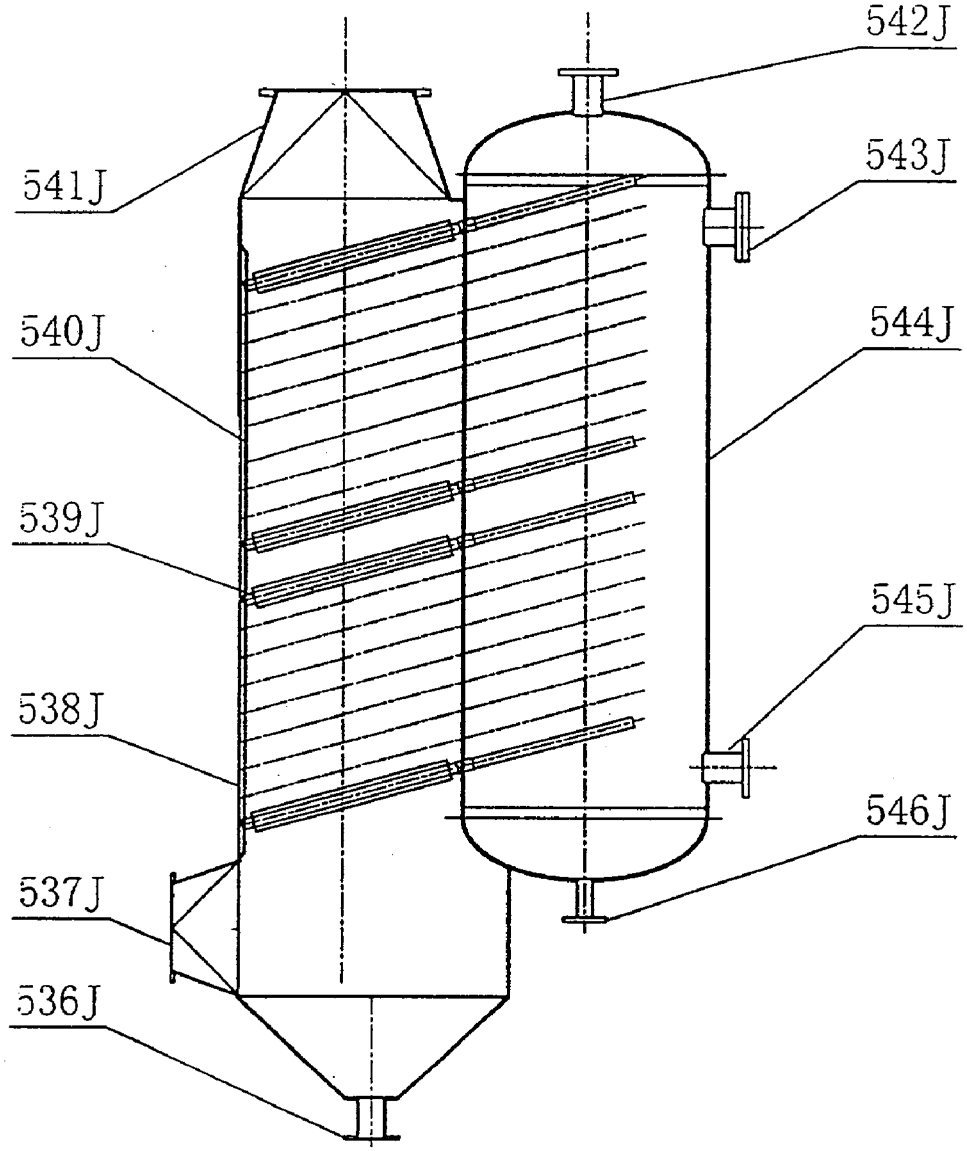
Figure 5I:
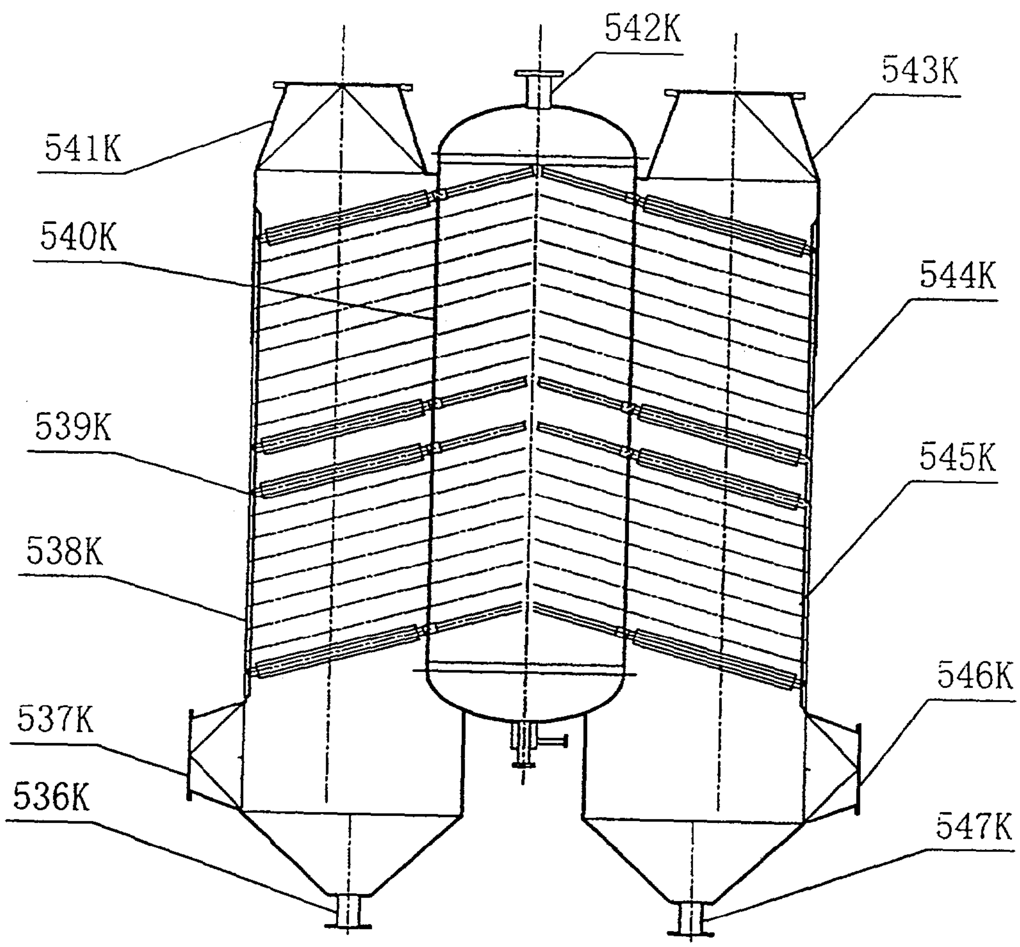
Figure 5I:
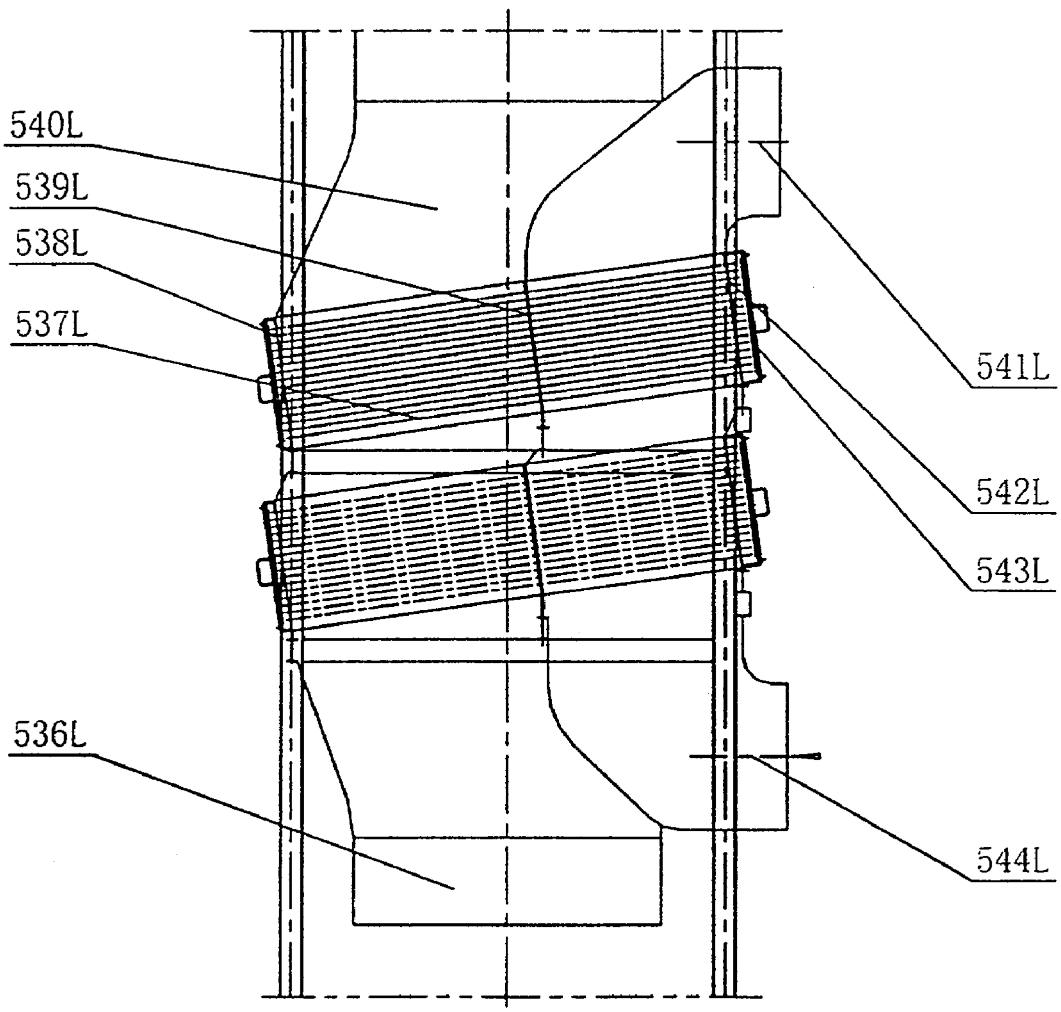
Figure 5I:
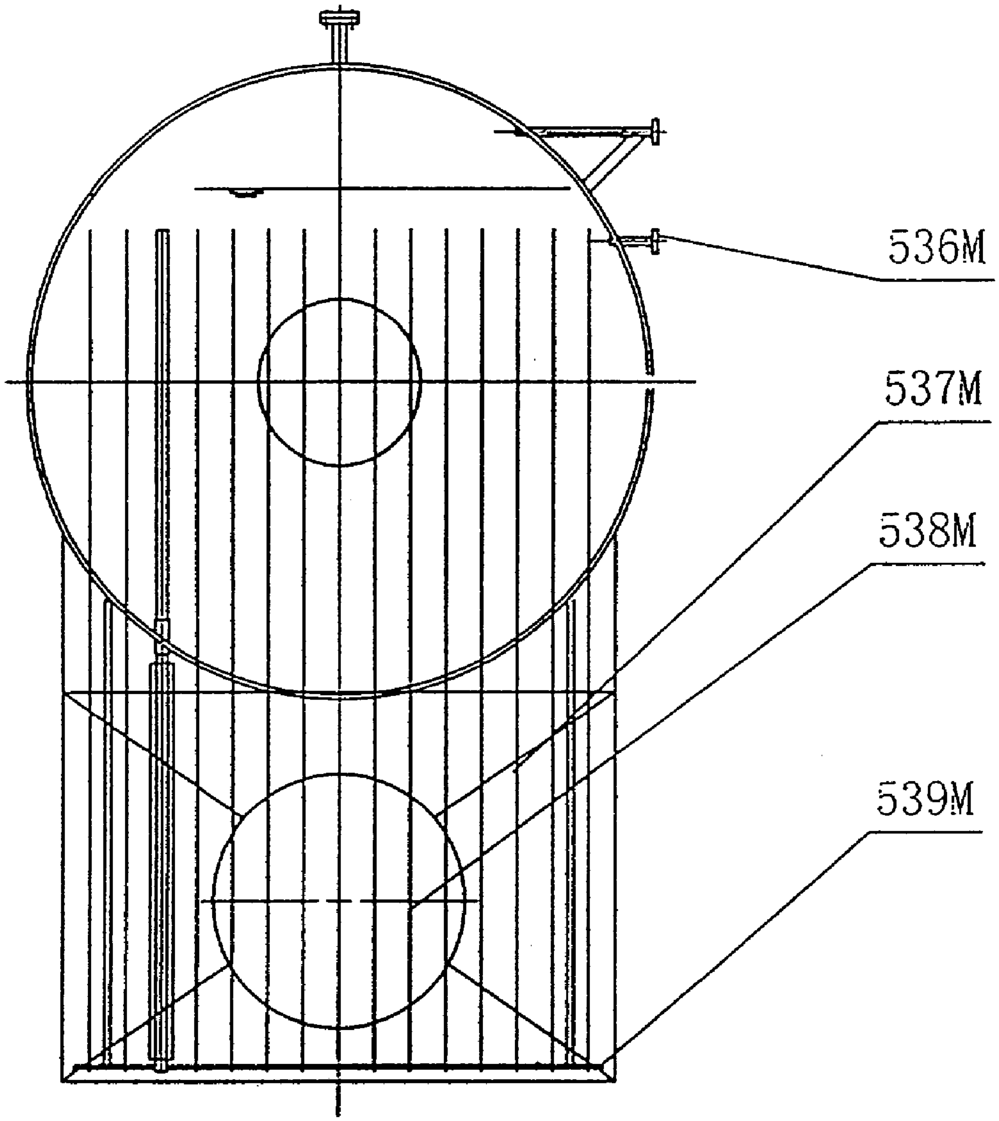
Figure 5I:
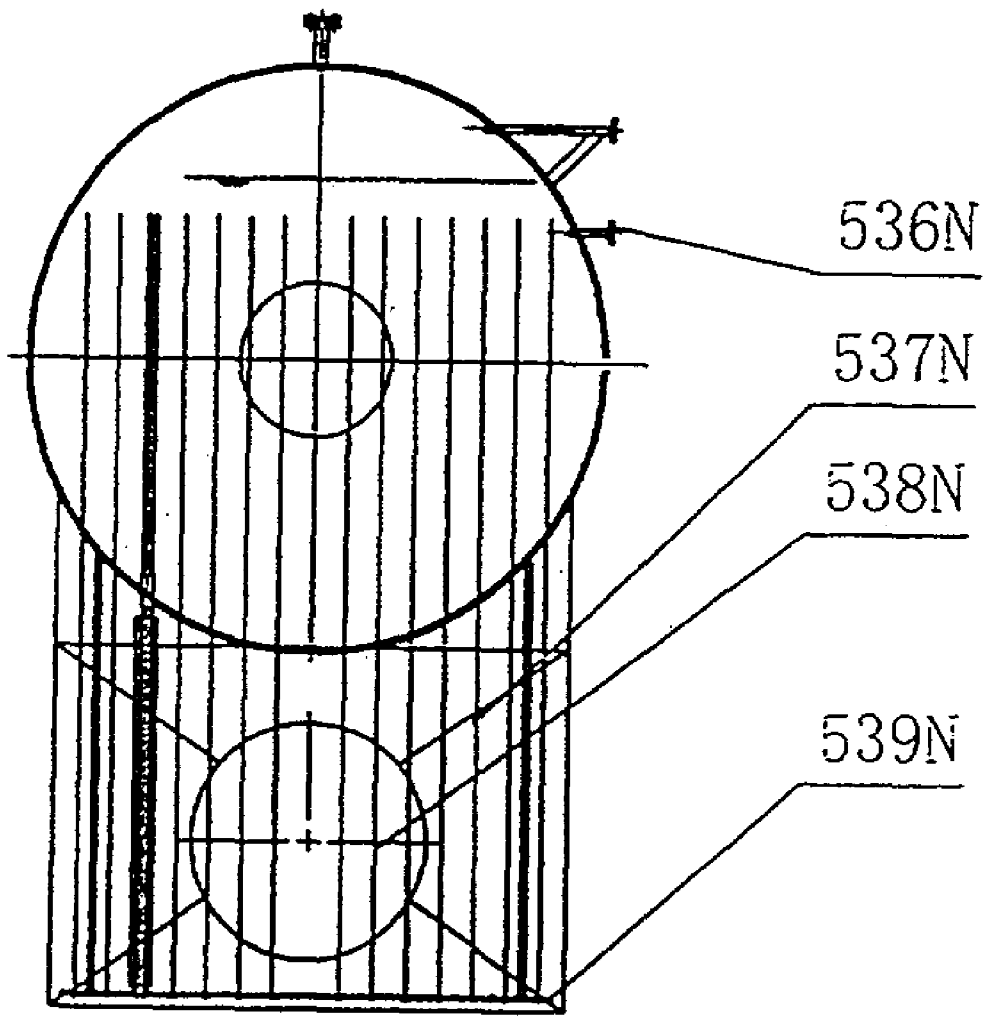
Figure 5J:
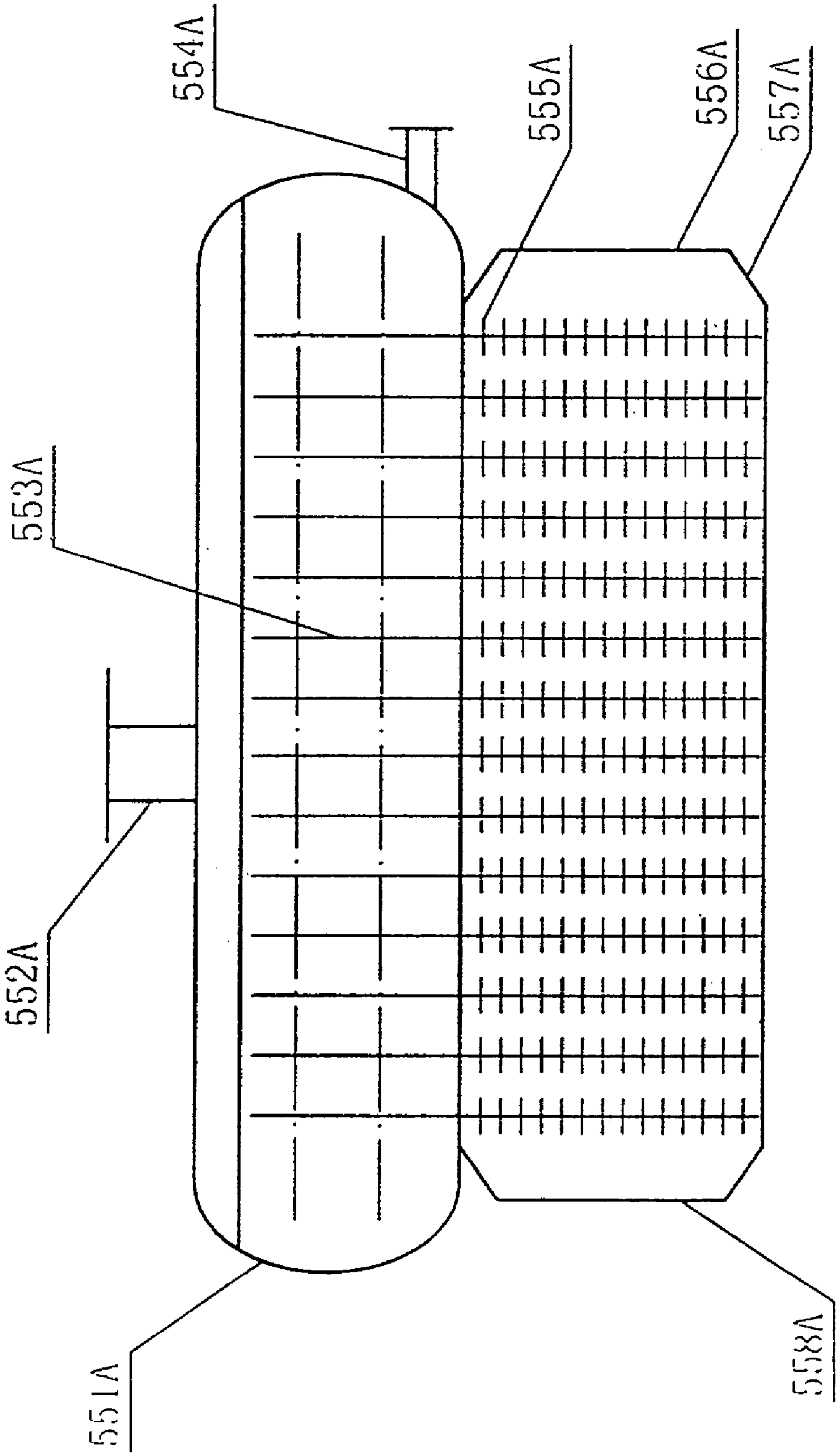
FIG. 5JA shows a schematic view of the structure of an afterheat boiler with high heat transfer rate.
Figure 5J:
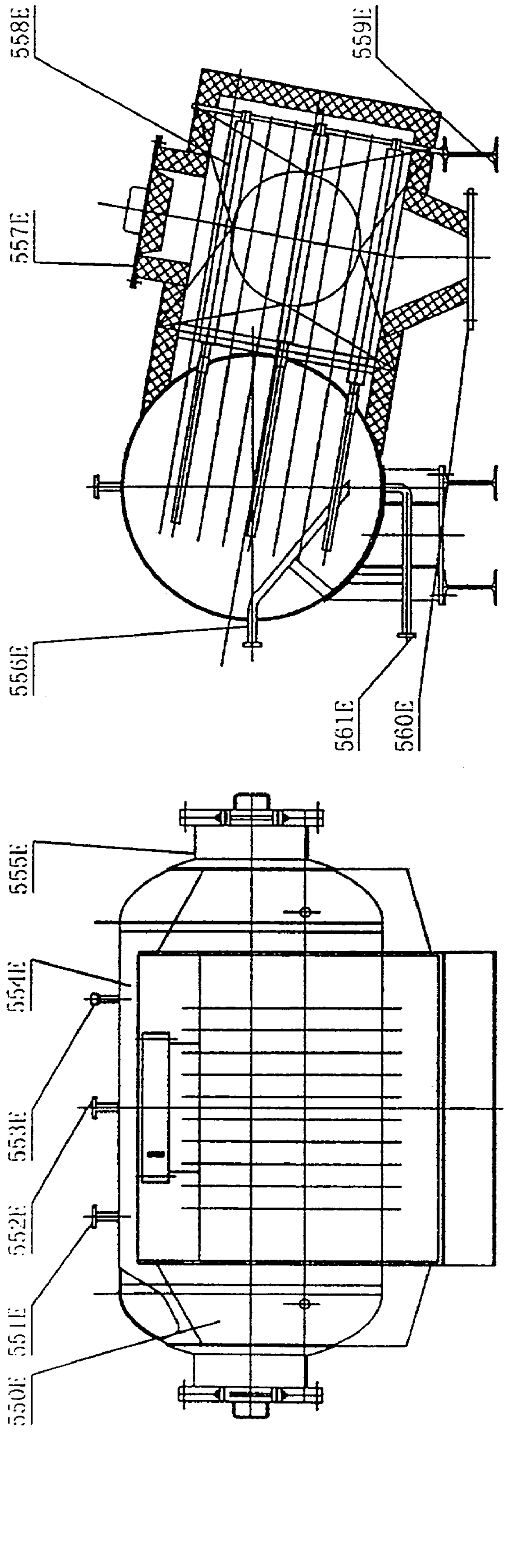
Figure 5J:
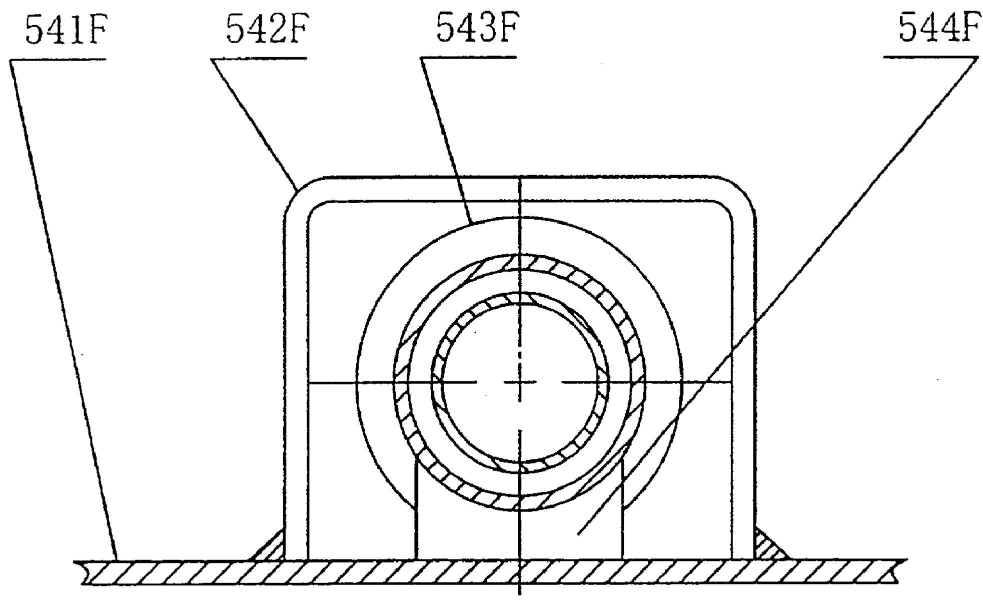
Figure 5J:
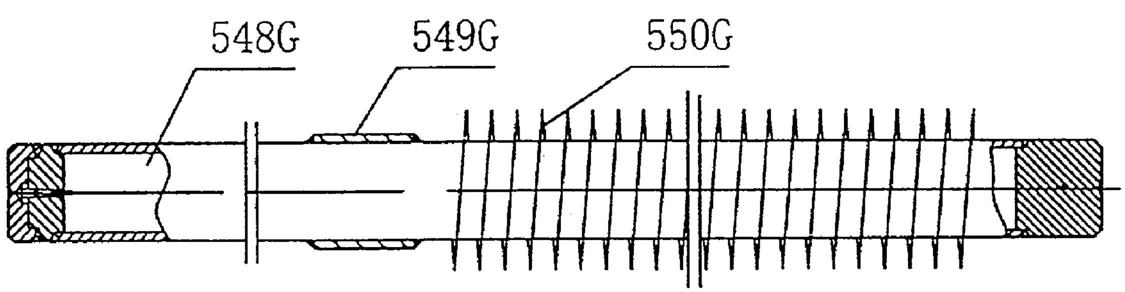
Figure 5J:
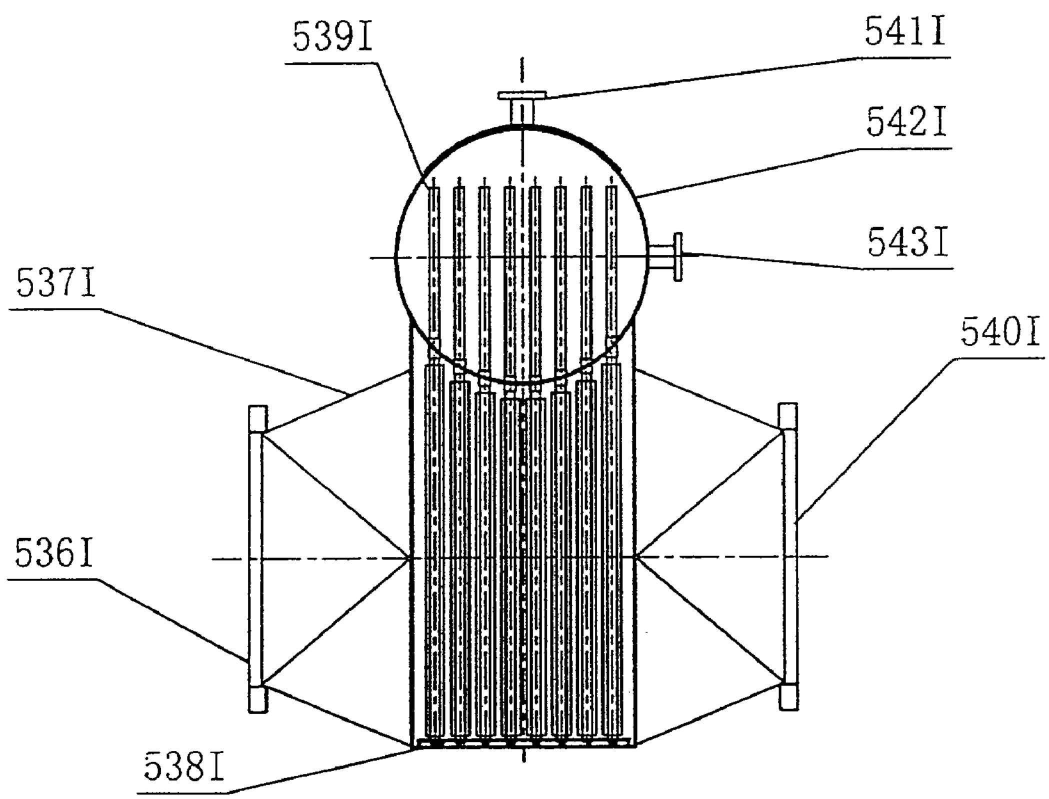
Figure 5J:
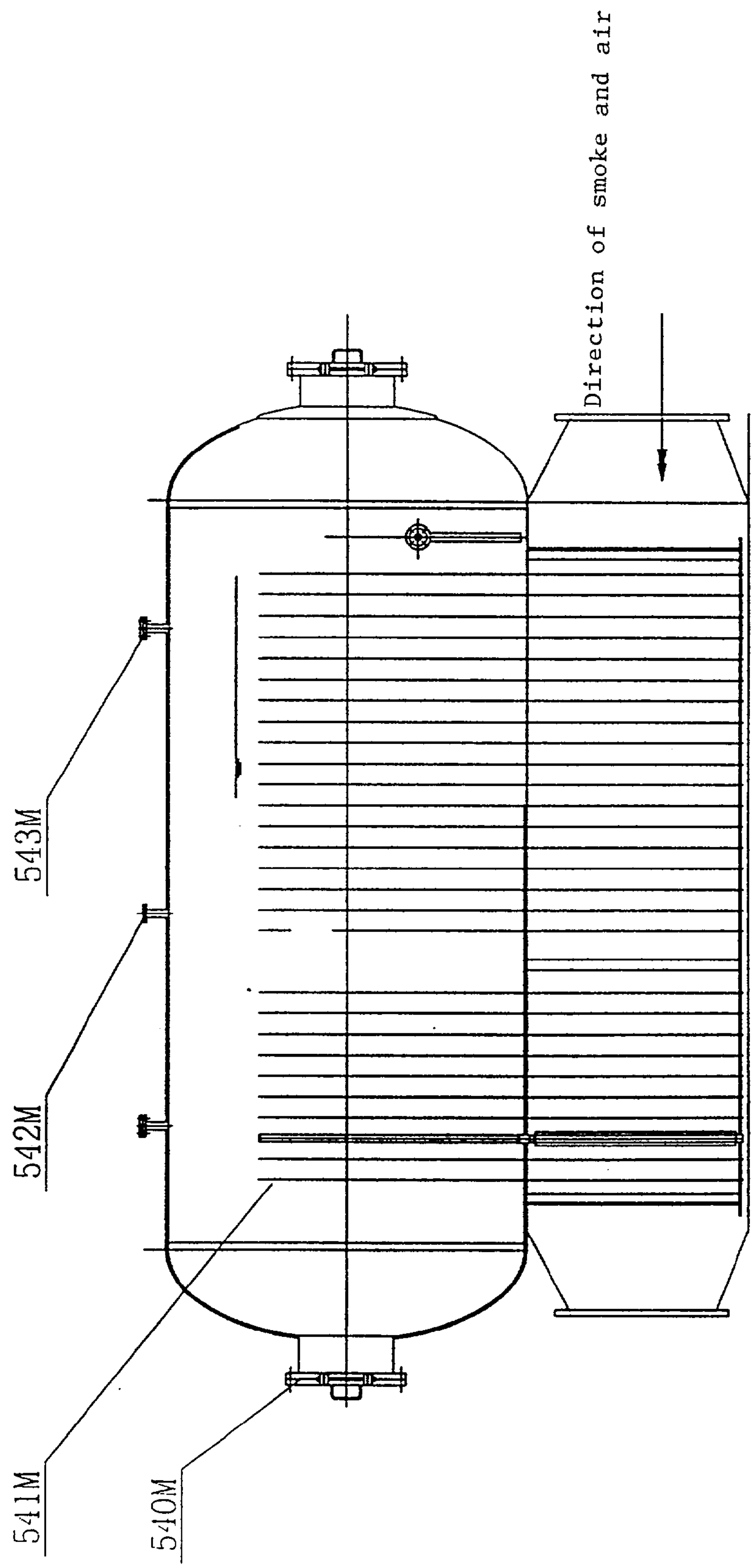
Figure 5J:
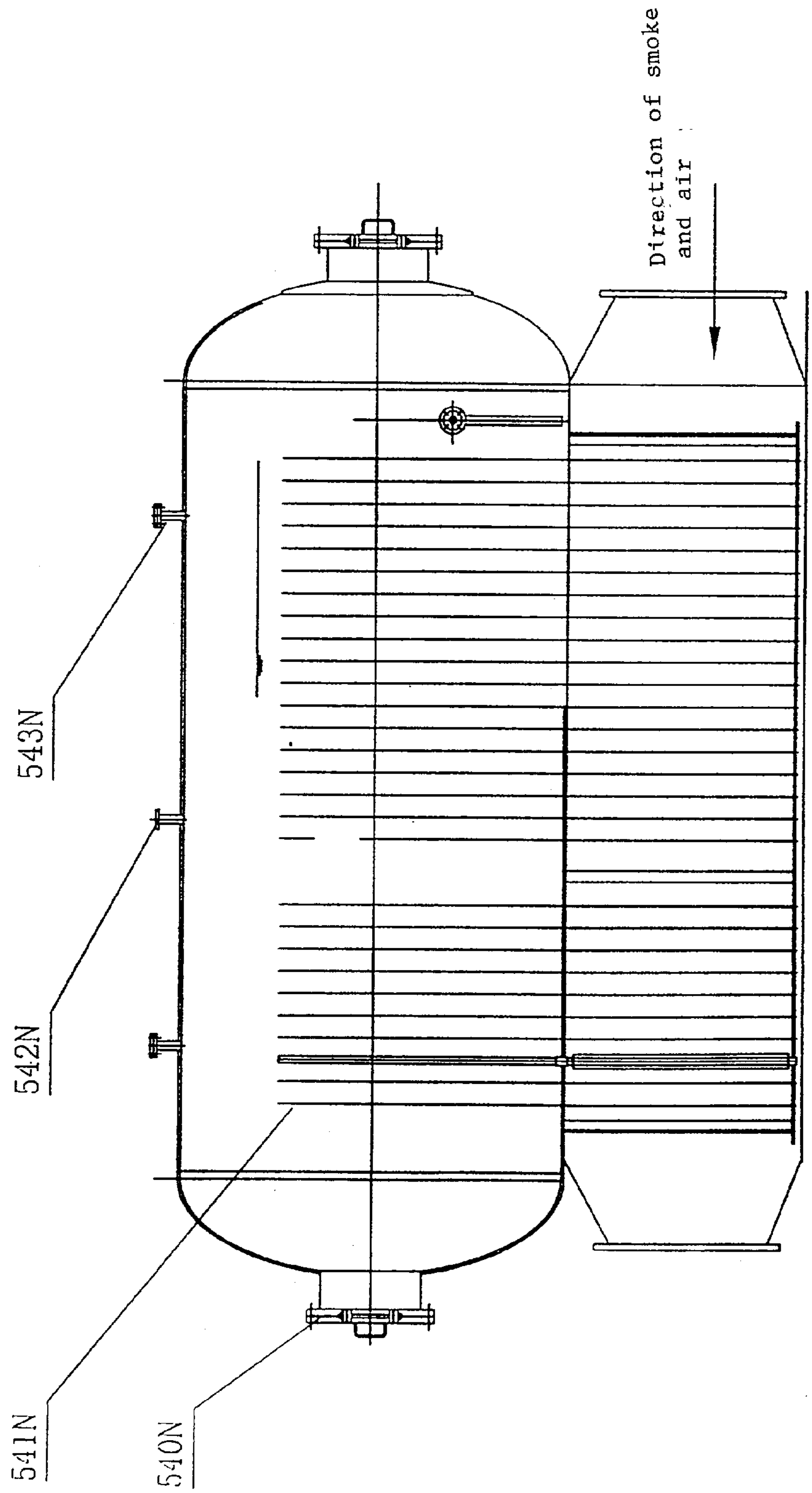
Figure 5K:
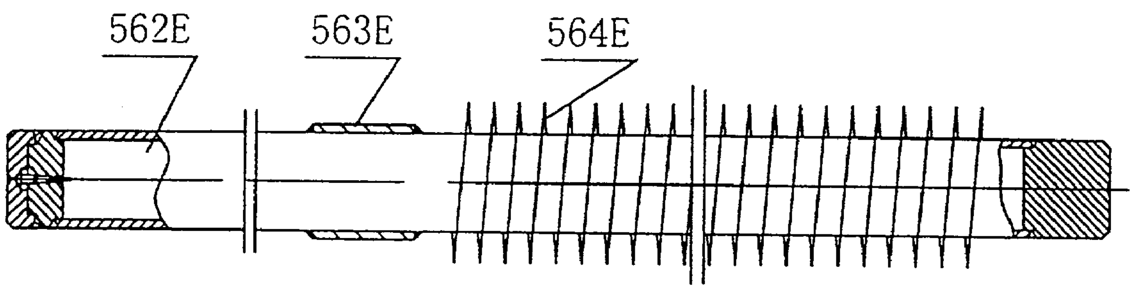
FIG. 5KE shows a schematic view of a high heat transfer rate pipe.
Figure 5K:
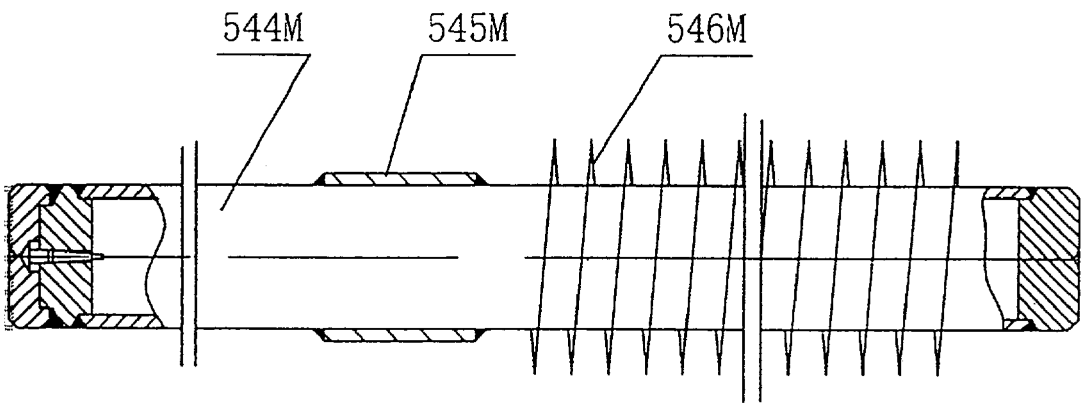
Figure 5K:
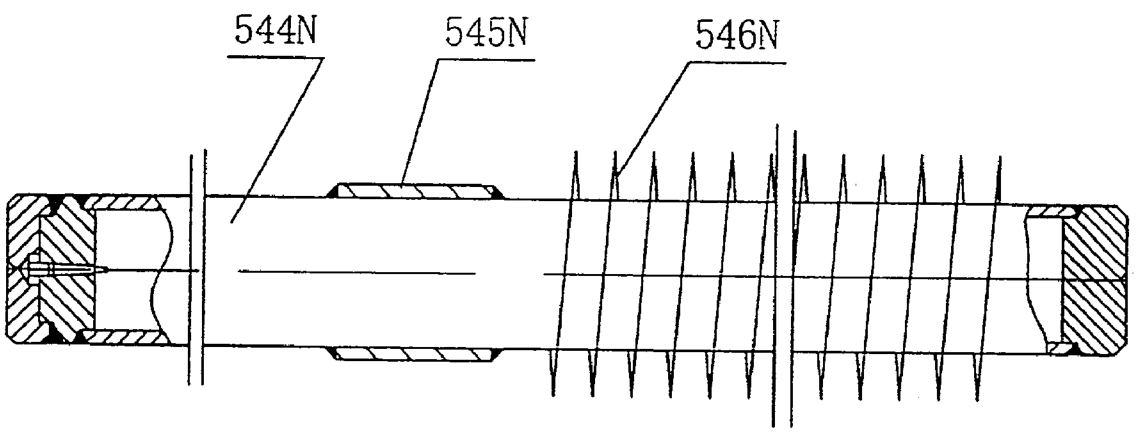
Figure 5Q:
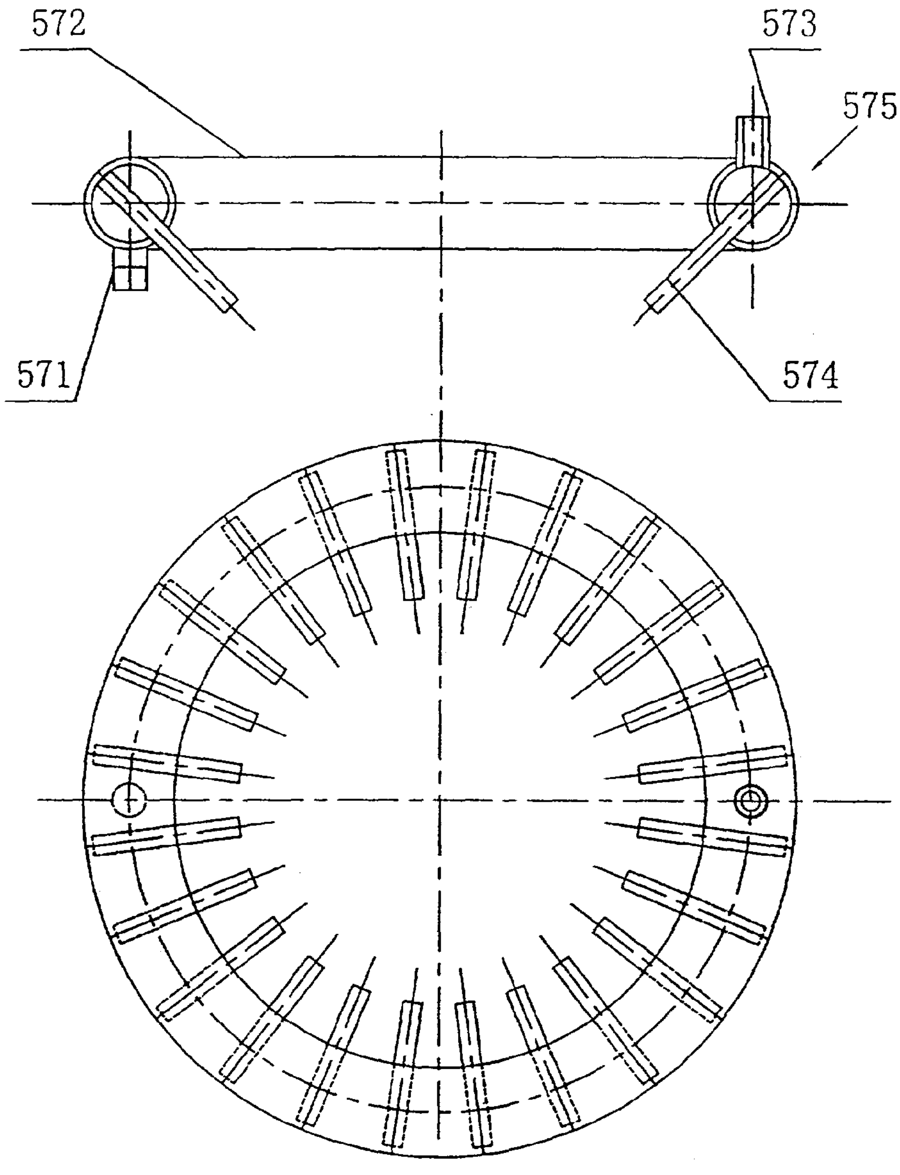
FIG. 5QA shows an afterheat water heater with high heat transfer rate element according to the present invention.
Figure 5Q:
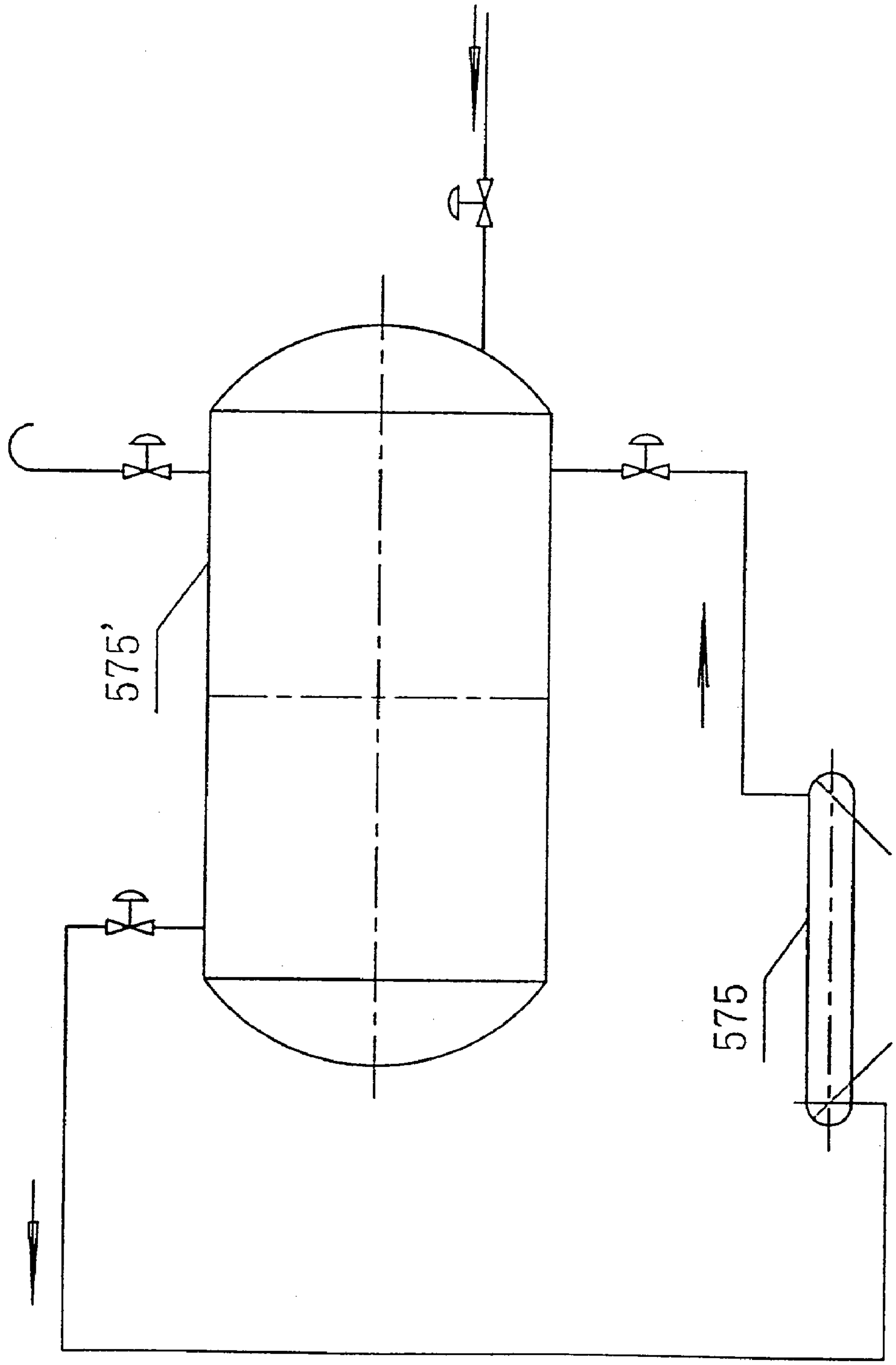
Figure 5Q:
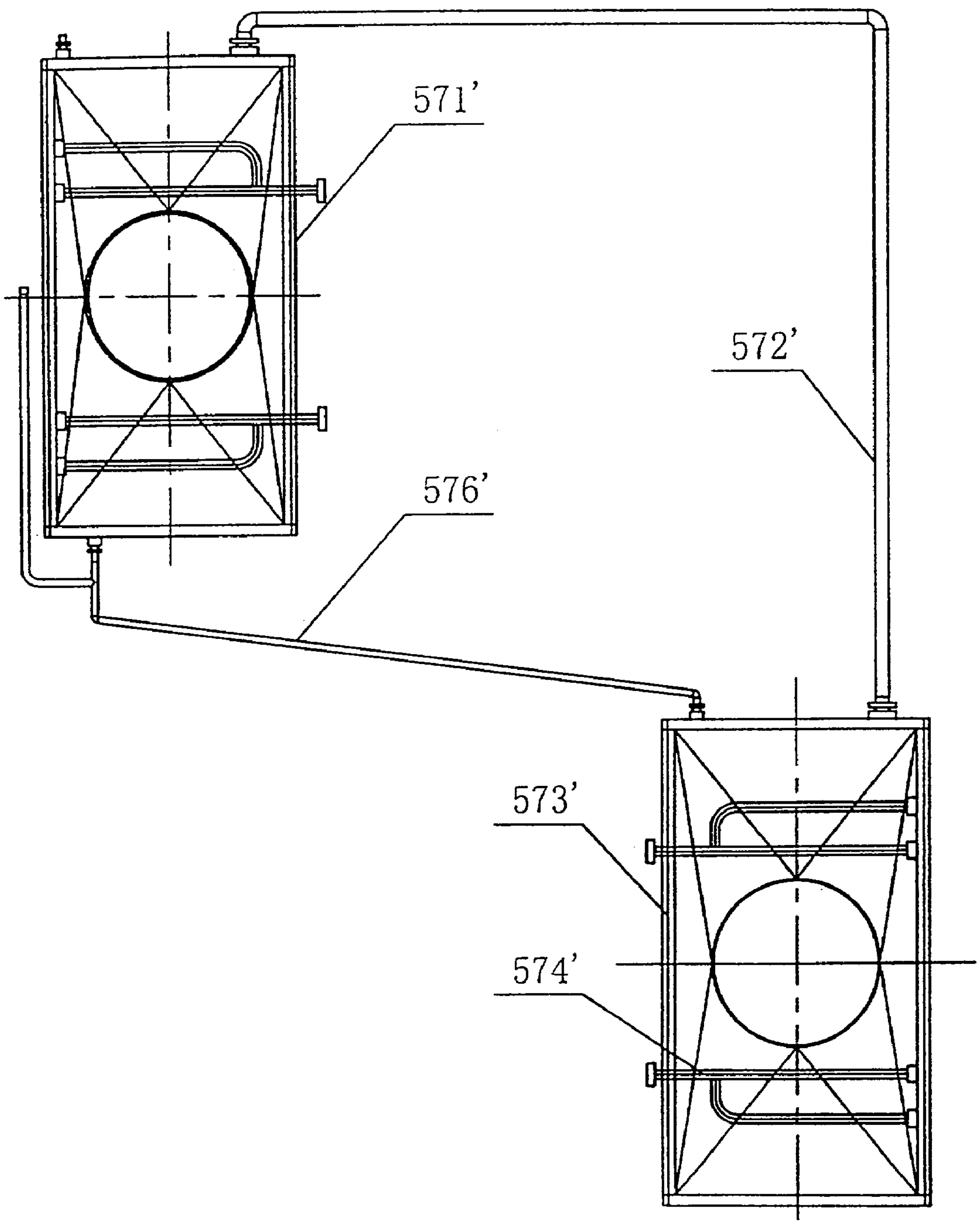
Figure 5Q:
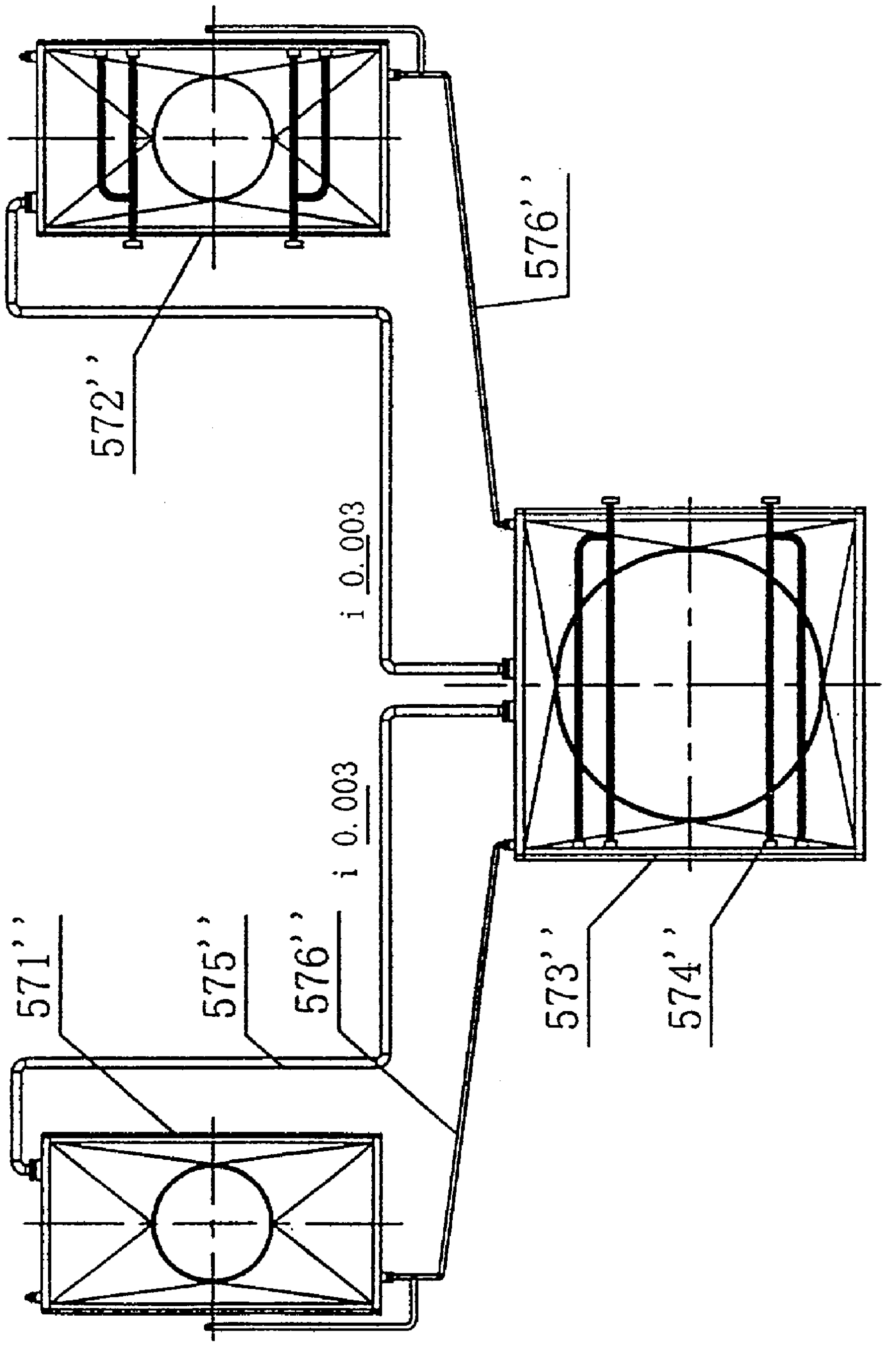
Figure 5R:
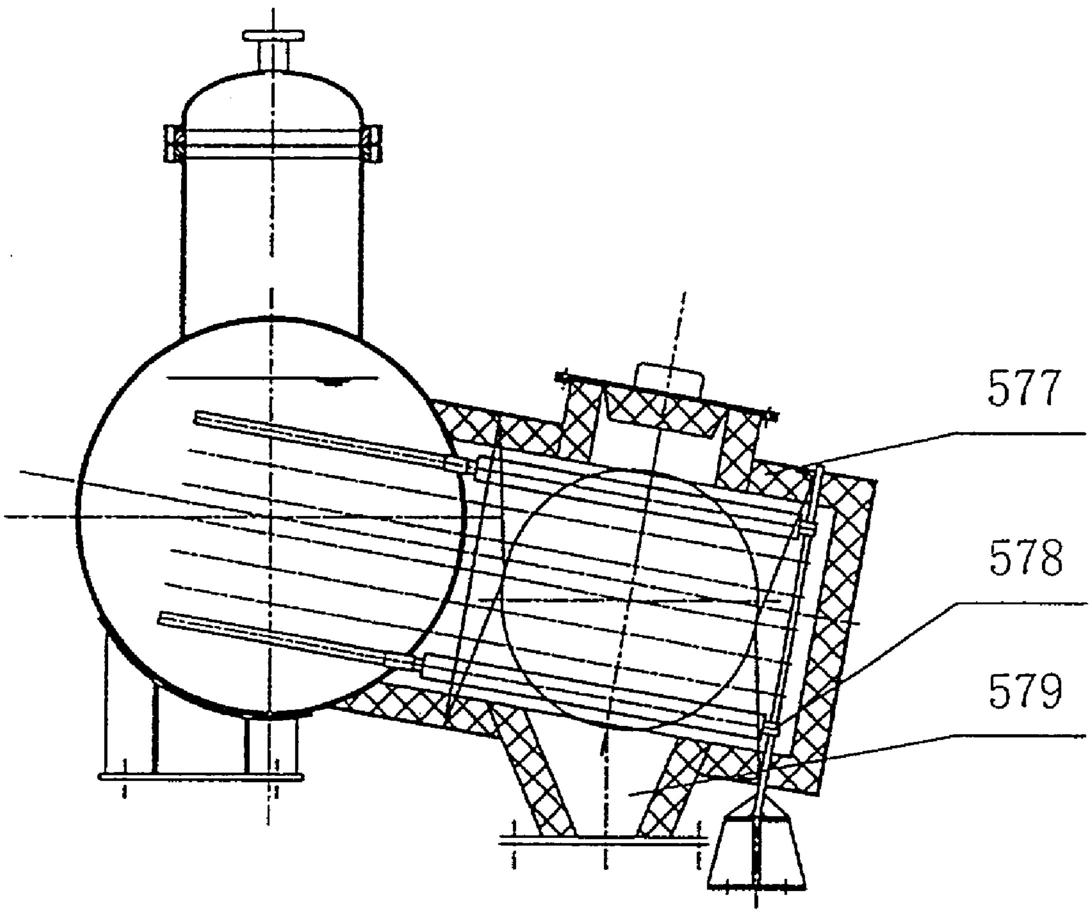
FIG. 5RA shows a schematic view of an afterheat boiler with the high heat transfer element according to the present invention, which is used in magnesium plants.
Figure 5R:
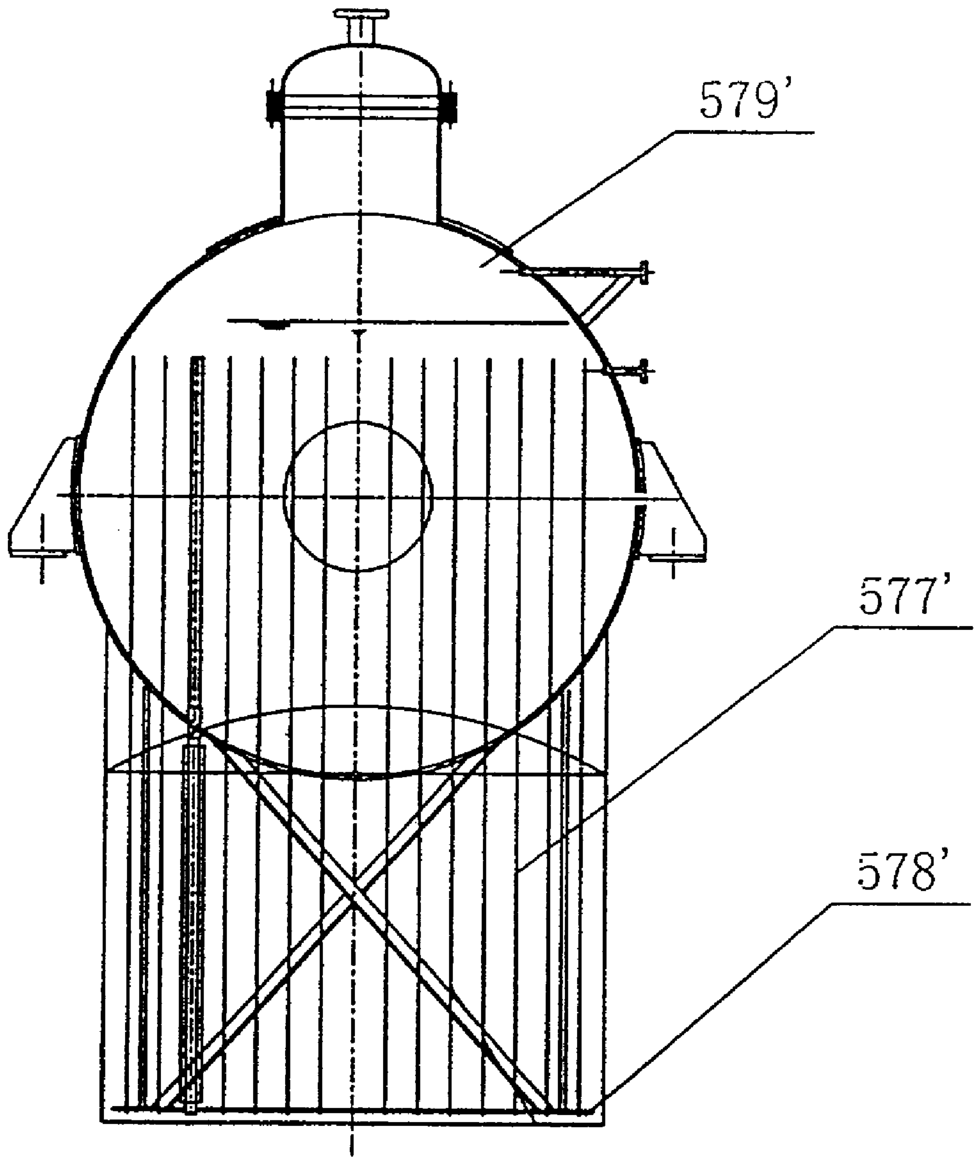
Figure 5R:
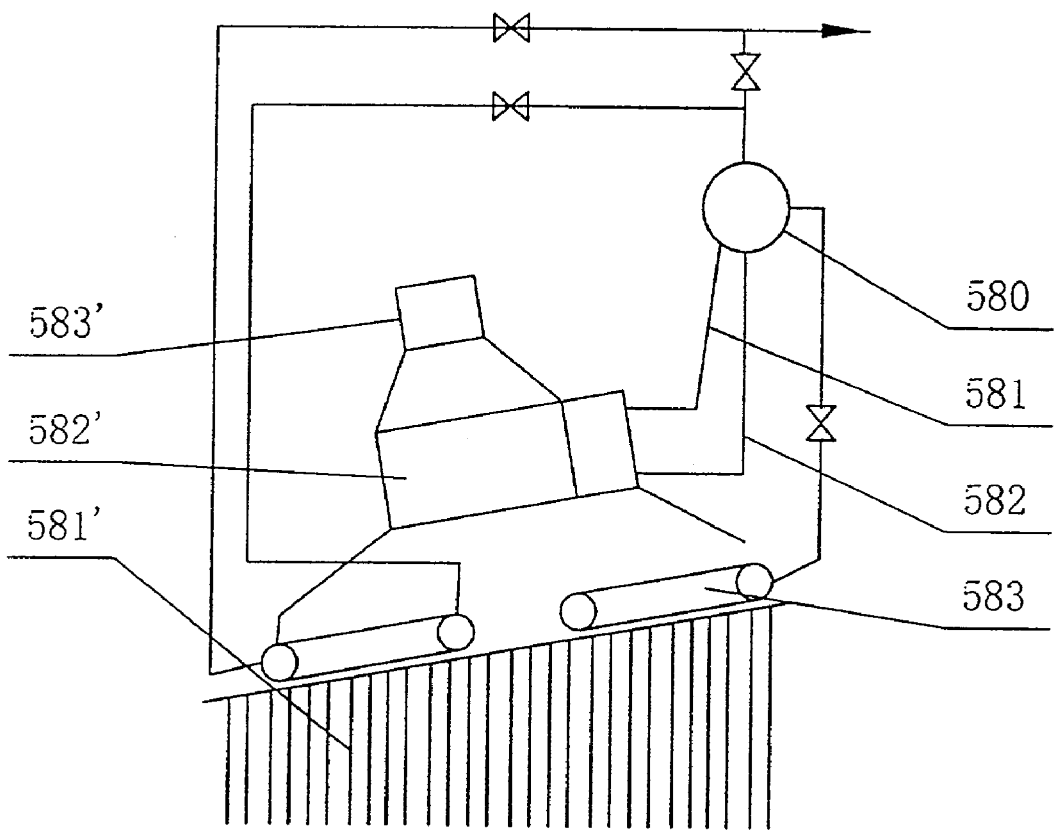
Figure 5S:
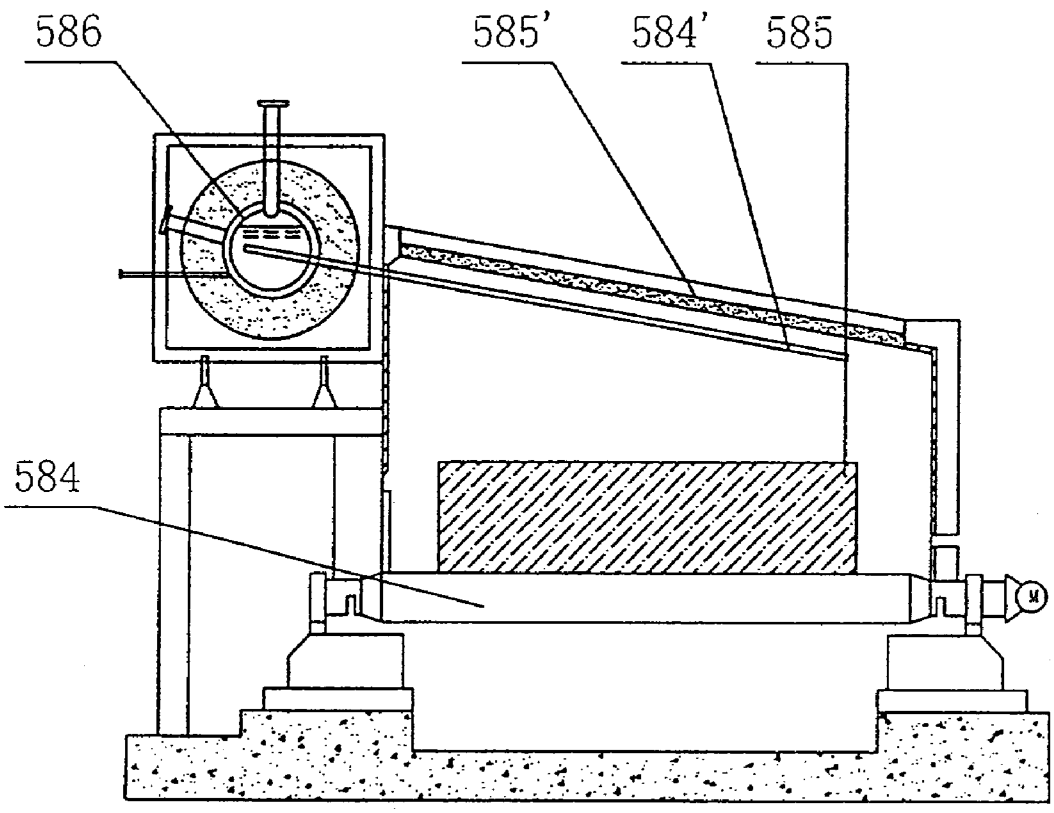
FIG. 5S shows a schematic view of an afterheat boiler for the coupling casting machine with the high heat transfer rate element according to the present invention.
Figure 5T:
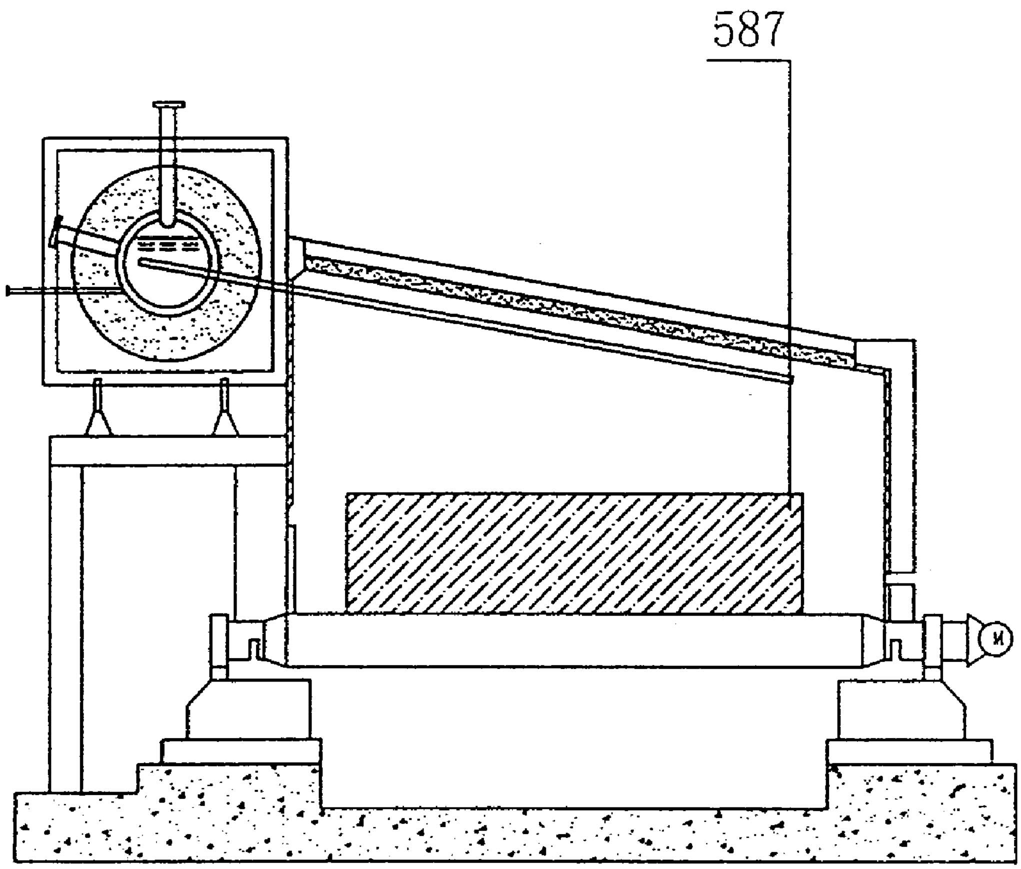
FIG. 5T shows a schematic view of a mineral plant billet afterheat boiler with the high heat transfer rate element of the present invention.
Figure 5U:
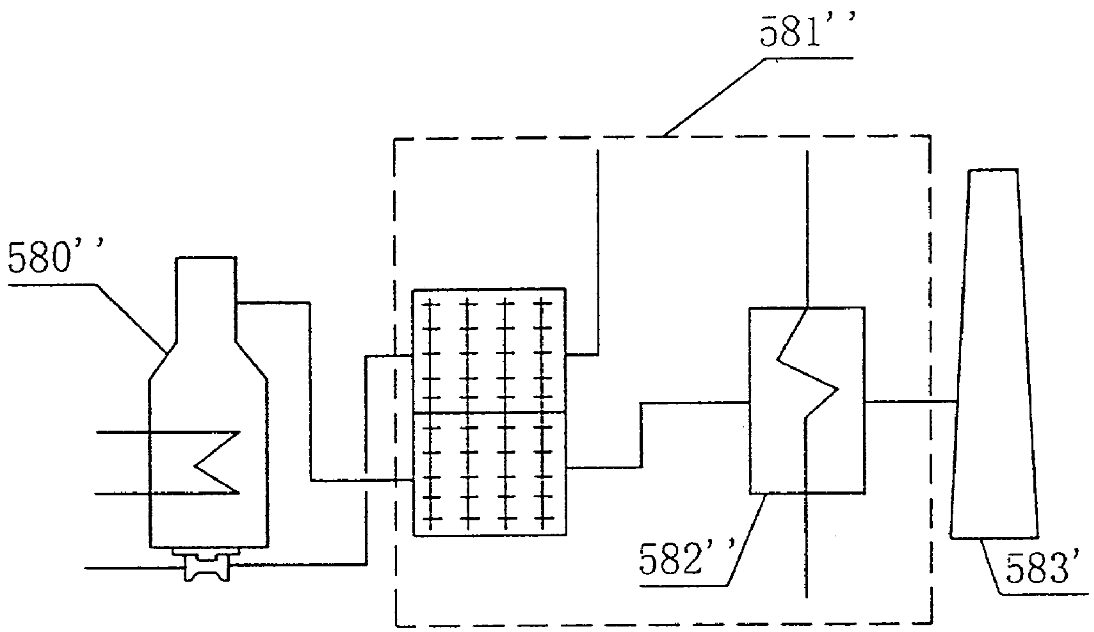
FIG. 5UA shows a schematic view of the heat recovery system process of a fuel oil industrial furnace with the high heat transfer rate element according to the present invention.
Figure 5U:
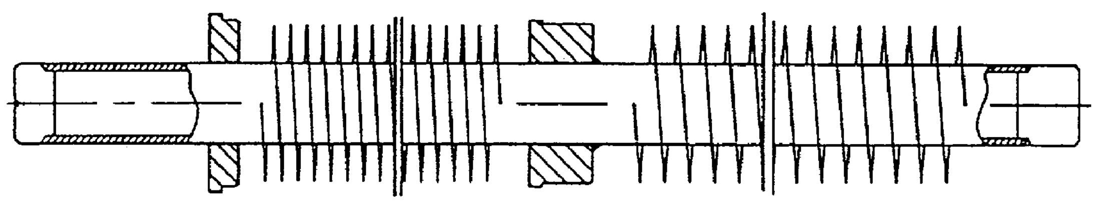
Figure 5V:
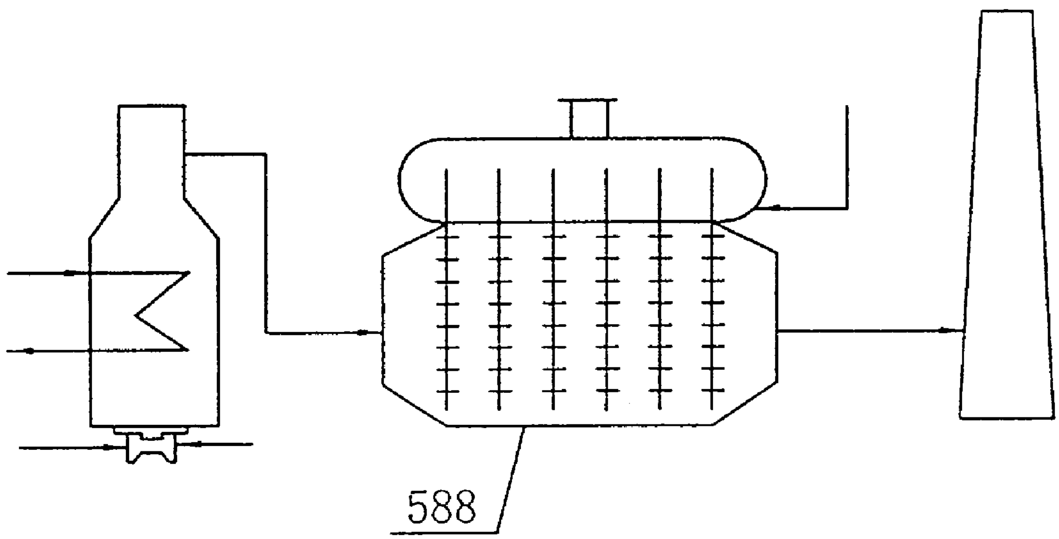
FIG. 5V shows the schematic operating process of a fuel oil industrial furnace stream generator with the high heat transfer rate element according to the present invention.
Figure 5W:
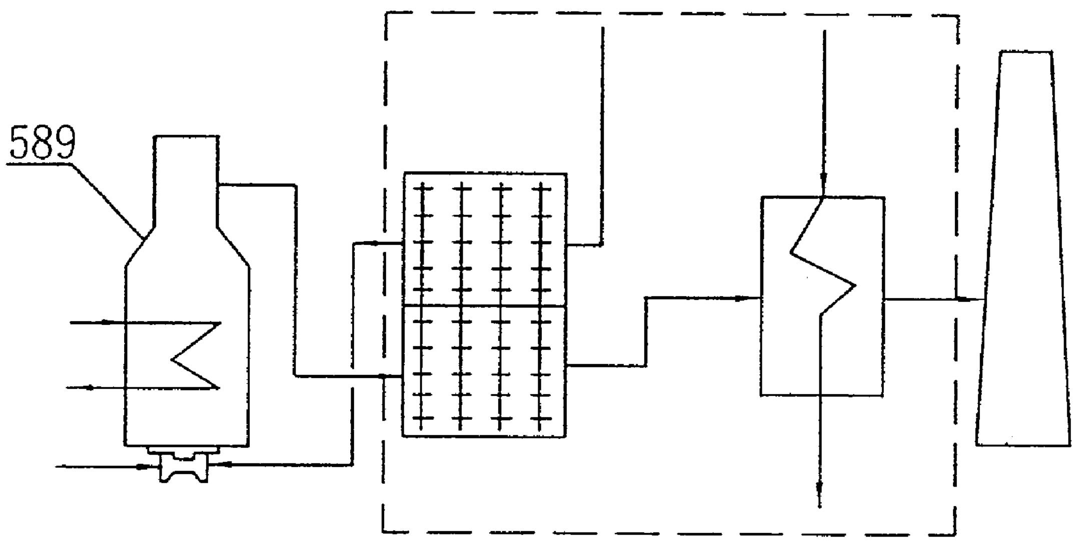
FIG. 5W shows the schematic heat recovery system process of a gas industrial furnace with the high heat transfer element according to the present invention.
Figure 5X:
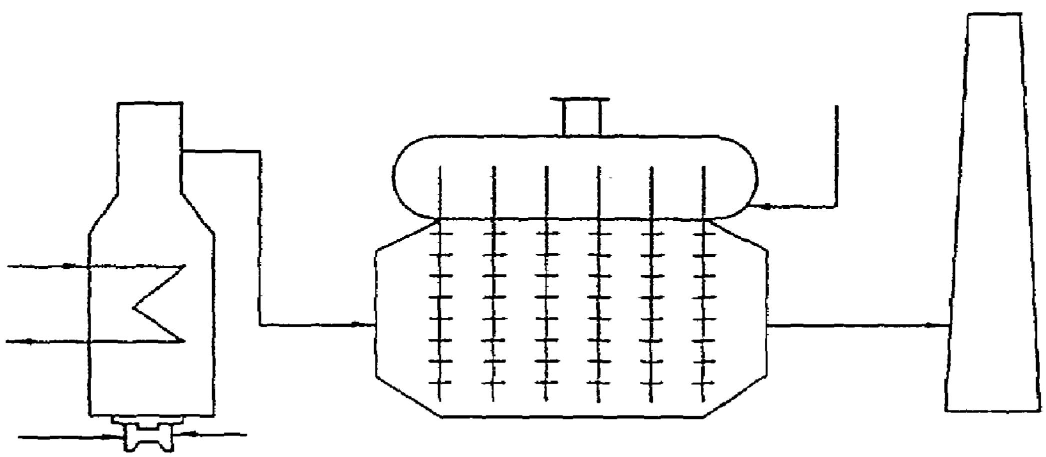
FIG. 5X shows the schematic operating process of a stream generator of a gas industrial furnace with the high heat transfer rate element according to the present invention.
Figure 5Y:
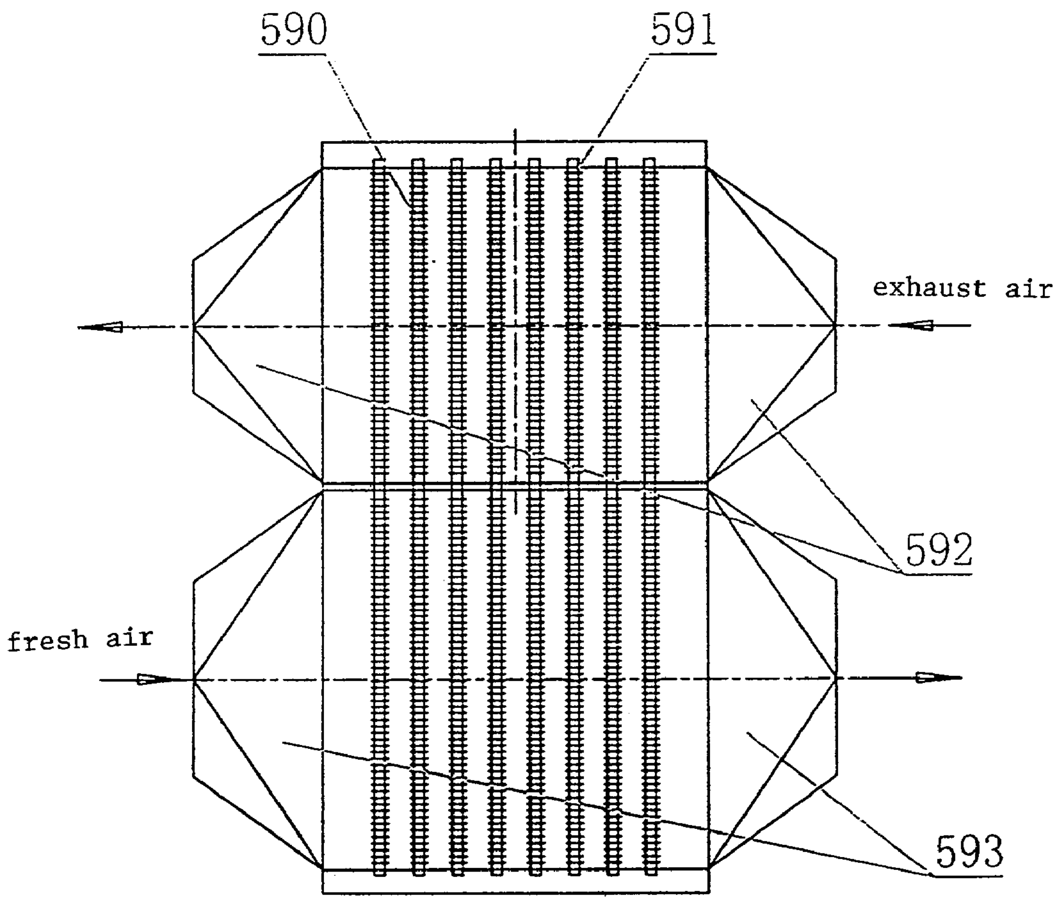
FIG. 5Y shows a schematic view of a heat exchanger with high heat transfer rate in a dryer energy cycling system.
Figure 5Z:
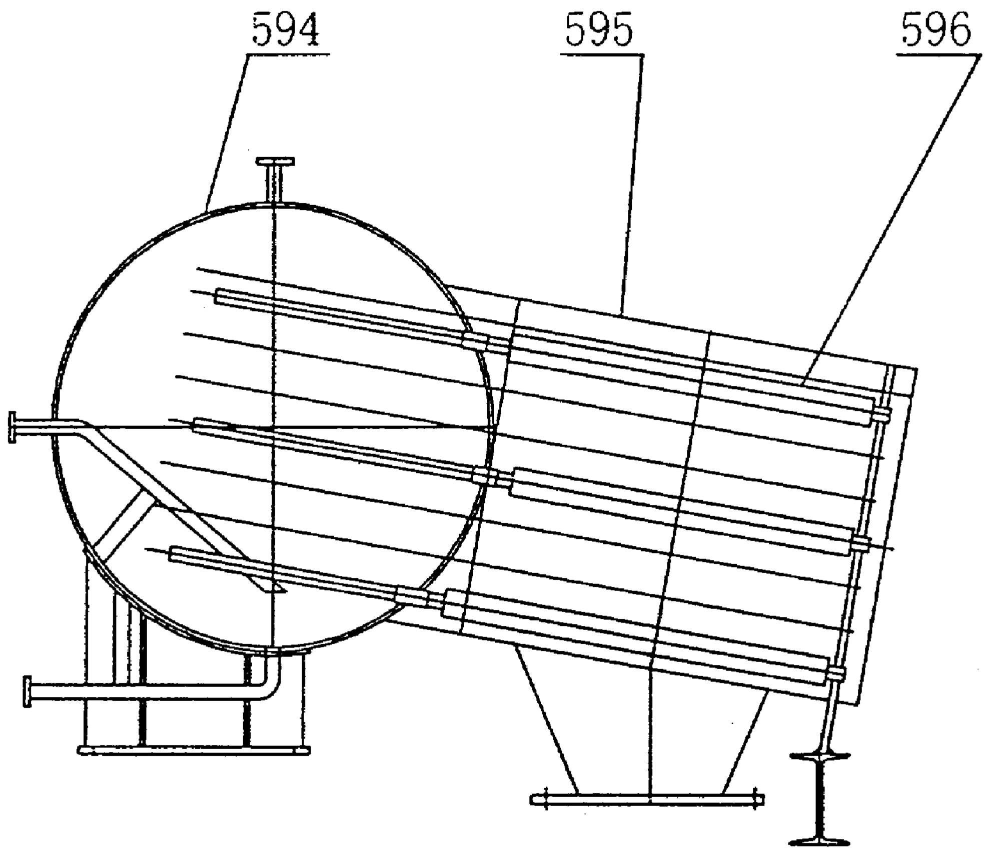
FIG. 5Z shows a schematic view of a heat recovery apparatus used in restaurants, which consists of the high heat transfer rate element according to the present invention.
Figure 5Z:
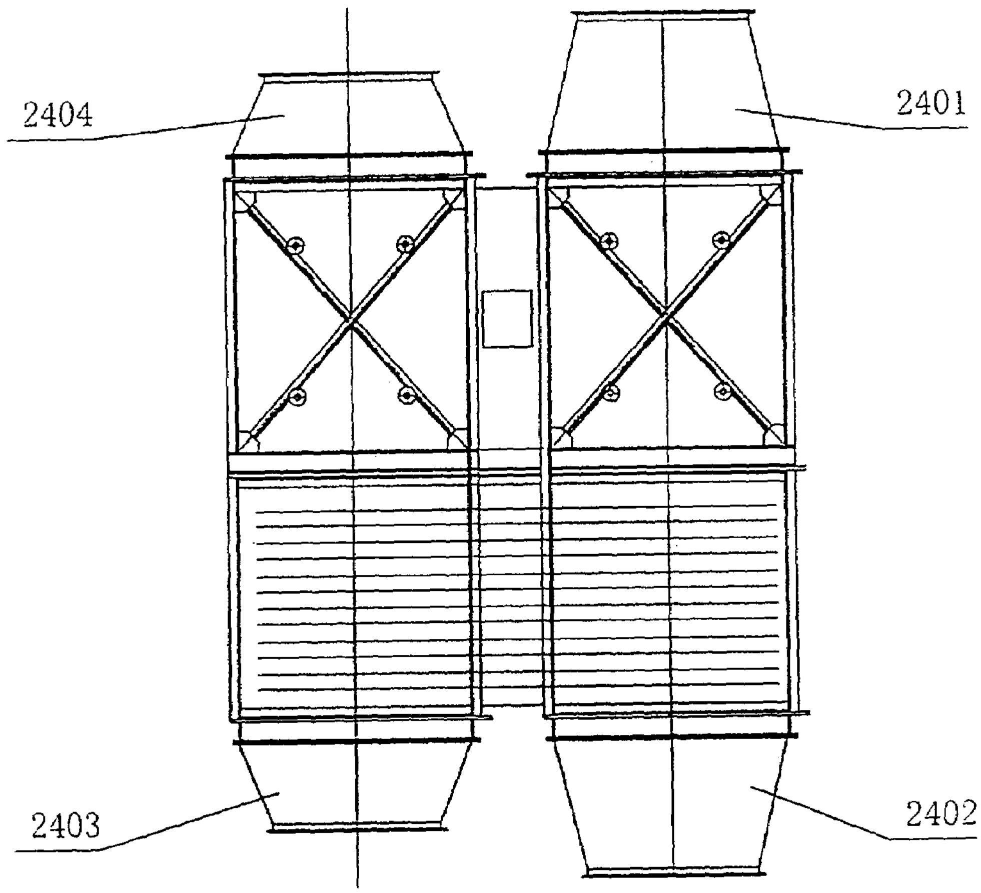
Figure 5Z:
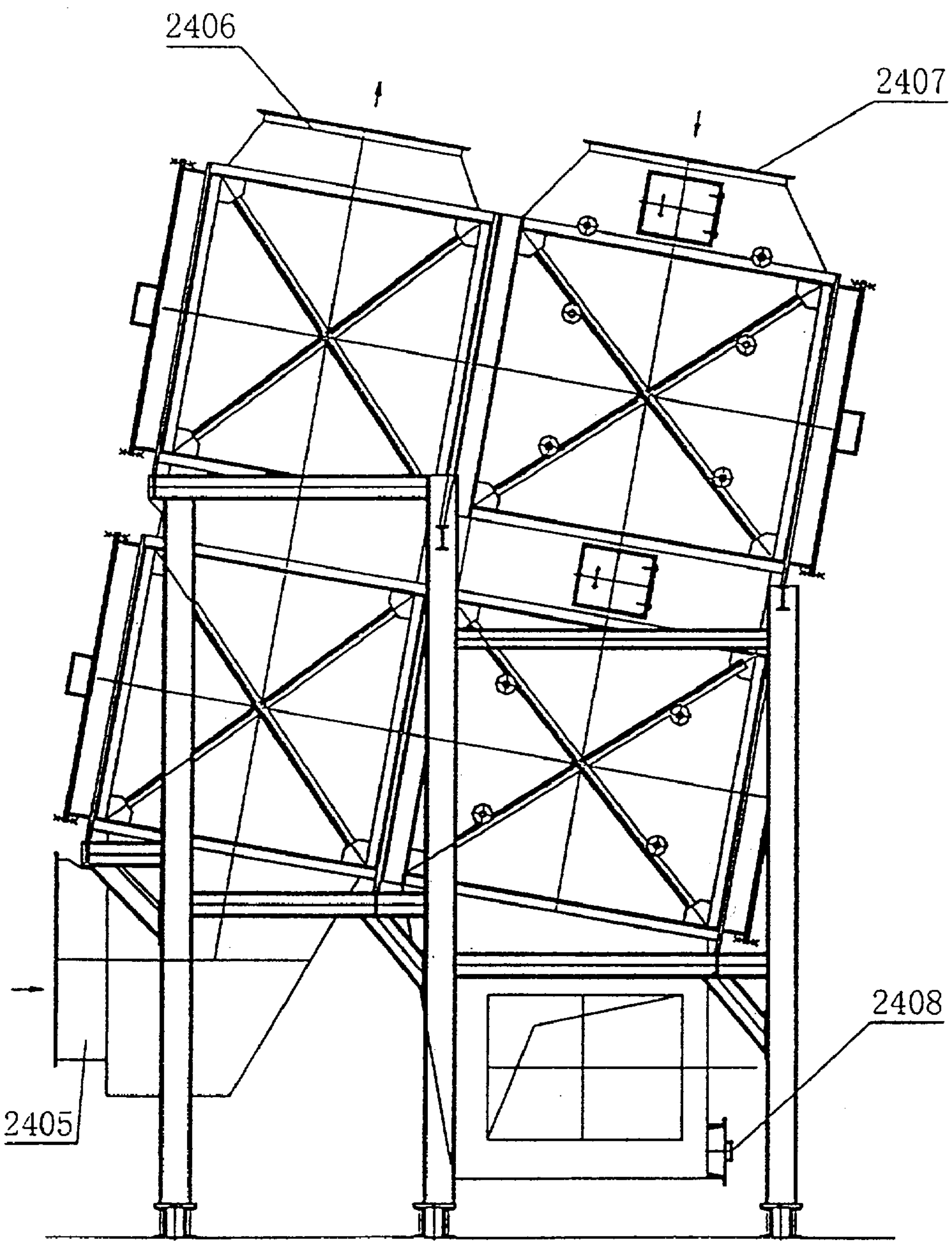
Figure 5Z:
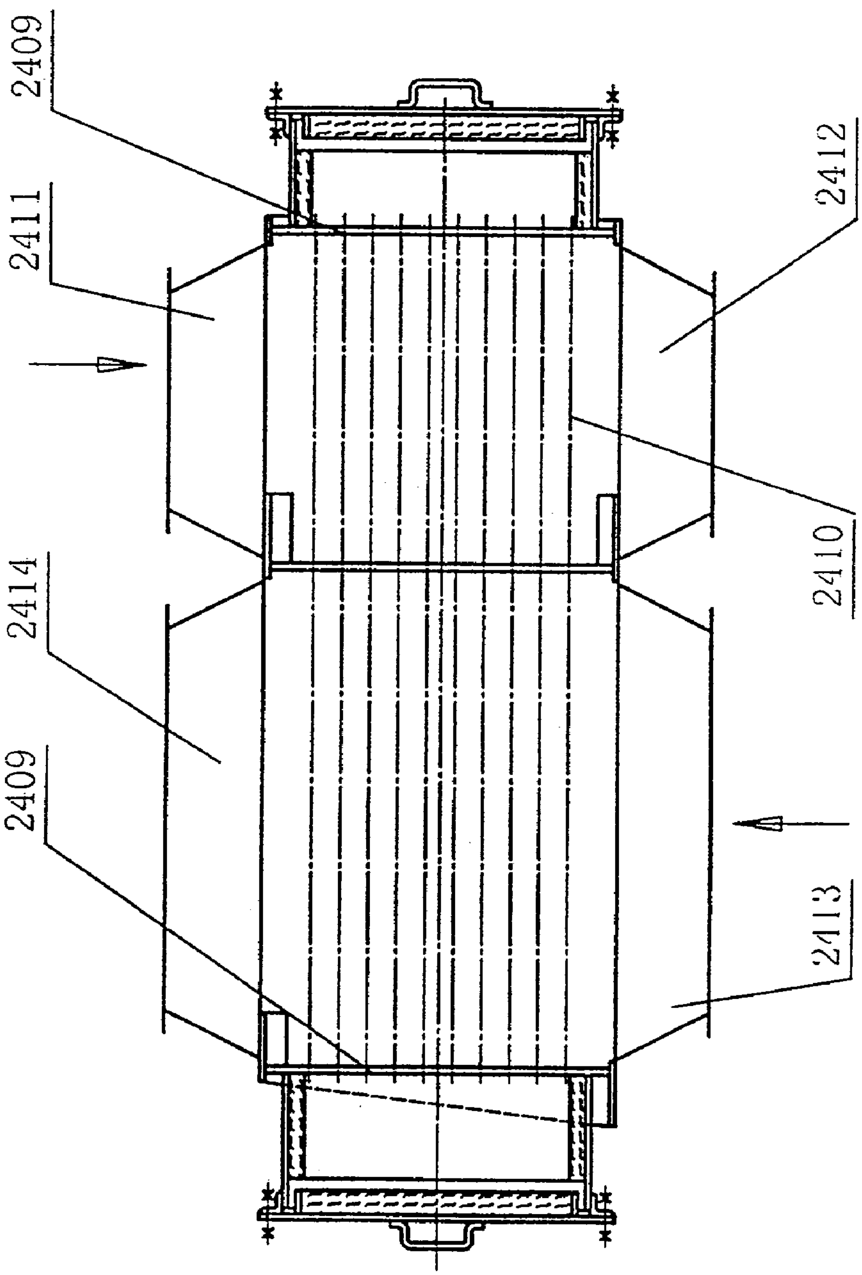
Figure 5Z:
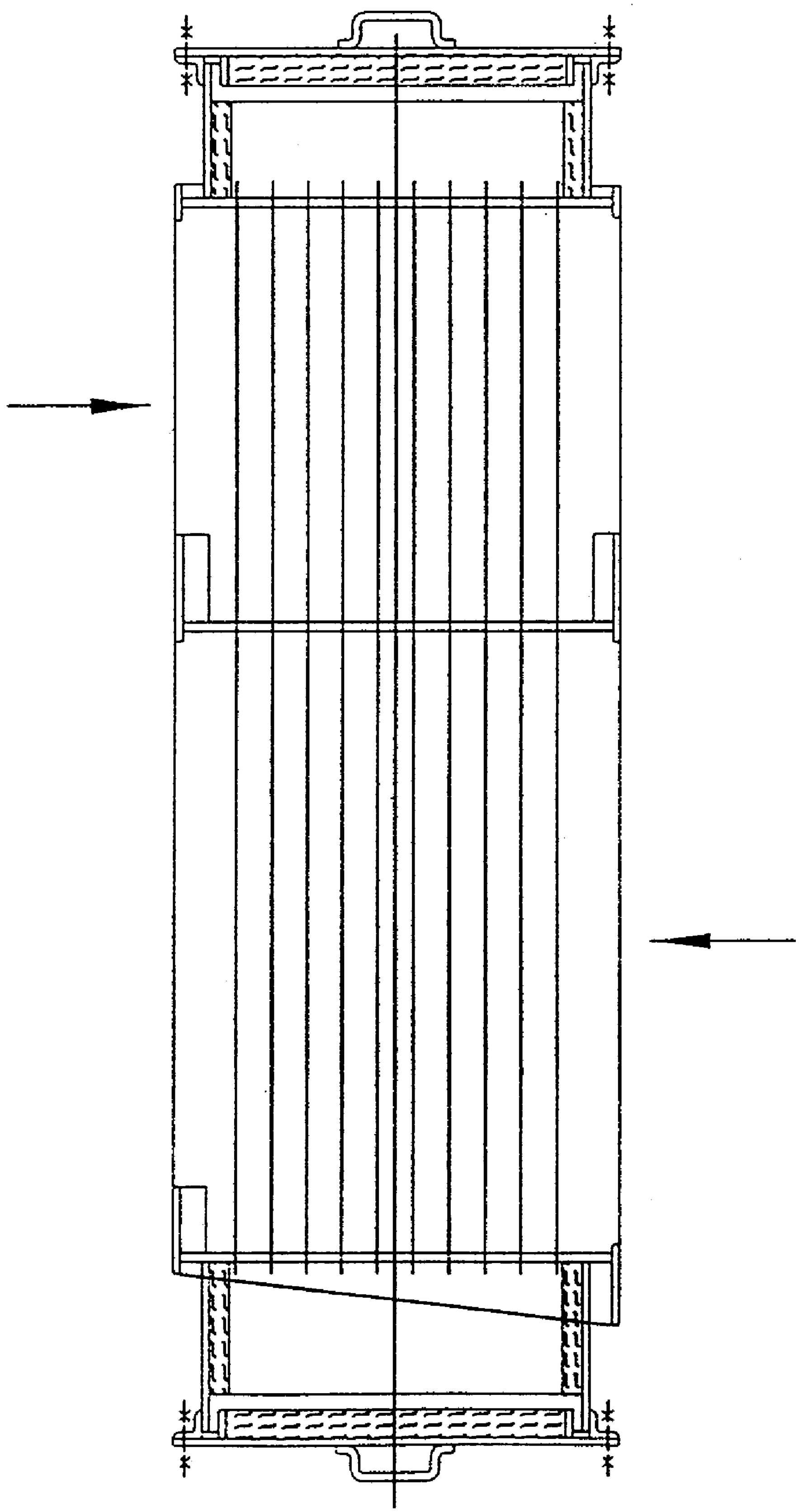
Figure 5Z:
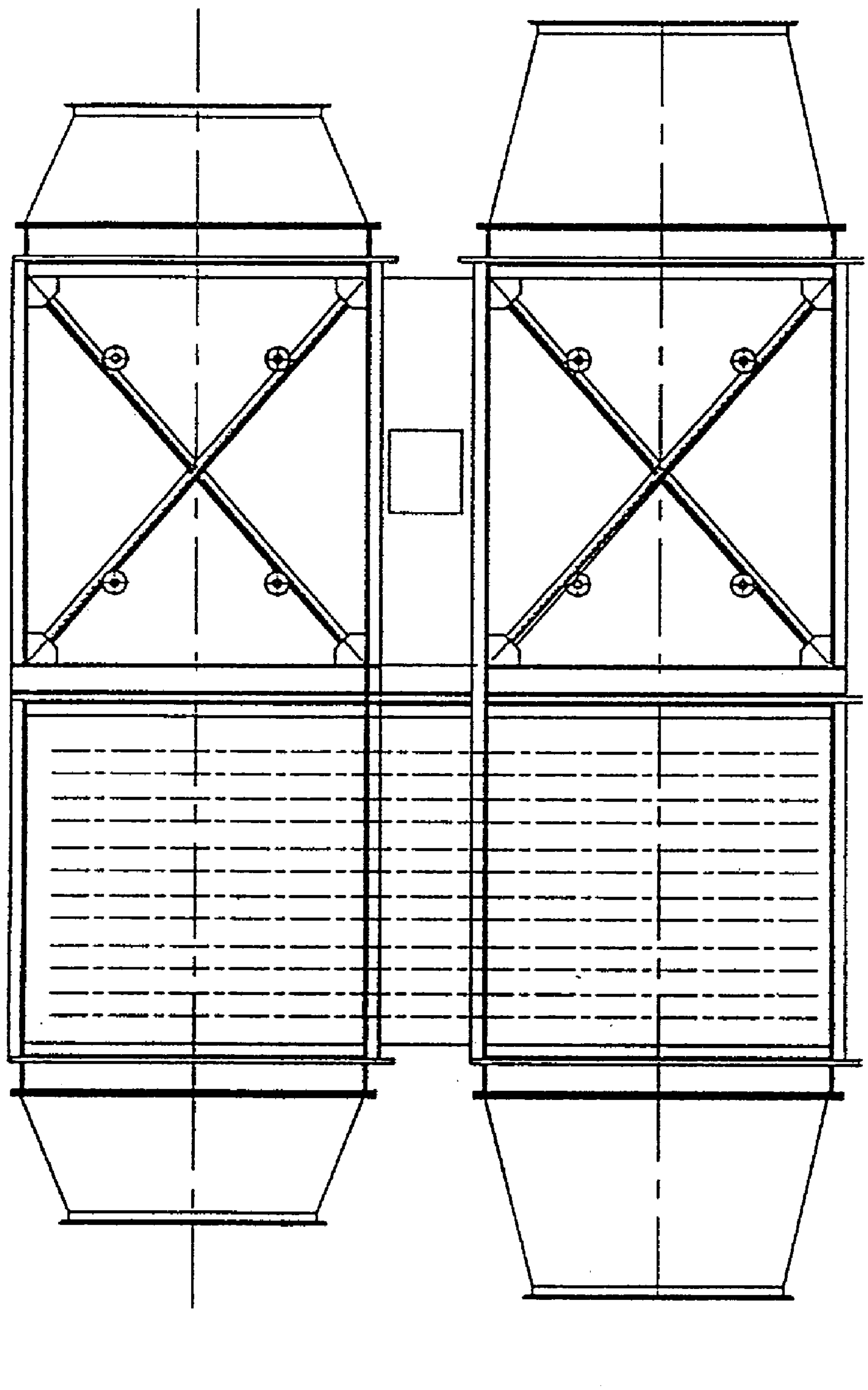
Figure 5Z:
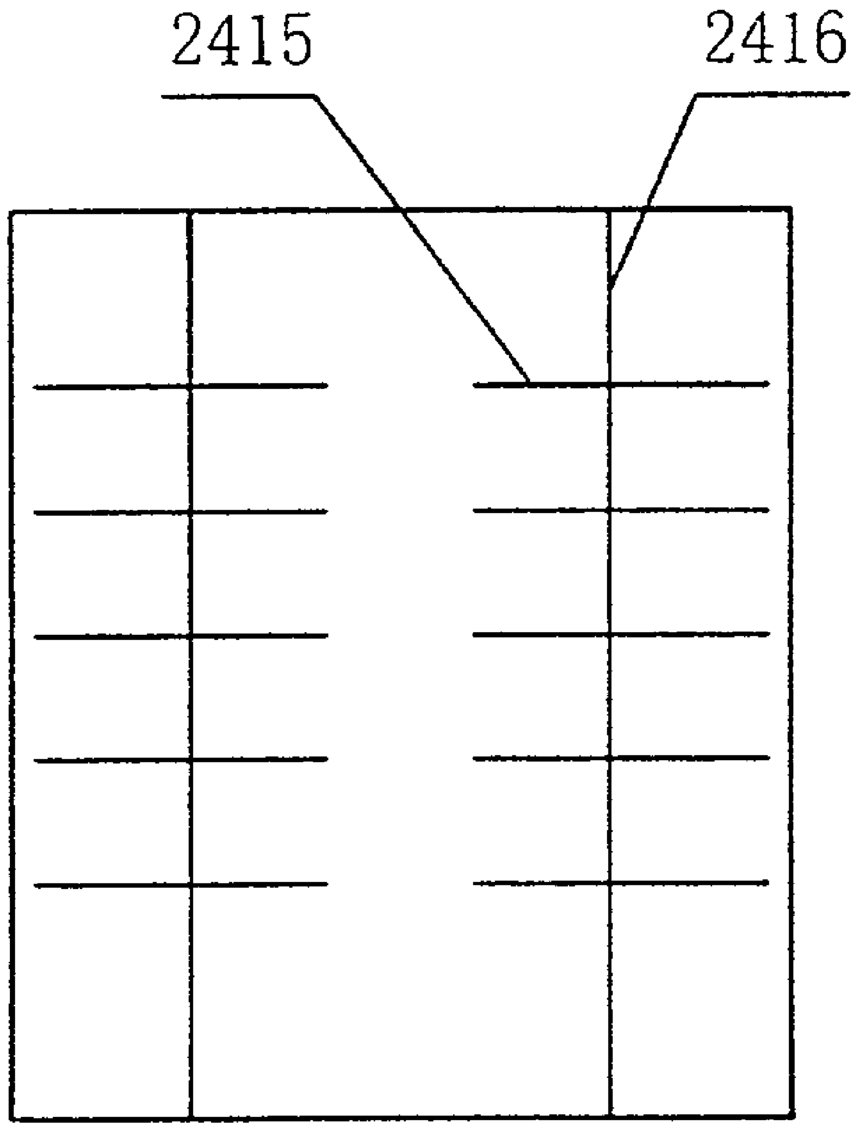
Figure 5Z:
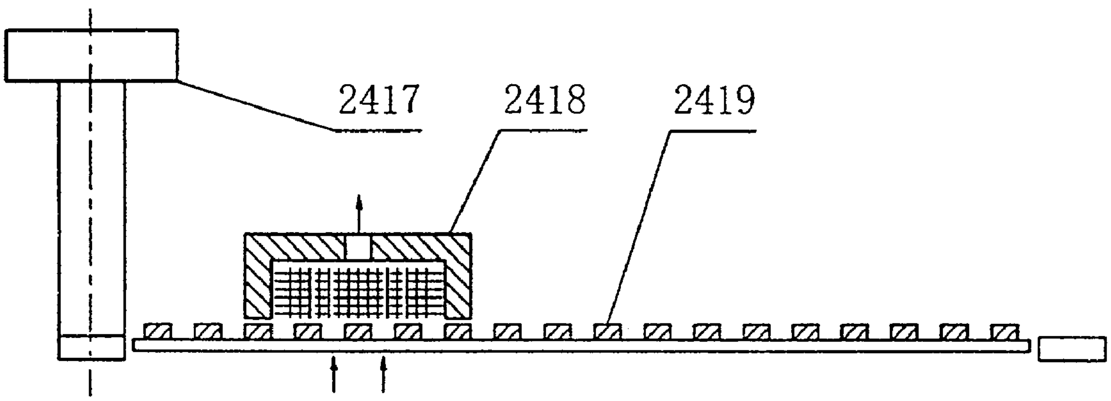
Figure 5Z:
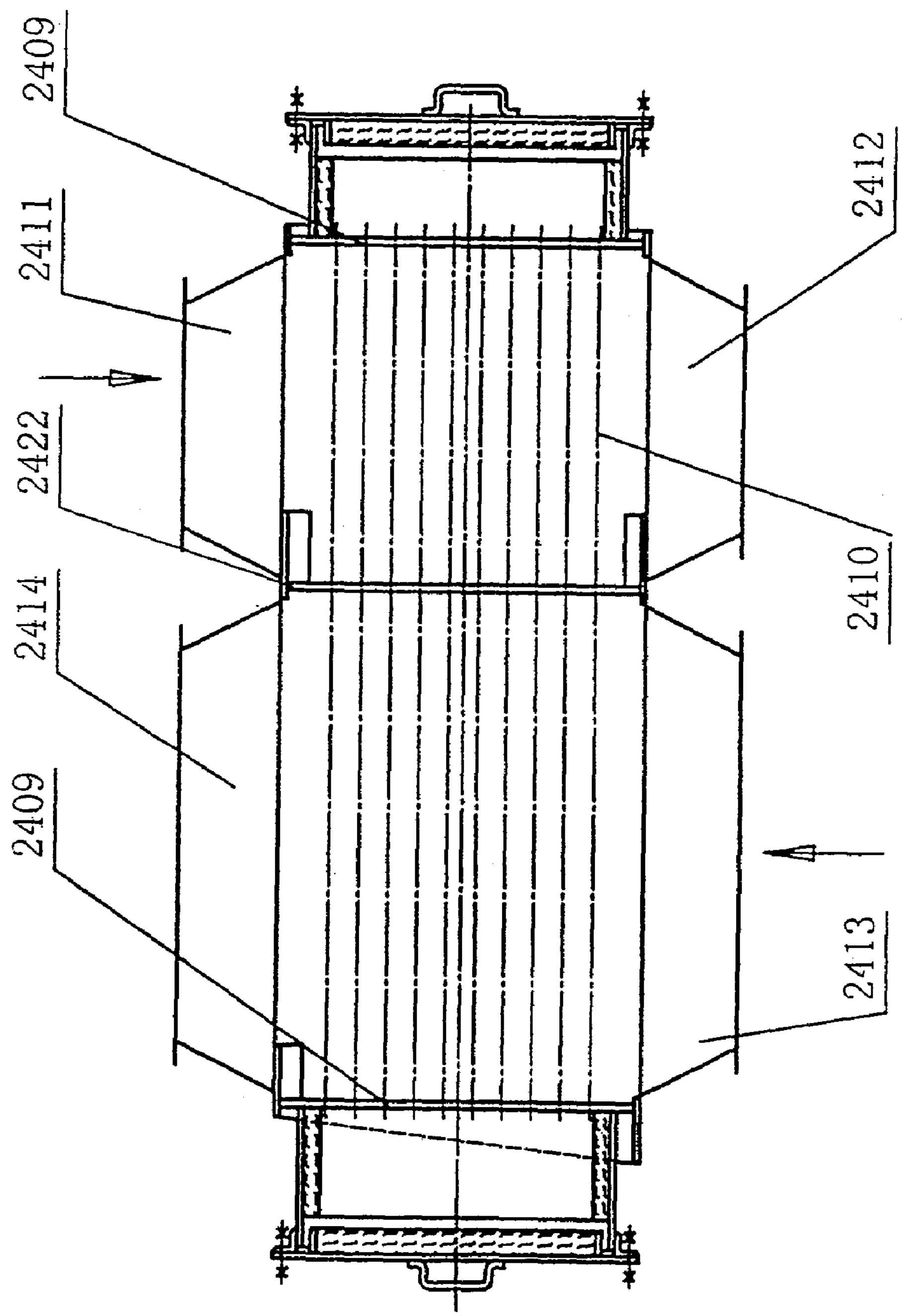
Figure 5Z:
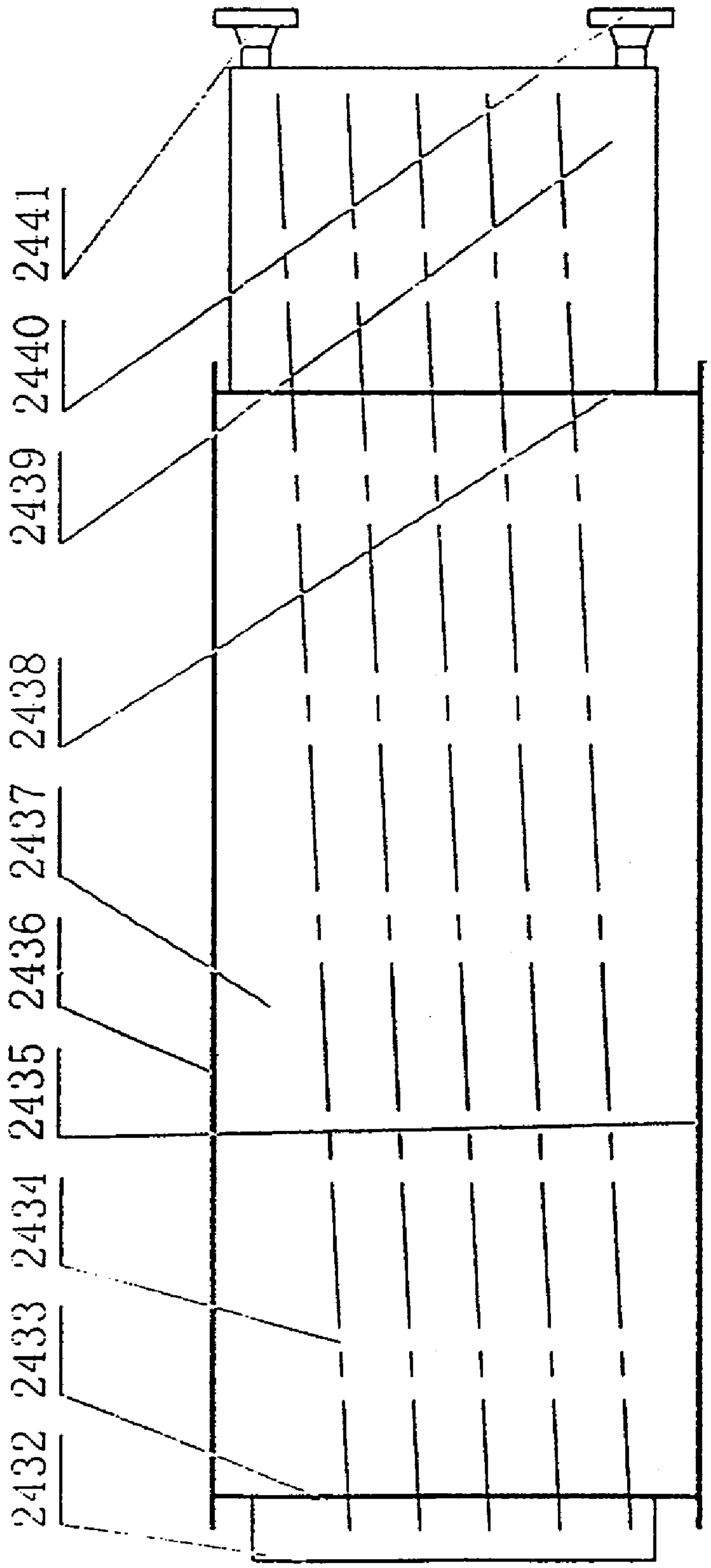
Figure 5Z:
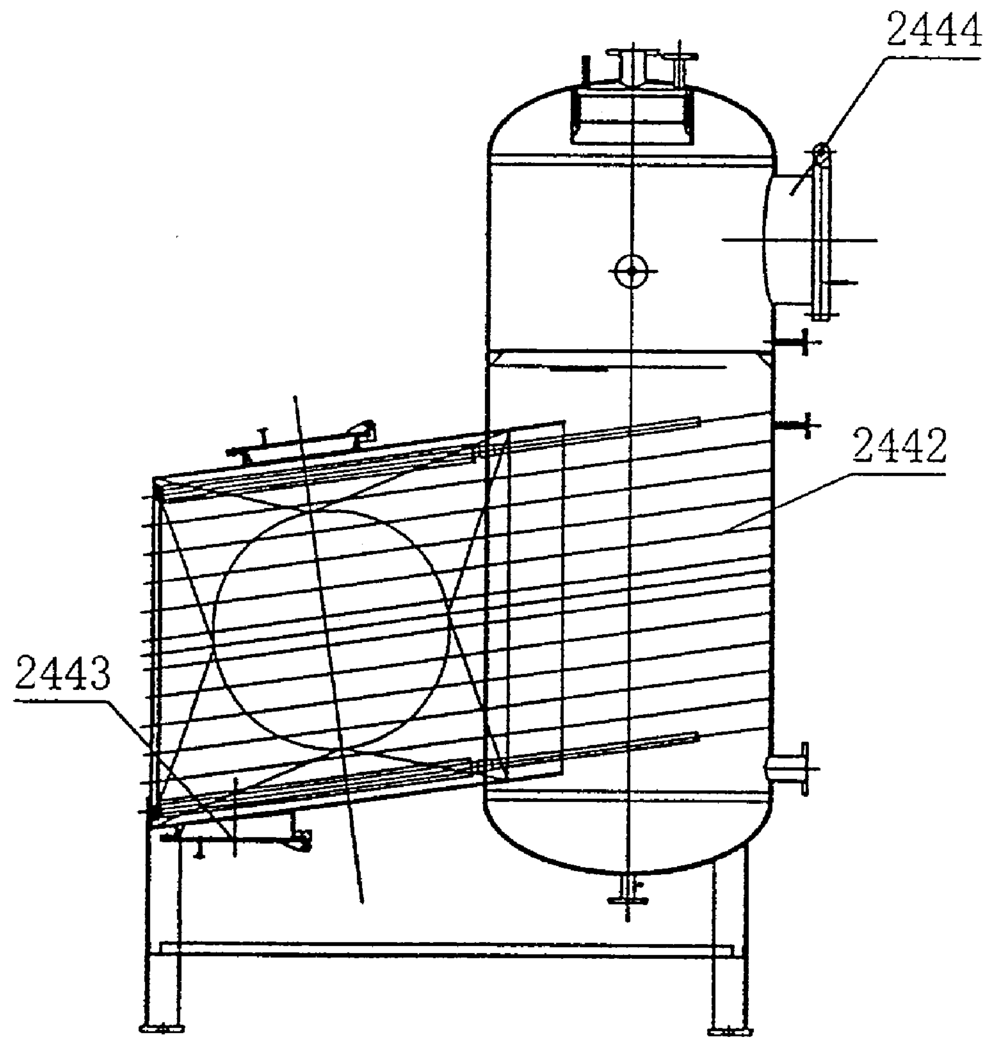

FIG. 5ZOC is the saddle type structure of a heat pipe heat recovery device.

FIG. 5ZOD shows a sectional view of a vortex scroll heat exchanger.

FIG. 5ZOG is the structure of the sulfur trioxide heat exchanger with high heat transfer rate element.

FIG. 5ZOH shows the structure and theory of a total counter flow heat exchanger with high heat transfer rate.

FIG. 5ZOJ shows a front view of a joint air pre-heater in a heating furnace with constant depressurizing devices.

FIG. 5ZOK shows a front view of a joint air pre-heater in a heating furnace with constant depressurizing devices.

FIG. 5ZPA shows a schematic view of the structure of a corrosion-proof heat transfer pipe in an anti-dew-point corrosion air pre-heater with high heat transfer rate.

FIG. 5ZPD shows a top view of FIG. 5ZOD.

FIG. 5ZPH shows a view of A—A in FIG. 5ZOH.

FIG. 5ZPJ shows a schematic partially zoom-in view of a high heat transfer rate pipe.

FIG. 5ZPK shows a schematic partially zoom-in view of a high heat transfer rate pipe.

Figure 6A:
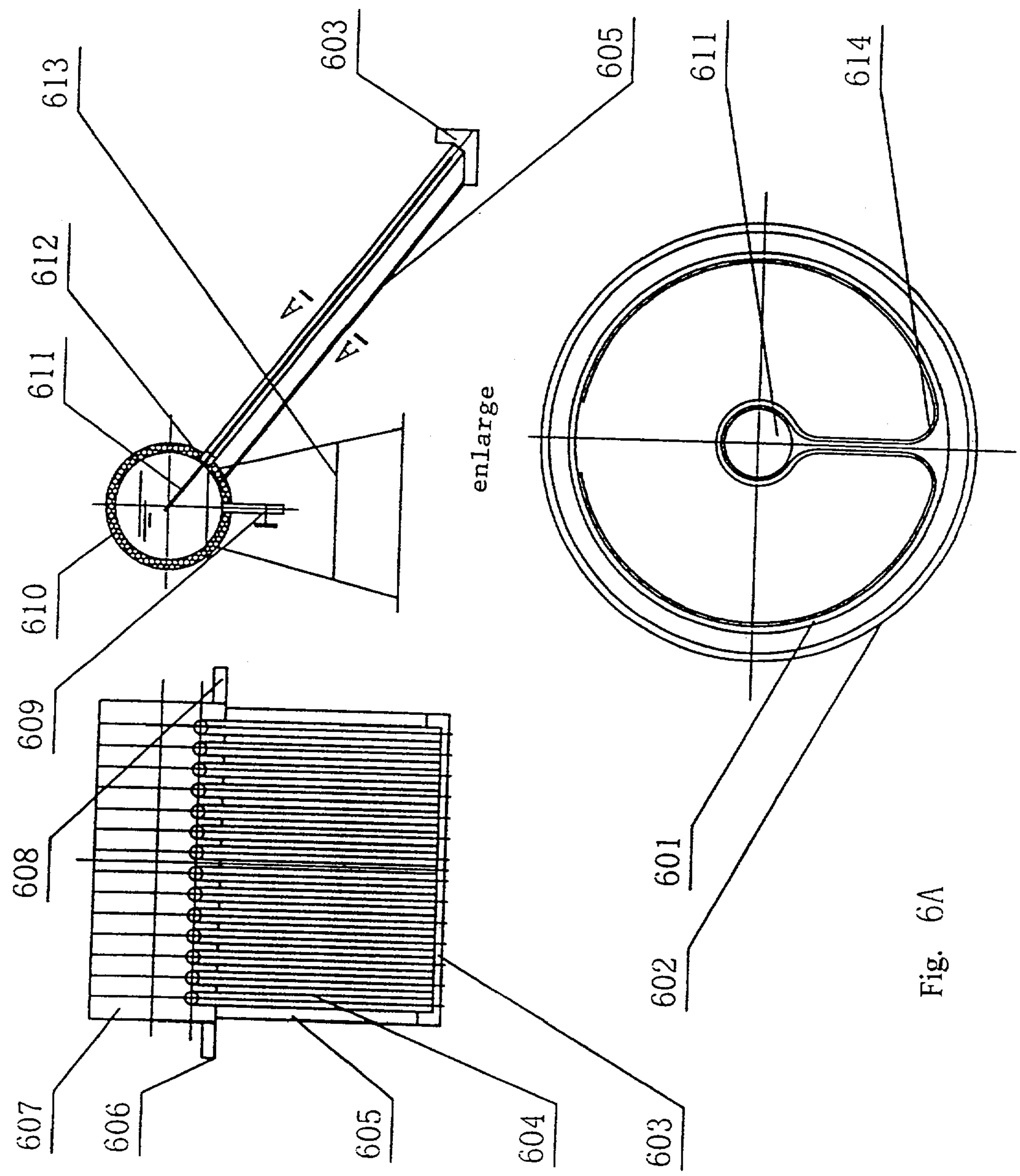

FIG. 6A shows a solar water heater with high heat transfer rate according to the present invention.

Figure 6B:
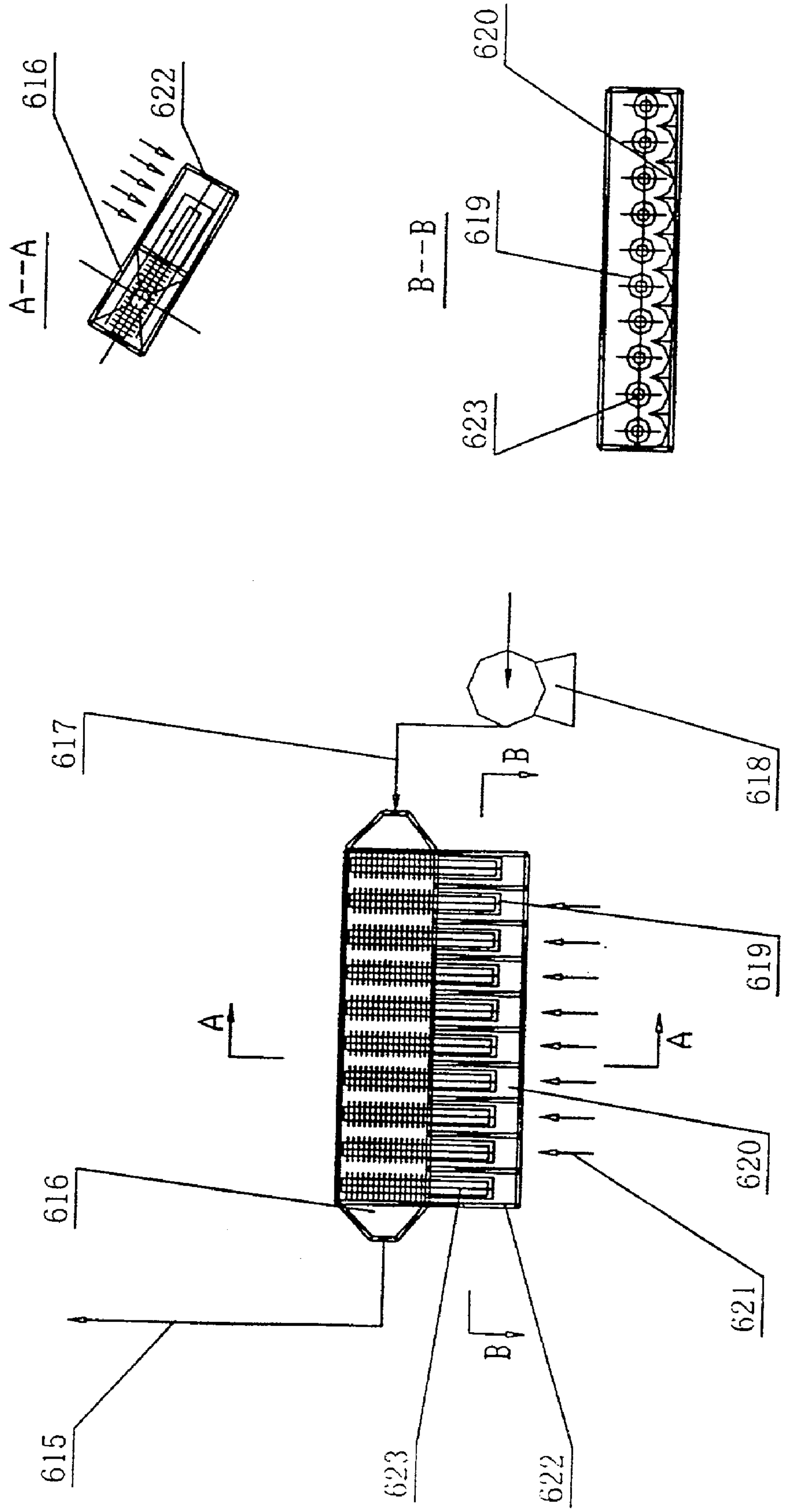

FIG. 6B shows an integrated air tool with high heat transfer rate according to the present invention.

Figure 6C:
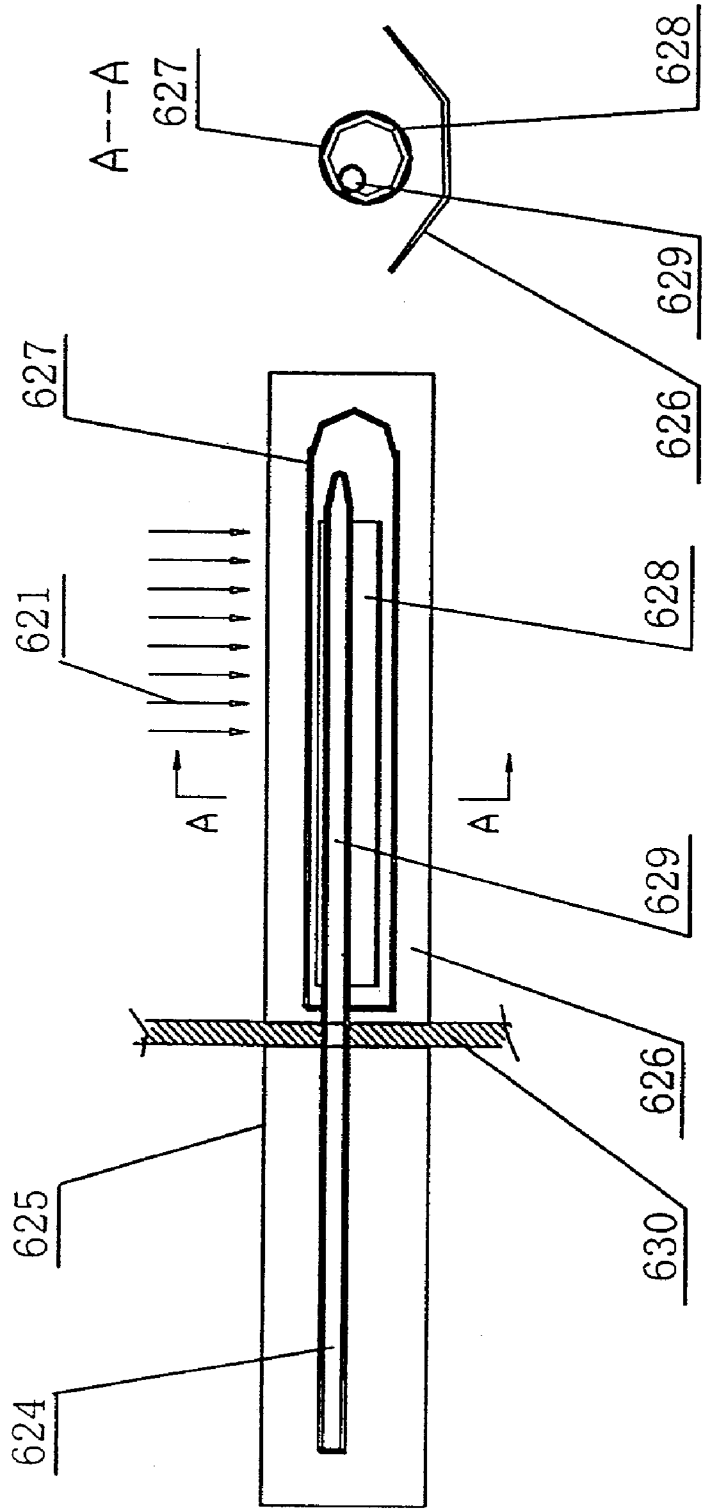

FIG. 6C shows a schematic view of a vacuum tube of the solar water heater with high heat transfer rate according to the present invention.

Figure 6D:
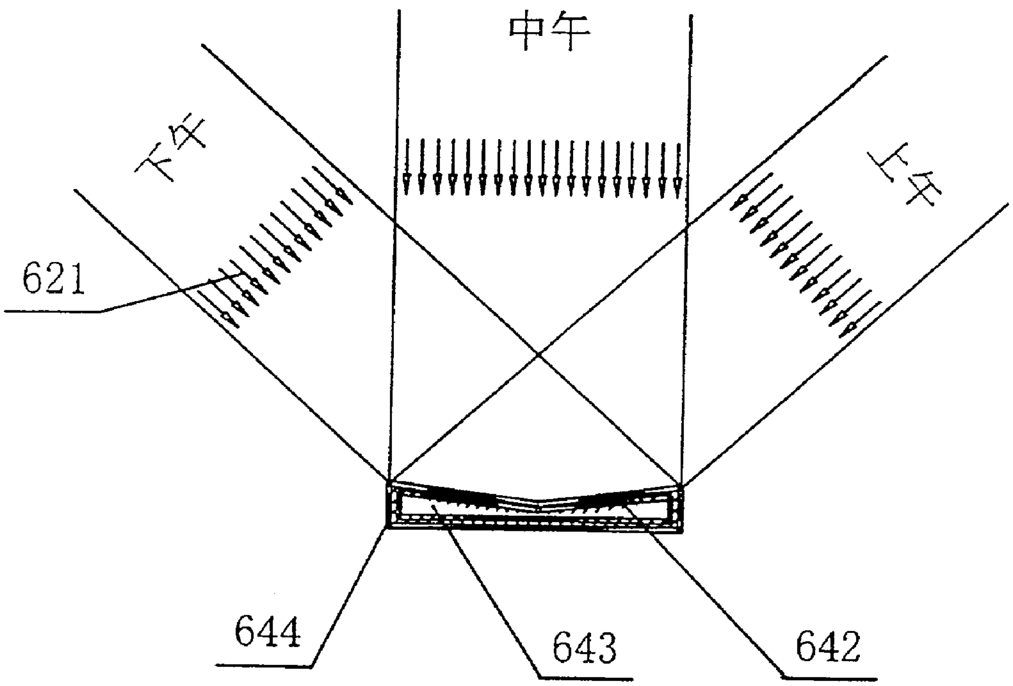

FIG. 6D shows a schematic view of a solar energy collector with high heat transfer rate according to the present invention.

Figure 6E:
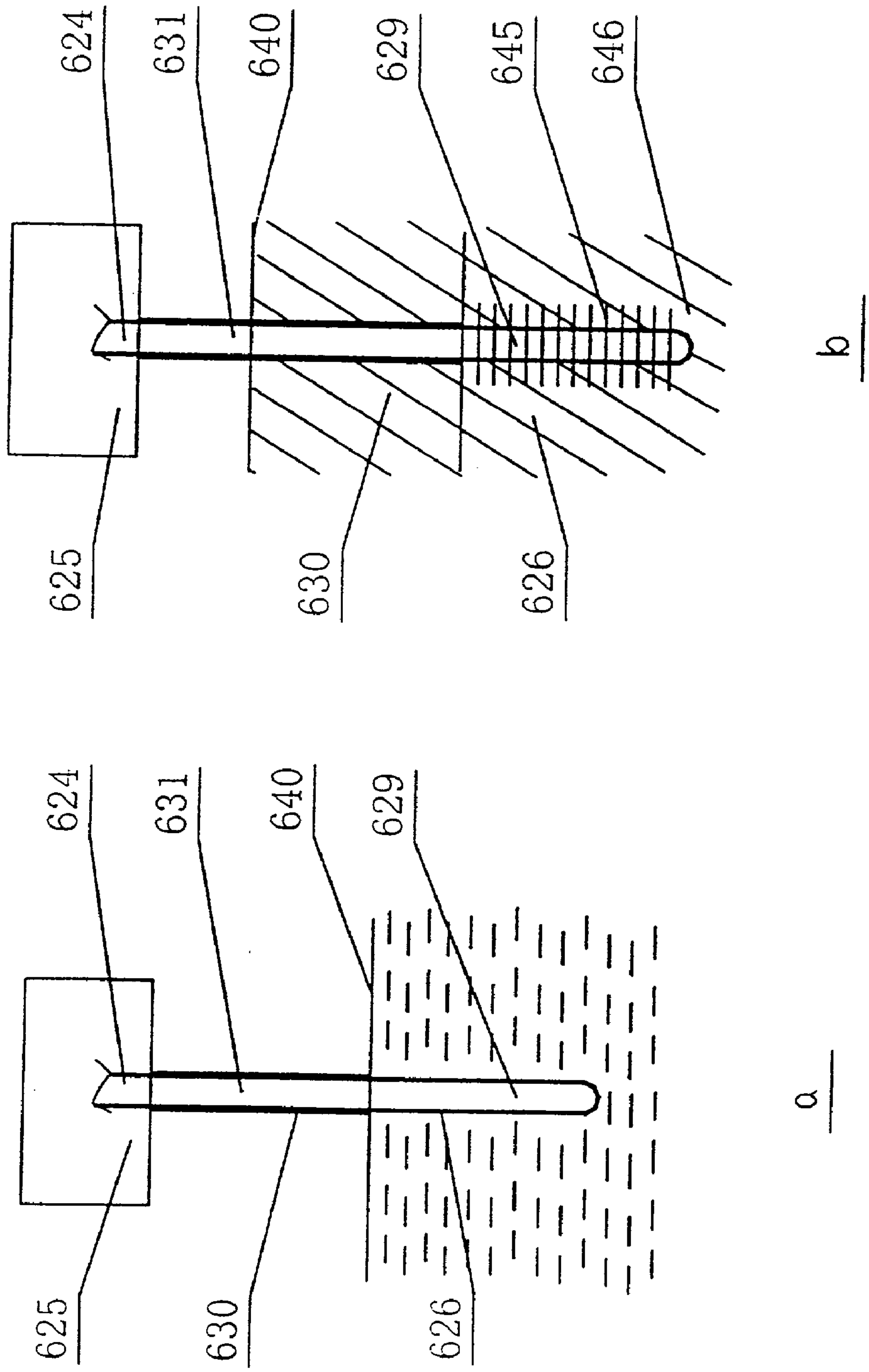

FIG. 6E is a schematic view of a high heat transfer rate element according to the present invention for geothermal energy collecting.

Figure 6F:
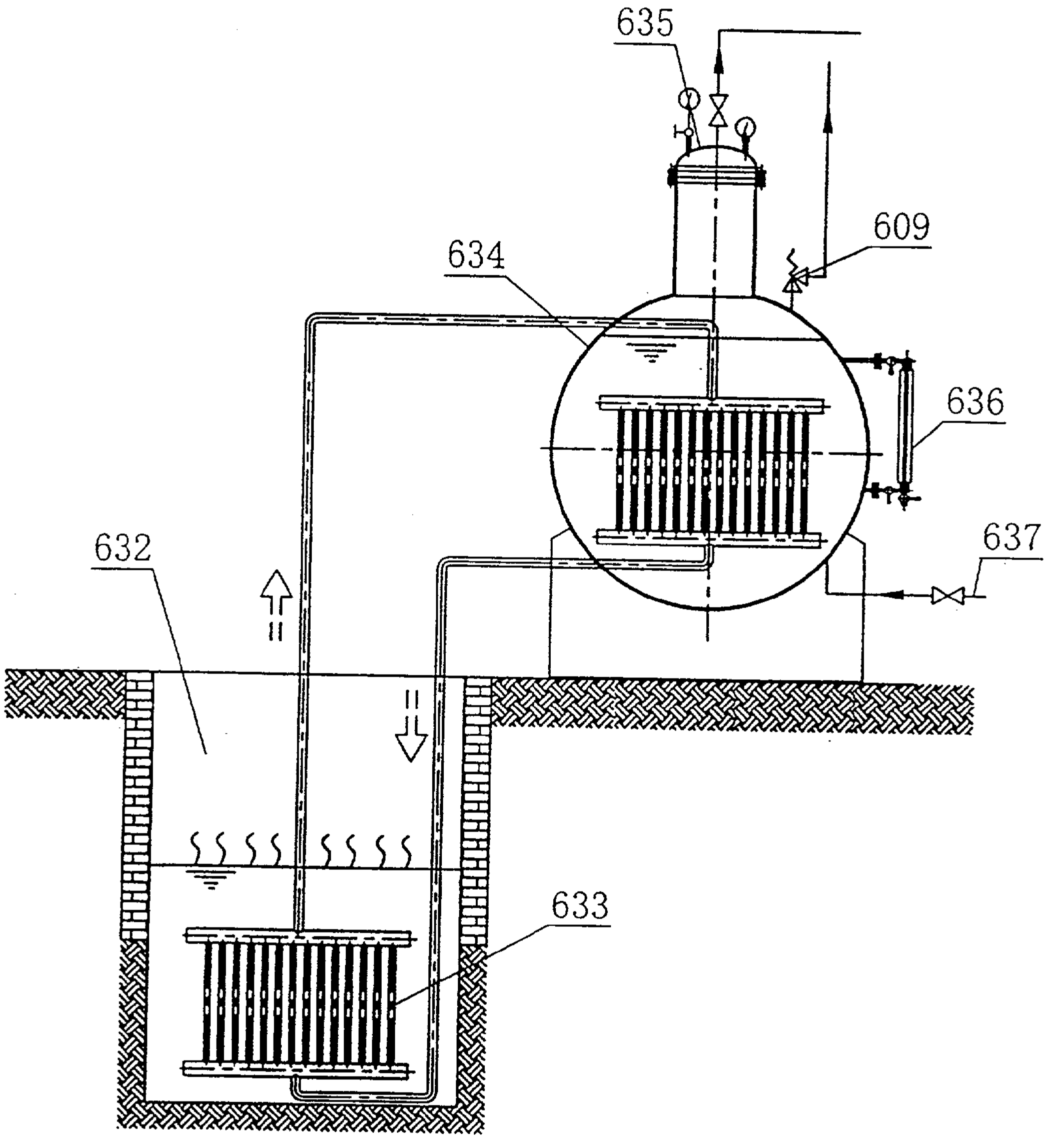

FIG. 6F is a schematic view of a geothermal boiler with high heat transfer rate according to the present invention.

Figure 6G:
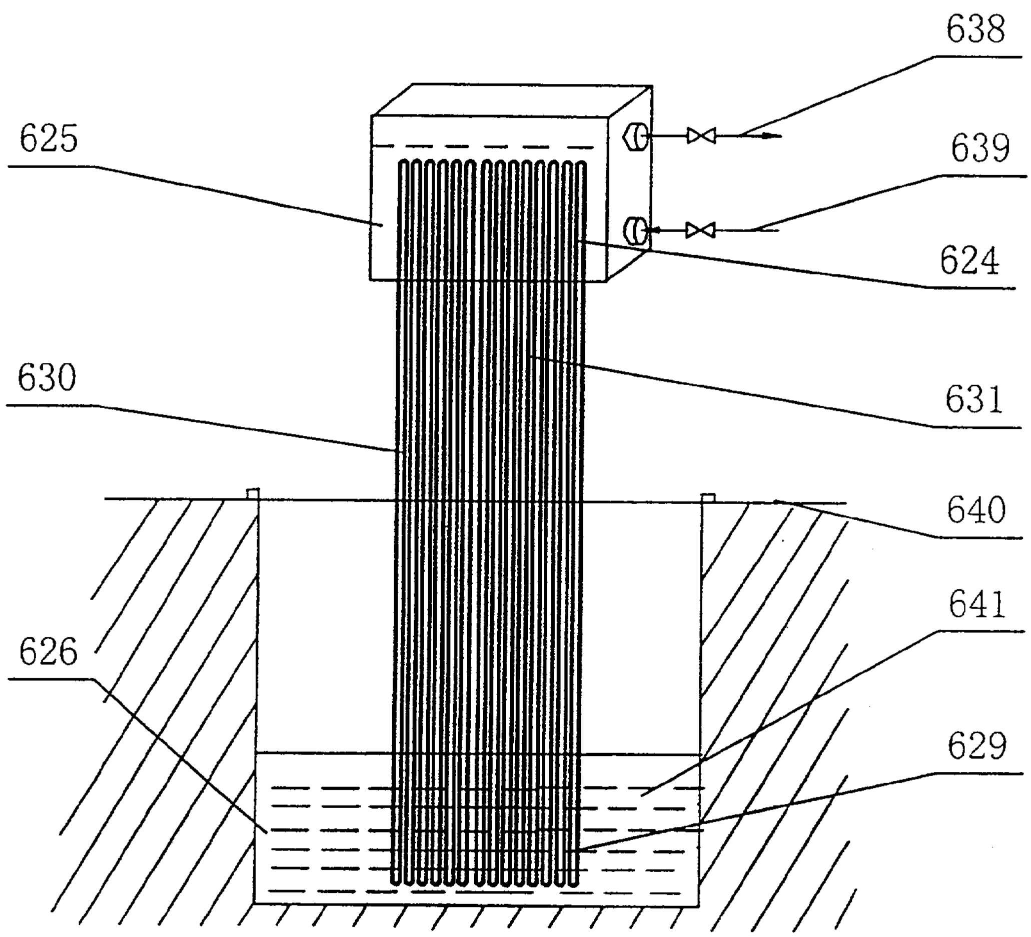

FIG. 6G shows a schematic view of a geothermal heat exchanger of water temperature with high heat transfer rate according to the present invention.

Figure 6H:
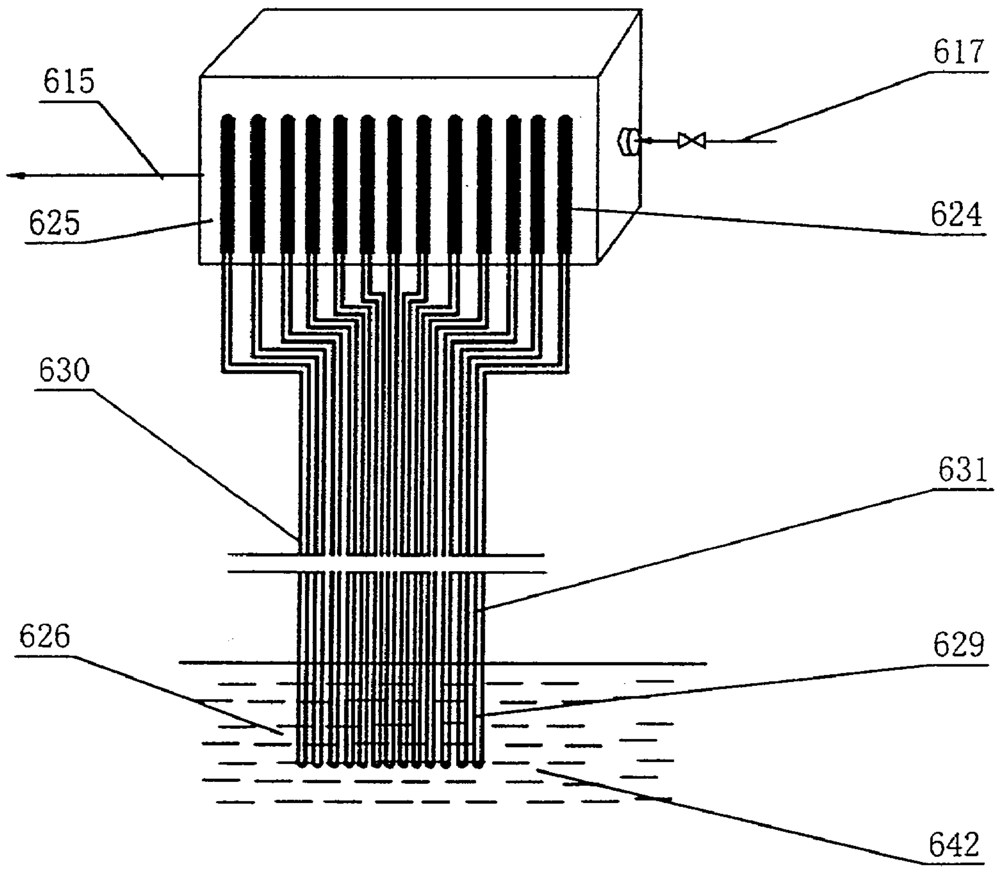

FIG. 6H shows a schematic view of a geothermal air heater with high heat transfer rate according to the present invention.

Figure 6I:
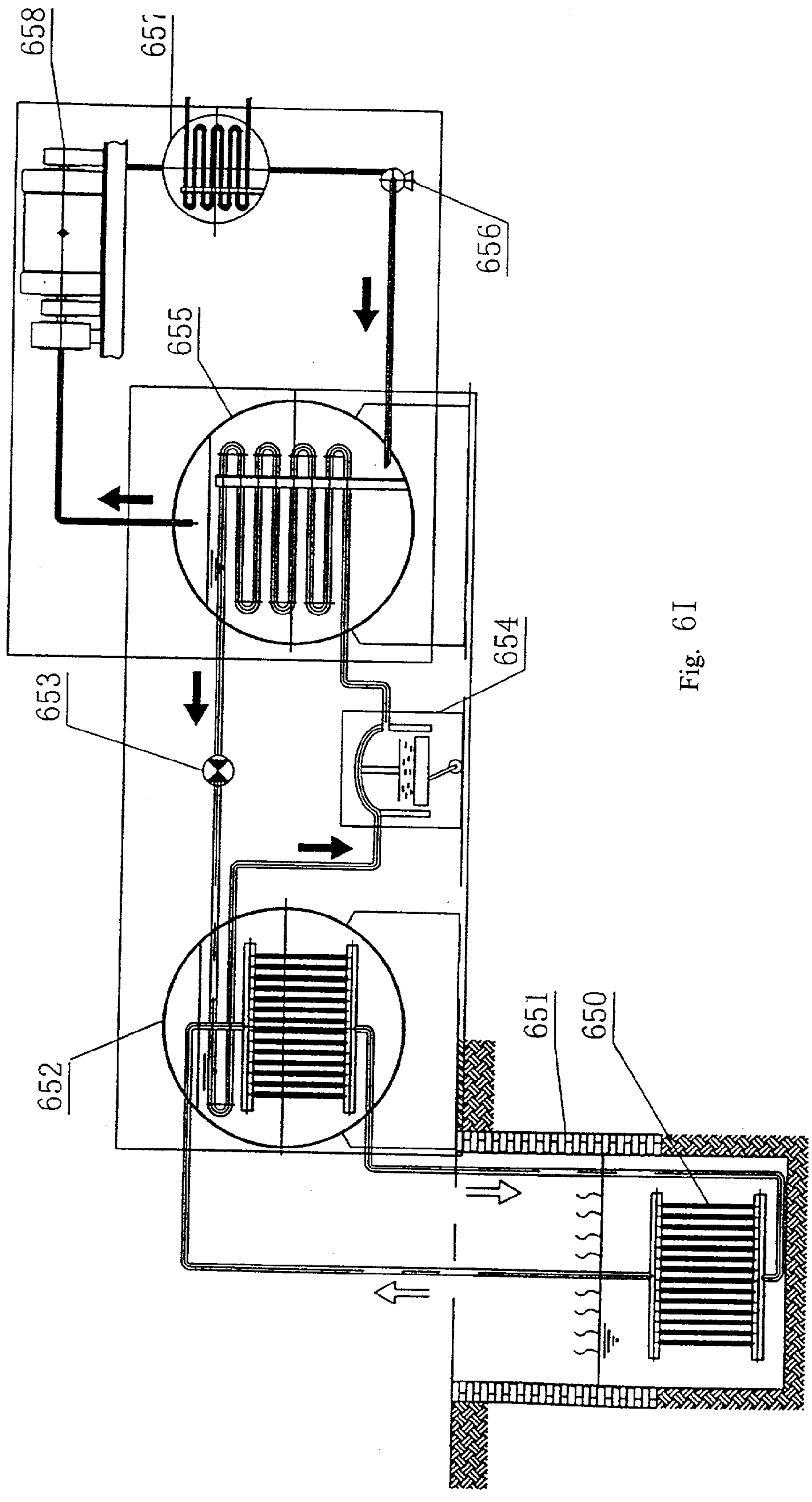

FIG. 6I is a schematic view of a geothermal power generating system with high heat transfer rate.

Figure 6J:
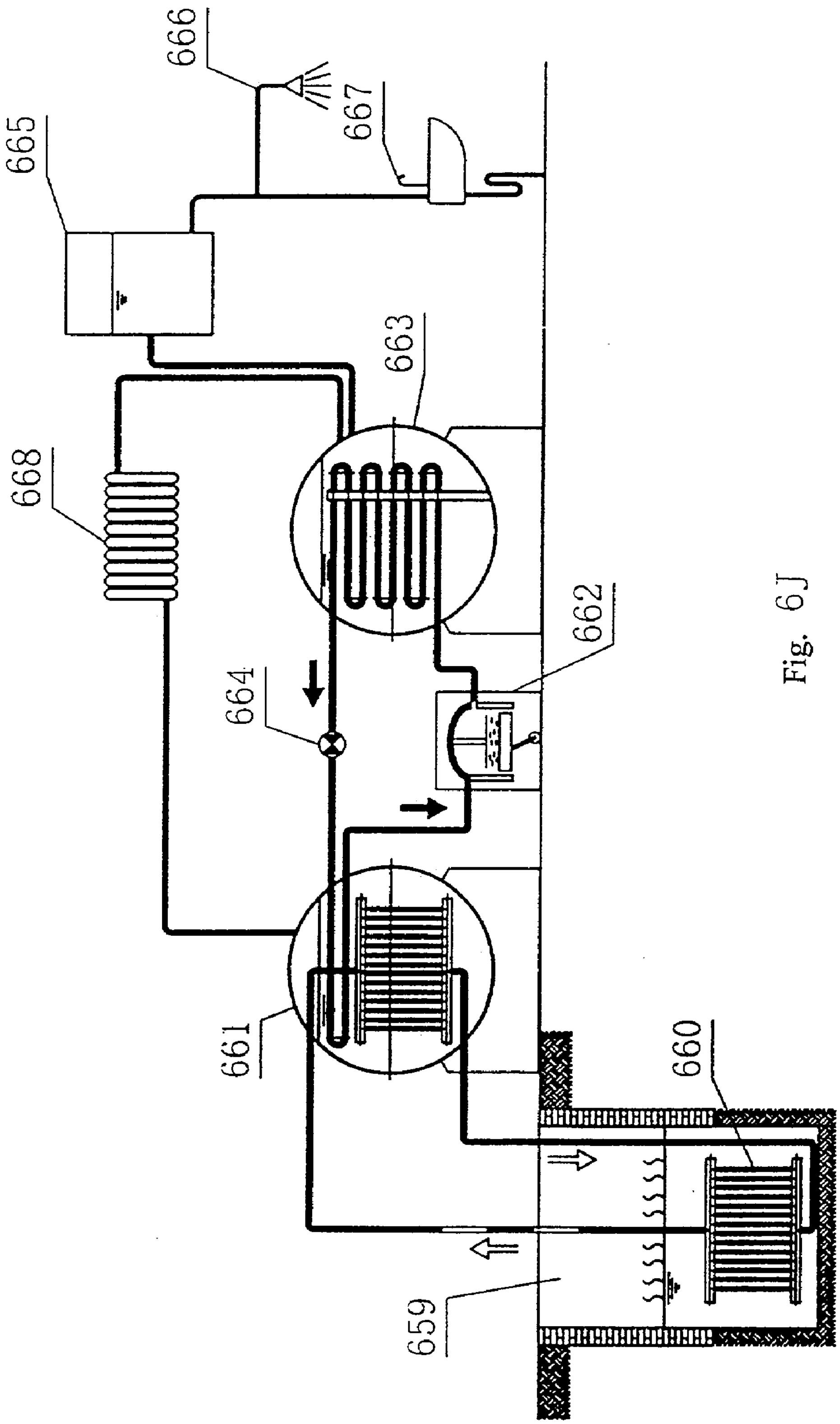

FIG. 6J is a schematic view of a geothermal heating system of low temperature with high heat transfer rate.

Figure 6K:
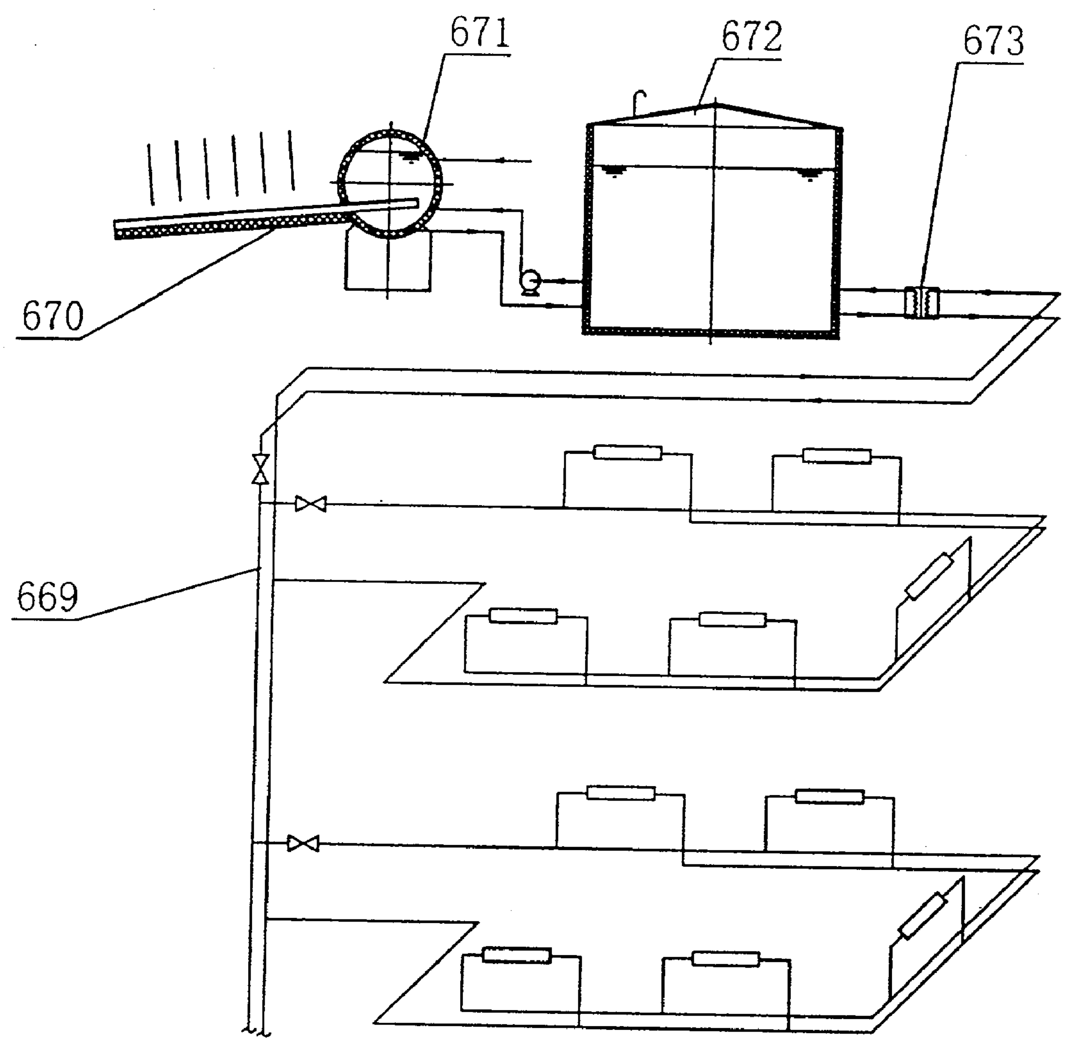

FIG. 6K is a schematic view of a solar building heating system.

Figure 6L:
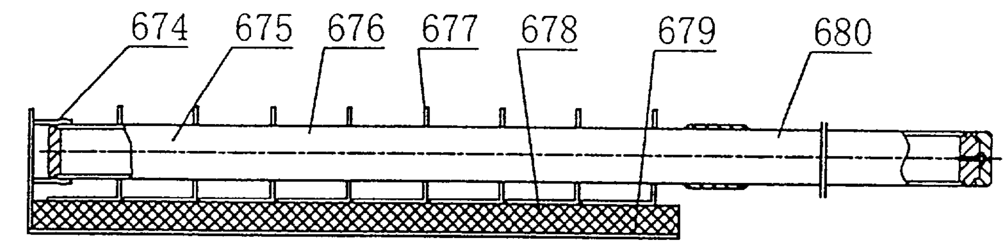

FIG. 6L shows a schematic view of the solar collector tube of the solar building heating system with high heat transfer rate in FIG. 6K.

Figure 6M:
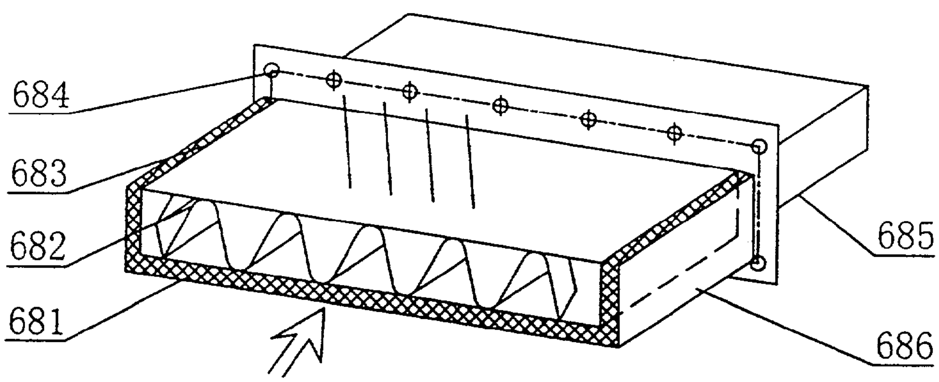

FIG. 6M shows a schematic view of the slab-warping solar collector of the solar building heating system with high heat transfer rate in FIG. 6K.

Figure 6N:
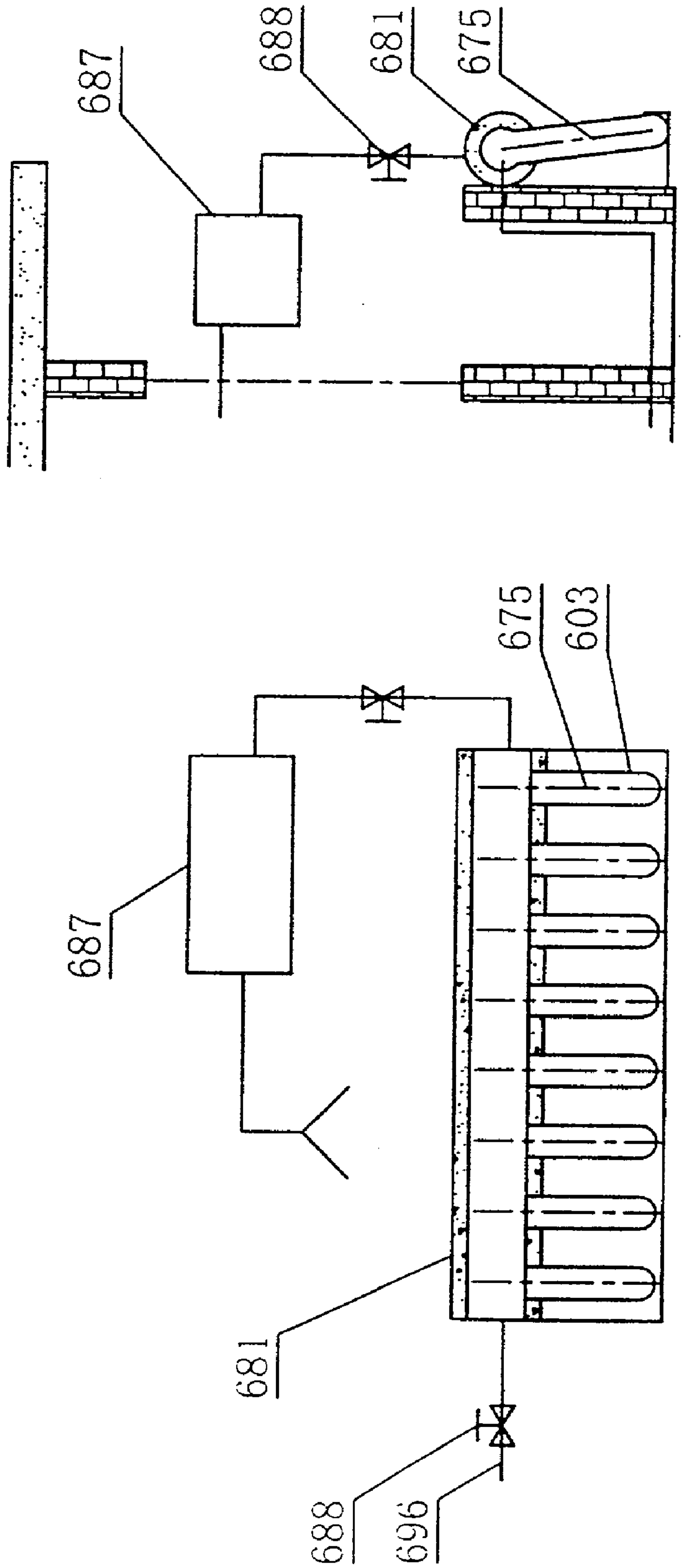

FIG. 6N shows a schematic view of a solar water heater to be installed on a balcony.

FIG. 6O shows a flat solar water heater with high heat transfer rate.

Figure 6P:
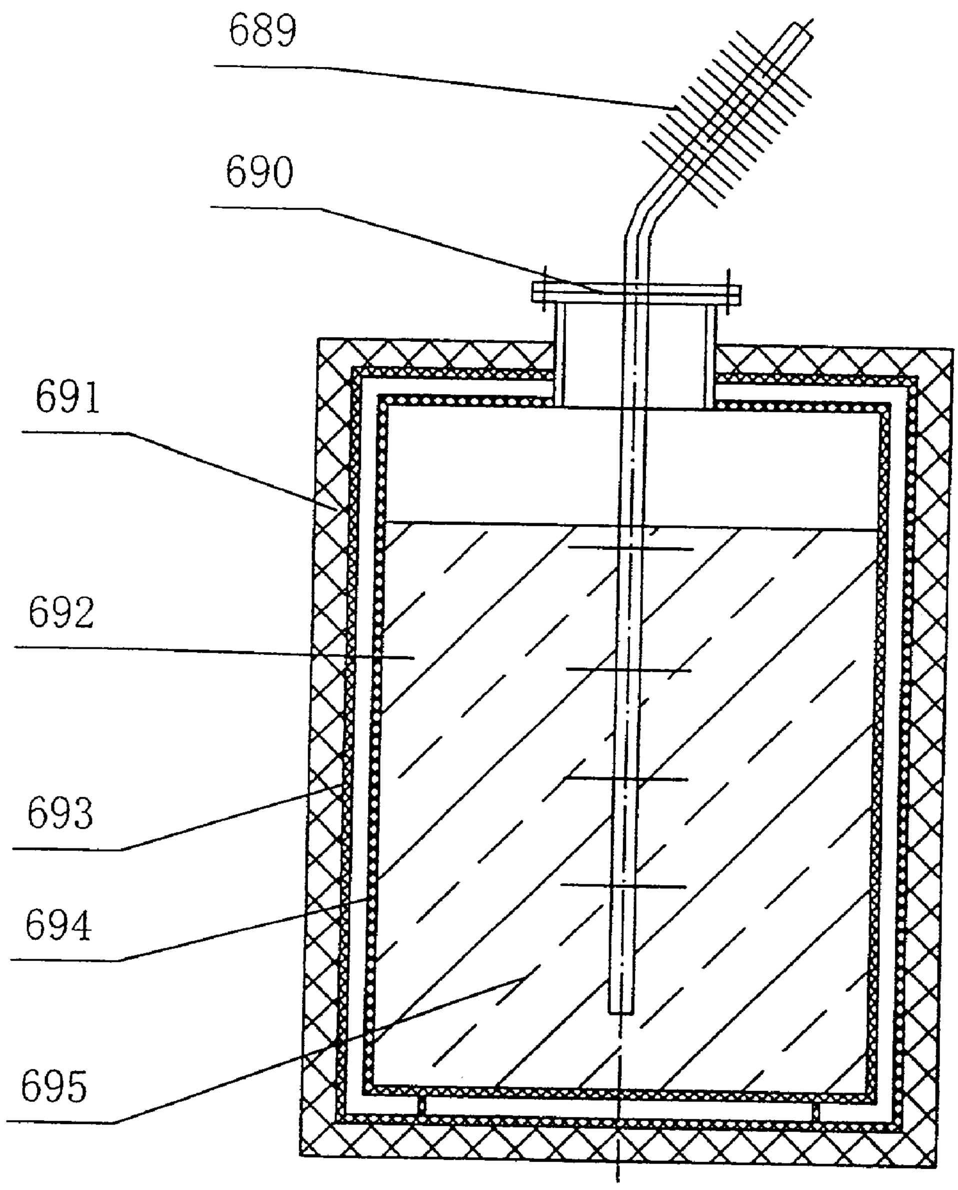
Figure 6Q:
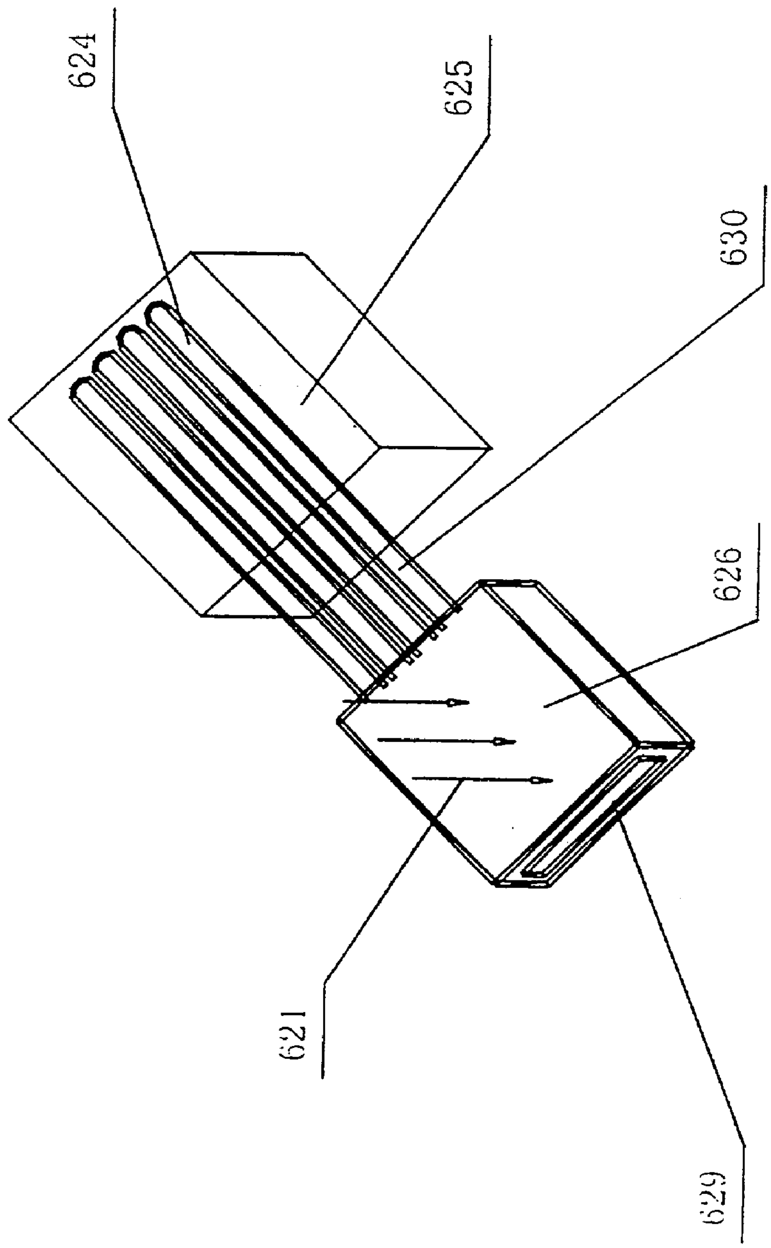

FIG. 6P is a schematic view of a heat storage device with a high heat transfer rate medium FIG. 6Q shows a schematic view of a board solar collector with high heat transfer rate.

Figure 7A:
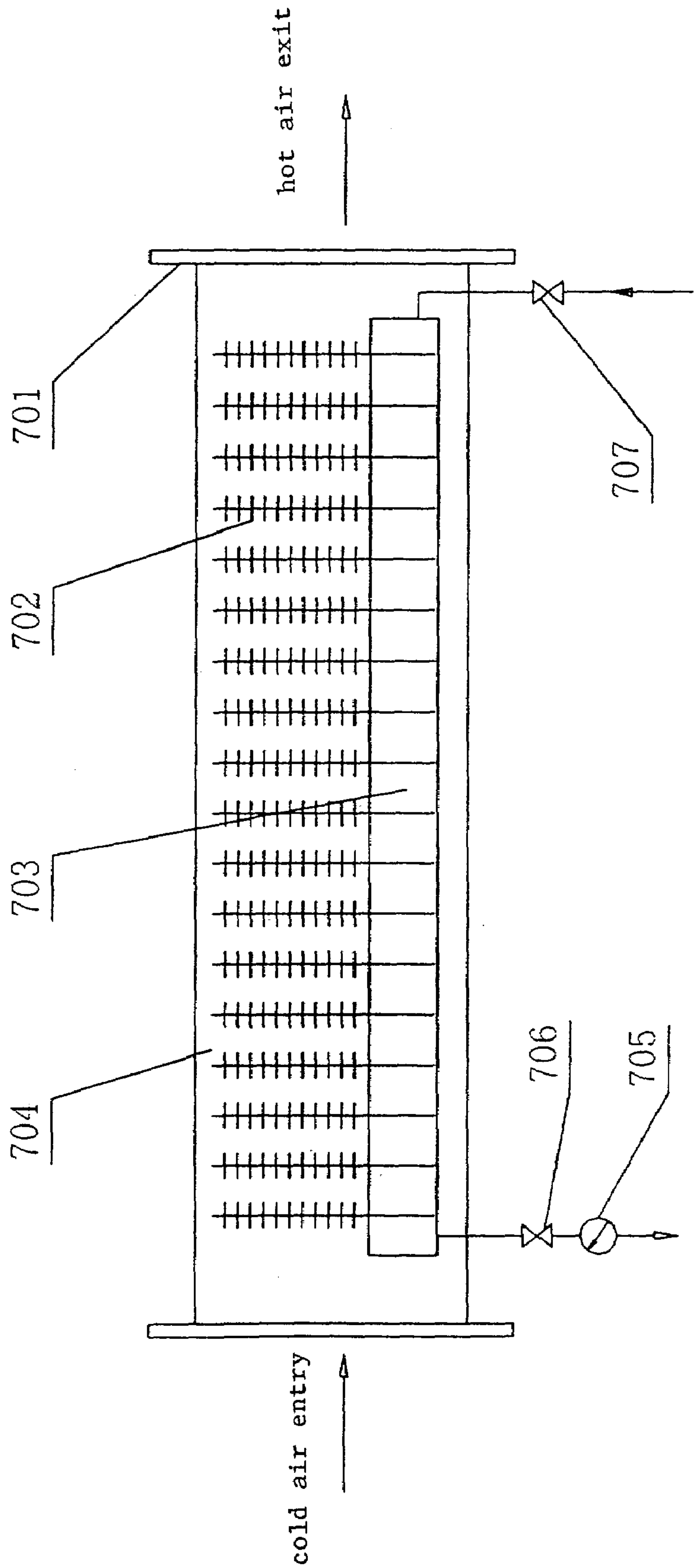

FIG. 7A shows a schematic view of an electric boiler air heater with high heat transfer rate.

Figure 7B:
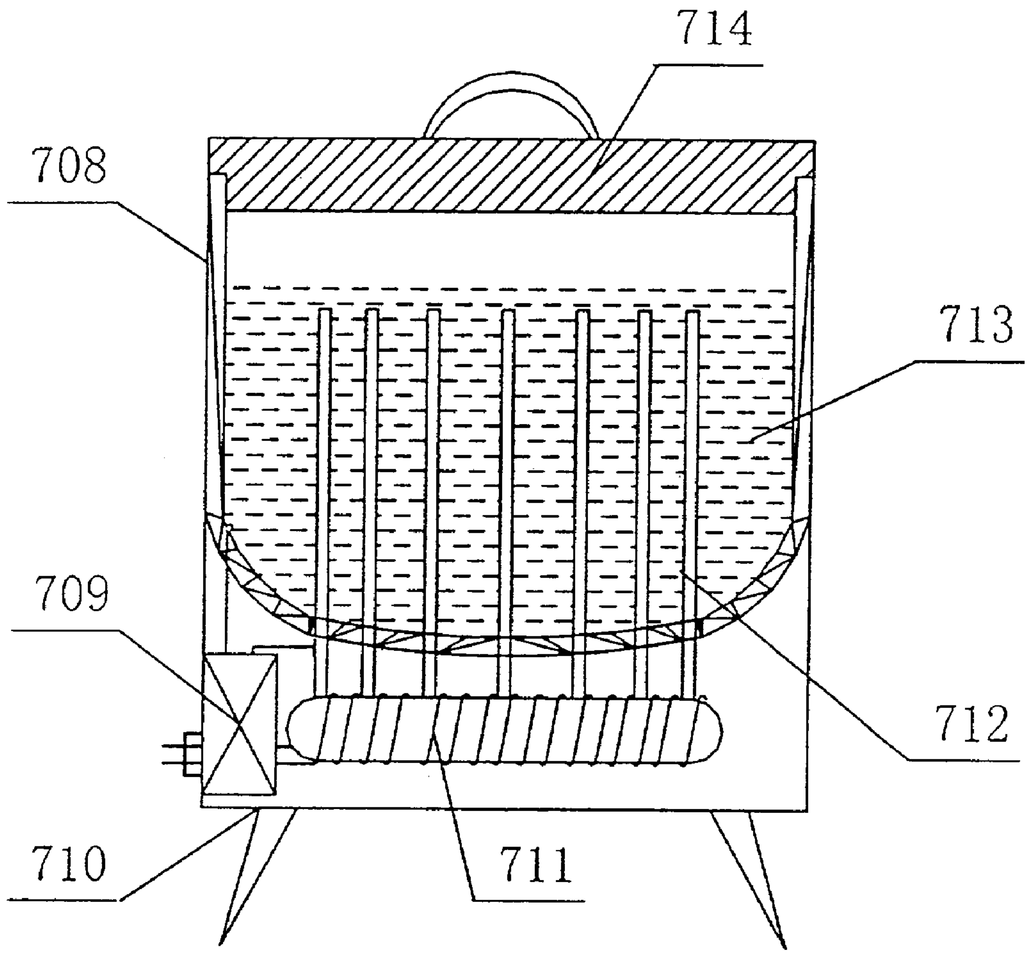

FIG. 7B shows a schematic view of an electrically heating reactor with high heat transfer rate.

Figure 7C:
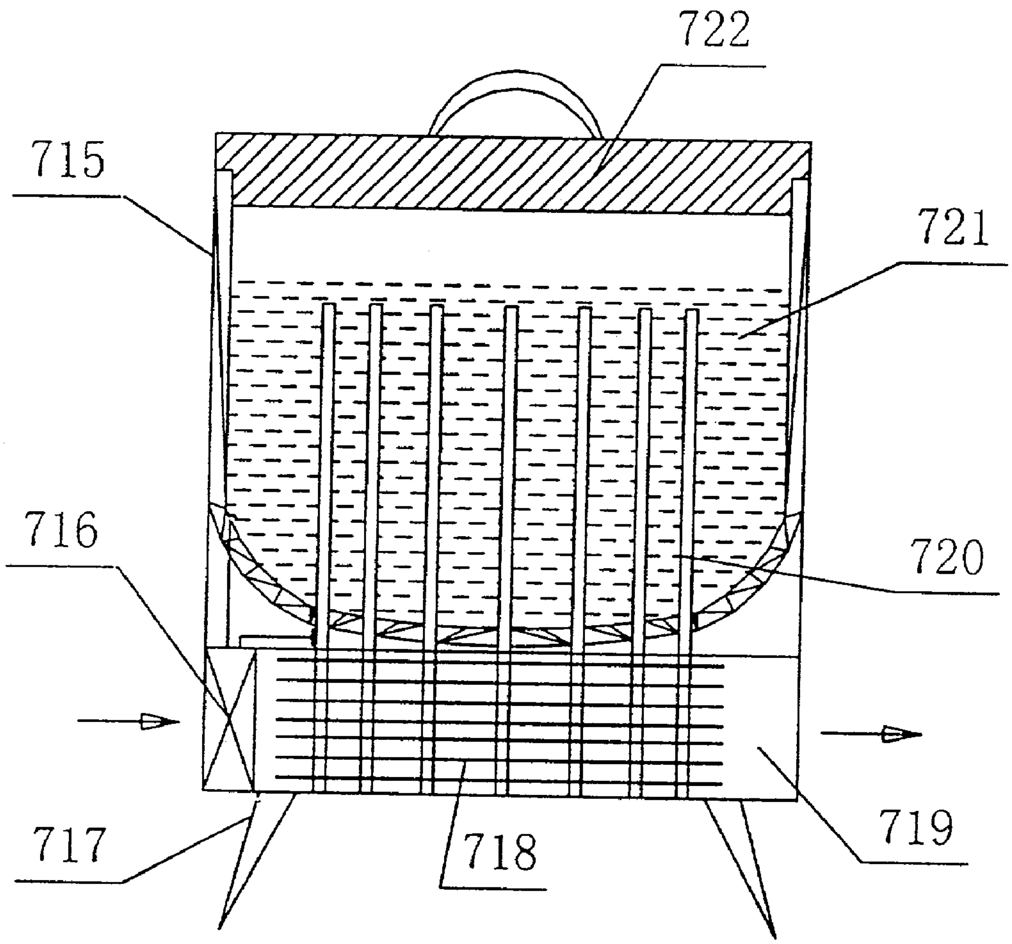

FIG. 7C shows a stream inorganic high heat transfer heating reactor.

Figure 7D:
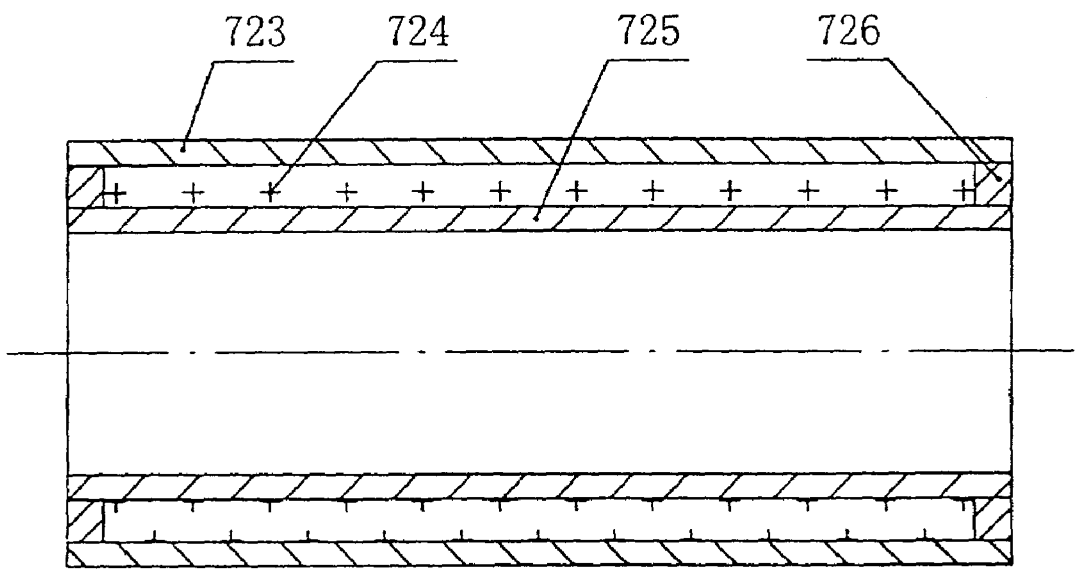

FIG. 7D shows the structure of an inorganic high heat transfer homogeneous temperature distribution epitaxial furnace.

Figure 7E:
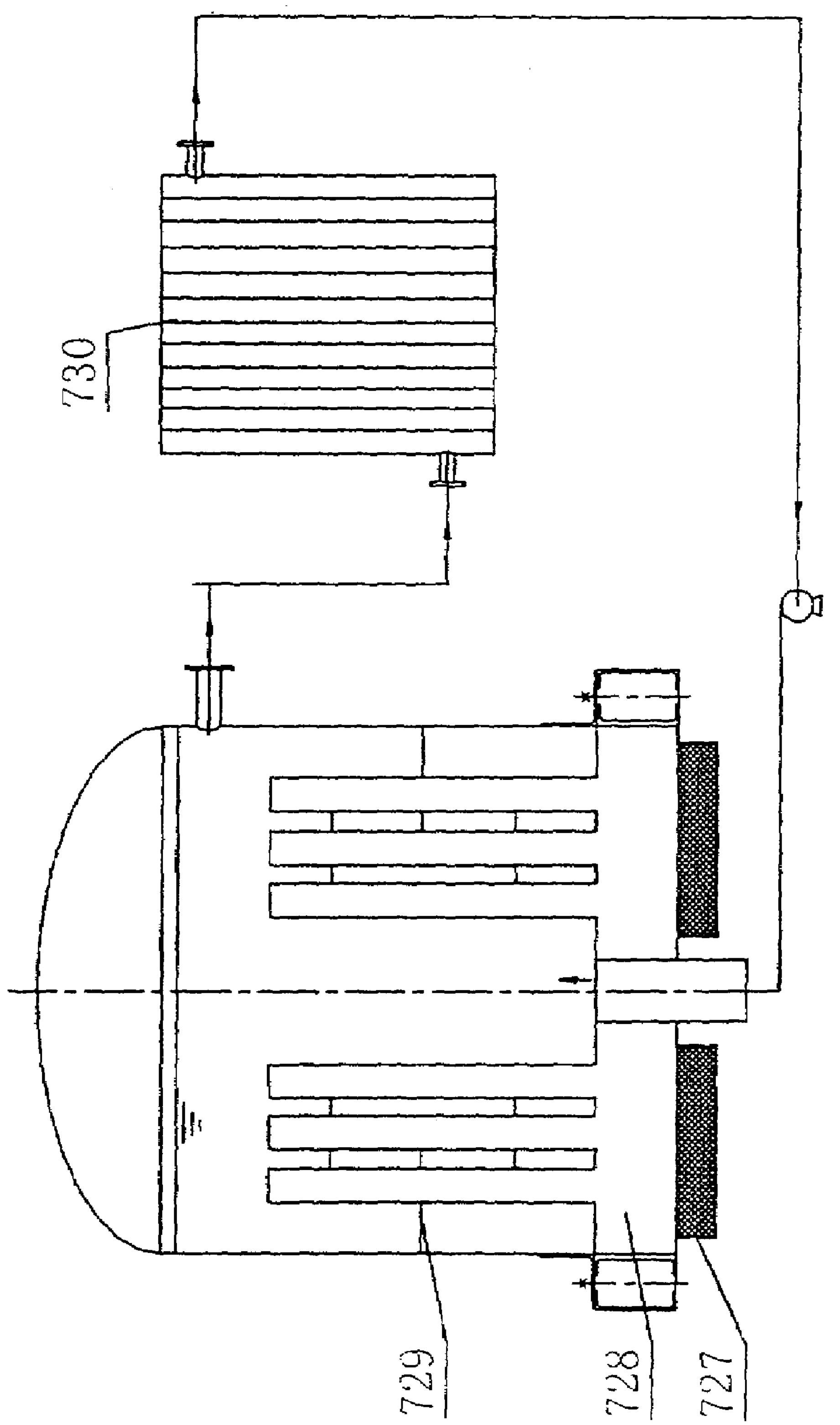

FIG. 7E is a schematic view of the structure of a geothermal water heating system with high heat transfer rate.

Figure 7F:
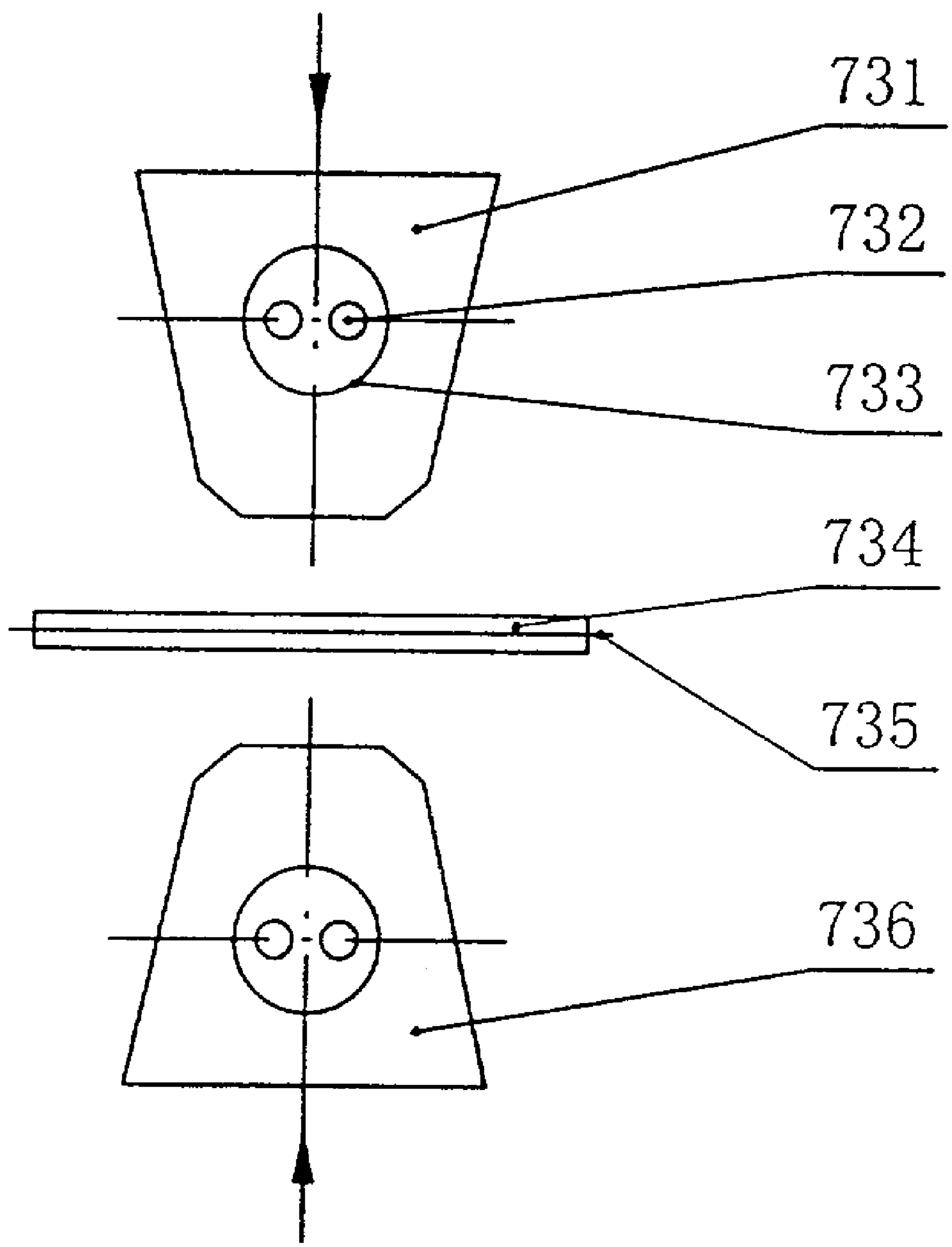

FIG. 7F shows schematic view of a PVC thermal sealer with high heat transfer rate.

Figure 7G:
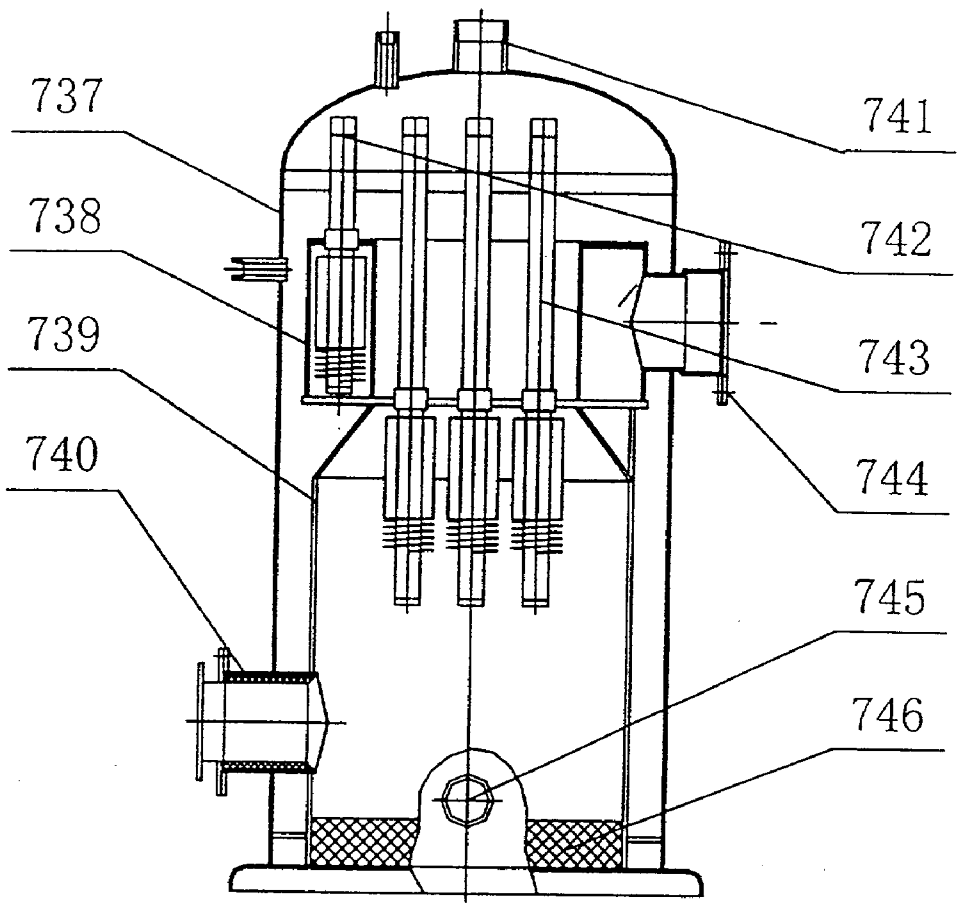

FIG. 7G is a front view of a steam boiler with high heat transfer rate.

Figure 7H:
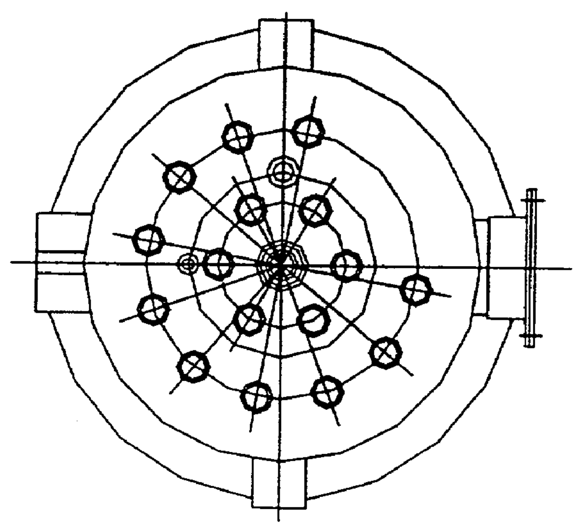

FIG. 7H is a top view of a steam boiler with high heat transfer rate.

Figure 7I:
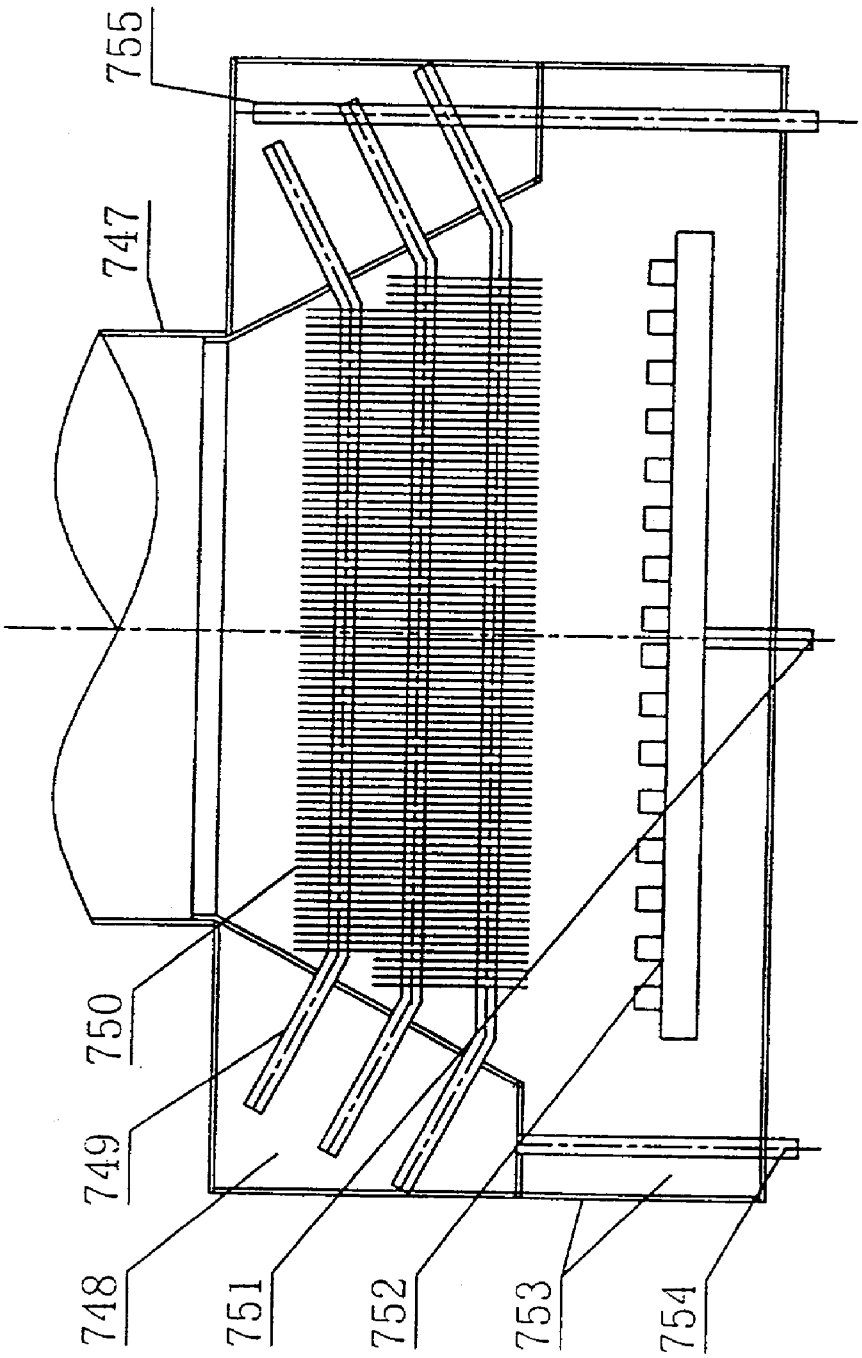

FIG. 7I shows a schematic view of a steam heater with heat transfer rate.

Figure 8A:
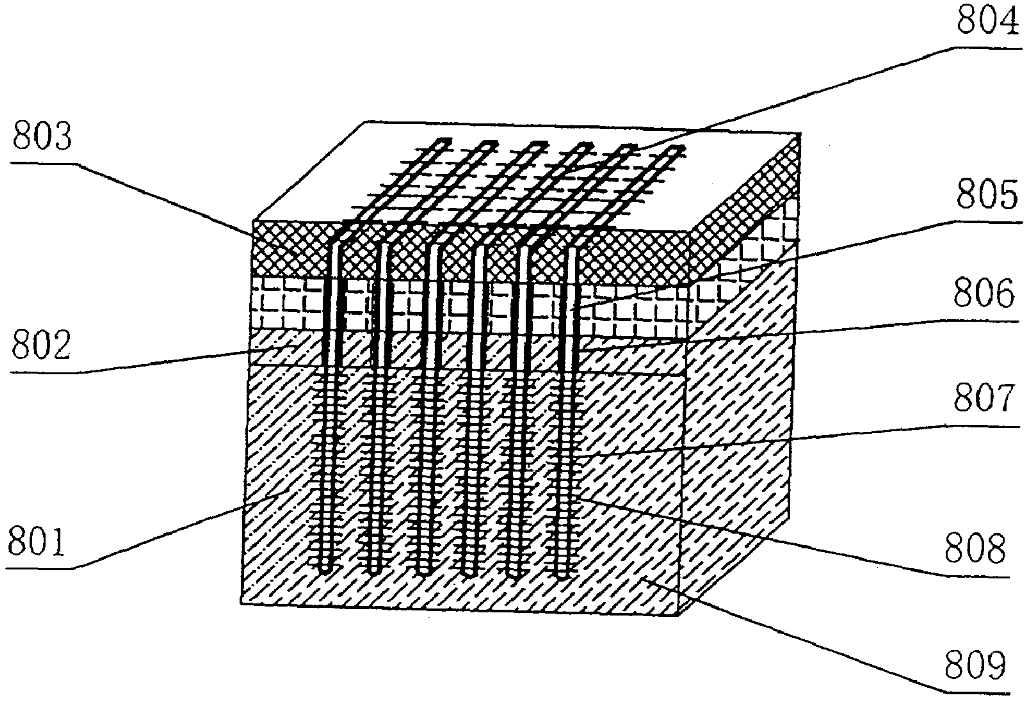

FIG. 8A is a schematic view of a runway heating system in airport according to the present invention.

Figure 8B:
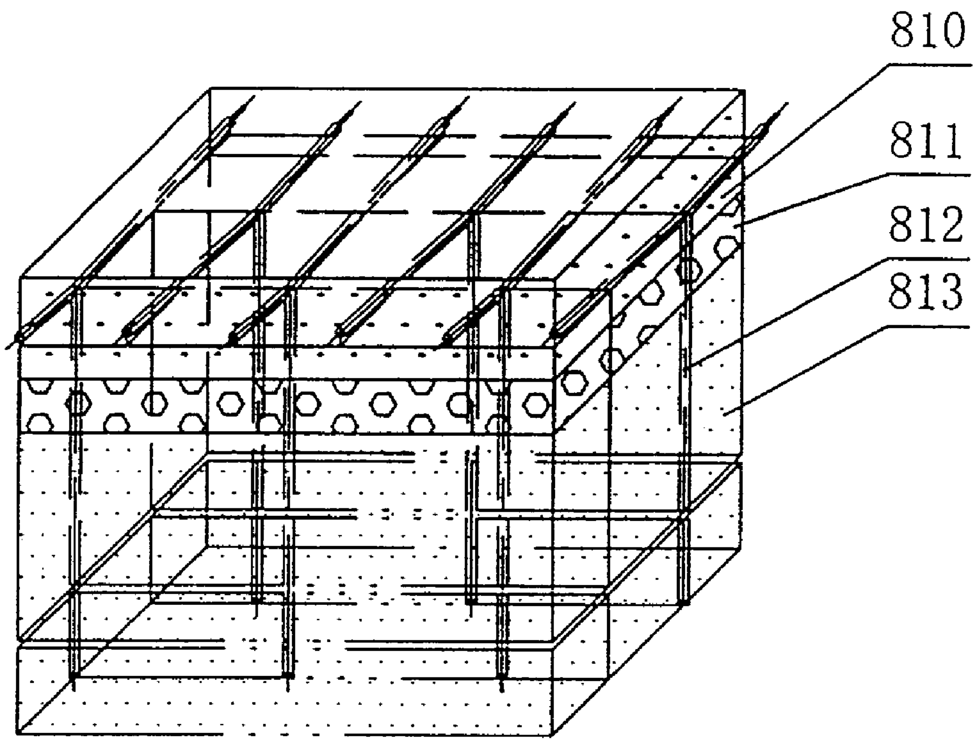

FIG. 8B is a schematic view of another runway heating system in airport according to the present invention.

Figure 8C:
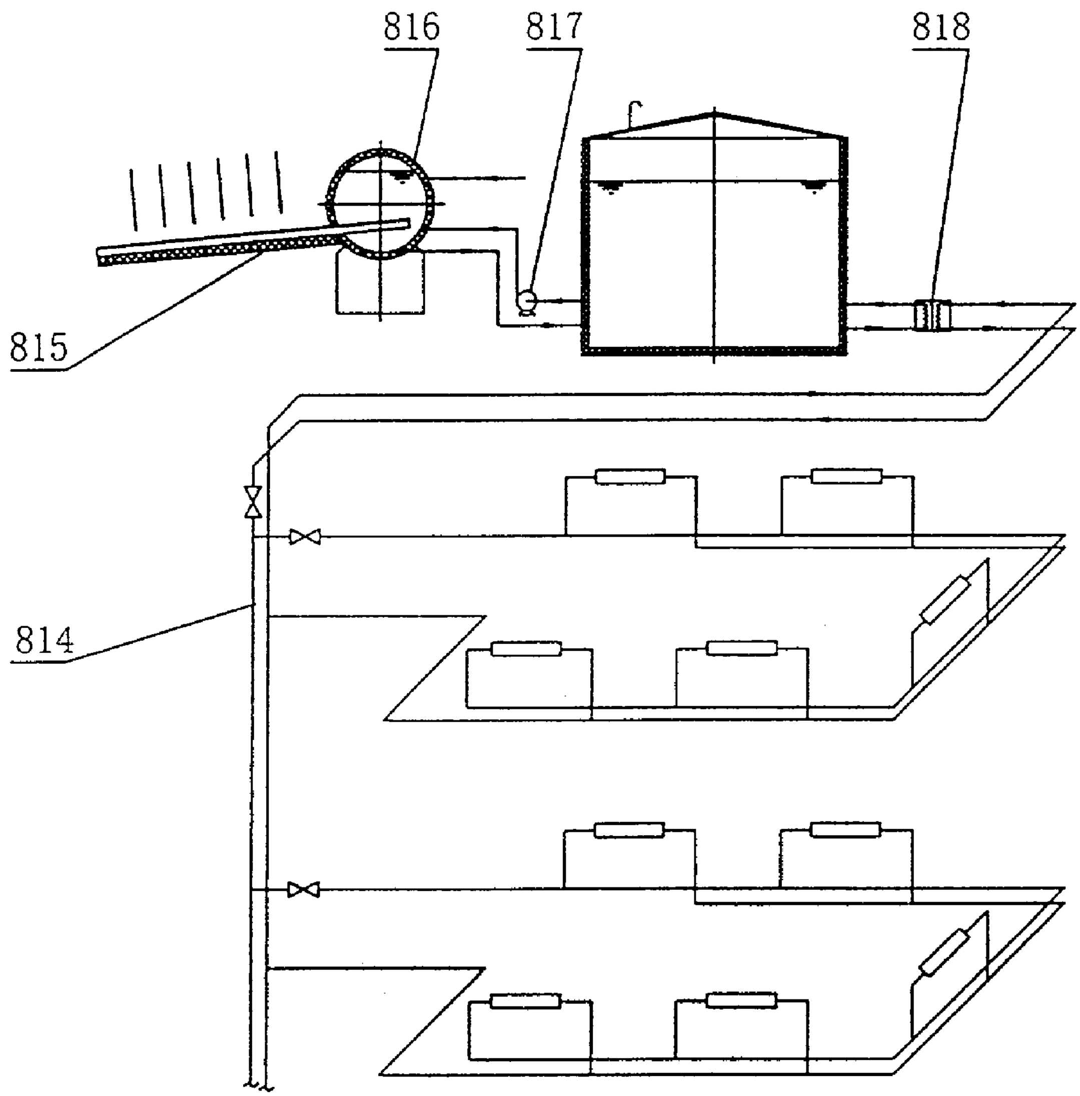

FIG. 8C is a schematic view of solar pool heating system according to the present invention.

FIGS. 8D(*a*) and (*b*) show schematic views of the tube and board collector(s) in the solar pool heating system in FIG. 8C.

Figure 8E:
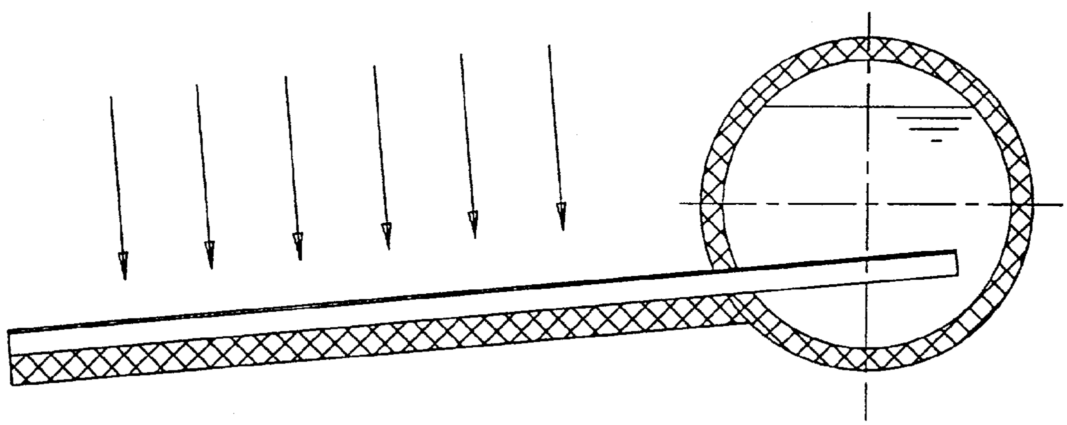

FIG. 8E is a schematic zoom-in view of the solar collectors in the solar pool heating system shown in FIG. 8C.

Figure 8F:
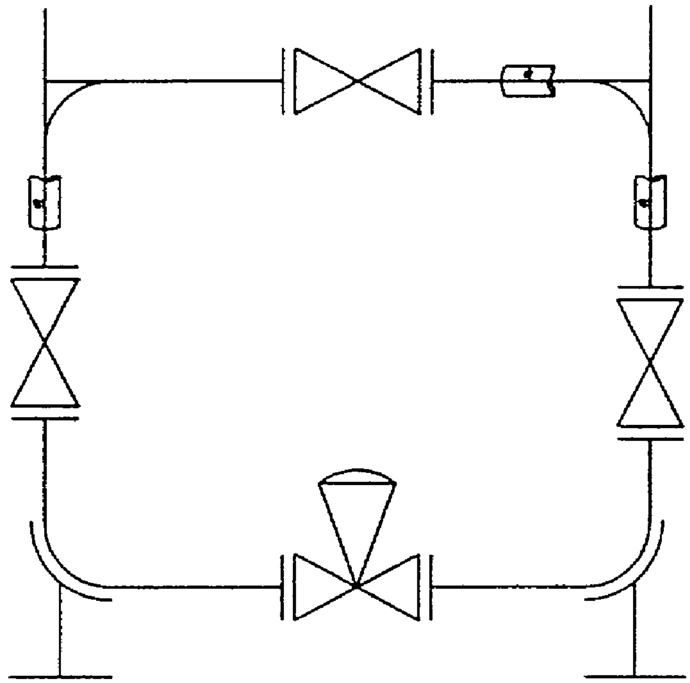

FIG. 8F is an exploded view of a high heat transfer rate blind pipe heater according to the present invention.

Figure 8G:
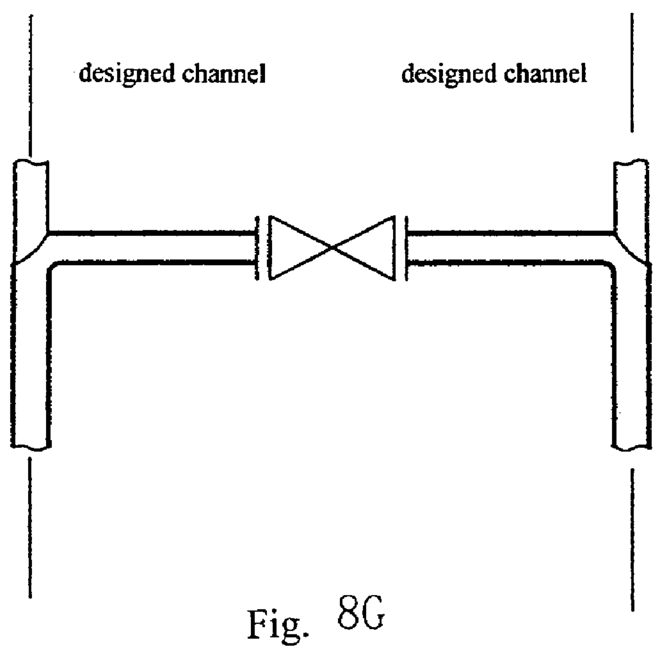

FIG. 8G shows a partial zoom-in view of the high heat transfer rate blind pipe in FIG. 8F.

Figure 9A:
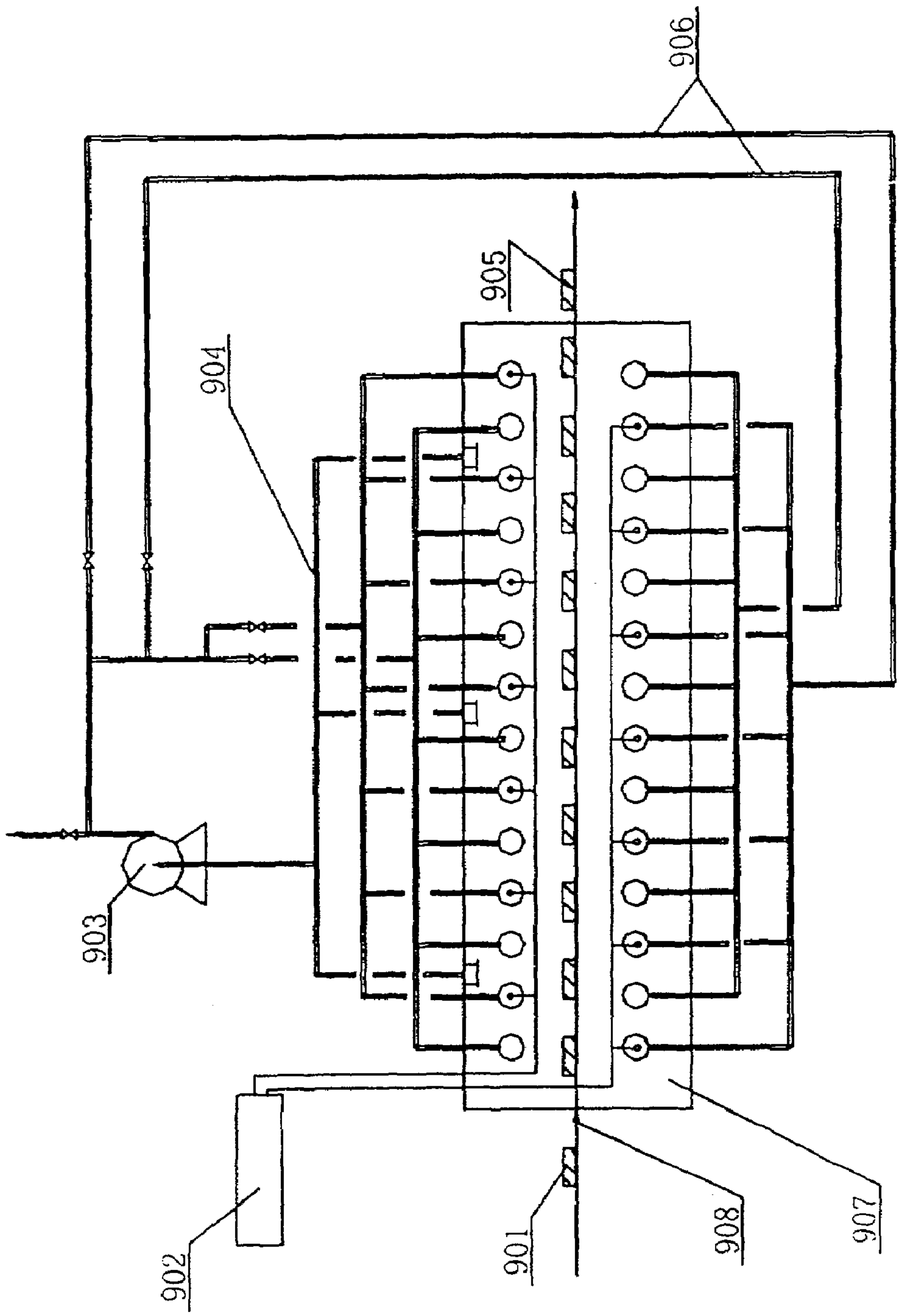

FIG. 9A is a schematic workflow of an electric heating drying box according to the present invention.

Figure 9B:
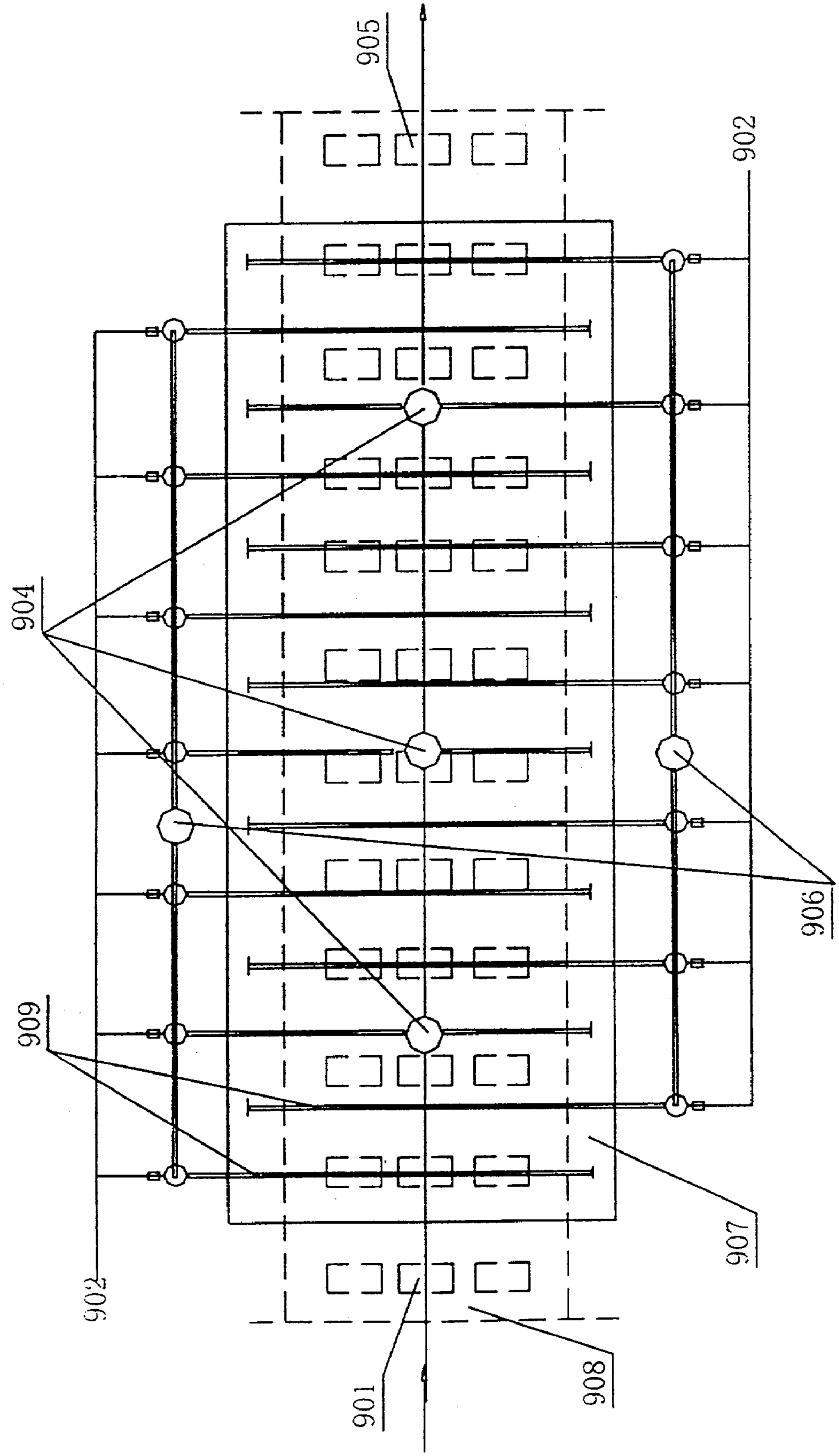

FIG. 9B shows a schematic perspective view of heat transfer pipe element according to the present invention.

Figure 9C:
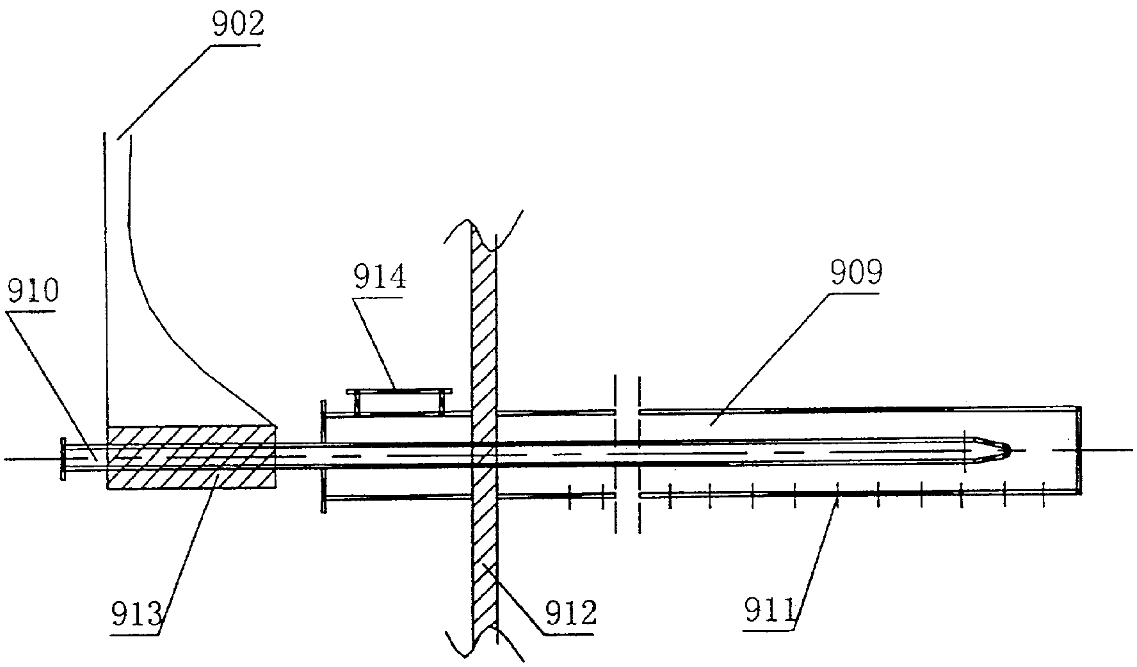

FIG. 9C is a sectional view of a hot air distributor with the high heat transfer rate elements.

Figure 9D:
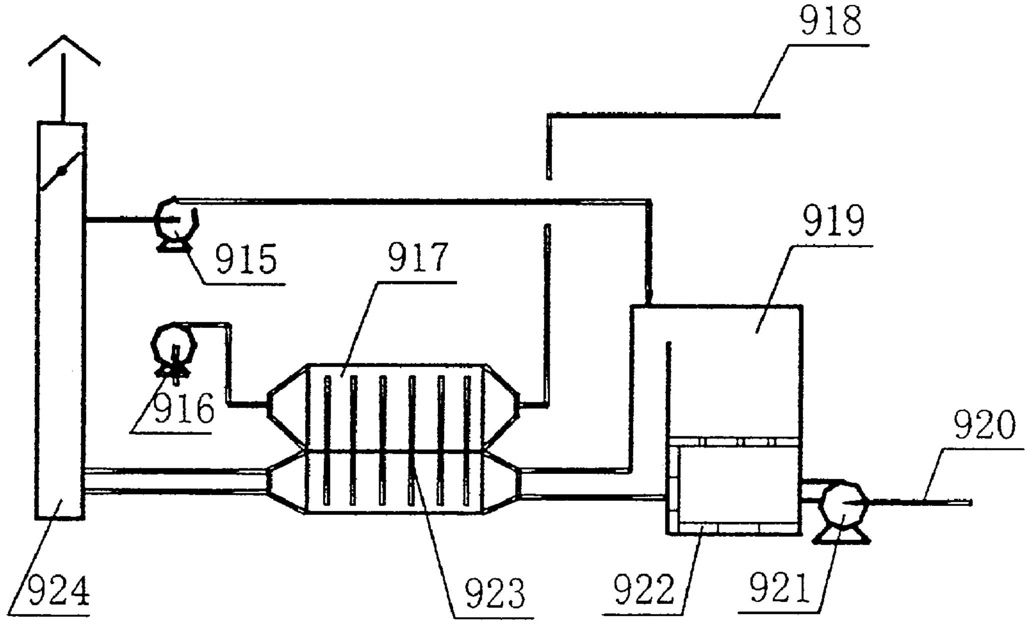

FIG. 9D shows the schematic workflow of a low temperature air heating system.

Figure 9E:
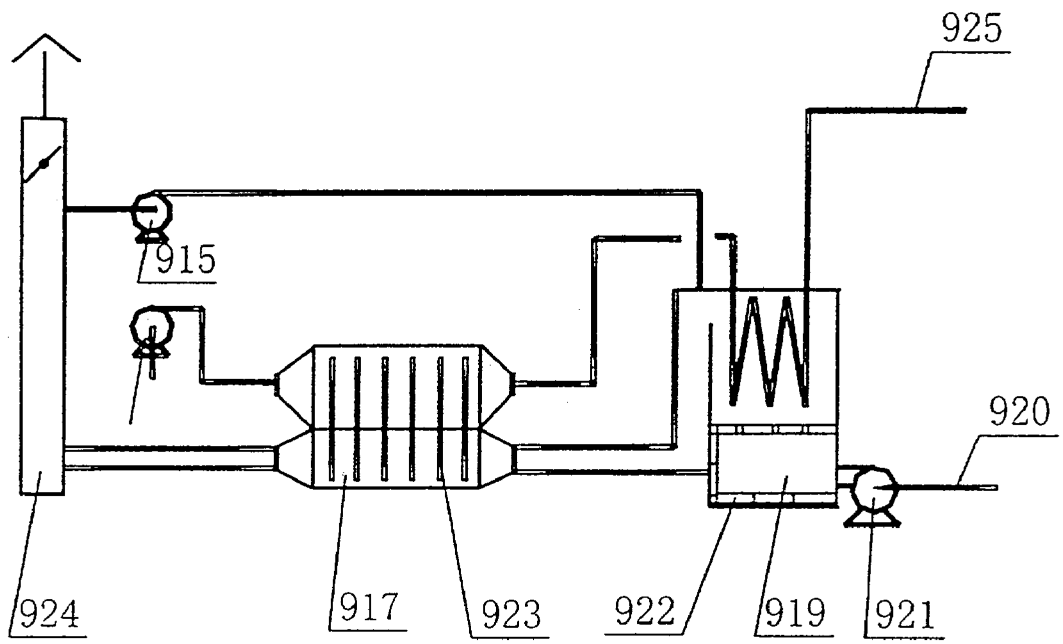

FIG. 9E shows the schematic workflow of a high temperature air heating system.

Figure 9F:
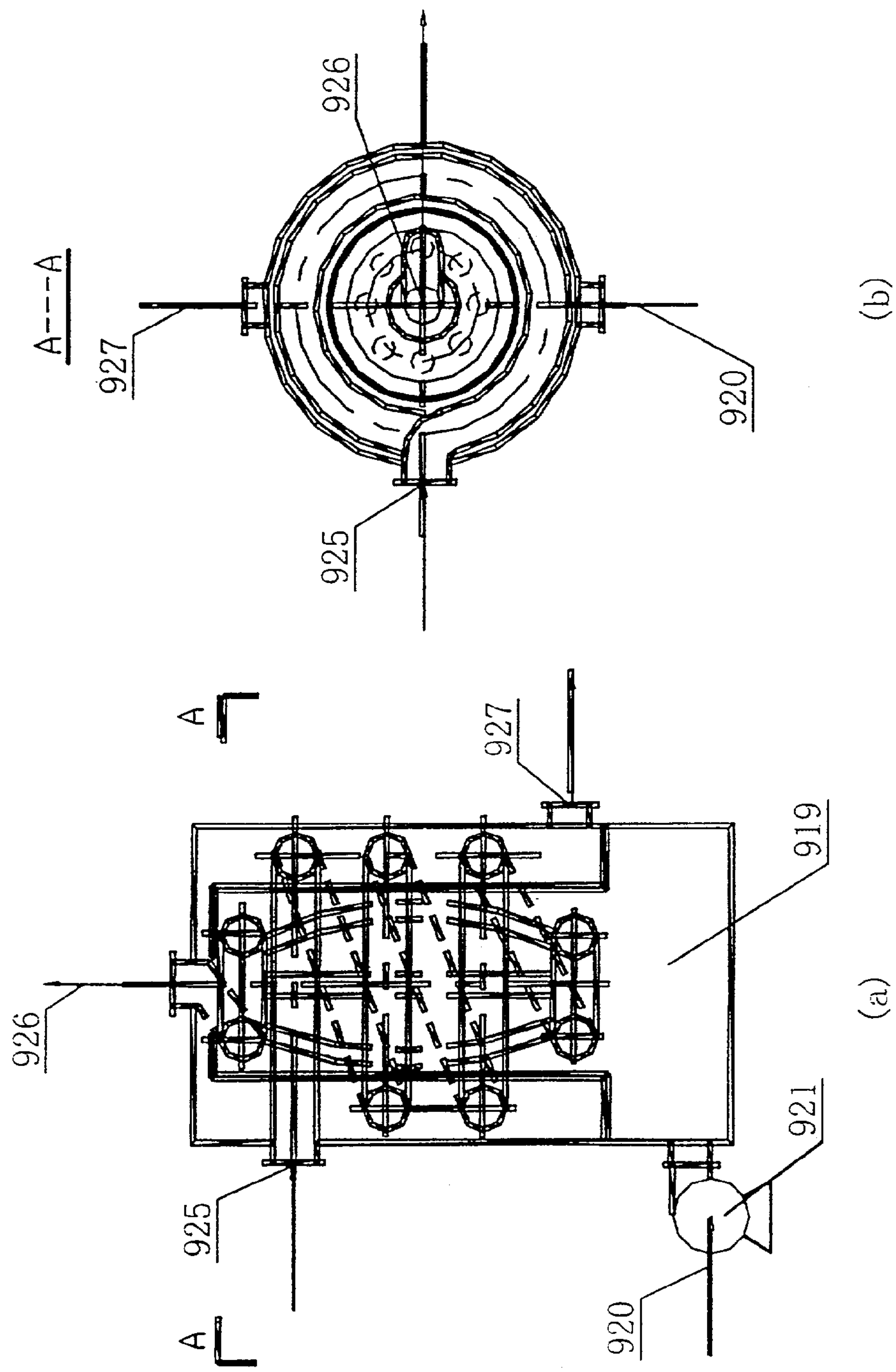

FIG. 9F(*a*) is a horizontally sectional view of the structure of the combustion room in FIG. 9E.

FIG. 9F(*b*) is a vertically sectional view of the structure of the combustion room along the A—A line in FIG. 9E.

Figure 9G:
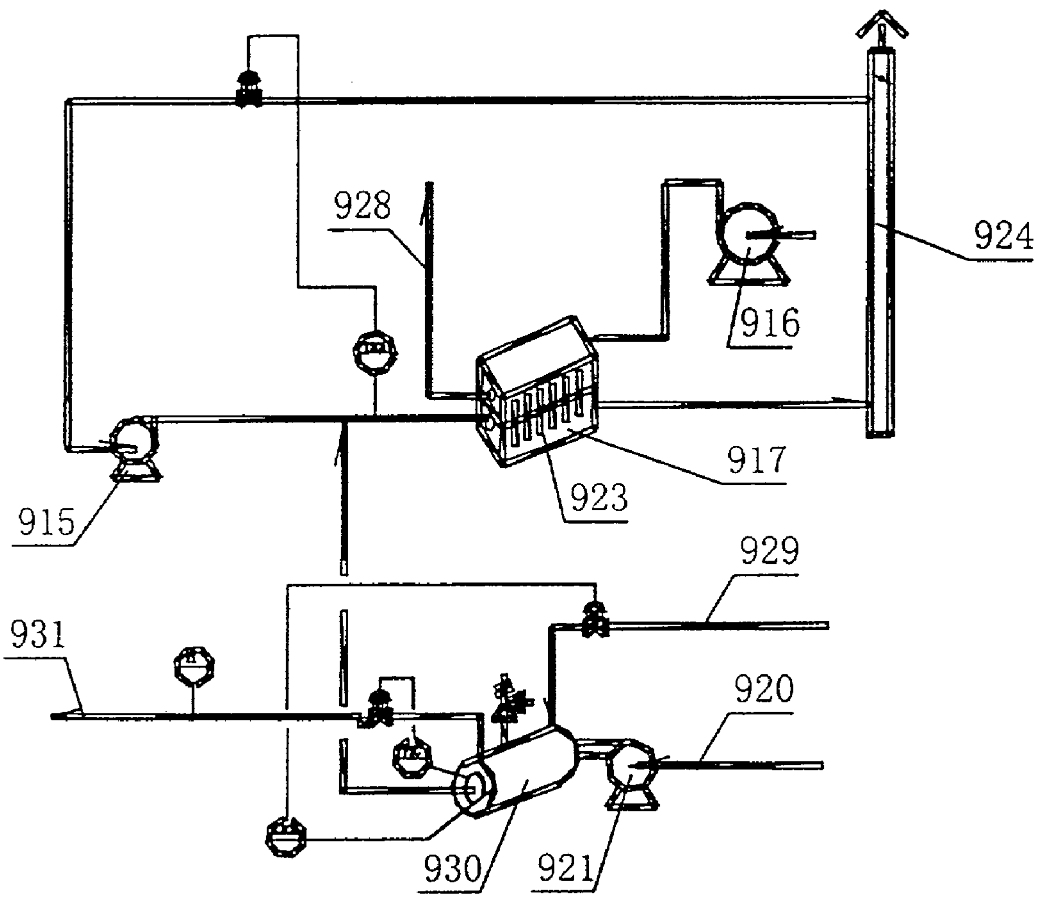

FIG. 9G shows the schematic workflow of a hot air and stream system.

Figure 9H:
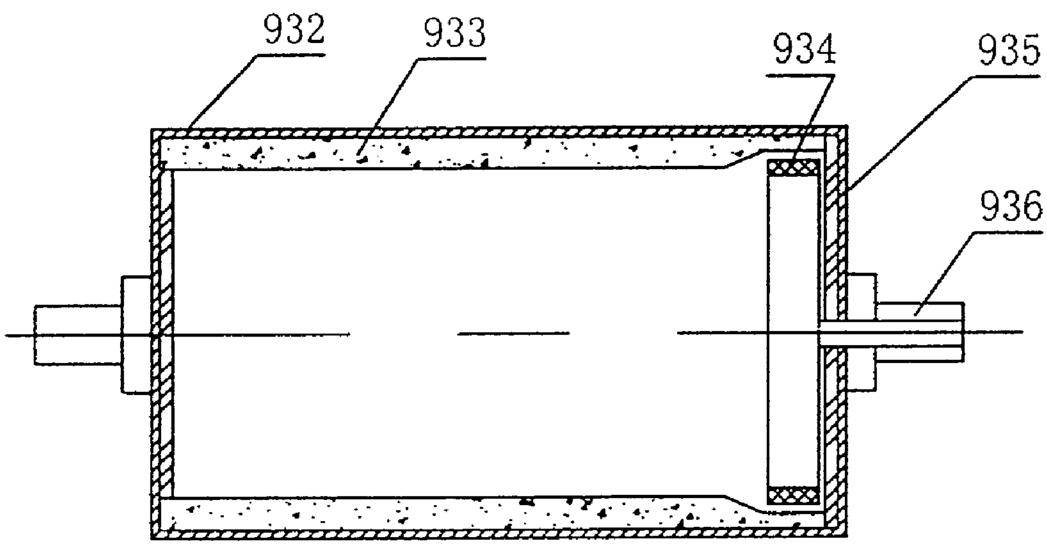

FIG. 9H shows a schematic view of a paper dryer according to the present invention.

Figure 9I:
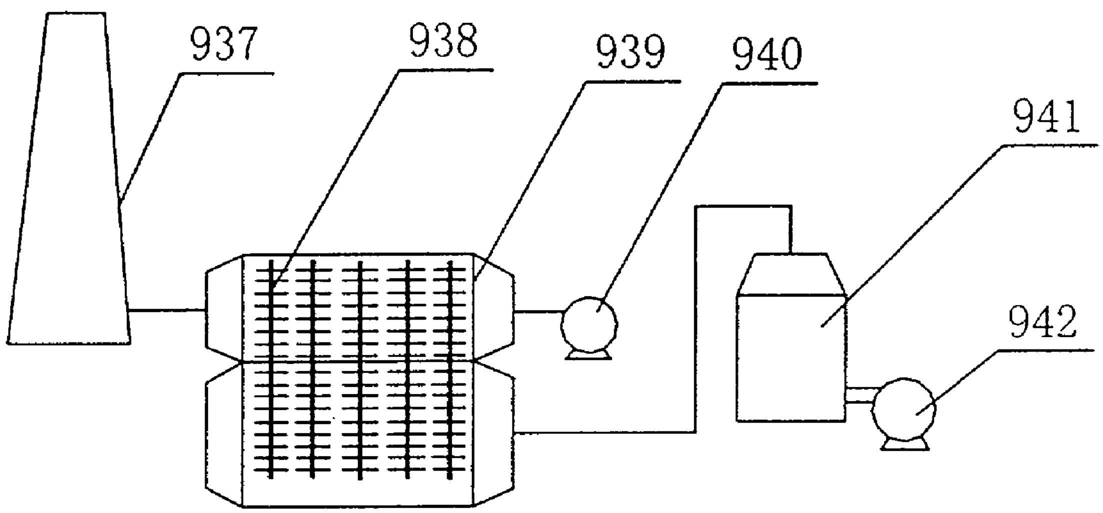

FIG. 9I shows a schematic view of a pencil wood case dryer according to the present invention.

Figure 9J:
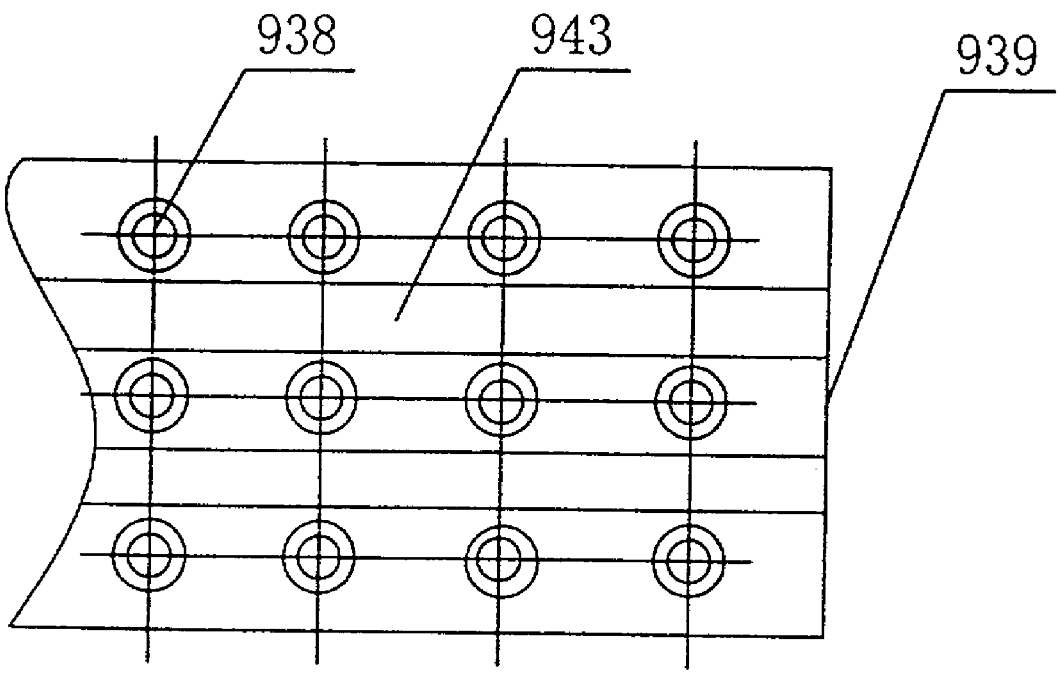

FIG. 9J shows the schematic structure of the pipe box in the device shown in FIG. 9I.

Figure 9K:
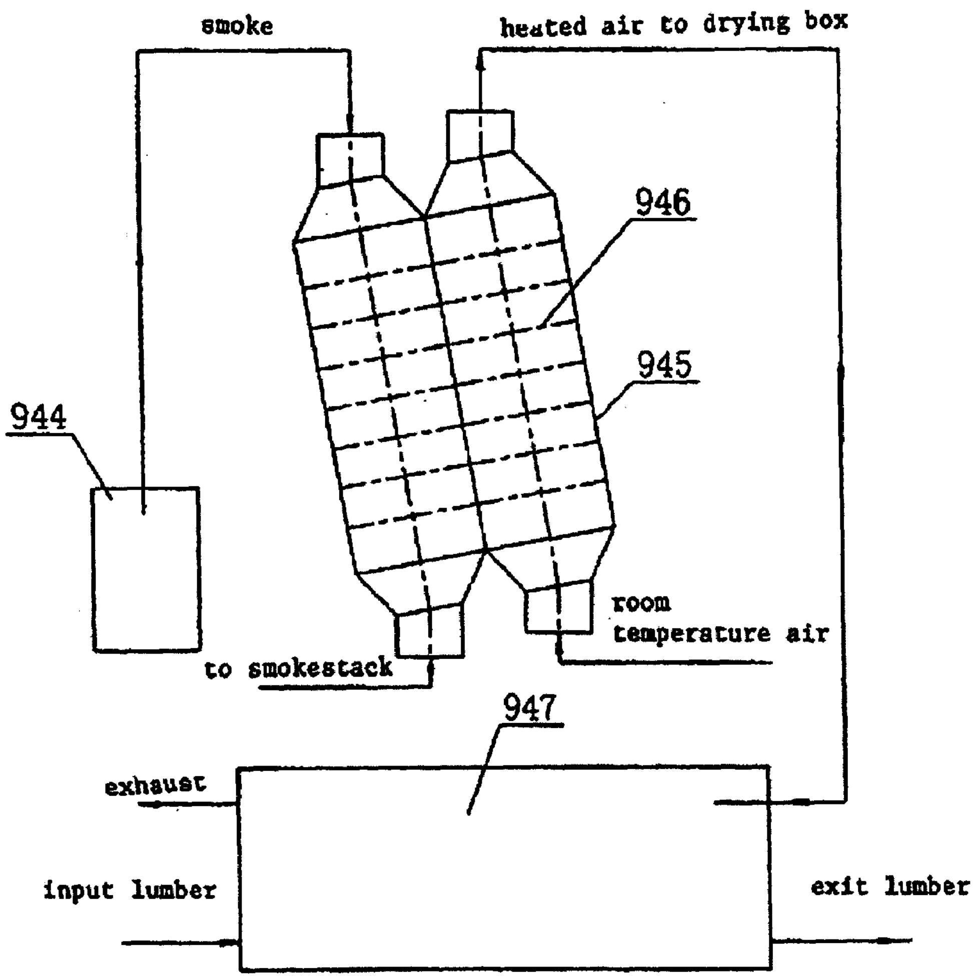

FIG. 9K shows a schematic view of a wood drying system according to the present invention.

Figure 9L:
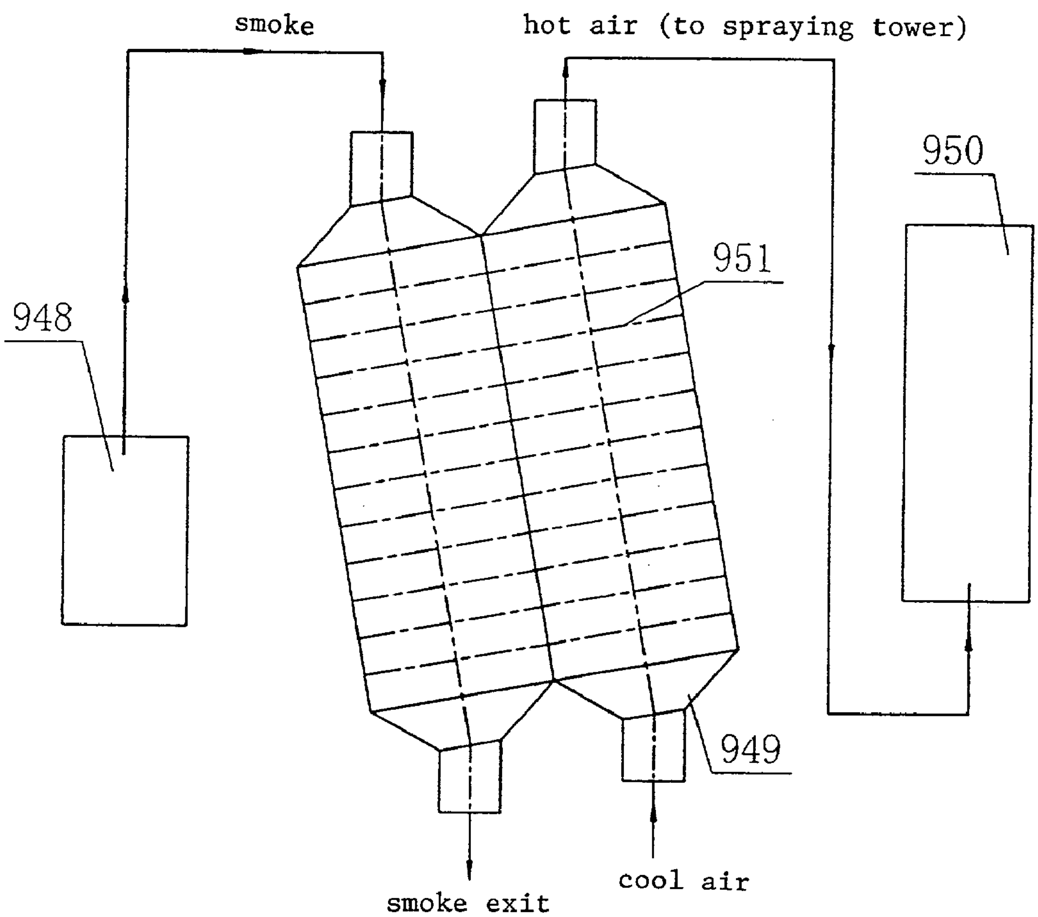

FIG. 9L shows a schematic view of a spraying dryer according to the present invention.

Figure 9M:
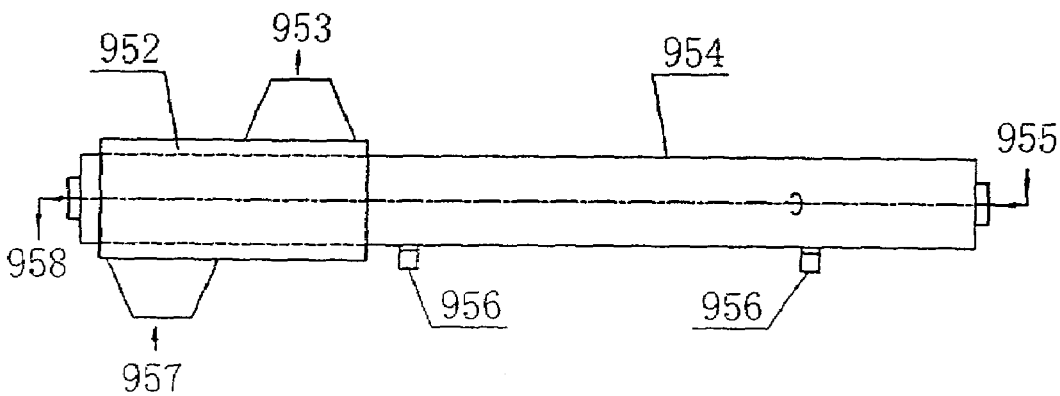

FIG. 9M shows a schematic view of the structure of a high transfer type turret dryer with high heat transfer rate.

Figure 9N:
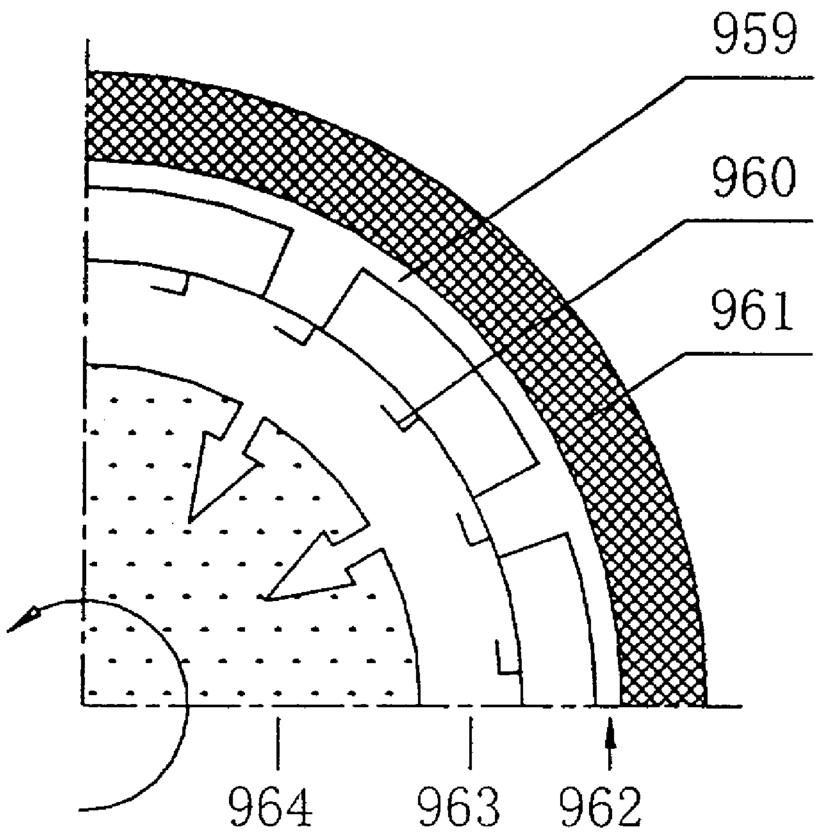
Figure 90:
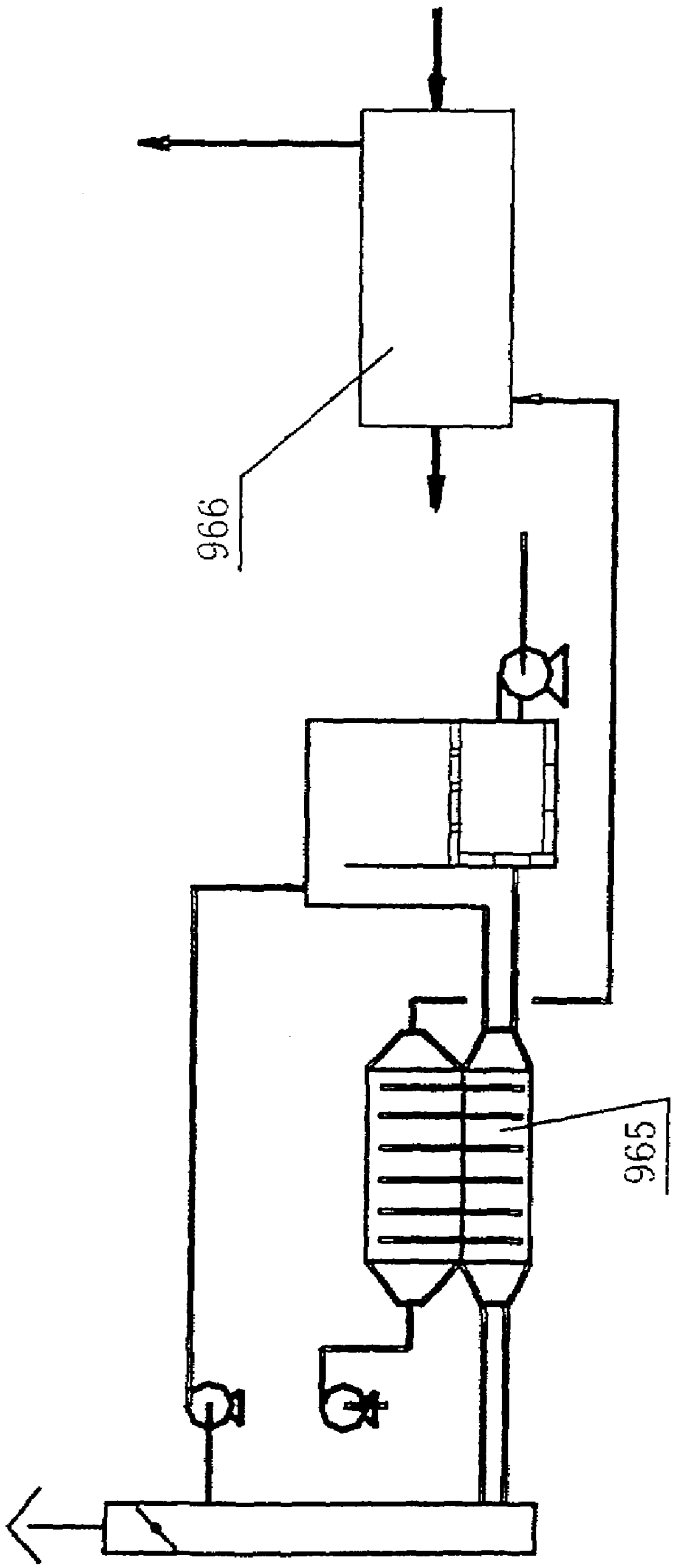

FIG. 9N is a sectional view of the heating section in the turret dryer in FIG. 9M.

FIG. 9O is a schematic view of a hot air drying system with high heat transfer rate.

Figure 10A:
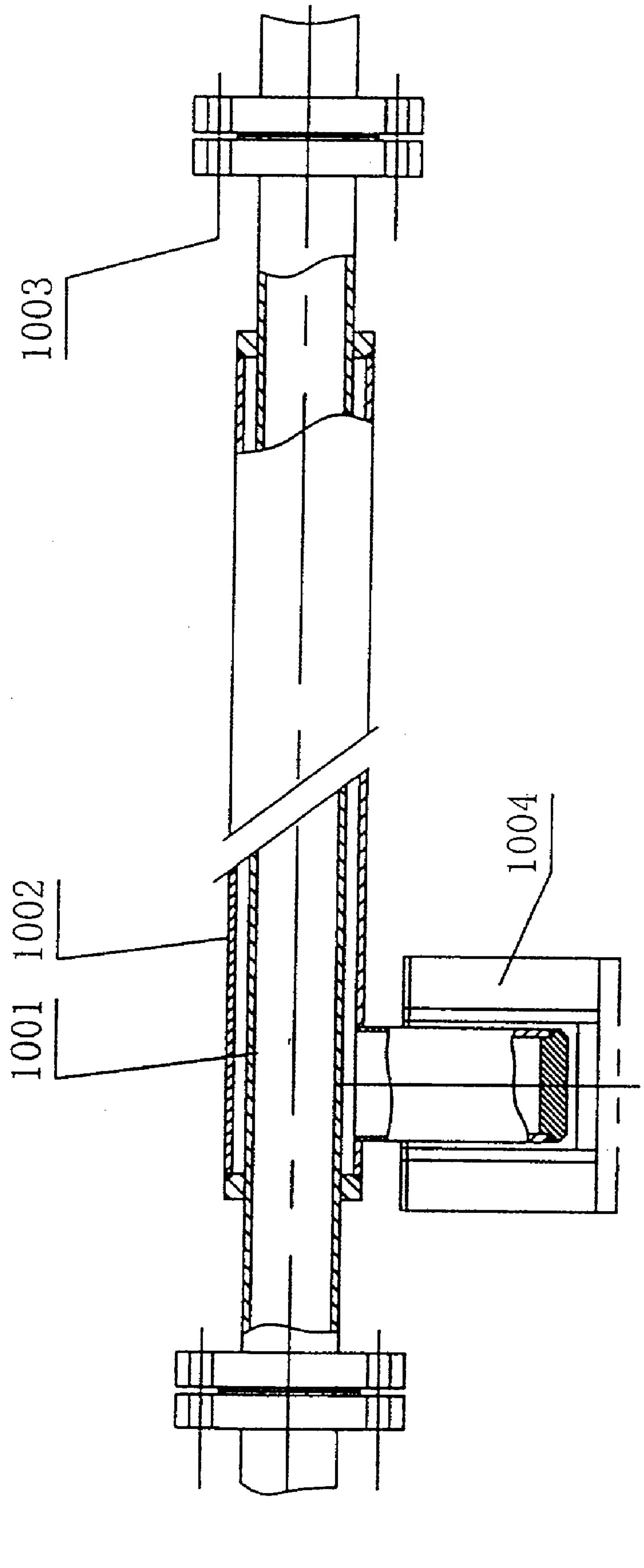

FIG. 10A is a schematic view of an oil pipe heating device according to the present invention.

Figure 10B:
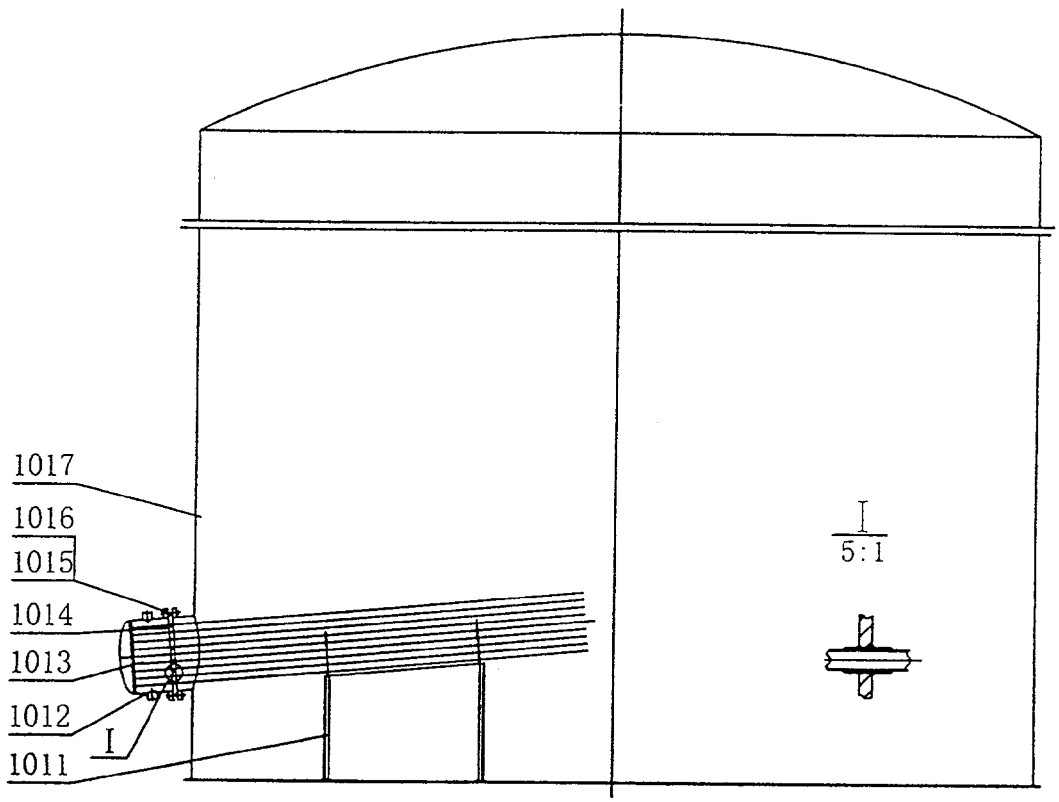

FIG. 10B is a schematic view of an oil heating can according to the present invention.

Figure 10C:
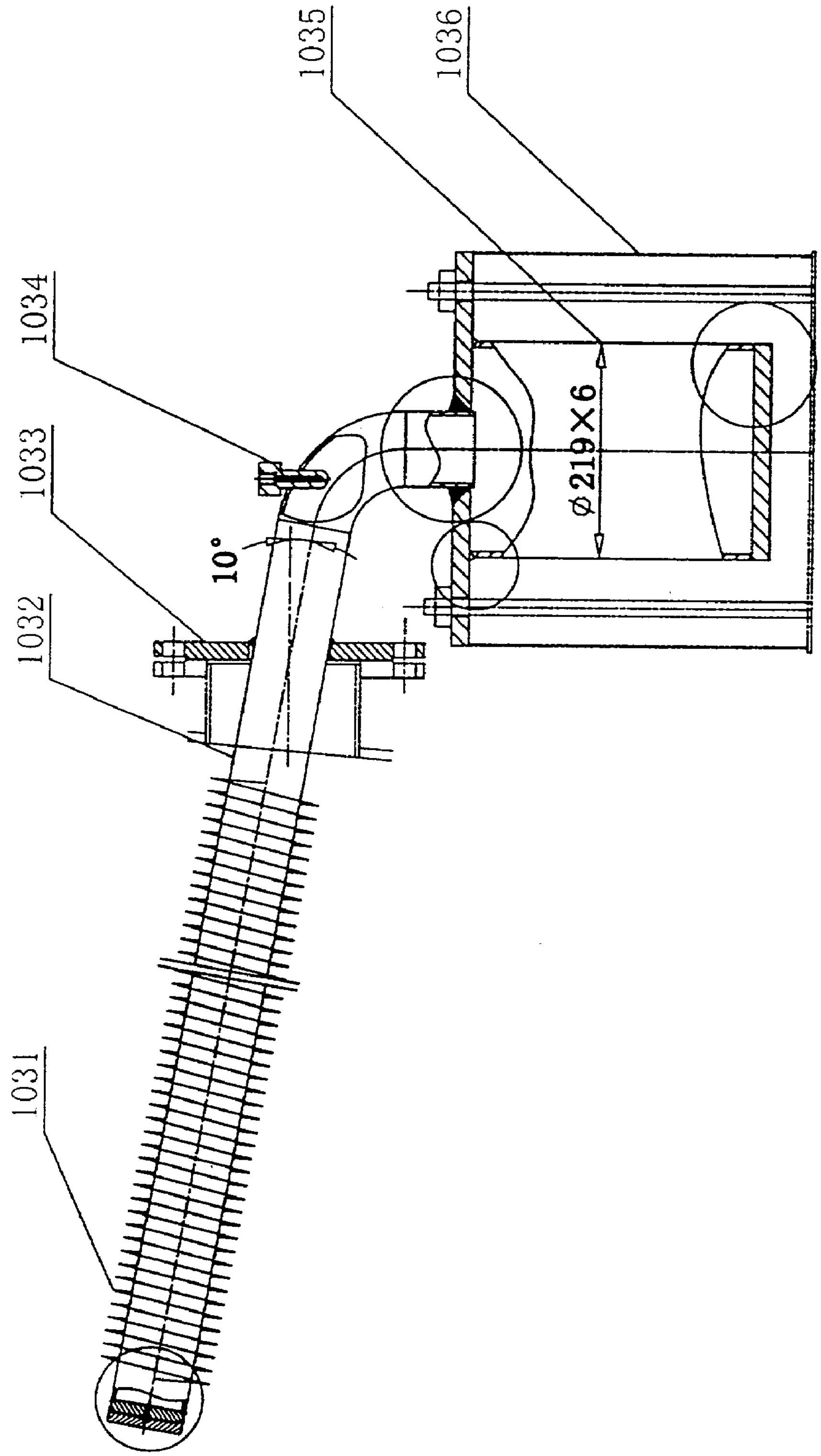

FIG. 10C is a schematic view of crude oil heated in the oil tank at the mouth of the oil well according to the present invention.

Figure 10D:
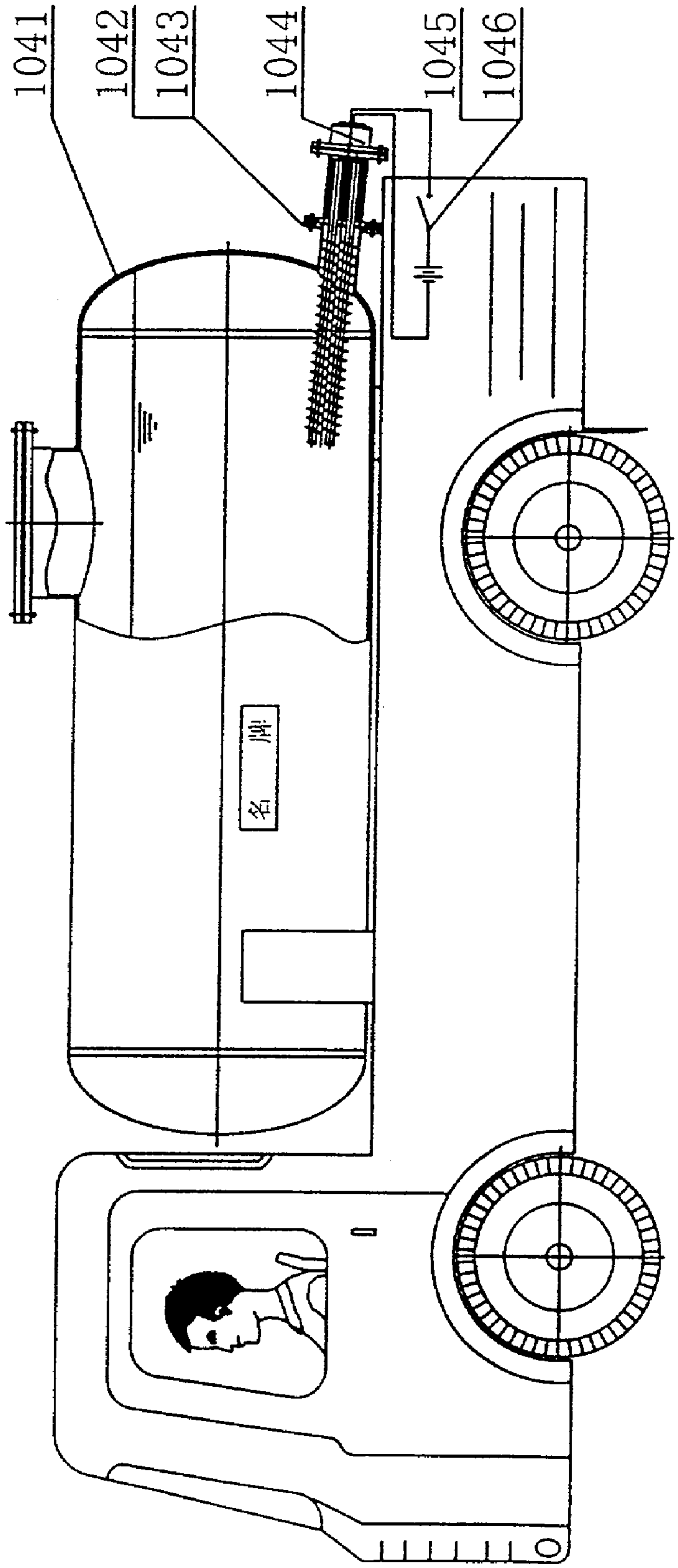

FIG. 10D shows a schematic view of an oil carrier on the truck of the crude oil heater according to the present invention.

Figure 10E:
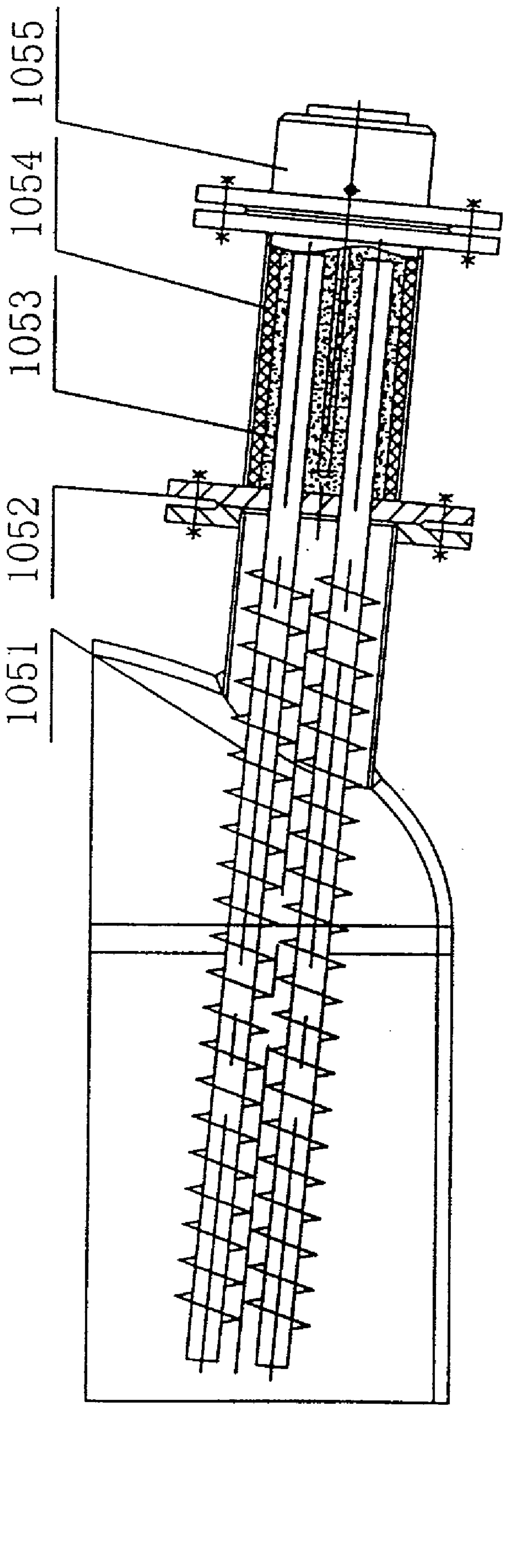

FIG. 10E shows a schematic view of a crude oil device in the heated truck oil carrier according to the present invention.

Figure 10G:
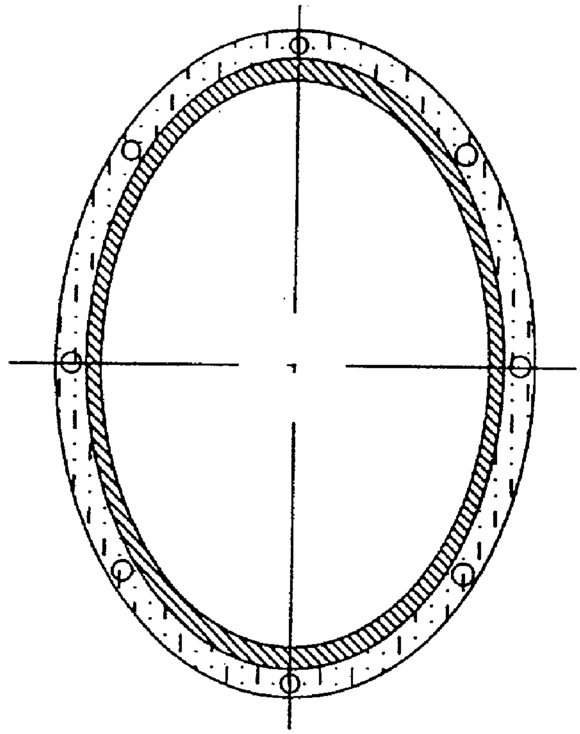
Figure 10F:
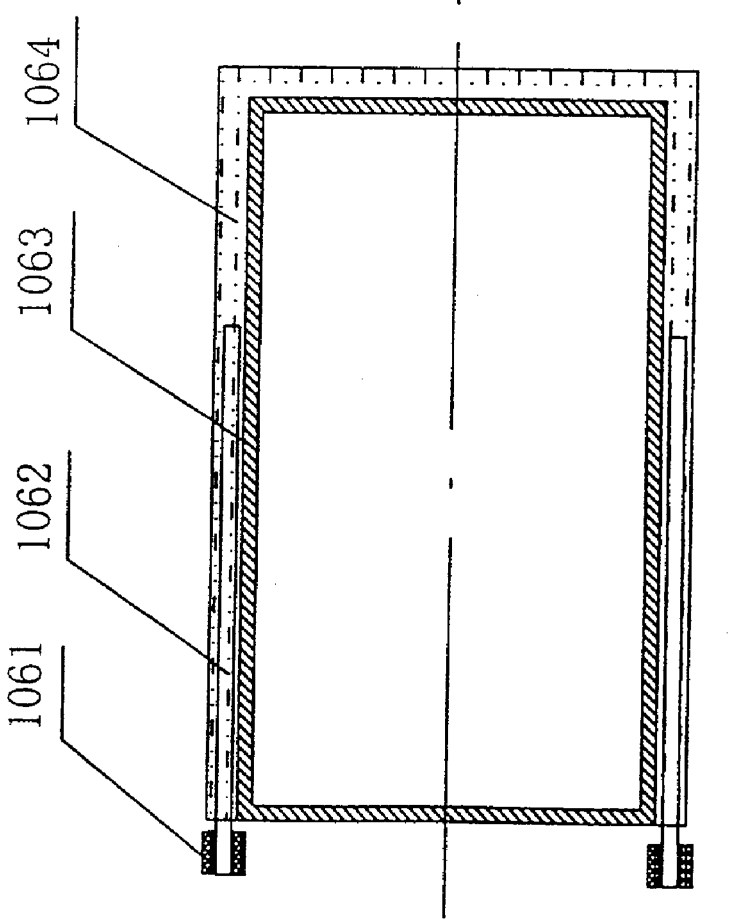

FIG. 10F shows a schematic view of a crude oil or oil material device in the heated truck oil tank according to the present invention.

FIG. 10G is a sectional view showing the oil tank in FIG. 10F.

Figure 10H:
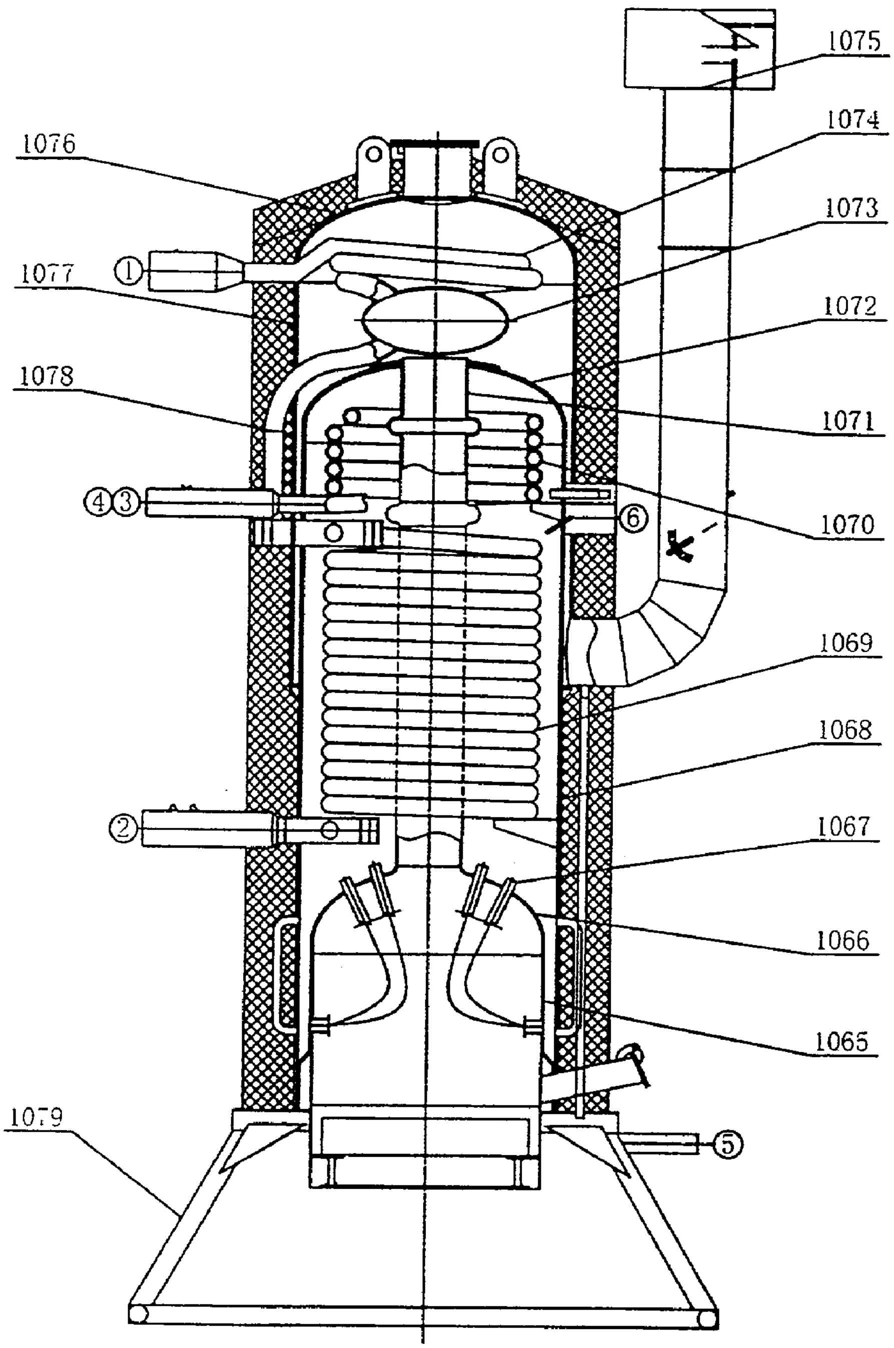
Figure 101:
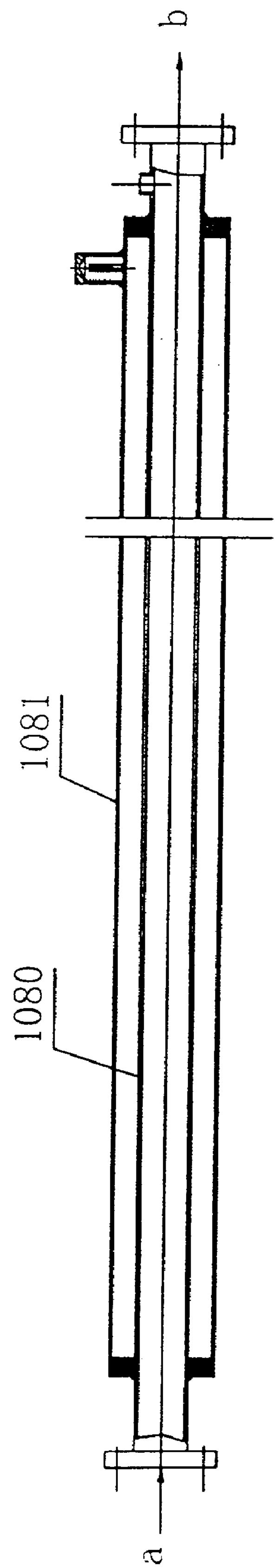

FIG. 10H is a schematic view of the structure of an internally heat exchange type intake heater with high heat transfer rate according to the present invention.

FIG. 10I is a schematic view of the structure of a jacket heat transfer element.

Figure 10J:
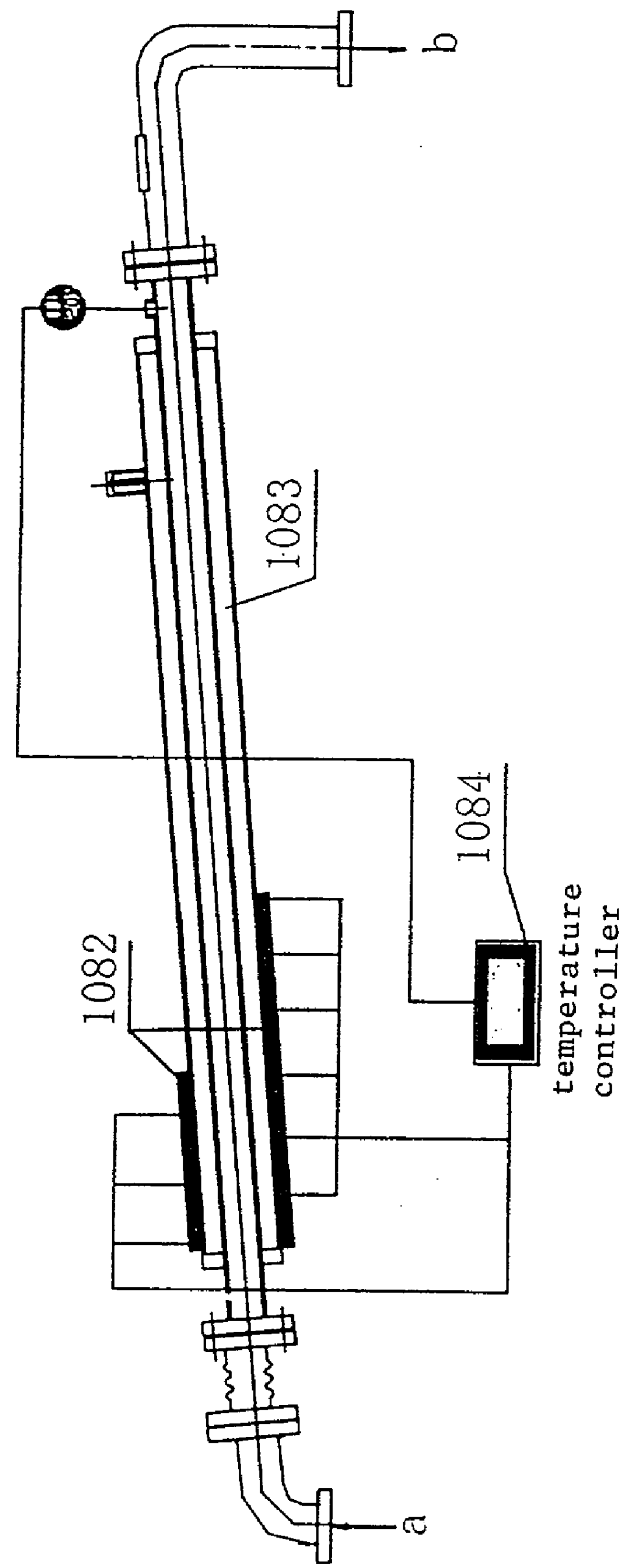

FIG. 10J is a schematic view of the structure of a high crude oil heater according to the present invention.

Figure 10K:
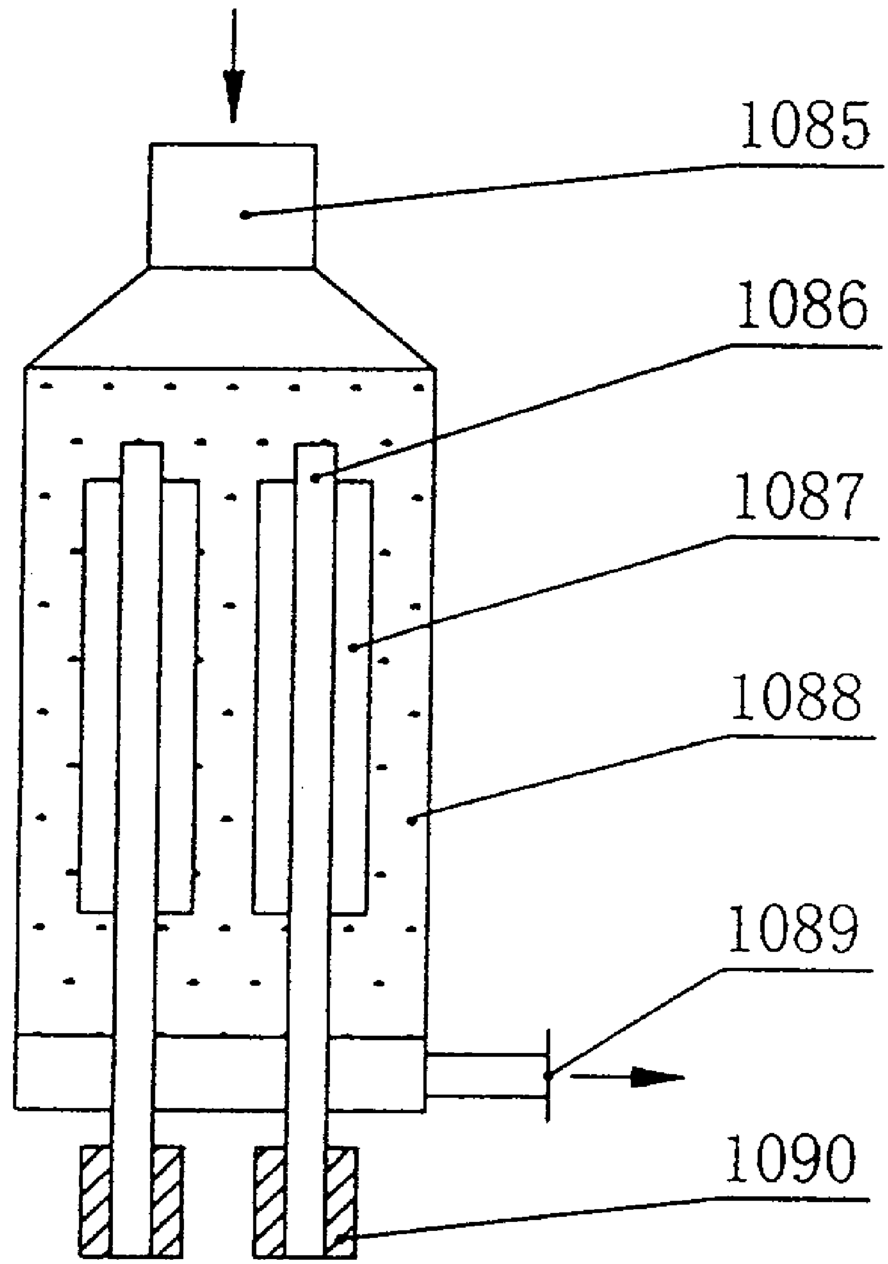

FIG. 10K shows a schematic view of a heat absorbing chemical reactor with high heat transfer rate.

Figure 10L:
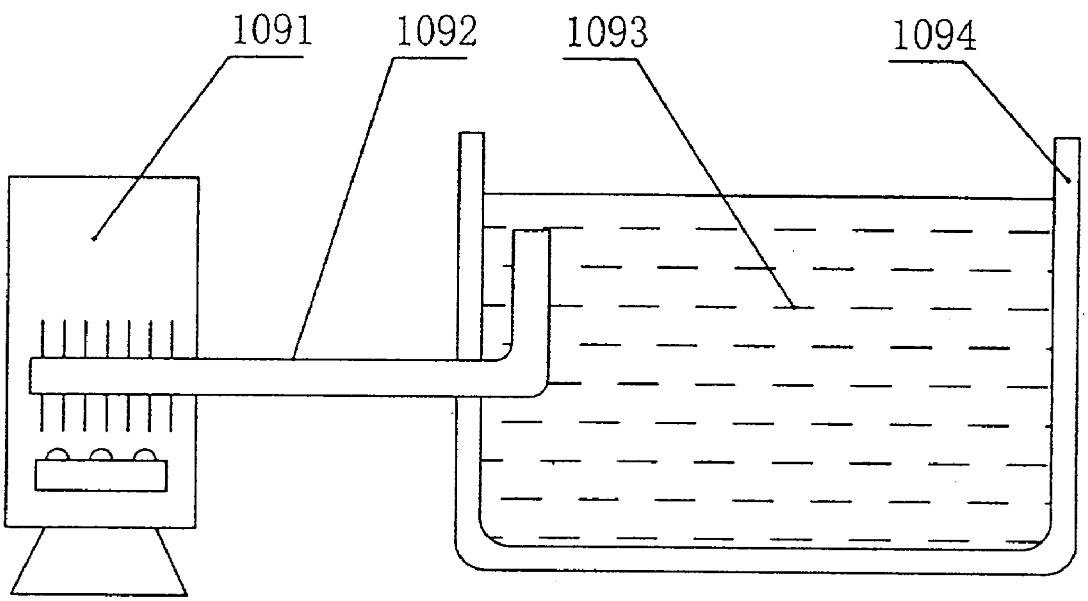

FIG. 10L shows a schematic view of a thermostatic bathtub with high heat transfer rate.

Figure 10M:
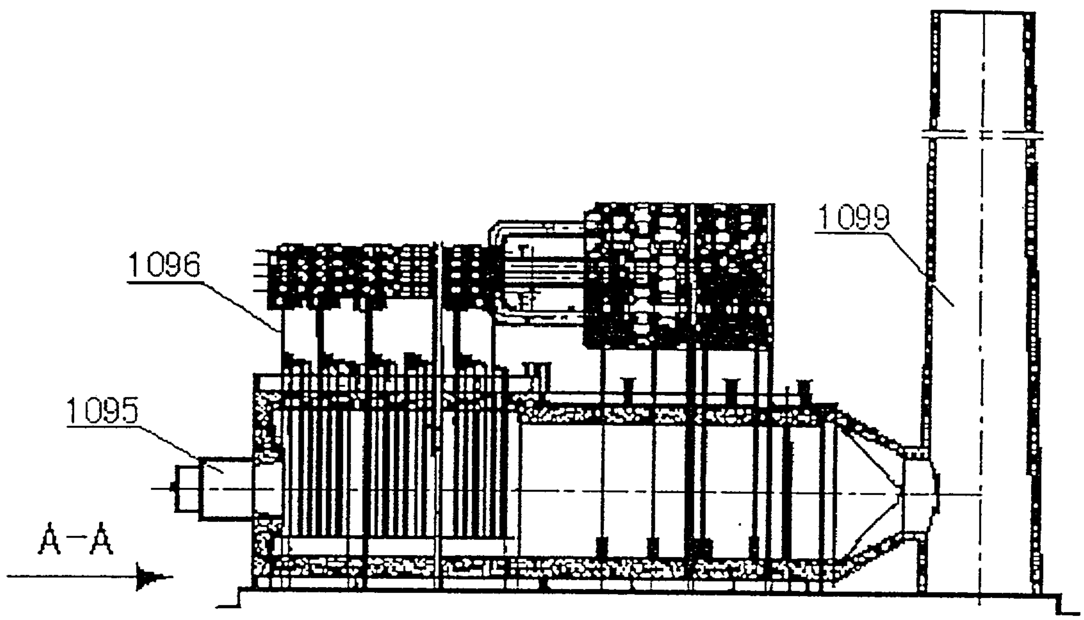

FIG. 10M shows a schematic view of an oil pipe heating furnace with high heat transfer rate.

Figure 10N:
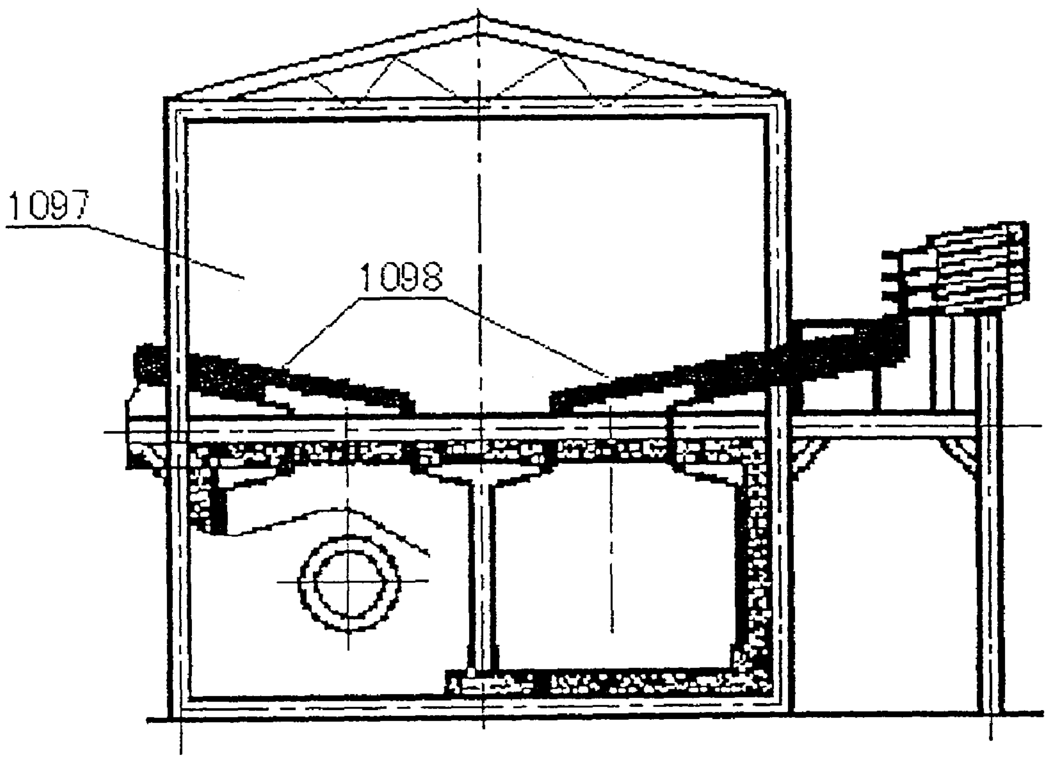
Figure 100:
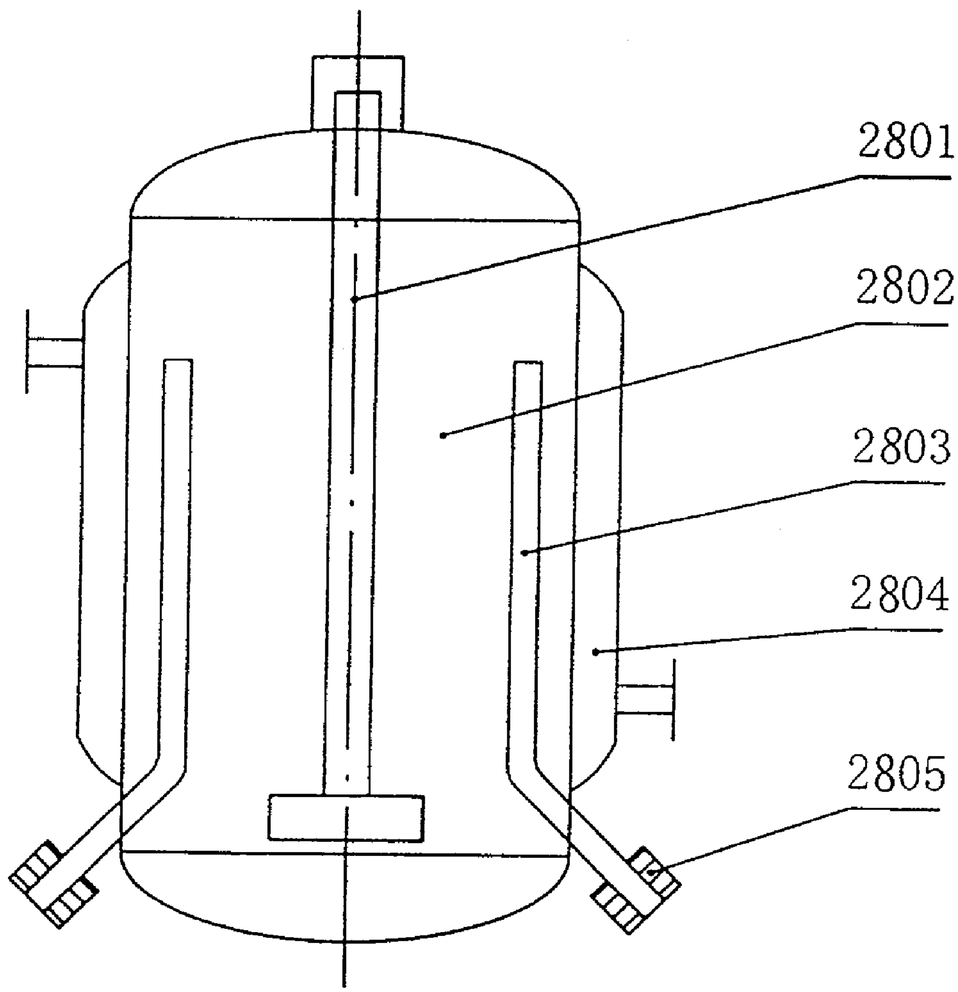

FIG. 10N is a view of the device in FIG. 10M along the broken line A—A.

FIG. 10O shows a schematic view of a chemical reactor vessel with high heat transfer rate.

Figure 10P:
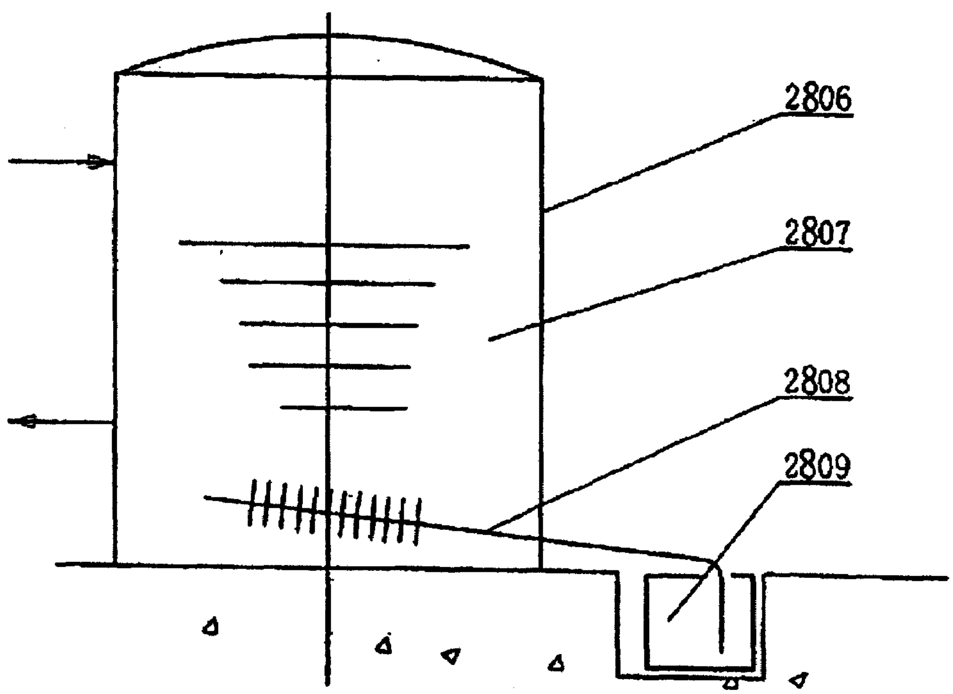

FIG. 10P shows a schematic view of a high heat transfer rate heater for heavy oil tanks.

Figure 10Q:
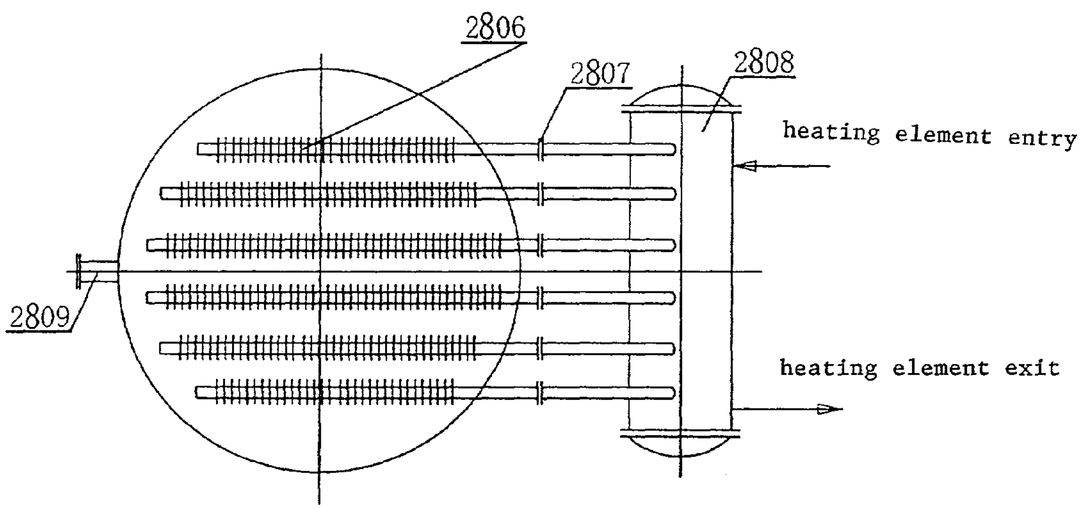

FIG. 10Q is a horizontal view of the heater in FIG. 10P.

Figure 10R:
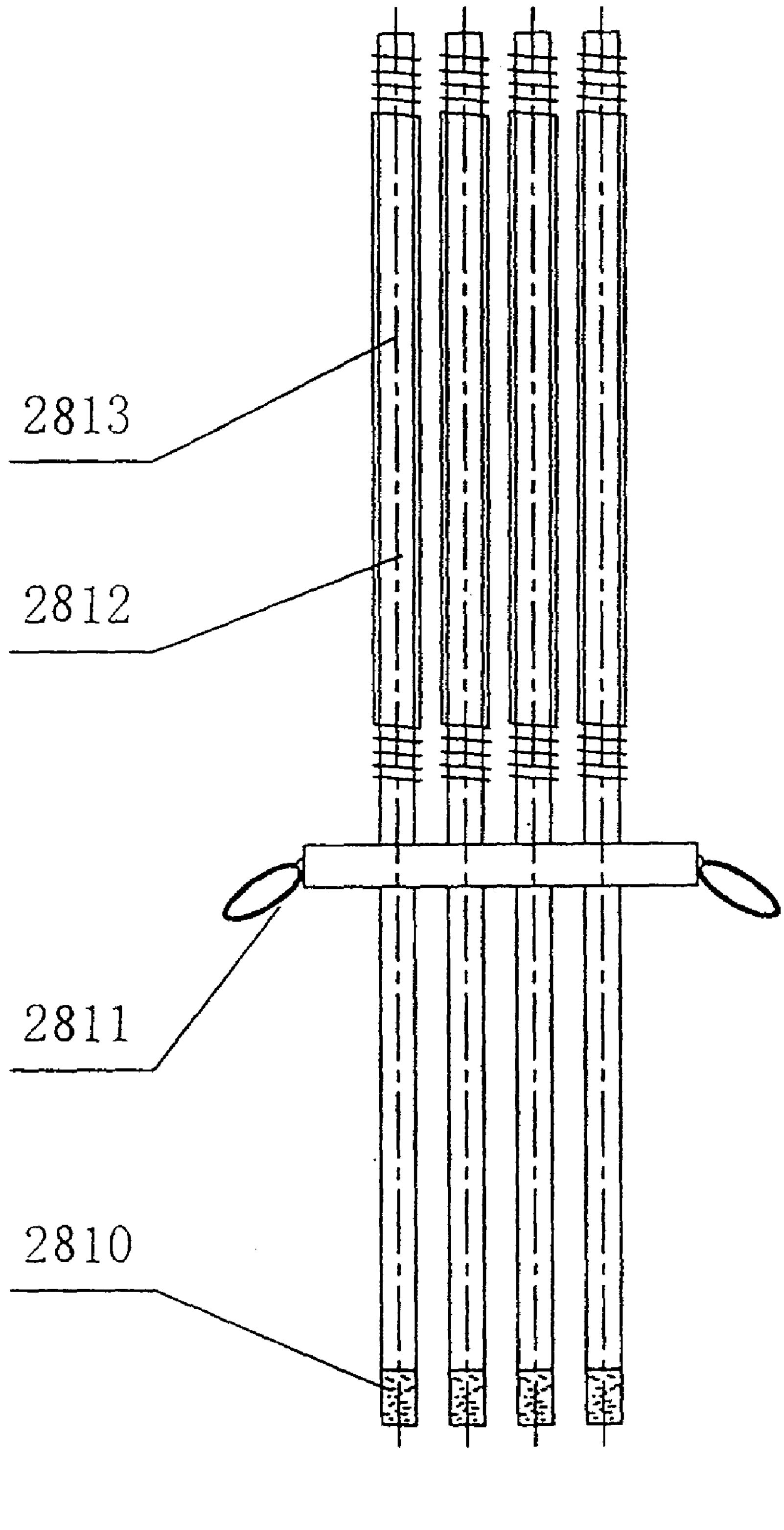

FIG. 10R is a schematic view of the structure of a high heat transfer rate element for heat transmission and heat-dissipating according to the present invention, which prevents spontaneous ignition and heating.

Figure 11:
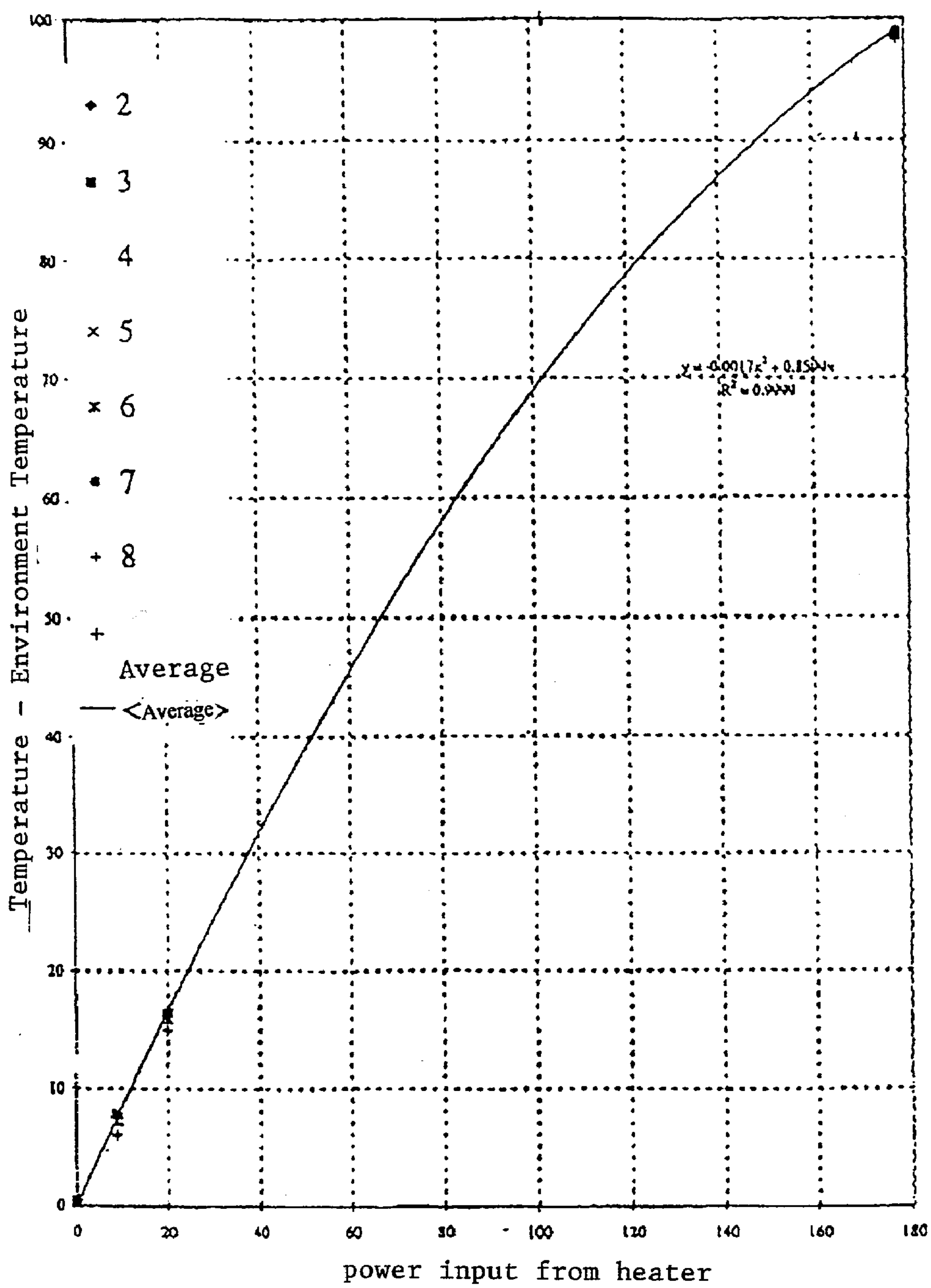
Figure 11A:
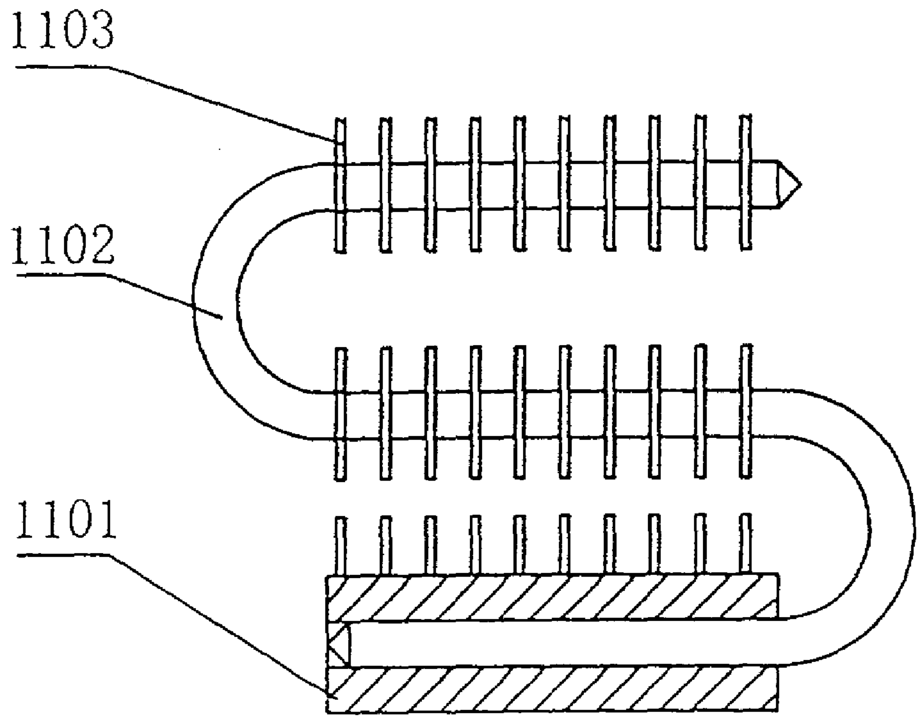

FIG. 11A shows a schematic view of a CPU cooler for desktop PCs, using the high heat transfer rate element according to the present invention.

Figure 11B:
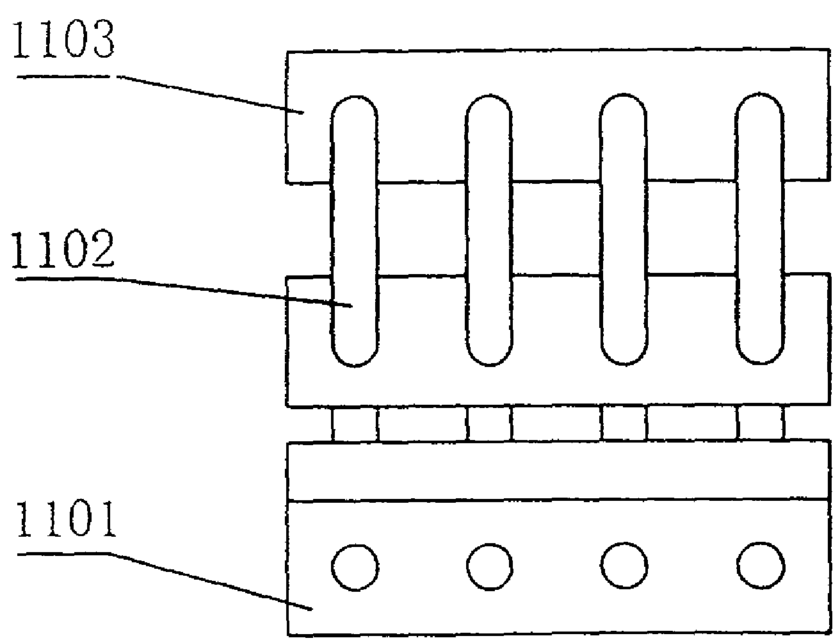

FIG. 11B is a left side view of the cooler in FIG. 11A.

Figure 11C:
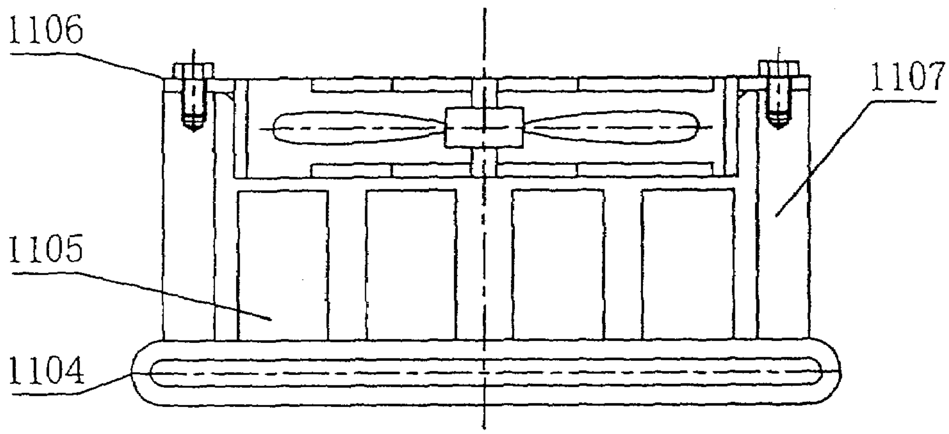

FIG. 11C shows a schematic view of another application of the CPU cooler for desktop PCs, using the high heat transfer rate element according to the present invention.

Figure 11D:
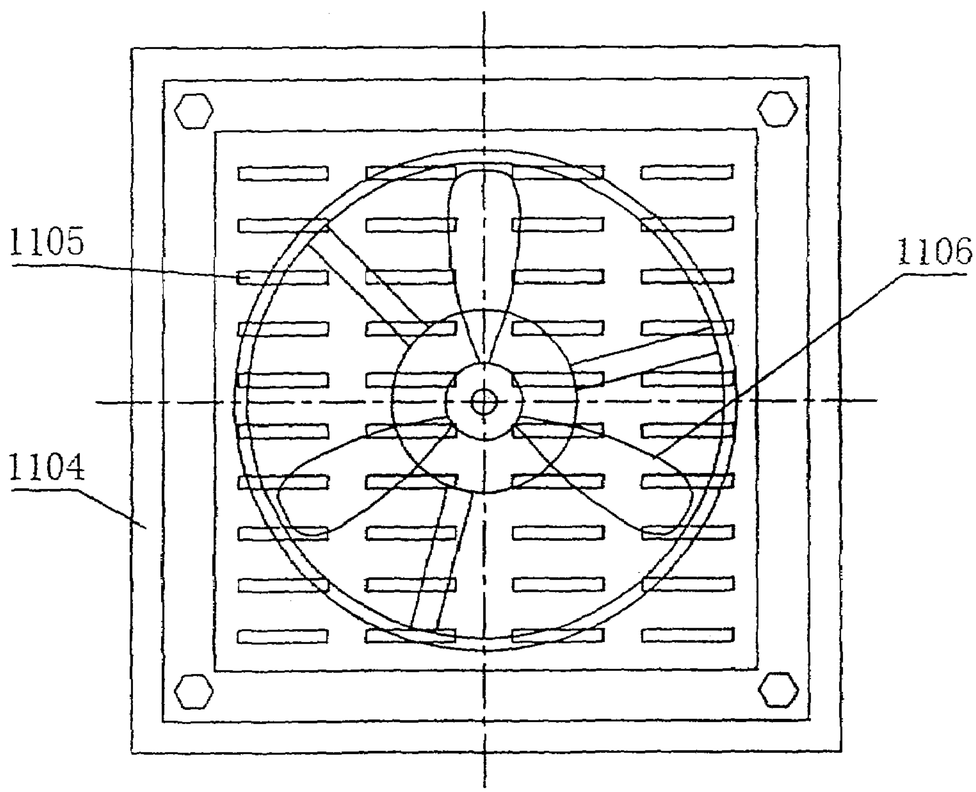

FIG. 11D is a left side view of the cooler in FIG. 11C.

Figure 11F:
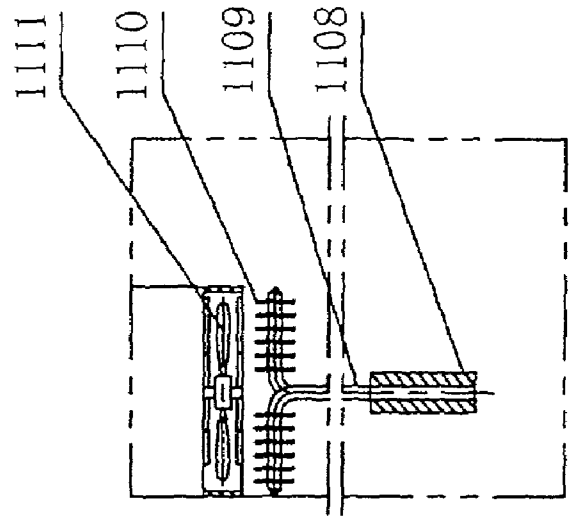
Figure 11E:
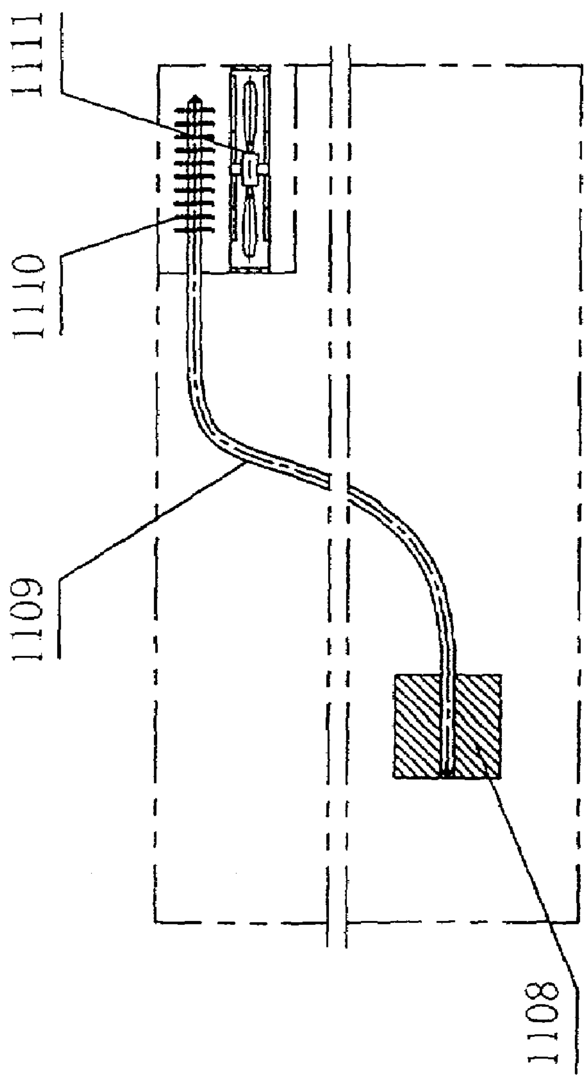

FIG. 11E shows a schematic view of an external CPU cooler for desktop PCs, using the heat transfer element of the present invention. The cooler is used for horizontal models.

FIG. 11F shows a schematic view of an external CPU cooler for desktop PCs, using the high heat transfer rate element of the present invention. The cooler is used for vertical models.

Figure 11G:
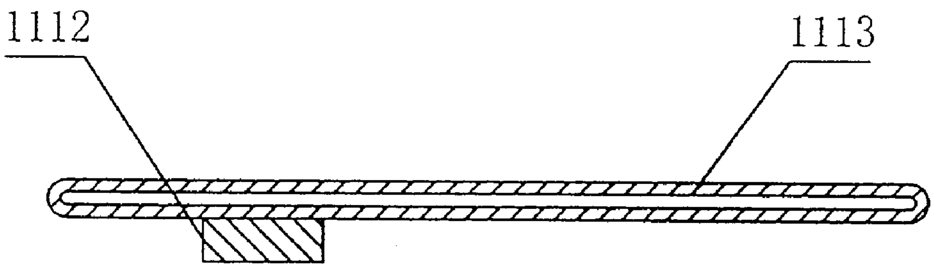

FIG. 11G shows a schematic view of a CPU cooler for notebook computers, using the high heat transfer rate element according to the present invention.

Figure 11H:
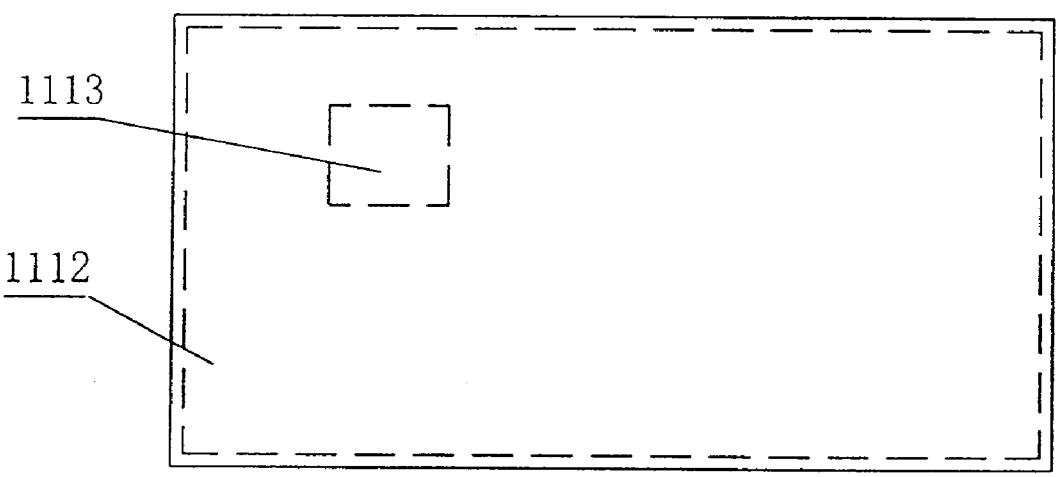

FIG. 11H is a top view of the cooler in FIG. 11G.

Figure 11J:
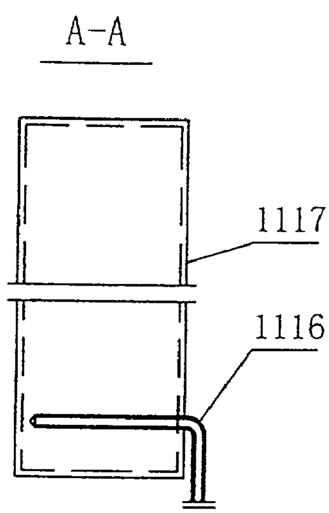
Figure 11I:
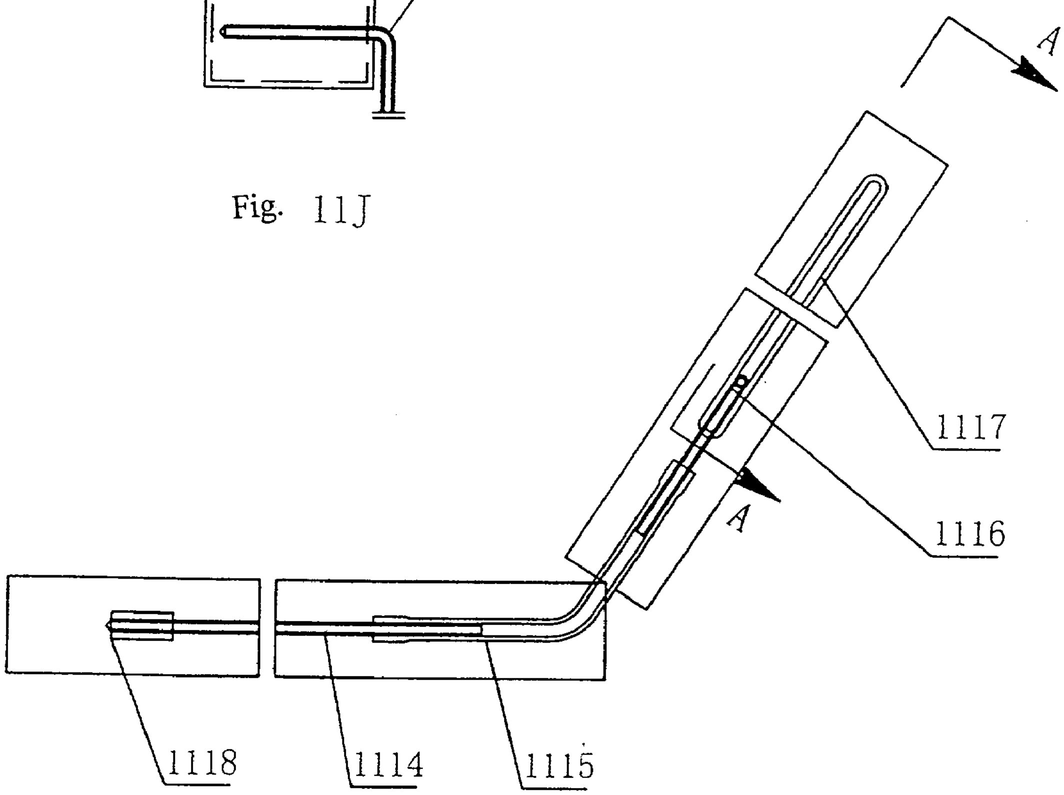

FIG. 11I shows a schematic view of another application of the CPU cooler for notebook computers, using the high heat transfer rate element of the present invention.

FIG. 11J is a schematic upward view along the arrow AA in FIG. 11I.

Figure 11K:
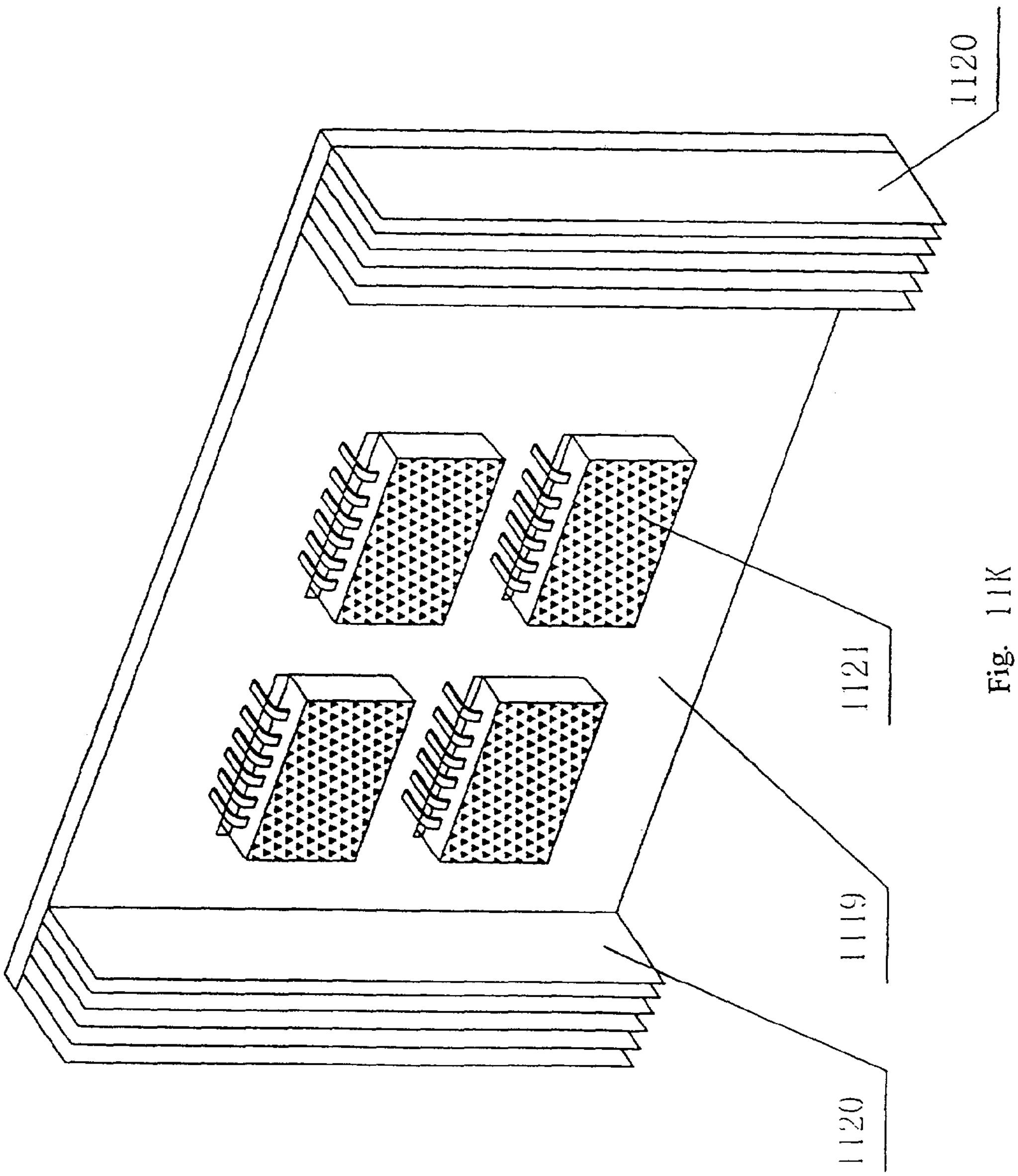

FIG. 11K shows a schematic view of an IC cooler using the heat transfer element according to the present invention.

Figure 11L:
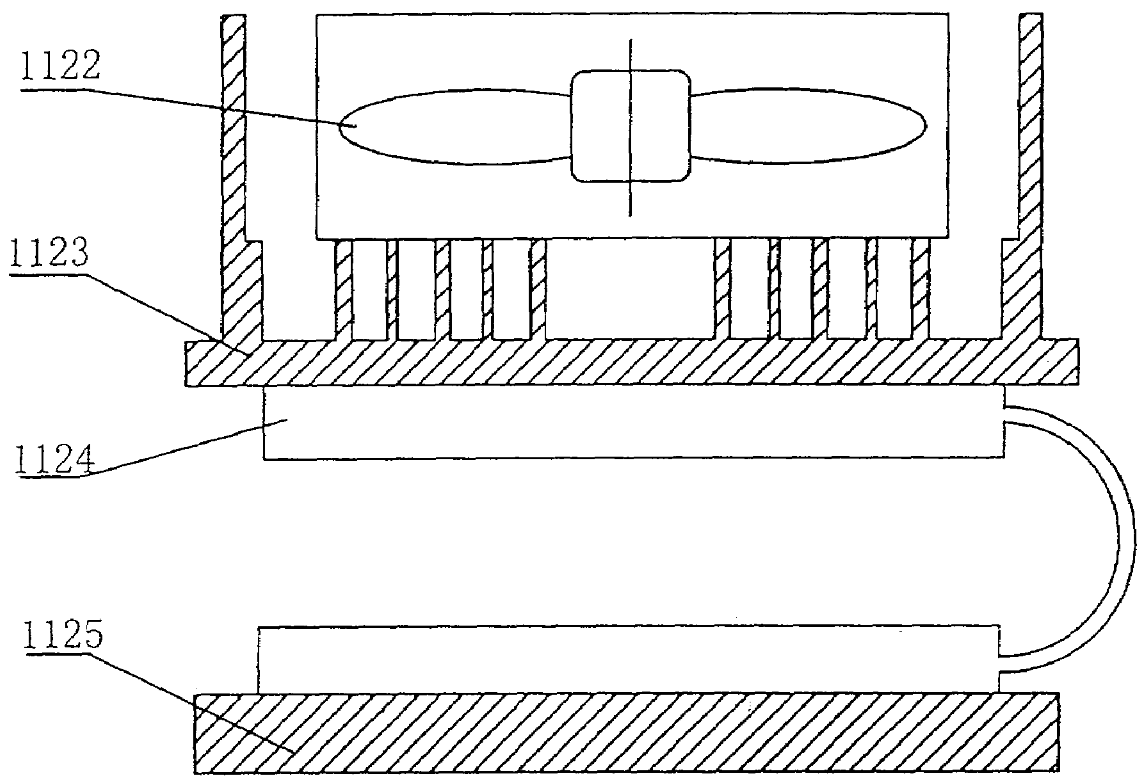

FIG. 11L is a schematic view of the installation of a semiconductor cooling device.

Figure 11M:
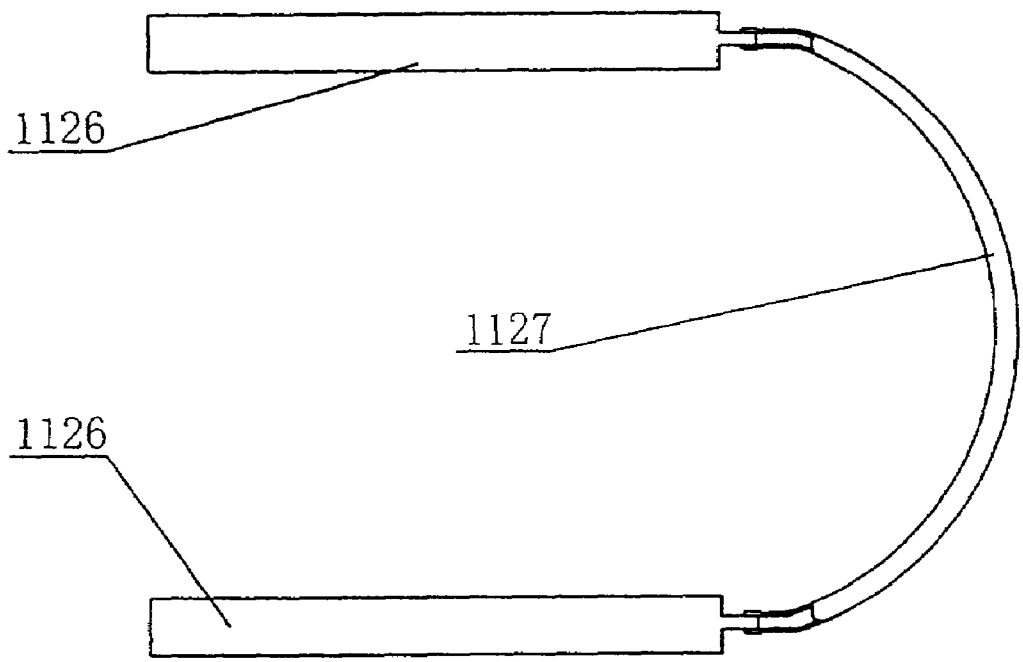

FIG. 11M shows a schematic view of the cooler in the device shown in FIG. 11L.

Figure 11N:
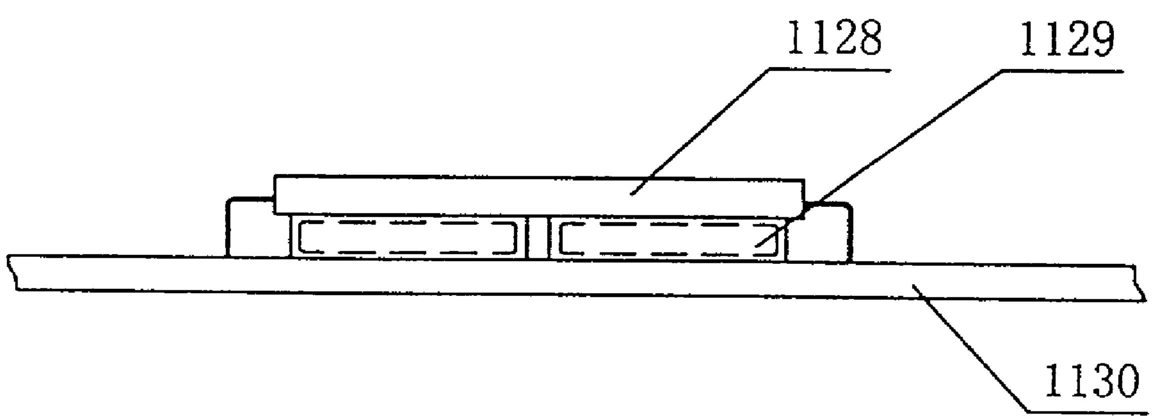
Figure 110:
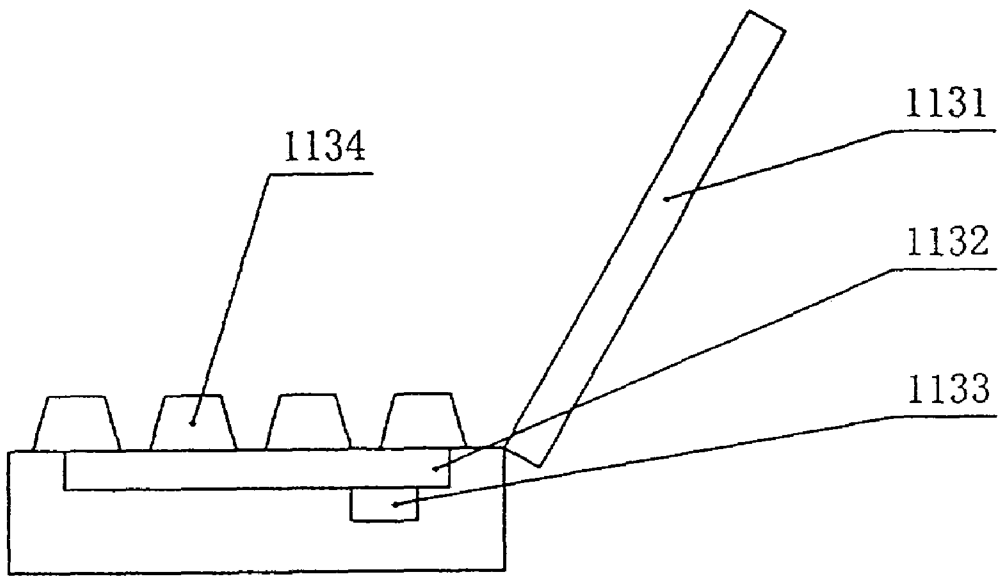

FIG. 11N shows a schematic view of an IC carrying cooler for notebook computer CPU, using the high heat transfer rate element of the present invention.

FIG. 11O shows a schematic view of a notebook computer using the high heat transfer rate element according to the present invention.

Figure 11P:
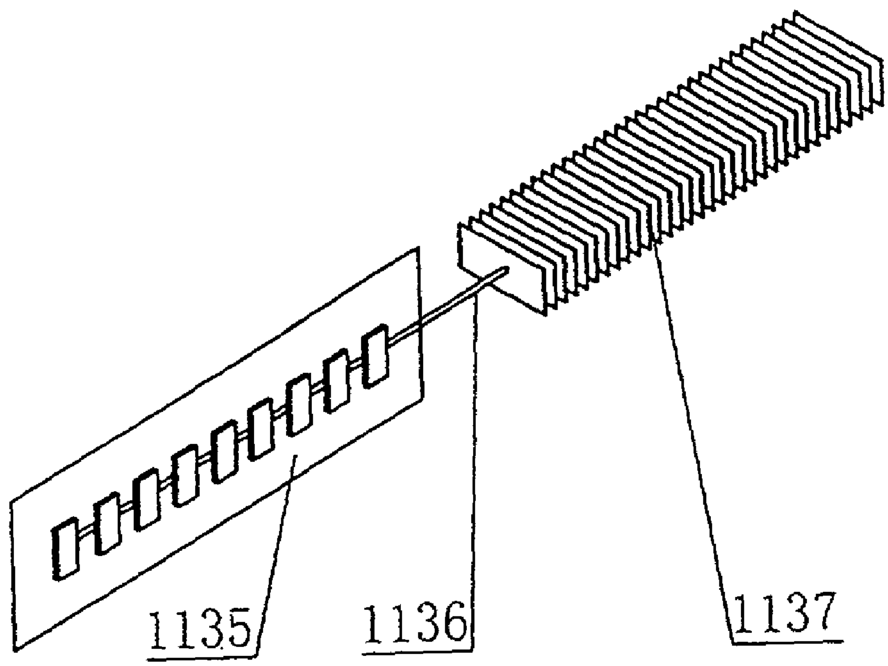

FIG. 11P is a schematic view of showing 3-D view of a chipset cooling device using the high heat transfer rate element according to the present invention.

Figure 11Q:
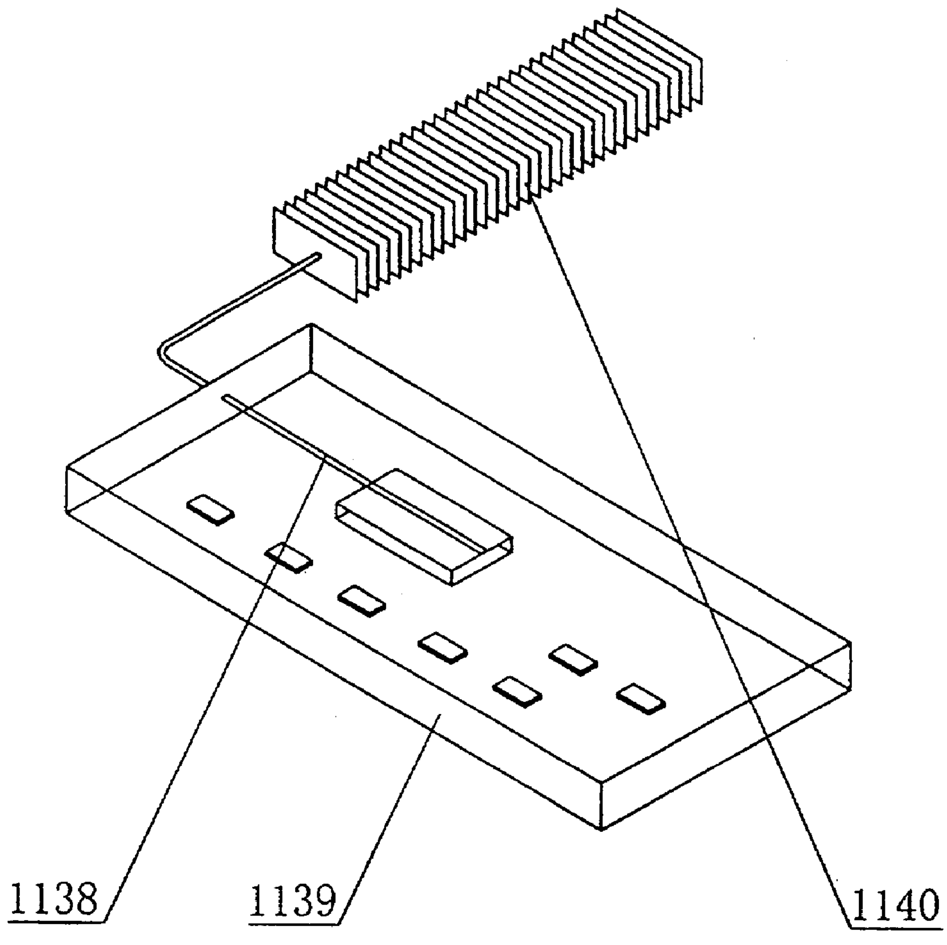

FIG. 11Q is a schematic view showing a 3-D view of an EMI-reducing cooling device using the high heat transfer rate element according to the present invention.

Figure 12A:
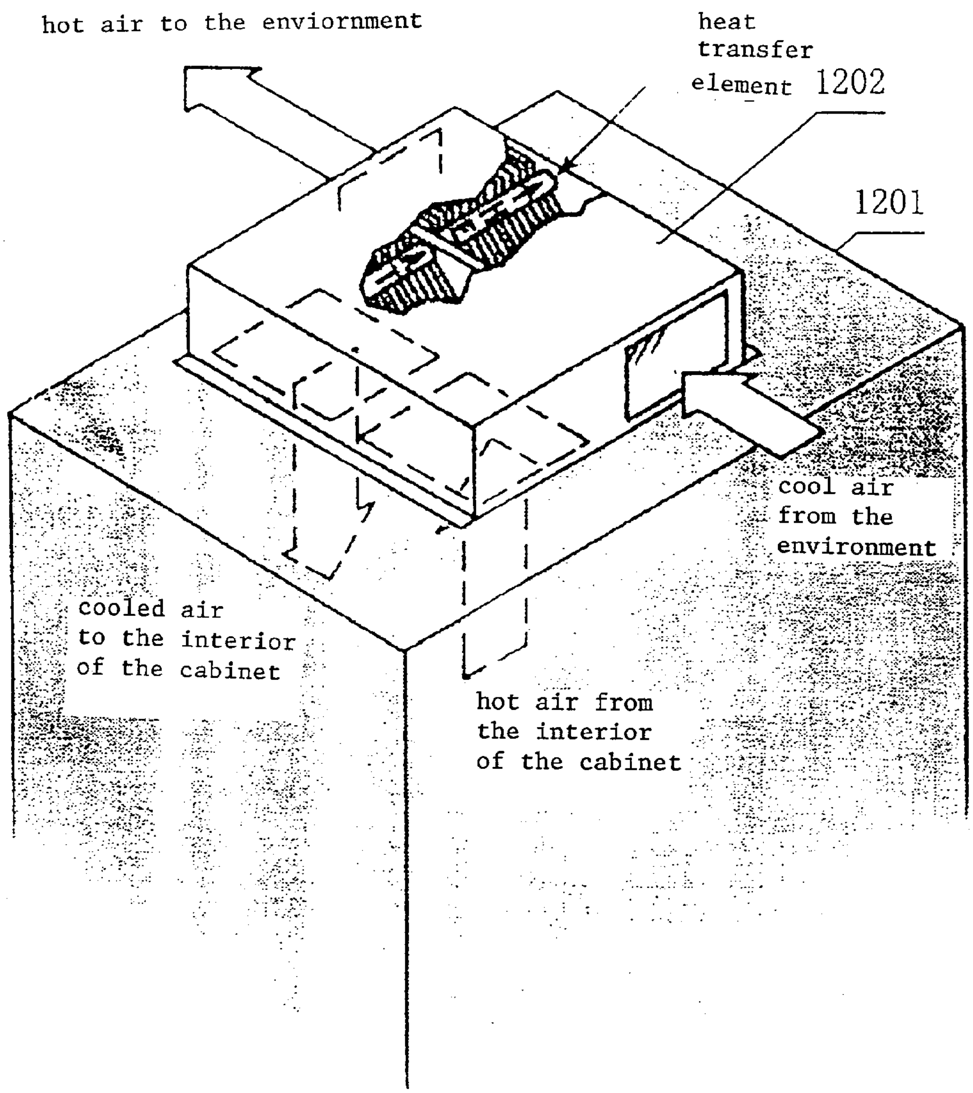

FIG. 12A is a schematic view showing an enclosed radiator for electronic controllers, using the high heat transfer rate element according to the present invention. The radiator is set on the top of the controller.

Figure 12B:
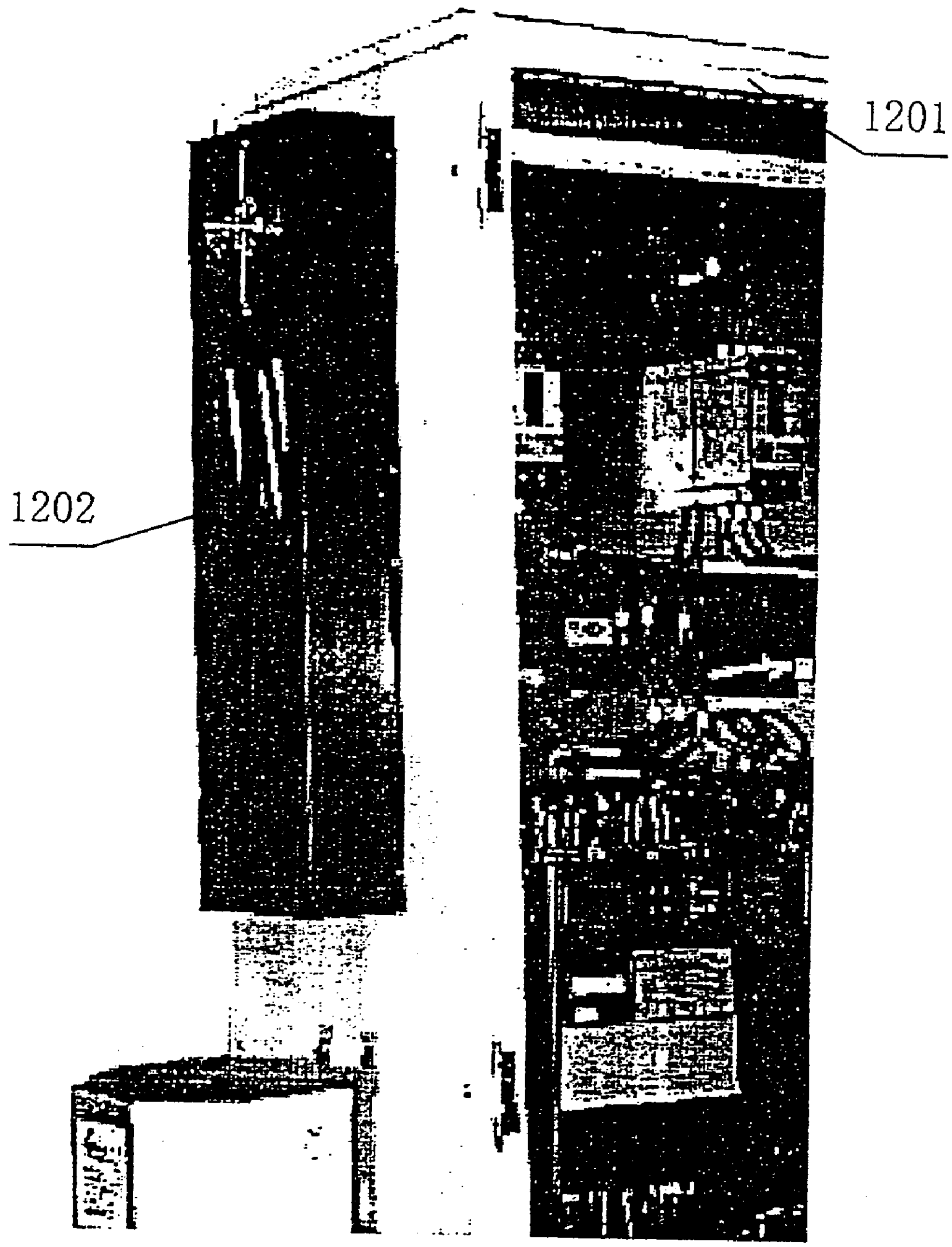

FIG. 12B is a schematic view showing an enclosed radiator for electronic controllers, using the high heat transfer rate element according to the present invention. The radiator is set on one side of the controller.

Figure 12C:
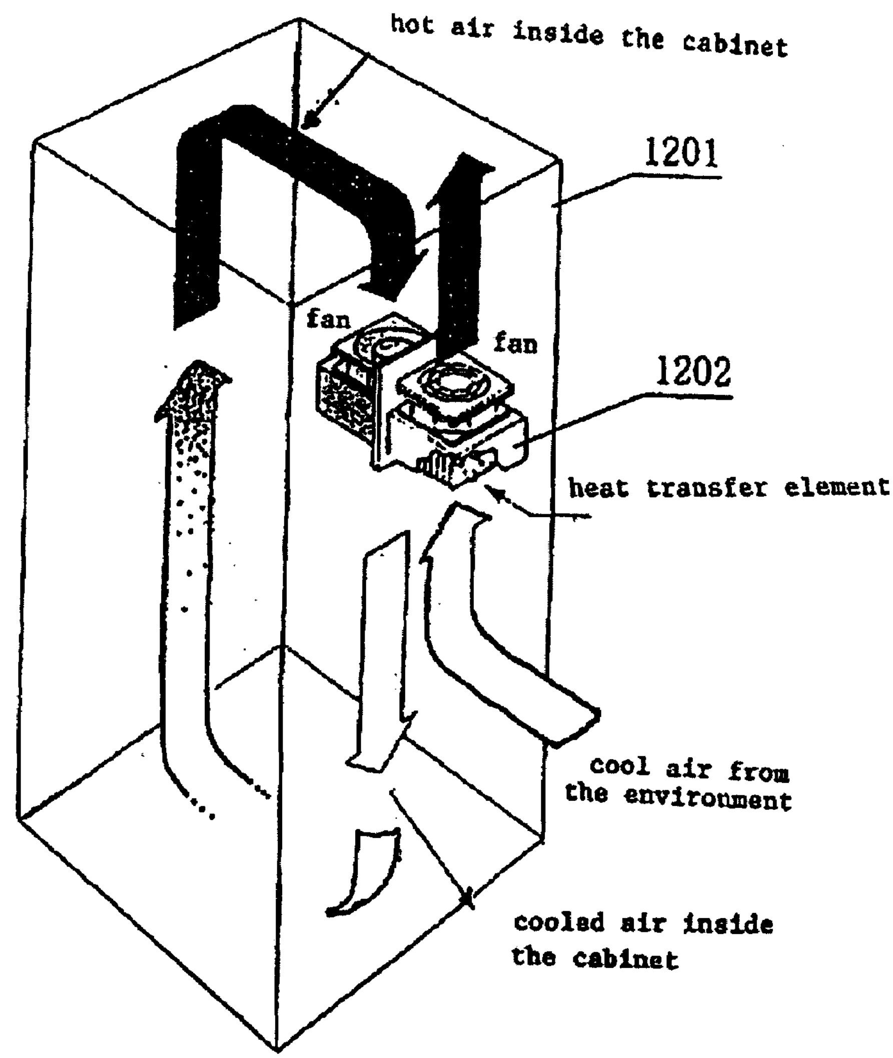

FIG. 12C is a schematic view showing an enclosed radiator for electronic controllers, using the high heat transfer rate element according to the present invention. The radiator is embedded onto the body of the controller.

Figure 12D:
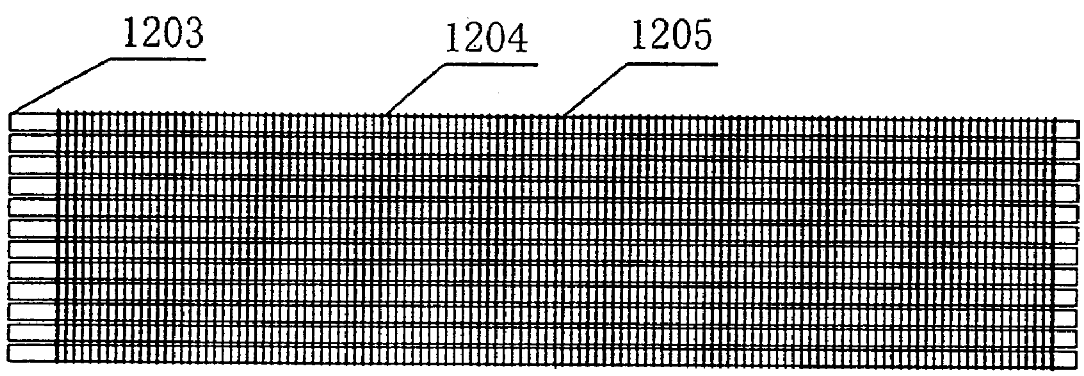

FIG. 12D is a partially cross-sectional view of the radiator shown in FIGS. 12A–12C.

Figure 12E:
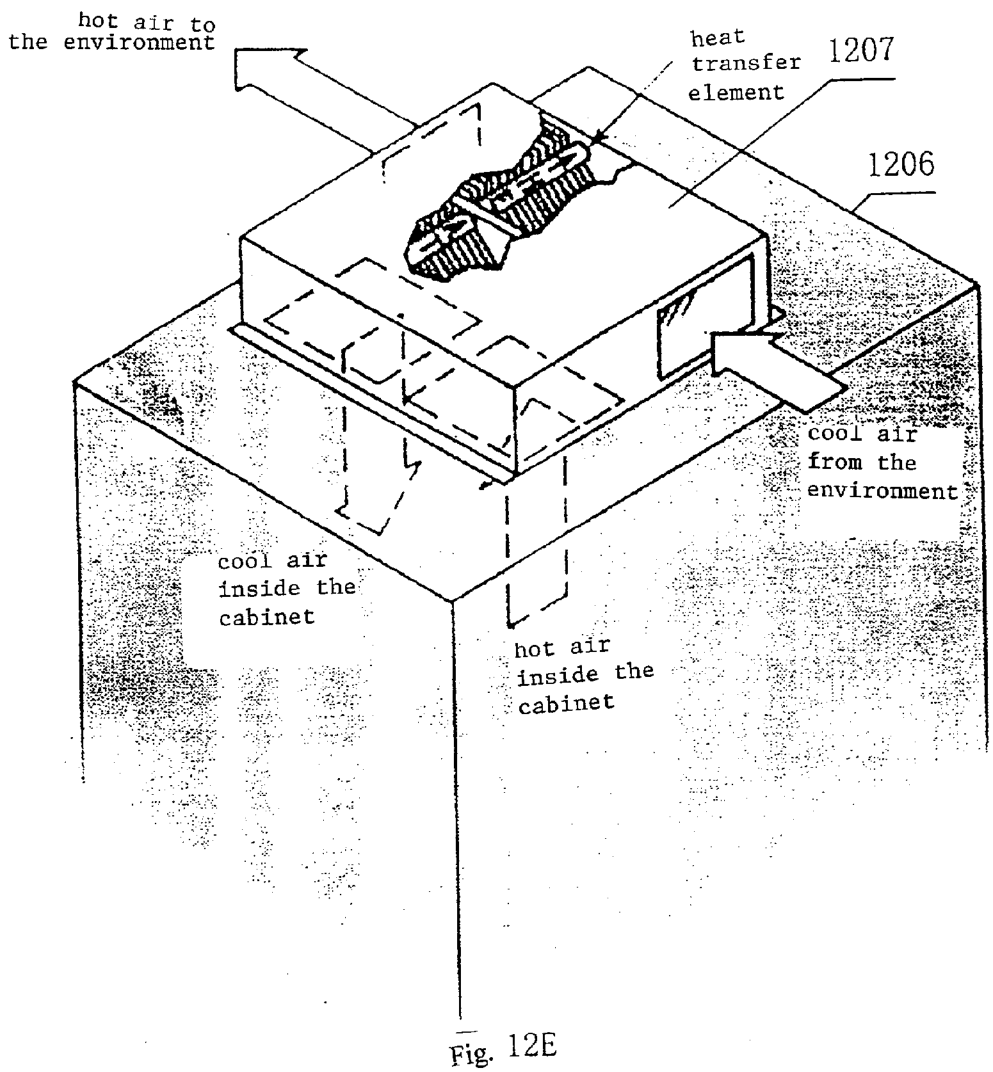

FIG. 12E is a schematic view showing the installation of an enclosed radiator in a display boxes for use in industry, using the high heat transfer rate element according to the present invention.

Figure 12F:
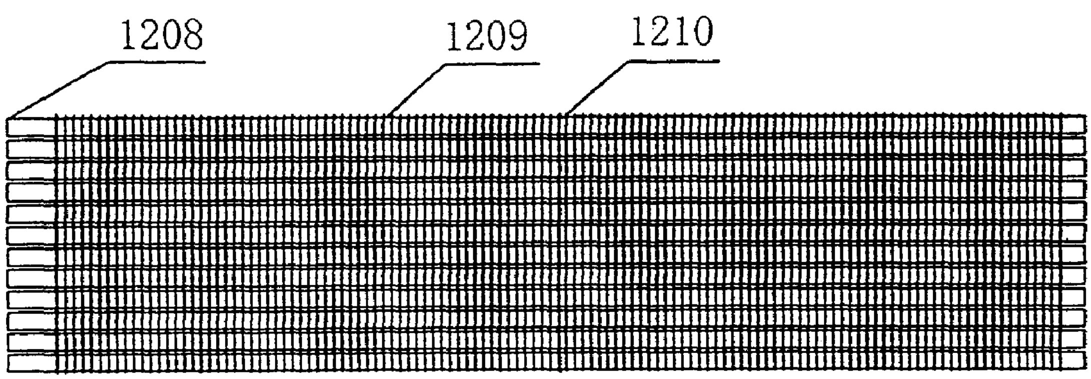

FIG. 12F is a partially cross-sectional view of the radiator shown in FIG. 12E.

Figure 12G:
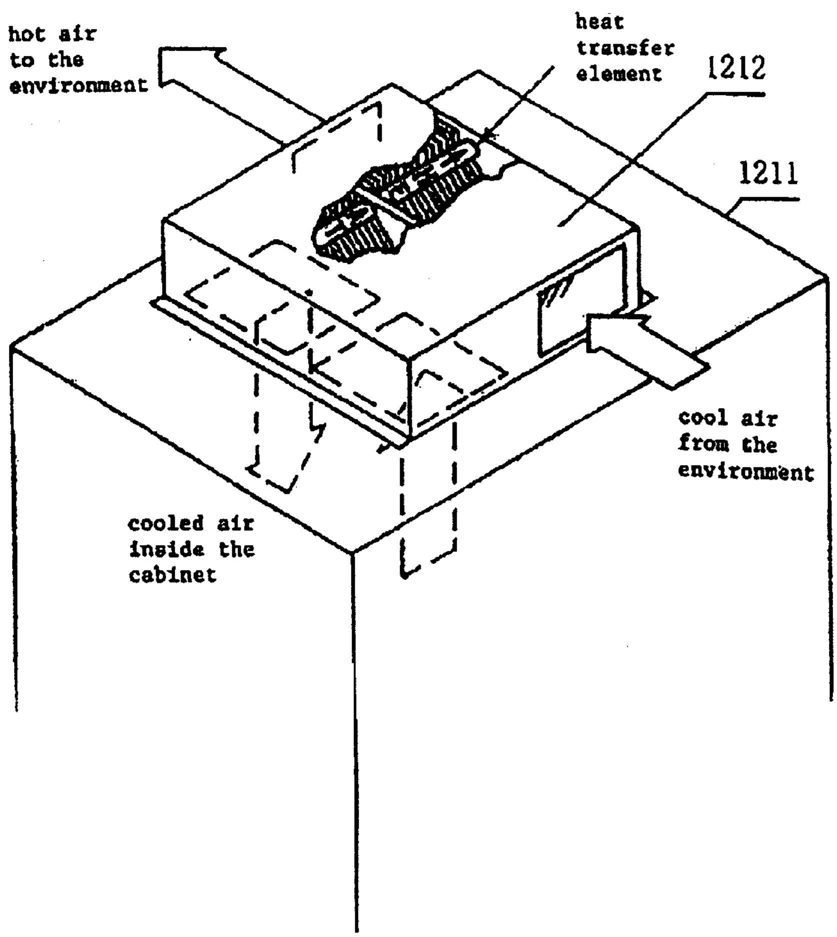

FIG. 12G is a schematic view showing the installation of an enclosed cooler for televisions, using the high heat transfer rate element according to the present invention.

Figure 12H:
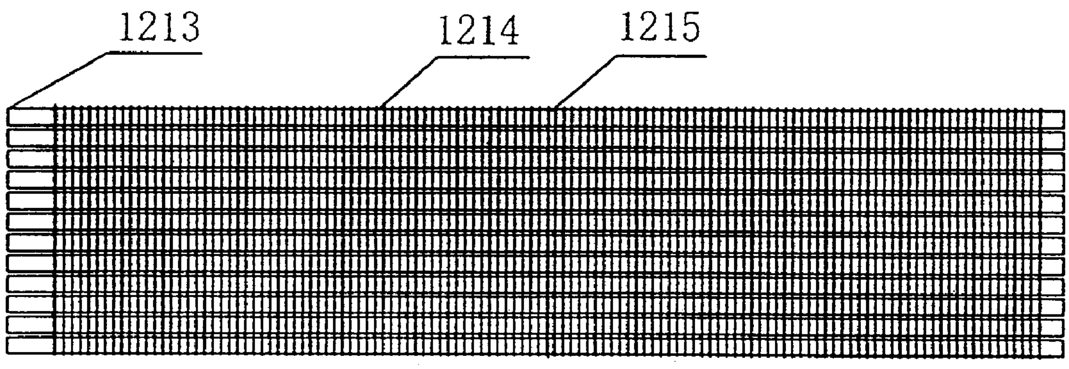

FIG. 12H is a partially cross-sectional view of the radiator shown in FIG. 12G.

Figure 12I:
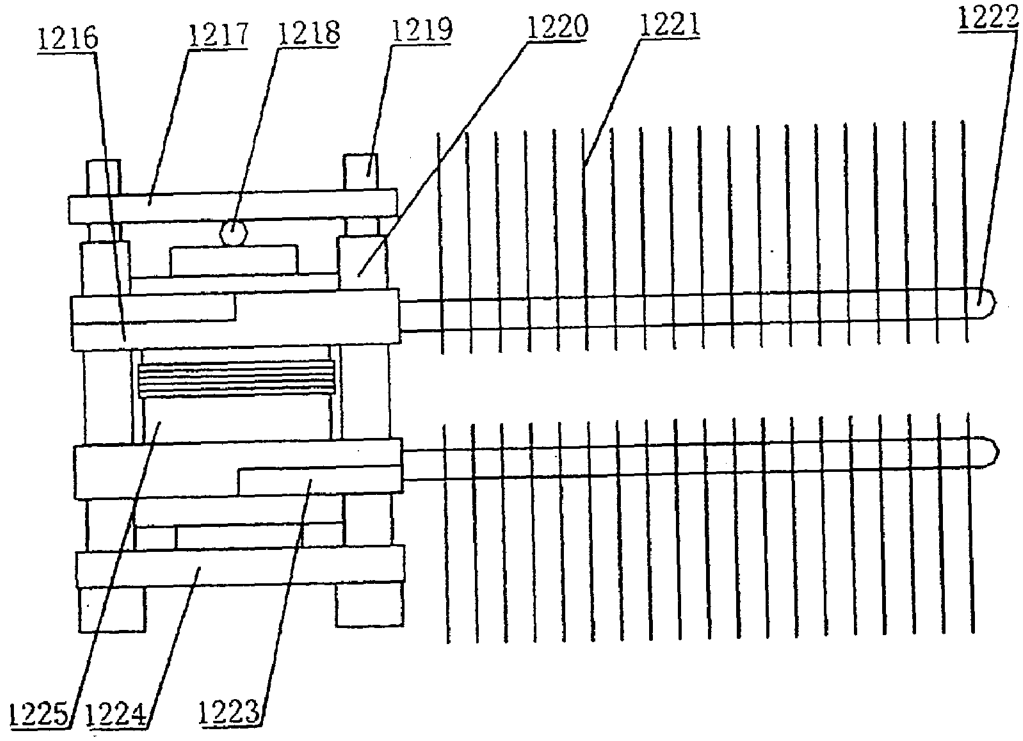

FIG. 12I is a front view of a cooler for controllable silicon elements, using the high heat transfer rate element according to the present invention.

Figure 12J:
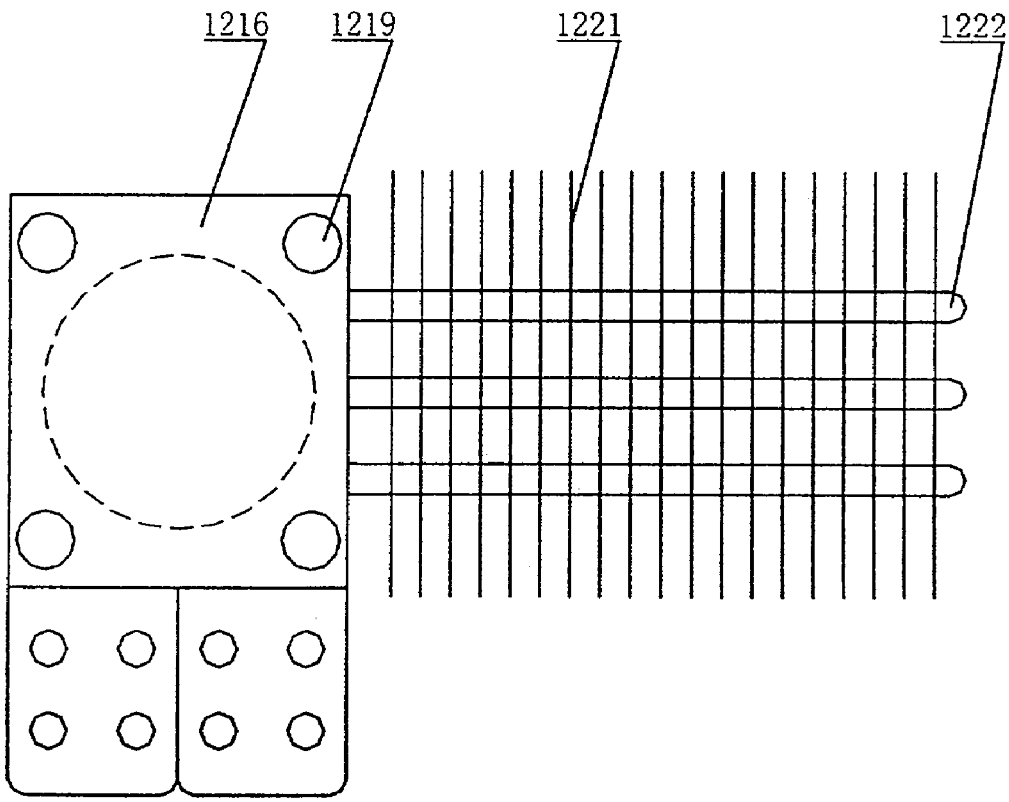

FIG. 12J is a top view of the cooler shown in FIG. 12I.

Figure 12K:
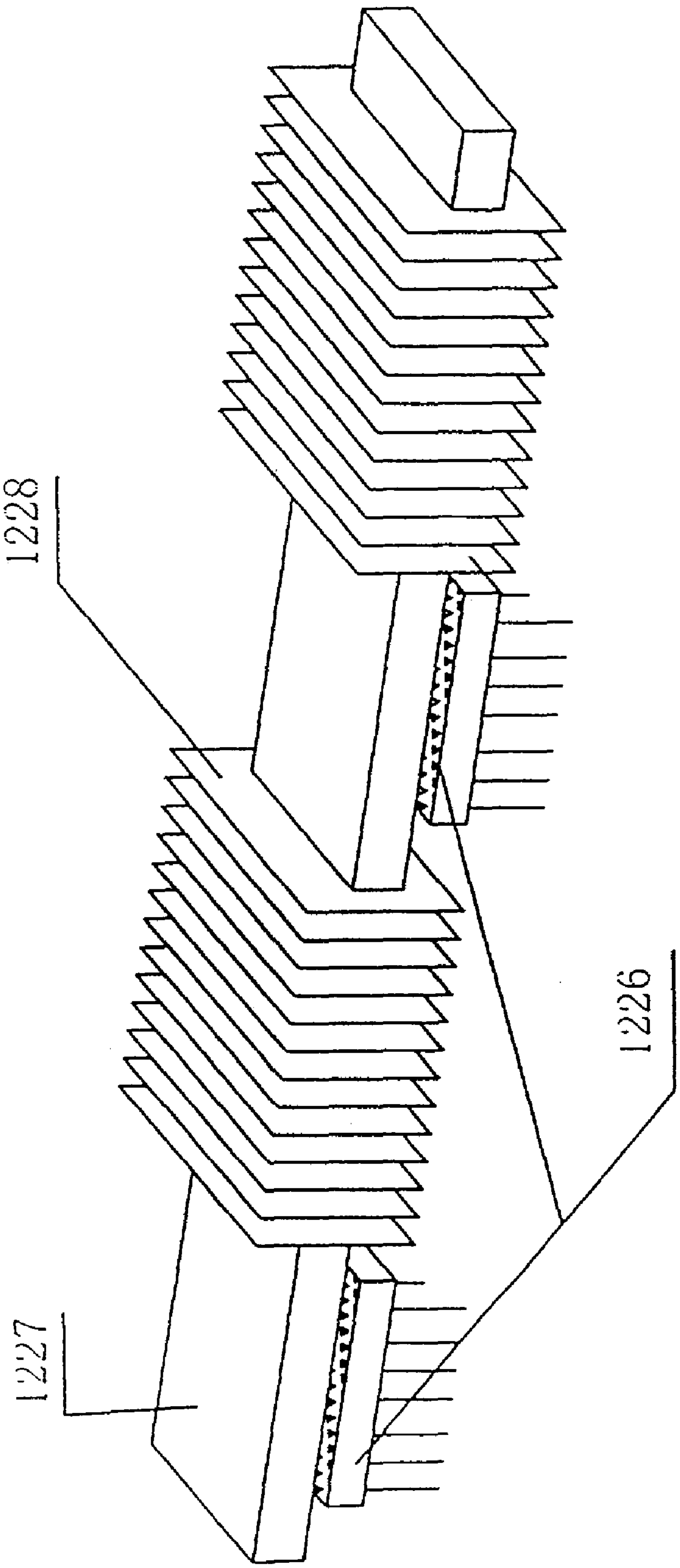

FIG. 12K is another embodiment of a cooler for controllable silicon elements, using the high heat transfer rate element according to the present invention.

Figure 12L:
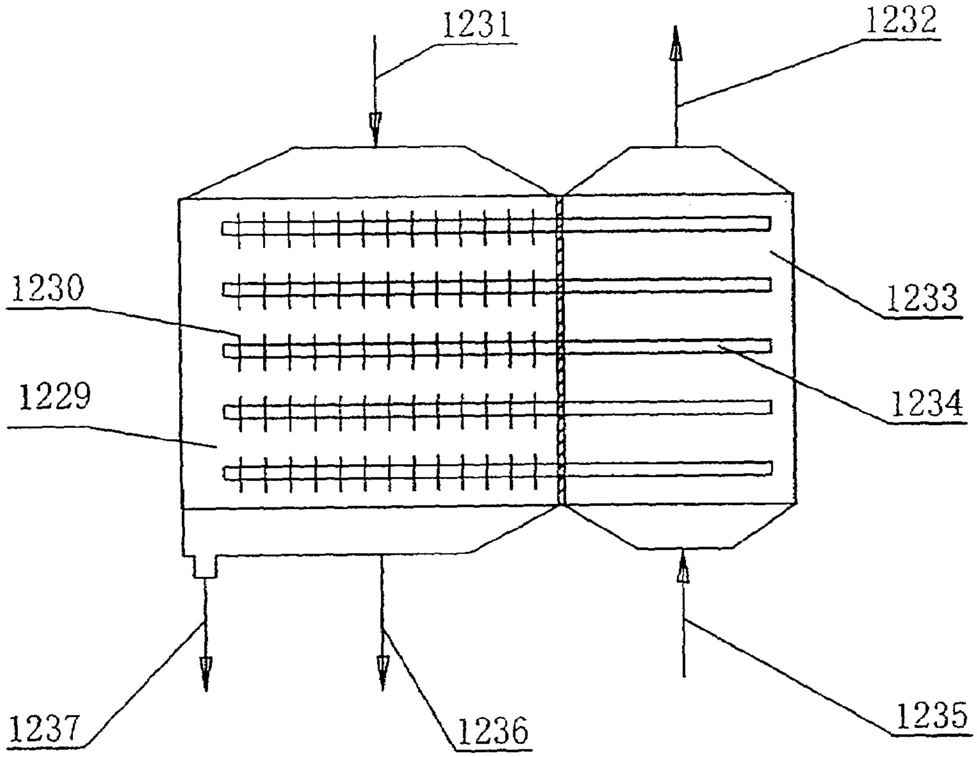

FIG. 12L shows a schematic view of the structure of a box-like compressed gas intermediate stage cooler using the high heat transfer rate element according to the present invention.

Figure 12M:
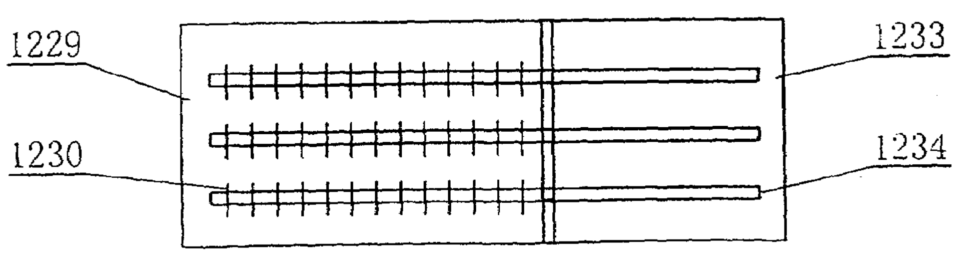

FIG. 12M is a top view of the cooler shown in FIG. 12L.

Figure 12N:
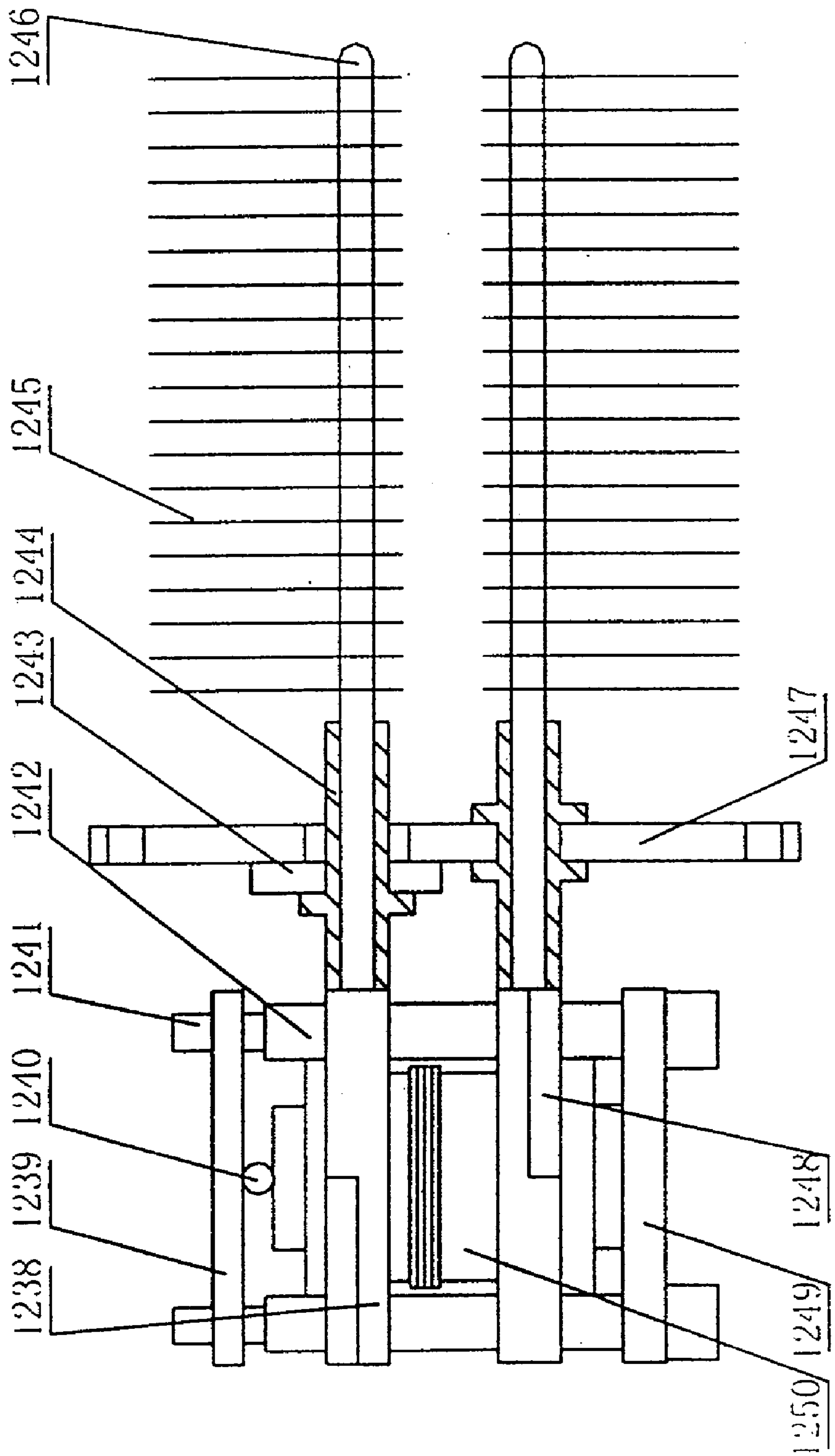

FIG. 12N is a front view of a cooler for controllable silicon element, using the high heat transfer rate element according to the present invention.

FIG. 12O is a top view of the large power cooler of the controllable silicon element in an explosion-proof casing showing in FIG. 12N.

Figure 12P:
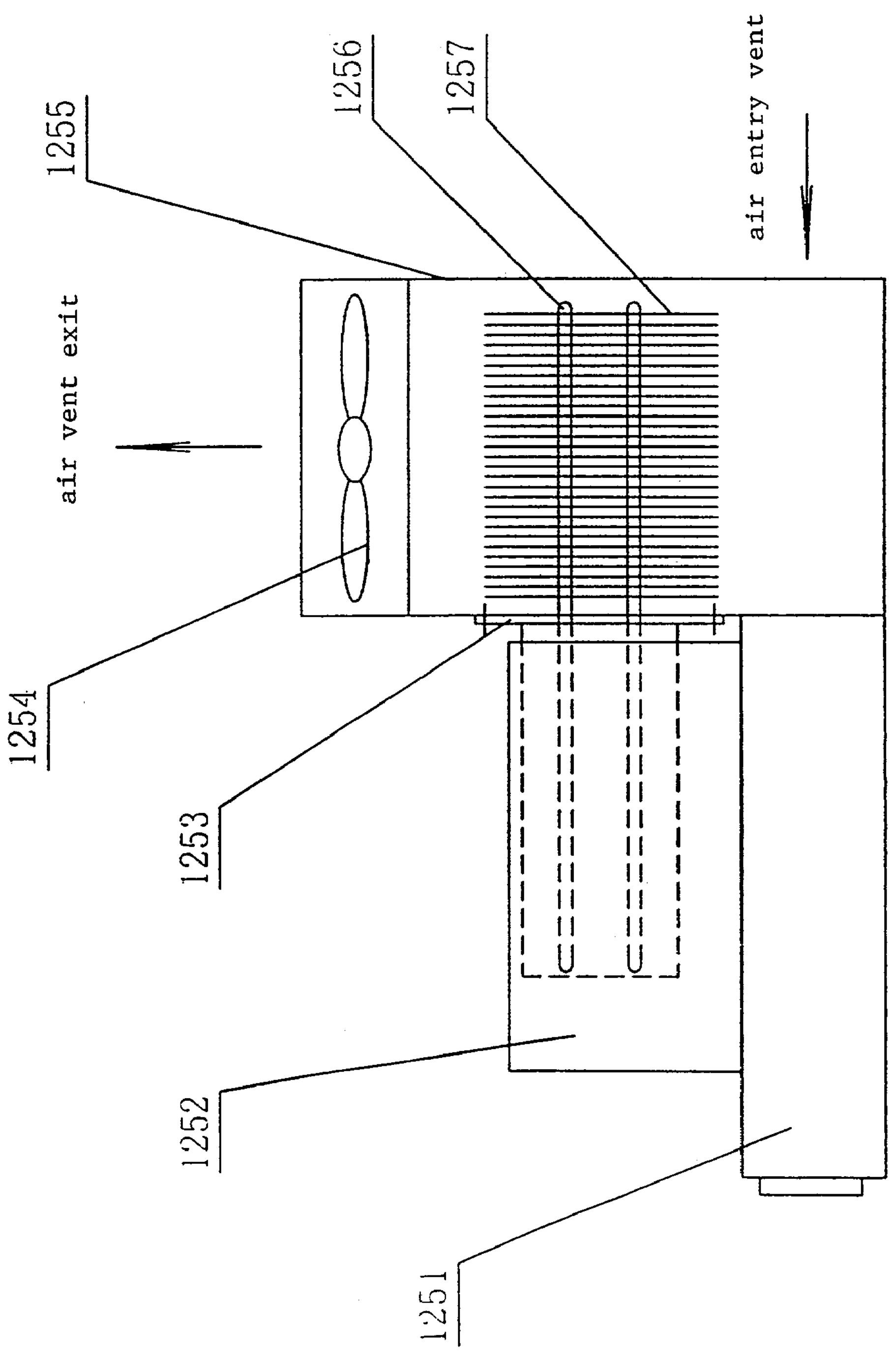

FIG. 12P is a front view of a cooler for power modules using the high heat transfer rate element according to the present invention.

Figure 12Q:
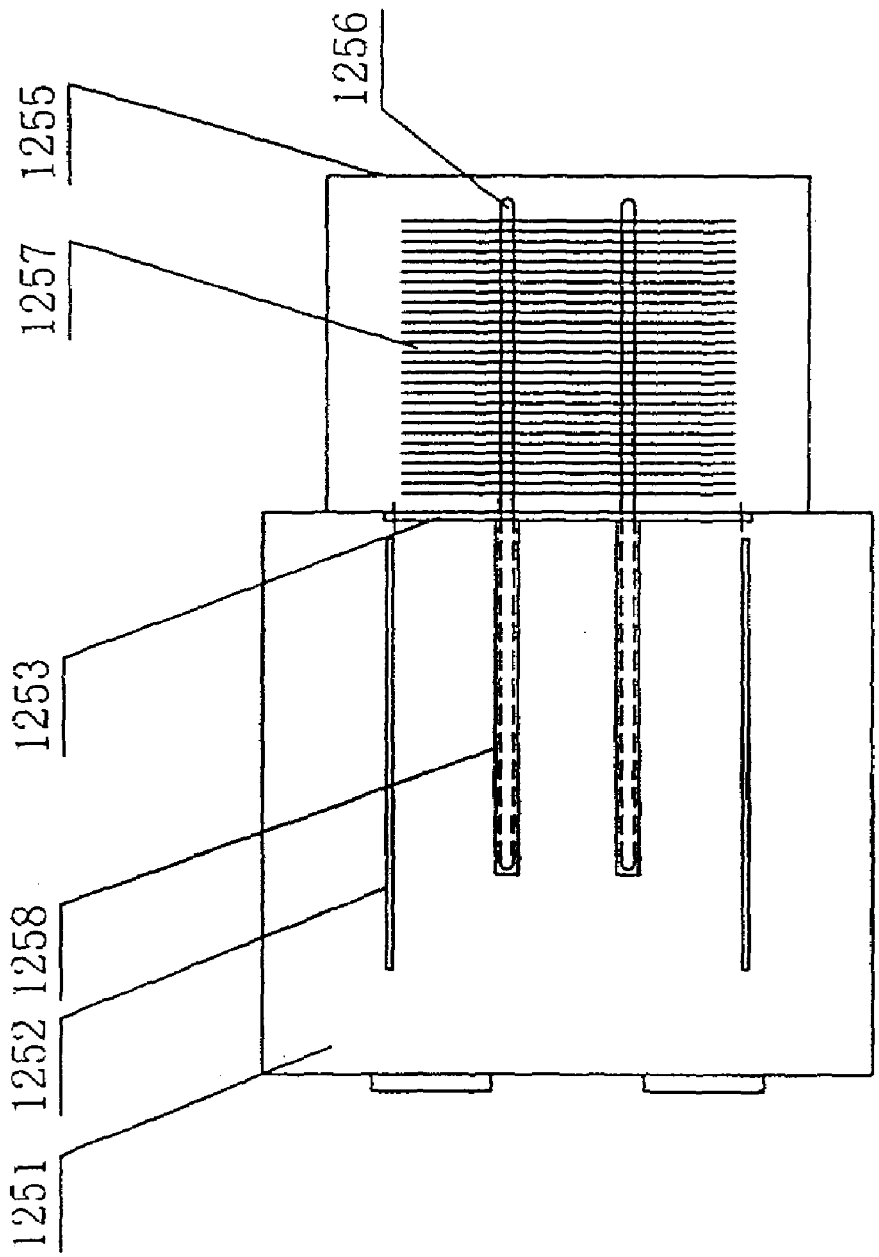

FIG. 12Q is a top view of the cooler shown in FIG. 12P.

Figure 12R:
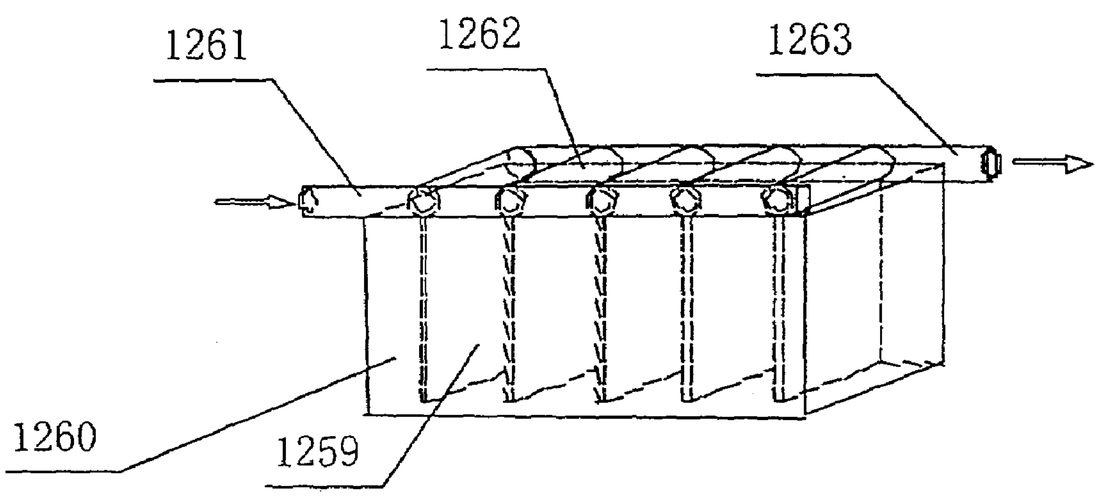

FIG. 12R is a schematic view showing a 3-D drawing of the installation of a water-based storage battery radiator for televisions, using the cooling element according to the present invention.

FIGS. 12R', 12R" and 12R'" stand for front, side and top views of the radiator in FIG. 12R respectively.

FIG. 12R"" is a partially cross-sectional view of a part cut along the arrow AA shown in FIG. 12R'".

Figure 12S:
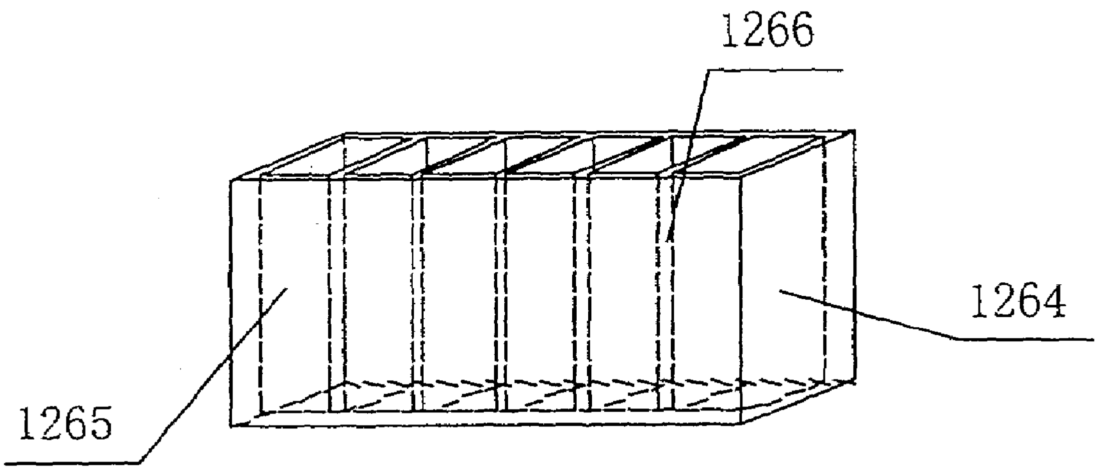
Figure 12S:
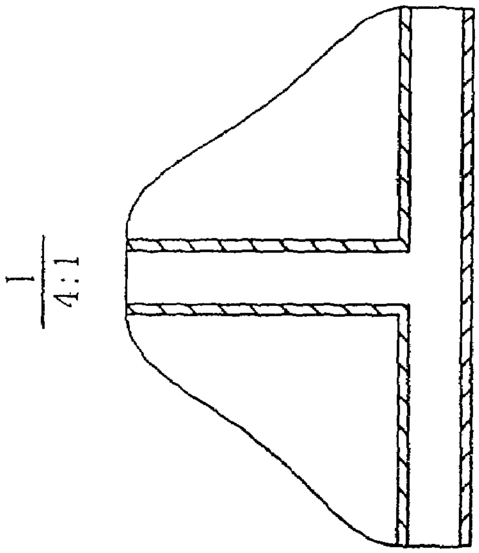
Figure 12S:
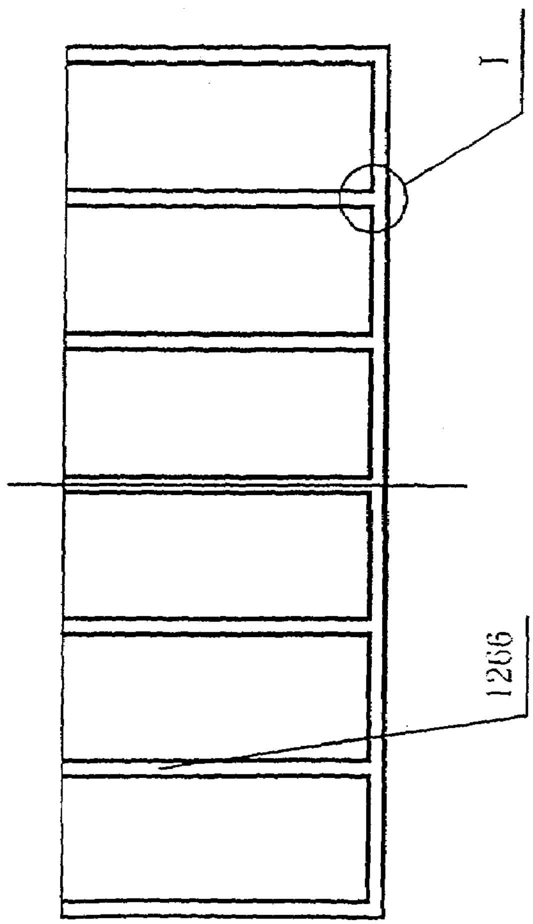
Figure 12S:
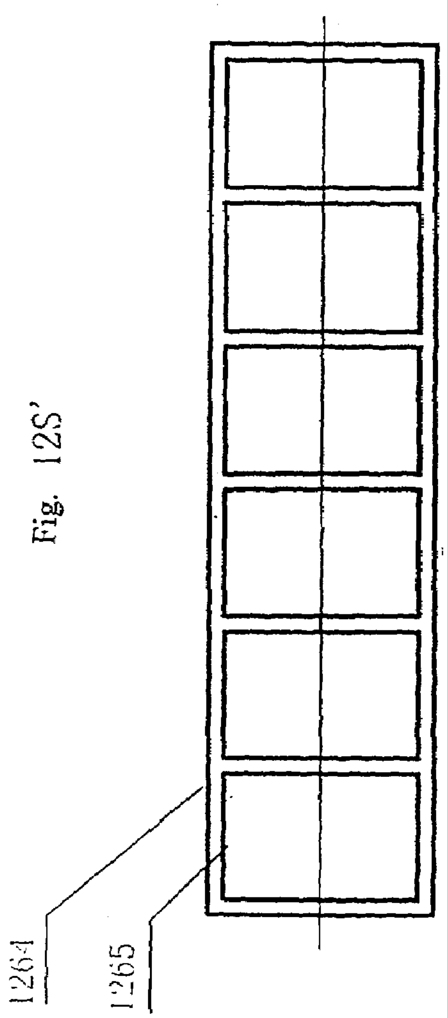

FIG. 12S is a schematic perspective view of a forced/natural air radiator for storage battery, using the cooling element of the present invention.

FIGS. 12S' and 12S" stand for front elevational view and top plan view of the radiator shown in FIG. 12S.

FIG. 12S'" is a zoom-in view of circle A in FIG. 12S'.

Figure 12T:
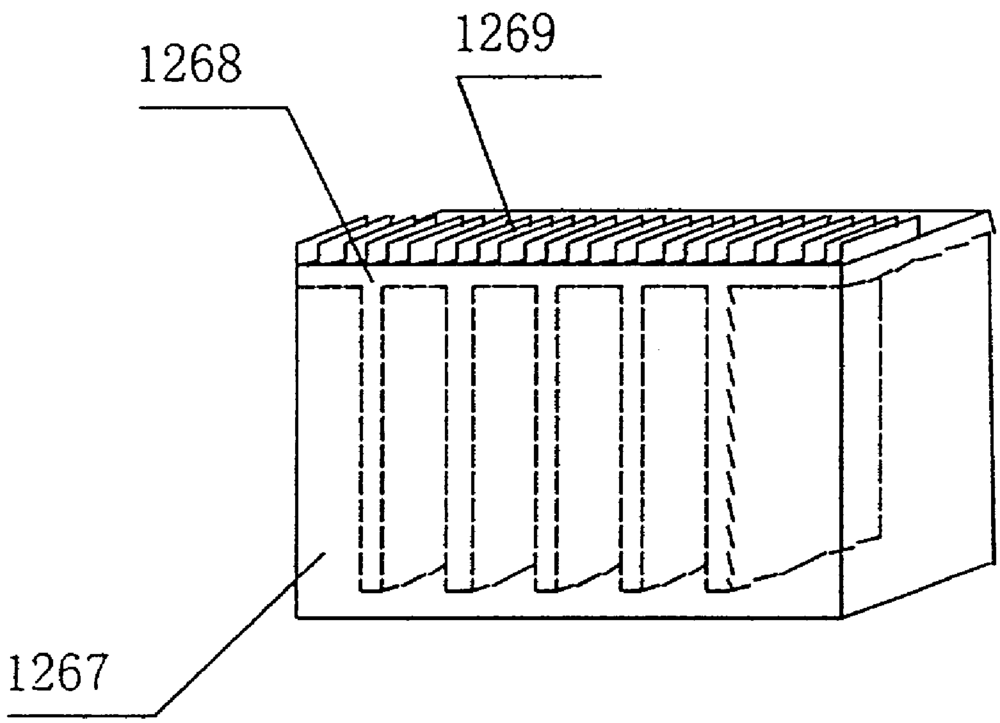

FIG. 12T is a schematic perspective view of another embodiment of the forced/natural air radiator for storage battery, using the cooling element of the present invention.

FIGS. 12T', 12T" and 12T'" stand for front, left side and top views of the radiator shown in FIG. 12T.

FIG. 12T"" is a zoom-in view of circle I shown in FIG. 12T'.

Figure 12U:
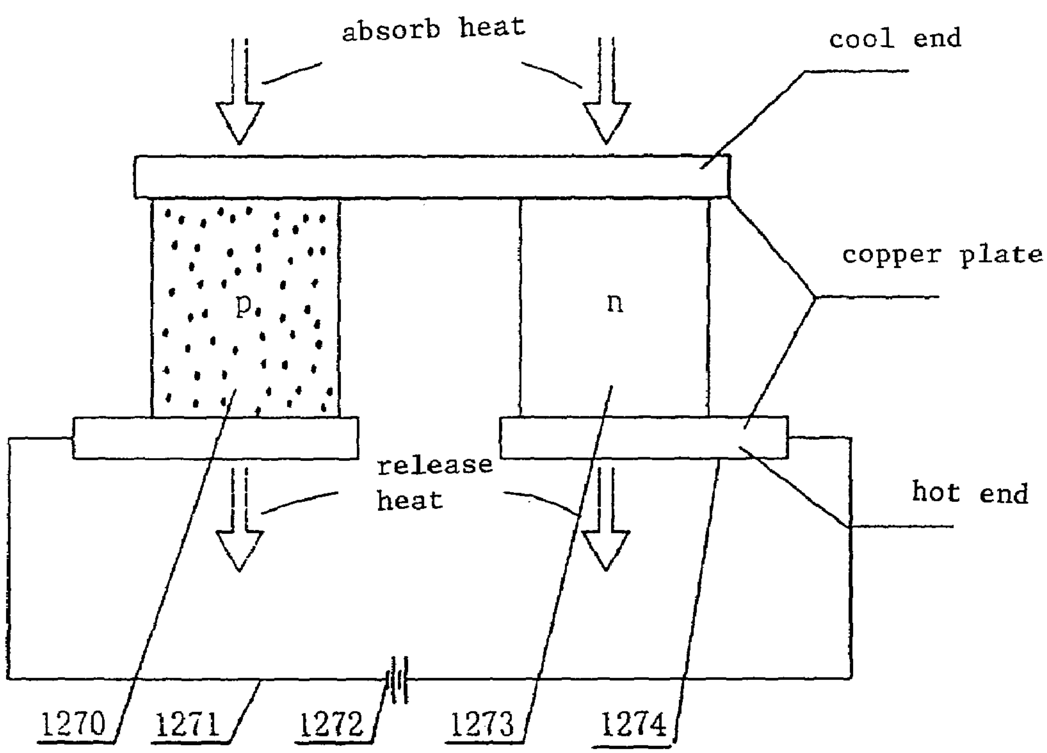

FIG. 12U shows the theory of the operation of a thermo-electrical cooler.

Figure 12V:
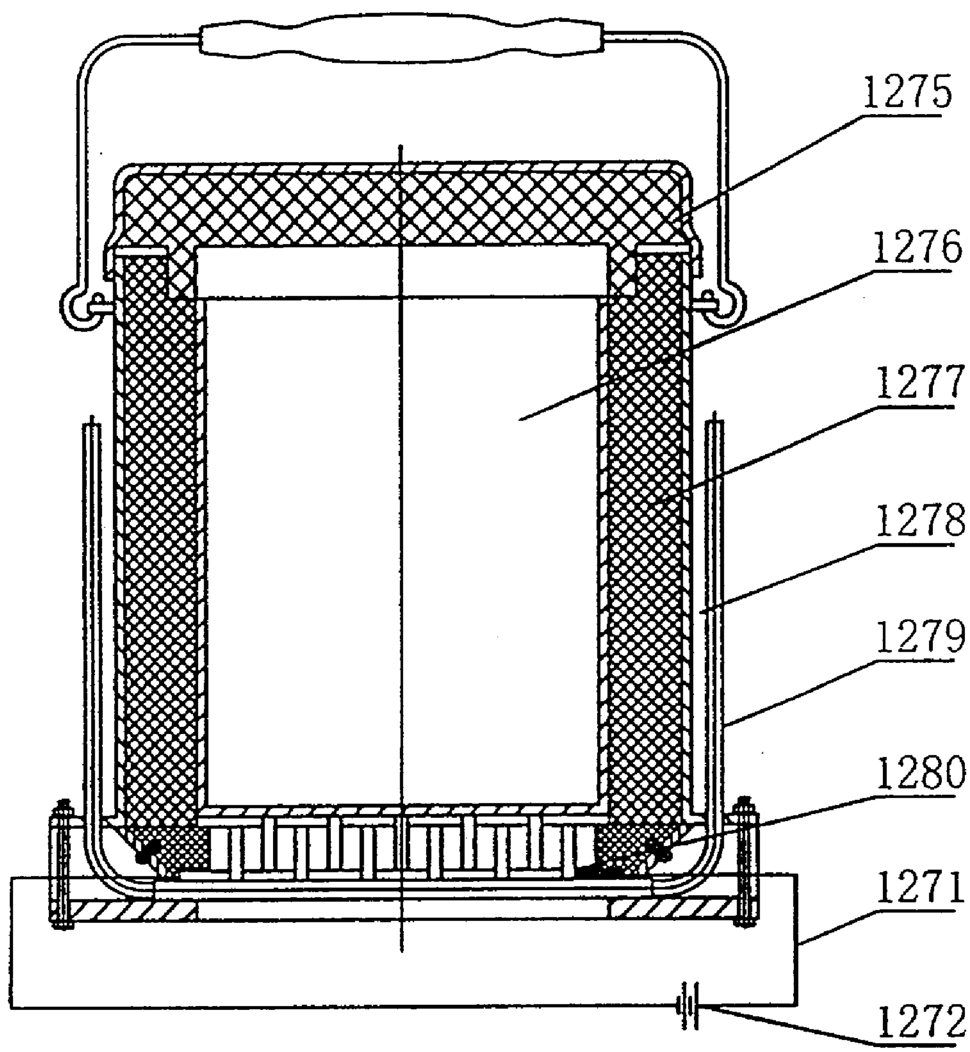

FIG. 12V shows the schematic construction of a portable thermoelectrical cooler using the heat transfer element of the present invention.

Figure 12W:
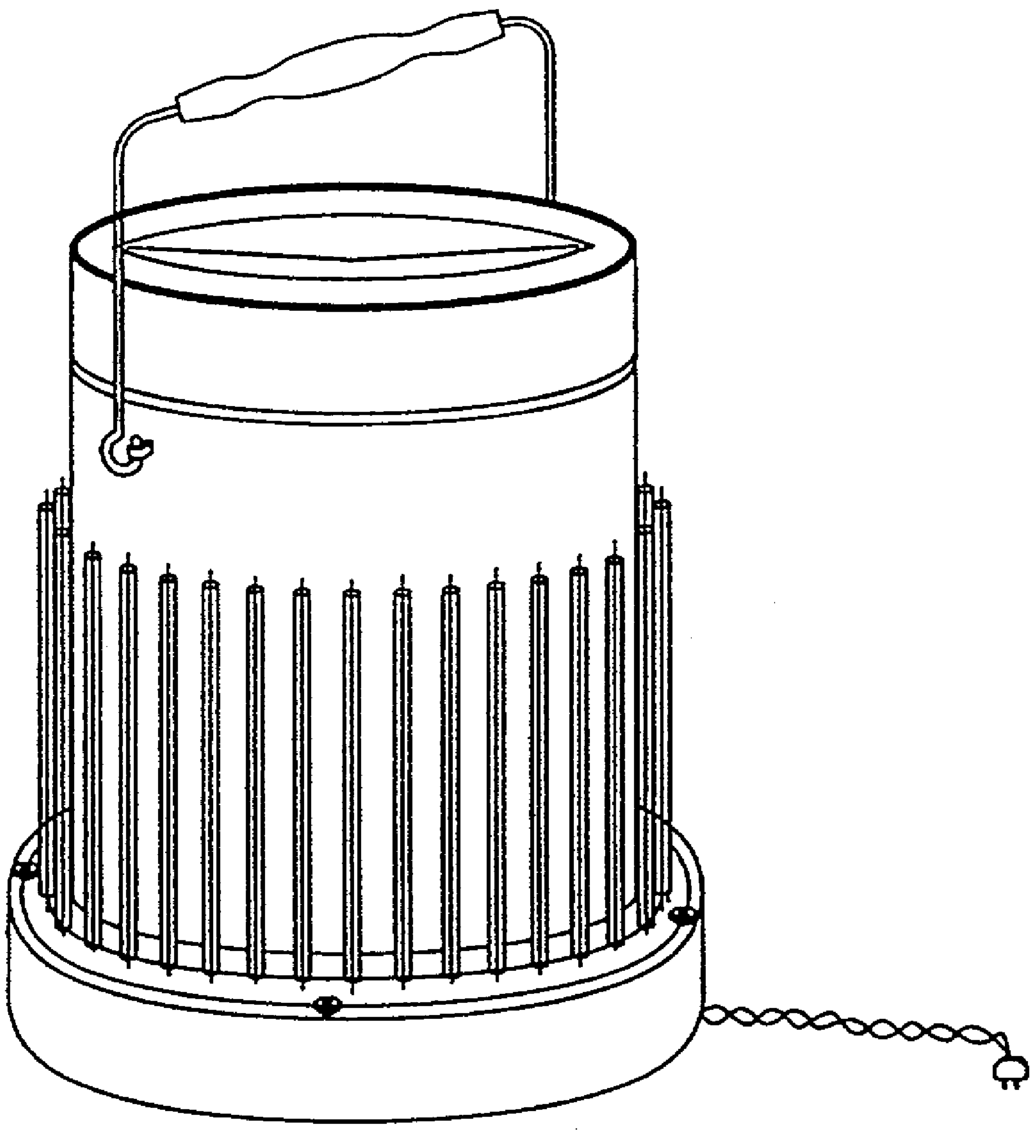

FIG. 12W is a schematic perspective view of the thermo-electrical cooler.

Figure 12X:
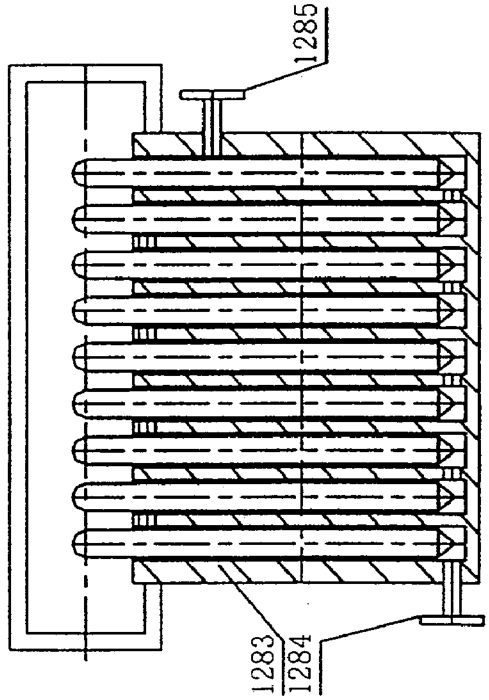
Figure 12X:
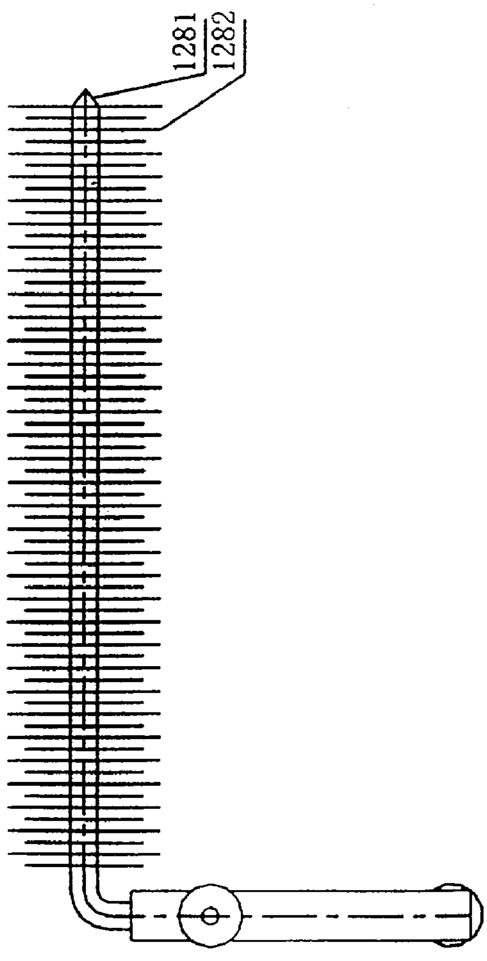

FIG. 12X shows a refrigerator radiator using the heat transfer element of the present invention.

FIG. 12X' is a left side view of the radiator shown in FIG. 12X.

Figure 12Y:
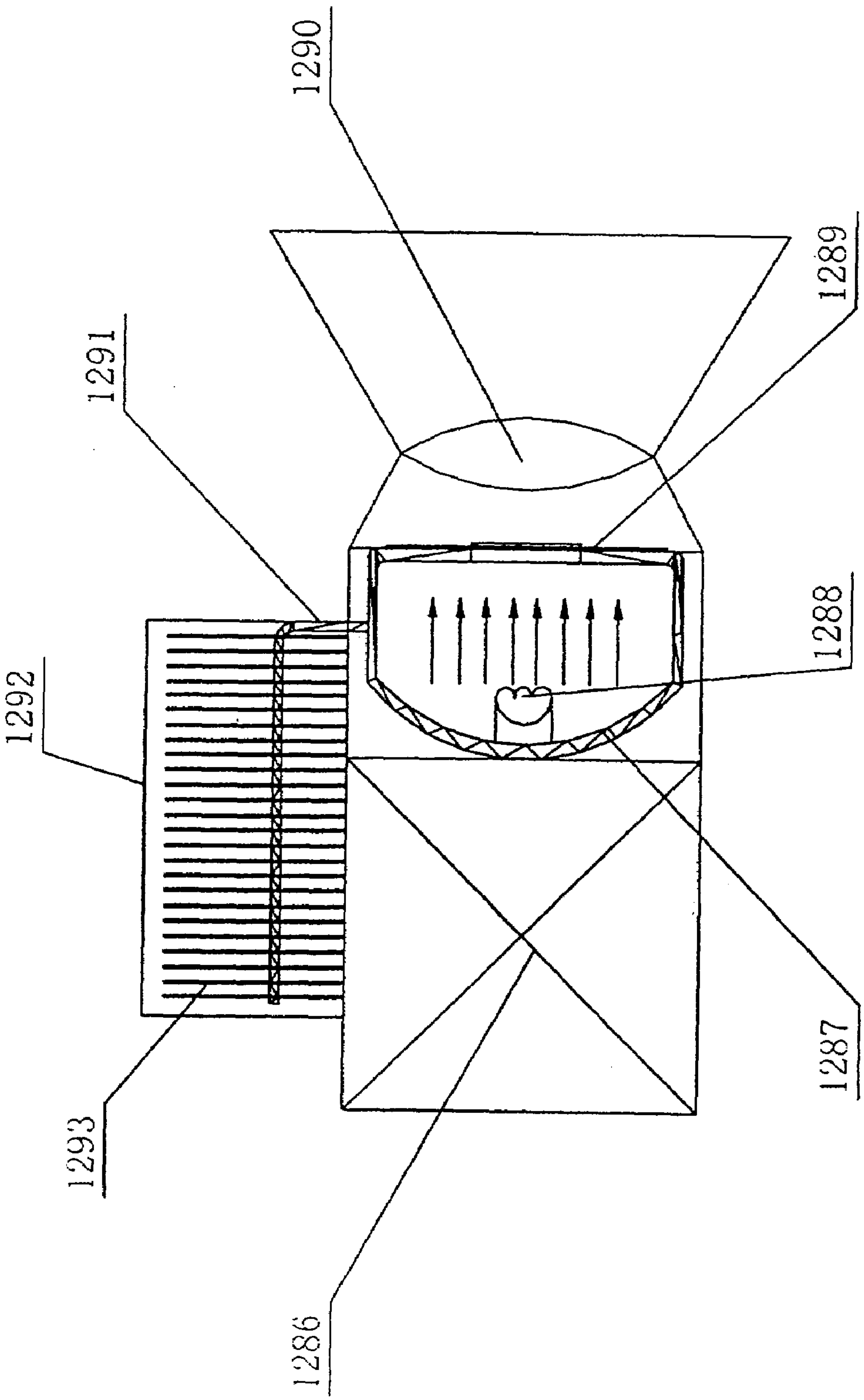

FIG. 12Y shows a video player using the heat transfer element of the present invention.

Figure 12Z:
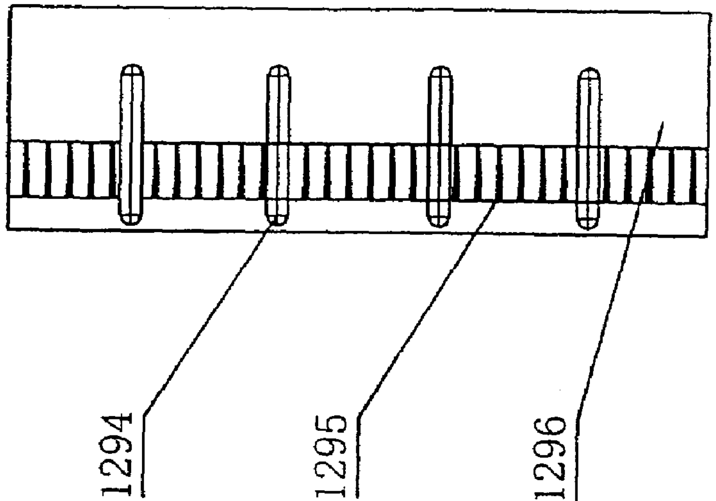
Figure 12Z:
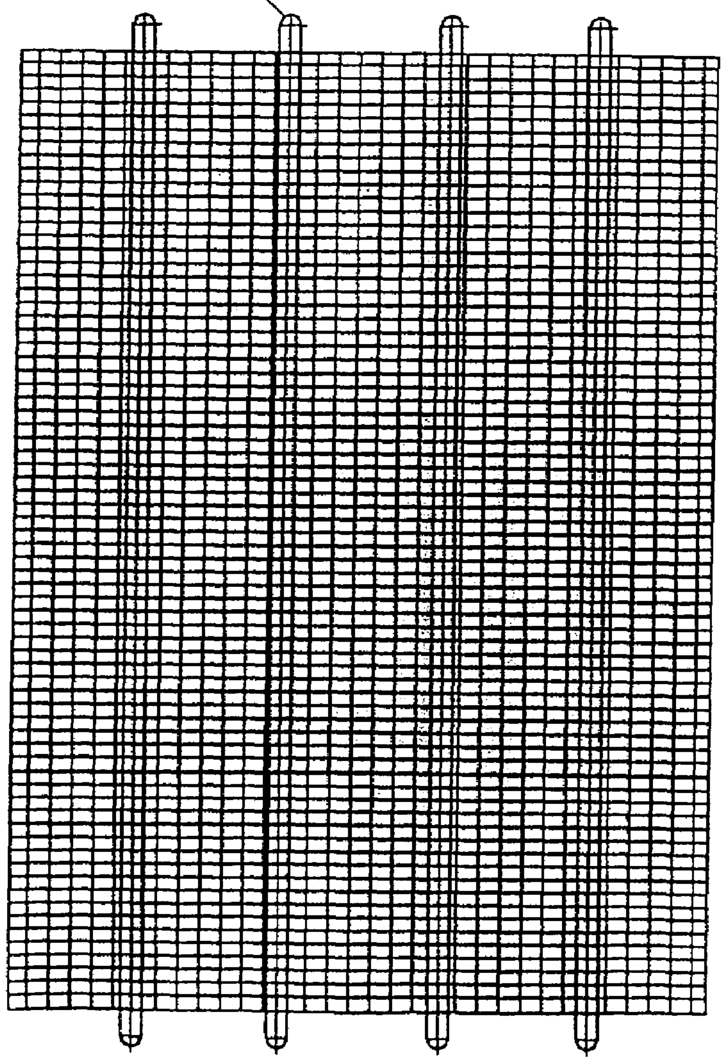
Figure 12Z:
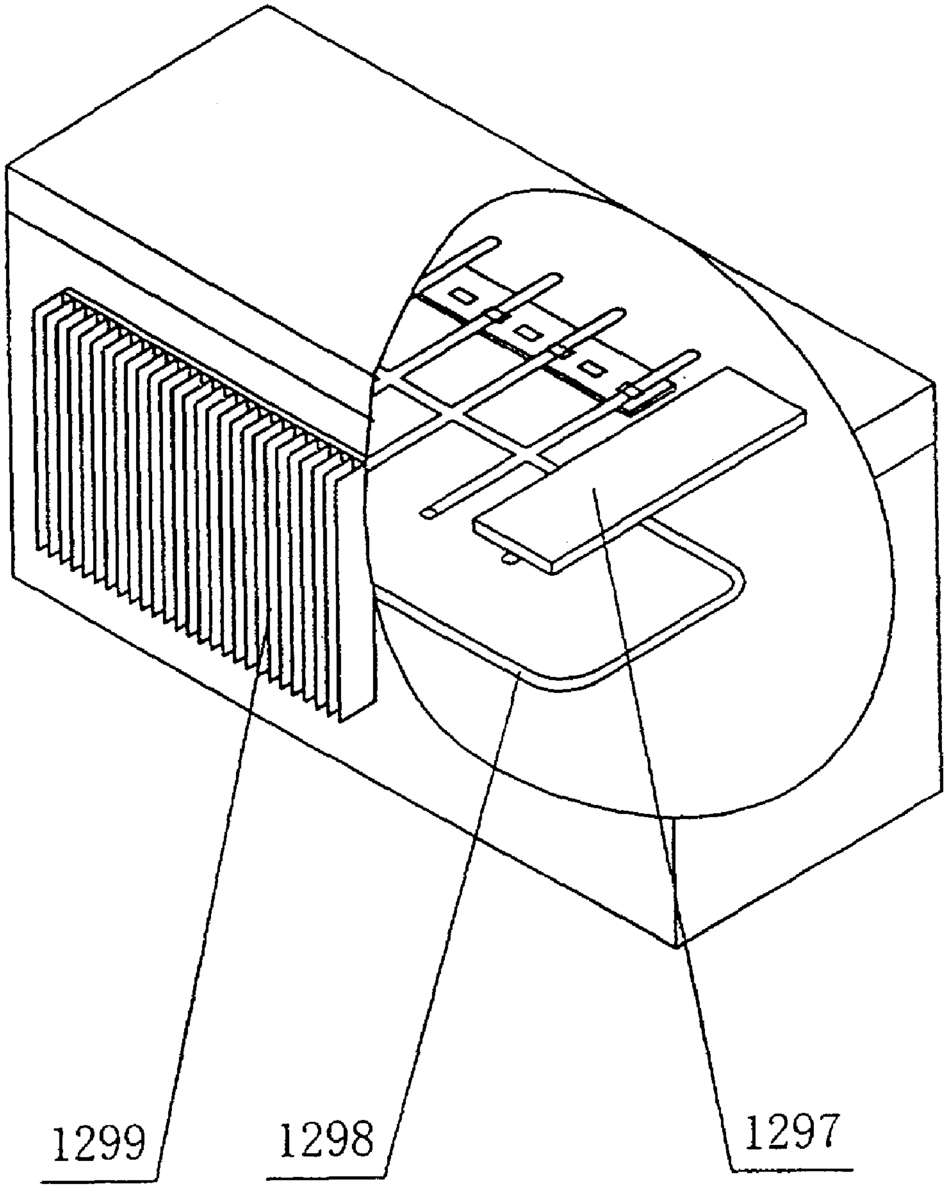
Figure 122B:
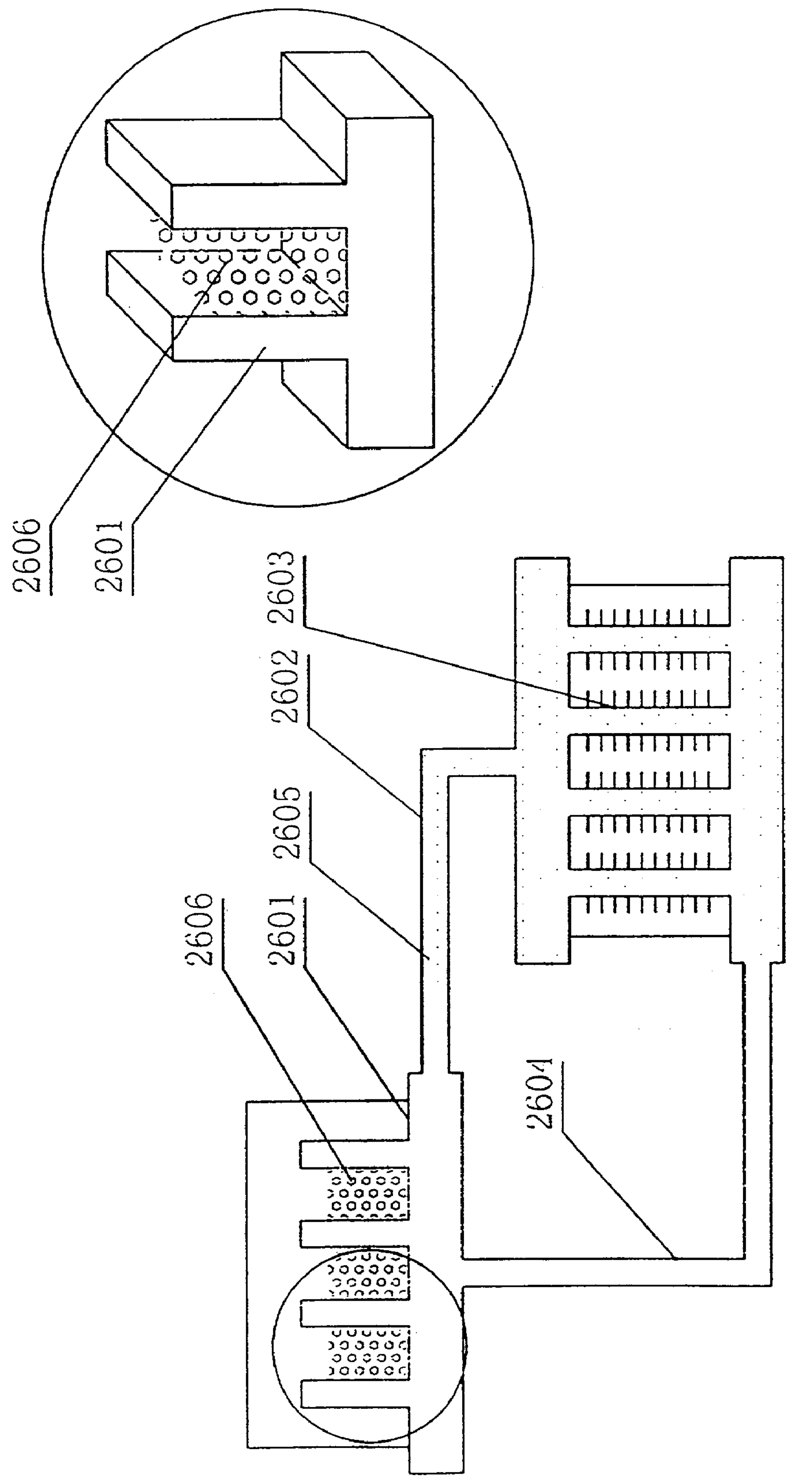

FIG. 12Z shows a cooling plate radiator using the heat transfer element of the present invention.

FIG. 12Z' is a side view of the radiator shown in FIG. 12Z.

FIG. 12ZA is a schematic view of a scanner cooling system using the heat transfer element of the present invention.

FIG. 12ZB shows part of a heat recovery cooling system using the heat transfer element of the present invention.

Figure 13A:
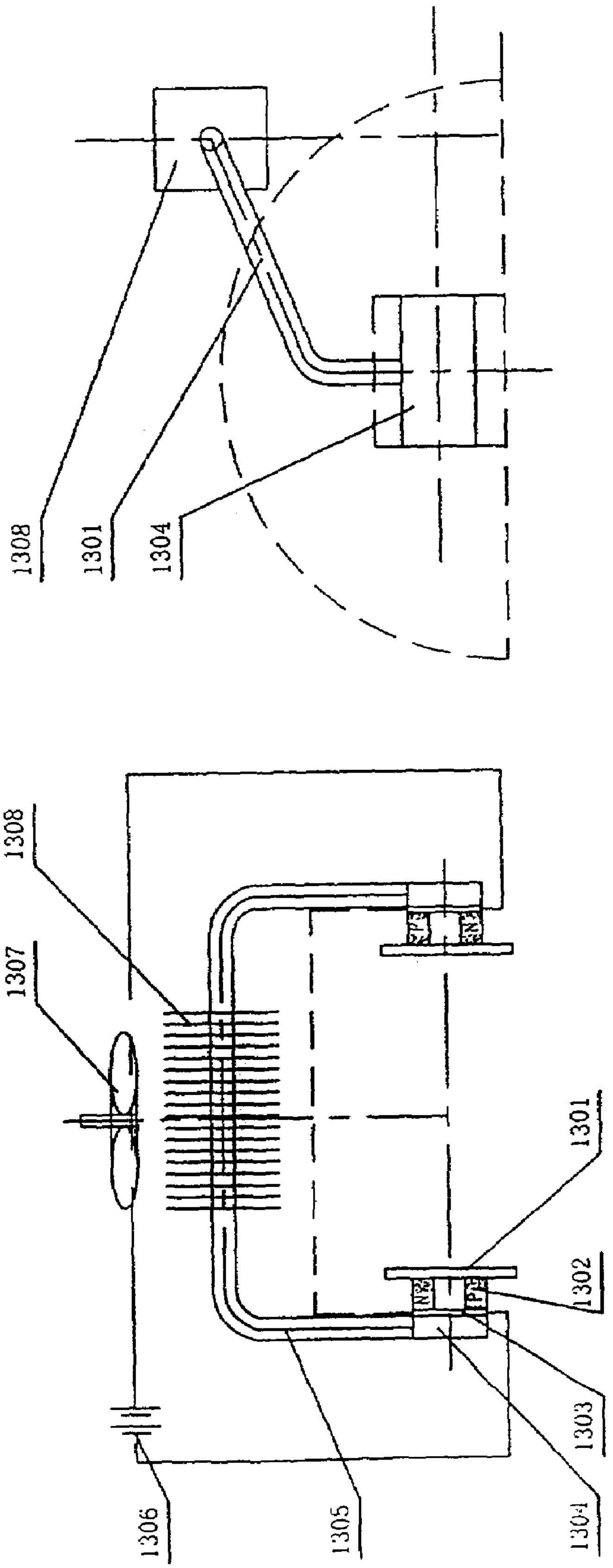

FIG. 13A shows the structure of an anti-doze cold hat according to the present invention.

Figure 13B:
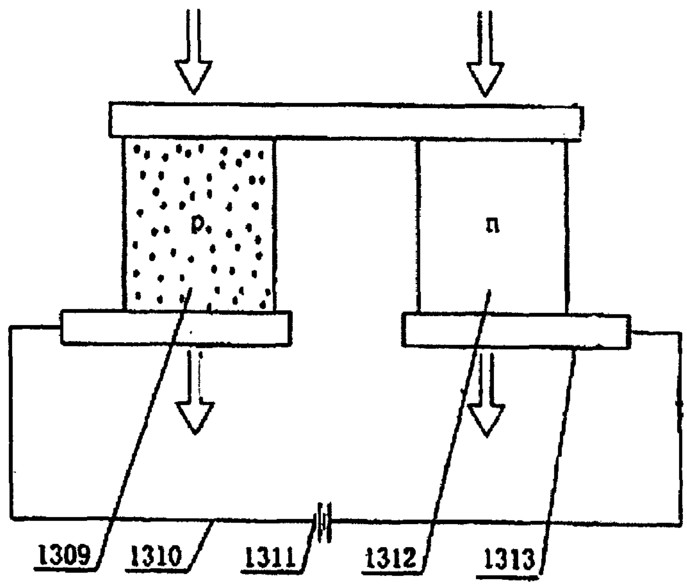

FIG. 13B shows the theory of the operation of a thermo-electrical cooler.

Figure 13C:
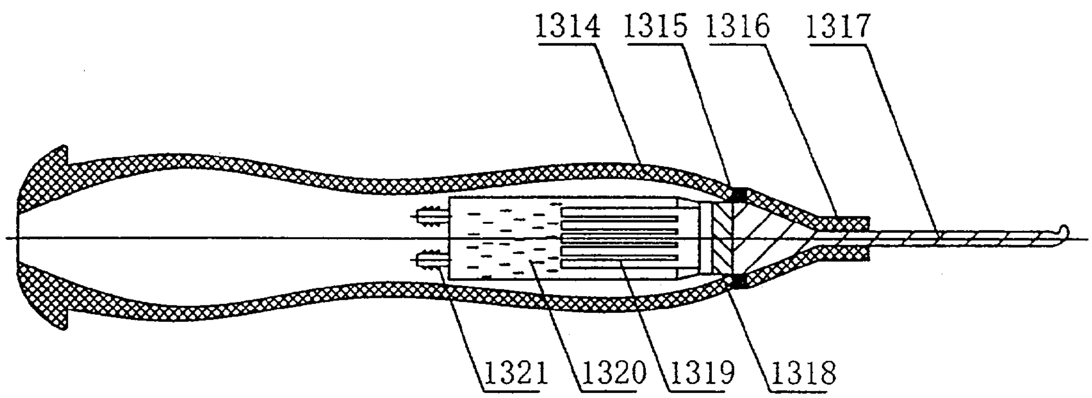

FIG. 13C shows the structure of a portable thermoelectrical cooling beauty device according to the present invention.

Figure 14A:
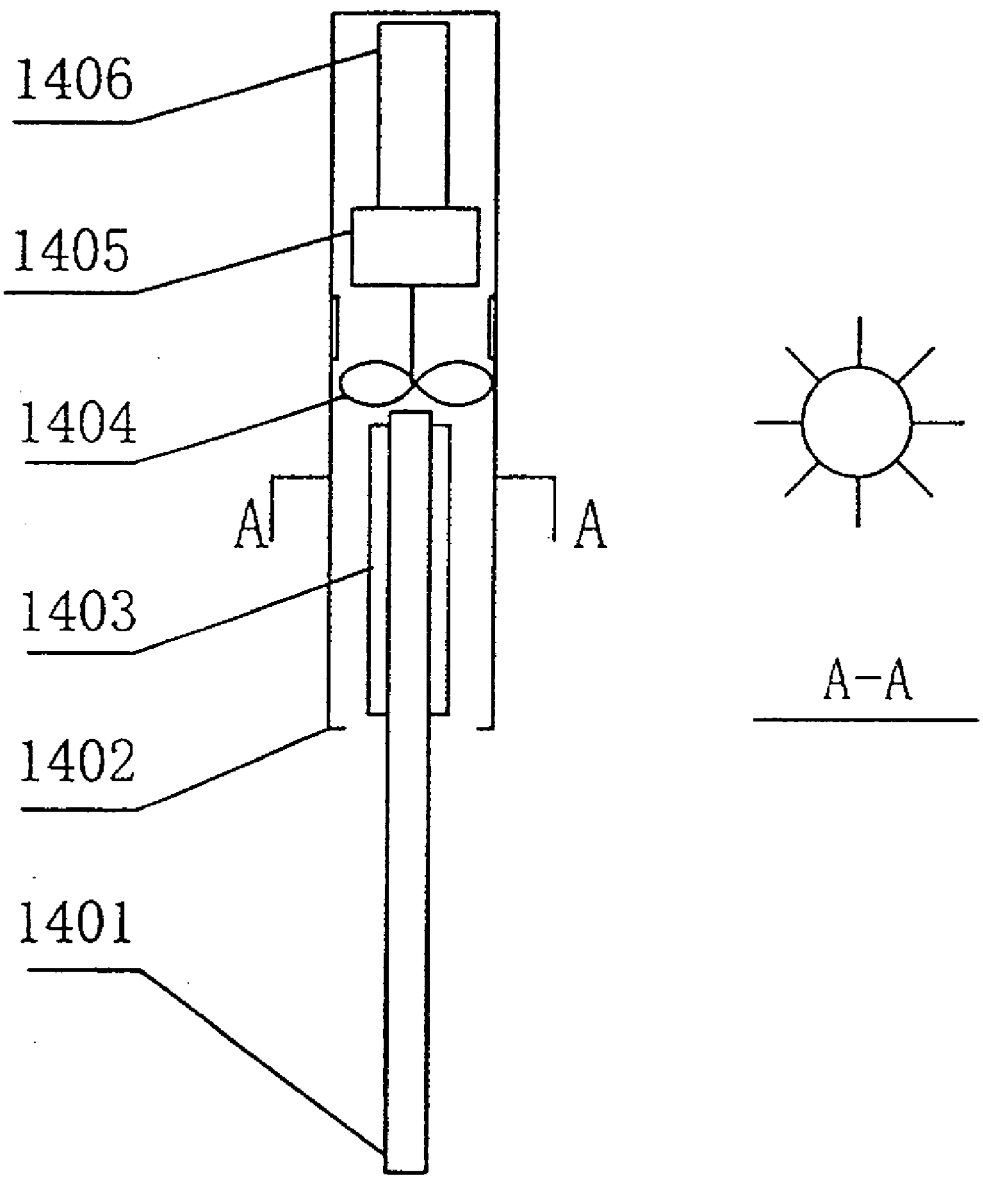

FIG. 14A shows the structure of a drink cooler according to the present invention.

Figure 14B:
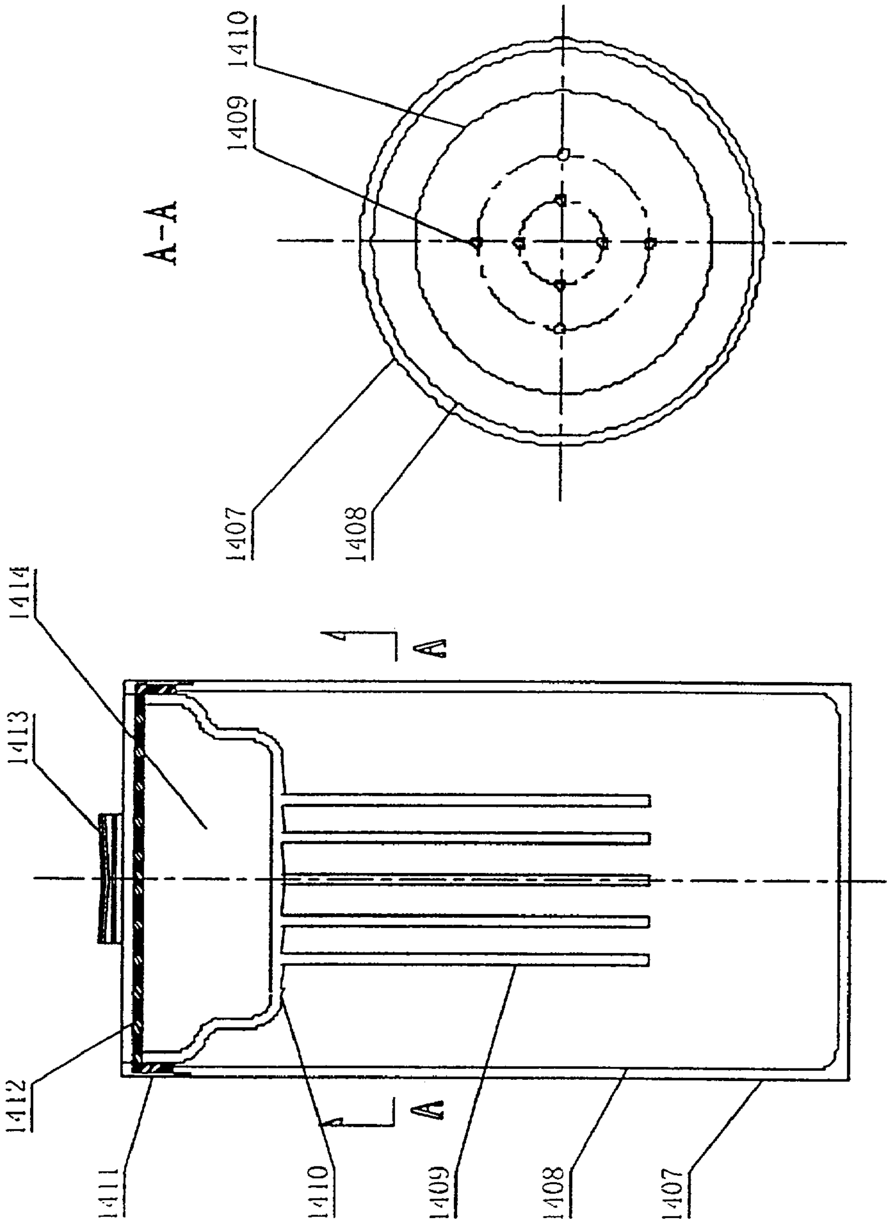

FIG. 14B shows the structure of a cooling cup according to the present invention.

Figure 14C:
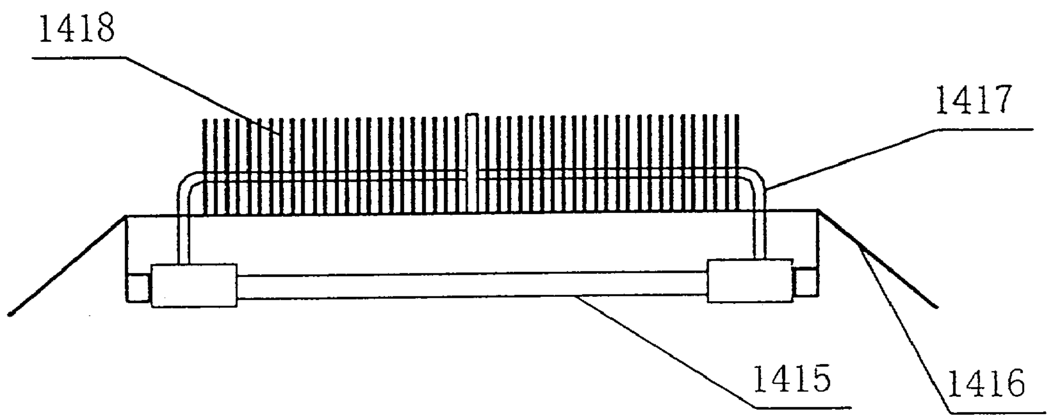

FIG. 14C shows the structure of a lamp radiator according to the present invention.

Figure 14D:
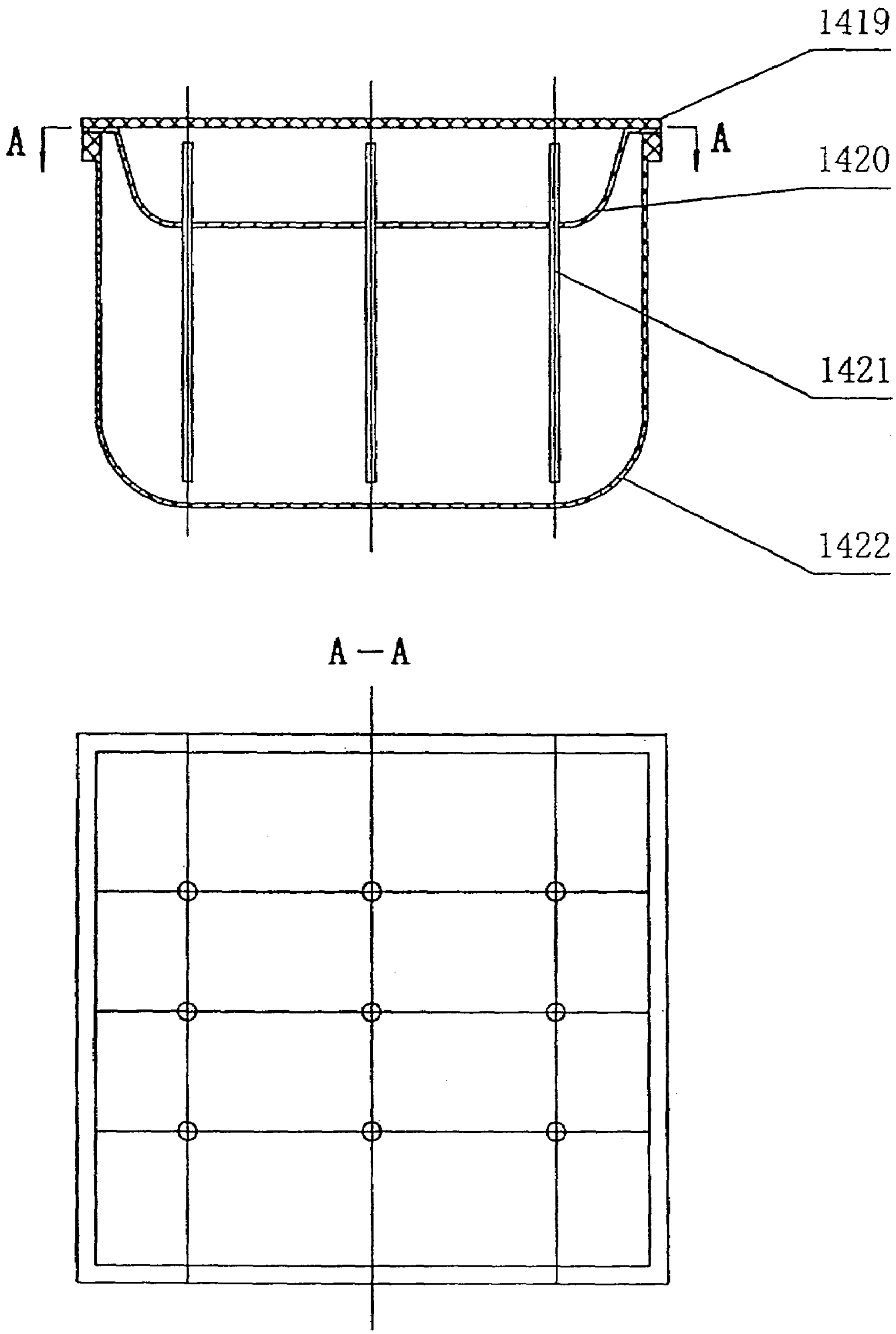

FIG. 14D shows the structure of a food container according to the present invention.

Figure 14E:
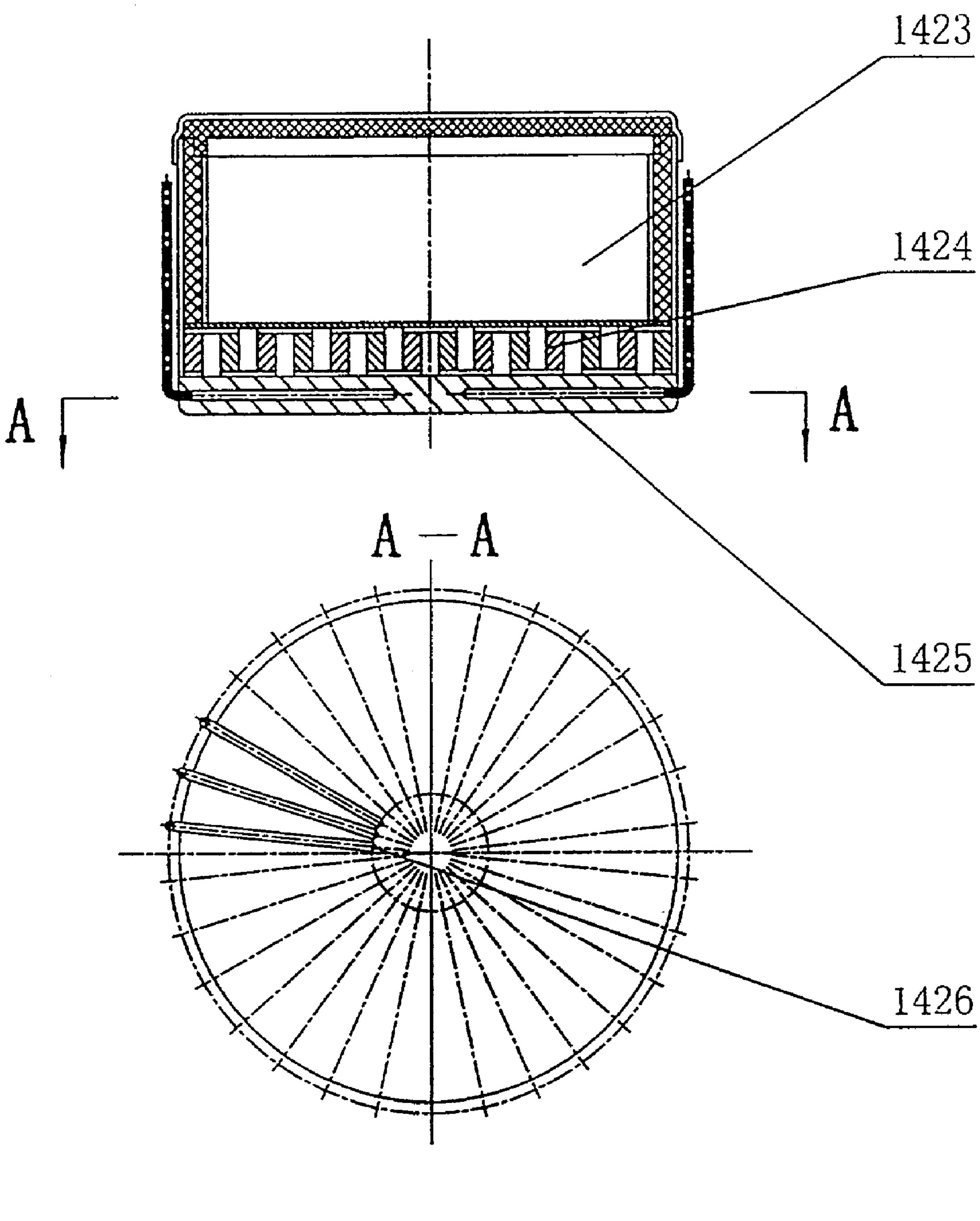

FIG. 14E shows the structure of a thermoelectric cooling food container according to the present invention.

Figure 14F:
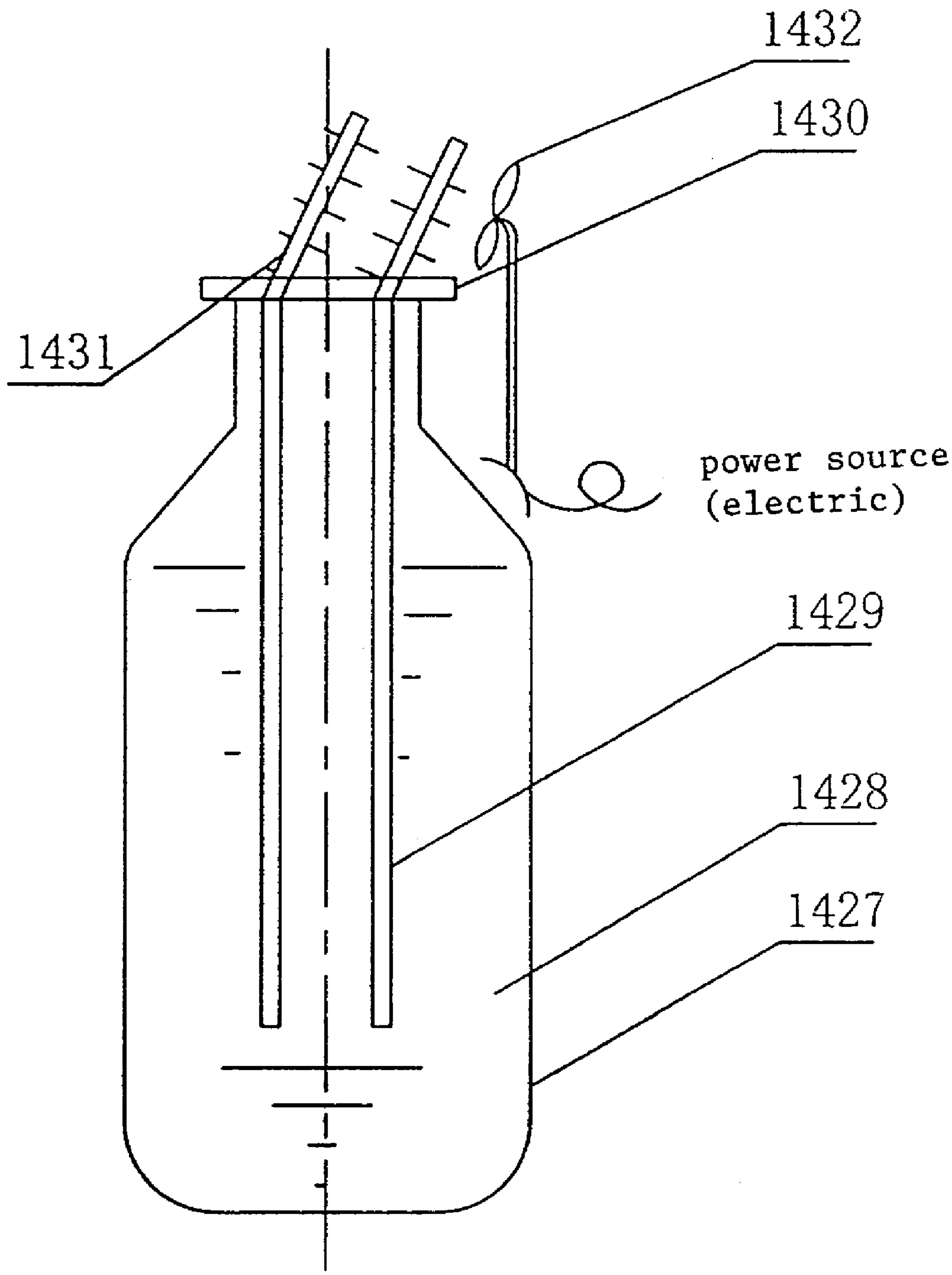

FIG. 14F is a simplified drawing showing the structure of a drink cooler according to the present invention.

Figure 15B:
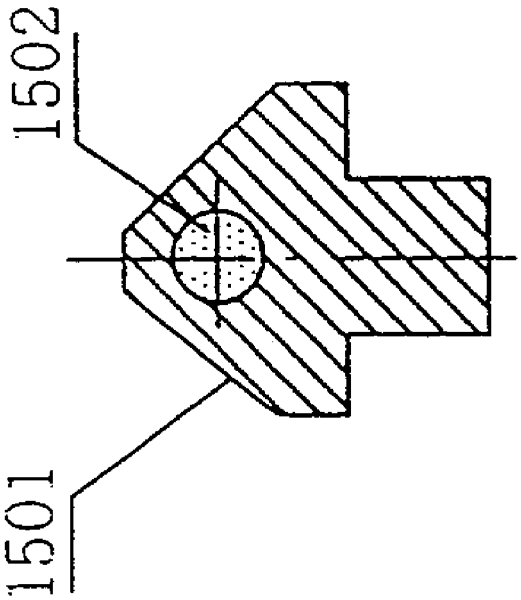
Figure 15A:
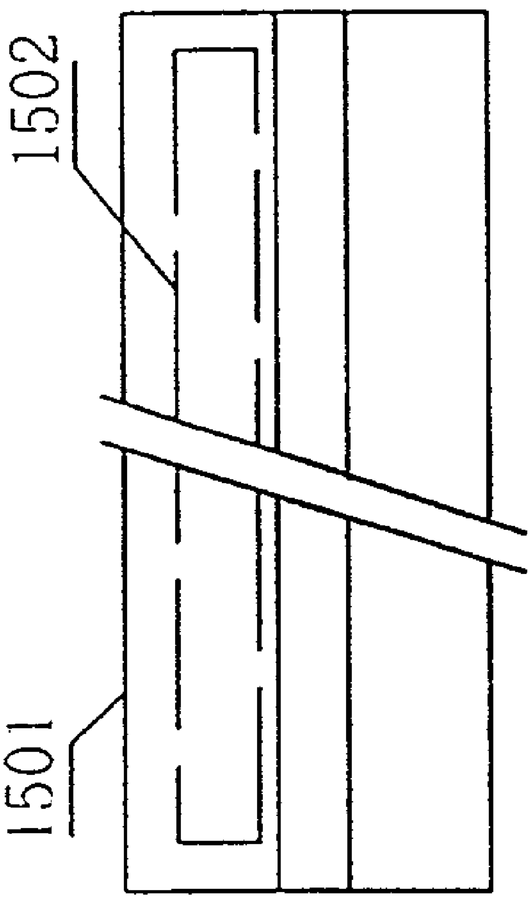

FIG. 15A is a side view of machine center guiding tracks using the high heat transfer element of the present invention.

FIG. 15B is a cross-sectional view of the track shown in FIG. 15A.

Figure 15C:
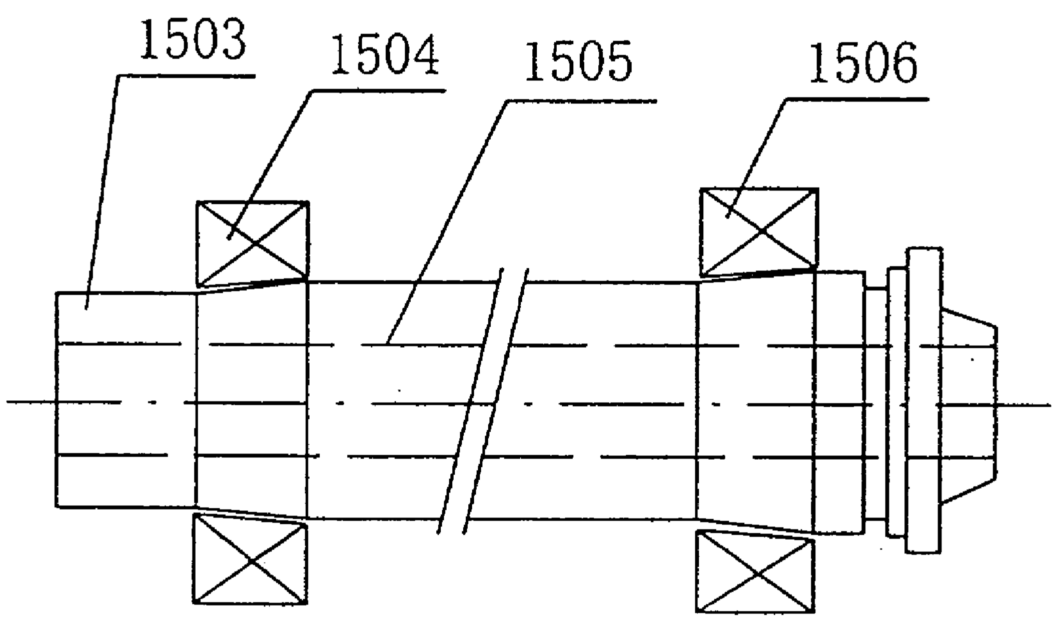

FIG. 15C is a side view of the main axle of the machine center using the high heat transfer element of the present invention.

Figure 15D:
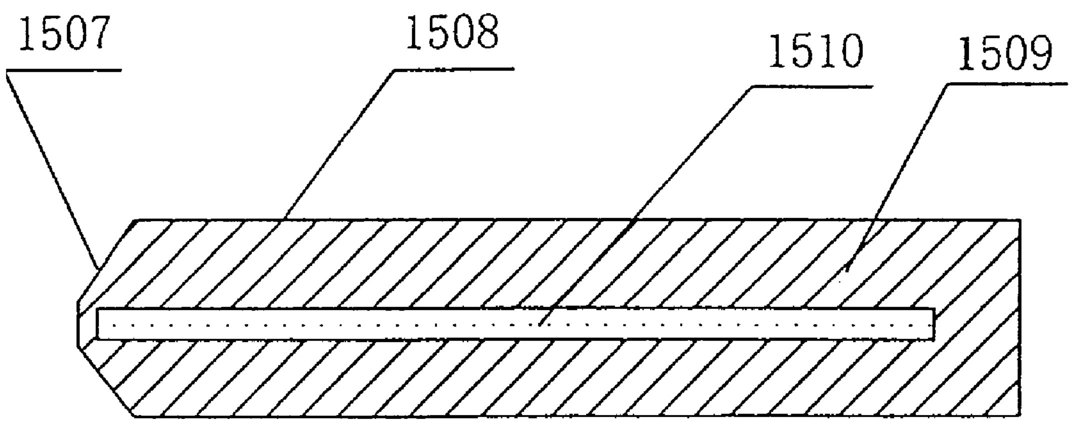

FIG. 15D is a cross-sectional view of a drill using the high heat transfer element of the present invention.

Figure 15E:
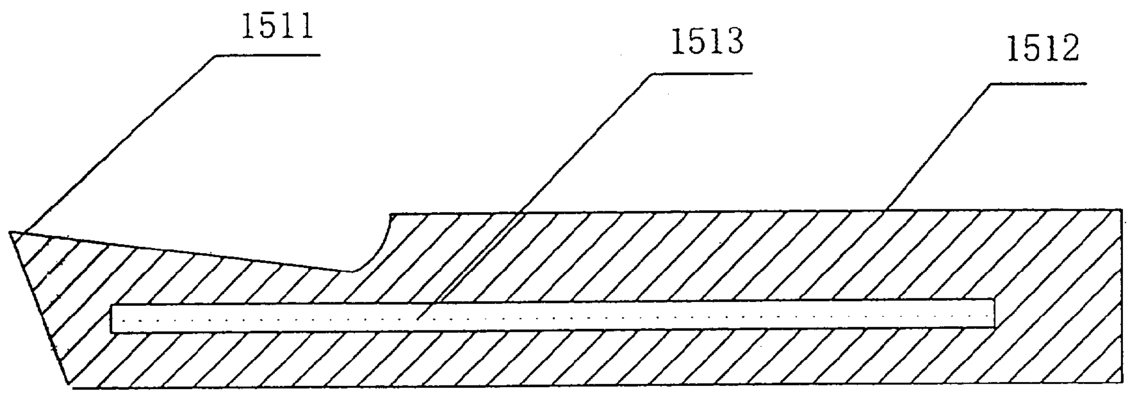

FIG. 15E is a cross-sectional view of a cutting tool using the high heat transfer element of the present invention.

Figure 15F:
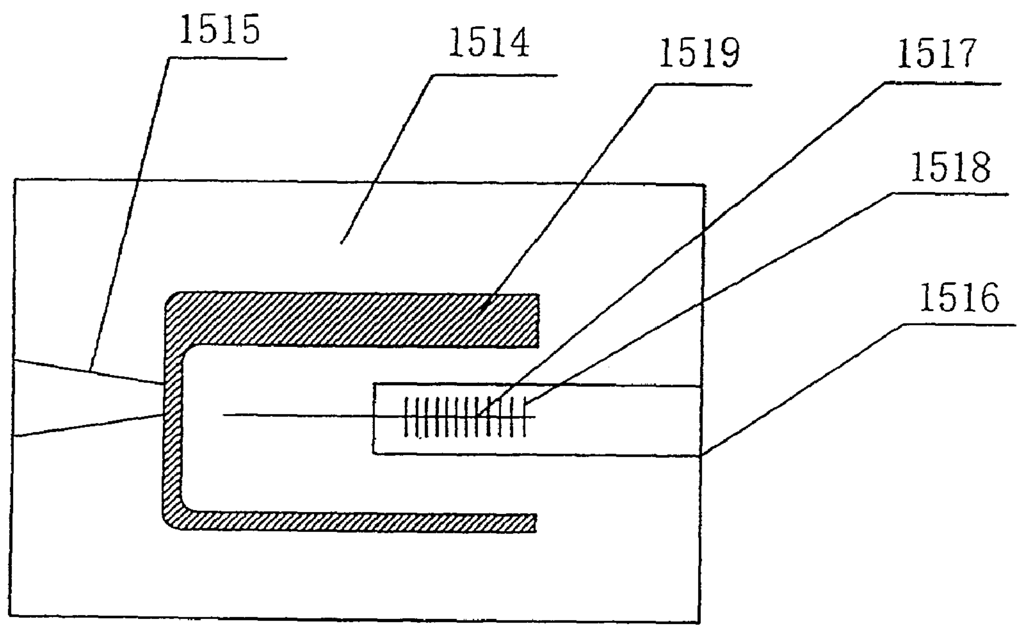

FIG. 15F shows a plastic-injecting mould using the heat transfer element of the present invention.

Figure 15G:
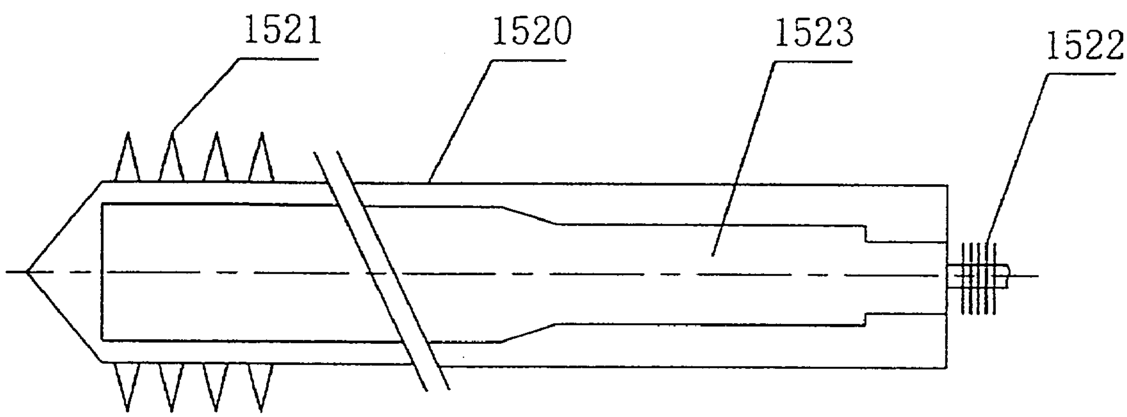

FIG. 15G is a cross-sectional view of a high-polymer extruding machine screw rod using the high heat transfer element of the present invention.

Figure 15H:
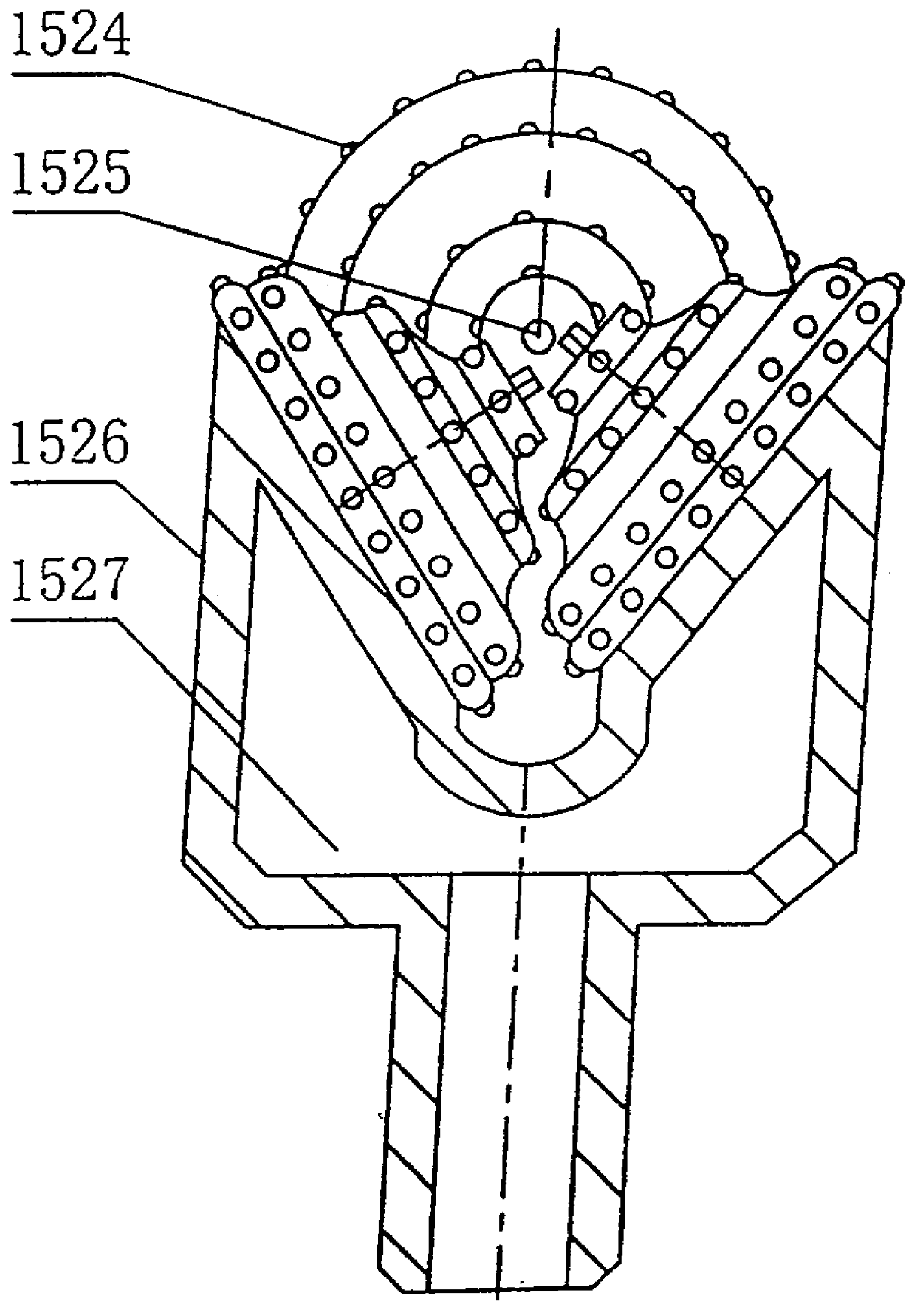

FIG. 15H shows a mine drill using the high heat transfer element of the present invention.

Figure 16A:
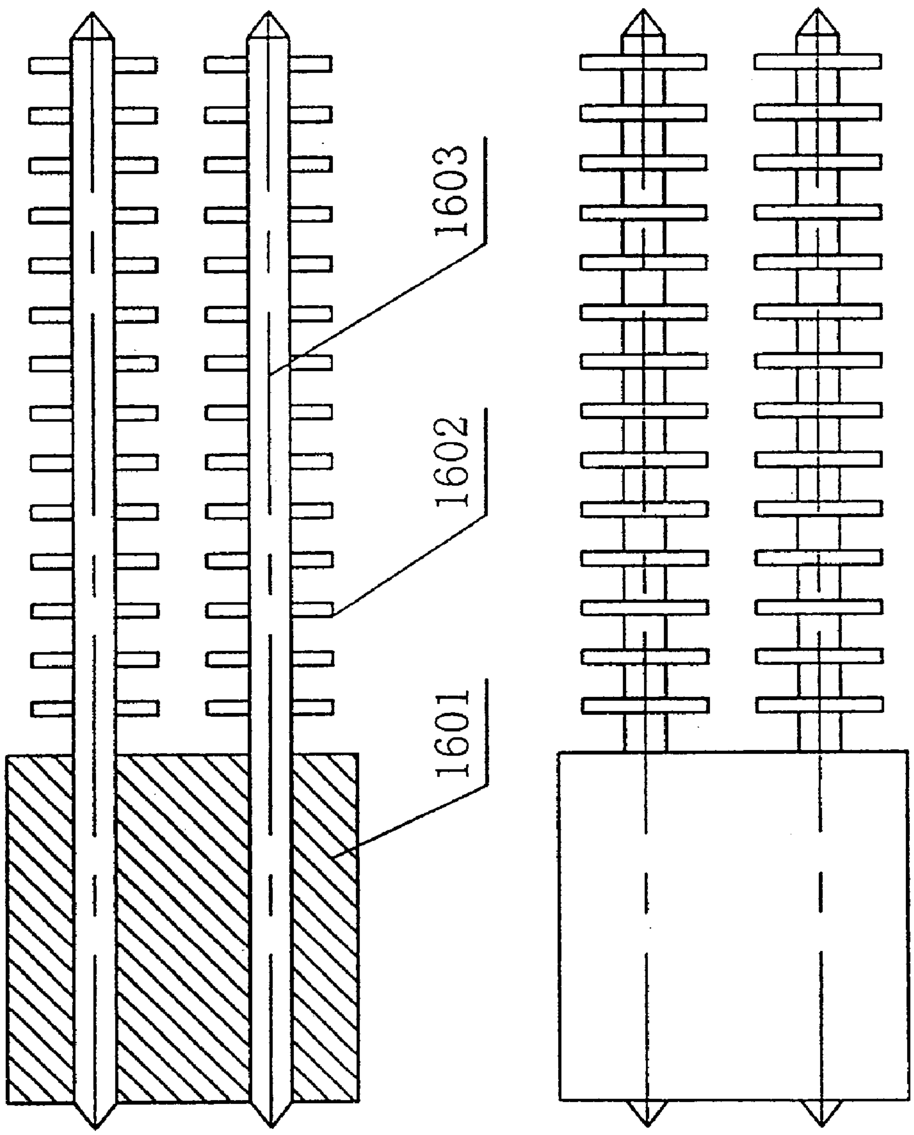

FIG. 16A shows a segment radiator of the high heat transfer sound output element according to the present invention.

Figure 16B:
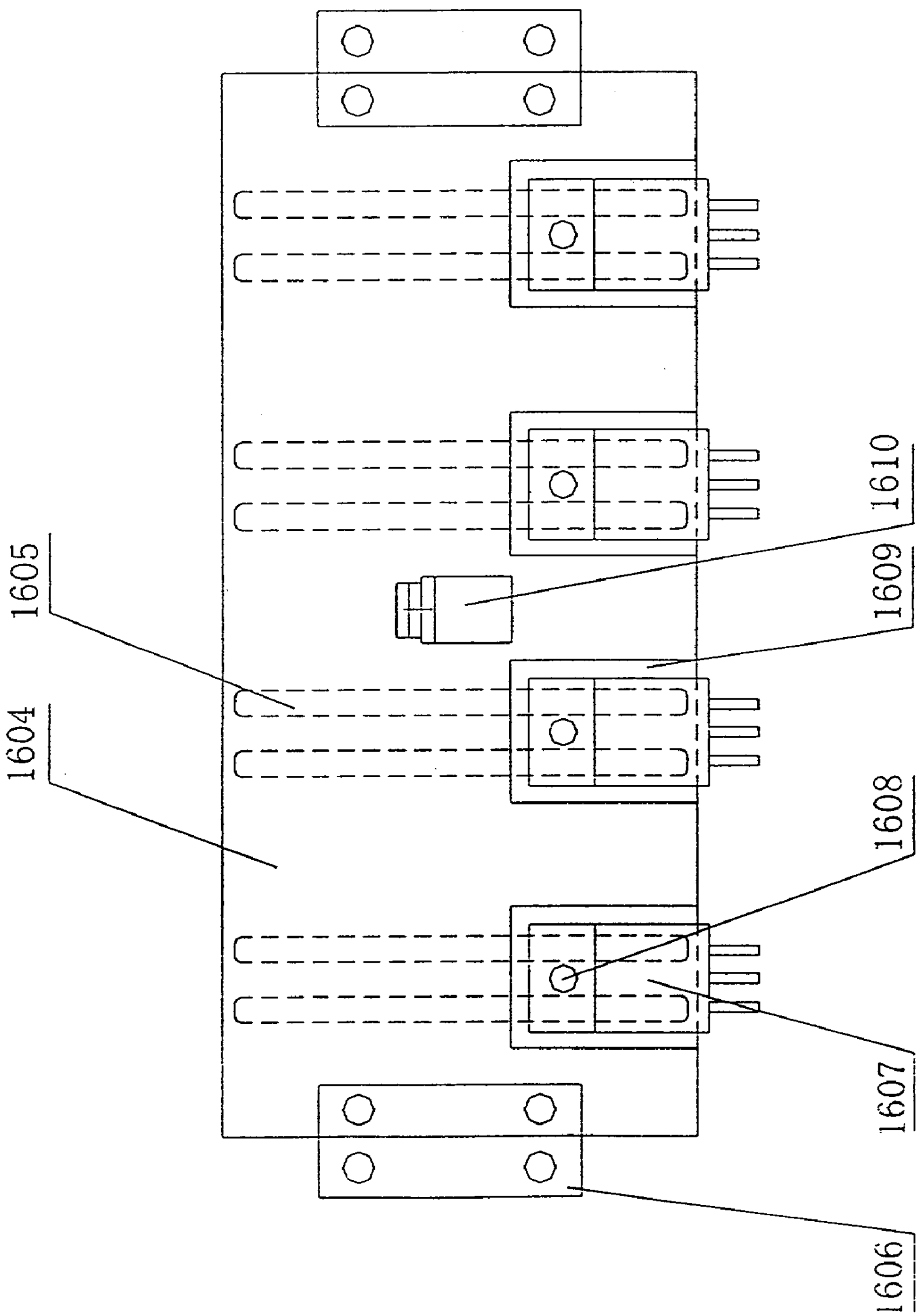

FIG. 16B shows a tube radiator of the high heat transfer sound output element according to the present invention.

Figure 16C:
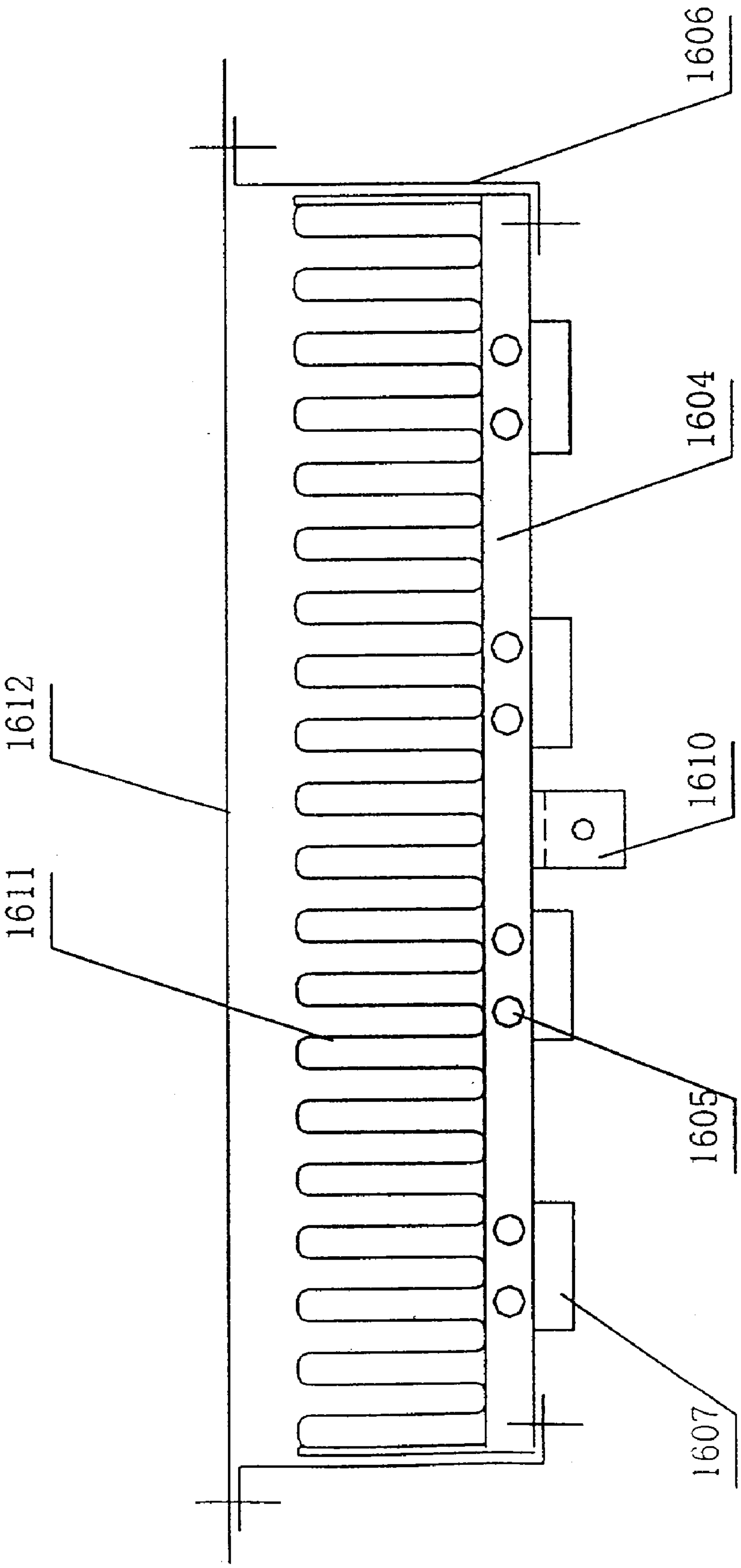

FIG. 16C is a top plan view of the cooler in FIG. 16B.

Figure 16D:
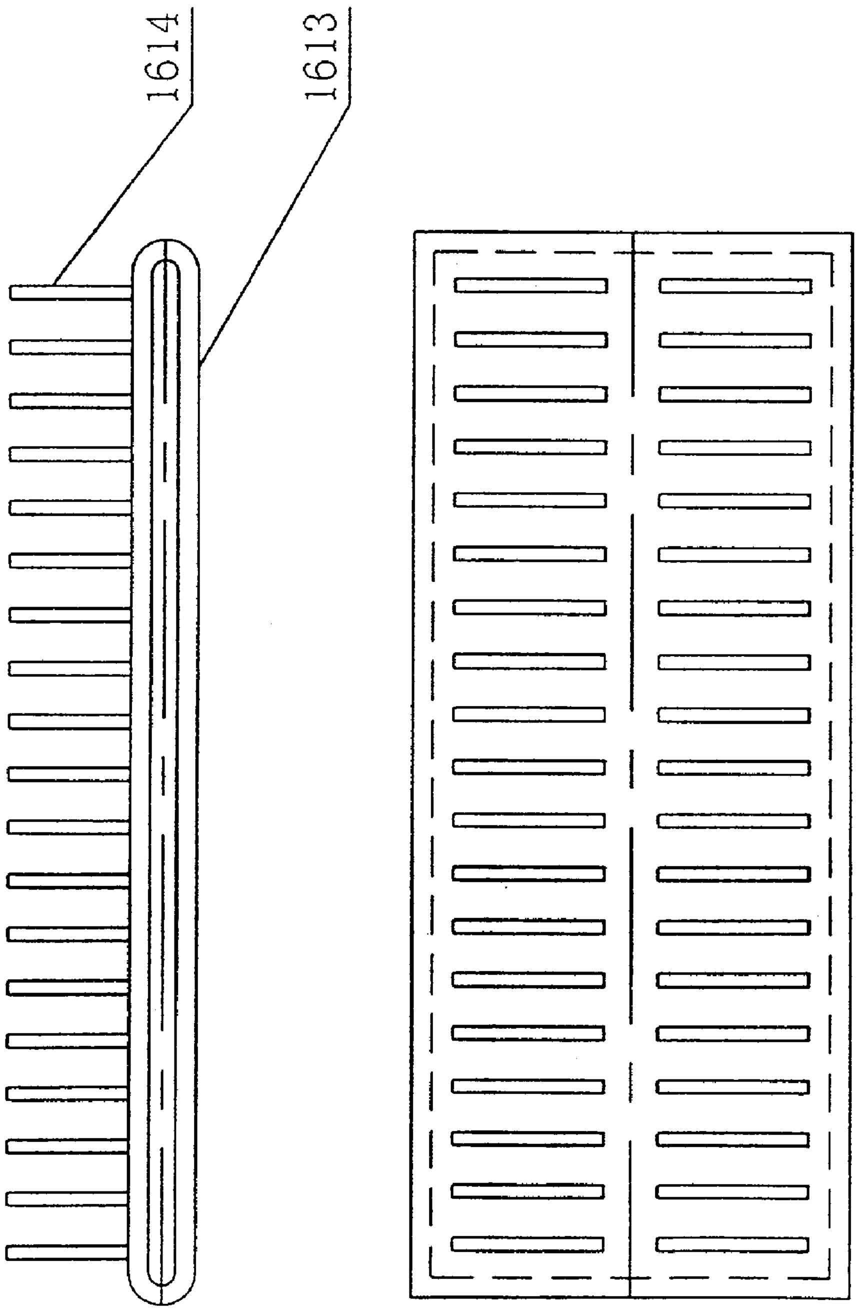

FIG. 16D shows a plate radiator of the high heat transfer sound output element according to the present invention.

Figure 16E:
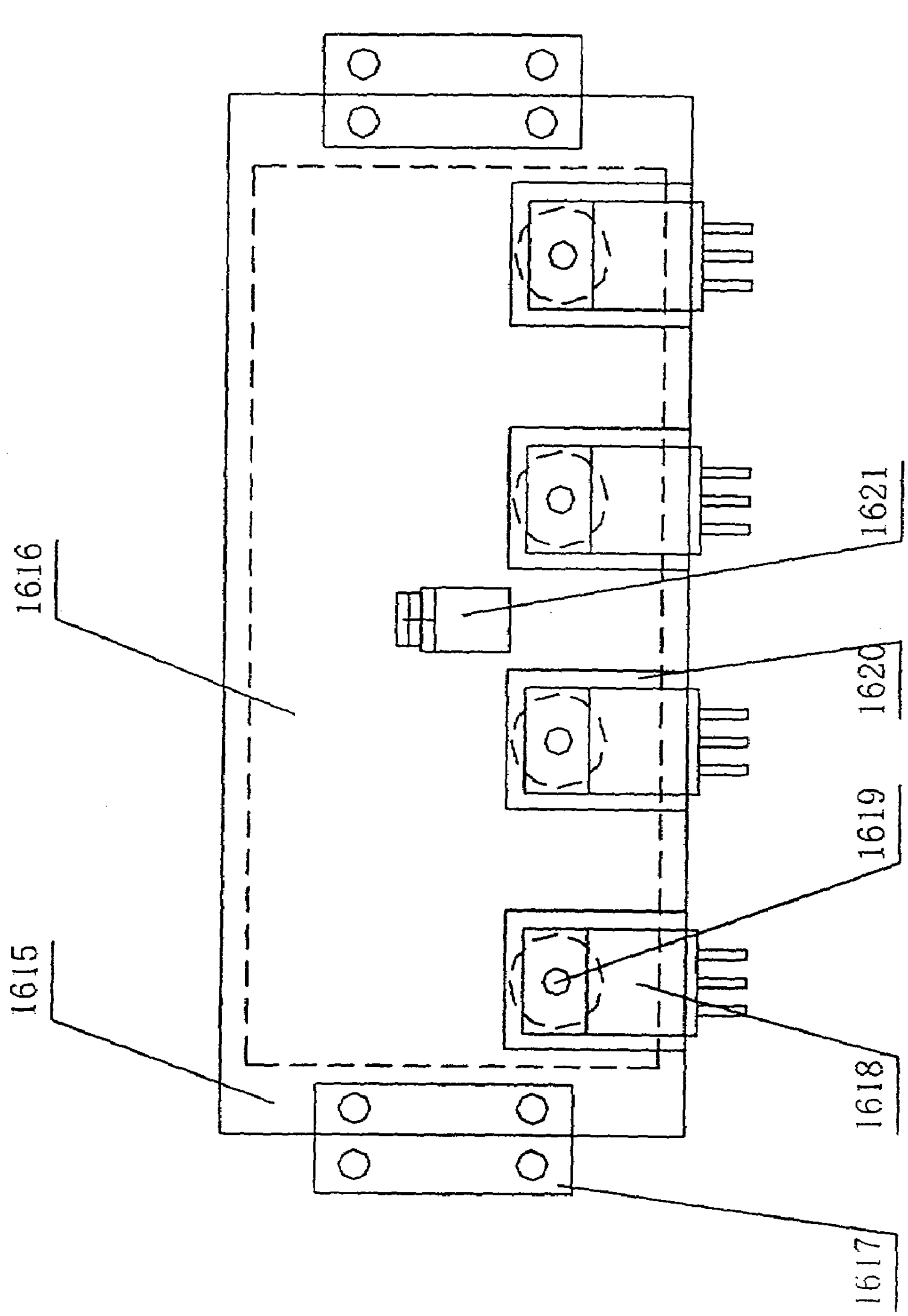

FIG. 16E shows a plate radiator of the high heat transfer sound output element according to the present invention.

Figure 16F:
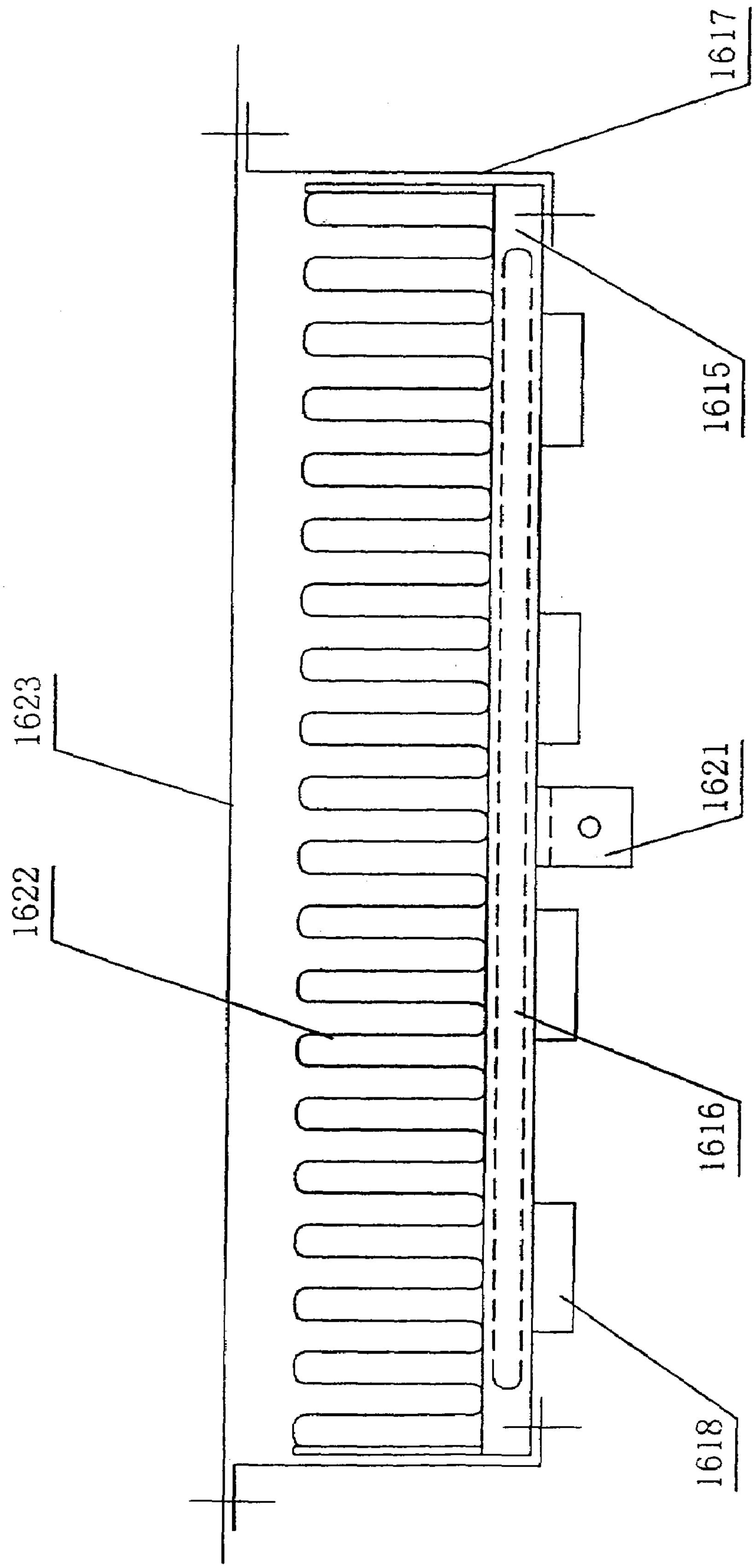

FIG. 16F is a top plan view of the cooler in FIG. 16E.

Figure 17A:
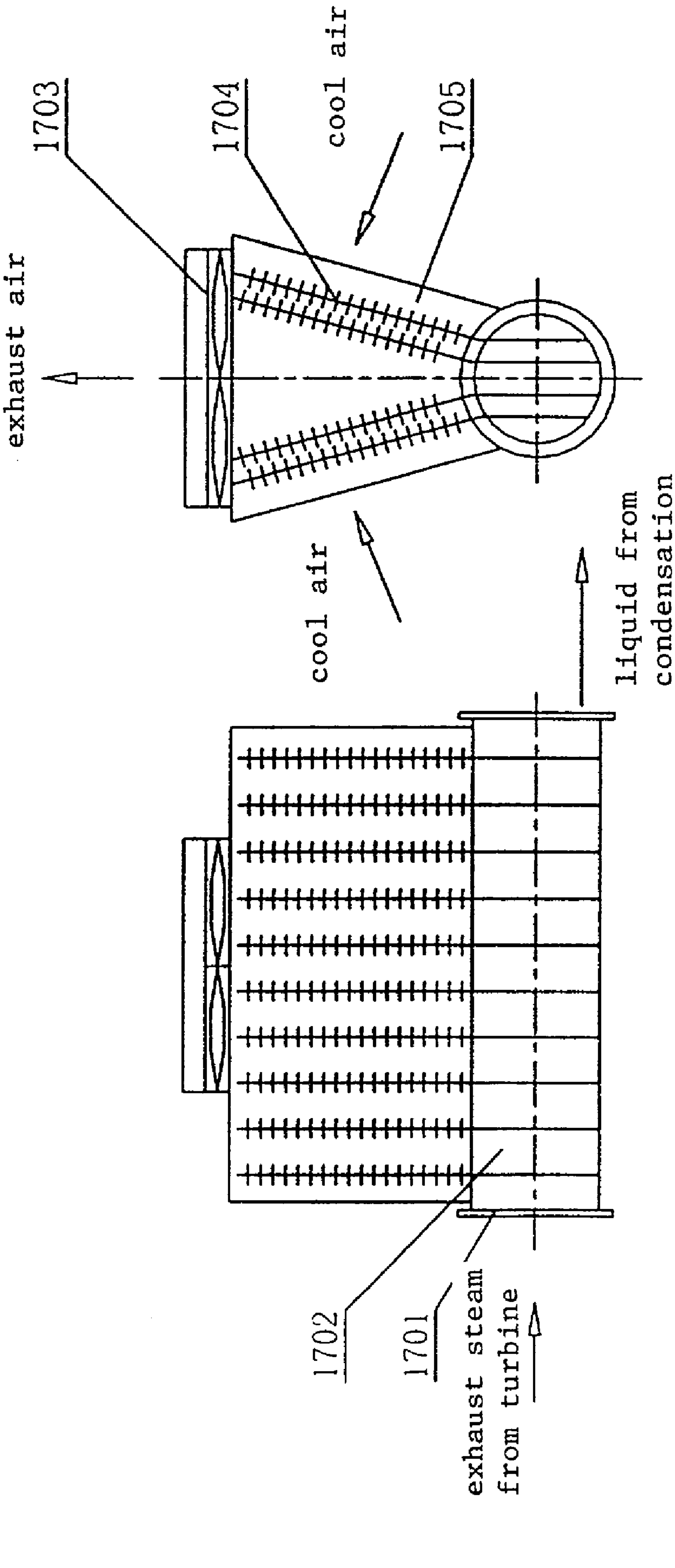

FIG. 17A shows the structure of the exhaust stream condenser of a power plant boiler.

Figure 17B:
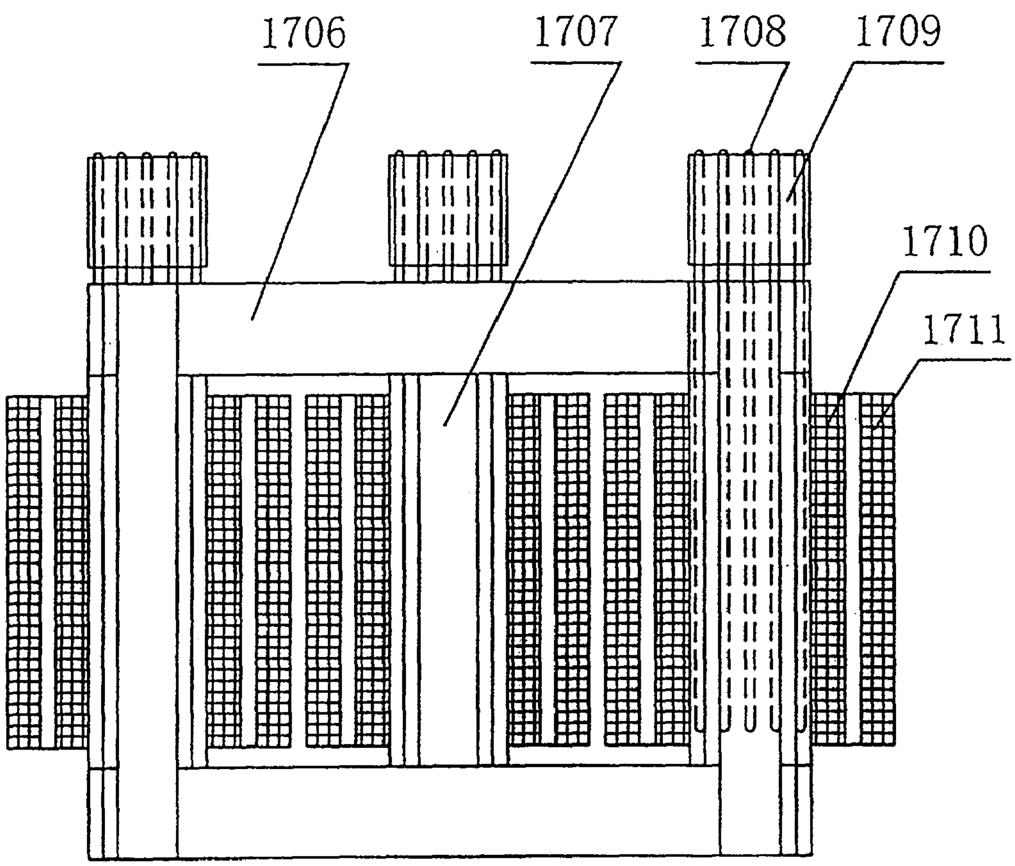

FIG. 17B is a front elevational view of an electric magnet core radiator on a tri-phase core adapter according to the present invention.

Figure 17C:
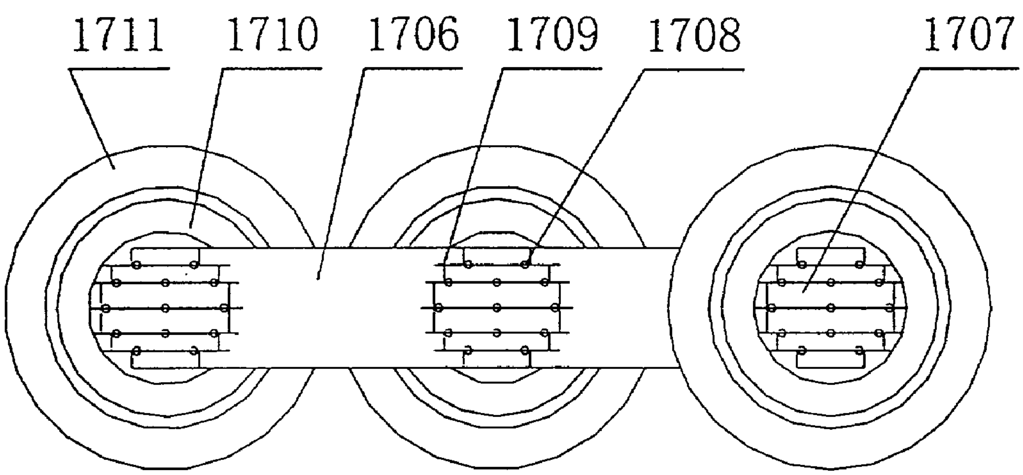

FIG. 17C is a top plan view of an electric magnet core radiator on a tri-phase core adapter according to the present invention.

Figure 17D:
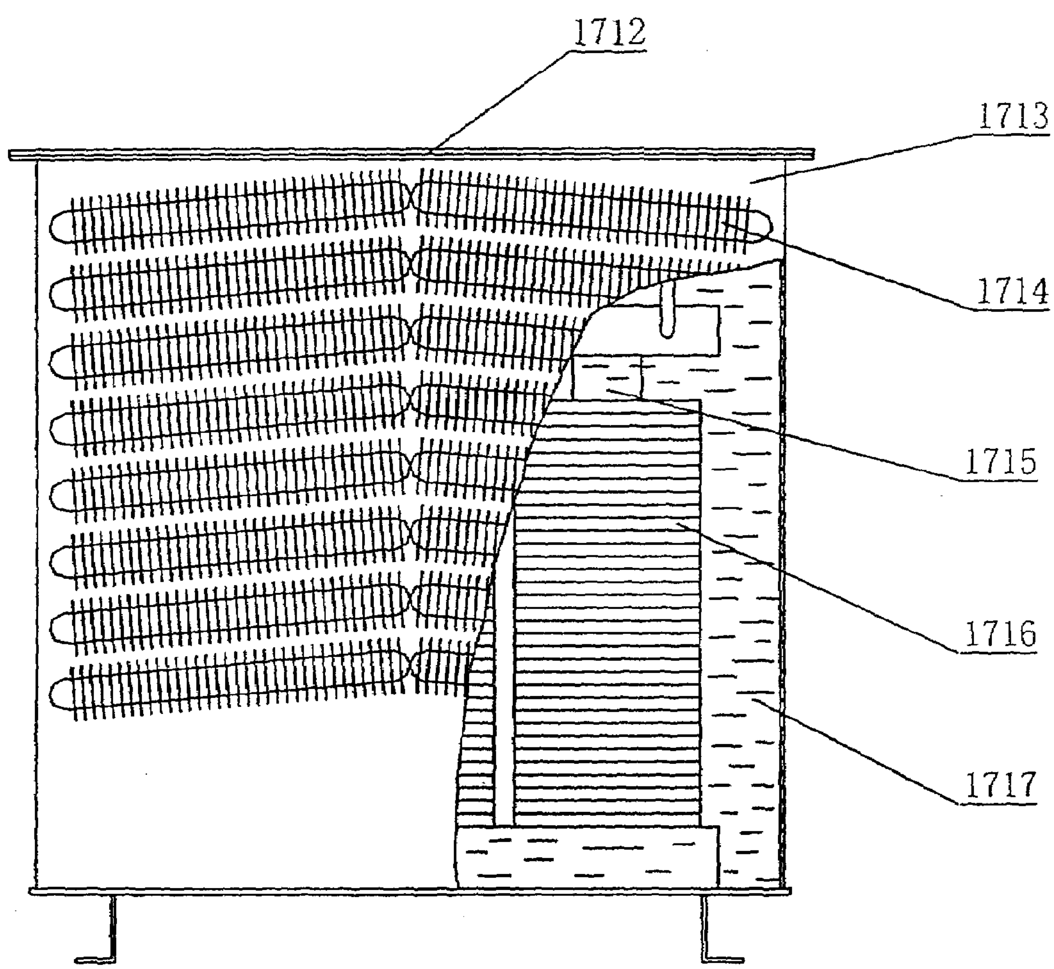

FIG. 17D shows front and partially cross-sectional view of an adepter radiator made of the high heat transfer tube of the present invention.

Figure 17E:
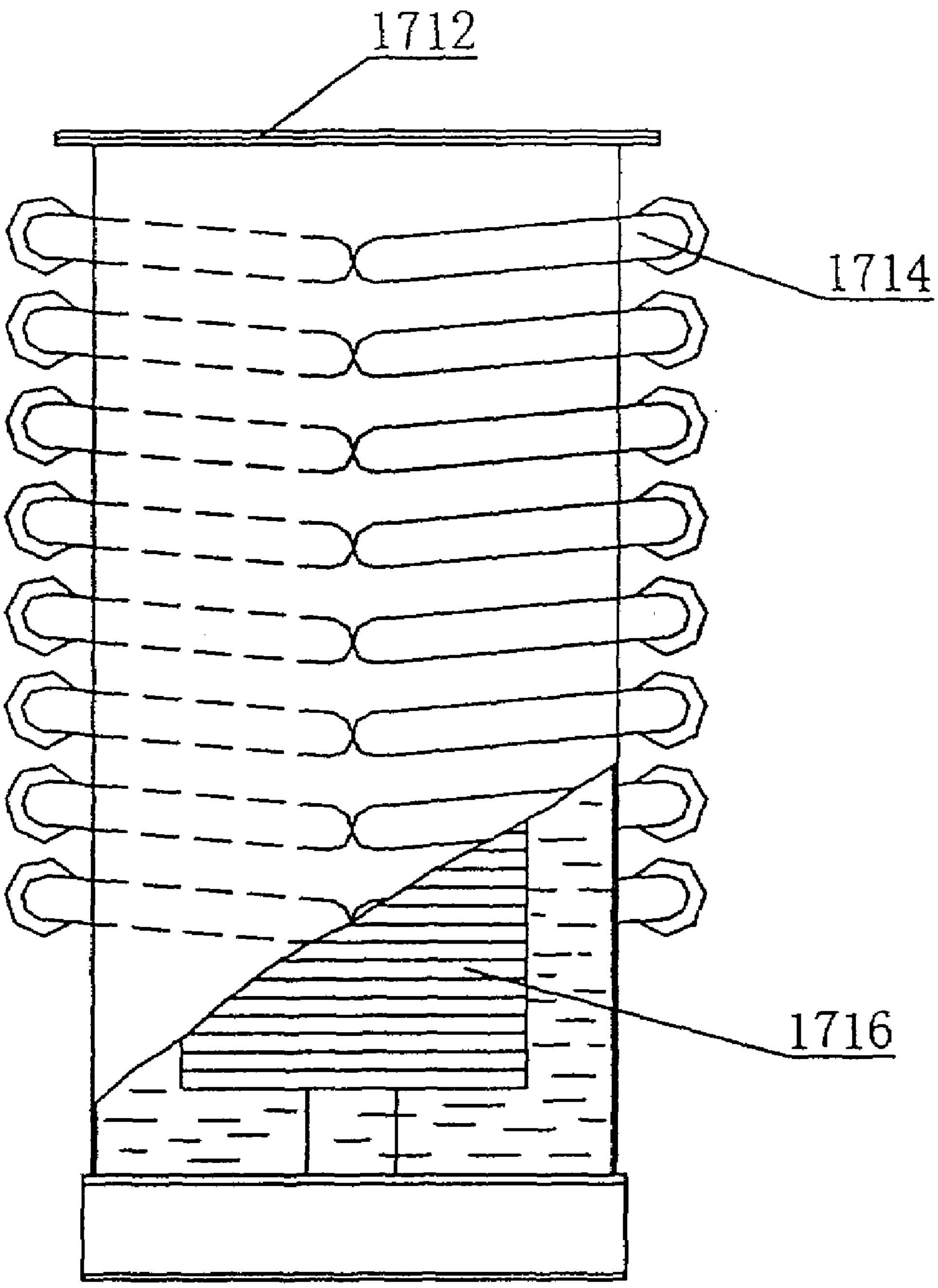

FIG. 17E shows side and partially cross-sectional views of an adepter radiator made of the high heat transfer tube of the present invention.

Figure 17F:
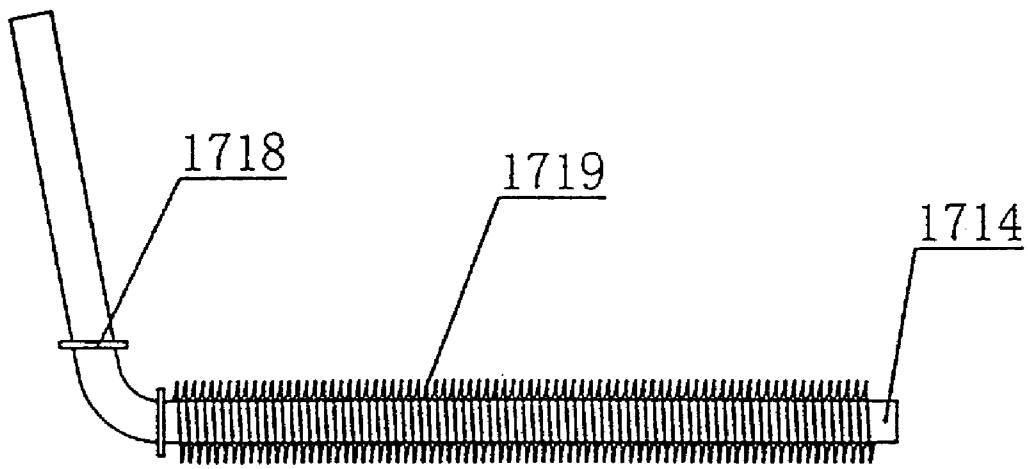

FIG. 17F shows the structure of the heat transfer tube shown in FIG. 17D or 17E.

Figure 17G:
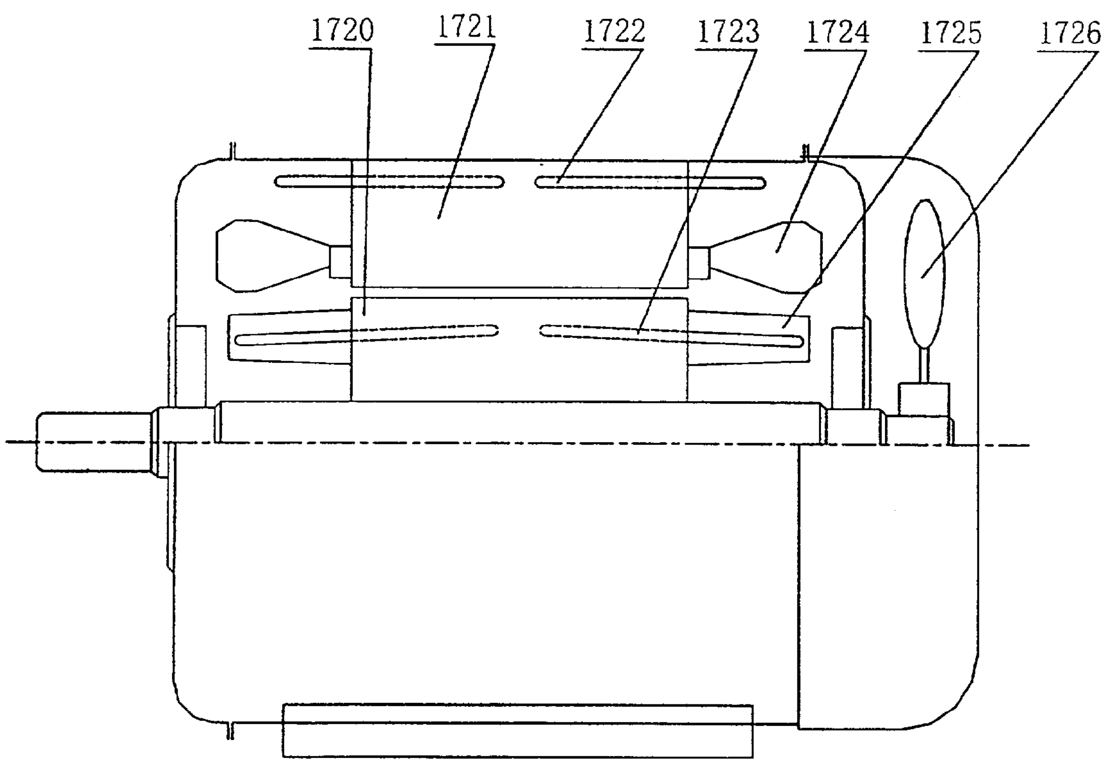

FIG. 17G is a partially cross-sectional view of an unsynchronous motor that cools the stator and rotor with the heat transfer element of the present invention.

Figure 17H:
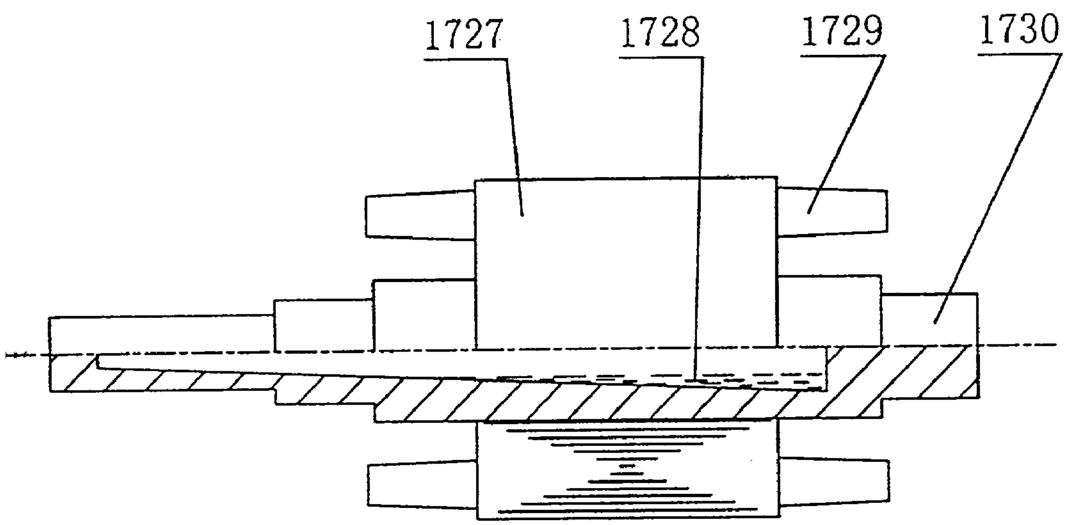

FIG. 17H shows a partially cross-sectional view of the rotor of a tri-phase unsynchronous adjustable motor and the pivot of a heat transfer pipe machine.

Figure 17I:
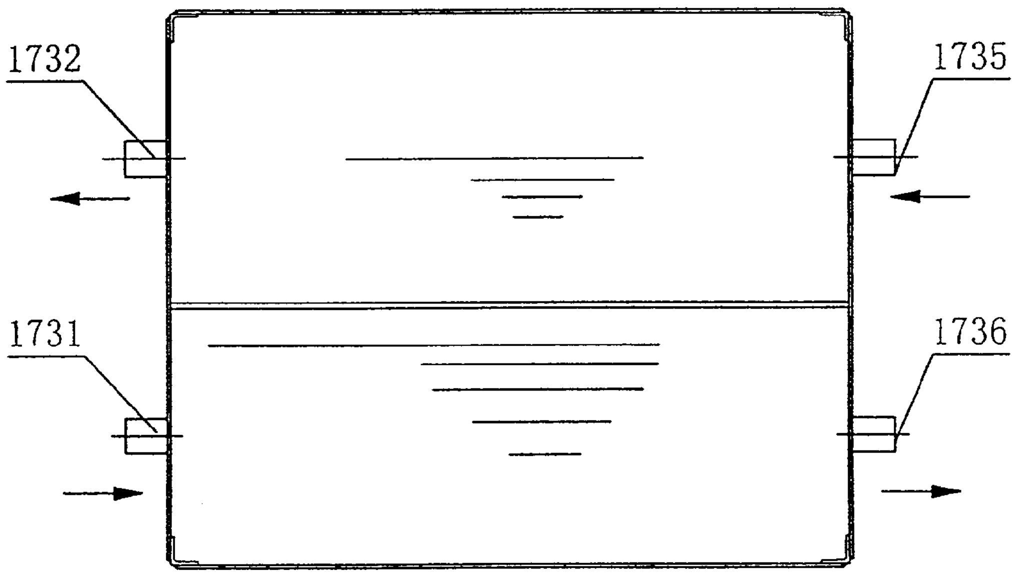

FIG. 17I shows the theory of the operation of the intensive magnetic unit oil cooler using the high heat transfer element of the present invention in a mineral plant.

Figure 17J:
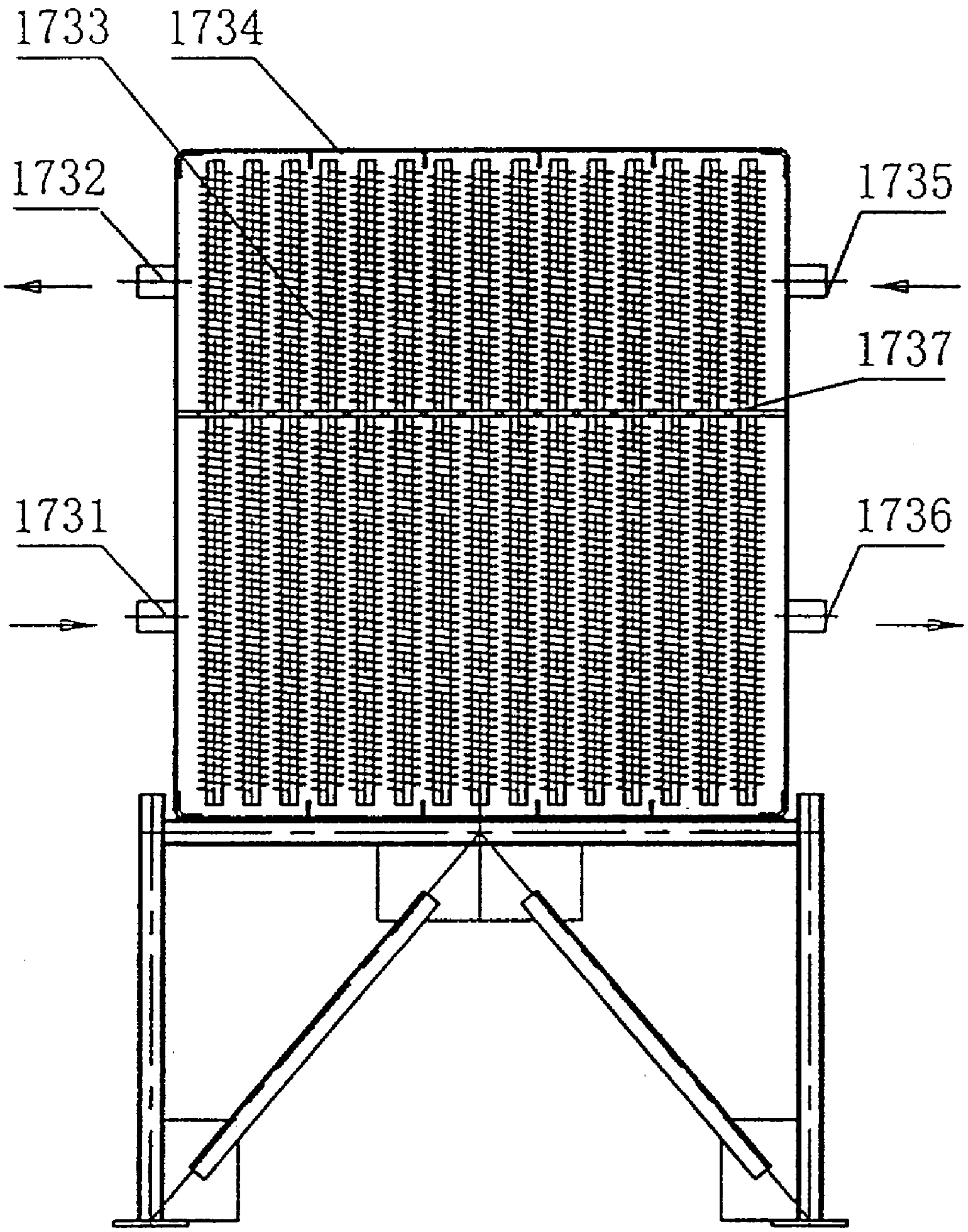

FIG. 17J shows front cross-sectional views of the intensive magnetic unit oil cooler using the high heat transfer element of the present invention in a mineral plant.

Figure 17K:
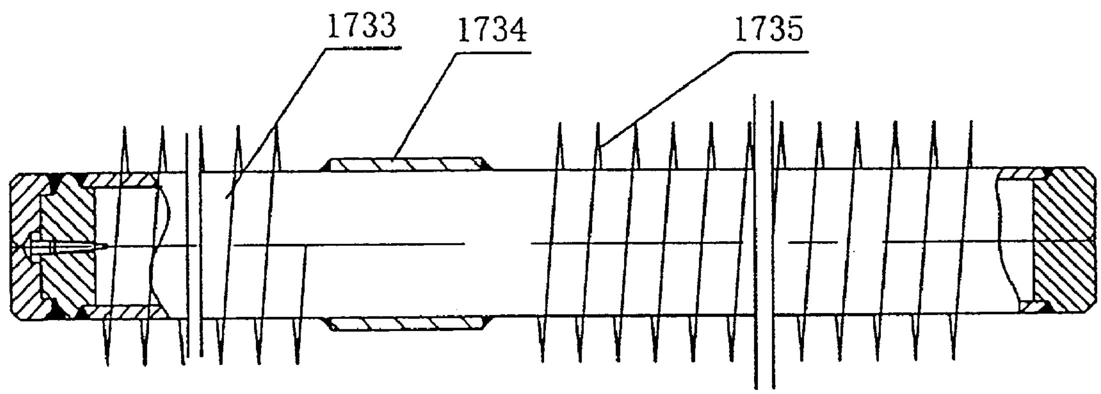

FIG. 17K shows the heat transfer tube bank used by the intensive magnetic unit oil cooler in the mineral plant.

Figure 17L:
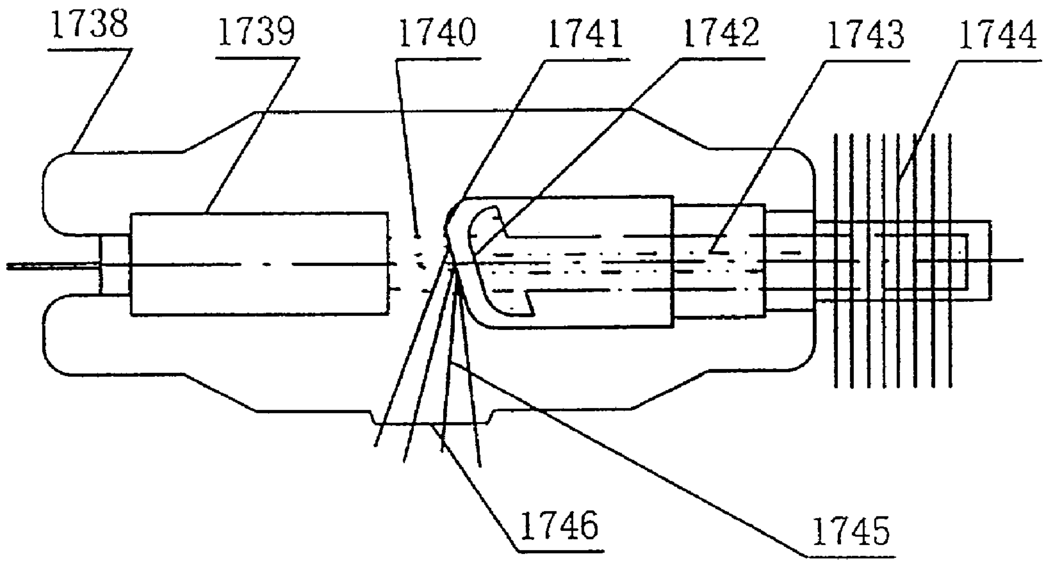

FIG. 17L shows an X-ray machine cooler adopting the high heat transfer element of the present invention.

Figure 17M:
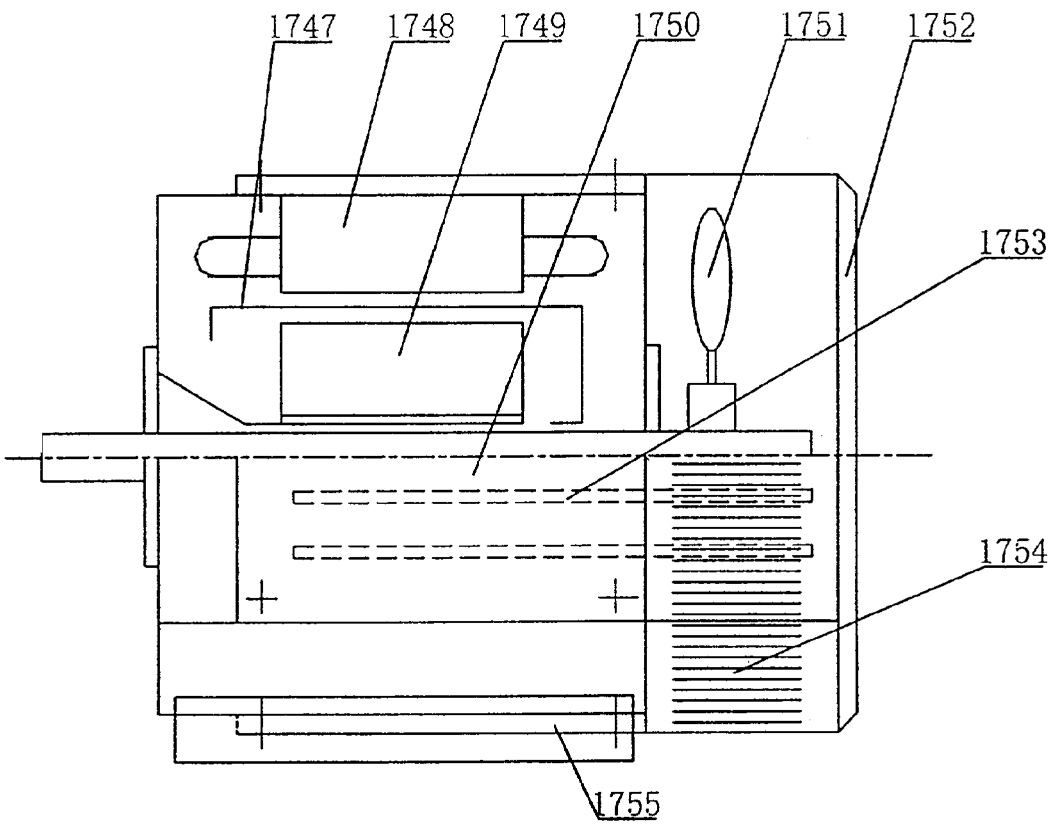

FIG. 17M shows front partially cross-sectional views of a motor radiator adopting the high heat transfer element of the present invention.

Figure 17N:
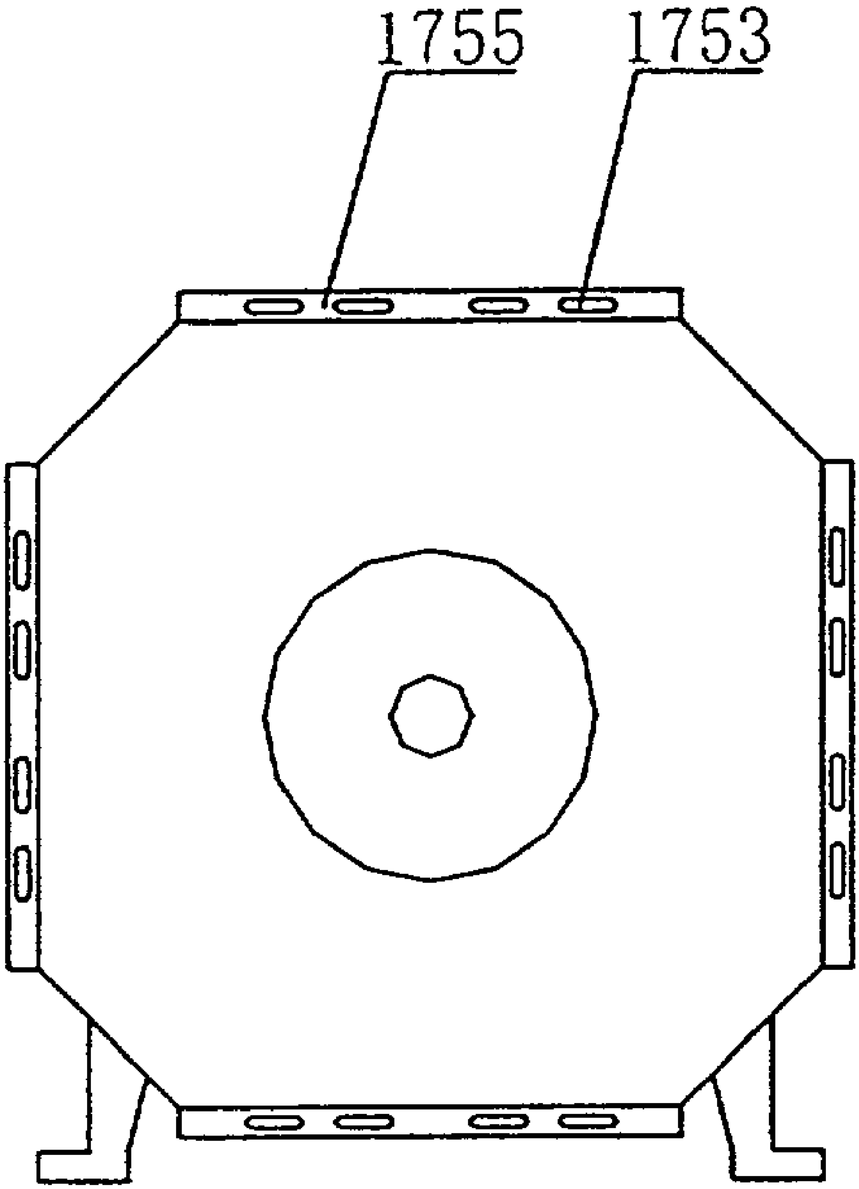

FIG. 17N is a side view of the motor radiator shown in FIG. 17M.

Figure 17O:
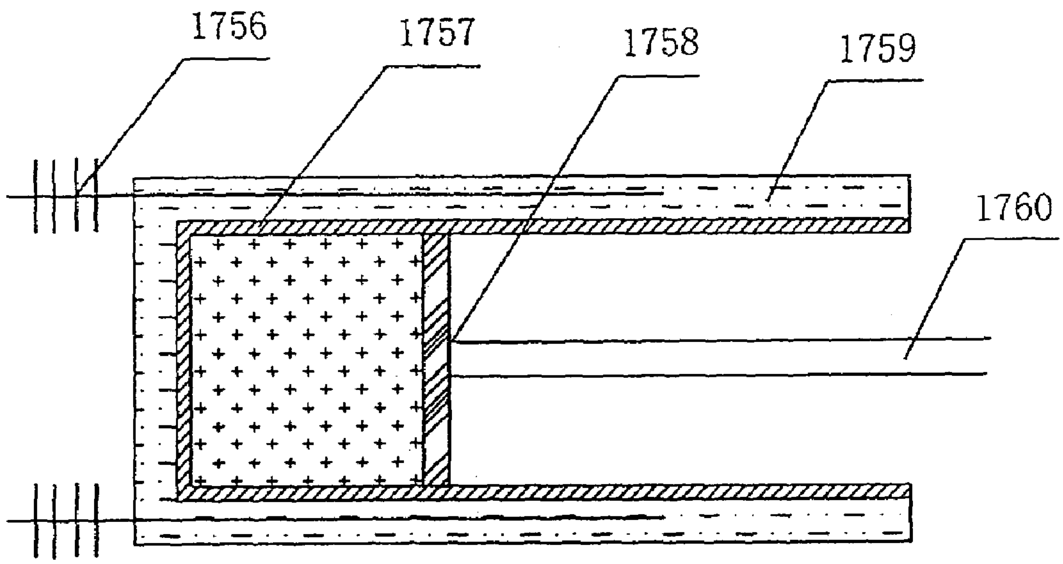

FIG. 17O shows a hydraulic oil radiator adopting the high heat transfer element of the present invention.

Figure 17P:
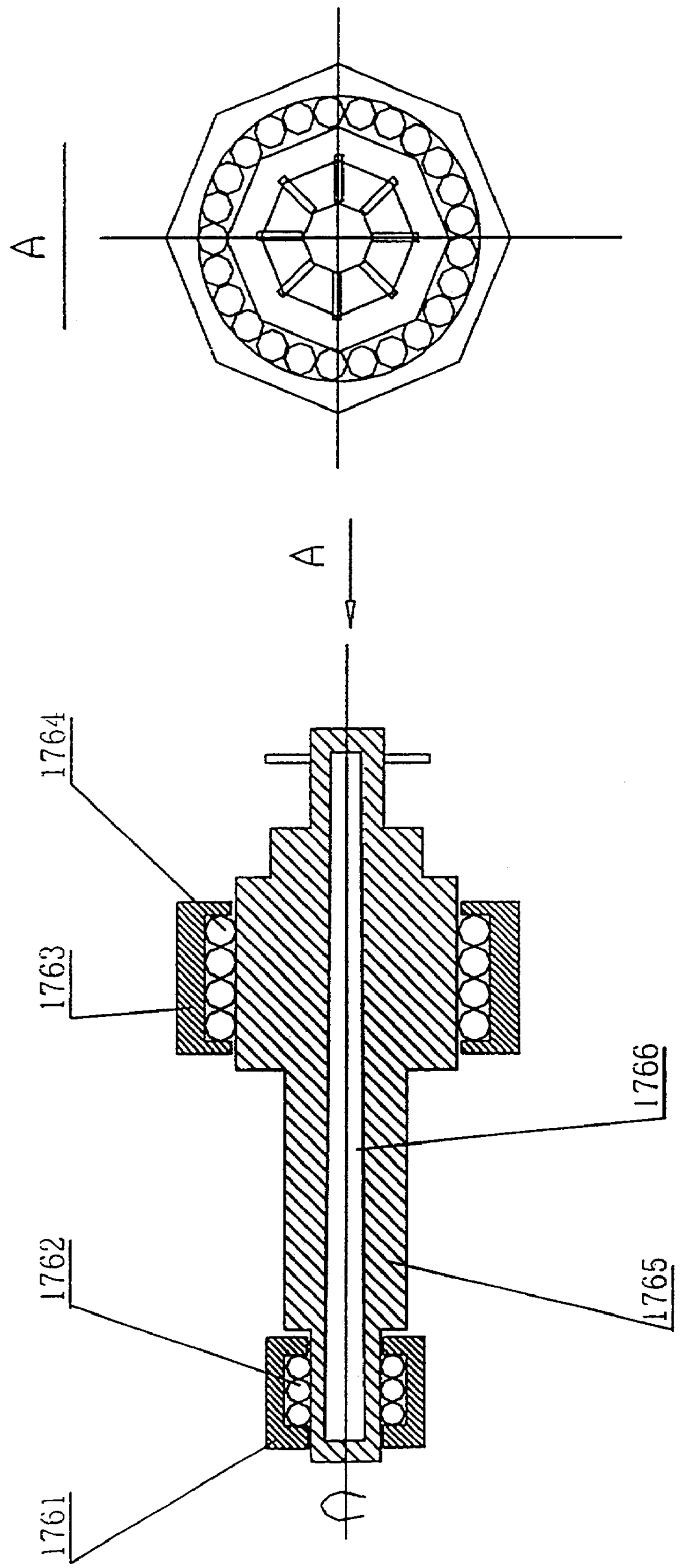

FIG. 17P is a schematic view showing the structure of a high heat transfer transmission shaft system of the present invention.

Figure 17Q:
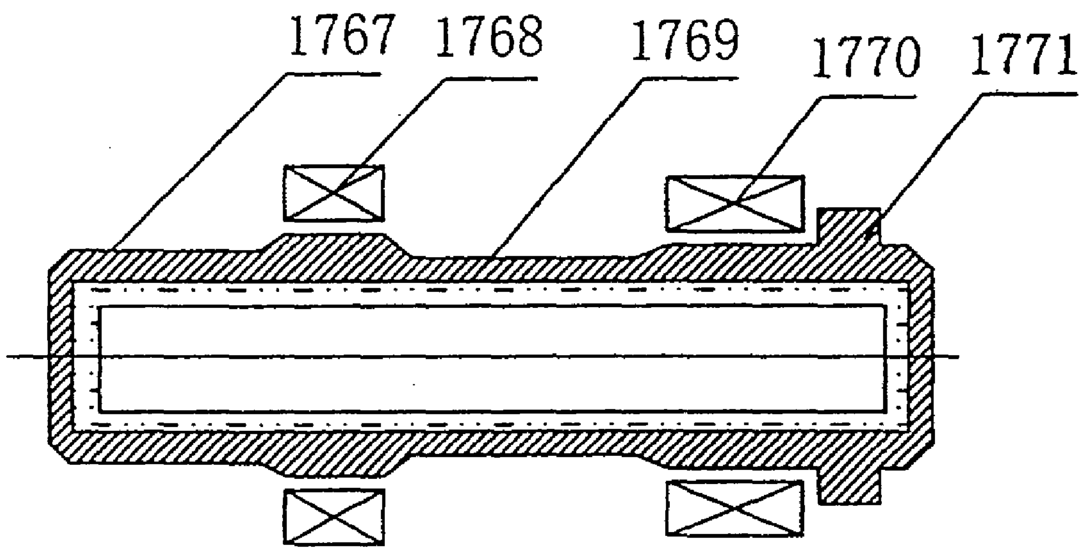

FIG. 17Q shows a high heat transfer cooler for the axle of precise machines.

Figure 17R:
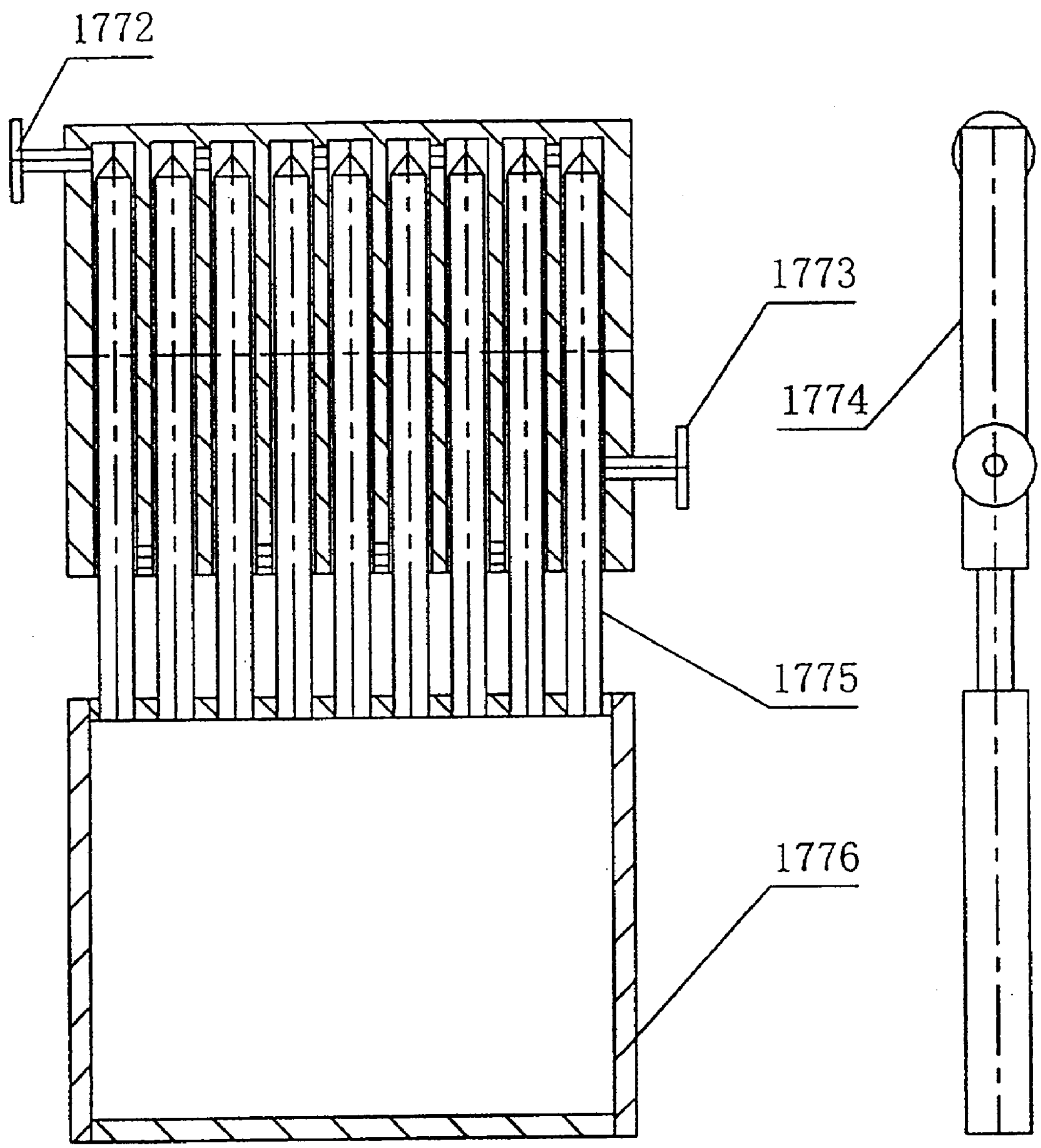

FIG. 17R is a schematic view of high heat transfer welding for part assembly of the present invention.

Figure 17S:
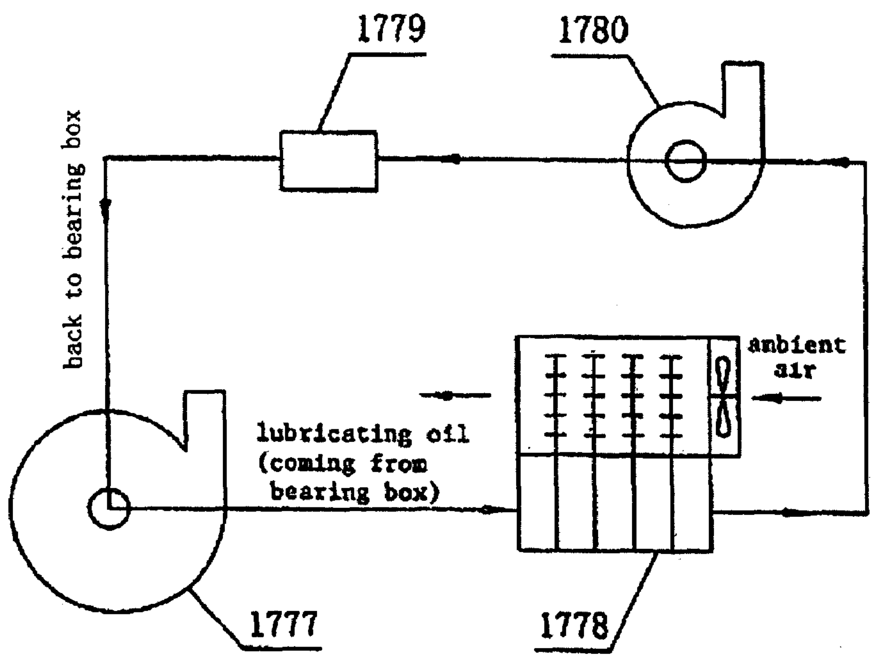

FIG. 17S is a schematic view showing a pump cooling system.

Figure 17T:
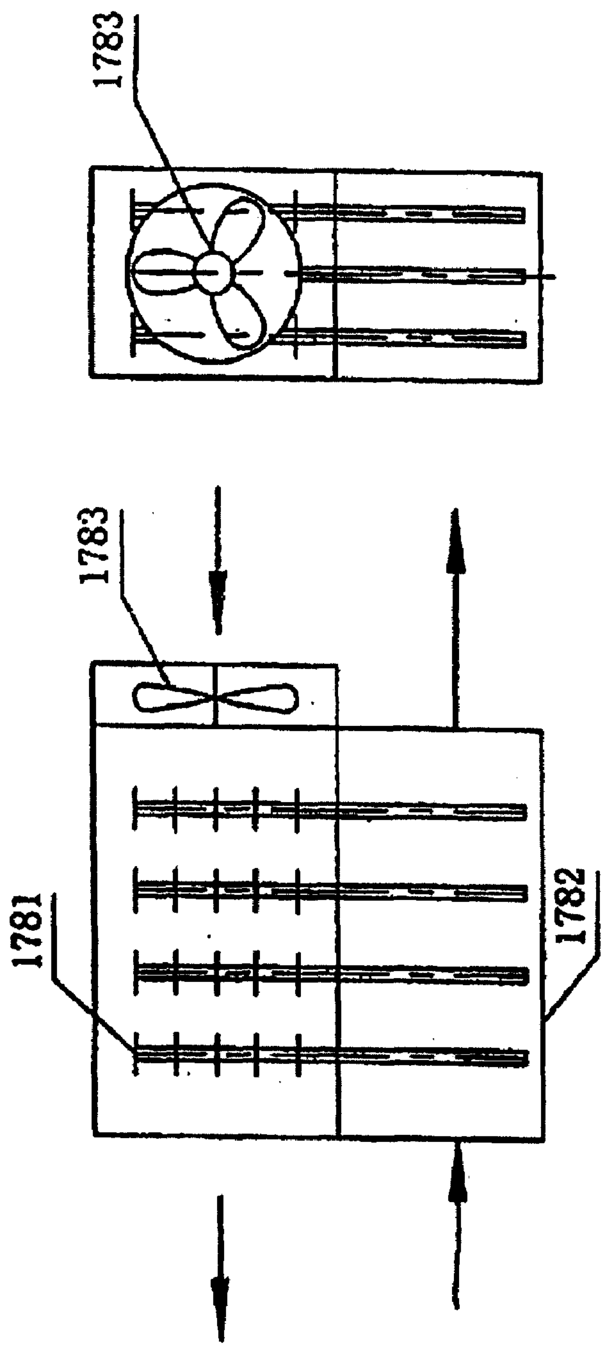

FIG. 17T shows a high heat transfer cooler for the pump cooling system.

Figure 17U:
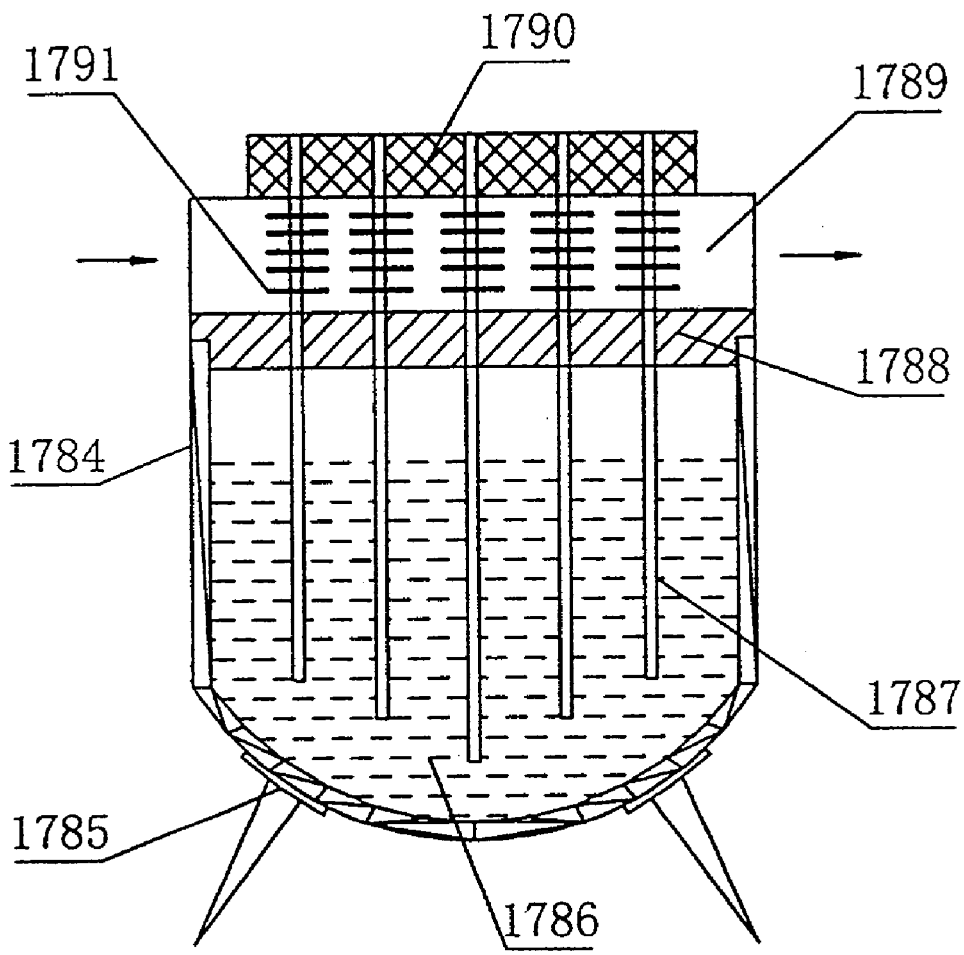

FIG. 17U shows a thermoelectric high heat transfer, heat conducting and cooling reactor.

Figure 17V:
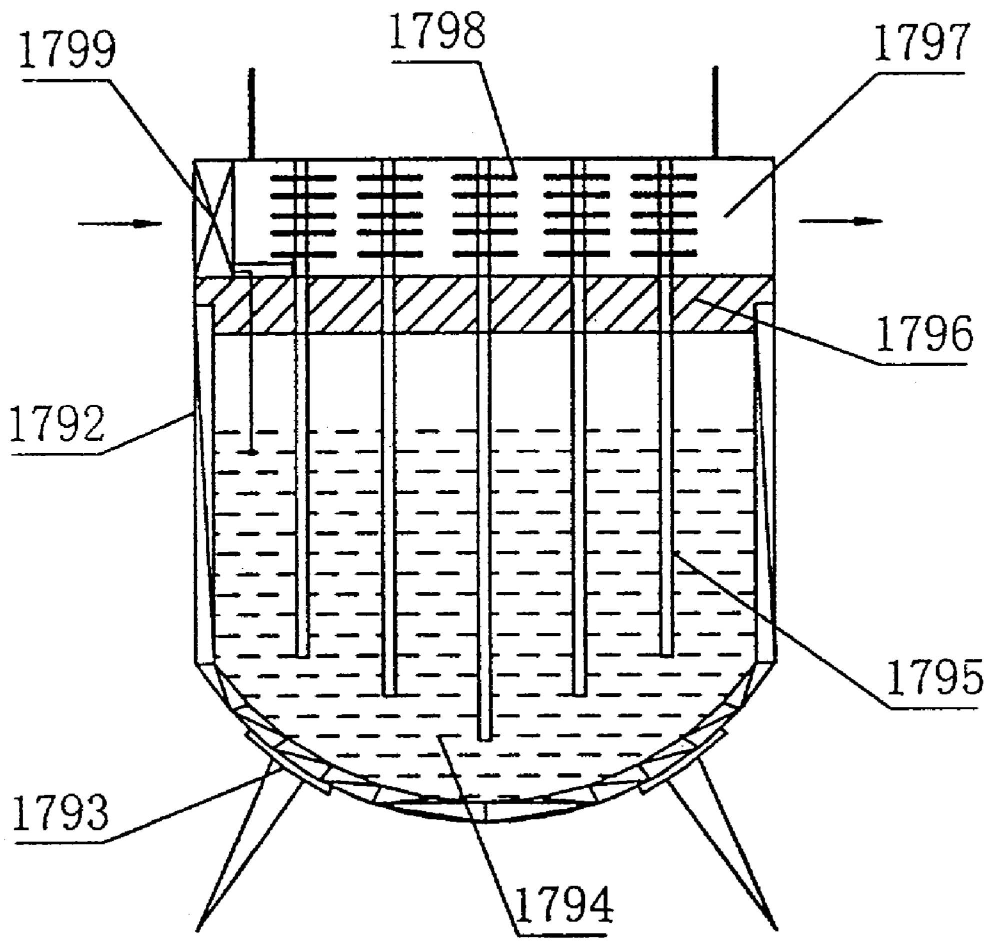

FIG. 17V shows a stream high heat transfer, heat conducting and cooling reactor.

Figure 17W:
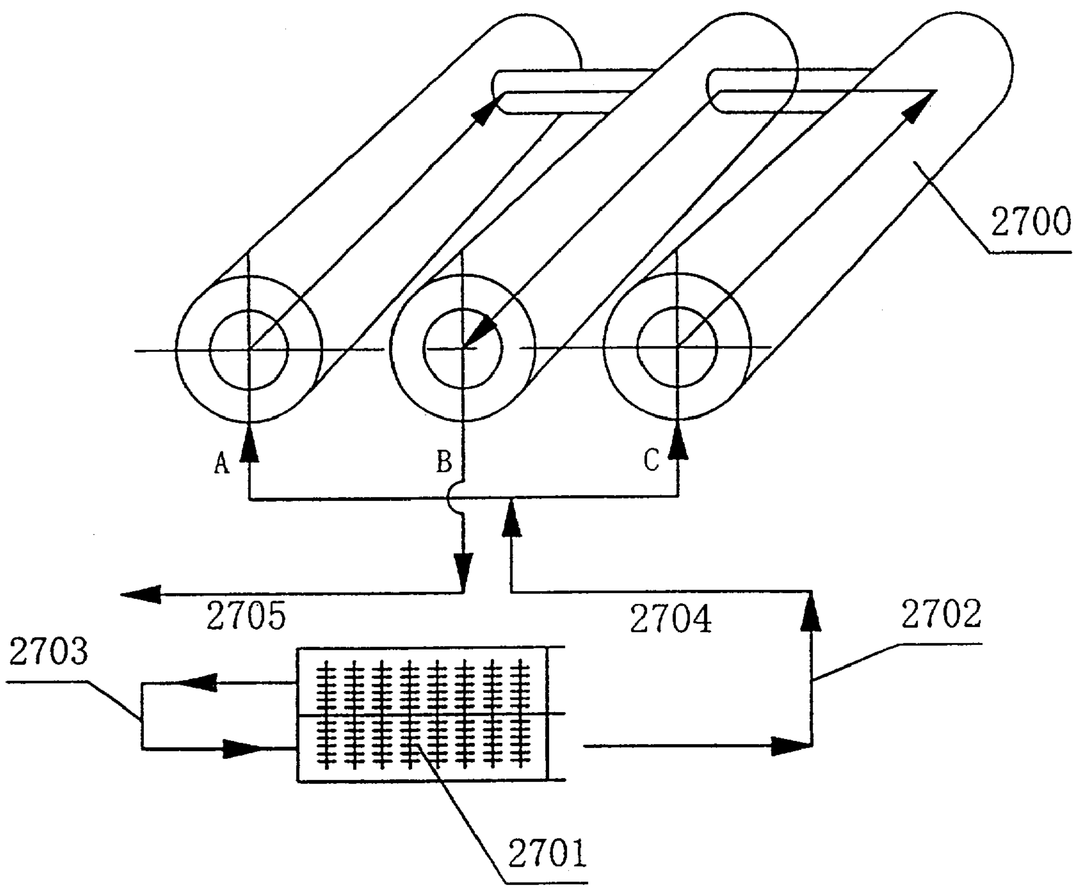

FIG. 17W shows a high-current off-phase close bus air-cooling system using the high heat transfer elements.

Figure 17X:
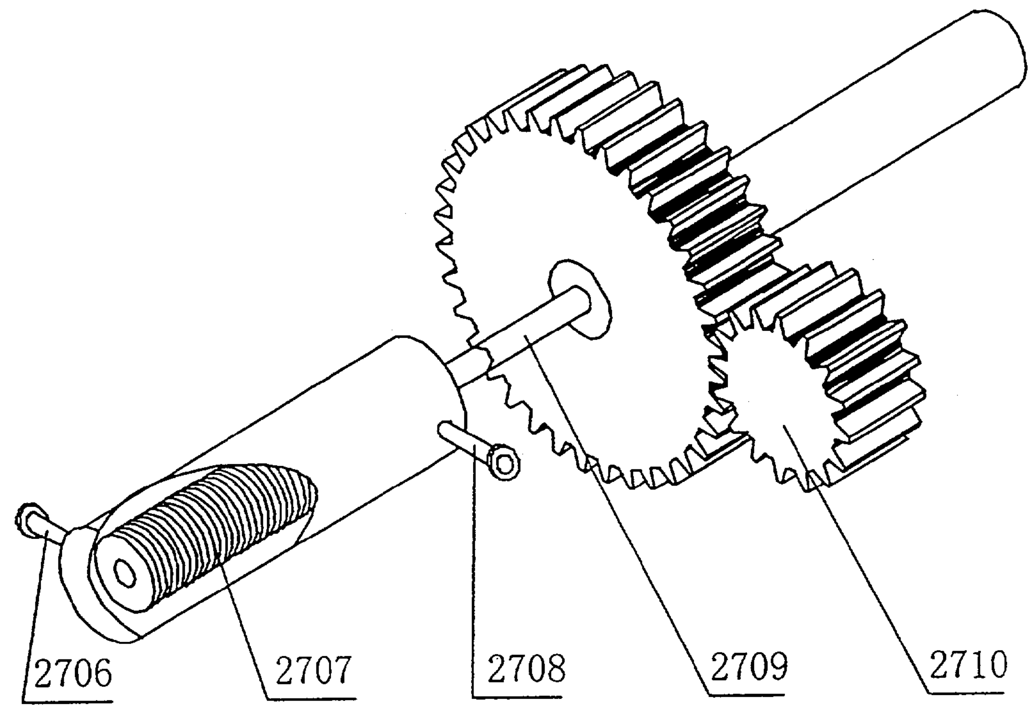

FIG. 17X is a schematic view showing a heavy machine linkage part cooling system adopting the heat transfer elements.

Figure 17Y:
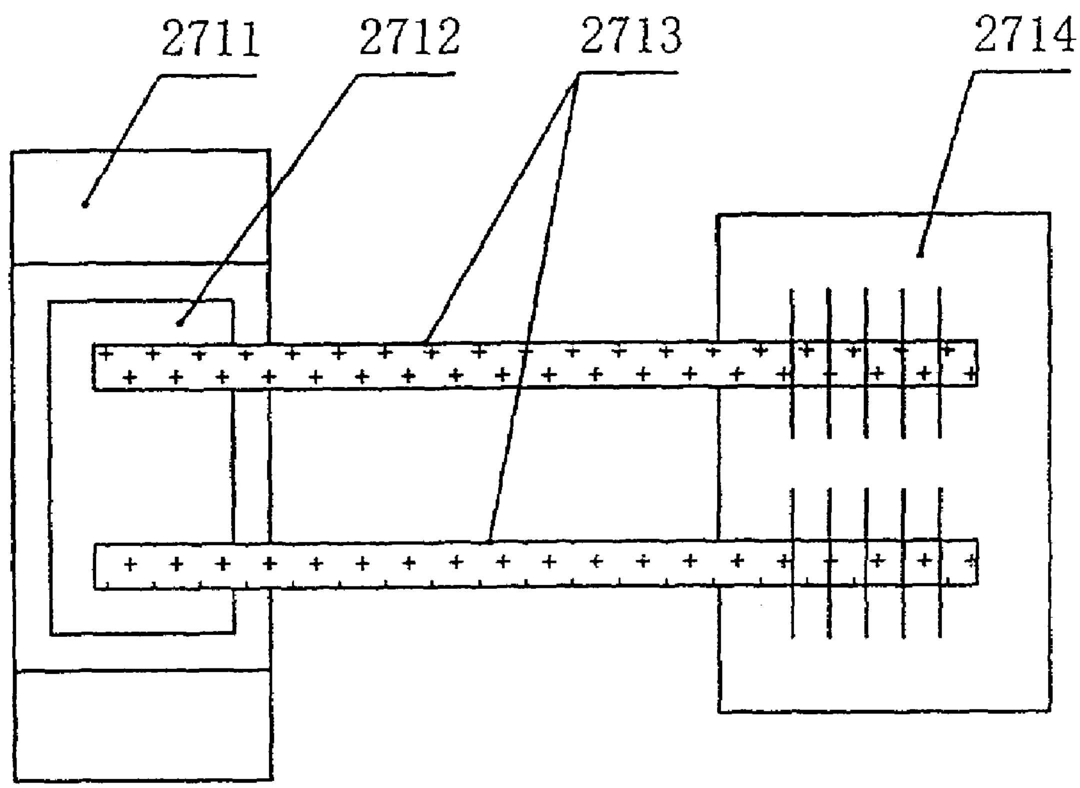

FIG. 17Y is a schematic view showing a speedy radiator of the heavy machine braking system adopting the heat transfer elements.

Figure 17Z:
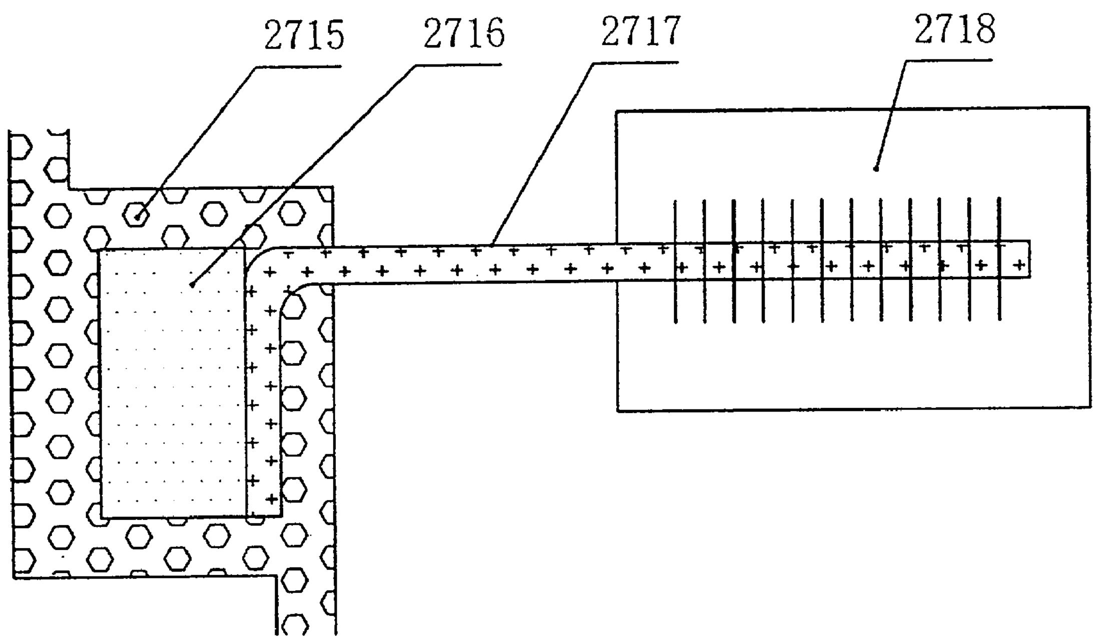
Figure 17Z:
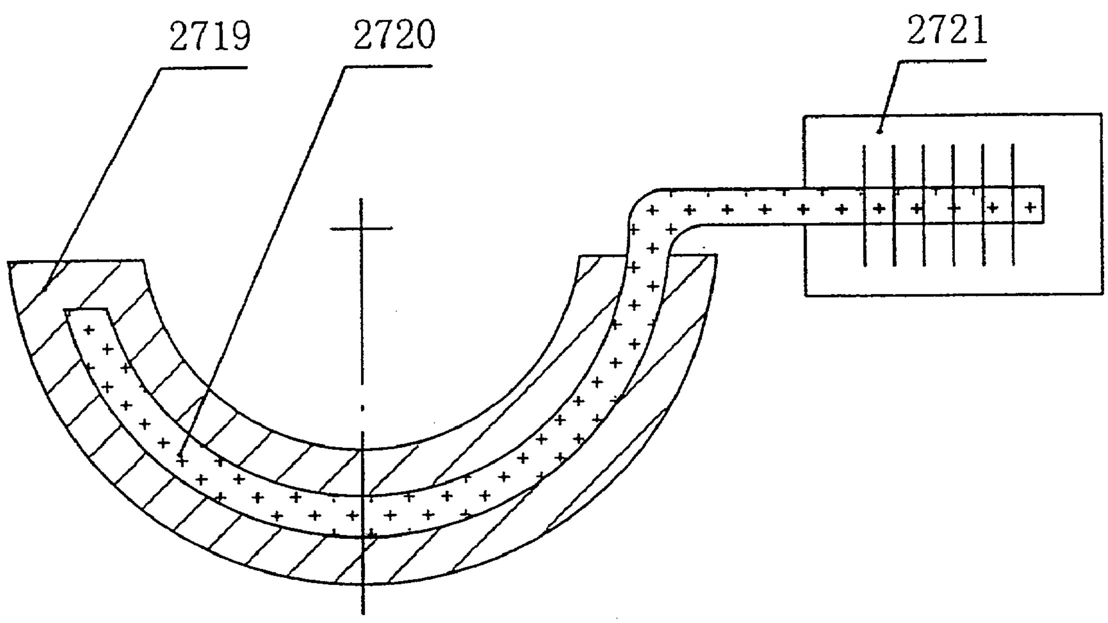
Figure 17Z:
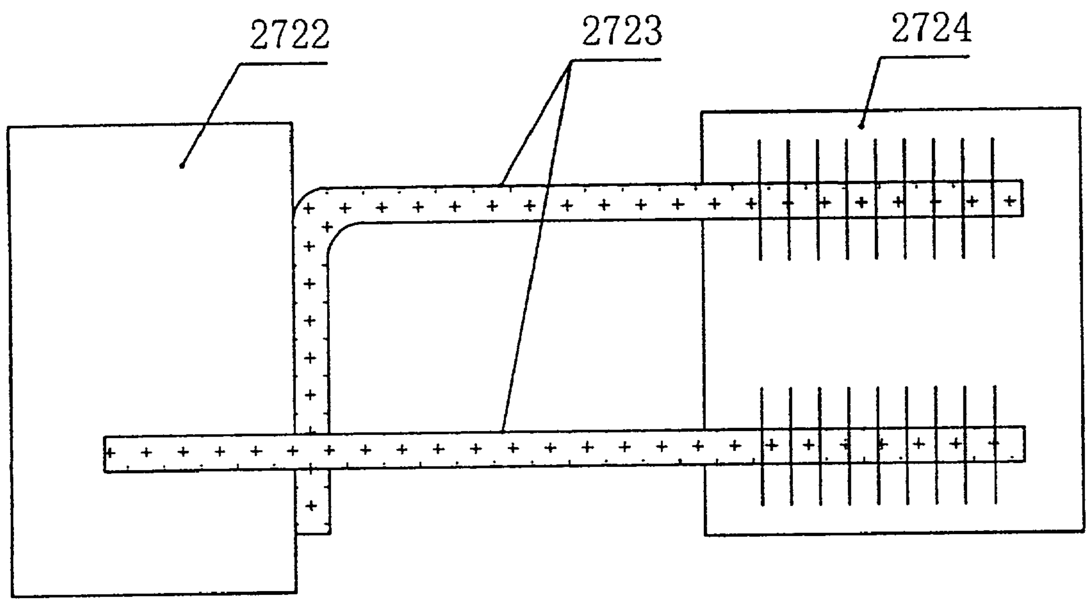
Figure 17Z:
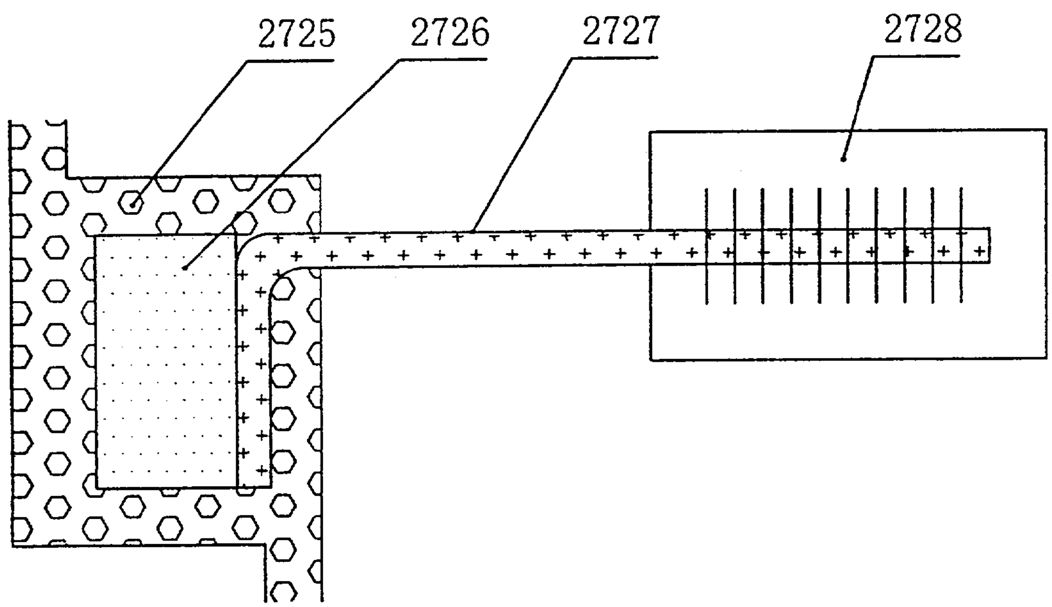
Figure 17Z:
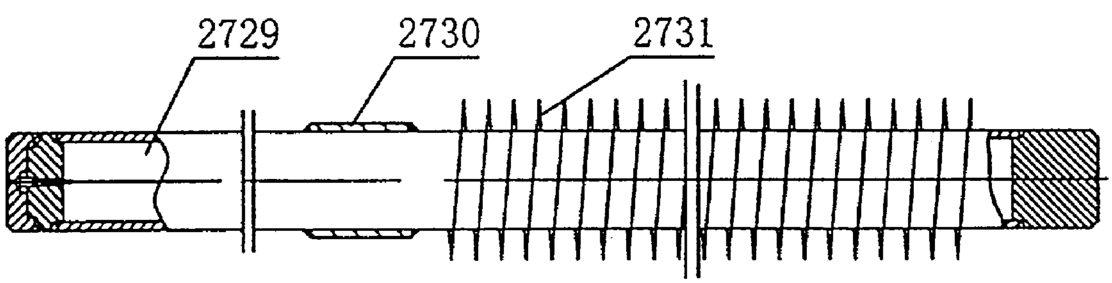
Figure 17Z:
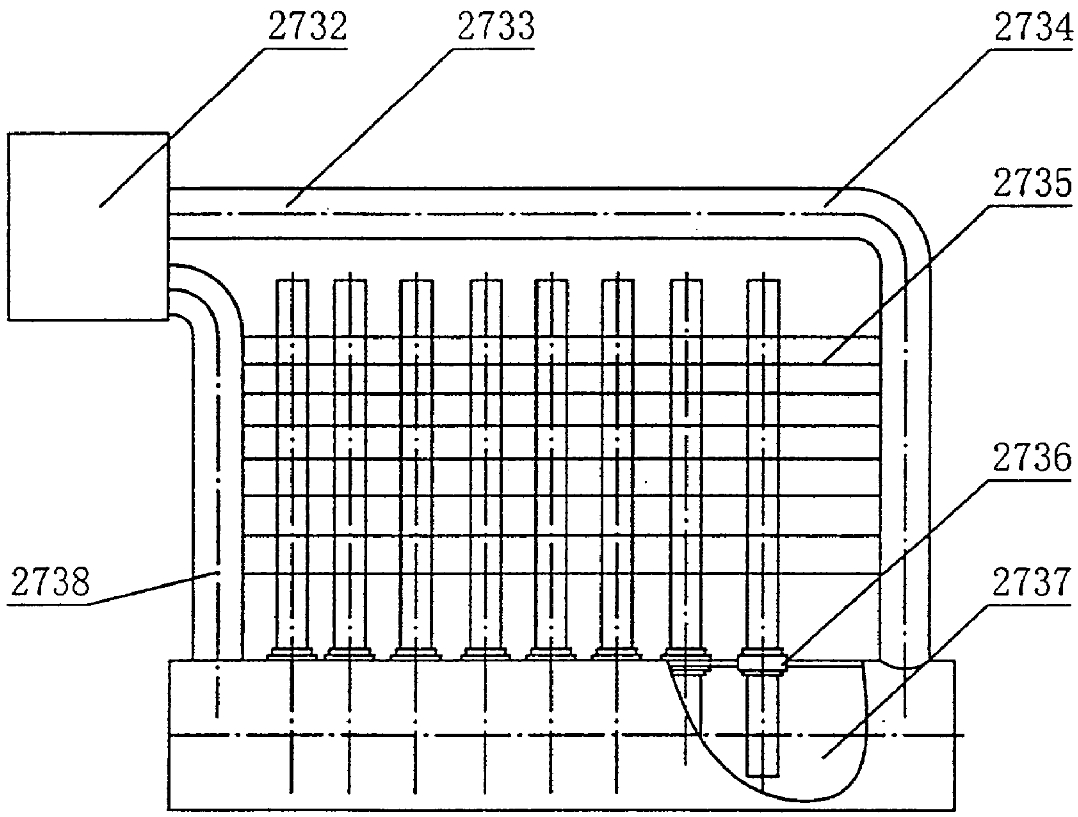
Figure 17Z:
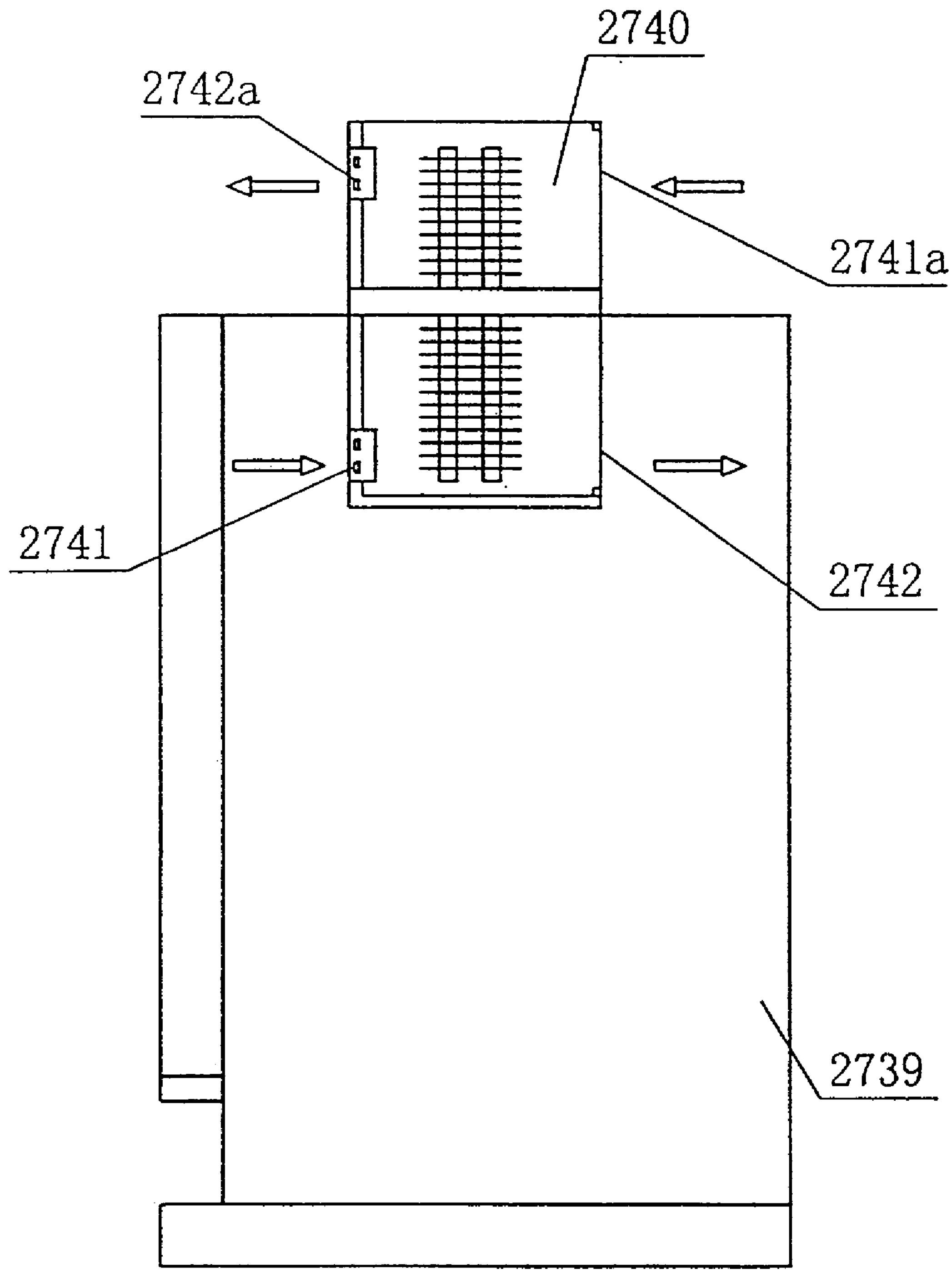
Figure 17Z:
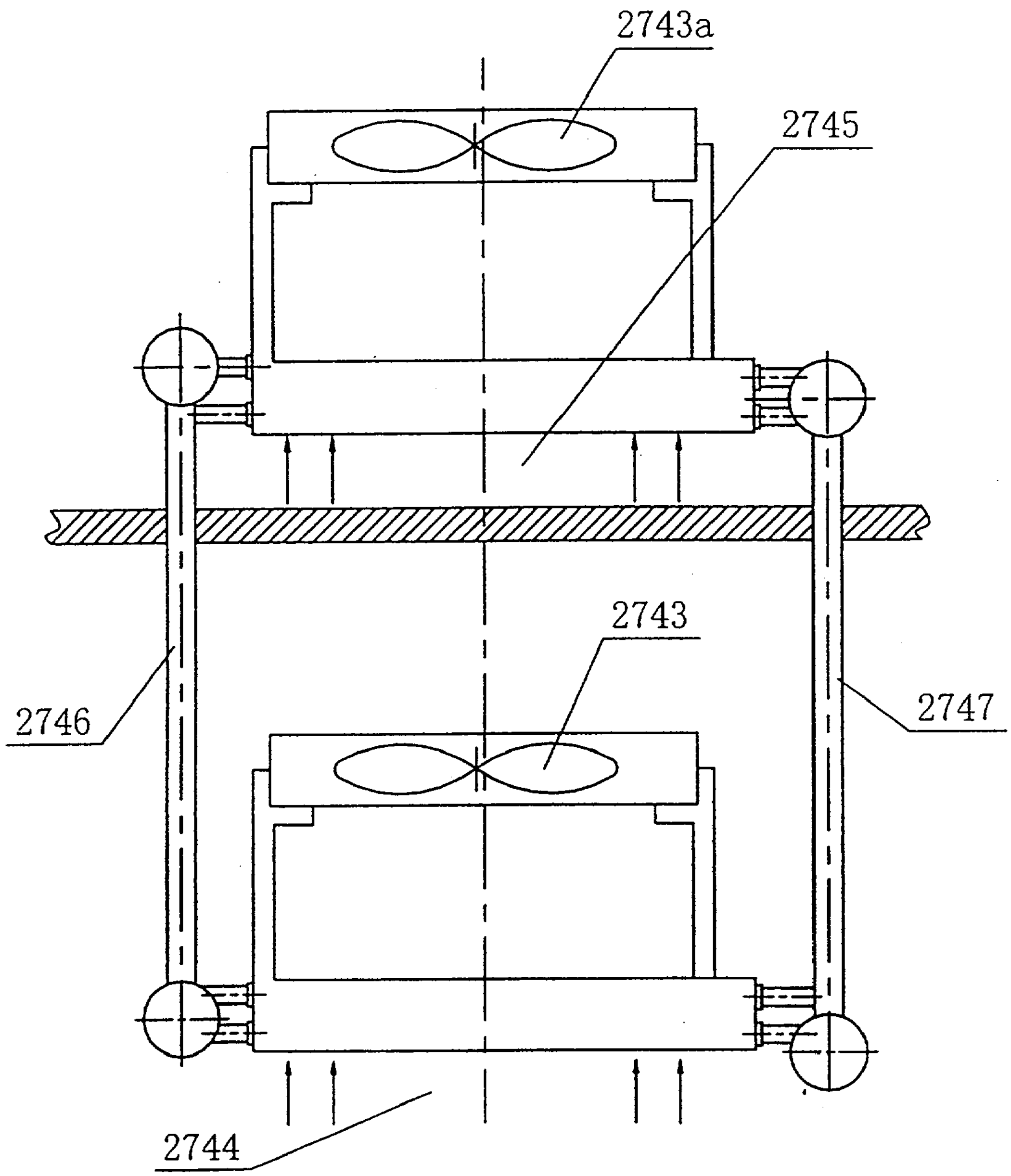
Figure 17Z:
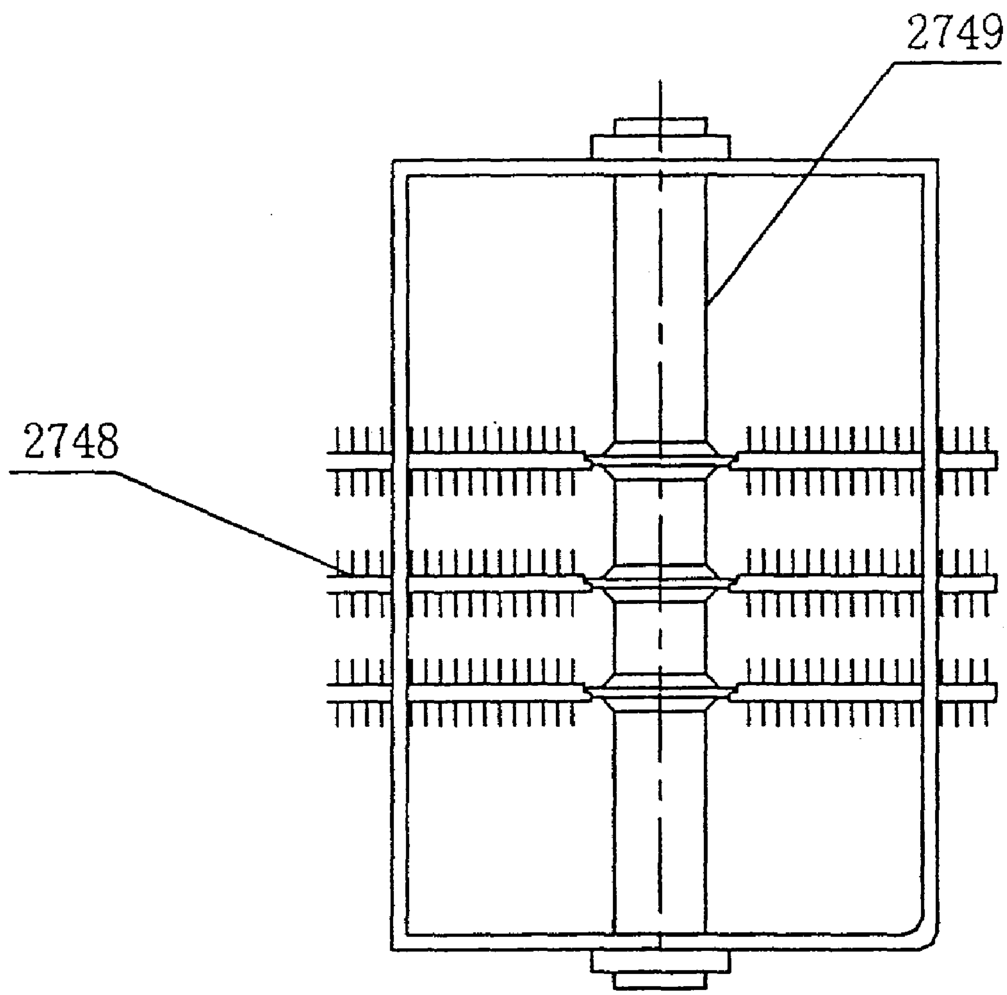
Figure 17Z:
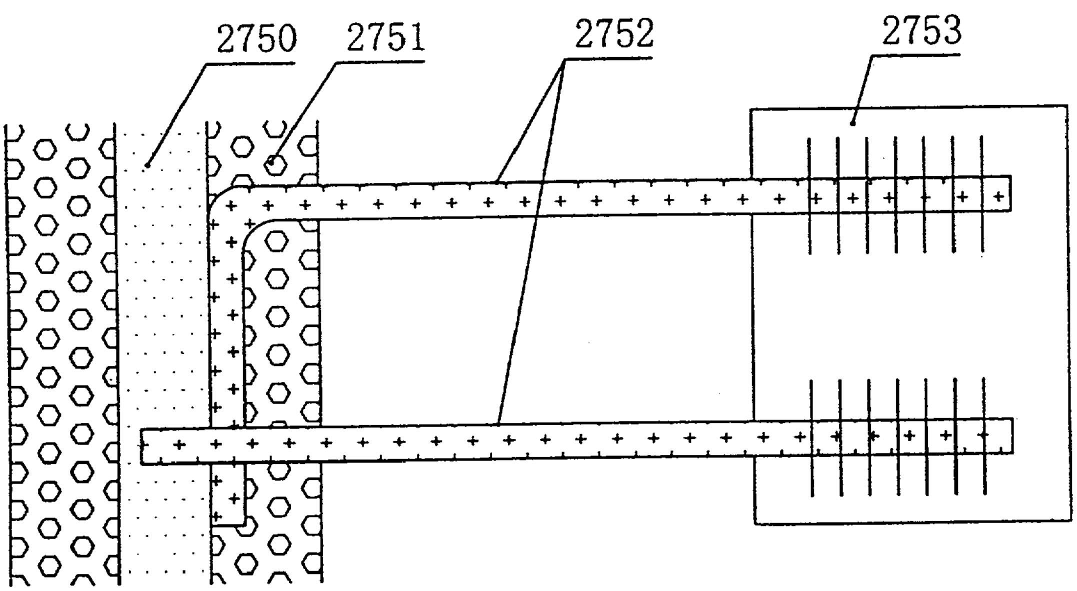
Figure 17Z:
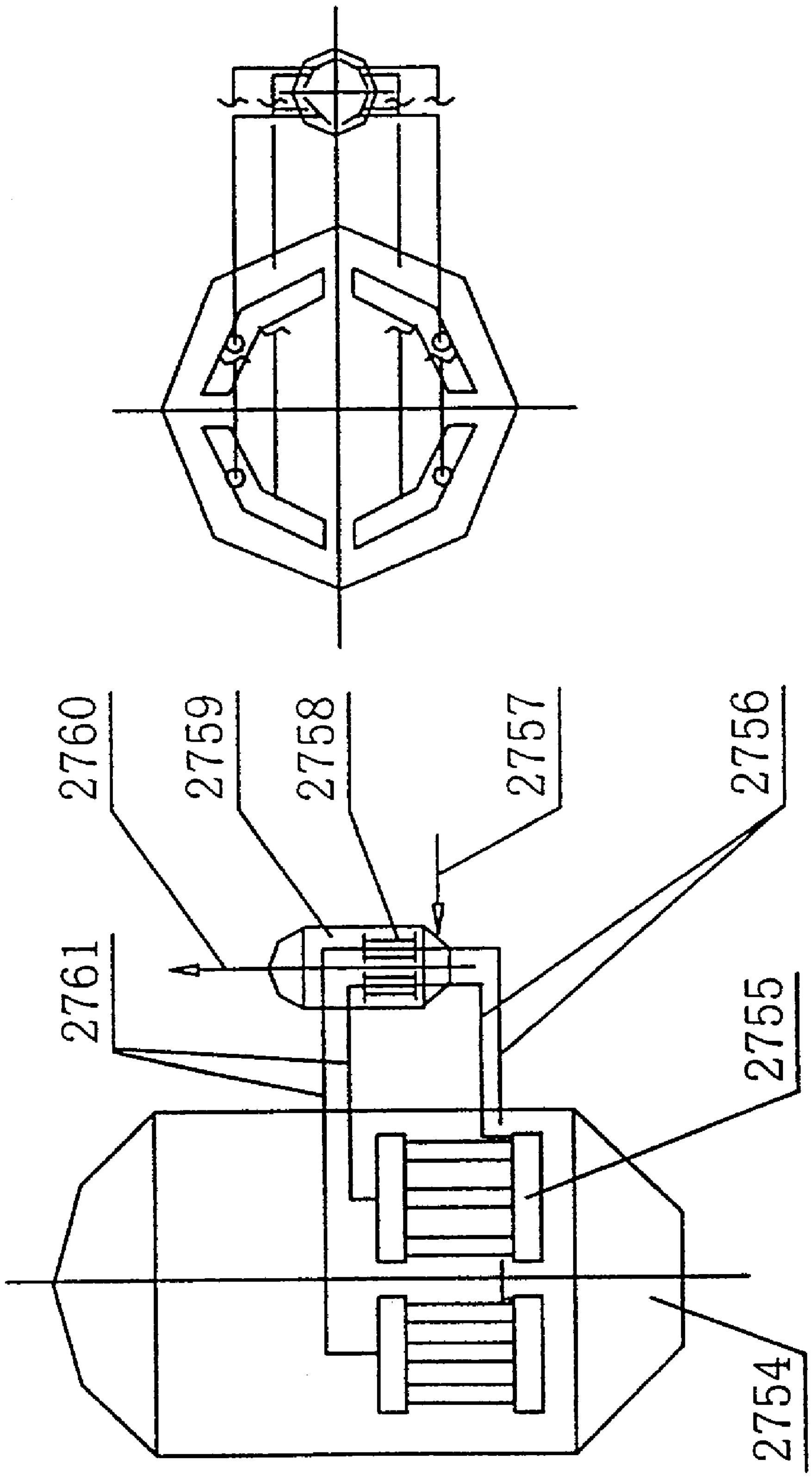
Figure 17Z:
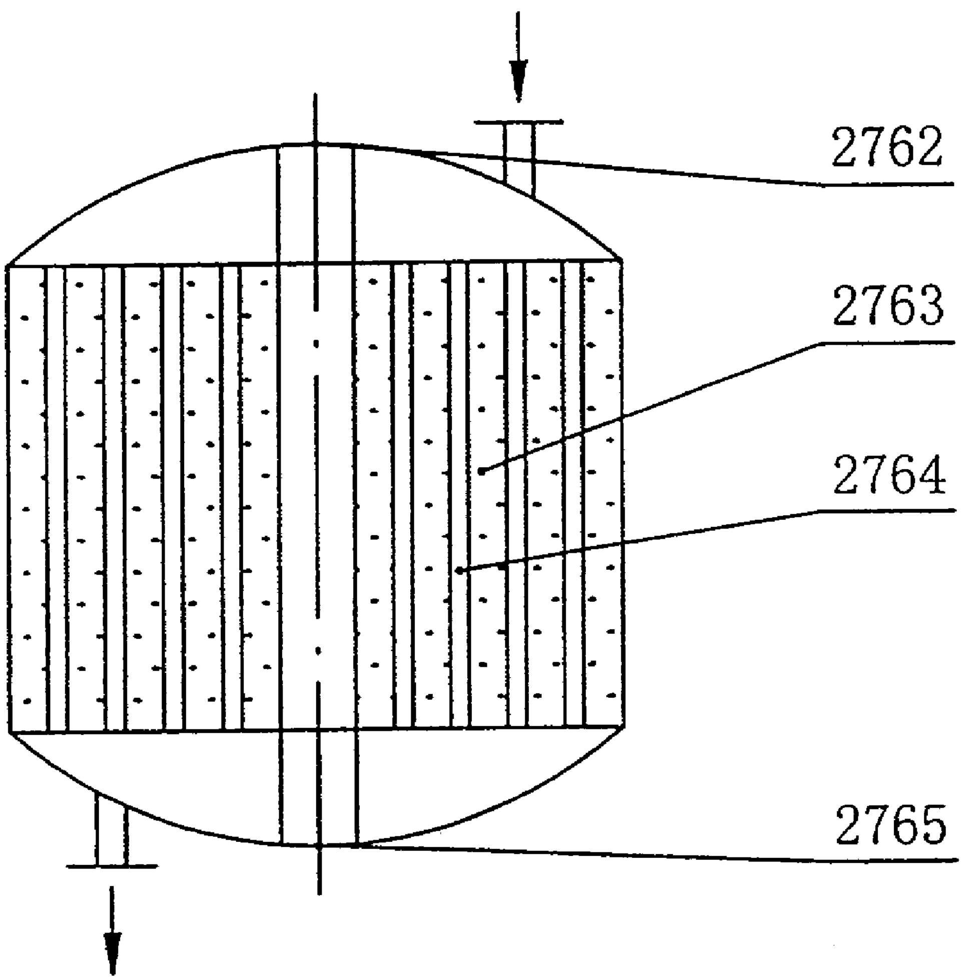
Figure 177L:
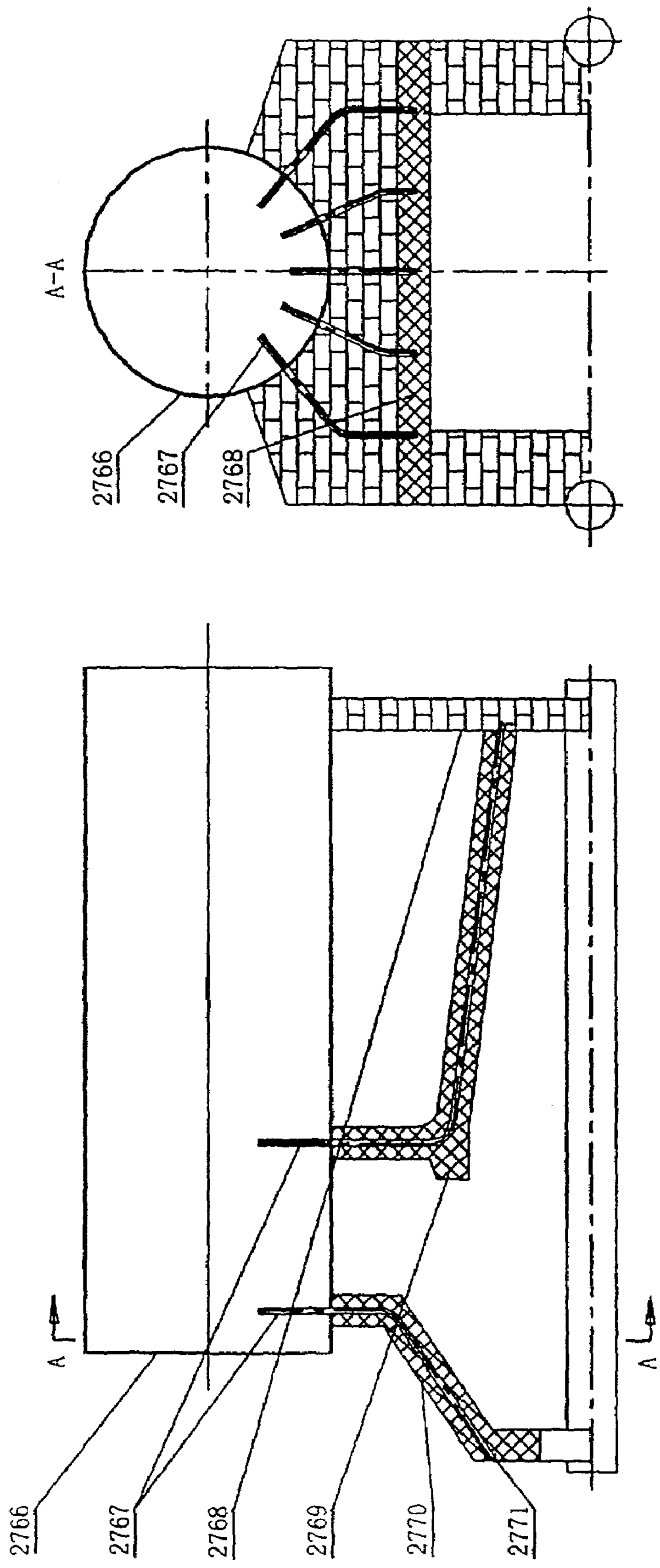
Figure 17Z:
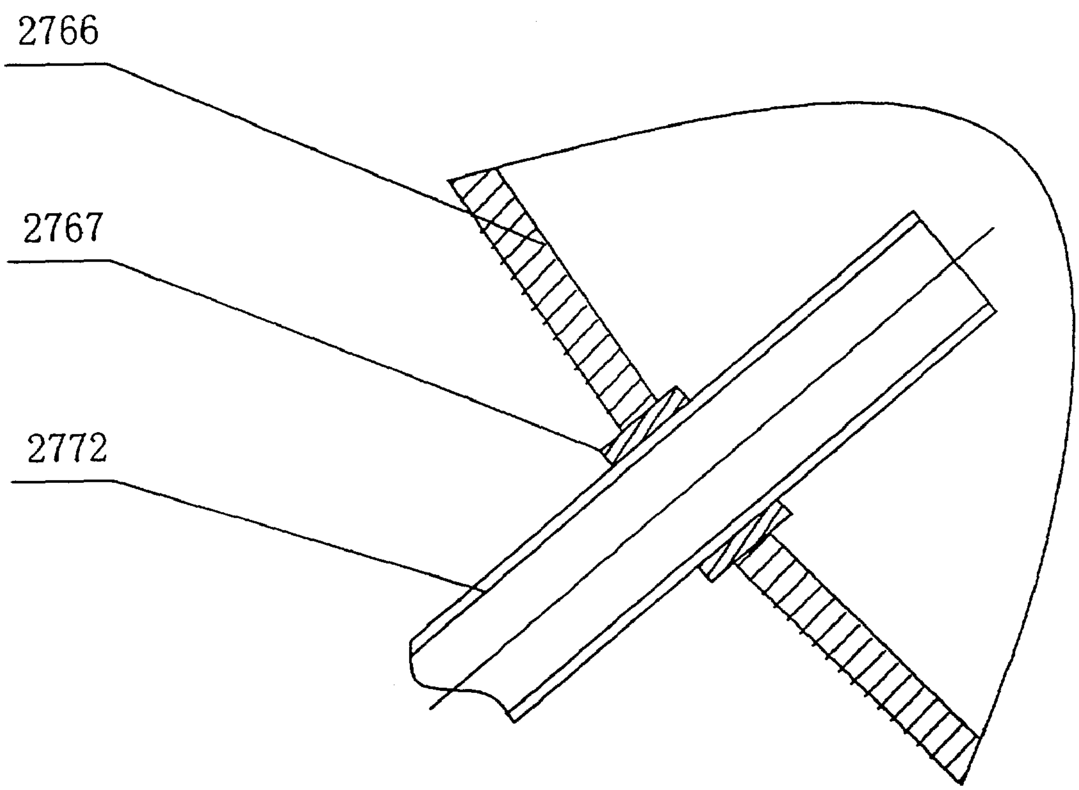

FIG. 17Z is a schematic view showing a diesel engine cooling system adopting the heat transfer elements.

FIG. 17ZA shows a bearing adopting the heat transfer elements.

FIG. 17ZB shows a cooling device for turbo chargers, adopting the heat transfer elements.

FIG. 17ZC is a schematic view showing a gasoline engine cooling system adopting the heat transfer elements.

FIG. 17ZD shows the heat pipe of a car radiator.

FIG. 17ZE shows the car radiator adopting the heat pipe shown in FIG. 17ZD.

FIG. 17ZF shows electronic equipment with a single pipe combination heat transfer exchanger installed on the top thereof.

FIG. 17ZG shows electronic equipment with a separated heat transfer exchanger installed on the top thereof.

FIG. 17ZH shows a mixing radiator adopting the heat transfer elements.

FIG. 17ZI shows a pressurized steam cooler adopting the heat transfer elements.

FIG. 17ZJ shows the structure of a high heat transfer heat absorbing brick.

FIG. 17ZK shows the structure of a high heat transfer, heat conducting non-crystal material preparing device.

FIG. 17ZL shows the furnace arc hanger of a high heat transfer furnace of the present invention.

FIG. 17ZM shows the connection between a heat transfer pipe and a boiler drum.

Figure 18B:
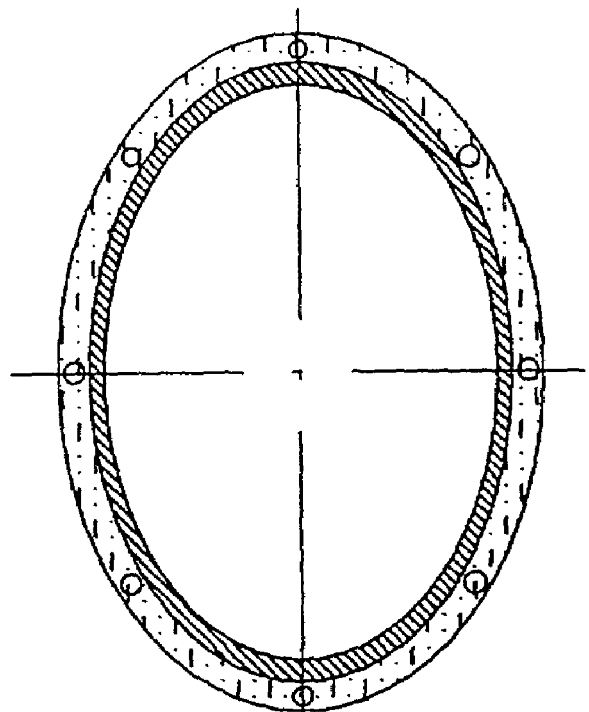
Figure 18A:
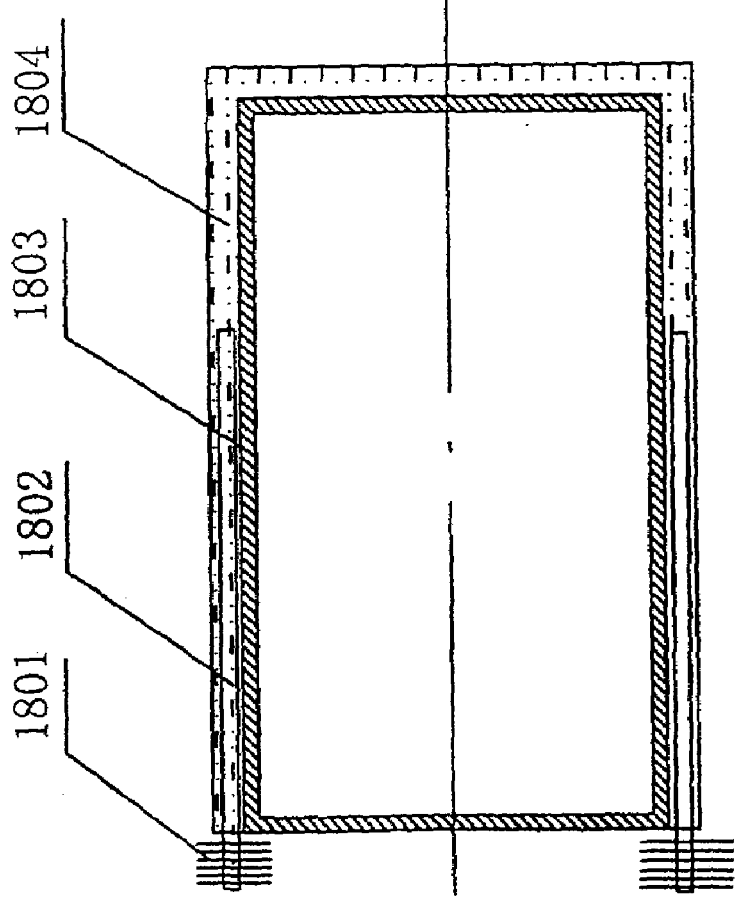

FIG. 18A shows a vehicle oil tank cooler adopting the heat transfer elements.

FIG. 18B is a cross-sectional view showing the oil tank in FIG. 18A.

Figure 18C:
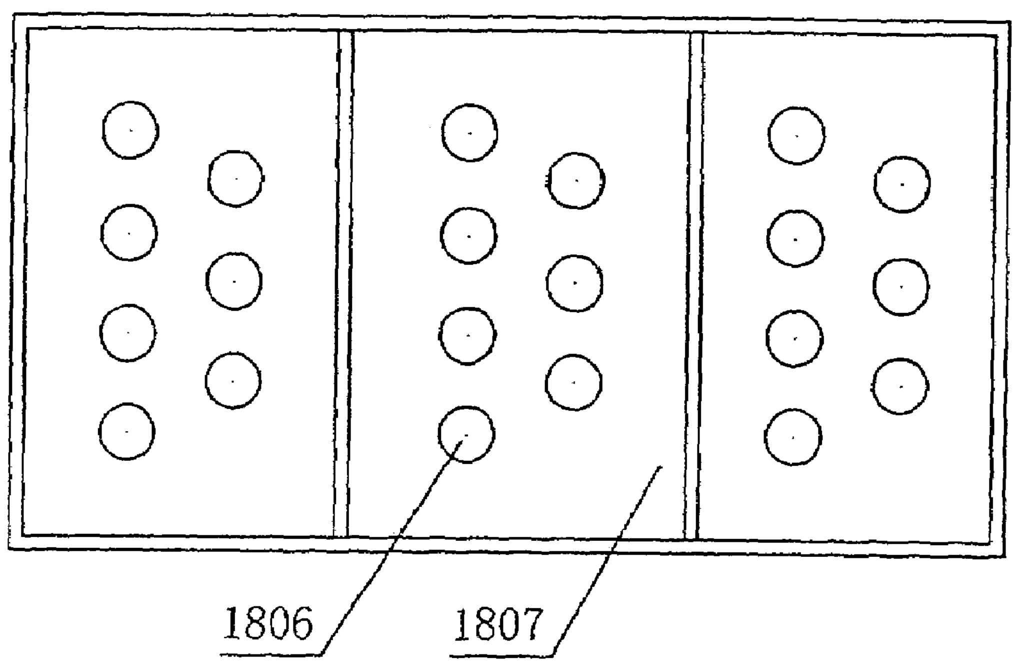

FIG. 18C is an elevational view of a high heat transfer distributed cement radiator.

Figure 18D:
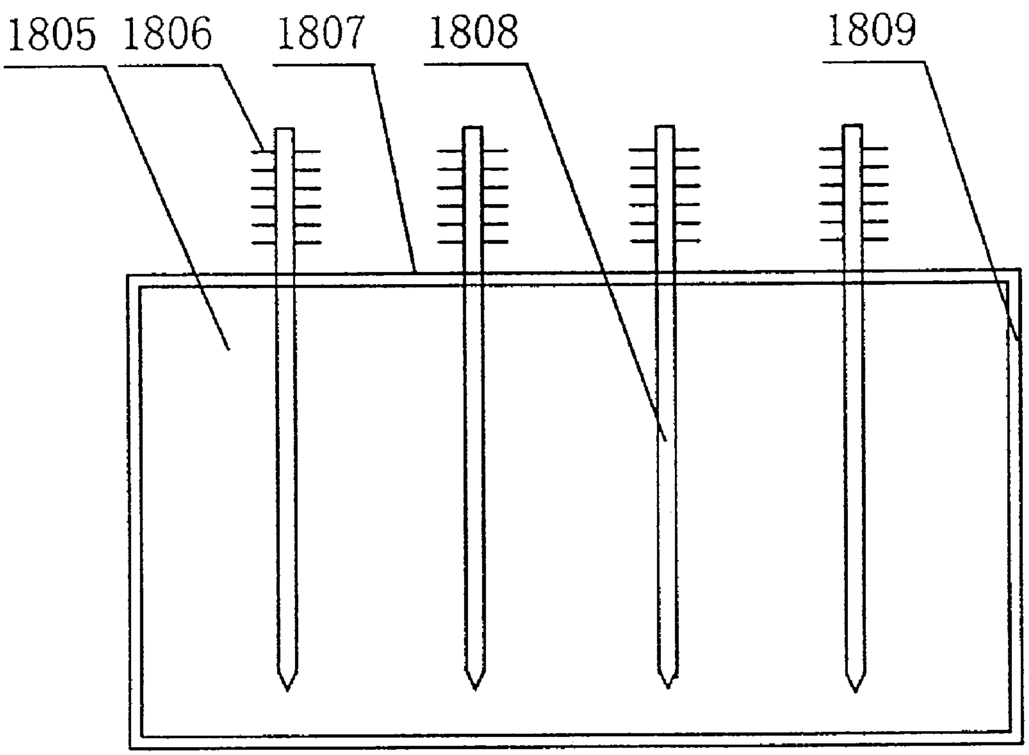

FIG. 18D is a front view of a high heat transfer distributed cement radiator.

Figure 18E:
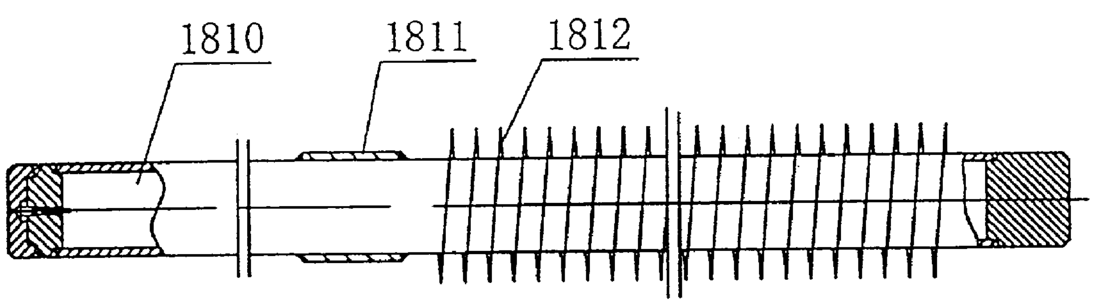

FIG. 18E shows the structure of a heat transfer pipe for plate radiators.

Figure 18F:
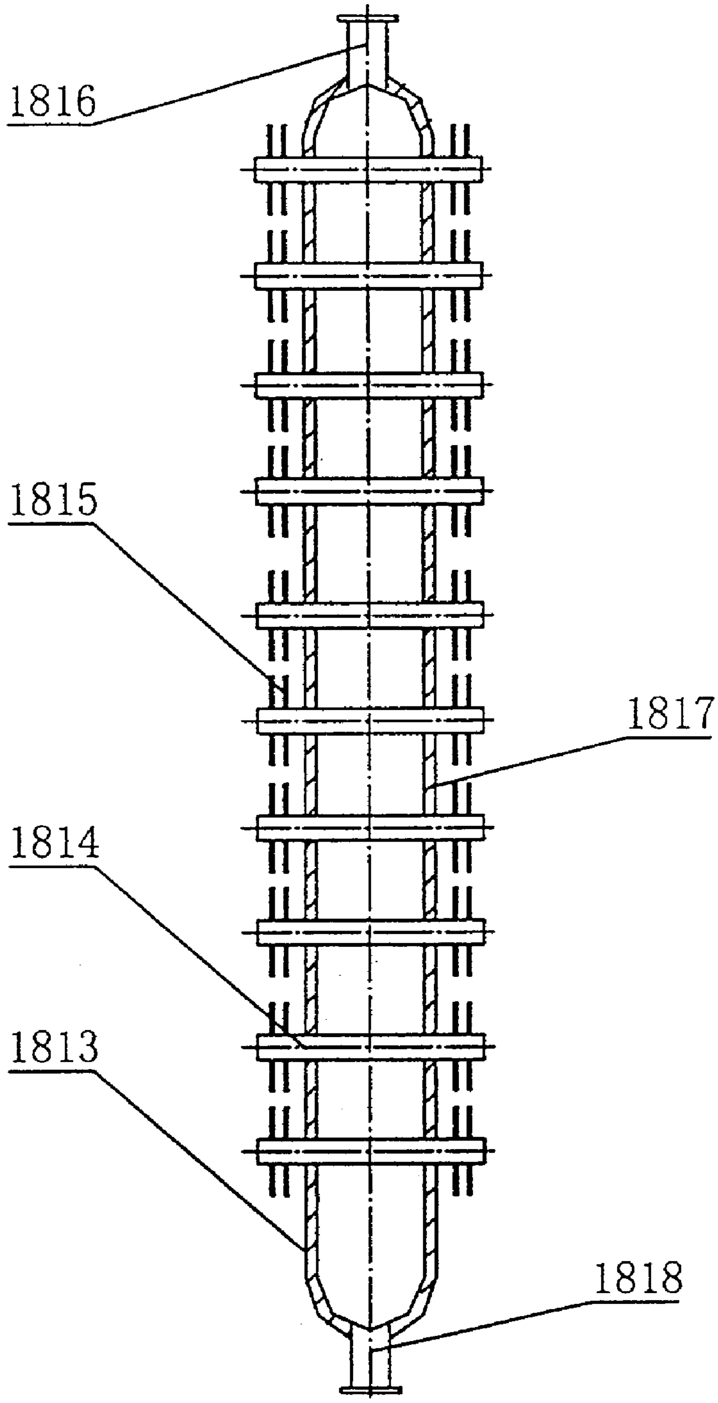

FIG. 18F shows a front view of the plate radiator adopting the heat transfer pipe in FIG. 18E.

Figure 18G:
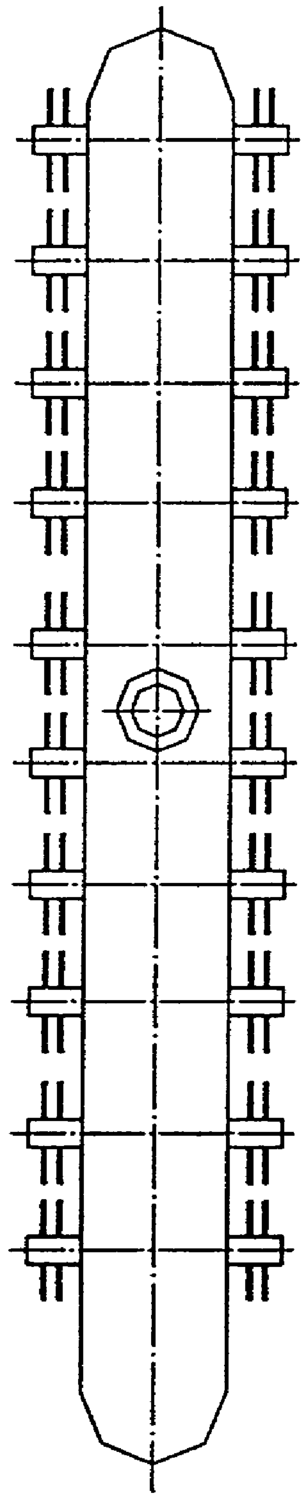

FIG. 18G shows a top view of the plate radiator adopting the heat transfer pipe in FIG. 18E.

Figure 19A:
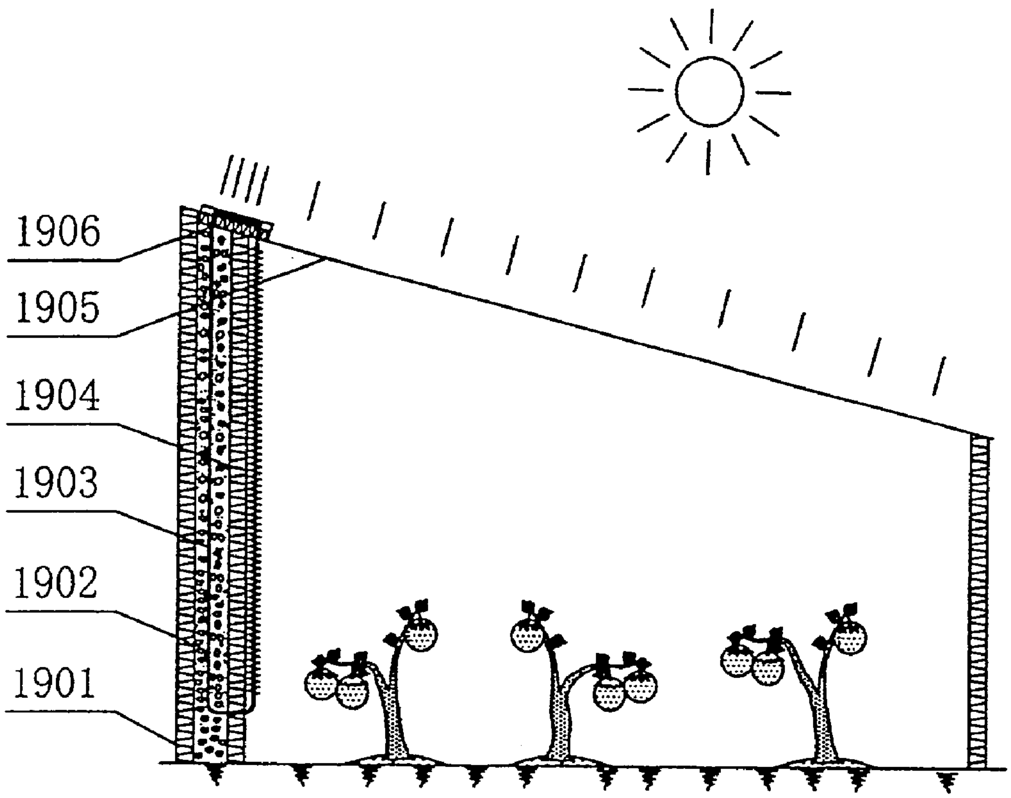

FIG. 19A is a schematic view showing an inorganic high heat transfer-pebble heat-accumulation circulation system.

Figure 19B:
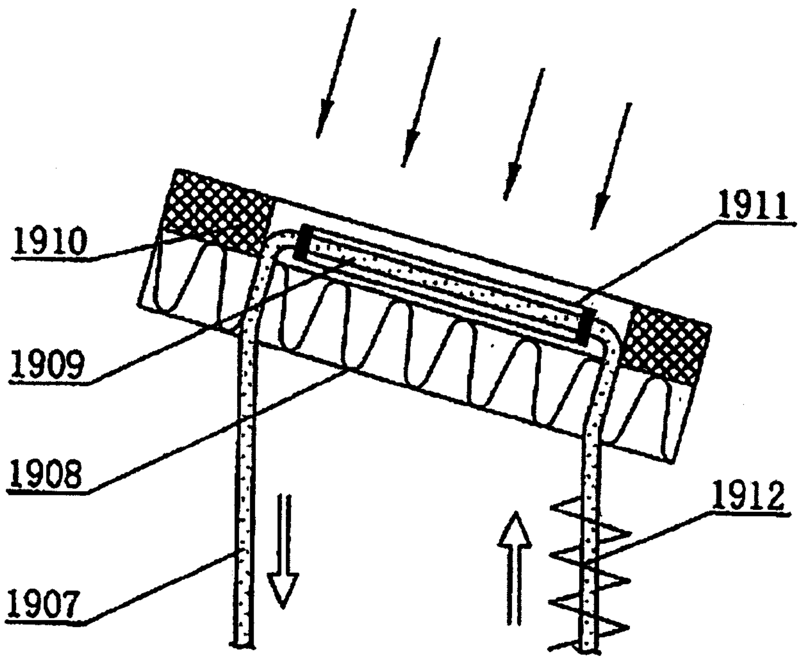

FIG. 19B shows the solar collector in the pebble heat-accumulation circulation system in FIG. 19A.

Figure 19C:
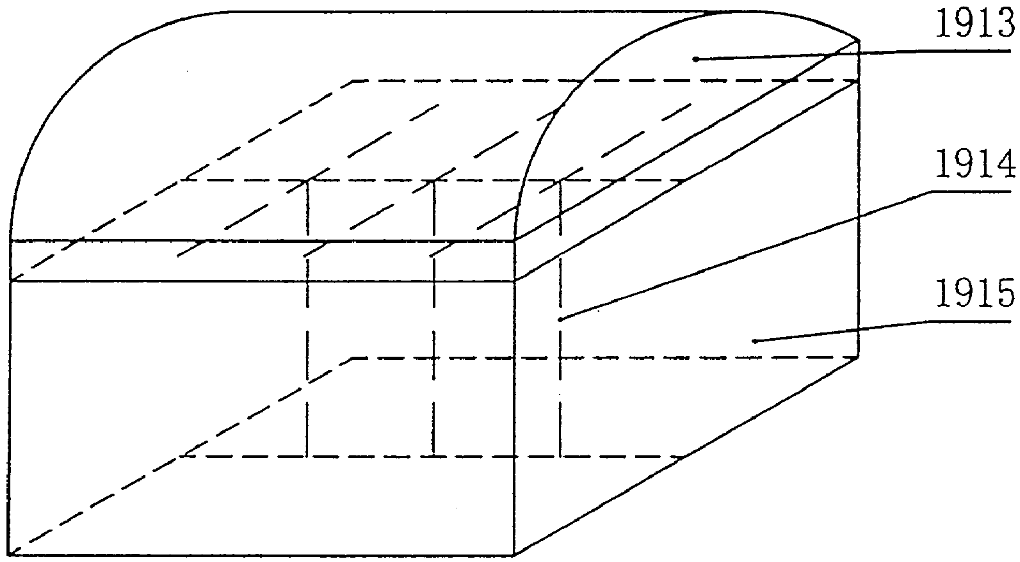

FIG. 19C is a schematic view showing an inorganic high heat transfer agricultural plastic tent heating system according to the present invention.

Figure 20A:
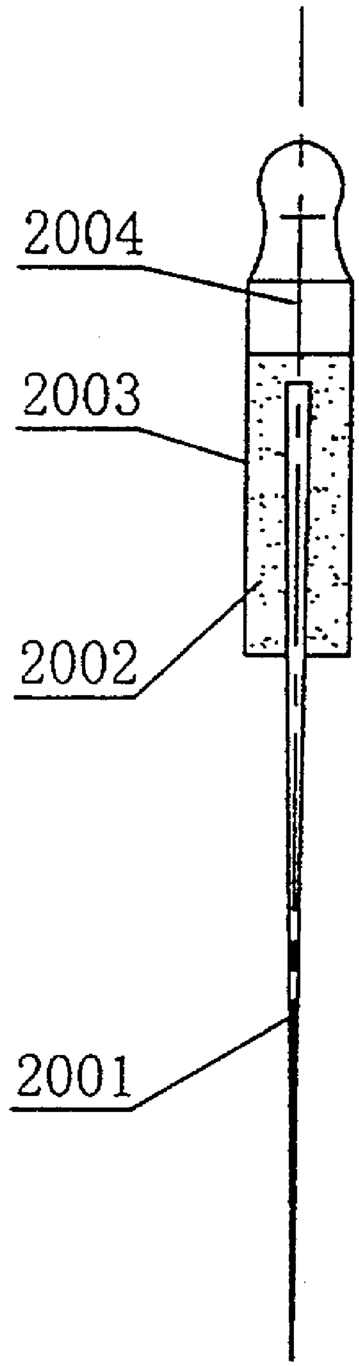

FIG. 20A is a schematic view showing an ordinary inorganic heat transfer hot/cold acupuncturing instrument according to the present invention.

Figure 20B:
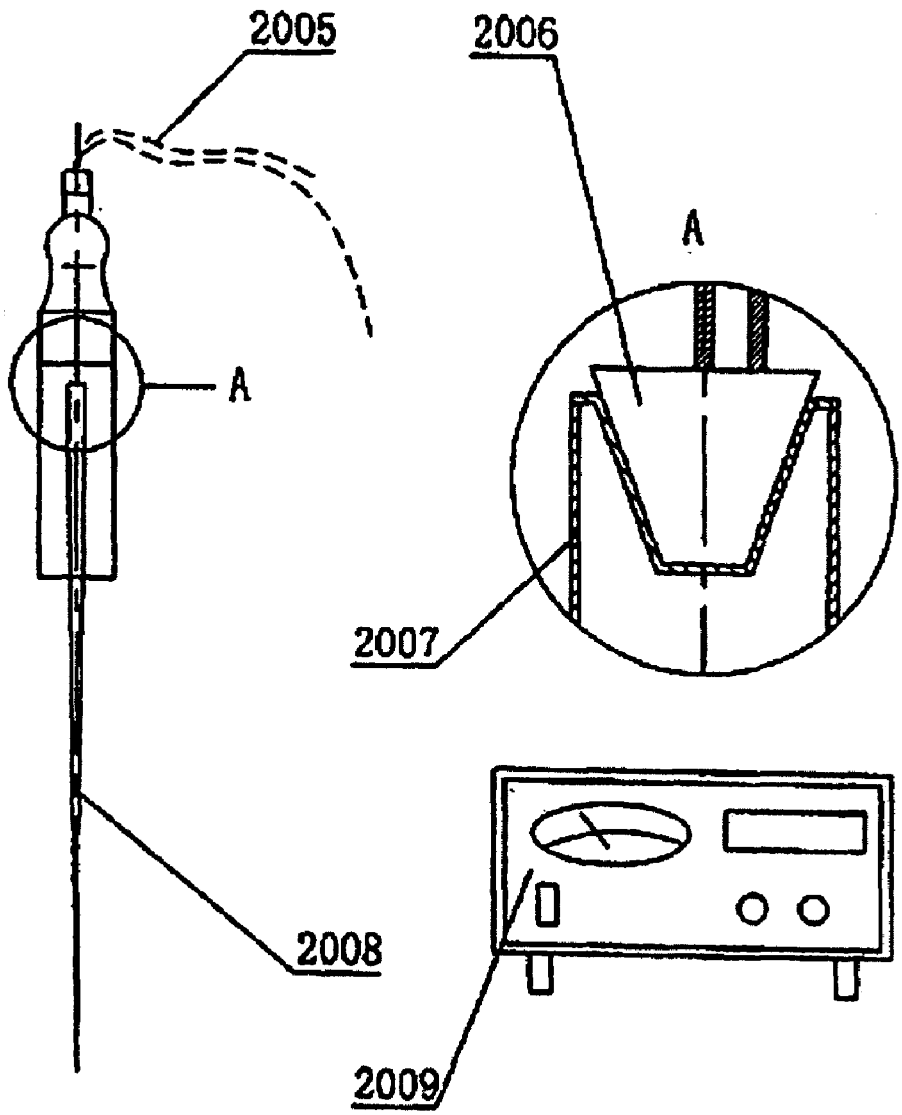

FIG. 20B is a schematic drawing of an electric-heating inorganic heat transfer hot/cold acupuncturing instrument with a controller according to the present invention.

Figure 20C:
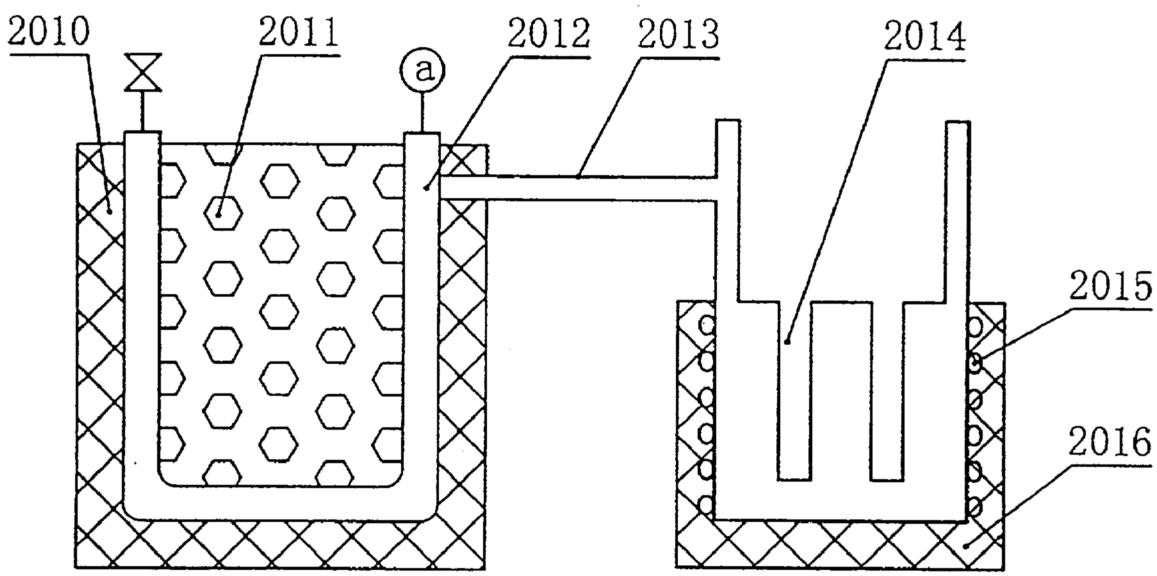

FIG. 20C shows the structure of an inorganic heat transfer target furnace according to the present invention.

Figure 20D:
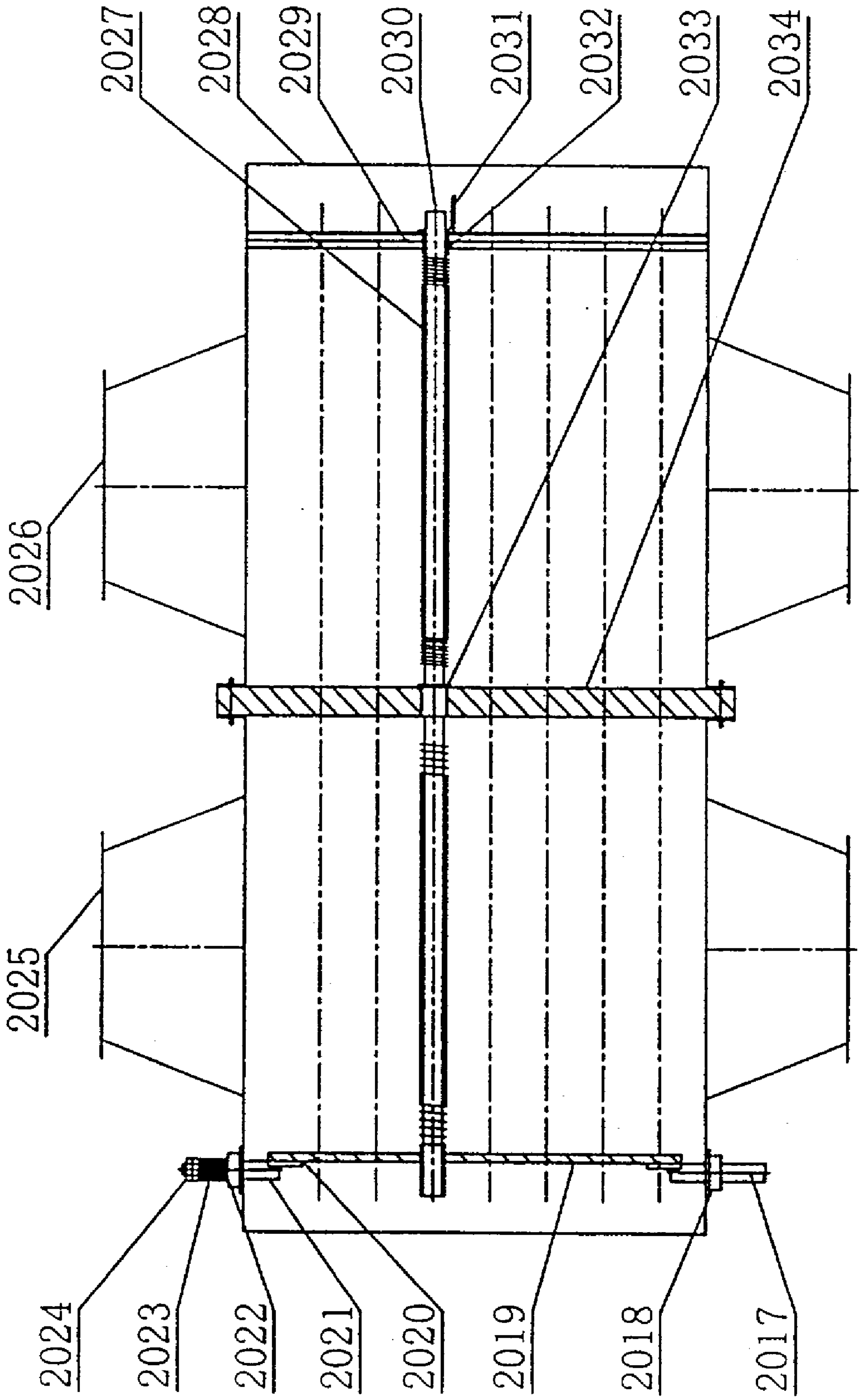

FIG. 20D shows the structure of an inorganic heat transfer dust removing heat exchanger according to the present invention.

Figure 20E:
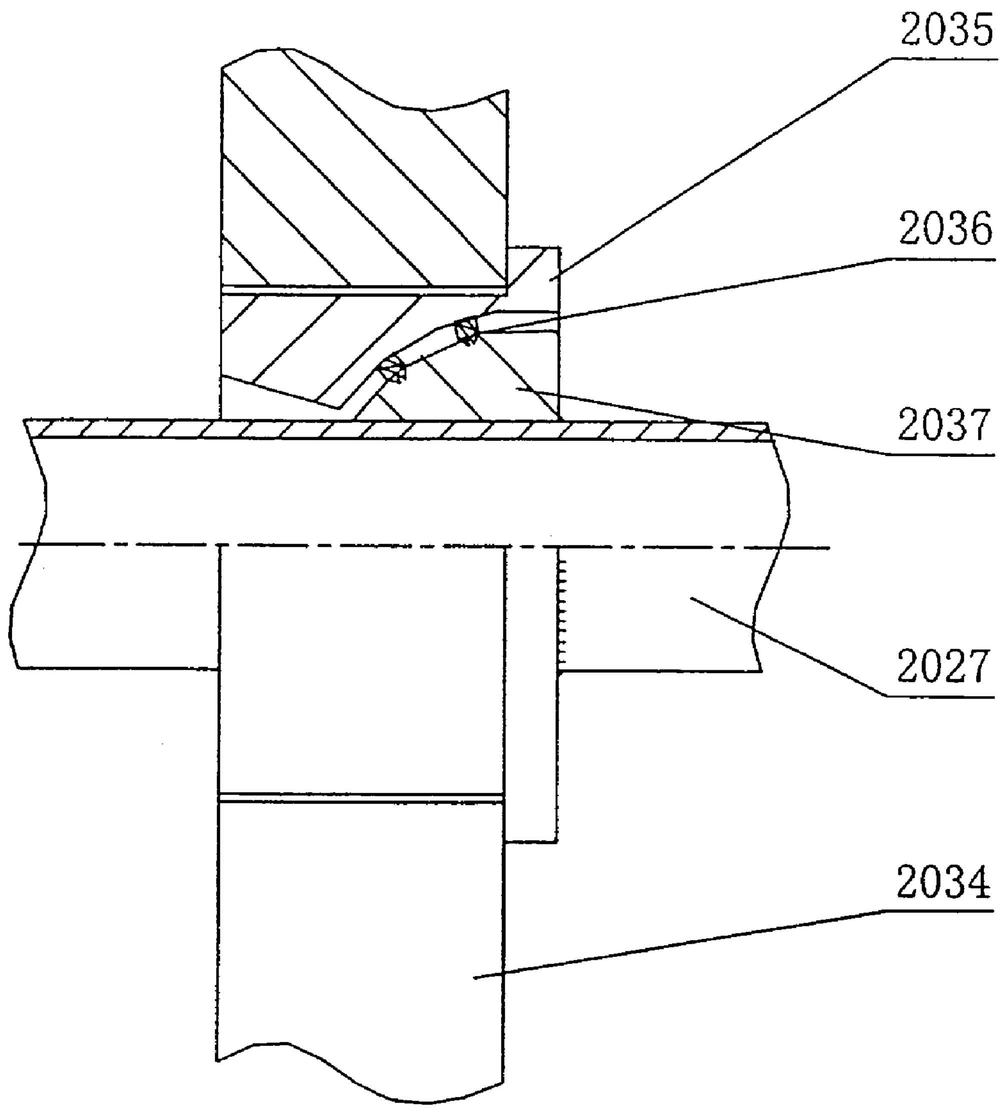

FIG. 20E shows the structure of the spherical closure used in FIG. 20D.

Figure 21A:
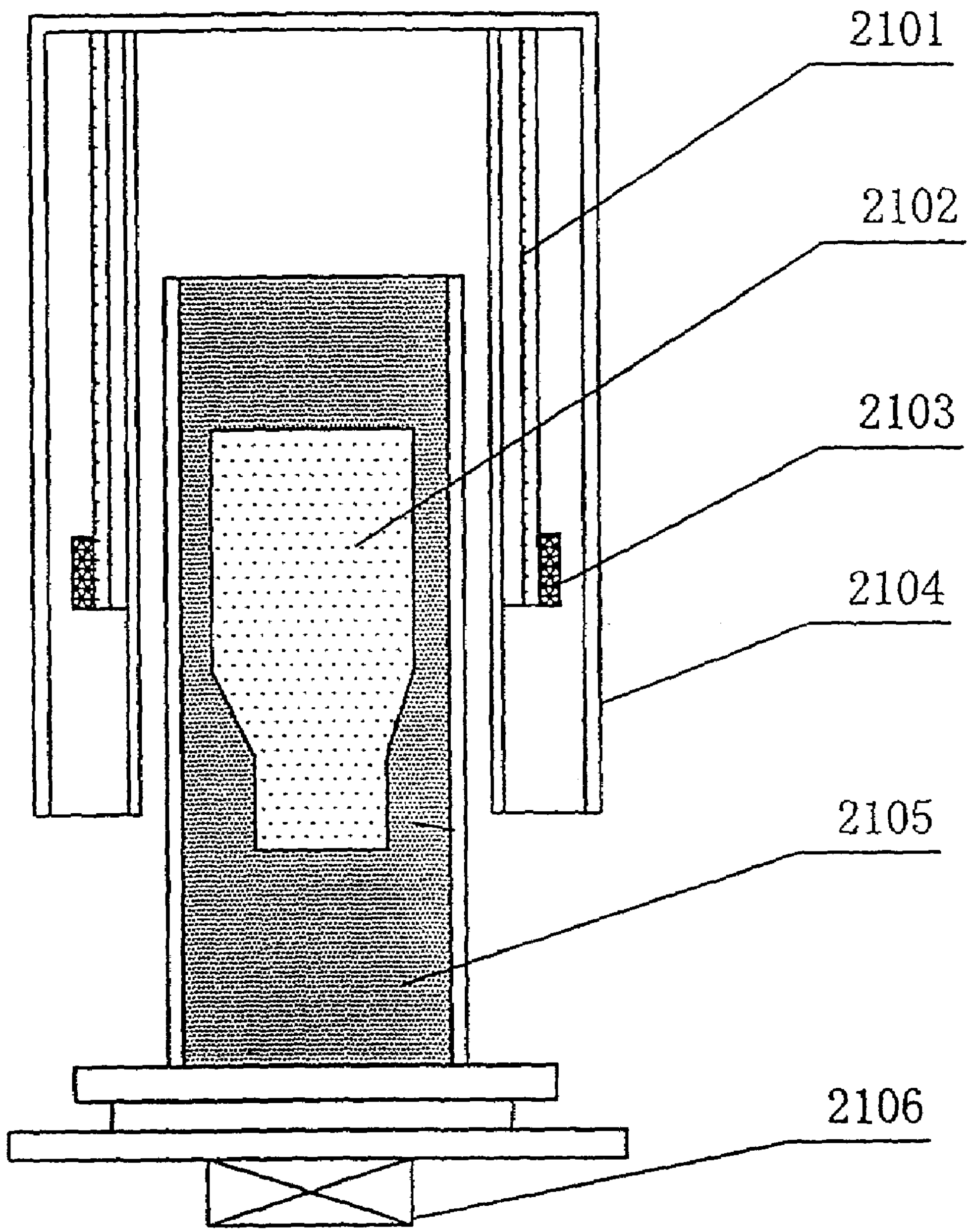

FIG. 21A shows the structure of an inorganic heat transfer crystal growing thermostat box according to the present invention.

Figure 21B:
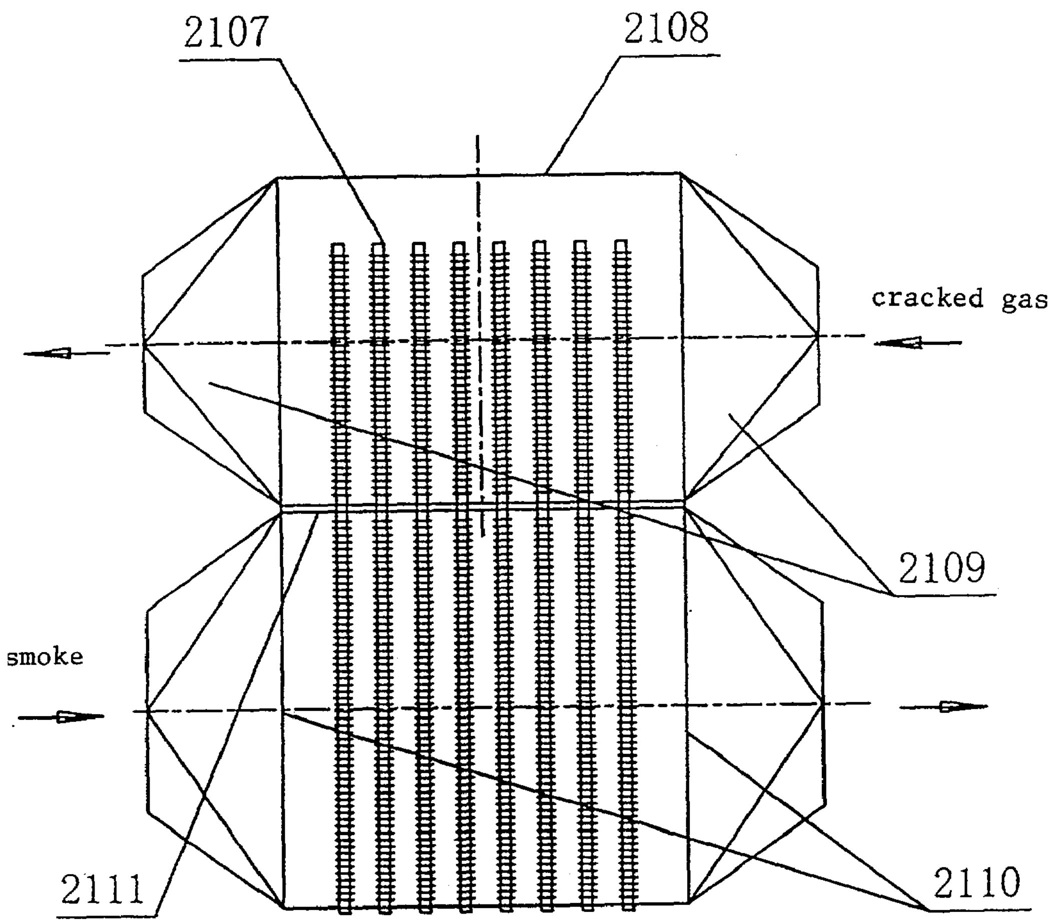

FIG. 21B shows a perspective view of heat transfer pipe element according to the present invention.

Figure 21C:
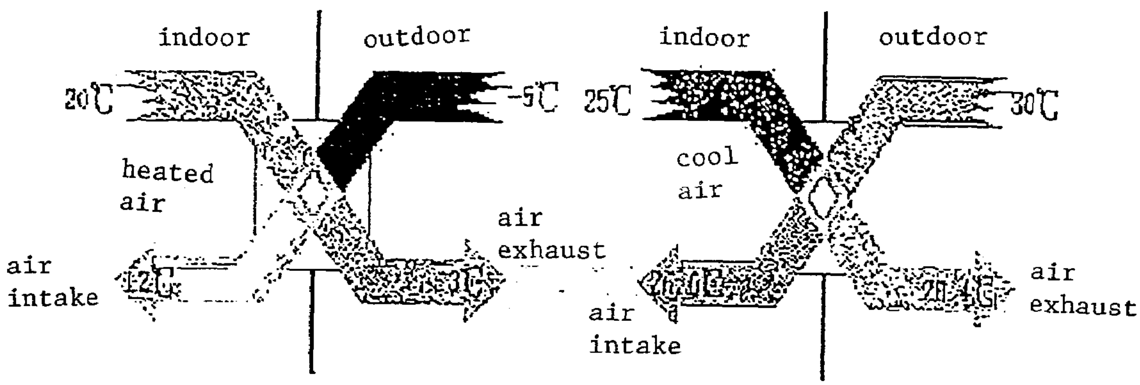

FIG. 21C is a schematic view showing a home energy-saving ventilation system according to the present invention.

Figure 21D:
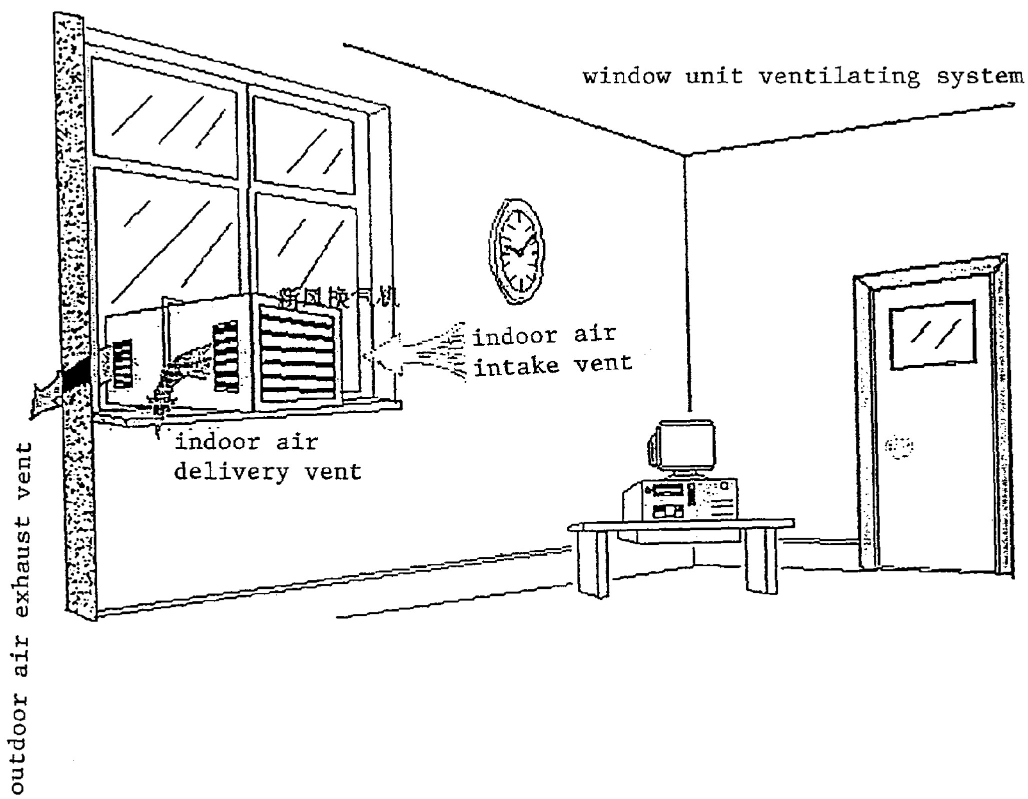

FIG. 21D is a schematic view showing the installation and operation of the home energy-saving ventilation system according to the present invention.

Figure 21E:
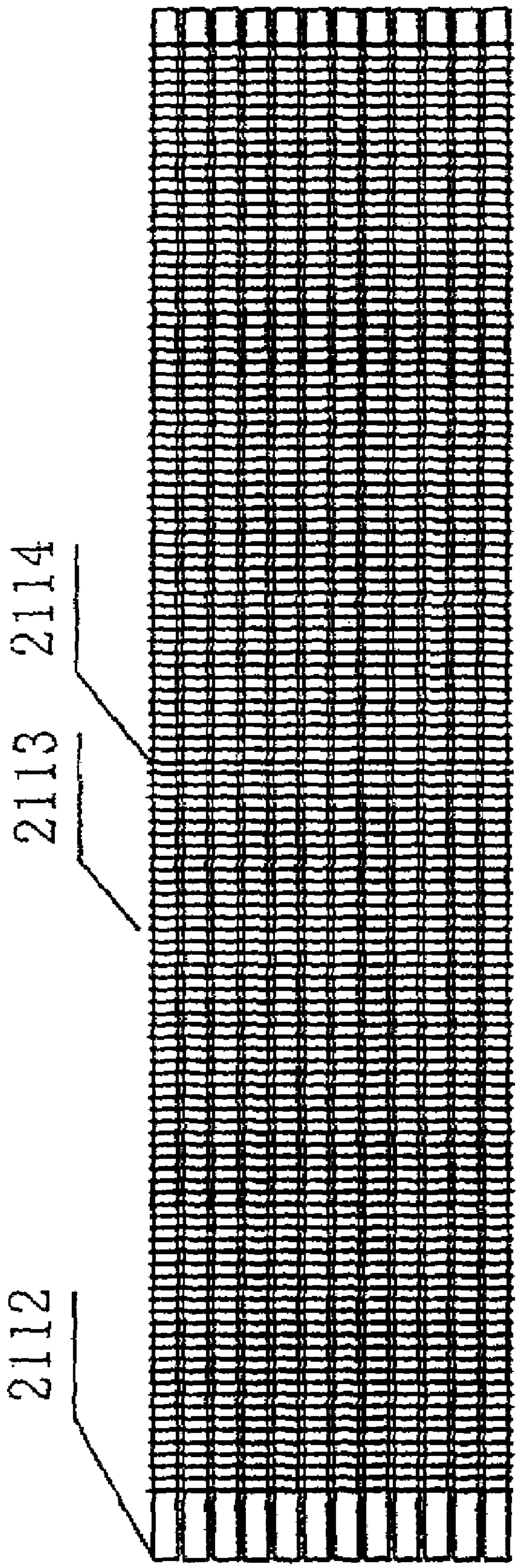

FIG. 21E is a partially sectional view of an inorganic heat transfer enclosed radiator for electronic controllers.

Figure 21F:
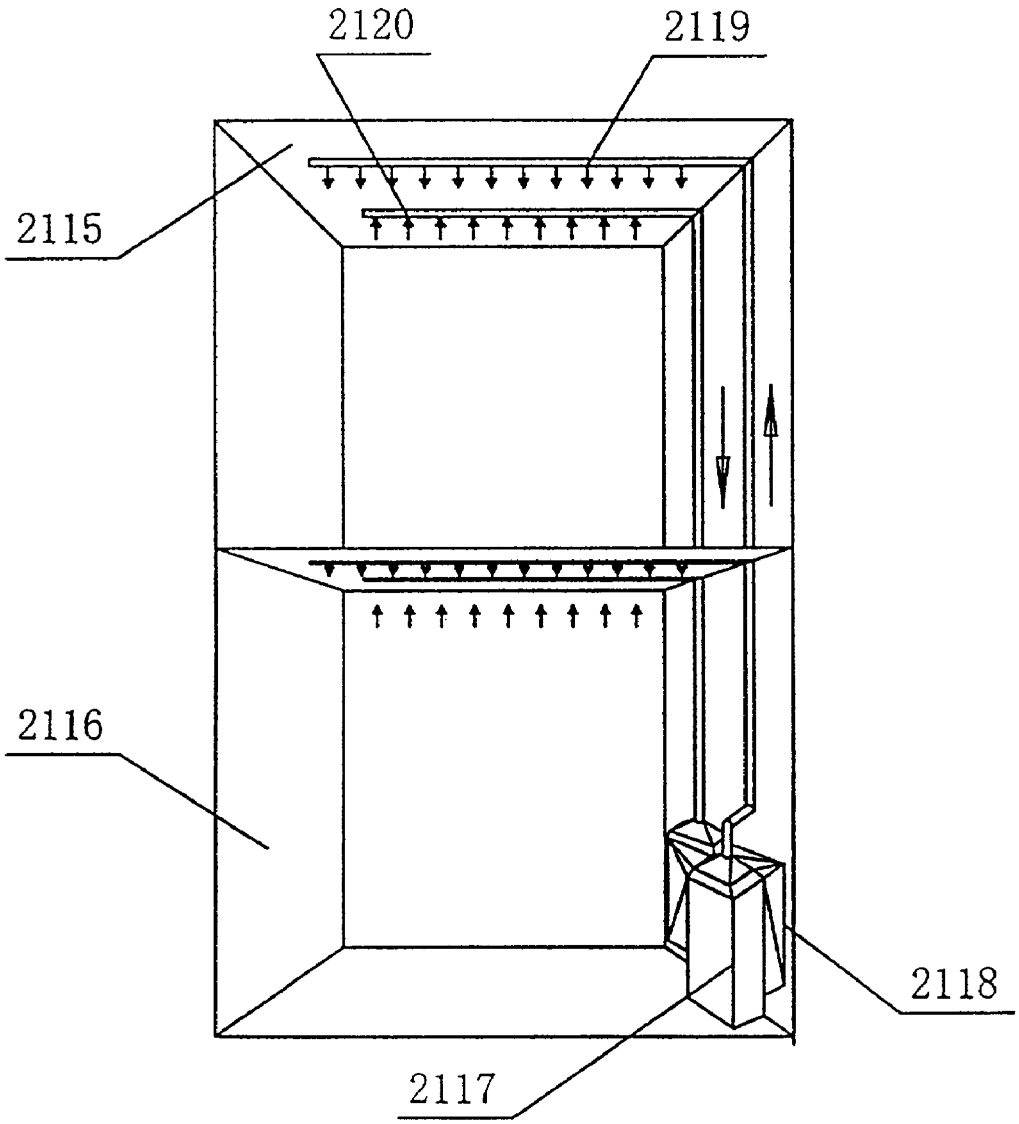

FIG. 21F is a schematic view showing a building energy-saving ventilation system according to the present invention.

Figure 21G:
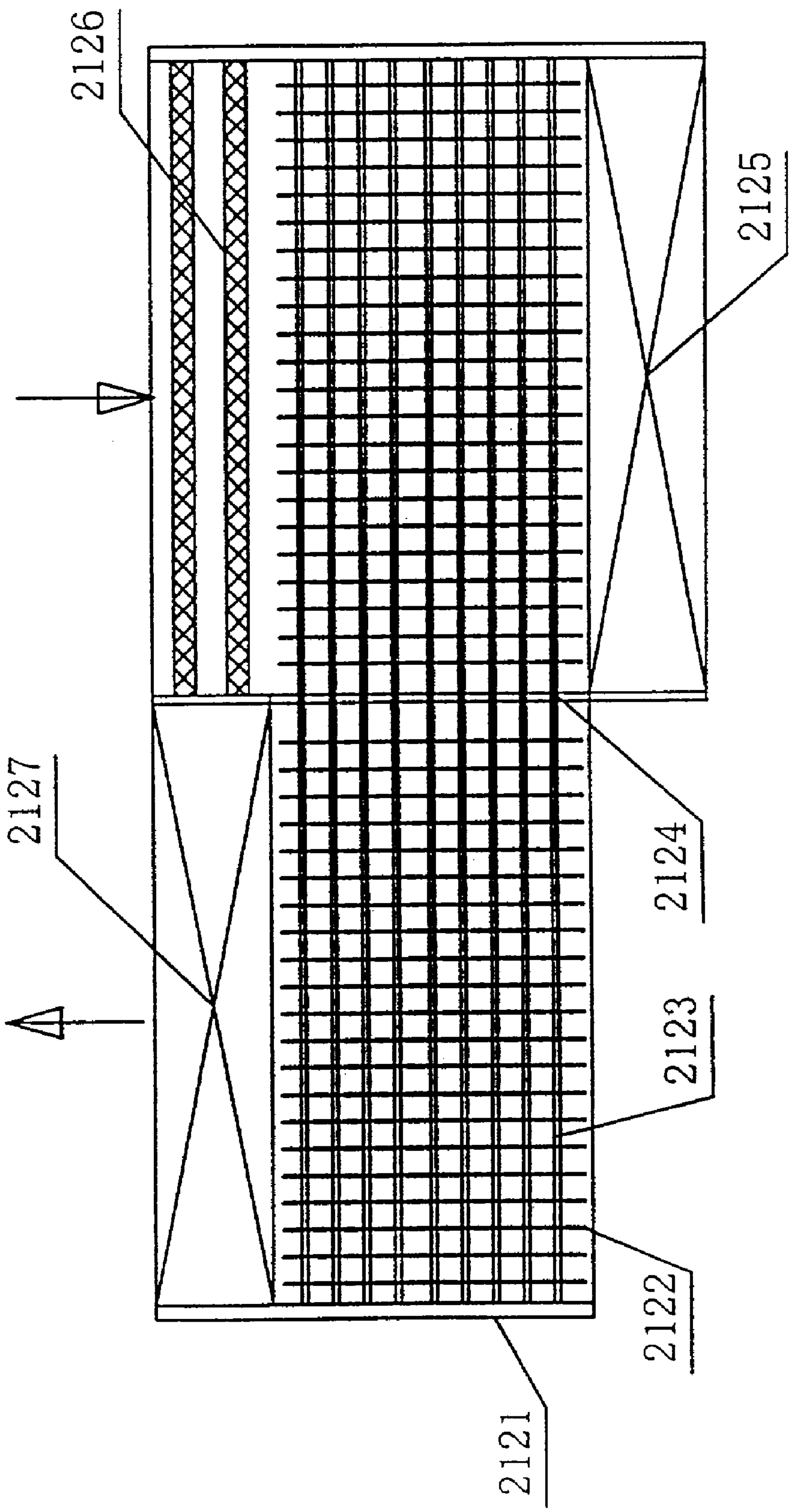

FIG. 21G shows the arrangement of heat transfer elements in the ventilation system according to the present invention.

Figure 21H:
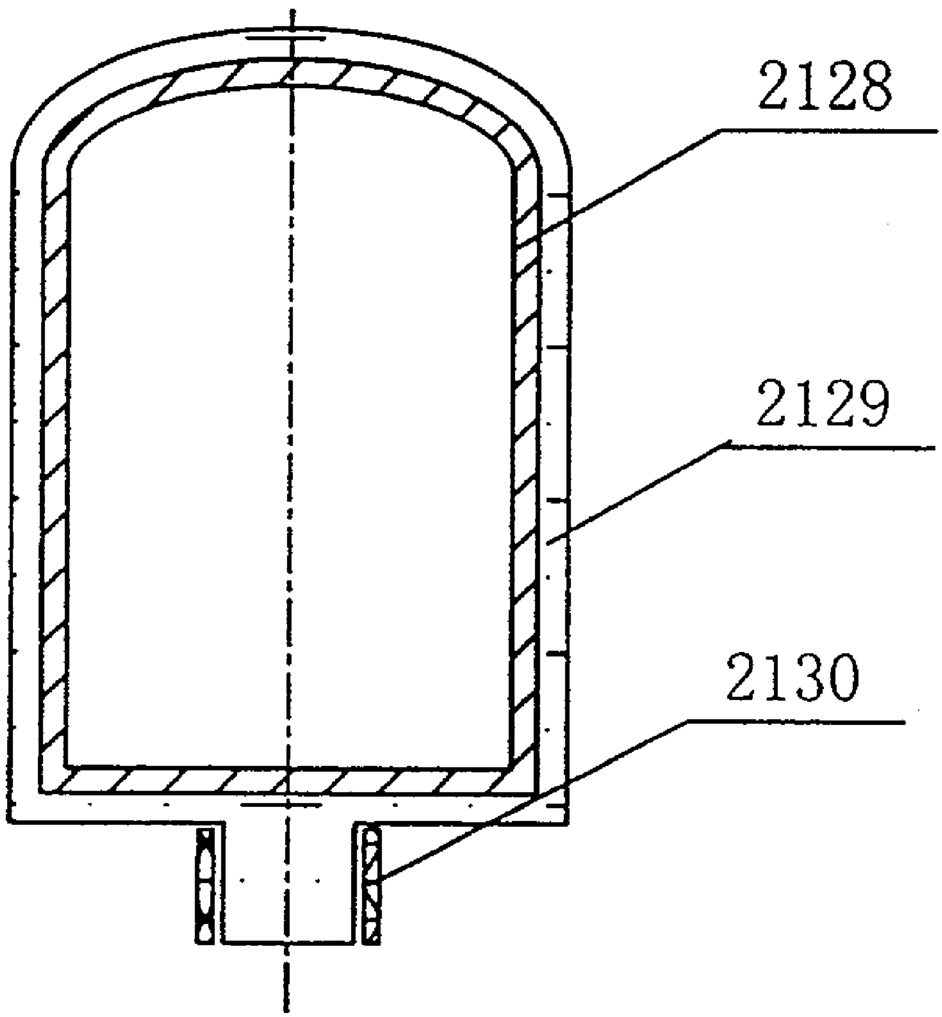

FIG. 21H shows the structure of an inorganic heat transfer fermentation thermostat controller according to the present invention.

Figure 21I:
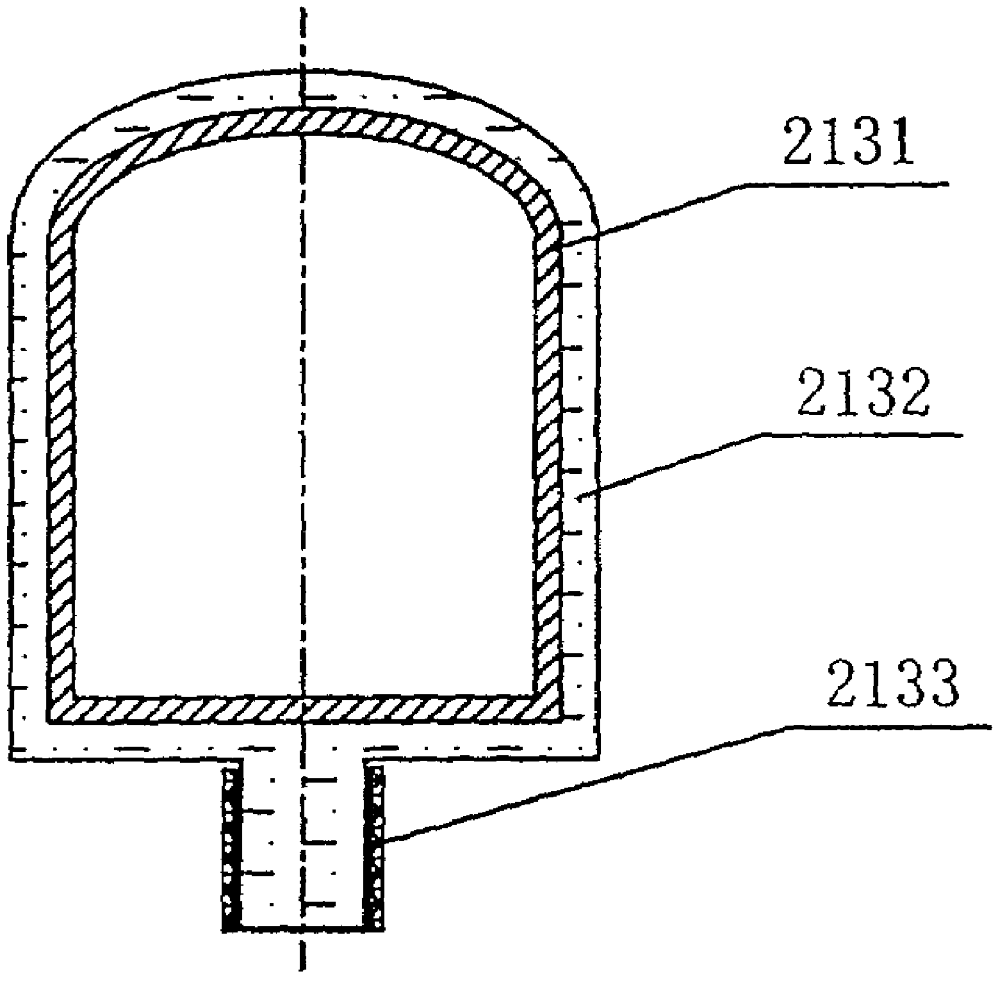

FIG. 21I shows the structure of an inorganic heat transfer biotechnological thermostat device according to the present invention.

Figure 21J:
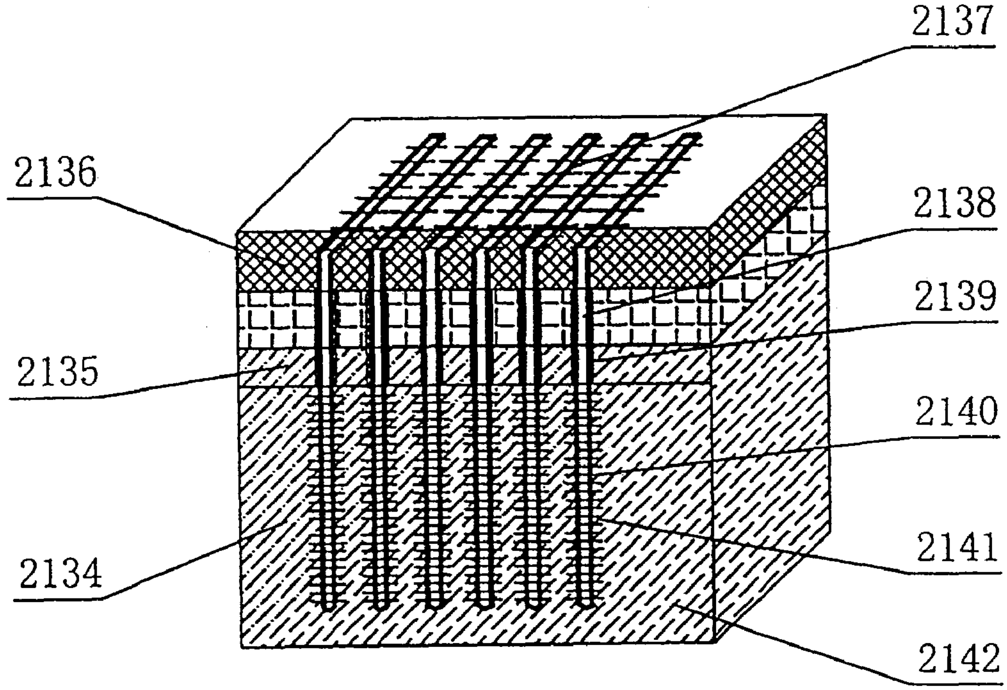

FIG. 21J shows an inorganic heat transfer non-freezing city according to the present invention.

Figure 21K:
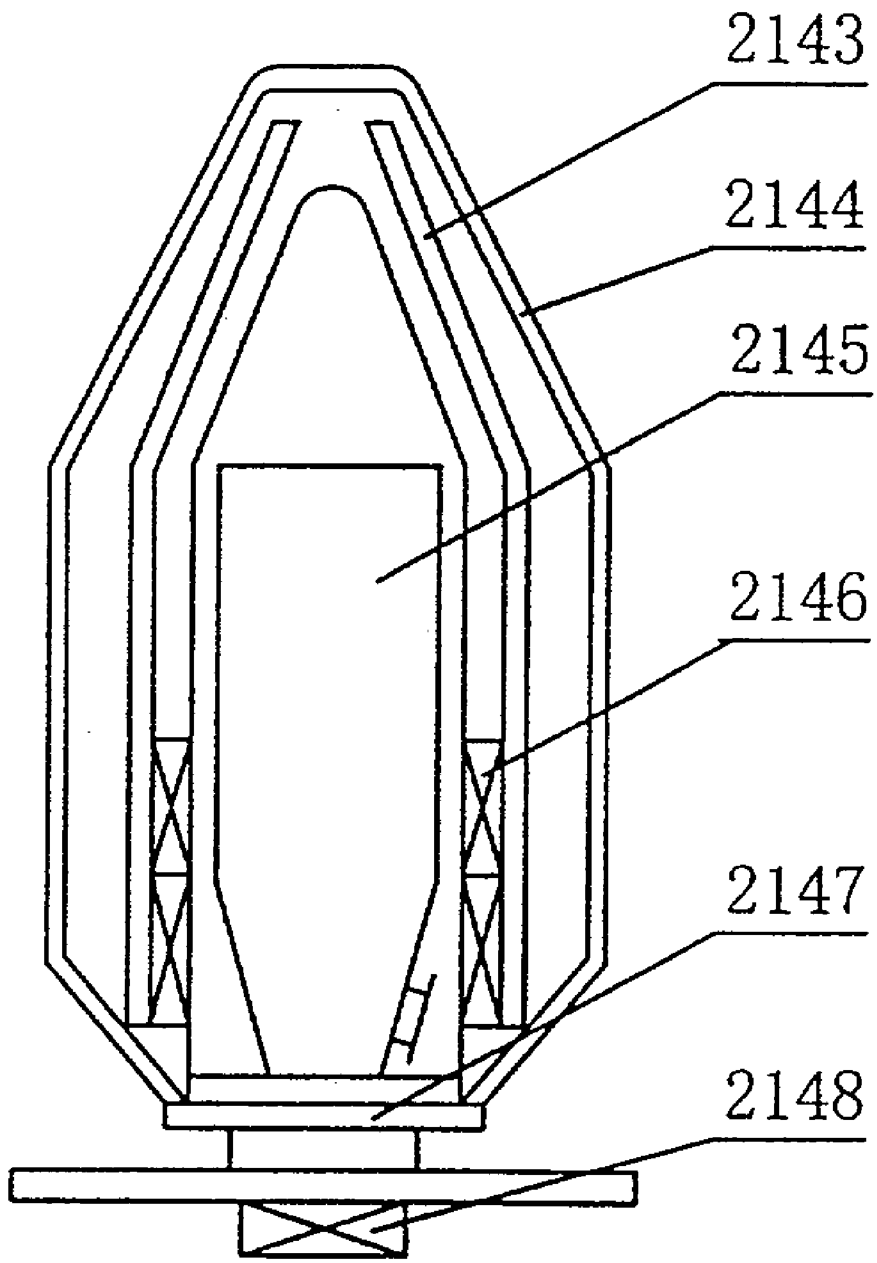

FIG. 21K shows the structure of an inorganic heat transfer quartz growing thermostat control box according to the present invention.

Figure 21L:
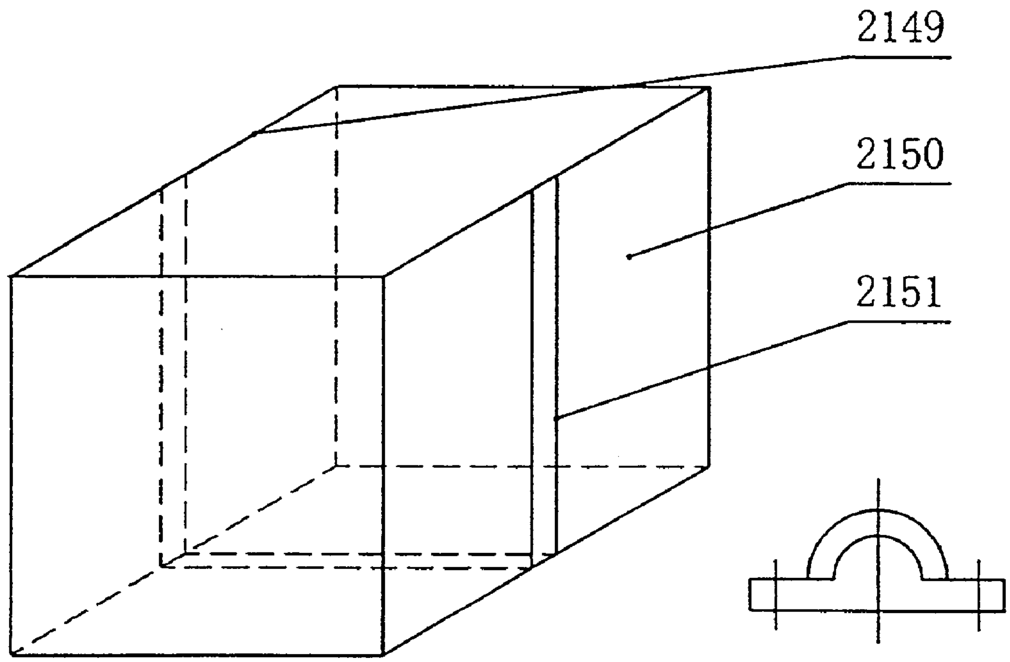

FIG. 21L shows the structure of an inorganic heat transfer star thermostat device according to the present invention.

Figure 21M:
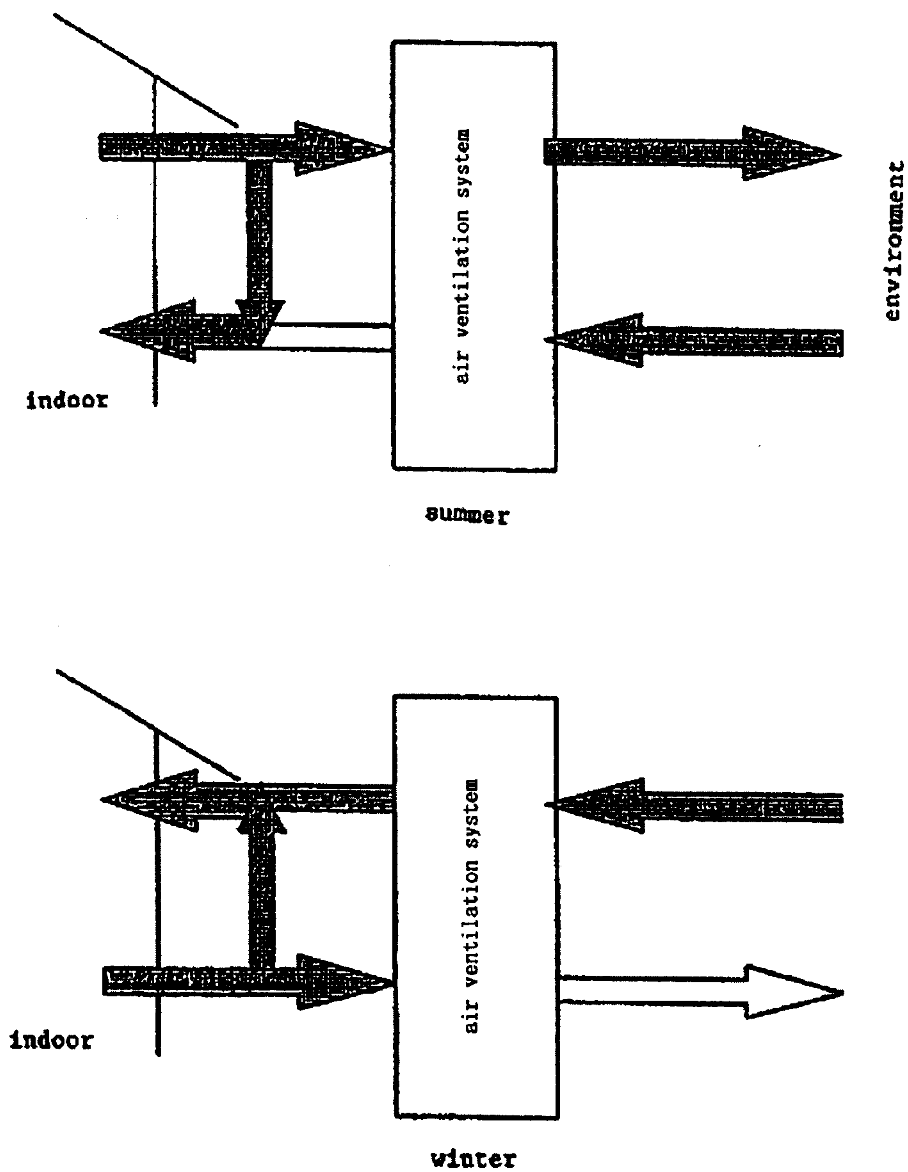

FIG. 21M is a schematic drawing of an inorganic heat transfer integrated and power-saving air conditioning unit according to the present invention.

Figure 22A:
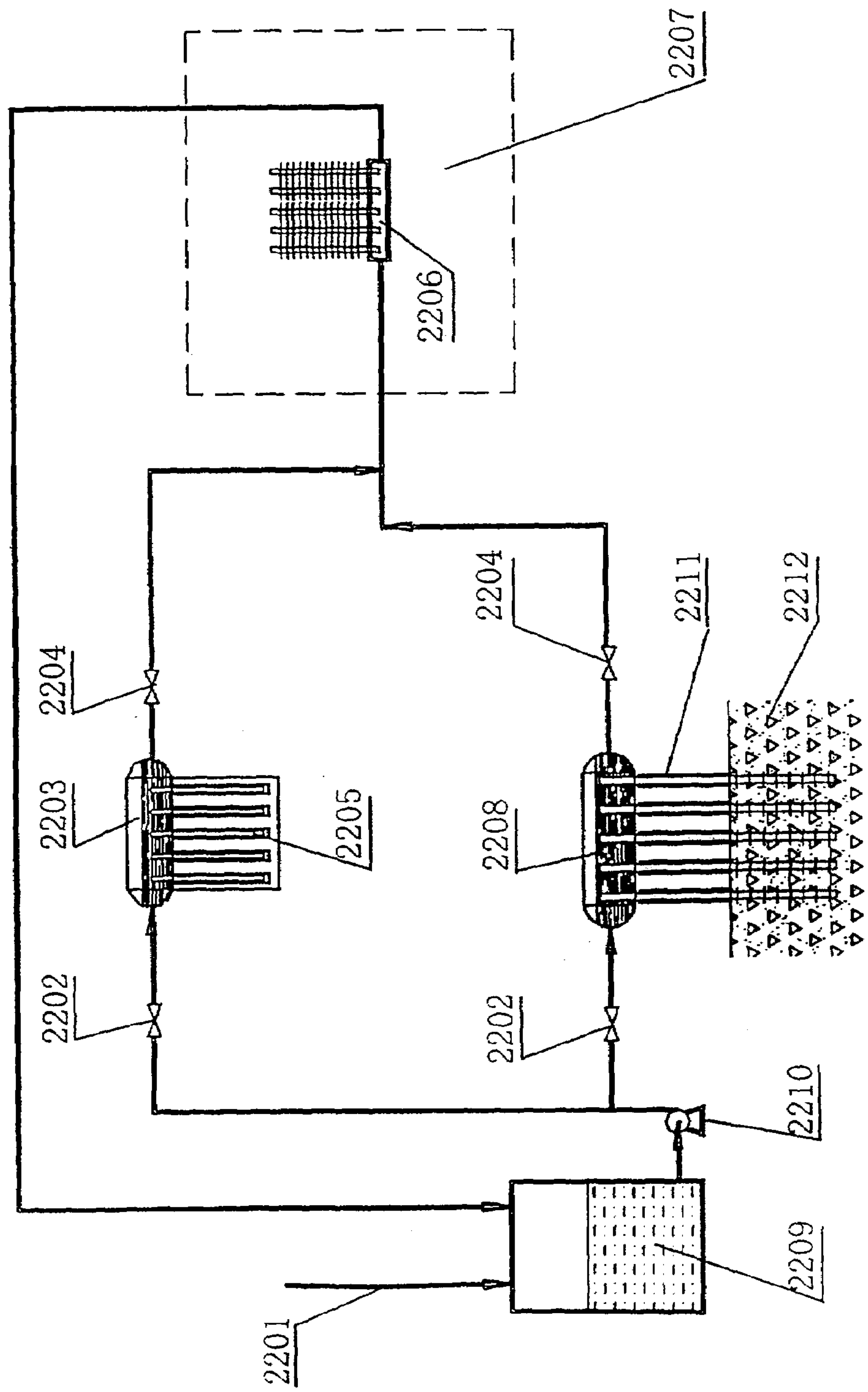

FIG. 22A is a schematic view showing the implementation of an inorganic heat transfer plant heating system according to the present invention.

Figure 22B:
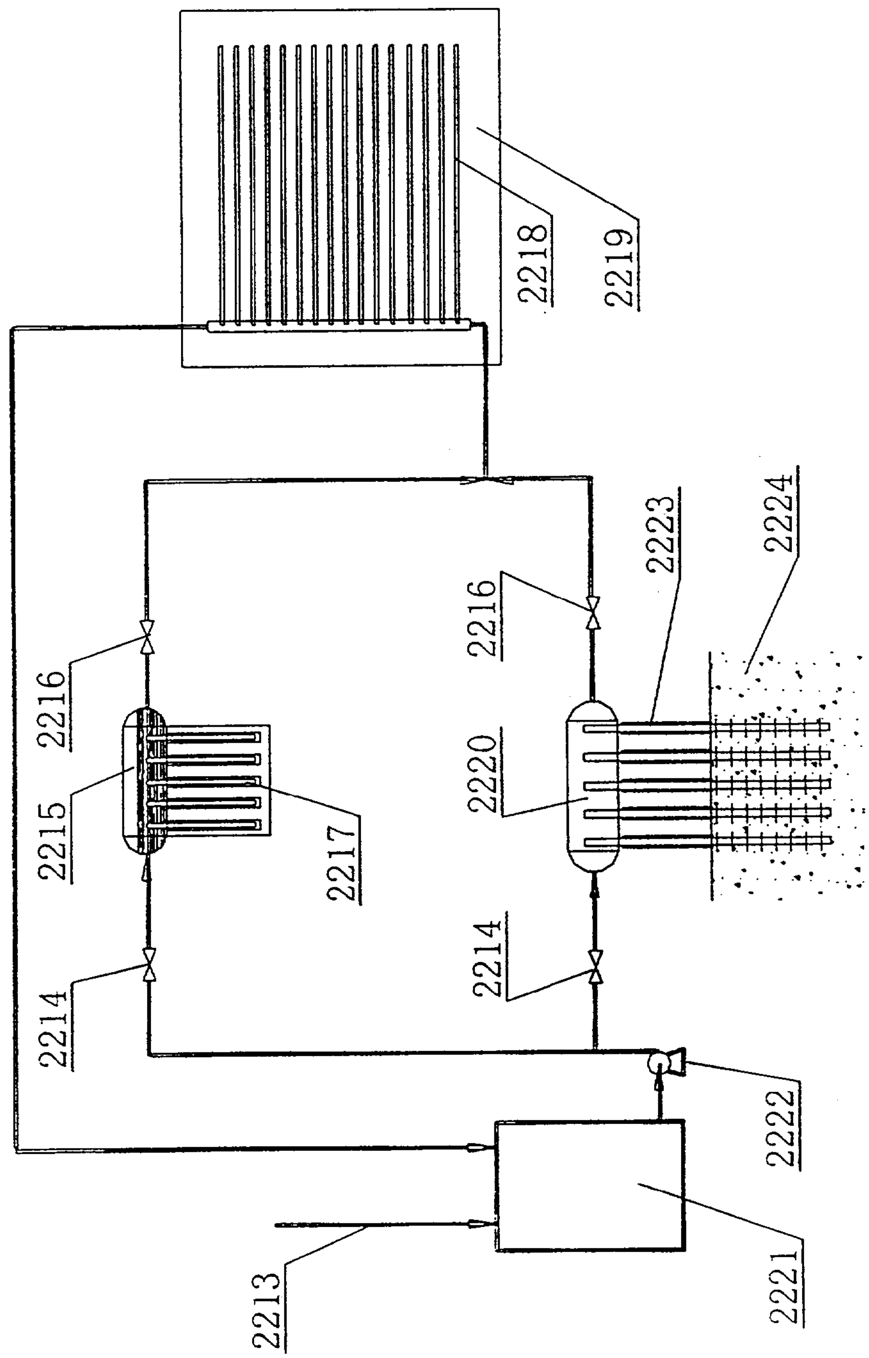

FIG. 22B is a schematic view showing the workflow of an inorganic heat transfer fishery heating system according to the present invention.

Figure 23A:
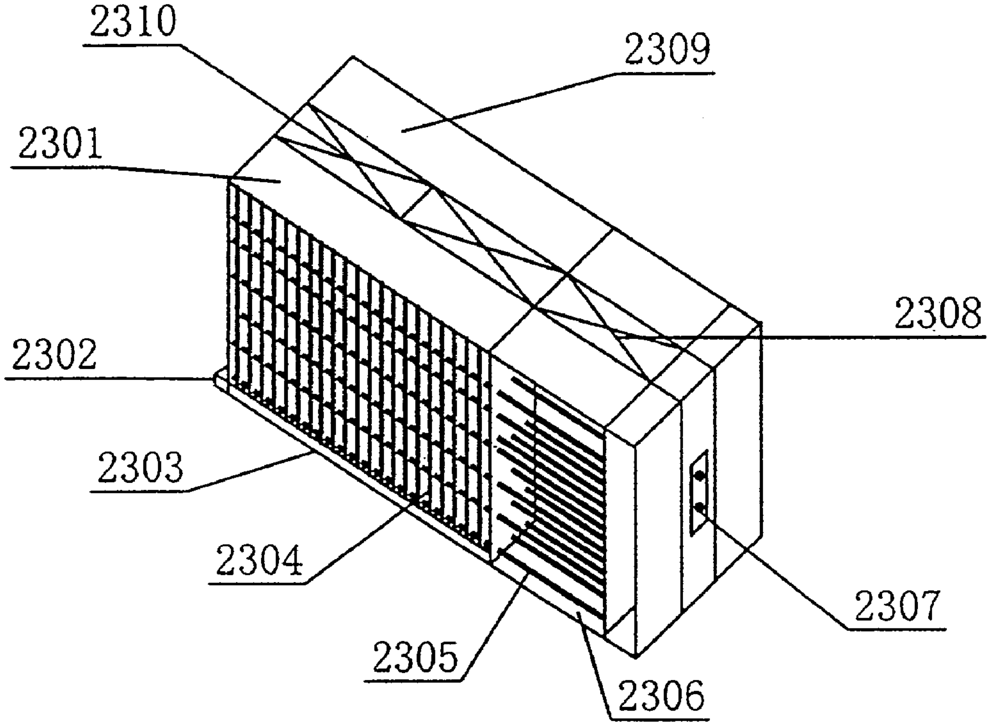

FIG. 23A shows an inorganic heat transfer dehydrator according to the present invention.

Figure 23B:
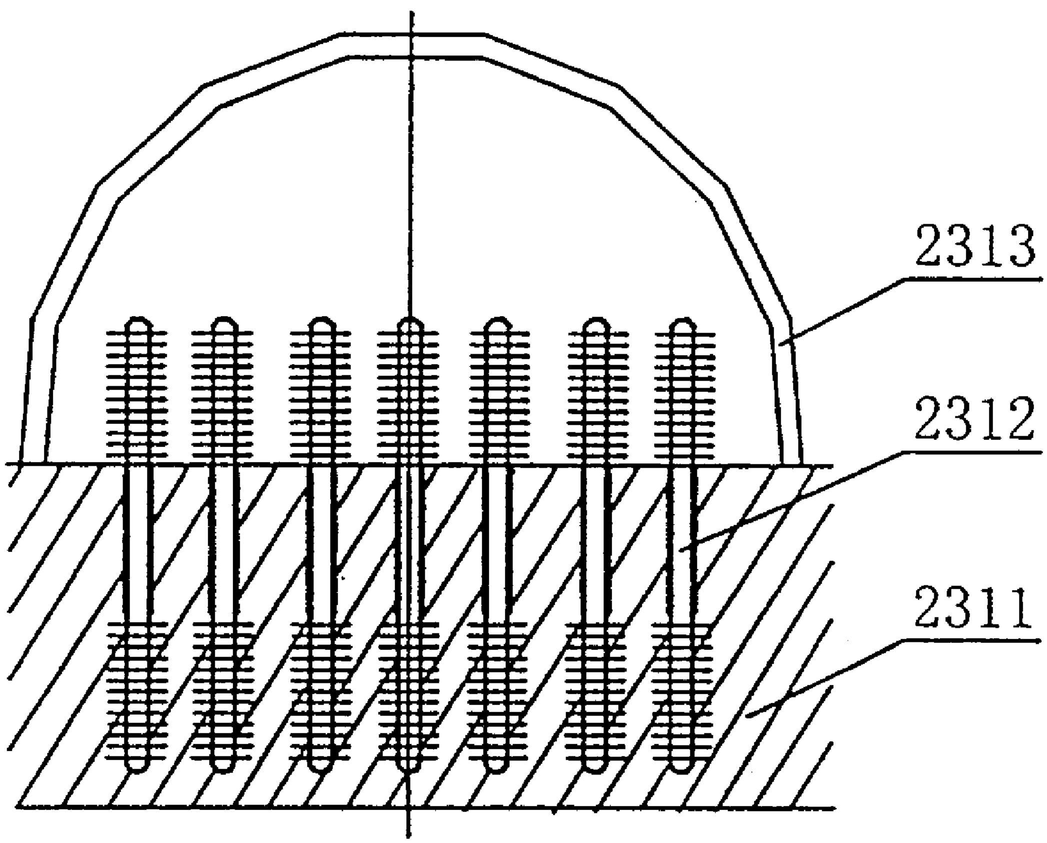

FIG. 23B shows the structure of an inorganic heat transfer geothermal energy refrigerating system according to the present invention.

| DESCRIPTION OF SYMBOLS FOR ELEMENTS | |
|---|---|
| 102 | Heat transfer element |
| 104 | Plug |
| 105 | Cavity |
| 106 | Hole diameter |
| 108 | Pipe |
| 110 | Heat transfer medium |
| 112 | Heat transfer pipe element |
| 114 | Electric heating cone |
| 116 | Cold water intake |
| 118 | Hot water outlet |
| 120 | Heat transfer pipe element |
| 122 | Fin |
| 124 | Support |
| 126 | Heat transfer pipe element |
| 128 | Rib |
| 129 | Electric heater |
| 130 | Heat transfer pipe element |
| 132 | Rotary tube sheet |
| 134 | Closure structure |
| 136 | Spiral heat pipe heat exchange device body |
| 138 | Afterheat storage |
| 140 | Heat recovery storage |
| 142 | Single pipe-pipe combination |
| 144 | Single pipe-pipe combination |
| 146 | Heat pipe |
| 148 | Heat pipe |
| 152 | Heat absorbing component |
| 154 | Heat absorbing component |
| 156 | Heat absorbing component |
| 158 | Heat absorbing component |
| 160 | Pipe |
| 162 | Plate cavity |
| 164 | Electronic element |
| 166 | Electronic element |
| 168 | Electronic element |
| 169 | Plate component |
| 170 | Plate component |
| 201 | Wardrobe casing |
| 202 | Support |
| 203 | Stream distributor |
| 204 | Condensed water outlet |
| 205 | Electronic heating system |
| 206 | Heat transfer heating element |
| 207 | Water intake |
| 208 | Gas generator |
| 209 | Redundant stream outlet |
| 211 | Casing |

-continued

| DESCRIPTION OF SYMBOLS FOR ELEMENTS | |
|---|---|
| 212 | Air outlet |
| 213 | Return air box |
| 214 | Drain |
| 215 | Filter |
| 216 | Fan |
| 217 | Radiating fin |
| 218 | Heat transfer heating element |
| 219 | Electric heating system |
| 220 | Air distributing box |
| 221 | Support |
| 231 | Rectangular water container |
| 232 | Cover |
| 233 | Inorganic heat transfer element |
| 234 | Blower |
| 301 | Heating device body |
| 302 | Inorganic high heat transfer element |
| 303 | Fuel oil intake |
| 304 | Hot water outlet |
| 305 | Water jacket |
| 306 | Flow conductor |
| 307 | Heating device body |
| 308 | Radiator casing |
| 309 | Inorganic high heat transfer element |
| 310 | Fin |
| 311 | Ventilation |
| 312 | Heating device body |
| 313 | Inorganic high heat transfer element |
| 314 | Fin |
| 315 | Heating device body |
| 316 | Casing |
| 317 | Electric heater element |
| 318 | Fin |
| 319 | Kettle |
| 320 | Inorganic high heat transfer pipe |
| 321 | Heater |
| 322 | Cylinder |
| 323 | Electric heater |
| 324 | Source end of inorganic high heat transfer pipe |
| 325 | Sink end of inorganic high heat transfer pipe (hollow partition) |
| 326 | Heating source |
| 327 | Grilling boards made of inorganic high heat transfer elements |
| 328 | Inorganic high heat transfer plate |
| 329 | Steam generator |
| 330 | Stainless base plate |
| 331 | Power input |
| 332 | Plate cavity electric heater |
| 333 | Water intake |
| 334 | Handle |
| 335 | Spray nozzle |
| 336 | Lower steam outlet |
| 337 | Support |
| 338 | Water intake |
| 339 | Lower water chamber |
| 340 | Hot water outlet |
| 341 | Decaling hand hole |
| 342 | Water transmission pipe |
| 343 | Upper outlet |
| 344 | Partition |
| 345 | Boiling water outlet |
| 346 | Inorganic heat transfer element |
| 347 | Upper water chamber |
| 348 | Water chamber wall |
| 349 | Fixing screws |
| 350 | Seal |
| 351 | Gas exhaust valve |
| 352 | Siren |
| 353 | Flange |
| 354 | Nameplate |
| 355 | Thermometer in upper water chamber |
| 356 | Upper water chamber water scale |
| 357 | Upper steam chamber |
| 358 | Incoming steam pipe |
| 359 | Support |
| 360 | Steam transmission pipe |
| 361 | Water thermometer |

-continued

| DESCRIPTION OF SYMBOLS FOR ELEMENTS | |
|---|---|
| 362 | Thermometer in lower water chamber |
| 363 | Lower steam chamber |
| 364 | Dredging pipe |
| 401 | Screw fin |
| 402 | Inorganic heat transfer medium |
| 403 | Screw rod |
| 404 | Electric heater |
| 500' | Dirt outlet |
| 501 | Pipe box |
| 501' | Air outlet pipe |
| 502 | Inorganic high heat transfer pipe |
| 502' | Linking pipe |
| 503 | Partition |
| 503' | Access port |
| 504 | Air outlet pipe |
| 504' | Smoke intake pipe |
| 505 | Air intake pipe |
| 505' | Soot cleaning hole |
| 506 | Smoke intake pipe |
| 506' | Support |
| 507 | Smoke outlet pipe |
| 507' | Smoke outlet pipe |
| 508 | Soot cleaning hole |
| 508' | Air intake pipe |
| 509 | Fin |
| 509' | Fin |
| 510 | Closure flange |
| 510' | Closure flange |
| 511 | Seal box |
| 511' | Seal box |
| 512 | Bearer |
| 512' | Thermal insulating layer |
| 513' | Partition |
| 514 | Linking pipe |
| 514' | Inorganic high heat transfer pipe |
| 515 | Air blower |
| 515' | Soot blower |
| 516 | Thermal insulating layer |
| 516' | Pipe box |
| 517 | Cold air intake |
| 517' | Blast intake |
| 518 | Air channel |
| 518' | Flue box |
| 519 | Box |
| 519' | Positioning board |
| 520 | Partition |
| 520' | Inorganic high heat transfer element |
| 521 | Flue |
| 521' | cooled gas outlet |
| 522 | Hot air outlet |
| 522' | Steam outlet |
| 523 | Double-channel casing |
| 523' | Boiler drum |
| 524 | Smoke intake |
| 524' | Water intake |
| 525 | Smoke outlet |
| 525' | Dirt outlet |
| 526' | Soot cleaning hole |
| 526 | Intermediate sealed tube sheet |
| 527 | Inorganic heat transfer element |
| 527' | Cooled gas outlet |
| 528 | Radiating fin |
| 528' | Flue box |
| 529 | Vertical endplate |
| 529' | Inorganic high heat transfer element |
| 530' | Positioning board |
| 530C | Water intake |
| 531' | Hot blast intake |
| 531C | Inorganic high heat transfer element |
| 531D | Inorganic high heat transfer element |
| 532' | Liquid-vapor outlet |
| 532C | Hot water outlet |
| 532D | Tube sheet |
| 533' | Hand hole |
| 533C | Air intake |
| 533D | Tube sheet |
| 534' | Boiler drum |

-continued

| DESCRIPTION OF SYMBOLS FOR ELEMENTS | |
|---|---|
| 534C | Air outlet |
| 535' | Water intake |
| 536A | Glass kiln furnace |
| 536E | Support |
| 536F | Car exhaust intake |
| 536G | Flue port |
| 536H, 548H | Soot outlet |
| 536I | Hot gas intake |
| 536J | Soot outlet |
| 536K, 547K | Soot outlet |
| 536L | Smoke outlet |
| 536M | Oil scale |
| 536N | Oil scale |
| 537A, 549A | Hot smoke entrance in a kiln furnace |
| 537E | Flue port |
| 537F | Flange |
| 537G | Discharge |
| 537H, 547H | Gas outlet |
| 537I | Flue box |
| 537J | Gas outlet |
| 537K, 546K | Gas outlet |
| 537L | Inorganic high heat transfer tube bundle |
| 537M | Flue entrance |
| 537N | Flue entrance |
| 538A, 548A | Furnace |
| 538E | Soot cleaning hole |
| 538F | Car exhaust passage |
| 538G | Hot water outlet |
| 538H, 545H | Flue box |
| 538I | Positioning board |
| 538J | Flue box |
| 538K, 544K | Flue box |
| 538L | Smoke side tube sheet |
| 538M | Inorganic high heat transfer pipe |
| 538N | Inorganic high heat transfer pipe |
| 539A, 547A | Heat retaining pre-heater |
| 539E | Man-hole |
| 539F | Inorganic high heat transfer fin pipe |
| 539G | Pressure meter joint |
| 539H | Inorganic high heat transfer element |
| 539I | Inorganic high heat transfer element |
| 539J | Inorganic high heat transfer element |
| 539K | Inorganic high heat transfer element |
| 539L | Intermediate tube sheet |
| 539M | Support plate |
| 539N | Support plate |
| 540A | Air intake |
| 540E | Cylinder |
| 540F | Car exhaust outlet |
| 540G | Cylinder |
| 540H | Boiler drum |
| 540I | Cooling gas |
| 540J | Positioning board |
| 540K | Boiler drum |
| 540L | Smoke intake |
| 540M | Boiler drum access port |
| 540N | Boiler drum access port |
| 541A | Steam outlet |
| 541E | Discharge outlet |
| 541F | Automobile passage floor |
| 541G | Conical cleaning hole |
| 541H, 543H | Gas intake |
| 541I | Steam outlet |
| 541J | Gas intake |
| 541K, 543K | Gas intake |
| 541L | Gas outlet |
| 541M | Boiler drum |
| 541N | Boiler drum |
| 542A | Water intake |
| 542E | Liquid-vapor separator |
| 542F | Protective device |
| 542G | Water intake |
| 542I | Boiler drum |
| 542J | Steam outlet |
| 542K | Steam outlet |
| 542L | Side air tube sheet |
| 542M | Fuel oil intake |

-continued

| DESCRIPTION OF SYMBOLS FOR ELEMENTS | |
|---|---|
| 542N | Fuel oil intake |
| 543A | Chimney |
| 543E | Pressure meter port |
| 543F | Inorganic high heat transfer fin tube |
| 543G | Man-hole |
| 543I | Water intake |
| 543J | Hand hole |
| 543L | Pipe box door |
| 543M | Fuel oil intake |
| 543N | Fuel oil intake |
| 544A | Smoke outlet of inorganic high heat transfer afterheat boiler |
| 544E | Stream outlet |
| 544F | Inorganic high heat transfer fin tube support |
| 544G | Inorganic high heat transfer pipe |
| 544H | Demister |
| 544I | Dirt outlet |
| 544J | Boiler drum |
| 544L | Air intake |
| 544M | Inorganic high heat transfer pipe |
| 544N | Inorganic high heat transfer pipe |
| 545A | Inorganic high heat transfer afterheat boiler |
| 545E | Safety valve port |
| 545G | Base |
| 545J | Water intake |
| 545K | Positioning board |
| 545M | Sleeve |
| 545N | Sleeve |
| 546A | Smoke intake of the inorganic high heat transfer afterheat boiler |
| 546E | Man-hole |
| 546G | Soot cleaning hole |
| 546H | Positioning board |
| 546J | Dirt outlet |
| 546M | Fin |
| 546N | Fin |
| 547E | Liquid scale port |
| 547G | Dirt outlet |
| 548E | Water intake |
| 548G | Inorganic high heat transfer pipe |
| 548K | Water intake |
| 549E | Dirt discharge |
| 549G | Sleeve |
| 549H | Water intake |
| 549K | Dirt outlet |
| 550A | Fuel oil intake |
| 550E | Flue port |
| 550G | Fin |
| 550H | Dirt outlet |
| 551A | Boiler drum |
| 551E | Discharge outlet |
| 552A | Stream outlet |
| 552E | Hot water outlet |
| 553A | Inorganic high heat transfer element |
| 553E | Pressure meter port |
| 554A | Water intake |
| 554E | Cylinder |
| 555A | Rib |
| 555E | Man-hole |
| 556A | Smoke outlet |
| 556E | Water intake |
| 557A | Smoke side box |
| 557E | Man-hole |
| 558A | Smoke intake |
| 558E | Inorganic high heat transfer pipe |
| 559E | Base |
| 560E | Soot cleaning hole |
| 561E | Dirt outlet |
| 562E | Inorganic high heat transfer pipe |
| 563E | Sleeve |
| 564E | Fin |
| 571 | Back-water pipe |
| 571' | Gas pipe box |
| 571" | Air pipe box |
| 572 | Main water pipe |
| 572' | Lifting pipe |
| 572" | Gas pipe box |

-continued

| DESCRIPTION OF SYMBOLS FOR ELEMENTS | |
|---|---|
| 573 | Water outlet pipe |
| 573' | Smoke pipe box |
| 573" | Smoke pipe box |
| 574 | Inorganic high heat transfer pipe |
| 574' | Soot blower |
| 574" | Soot blower |
| 575 | Inorganic high heat transfer afterheat water heater |
| 575' | Water storage |
| 575" | Lifting pipe |
| 576' | Lowering pipe |
| 576" | Lowering pipe |
| 577 | Flue box |
| 577' | Inorganic heat transfer tube bank |
| 578 | Inorganic heat transfer tube bank |
| 578' | Bearing board |
| 579 | Soot removing hole |
| 579' | Boiler drum |
| 580 | Steam dome |
| 580" | Fuel oil industrial furnace |
| 581 | Steam pipe |
| 581' | Hot air in sintering machine |
| 581" | Inorganic high heat transfer afterheat recovery system |
| 582 | Water pipe |
| 582' | Afterheat boiler |
| 582" | Coal saver |
| 583 | Water pre-heater |
| 583' | Chimney |
| 583" | Chimney |
| 584 | Coupling casting machine |
| 584' | Heat pipe |
| 585 | Cast Iron plate |
| 585' | Reflecting plate |
| 586 | Boiler drum |
| 587 | Steel plate |
| 588 | Steam generator |
| 589 | Gas industrial furnace |
| 590 | Inorganic high heat transfer fin pipe |
| 591 | Furnace chamber |
| 592 | Exhaust entrance pipe |
| 593 | Fresh air entrance pipe |
| 594 | Water container |
| 595 | Channel for discharging oil, smoke and other hot air |
| 596 | Inorganic high heat transfer fin pipe |
| 601 | Vacuum glass tube internal wall (heat collecting layer) |
| 602 | Vacuum glass tube external wall (heat collecting layer) |
| 603 | Support |
| 604 | Vacuum glass heat collecting glass tube |
| 605 | Reflecting plate |
| 606 | Hot water outlet |
| 607 | Pressure-resist water tank |
| 608 | Cold water intake |
| 609 | Safety valve (depressurizing valve) |
| 610 | Thermal insulating layer |
| 611 | Inorganic high heat transfer element |
| 612 | Water-proof sealing valve |
| 613 | Water tank support |
| 614 | ω-type heating absorbing aluminum board |
| 615 | Hot air outlet |
| 616 | Air heating segment |
| 617 | Cold air intake |
| 618 | Air ventilator |
| 619 | Vacuum heat collector |
| 620 | Arc polish reflector |
| 621 | Sunlight |
| 622 | Solar energy collecting segment |
| 623 | Inorganic high heat transfer element |
| 624 | Cooling end of inorganic high heat transfer element |
| 625 | Heat receiving segment |
| 626 | Heat collecting segment |
| 627 | Vacuum tube |
| 628 | Heat collecting lug |
| 629 | Heating end of inorganic high heat transfer element |
| 630 | Heat insulating segment |
| 631 | Transmitting end |
| 632 | Heating well or oil/gas waste well |
| 633 | Separate type inorganic high heat transfer afterheat heat exchanger |

-continued

| DESCRIPTION OF SYMBOLS FOR ELEMENTS | |
|---|---|
| 634 | Storage container |
| 635 | Steam generator |
| 636 | Leveler |
| 637 | Water intake |
| 638 | Warm water outlet |
| 639 | Cold water intake |
| 640 | Horizontal surface |
| 641 | Water source |
| 642 | Radiation receiving surface |
| 643 | Inorganic high heat transfer medium |
| 644 | Plate type inorganic high heat transfer solar collector |
| 645 | Rib |
| 646 | Soil |
| 650 | Separate type inorganic high heat transfer afterheat heat exchanger |
| 651 | Heating well or oil/gas waste well |
| 652 | Vaporizer |
| 653 | Expansion pump |
| 654 | Compressor |
| 655 | Condenser |
| 656 | Circulating pump |
| 657 | Condenser |
| 658 | Power generating module of steam turbine |
| 659 | Heating well or oil/gas waste well |
| 660 | Separate type inorganic high heat transfer afterheat heat exchanger |
| 661 | Vaporizer |
| 662 | Compressor |
| 663 | Condenser |
| 664 | Expansion pump |
| 665 | High hot water tank |
| 666 | Nozzle |
| 667 | Water pipe |
| 668 | Indoor heating system |
| 669 | Indoor heating system |
| 670 | Solar energy collector |
| 671 | Storage container |
| 672 | Heat storage |
| 673 | Heat pump |
| 674 | Tube clip |
| 675 | Inorganic heat transfer tube |
| 676 | Heating segment |
| 677 | Heat collecting plate |
| 678 | Thermal insulating layer |
| 679 | Base |
| 680 | Cooling segment |
| 681 | Thermal insulating layer |
| 682 | Fin plate |
| 683 | Partition |
| 684 | Flange |
| 685 | Cooling segment |
| 686 | Heating segment |
| 687 | Water storage |
| 688 | Valve door |
| 689 | Fin heat pipe |
| 690 | Plastic flange cover |
| 691 | Heat insulating sleeve |
| 692 | Heat flask |
| 693 | External wall |
| 694 | Internal wall |
| 695 | Heat storage medium |
| 696 | Tap water |
| 701 | Port flange |
| 702 | Inorganic high heat transfer tube bundle |
| 703 | Steam chamber |
| 704 | Casing |
| 705 | Dredger |
| 706 | Condenser liquid outlet |
| 707 | Stream intake valve |
| 708 | Reactor vessel |
| 709 | Electric control box |
| 710 | Support |
| 711 | Electric heating system |
| 712 | Inorganic high heat transfer pipe |
| 713 | Reactor solvent |
| 714 | Cover |
| 715 | Reactor vessel |

-continued

| DESCRIPTION OF SYMBOLS FOR ELEMENTS | |
|---|---|
| 716 | Flow controller |
| 717 | Support |
| 718 | Fin |
| 719 | Steam channel |
| 720 | Inorganic high heat transfer pipe |
| 721 | Reactor solvent |
| 722 | Cover |
| 723 | External pipe |
| 724 | Inorganic high heat transfer medium |
| 725 | Internal pipe |
| 726 | End cover |
| 727 | Electric heater |
| 728 | Inorganic high heat transfer medium |
| 729 | Refracting plate |
| 730 | Radiating flange |
| 731 | Upper heating seal |
| 732 | Inorganic high heat transfer element |
| 733 | Electric heater |
| 734 | Plastic wrapping material |
| 735 | Thermal sealing face |
| 736 | Lower heating seal |
| 737 | Boiler drum |
| 738 | Counter current flue channel |
| 739 | Furnace flask |
| 740 | Burner port |
| 741 | Hot water outlet |
| 742 | Counter current segment inorganic high heat transfer pipe |
| 743 | Radiating segment inorganic high heat transfer pipe |
| 744 | Smoke outlet |
| 745 | Water intake |
| 746 | Furnace bottom |
| 747 | Chimney |
| 748 | Water tank |
| 749 | Inorganic high heat transfer pipe |
| 750 | Fin |
| 751 | Casing board |
| 752 | Burner |
| 753 | Burning gas intake |
| 754 | Cold water intake pipe |
| 755 | Hot water outlet pipe |
| 801 | Heat collecting segment |
| 802 | Heat insulating segment |
| 803 | Heat receiving segment (runway) |
| 804 | Cooling end of high heat transfer element |
| 805 | Transmitting end of high heat transfer element |
| 806 | Insulated thermal insulating layer |
| 807 | Heating end of high heat transfer element |
| 808 | Rib |
| 809 | Soil |
| 810 | Surface of runway |
| 811 | Rubble layer |
| 812 | Inorganic high heat transfer, heat transfer element |
| 813 | Soil |
| 814 | Indoor water supply system |
| 815 | Solar energy collector |
| 816 | Water storage |
| 817 | Circulating water pump |
| 818 | Water storage |
| 819 | Thermal insulating layer |
| 820 | Heating segment |
| 821 | Cooling segment |
| 822 | Heat transfer pipe |
| 823 | Heat collecting segment |
| 824 | Base |
| 825 | Tube clip |
| 826 | Fin plate |
| 827 | Partition |
| 828 | Lug edge |
| 901 | Material intake |
| 902 | Electric heating controller |
| 903 | Circulating ventilator |
| 904 | Circulating air outlet pipe |
| 905 | Material outlet |
| 906 | Circulating air intake |
| 907 | Drying box |
| 908 | Material conveyer |

-continued

| DESCRIPTION OF SYMBOLS FOR ELEMENTS | |
|---|---|
| 909 | Hot wind distributor |
| 910 | Heat transfer element |
| 911 | Circulating hot wind hole |
| 912 | Drying box wall |
| 913 | Electric heater |
| 914 | Circulating air intake |
| 915 | Smoke returning fan |
| 916 | Air ventilator |
| 917 | Air heater |
| 918 | Low temperature hot air |
| 919 | Burning chamber |
| 920 | Crude oil and air intake |
| 921 | Burner |
| 922 | Fire-proof brick |
| 923 | Heat transfer element |
| 924 | Chimney |
| 925 | Low temperature hot air |
| 926 | High temperature hot air |
| 927 | Smoke |
| 928 | Hot air outlet |
| 929 | Water intake |
| 930 | Steam dome |
| 931 | Low pressure steam or hot water |
| 932 | Cylinder |
| 933 | Heat transfer medium |
| 934 | Electric heater |
| 935 | Cylinder cover |
| 936 | Swivel |
| 937 | Chimney |
| 938 | High heat transfer, heat transfer pipe |
| 939 | Pipe box |
| 940 | Ventilator |
| 941 | Burning chamber |
| 942 | Burner |
| 943 | Wood conveyer |
| 944 | Furnace |
| 945 | Heat exchanger |
| 946 | High heat transfer, heat transfer element |
| 947 | Drying box |
| 948 | Furnace |
| 949 | Heat exchanger |
| 950 | Sprayer tower |
| 951 | High heat transfer, heat transfer element |
| 952 | Heating segment |
| 953 | Smoke outlet |
| 954 | Cooling segment |
| 955 | Material intake |
| 956 | Rotary support |
| 957 | Smoke intake |
| 958 | Material outlet |
| 959 | Fin |
| 960 | Liquid distributor |
| 961 | Thermal insulating layer |
| 962 | Smoke |
| 963 | Heat transfer element |
| 964 | Material |
| 965 | Air heater |
| 966 | Material dryer |
| 1001 | Crude oil pipe |
| 1002 | High heat transfer pipe of crude oil transport pipe heating device |
| | Heat transfer pipe |
| 1003 | Lug port |
| 1004 | Electric heater |
| 1011 | Track and support |
| 1012 | Pipe box |
| 1013 | Heat transfer element |
| 1014 | Tube sheet |
| 1015 | Connecting pipe |
| 1016 | Lug edge |
| 1017 | Storage container |
| 1031 | Fin |
| 1032 | Sink end pipe |
| 1033 | Fixed lug |
| 1034 | Thermometer |
| 1035 | Source end pipe |
| 1036 | Heat source |

-continued

| DESCRIPTION OF SYMBOLS FOR ELEMENTS | |
|---|---|
| 1041 | Oil carrier |
| 1042 | Connecting pipe |
| 1043 | Lug edge |
| 1044 | Heating device |
| 1045 | Power supply |
| 1046 | Switch |
| 1051 | Heat transfer element |
| 1052 | Tube sheet |
| 1053 | Magnesium oxide |
| 1054 | Thermal insulating layer |
| 1056 | Casing element |
| 1061 | Electric heater |
| 1062 | High heat transfer, heat transfer element |
| 1063 | Oil tank casing |
| 1064 | Mineral oil heat carrier |
| 1065 | Inner cylinder |
| 1066 | Lower seal |
| 1067 | Curved distilling pipe |
| 1068 | High heat transfer cylinder |
| 1069 | Dense oil heat exchanger |
| 1070 | Diluted heat exchanger |
| 1071 | Bellows |
| 1072 | Upper seal |
| 1073 | Deflecting ball |
| 1074 | Coil tube |
| 1075 | Outer flue channel |
| 1076 | Outer seal |
| 1077 | Outer cylinder |
| 1078 | Linking pipe |
| 1079 | Base |
| 1080 | Jacket tube |
| 1081 | Inner jacket tube |
| 1082 | Electric heater |
| 1083 | Jacket type heat transfer pipe element |
| 1084 | Intelligent temperature controller |
| 1085 | Material intake |
| 1086 | Heat transfer element |
| 1087 | Fin |
| 1088 | Catalyst |
| 1089 | Raw material outlet |
| 1090 | Heater |
| 1091 | Boiler |
| 1092 | Heat transfer element |
| 1093 | Silicon oil |
| 1094 | Oil bathtub |
| 1095 | Burner |
| 1096 | Radiation room |
| 1097 | Counter current room |
| 1098 | Heat transfer element |
| 1099 | Chimney |
| 1101 | Heat absorbing brick |
| 1102 | Heat transfer element |
| 1103 | Fin |
| 1104 | Heat transfer element |
| 1105 | Fin |
| 1106 | Fan |
| 1107 | Support |
| 1108 | Heat absorbing brick |
| 1109 | Heat transfer element |
| 1110 | Fin |
| 1111 | Power fan |
| 1112 | Heat transfer element |
| 1113 | Connector |
| 1114 | Heat transfer element |
| 1115 | Heat transfer element |
| 1116 | Heat transfer element |
| 1117 | Heat transfer element |
| 1118 | Heat absorbing connector |
| 1119 | Heat transfer element |
| 1120 | Radiating fin |
| 1121 | Electronic element |
| 1122 | Axial-flow fan |
| 1123 | Aluminum radiator |
| 1124 | Semiconductor cooler |
| 1125 | Radiator |
| 1126 | Heat transfer element |
| 1127 | Heat transfer element |

-continued

| DESCRIPTION OF SYMBOLS FOR ELEMENTS | |
|---|---|
| 1128 | CPU chip |
| 1129 | Heat transfer element |
| 1130 | Printed circuit board |
| 1131 | Display screen |
| 1132 | Heat transfer element |
| 1133 | CPU of notebook computer |
| 1134 | Keyboard |
| 1135 | Chip set |
| 1136 | Heat transfer element |
| 1137 | Radiating flange |
| 1138 | Heat transfer element |
| 1139 | Central processing system |
| 1140 | Radiating flange |
| 1201 | Electric control cabinet |
| 1202 | Sealed radiator |
| 1203 | Heat transfer element |
| 1204 | Aluminum piece |
| 1205 | Partition |
| 1206 | Industrial display box |
| 1207 | Sealed radiator |
| 1208 | Heat transfer element |
| 1209 | Aluminum piece |
| 1210 | Partition |
| 1211 | Television set cabinet |
| 1212 | Sealed radiating flange |
| 1213 | Heat transfer element |
| 1214 | Aluminum piece |
| 1215 | Partition |
| 1216 | Positive substrate |
| 1217 | Spring press plate |
| 1218 | Ball |
| 1219 | Bolt rod |
| 1220 | Insulated jacket tube |
| 1221 | Radiating flange |
| 1222 | Heat transfer element |
| 1223 | Negative substrate |
| 1224 | Press plate |
| 1225 | Controllable silicon element |
| 1226 | Controllable silicon element |
| 1227 | Heat transfer element |
| 1228 | Radiating fin |
| 1229 | Air cooler |
| 1230 | Rib |
| 1231 | Compressed gas intake |
| 1232 | Cooling water outlet |
| 1233 | Cooling water side |
| 1234 | Heat transfer element |
| 1235 | Cooling water intake |
| 1236 | Compressed gas outlet |
| 1237 | Condenser water discharge |
| 1238 | Positive substrate |
| 1239 | Spring press plate |
| 1240 | Ball |
| 1241 | Bolt rod |
| 1242 | Insulated jacket tube |
| 1243 | Slip hole brake |
| 1244 | Heat-proof insulated jacket tube |
| 1245 | Radiating flange |
| 1246 | Heat transfer element |
| 1247 | Anti-explosive board |
| 1248 | Negative substrate |
| 1249 | Press plate |
| 1250 | Controllable silicon element |
| 1251 | Power modular box |
| 1252 | Controller and auxiliary PCB |
| 1253 | Sealed retaining plate |
| 1254 | Axial-flow fan |
| 1255 | Ventilation channel |
| 1256 | Heat transfer element |
| 1257 | Radiating flange |
| 1258 | Base |
| 1259 | Heat transfer element |
| 1260 | Storage battery casing |
| 1261 | Water intake |
| 1262 | Embedded wall pipe heat transfer element |
| 1263 | Water outlet pipe |
| 1264 | Outer casing of the heat transfer element |

-continued

| DESCRIPTION OF SYMBOLS FOR ELEMENTS | |
|---|---|
| 1265 | Inner casing of the heat transfer element |
| 1266 | Heat transfer element |
| 1267 | Storage battery casing |
| 1268 | Heat transfer element cavity |
| 1269 | Radiating flange |
| 1270 | p-type semiconductor element |
| 1271 | Electric wire |
| 1272 | Power supply |
| 1273 | n-type semiconductor element |
| 1274 | Copper leaf |
| 1275 | Lid |
| 1276 | Small roll |
| 1277 | Thermal insulating layer |
| 1278 | Stainless shell |
| 1279 | Heat transfer element |
| 1280 | Thermopile |
| 1281 | Heat transfer element |
| 1282 | Fin |
| 1283 | Heat exchange container |
| 1284 | Cooling solution intake |
| 1285 | Cooling solution outlet |
| 1286 | Circuit controlling system |
| 1287 | Concoctive reflecting plate |
| 1288 | Light emitting source |
| 1289 | Film |
| 1290 | Lenses |
| 1291 | Heat transfer element |
| 1292 | Cooling air channel |
| 1293 | Radiating flange |
| 1294 | Heat transfer element |
| 1295 | Aluminum plate radiator |
| 1296 | Aluminum radiator |
| 1297 | Scanning head and electronic parts of the scanner |
| 1298 | Heat transfer element |
| 1299 | Radiating flange |
| 1301 | Copper plate |
| 1302 | p-n semiconductor cooler |
| 1303 | Insulating materials |
| 1304 | High heat transfer, heat transfer board |
| 1305 | High heat transfer, heat transfer pipe |
| 1306 | Power supply |
| 1307 | Fan |
| 1308 | Radiating fin |
| 1309 | p-type semiconductor |
| 1310 | Conductive wire |
| 1311 | Power supply |
| 1312 | n-type semiconductor |
| 1313 | Copper leaf |
| 1314 | Handle |
| 1315 | Sink end setting ring |
| 1316 | Sink end insulating sleeve |
| 1317 | Sink end |
| 1318 | Thermopile |
| 1319 | High heat transfer heat transfer element |
| 1320 | Water tank |
| 1321 | Water pipe connector |
| 1401 | High heat transfer, heat transfer element |
| 1402 | Casing |
| 1403 | Rib |
| 1404 | Fan |
| 1405 | Electric machines |
| 1406 | Battery |
| 1407 | Cup |
| 1408 | Internal wall |
| 1409 | High heat transfer heat pipe element |
| 1410 | High heat transfer, heat transfer plate element |
| 1411 | Cup lid |
| 1412 | Insulating materials |
| 1413 | Top cover |
| 1414 | Space |
| 1415 | Light tube |
| 1416 | Lamp shade |
| 1417 | High heat transfer heat transfer pipe |
| 1418 | Radiating flange |
| 1419 | Box lid |
| 1420 | Cold medium container |
| 1421 | High heat transfer, heat transfer pipe |

-continued

| DESCRIPTION OF SYMBOLS FOR ELEMENTS | |
|---|---|
| 1422 | Food container body |
| 1423 | Working capacity |
| 1424 | Semiconductor element |
| 1425 | Heat releasing end |
| 1426 | High heat transfer, heat transfer pipe |
| 1427 | Bottle |
| 1428 | Drinks |
| 1429 | Heat transfer element |
| 1430 | Bottle lid |
| 1431 | Radiating fin |
| 1432 | Fan |
| 1501 | Machine center guiding track |
| 1502 | Circular cavity |
| 1503 | Machine center arbor |
| 1504 | Front bearings |
| 1505 | Annular cavity |
| 1506 | Rear bearings |
| 1507 | Cutting blade |
| 1508 | Directing segment |
| 1509 | Grip portion |
| 1510 | Hollow structure |
| 1511 | Cutting segment |
| 1512 | Shank |
| 1513 | Hollow structure |
| 1514 | Plastic-injecting mold |
| 1515 | Plastic-injecting gate |
| 1516 | Cooling water sump |
| 1517 | Heat transfer element |
| 1518 | Fin |
| 1519 | Plastic-injecting products |
| 1520 | High-polymer extruding machine screw rod |
| 1521 | Screw fin |
| 1522 | Radiating fin |
| 1523 | Cavity |
| 1524 | Tipper claw |
| 1525 | Axle |
| 1526 | Tipper claw support |
| 1527 | Cavity |
| 1601 | Heat absorbing brick |
| 1602 | Radiating fin |
| 1603 | Heat transfer element |
| 1604 | Base |
| 1605 | Micro tubular heat transfer element |
| 1606 | Radiator support |
| 1607 | Crystal triode |
| 1608 | Screw |
| 1609 | Isinglass |
| 1610 | IC element |
| 1611 | Radiating flange |
| 1612 | Rear panel of the amplifier |
| 1613 | Heat transfer plate element |
| 1614 | Fin |
| 1615 | Base |
| 1616 | Plate cavity heat transfer element |
| 1617 | Radiator rack |
| 1618 | Crystal triode |
| 1619 | Screw |
| 1620 | Isinglass |
| 1621 | IC element |
| 1622 | Radiating flange |
| 1623 | Rear panel of the amplifier |
| 1701 | Interface flange |
| 1702 | Exhaust channel |
| 1703 | Ventilator |
| 1704 | Heat transfer pipe |
| 1705 | Side board |
| 1706 | Iron hoop |
| 1707 | Magnetic core |
| 1708 | Heat transfer element |
| 1709 | Radiating flange |
| 1710 | Low voltage coil |
| 1711 | High voltage coil |
| 1712 | Oil tank lid of adapter |
| 1713 | Oil tank of adapter |
| 1714 | High heat transfer pipe used by radiator of adapter system |
| 1715 | Adapter core |

-continued

| DESCRIPTION OF SYMBOLS FOR ELEMENTS | |
|---|---|
| 1716 | Coil and insulator of adapter |
| 1717 | Adapter oil |
| 1718 | Retaining flange |
| 1719 | Fin at radiating end of high heat transfer, heat transfer pipe |
| 1720 | Electrical machinery rotor core |
| 1721 | Electrical machinery stator core |
| 1722 | Stator heat transfer element |
| 1723 | Rotor heat transfer element |
| 1724 | Electrical machinery stator wiring |
| 1725 | Rotor fan blade |
| 1726 | Electrical machinery cooling fan |
| 1727 | Rotor core and conductor |
| 1728 | Working liquid of heat transfer pipe |
| 1729 | Rotor fan blade |
| 1730 | Heat transfer electrical machinery spindle |
| 1731 | Oil intake of intensive magnetic unit cooler in mineral plant |
| 1732 | Water outlet of intensive magnetic unit cooler in mineral plant |
| 1733 | Heat transfer pipe of intensive magnetic unit cooler in mineral plant |
| 1734 | Pipe box of intensive magnetic unit cooler in mineral plant |
| 1735 | Water intake of intensive magnetic unit cooler in mineral plant |
| 1736 | Oil outlet of intensive magnetic unit cooler in mineral plant |
| 1737 | Partition of intensive magnetic unit cooler in mineral plant |
| 1738 | Glass shield of X-ray machine |
| 1739 | Electric gun of X-ray machine |
| 1740 | Electron beam |
| 1741 | Metal target of X-ray machine |
| 1742 | Copper positive of X-ray machine |
| 1743 | X-ray machine cooler high heat transfer medium |
| 1744 | Radiating fin |
| 1745 | X-ray |
| 1746 | Window |
| 1747 | Cup type rotor |
| 1748 | Outer stator core |
| 1749 | Inner stator core |
| 1750 | Radiating flange |
| 1751 | Motor fan |
| 1752 | End cap |
| 1753 | Plate heat transfer element |
| 1754 | Venetian-blind radiating flange |
| 1755 | Base of the radiator |
| 1756 | Hydraulic system cylinder body |
| 1757 | Heat transfer elements used by hydraulic oil radiator |
| 1758 | Electric heater |
| 1759 | Hydraulic system cylinder cover |
| 1760 | Swivel |
| 1761 | Bearing base |
| 1762 | Bearing |
| 1763 | Bearing base |
| 1764 | Bearing |
| 1765 | Mechanical transmission shaft |
| 1766 | Medium cavity |
| 1767 | Arbor precision machine |
| 1768 | Front bearing of arbor of precision machine |
| 1769 | High heat transfer medium used by cooler of arbor of precision machine |
| 1770 | Rear bearing of arbor of precision machine |
| 1771 | Table shoulder of arbor of precision machine |
| 1772 | Welded cooling water outlet |
| 1773 | Welded cooling water intake |
| 1774 | Welded water heat exchange container |
| 1775 | Welded heat transfer pipe |
| 1776 | Welded heat transfer brick |
| 1777 | Large power pump |
| 1778 | Cooler |
| 1779 | Filter |
| 1780 | Oil pump |
| 1781 | High heat transfer element of pumping system cooler |
| 1782 | Cooler casing |
| 1783 | Cooler fan |

-continued

| DESCRIPTION OF SYMBOLS FOR ELEMENTS | |
|---|---|
| 1784 | Electrically heated high heat transfer, heat transfer cooling reactor for reactor vessel |
| 1785 | Reactor vessel support |
| 1786 | Reactor solvent |
| 1787 | Heat transfer pipe (two-way) of electrically heated high heat transfer, heat transfer cooling reactor |
| 1788 | Reactor vessel cover |
| 1789 | Coolant medium channel |
| 1790 | Electric heating system |
| 1791 | High heat transfer pipe radiating fin |
| 1792 | Steam heated, high heat transfer, heat transfer cooling reactor for reactor vessel |
| 1793 | Reactor vessel support |
| 1794 | Reactor solvent |
| 1795 | Heat transfer pipe of steam heated, high heat transfer, heat transfer cooling reactor |
| 1796 | Reactor vessel cover |
| 1797 | Steam channel |
| 1798 | High heat transfer pipe radiating fin |
| 1799 | Steam flow controller |
| 1801 | Radiating fin |
| 1802 | tubular high heat transfer heat element |
| 1803 | Oil tank casing |
| 1804 | Mineral oil heat carrier |
| 1805 | Independently packed cement |
| 1806 | Radiating fin |
| 1807 | Cover |
| 1808 | Heat transfer pipe |
| 1809 | Vehicular body |
| 1810 | Heat transfer pipe body |
| 1811 | Sleeve |
| 1812 | Radiating fin |
| 1813 | Cavity |
| 1814 | Heat transfer pipe of plate type radiator |
| 1815 | Left seal |
| 1816 | Hot fluid intake |
| 1817 | Right seal |
| 1818 | Hot fluid outlet |
| 1901 | Fixed thermal insulating layer |
| 1902 | Pebble |
| 1903 | Inorganic heat transfer element |
| 1904 | Mobile thermal insulating layer |
| 1905 | PE film |
| 1906 | Solar energy collector |
| 1907 | Inorganic heat transfer element (cooling segment) |
| 1908 | Thermal insulating layer |
| 1909 | Inorganic heat transfer element (coated heating segment) |
| 1910 | Thermal insulating layer |
| 1911 | Vacuum tube |
| 1912 | Inorganic heat transfer element (heating segment with fins) |
| 1913 | Canopy |
| 1914 | Inorganic heat transfer element |
| 1915 | Soil |
| 2001 | Inorganic high heat transfer element (needle tip) |
| 2002 | Heat/cold storage medium |
| 2003 | Heat insulating handle |
| 2004 | Rear cover |
| 2005 | Conductive wire |
| 2006 | Electric heating cone |
| 2007 | Inorganic heat transfer pipe element |
| 2008 | Inorganic high heat transfer element (needle tip) |
| 2009 | Controller |
| 2010 | Thermal insulating layer |
| 2011 | Ice cube |
| 2012 | Inorganic heat transfer element |
| 2013 | Connecting pipe |
| 2014 | Working cavity |
| 2015 | Electric heater |
| 2016 | Thermal insulating layer |
| 2017 | Vibration-transmission guiding rod |
| 2018 | Seal ring |
| 2019 | Vibrating plate |
| 2020 | Plate connector |
| 2021 | Axle pin |
| 2022 | Seal ring |

-continued

| DESCRIPTION OF SYMBOLS FOR ELEMENTS | |
|---|---|
| 2023 | Compressive spring |
| 2024 | Adjusting screw cap |
| 2025 | Hot wind channel |
| 2026 | Cold wind channel |
| 2027 | Inorganic heat transfer element |
| 2028 | Box |
| 2029 | Angle steel |
| 2030 | Bearing sleeve |
| 2031 | Angle steel |
| 2032 | Compressive spring (tower type) |
| 2033 | Spherical seal |
| 2034 | Intermediate partition |
| 2035 | Lug base |
| 2036 | Ring tank |
| 2037 | Spherical insulating ring |
| 2101 | Inorganic heat transfer element |
| 2102 | Crucible |
| 2103 | Electric heater |
| 2104 | Zirconium oxide insulation cap |
| 2105 | Thermal insulating layer |
| 2106 | Lifting mechanism |
| 2107 | Inorganic heat transfer pipe |
| 2108 | Furnace chamber |
| 2109 | Smoke entrance pipe fitting |
| 2110 | Cracked gas access pipe fitting |
| 2111 | Tube sheet |
| 2112 | Inorganic heat transfer base pipe |
| 2113 | Aluminum leaf |
| 2114 | Partition |
| 2115 | Canopy |
| 2116 | Wall body |
| 2117 | Air conditioning unit |
| 2118 | Inorganic heat transfer building complex energy-saving ventilation system |
| 2119 | Wind outlet pipe |
| 2120 | Return air pipe |
| 2121 | Casing |
| 2122 | Fin |
| 2123 | Inorganic heat transfer pipe |
| 2124 | Tube sheet |
| 2125 | Intake ventilator |
| 2126 | Filter screen |
| 2127 | Outlet Ventilator |
| 2128 | Fermentation container |
| 2129 | Inorganic heat transfer element |
| 2130 | Electric heater |
| 2131 | Reactor |
| 2132 | Inorganic heat transfer element |
| 2133 | Electric heater |
| 2134 | Heat collecting segment |
| 2135 | Heat insulating segment |
| 2136 | Heat receiving segment (roadside) |
| 2137 | Cooling end of inorganic heat transfer element |
| 2138 | Transmitting end of inorganic heat transfer element |
| 2139 | Insulated thermal insulating layer |
| 2140 | Heating end of inorganic heat transfer element |
| 2141 | Rib |
| 2142 | Soil |
| 2143 | Inorganic heat transfer element |
| 2144 | Thermal insulating shield |
| 2145 | Crucible |
| 2146 | Electric heater |
| 2147 | Bearing elevating platform |
| 2148 | Lifting mechanism |
| 2149 | South panel |
| 2150 | North panel |
| 2151 | Inorganic heat transfer element |
| 2201 | Supply bucket |
| 2202 | Water intake valve |
| 2203 | Solar water heater |
| 2204 | Water outlet valve |
| 2205 | Plate type inorganic heat transfer solar collector |
| 2206 | Plate type inorganic heat transfer air radiator |
| 2207 | Canopy for vegetable planting |
| 2208 | Geothermal water heater |
| 2209 | Water storage |
| 2210 | Pump |

-continued

| DESCRIPTION OF SYMBOLS FOR ELEMENTS | |
|---|---|
| 2211 | Tubular heat transfer element |
| 2212 | Geothermal energy |
| 2213 | Supply bucket |
| 2214 | Water intake valve |
| 2215 | Solar water heater |
| 2216 | Water outlet valve |
| 2217 | Plate type inorganic heat transfer solar collector |
| 2218 | Pound heater |
| 2219 | Fishery pound |
| 2220 | Geothermal water heater |
| 2221 | Water storage basin |
| 2222 | Pump |
| 2223 | Tubular heat transfer element |
| 2224 | Geothermal energy |
| 2301 | Cooling and moisture trapping system |
| 2302 | Water drain |
| 2303 | Water collecting tank |
| 2304 | Radiating flange |
| 2305 | Inorganic heat transfer element |
| 2306 | Heat filler |
| 2307 | Power interface |
| 2308 | Semiconductor made cold production system |
| 2309 | Heating system |
| 2310 | Fan |
| 2311 | Soil |
| 2312 | Inorganic heat transfer element |
| 2313 | Fridge |
| 2401 | Air intake pipe |
| 2402 | Air outlet pipe |
| 2403 | Smoke intake pipe |
| 2404 | Smoke outlet pipe |
| 2405 | Air intake pipe |
| 2406 | Air outlet pipe |
| 2407 | Smoke intake pipe |
| 2408 | Smoke outlet pipe |
| 2409 | Bearing pipe sheet |
| 2410 | Inorganic high heat transfer pipe |
| 2411 | Air intake |
| 2412 | Air outlet |
| 2413 | Smoke intake |
| 2414 | Smoke outlet |
| 2415 | Inorganic heat transfer element |
| 2416 | Coke furnace lift pipe |
| 2417 | Continuous casting machine |
| 2418 | Inorganic heat transfer element |
| 2419 | Continuous casting blank |
| 2422 | Intermediate tube sheet |
| 2423 | Smoke side tube sheet |
| 2424 | Smoke intake |
| 2425 | Inorganic high heat transfer pipe |
| 2426 | Side board |
| 2427 | Smoke outlet |
| 2428 | Intermediate partition |
| 2429 | Air outlet |
| 2430 | Air intake |
| 2431 | Side air tube sheet |
| 2432 | End thermal insulating layer |
| 2433 | Smoke side tube sheet |
| 2434 | Inorganic high heat transfer pipe |
| 2435 | Smoke intake |
| 2436 | Smoke outlet |
| 2437 | Smoke side plate |
| 2438 | Water side tube sheet |
| 2439 | Water tank |
| 2440 | Soft water intake |
| 2441 | Soft water outlet |
| 2442 | Inorganic high heat transfer pipe bank |
| 2443 | Soot cleaning hole |
| 2444 | Man-hole |
| 2451 | Smoke outlet |
| 2452 | Soot cleaning door |
| 2453 | Upper pipe box |
| 2454 | Partition |
| 2455 | Intermediate tube sheet |
| 2456 | Lower pipe box |
| 2457 | Intermediate tube sheet |
| 2458 | Flue channel |

-continued

| DESCRIPTION OF SYMBOLS FOR ELEMENTS | |
|---|---|
| 2459 | Smoke intake |
| 2460 | Soot blowing hole |
| 2461 | Air outlet |
| 2462 | Ventilation channel |
| 2463 | Heat transfer pipe |
| 2464 | Side tube sheet |
| 2465 | Air intake |
| 2466 | Ceramic layer |
| 2467 | Positioning handle |
| 2468 | Press plate |
| 2469 | Spring |
| 2470 | Screw cap |
| 2471 | Casing |
| 2472 | Inorganic high heat transfer element |
| 2473 | U-type channel |
| 2474 | Smoke intake |
| 2475 | Base I |
| 2476 | Boiler drum |
| 2477 | Low temperature water supply |
| 2478 | Stream outlet |
| 2479 | Smoke outlet |
| 2480 | Base II |
| 2481 | Back base |
| 2482 | Ash cylinder |
| 2483 | Boiler drum |
| 2484 | Heat pipe |
| 2485 | Flue channel |
| 2486 | Inorganic high heat transfer pipe |
| 2487 | Sleeve |
| 2488 | Fin |
| 2489 | Smoke outlet |
| 2490 | Smoke chamber |
| 2491 | Vortex refracting plate in the smoke chamber |
| 2492 | Vortex scroll casing |
| 2493 | Partition |
| 2494 | Air chamber |
| 2495 | Vortex refracting plate in the air chamber |
| 2496 | Heat pipe |
| 2497 | Hot air outlet |
| 2498 | Liquid container (boiler drum) |
| 2499 | Cold gas medium channel |
| 2500 | Hot gas medium channel |
| 2501 | Inorganic high heat transfer element |
| 2502 | Technical gas intake |
| 2503 | Soft water intake |
| 2504 | Medium pressure waste boiler |
| 2505 | Low pressure waste boiler |
| 2506 | Technical gas outlet |
| 2507 | Coal saver |
| 2508 | Soft water intake |
| 2509 | Low pressure stream outlet |
| 2510 | Medium pressure stream outlet |
| 2511 | Converter |
| 2512 | High temperature heat exchanger |
| 2513 | Medium temperature heat exchanger |
| 2514 | Low temperature heat exchanger |
| 2515 | Air cooler |
| 2516 | Blower |
| 2517 | Sulfur trioxide absorbing tower |
| 2518 | Inorganic high heat transfer heat sulfur trioxide heat exchanger |
| 2519 | Steam dome |
| 2520 | Inorganic heat transfer device |
| 2521 | Cylinder wall |
| 2522 | Closure structure |
| 2523 | Water jacket |
| 2524 | Inorganic high heat transfer pipe |
| 2525 | Sleeve |
| 2526 | Fin |
| 2527 | Upper cylinder |
| 2528 | Flow conductor |
| 2529 | Heat pipe |
| 2530 | Partition |
| 2531 | Connecting pipe |
| 2532 | Connecting pipe |
| 2533 | Bolt cap |
| 2534 | Flange |

-continued

| DESCRIPTION OF SYMBOLS FOR ELEMENTS | |
|---|---|
| 2535 | Flange |
| 2536 | Connecting pipe |
| 2537 | Lower cylinder |
| 2538 | Flow conductor |
| 2539 | Connecting pipe |
| 2540 | Connecting pipe |
| 2541 | Heat pipe |
| 2543 | Flow conductor |
| 2545 | Coke furnace |
| 2546 | Coke director |
| 2548 | Coke carrier |
| 2549 | Dust vacuuming equipment |
| 2550 | Elevating machine |
| 2551 | Coke loading equipment |
| 2552 | Drying extinguishing tank |
| 2553 | Coke exhaust device |
| 2554 | Coke carrying line |
| 2555 | Primary dust remover |
| 2556 | Afterheat boiler |
| 2557 | Secondary dust remover |
| 2558 | Blower |
| 2559 | Bypass valve |
| 2562 | Coke powder transporting device |
| 2564 | Air intake pipe |
| 2565 | Air outlet pipe |
| 2566 | Smoke intake pipe |
| 2567 | Smoke outlet |
| 2568 | Metal pipe |
| 2569 | Fin |
| 2570 | Flange |
| 2571 | Ash blow pipe |
| 2572 | Thermal insulating layer |
| 2573 | Air intake pipe |
| 2574 | Air outlet pipe |
| 2575 | Smoke intake pipe |
| 2576 | Blow pipe port |
| 2578 | Smoke outlet pipe |
| 2579 | Metal pipe |
| 2580 | Fin |
| 2581 | Flange |
| 2582 | Thermal insulating layer |
| 2583 | Smoke intake |
| 2584 | Inorganic high heat transfer unit |
| 2585 | Air intake |
| 2601 | Absorbing bed |
| 2602 | Upper linking pipe |
| 2603 | Heat intake |
| 2604 | Lower linking pipe |
| 2605 | High heat transfer, heat transfer medium |
| 2606 | Absorbing and cooling solutions |
| 2700 | High-current off-phase close bus air cooling system |
| 2701 | Heat transfer air cooler |
| 2702 | 60° C. hot air side outlet |
| 2703 | 80° C. hot air side intake |
| 2704 | 40° C. hot air side intake |
| 2705 | 60° C.□ hot air side outlet |
| 2706 | Cooling medium intake |
| 2707 | Radiating flange |
| 2708 | Cooling medium outlet |
| 2709 | Heat transfer element of cooling system of heavy machine linkage part |
| 2710 | Heavy machine linkage part |
| 2711 | Vehicular wheel |
| 2712 | Brake |
| 2713 | Heat transfer element (with a fin at the end) of the speed radiator of brake system |
| 2714 | Low temperature heat source |
| 2715 | Combustion chamber |
| 2716 | Circulating water |
| 2717 | Heat transfer element (with a fin at the end) of diesel engine cooling system |
| 2718 | Low temperature heat source (serving as an afterheat recovery device) |
| 2719 | Bearing |
| 2720 | Heat transfer element used on bearing (with a fin at the end) |

-continued

| DESCRIPTION OF SYMBOLS FOR ELEMENTS | |
|---|---|
| 2721 | Low temperature heat source |
| 2722 | Turbo charger |
| 2723 | Heat transfer of the turbo charger cooler element (with a fin at the end) |
| 2724 | Low temperature heat source (serving as an afterheat recovery device) |
| 2725 | Combustion chamber |
| 2726 | Circulating water |
| 2727 | Heat transfer element (with a fin at the end) of gasoline engine cooling system |
| 2728 | Low temperature heat source (serving as an afterheat recovery device) |
| 2729 | Heat transfer element of car radiator |
| 2730 | Sleeve |
| 2731 | Radiating fin |
| 2732 | Water tank |
| 2733 | Water outlet pipe |
| 2734 | Heat transfer pipe |
| 2735 | Radiating fin |
| 2736 | Sleeve |
| 2737 | Pipe box |
| 2738 | Water intake |
| 2739 | Electric equipment |
| 2740 | Heat transfer pipe heat exchanger |
| 2741 | Air intake hole |
| 2741a | Air intake hole |
| 2742 | Air exhaust hole |
| 2742a | Air exhaust hole |
| 2743 | Fan |
| 2743a | Fan |
| 2744 | Heat absorbing segment |
| 2745 | Heat-dissipating segment |
| 2746 | Lifting pipe |
| 2747 | Lowering pipe |
| 2748 | Heat transfer pipe of mixing radiator |
| 2749 | Rotary shaft |
| 2750 | Compressed gas |
| 2751 | Circulating water |
| 2752 | Heat transfer element (with a fin at the end) of compressed steam cooler |
| 2753 | Low temperature heat source (serving as an afterheat recovery device) |
| 2754 | Heat generating equipment |
| 2755 | Heat receiving end of heat transfer element |
| 2756 | Lower connecting pipe |
| 2757 | Cooling solution intake |
| 2758 | Cooking end of the heat transfer element |
| 2759 | Cooling equipment |
| 2760 | Cooling solution outlet |
| 2761 | Upper connecting pipe |
| 2762 | Molten metal intake |
| 2763 | High heat transfer, heat transfer medium |
| 2764 | Cooling pipe bundle |
| 2765 | Non-crystal stick material outlet |
| 2766 | Boiler drum |
| 2767 | Heat transfer pipe |
| 2768 | Rear wall of boiler |
| 2769 | Rear arc |
| 2770 | Front arc |
| 2771 | Support |
| 2772 | Sleeve |
| 2801 | Mixer |
| 2802 | Reactor vessel |
| 2803 | Heat transfer element |
| 2804 | Jacket |
| 2805 | Heater |
| 2806 | Canister body |
| 2807 | Heavy oil |
| 2808 | Heat transfer element |
| 2809 | Heat source |
| 2810 | Inorganic high heat transfer medium |
| 2811 | Elevating ring |
| 2812 | Metal pipe |
| 2813 | Radiating flange |

DETAILED DESCRIPTION OF THE INVENTION AND THE PREFERRED EMBODIMENTS

Composition

The heat transfer medium used in the present invention, typically in an inorganic nature, may be deemed as a composition. The composition comprises or alternatively speaking, consists essentially of the following compounds mixed together in the ratios or amounts listed below. The amounts as listed may be scaled up or down as needed to produce a desired amount. Although the compounds are preferably mixed in the order shown, they need not be mixed in that order.

Cobaltic Oxide ($Co_2O_3$), 0.5%–1.0%, preferably 0.7–0.8%, most preferably 0.723%;

Boron Oxide ($B_2O_3$), 1.0%–2.0%, preferably 1.4–1.6%, most preferably 1.4472%;

Calcium Dichromate ($CaCr_2O_7$), 1.0%–2.0%, preferably 1.4–1.6%, most preferably 1.4472%;

Magnesium Dichromate ($Mg_2Cr_2O_7$□$6H_2O$), 10.0%–20.0%, preferably 14.0–16.0%, most preferably 14.472%;

Potassium Dichromate ($K_2Cr_2O_7$), 40.0%–80.0%, preferably 56.0–64.0%, most preferably 57.888%

Sodium Dichromate ($Na_2Cr_2O_7$), 10.0%–20.0%, preferably 14.0–16.0%, most preferably 14.472%;

Beryllium Oxide (BeO), 0.05%–0.10%, preferably 0.07–0.08%, most preferably 0.0723%;

Titanium Diboride ($TiB_2$), 0.5%–1.0%, preferably 0.7–0.8%, most preferably 0.723%;

Potassium Peroxide ($K_2O_2$), 0.05%–0.10%, preferably 0.07–0.08%, most preferably 0.0723%;

A selected metal or Ammonium Dichromate ($MCr_2O_7$), 5.0%–10.0%, preferably 7.0–8.0%, most preferably 7.23%, where "M" is selected from the group consisting of potassium, sodium, silver, and ammonium.

Strontium Chromate ($SrCrO_4$), 0.5%–1.0%, preferably 0.7–0.8%, most preferably 0.723%; and, Silver Dichromate ($AgCr_2O_7$), 0.5%–1.0%, preferably 0.7–0.8%, most preferably 0.723%;

The percentages as expressed above are those of the final composition by weight, once the composition has been dried to remove the added water.

A most highly preferred composition used in the present invention is made in accordance with the following contents, in which the following inorganic compounds are added in the amounts shown below, with a variation within +/−0.10% of each compound, and in the manner discussed below:

Cobaltic Oxide ($Co_2O_3$), 0.01 g;

Boron Oxide ($B_2O_3$), 0.02 g;

Calcium Dichromate ($CaCr_2O_7$), 0.02 g;

Magnesium Dichromate ($MgCr_2O_7$□$6H_2O$), 0.2 g;

Potassium Dichromate ($K_2Cr_2O_7$), 0.8 g;

Sodium Dichromate ($Na_2Cr_2O_7$), 0.2 g;

Beryllium Oxide (BeO), 0.001 g;

Titanium Diboride ($TiB_2$), 0.01 g;

Potassium Peroxide ($K_2O_2$), 0.001 g;

A selected metal or Ammonium Dichromate ($MCr_2O_7$), 0.1 g; where "M" is selected from the group consisting of potassium, sodium, silver, and ammonium;

Strontium Chromate ($SrCrO_4$), 0.01 g; and

Silver Dichromate ($Ag_2Cr_2O_7$), 0.01 g, start here

The compounds are added sequentially in the order as listed above to a container containing 100 ml of generally pure, preferably twice-distilled, water until dissolved. The mixture is mixed at ambient temperature, e.g., about 18–20° C., and then preferably heated to a temperature in the range of 55–65° C., preferably at about 60° C., and then stirred and mixed at such temperature for, e.g., about 20 minutes, until complete dissolution is attained. The composition is then ready for application.

The heat transfer medium used in the present invention may be applied to any suitable substrate, e.g., placed upon a metal pipe or even glass pipe, so long as the chosen surface is substantially free of metallic oxides, grease or oils. To optimize the quality of the resulting heat transfer composition, it is preferable to apply the composition in a very low humidity environment, e.g., 35–37% relative humidity, in any event less than about 40% relative humidity. It is also desirable to apply the composition to a closed volume that is isolated from water (vaporous or liquid) once applied.

To achieve desirable heat conductivity in a heat transfer pipe or cavity containing the composition, the quantity of the heat transfer medium added to the chamber is dependent on the volume of that cavity. Preferably, the ratio of the volume of the composition used in the invention to the cavity volume is desirably maintained within the range of 0.001 to 0.025, preferably 0.01 to 0.025, best at the ratios of 0.025, 0.02, 0.0125, and 0.01. There is no need to perform any pre-coating step to the pipe. Once the cavity or pipe is packed or filled with desirable amount of the medium, it is heated up to 120° C. to permit evaporation of the twice-distilled water. The pipe or cavity is then sealed and is ready for use as a heat transfer device.

The amount of the heat transfer medium used to prepare the transfer pipe may be varied according to the intended use of the finished products. The preparation of the improved medium and the manufacture of a high heat transfer surfaces or transmission pipe using the heat transfer medium of the present invention may be achieved and completed in one single step.

The improved medium may be operated at a temperature range of 70–1800° C. without losing its characteristics. The surface may be constructed in various shapes pursuant to the shapes of the intended products without being restricted by any construction angles. For instance, the pipe may be made in a straight, curved, zigzag, grid, spiral, or an undulating shape. The pipe can then be applied to a variety of fields of application uses pursuant to the external dimensions.

It has been observed that thermal conductivities and heat transfer rates for the medium used in the present invention exceed 32,000 times that of pure, metallic silver.

It should be noted that if the components of the improved medium are combined in an order not consistent with the listed sequence, the medium can become unstable and may result in a catastrophic reaction. Further, should metals be used as substrates for the medium of the present invention, it is recommended that the metal be clean, dry, and free of any oxides or scales. This can be accomplished by conventional treatment including, for example, sand blasting, weak acid washing, or weak base washing. Any materials used to clean and treat the pipe should be completely removed and the inner pipe surface also should be dry prior to adding the medium to pipe. The following section will elaborate on the technical content of the present invention, referring to some examples of non-restrictive applications.

EXAMPLE 1

A high heat transfer heat medium was prepared by the following process, and the compounds were added in the manner as discussed below:

Cobaltic Oxide ($Co_2O_3$), 0.01 g;
Boron Oxide ($B_2O_3$), 0.02 g;
Calcium Dichromate ($CaCr_2O_7$), 0.02 g;
Magnesium Dichromate ($MgCr_2O_7$□$6H_2O$), 0.2 g;
Potassium Dichromate ($K_2Cr_2O_7$), 0.8 g;
Sodium Dichromate ($Na_2Cr_2O_7$), 0.2 g;
Beryllium Oxide (BeO), 0.001 g;
Titanium Diboride ($TiB_2$), 0.01 g;
Potassium Peroxide ($K_2O_2$), 0.001 g;
A selected metal or Ammonium Dichromate ($MCr_2O_7$), 0.1 g; where "M" is selected from the group consisting of potassium, sodium, silver, and ammonium;
Strontium Chromate ($SrCrO_4$), 0.01 g; and
Silver Dichromate ($Ag_2Cr_2O_7$), 0.01 g.

The compounds were added sequentially in the order as listed above to a container containing 100 ml of twice-distilled water until dissolved. The mixture was mixed at ambient temperature of 20° C. and heated to a temperature of 60° C., and then stirred and mixed at such temperature for 20 minutes, until complete dissolution was attained. The composition was then ready for application.

EXAMPLE 2

The composition obtained from Example 1 was used as a heat transfer medium. Under the relative humidity of 36%, the heat transfer medium of the present invention is applied to a substrate of a metal pipe, selected from carbon steel, stainless steel, aluminum, copper, titanium, and nickel and alloys thereof, or non-metal pipe, either glass or ceramic, and then formed into the required heat transfer elements. The selected surface of the substrate is substantially free of metallic oxides, grease or oils. To optimize the quality of the resulting heat transfer composition, it is preferable to apply the composition in any event less than about 40% relative humidity. The composition used as the heat transfer medium is sealed in the cavity of the heat transfer element after application so as to be isolated from water (vapor or liquid). The cavity can be sealed after being vacuumed if necessary.

To achieve desirable heat conductivity in a heat transfer pipe or cavity containing the composition, the mass of the heat transfer medium of the present invention applied is dependent on the volume of that cavity or pipe. The medium of the present invention is applied over the selected surface, an inner wall of the cavity or pipe, with the ratio of the composition volume to the cavity volume at 0.025, 0.02, 0.0125, or 0.01. There is no need to perform any pre-coating step to the pipe. Once the cavity or pipe is packed or filled with desirable amount of the medium, it is heated to 120° C. to permit evaporation of the twice-distilled water. The pipe or cavity is then sealed and is ready for use as a heat transfer element in a heat transfer device.

The amount of the heat transfer medium of the present invention used to prepare the pipe may also be varied according to the intended use of the finished products. The preparation of the improved medium and the manufacture of high heat transfer surfaces (of the cavity or pipe) using the heat transfer medium of the present invention may be achieved and completed in one single step.

The improved medium may be operated at a temperature range of 70–1800° C. without losing its characteristics. The surface may be constructed in various shapes pursuant to the shapes of the intended products without being restricted by any construction angles. For instances, the pipe may be made in a straight, curved, zigzag, grid, spiral, or an undulating shape. The pipe can then be applied to a variety of fields of application pursuant to the external dimensions.

A standard heat pipeline is a technique of rapidly transferring thermal energy from a source end to a sink end of the pipeline by the absorption and emission of extensive amount of latent heat during the liquid vaporization and vapor condensation, respectively. The heat transfer rate in axial direction depends on the vaporization heat of a liquid and the transformation rate between liquid and vapor. It is also restricted by some factors, such as the adjustability of materials and that the temperature and pressure should not be too high.

A heat pipe element of the present invention axially transferred heat in a rate much faster than that of any other metal bars or standard heat pipes. The pressure intensity inside the heat pipe element is much lower than that of any other heat pipes. The upper limit of the allowed temperature equals the highest temperature of application for the heat pipe element. According to the present invention, the pipe element may be designed and manufactured to meet the various requirements in size and shape. Applications of gigantic heat transfer elements mainly include geothermal snow melting, roadside ice melting, coal storage pile cooling, etc. Applications of large heat transfer elements comprise large-scale boilers, furnace pre-heaters, heat exchangers, etc. Medium heat transfer elements can be used in medium-scale boilers/pre-heaters and heat recovery boilers. Small heat transfer elements are mainly used as radiators of electric/electronic apparatus. Applications of micro heat transfer elements include radiators for electric/electronic apparatus, CPU, etc.

Figure 1A:
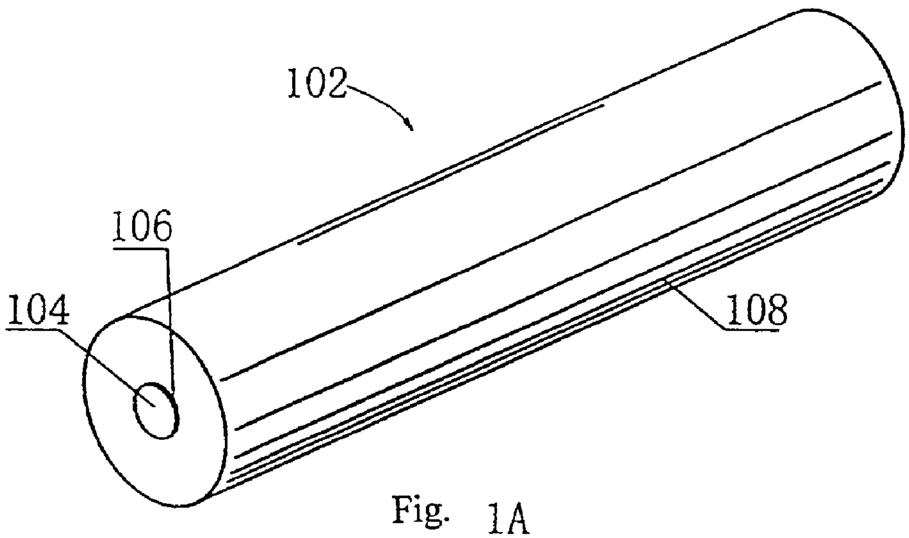
FIG. 1A shows a perspective view of heat transfer pipe element according to the present invention.
Figure 1B:
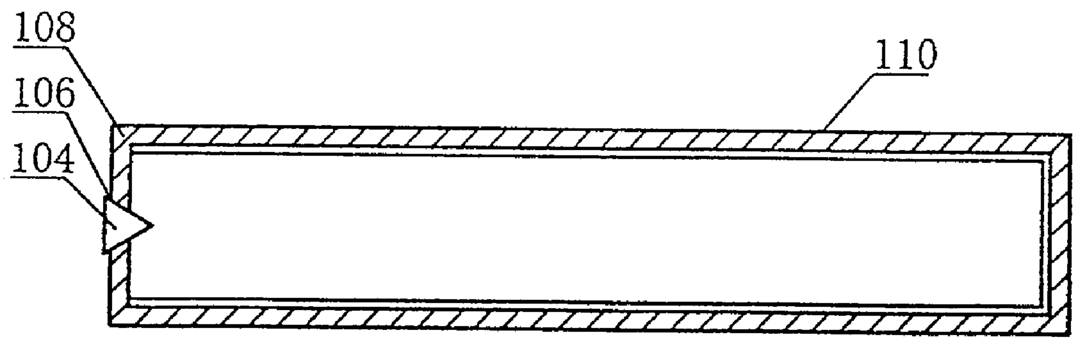
FIG. 1B shows a cross-sectional view of the element in FIG. 1.

FIGS. 1A and 1B show perspective and cross-sectional views, respectively, of the heat-transfer pipe according to the present invention. As shown in these two drawings, a heat transfer pipe element 102 comprises a heat transfer medium 110 applied to an inner wall surface of the heat transfer pipe element, a cavity 105, a pipe 108, a hole 106, and a plug 104 for sealing the hole 106.

Figure 1C:
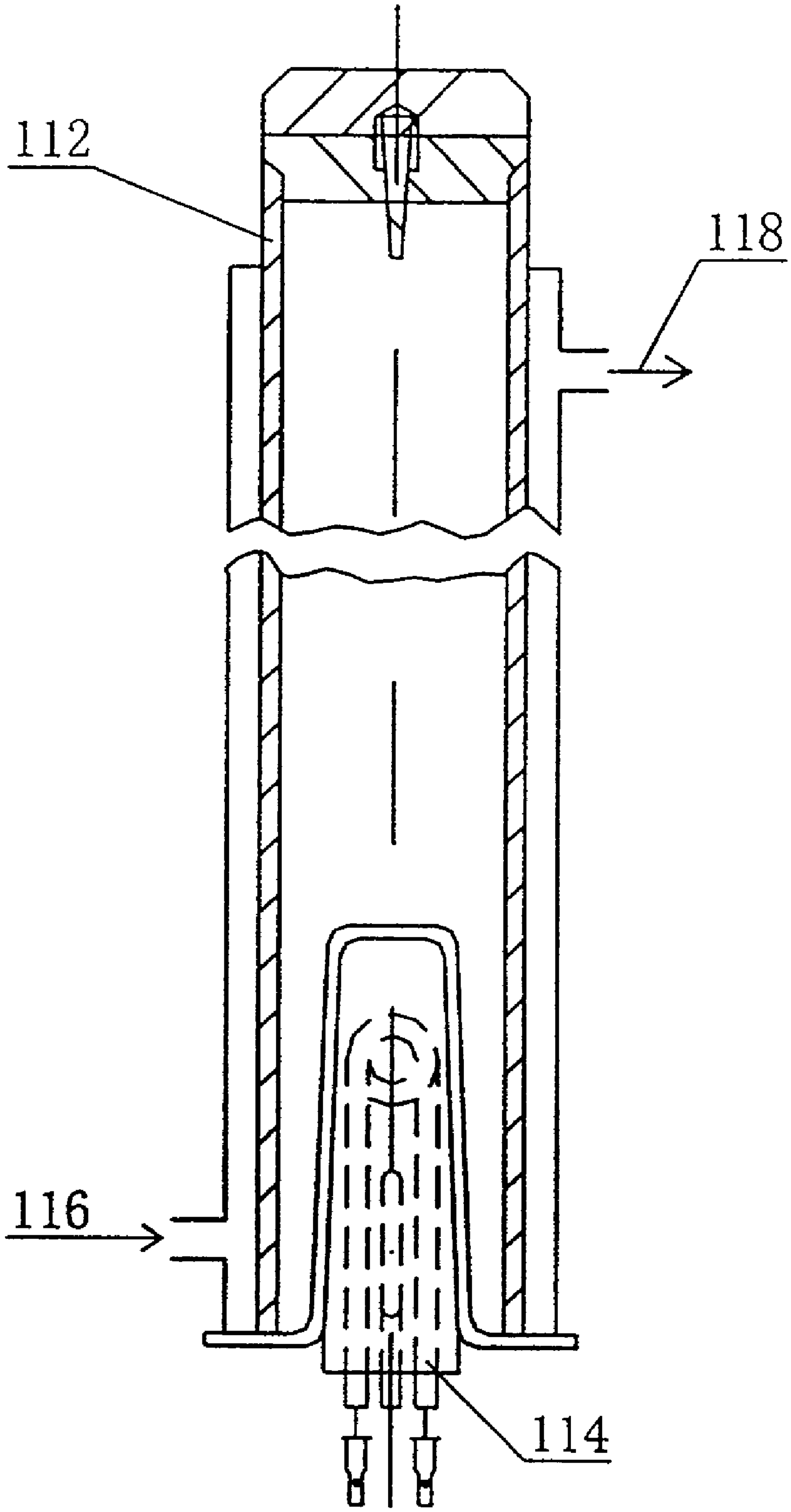
FIG. 1C shows a heat transfer pipe element with a built-in electric heating cone as heat source.
Figure 1C:
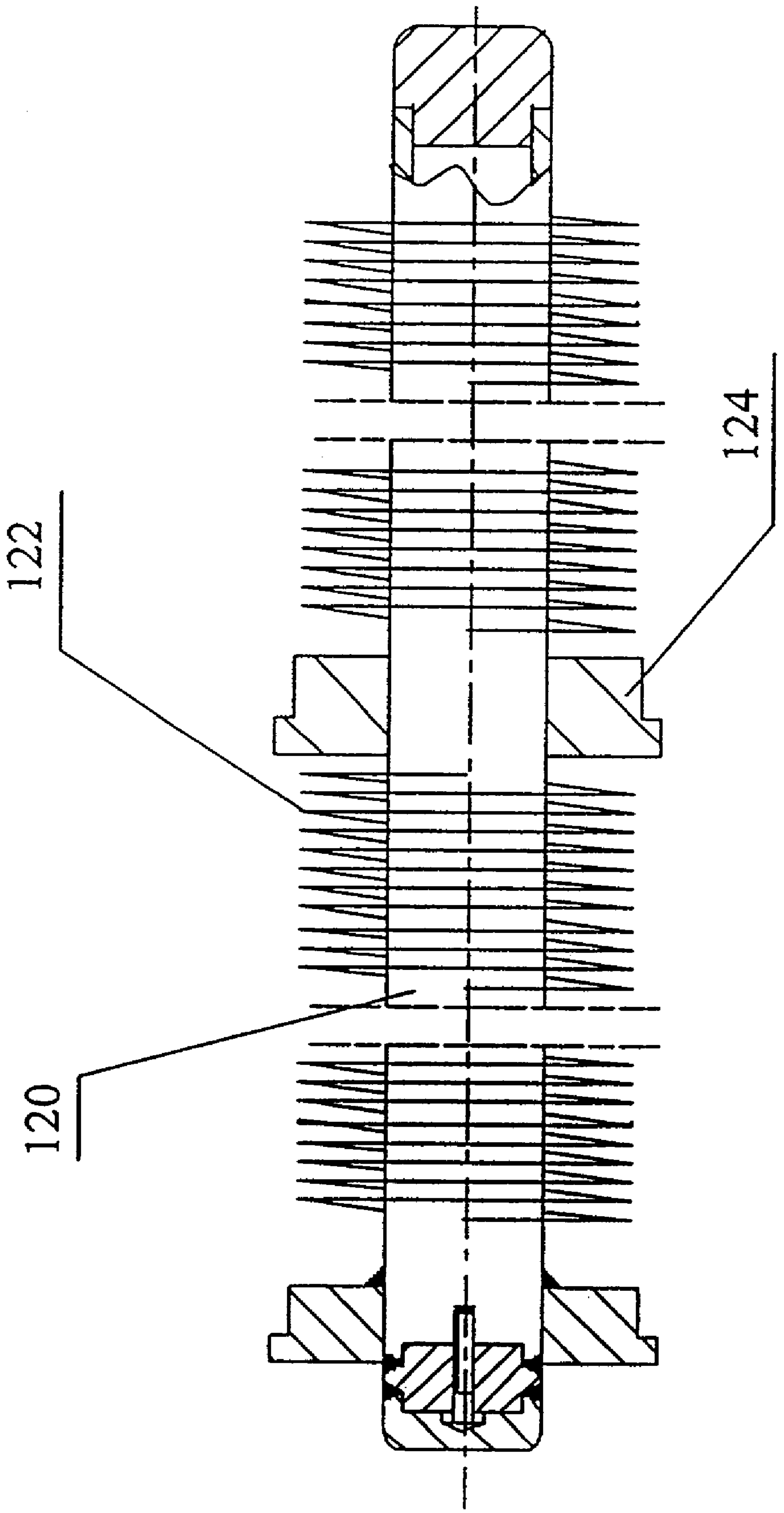
Figure 1C:
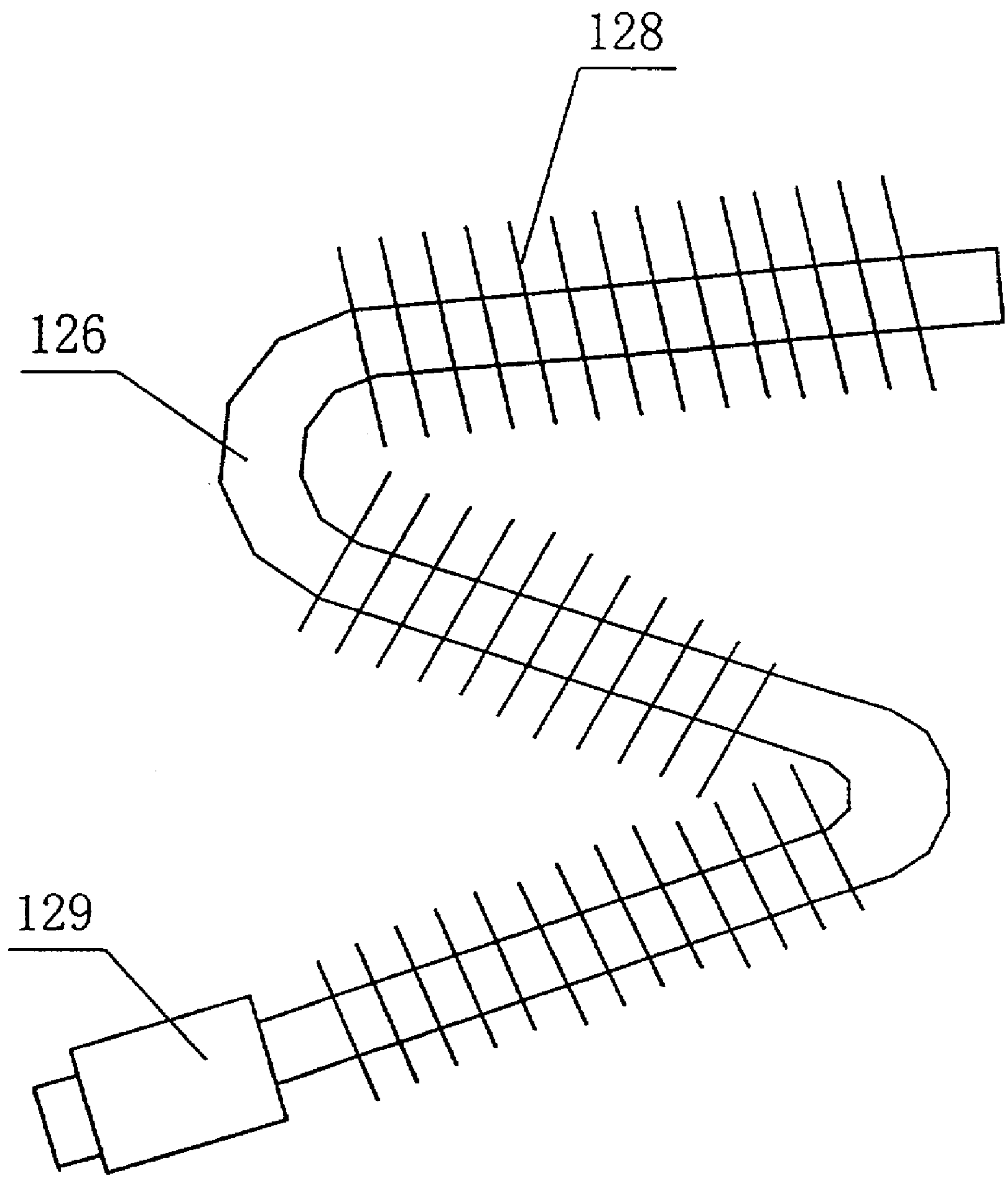
Figure 1C:
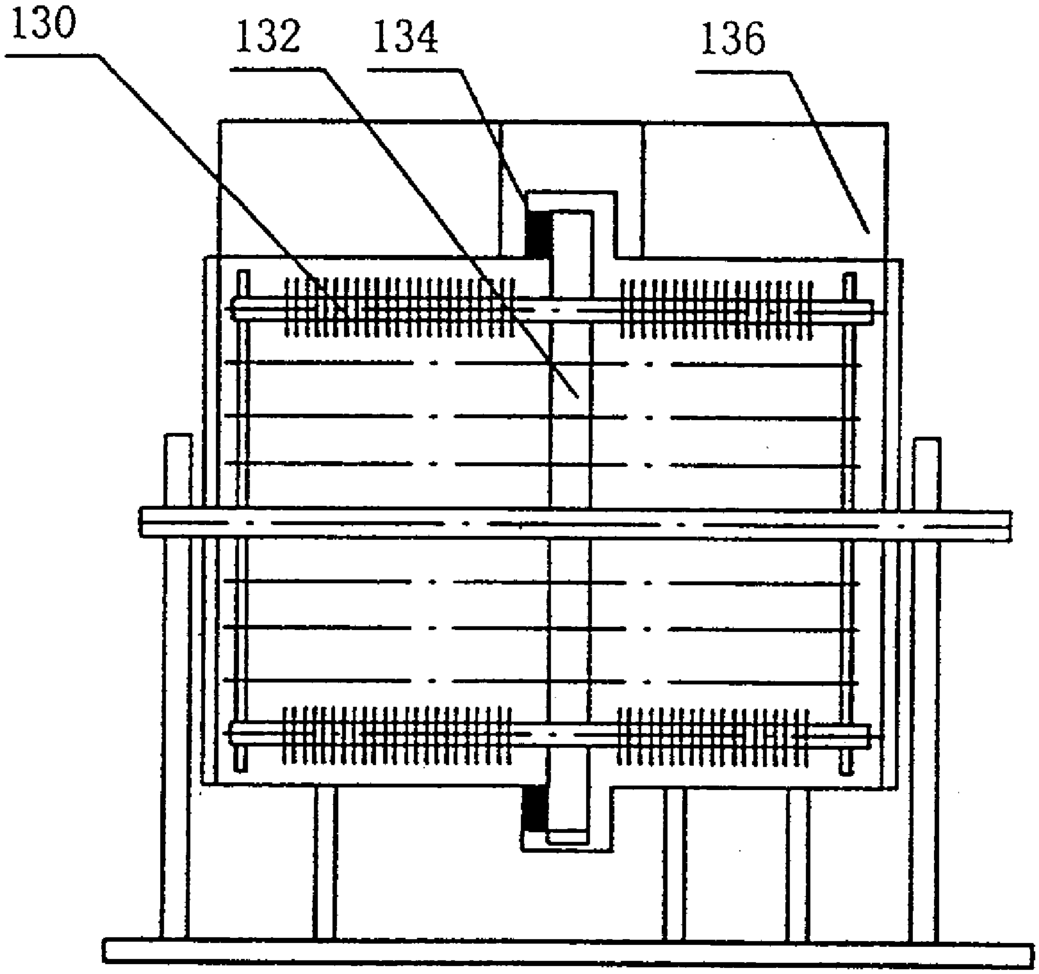

FIG. 1C shows the electric water heating part of an electric water heater, implementing a built-in electric heating cone 114 to go through the heat transfer pipe element 112, which serves as a heat source. The electric water heating part comprises the heat transfer pipe element 112 applied with the heat transfer medium to an inner wall surface as discussed in Example 1, the electric heating cone 114, and a cold water intake 116 as well as a hot water outlet 118 of a heat pipe surrounding the heat transfer pipe element 112.

To improve the heat exchange rate of the heat transfer pipe element, ribs or fins can be welded, pressed; or alternatively fabricated to the basic pipe element, as FIG. 1CA shows, in which the heat transfer element comprises a heat transfer pipe element 120, fins 122 and holders 124. FIG. 1CB shows a gas-heating device having a curved heat transfer pipe element 126 with externally connected ribs 128 and using a built-in electric heater 129 as a heat source.

The heat transfer pipe elements of the present invention may be joined to one another, referred to as a pipe-pipe element, for practical uses. The pipe-pipe element is featured with such features as efficient heat transfer rate, evenly-distributed temperature, high flexibility in assembly, and variable density of heat flow, etc. A heat exchanger made of the pipe-pipe elements is characterized by its compact or small volume and low surface dissipation, thereby increasing the heat efficiency and conserving electrical energy. The pipe-pipe elements all work independently so that damage in any end of the elements will not result in mixing of two kinds of exchange fluids. Damage in any individual pipe-pipe element will not affect the normal function of the other elements. Damage or malfunction in small parts of the pipe-pipe elements will not affect the normal operation of whole equipment.

These elements can be categorized into two groups according to its assembly measure, namely integrated pipe-pipe combination element and separated pipe-pipe combination element. The integrated pipe-pipe combination element assembles the heat transfer pipe elements of the present invention in a juxtaposed or staggered way. It is often used in applications requiring uniform heating such as thermostatic heating, flammable and explosive chemical raw materials in gaseous or liquid phase. The techniques of processing chemical gaseous and liquid raw materials can be very demanding and difficult. Most chemical fluidic raw materials are inflammable, explosive and poisonous gases, which are sometimes pressurized. Productive techniques of heating gaseous or liquid raw materials should be even and thermostatic, with elimination of any leakage.

FIG. 1CC shows a heat exchanger with spiral heat transfer pipe elements. It is an application of integrated pipe-pipe combination externally connected with ribs or fins. The application comprises heat transfer pipe elements 130, a rotary tube plate 132, a closure structure 134 and a spiral heat pipe heat exchange device body 136. The medium reflux in the designed spiral heat pipe is driven by centrifugal force and gravity, which causes a significantly higher transfer rate of heat and mass as compared to that in a connected heat pipe. This is because centrifugal force reinforces counter flow in the vaporizing segment, thereby increasing heat exchange rate in this segment and maximizing heat flux density when it is boiling. The centrifugal force in the condenser segment increases the heat transfer coefficient in the pipe by enhancing working medium reflux and reducing the thickness of the liquid film. In addition, the turning heat pipe also strengthens heat exchange between the pipe and the surrounding. The compact structure and spiral feature of the pipe also serve to resolve technical problems such as soot accumulation, soot blockage and corrosion.

Figure 1D:
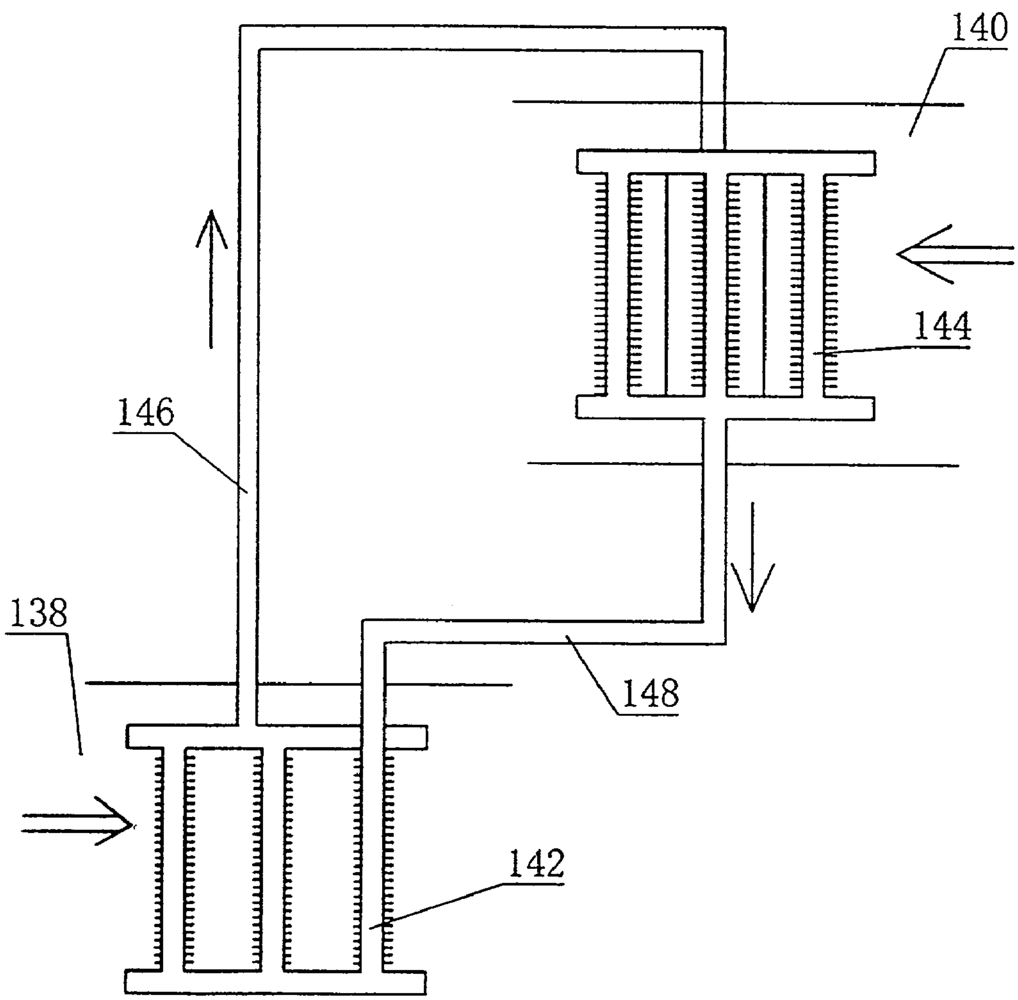
FIG. 1D shows a schematic view of a combined application of pipe elements according to this invention.

FIG. 1D shows a combined application of the heat transfer pipe element of the present invention and the separated pipe-pipe combination element. The working theory lies in that the heat receiving segment absorbs heat and then transports heat to external medium via a heat transfer pipe element in the heat-dissipating segment. In order to reinforce the entire heat exchanging cycle, ribs or fins can be applied to the pipe elements, as shown in FIG. 1CB. The separated pipe-pipe combination element is mainly used in the following applications: (1) massive heat recovery in smoke (in the rate between hundreds of thousands and millions of standard cubic meters per hour) when there is no leak of two fluids (in liquid vaporization and vapor condensation); and (2) heat dissipation in a sealed instrument cabinet producing considerable heat. In FIG. 1D, the afterheat storage 138 transports afterheat from the integrated single pipe-pipe combination 142 to the heat pipe 146 connected to the integrated single pipe-pipe combination 144. Then the afterheat travels from the integrated single pipe-pipe combination 144 to the heat recovery storage 140. Medium of lower temperature in the heat pipe 148 flows back to the heat recovery storage 138 and is heated by the integrated single pipe-pipe combination 142. This well-developed thermostatic design overcomes the problems with corrosion caused by low temperature smoke due to uneven pipe wall temperature after the on the heat pipe has been used for a certain period of time since temperature at its cold end is slightly higher than that at the hot end.

Figure 1E:
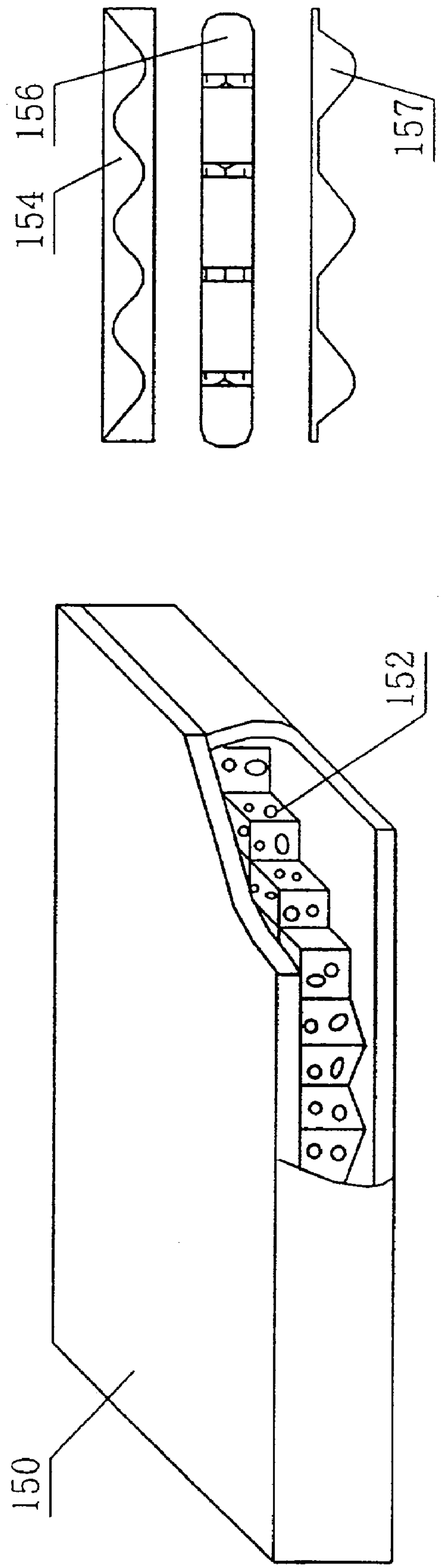
FIG. 1E shows a perspective view of heat transfer plate element according to the present invention.
Figure 1E:
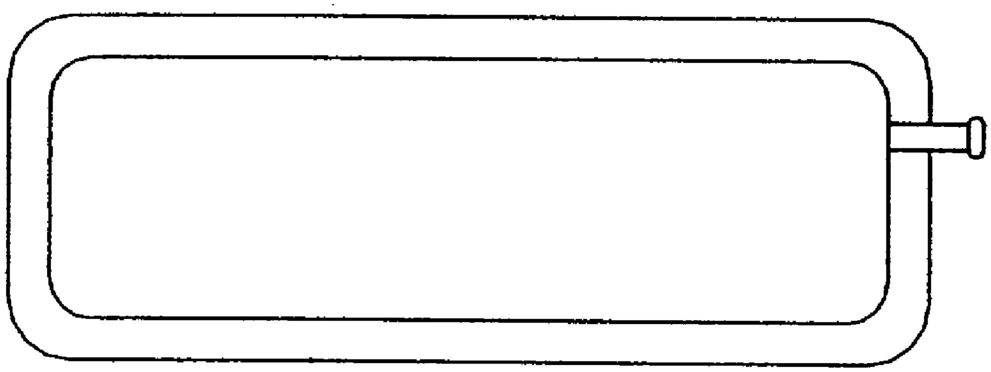
Figure 1E:
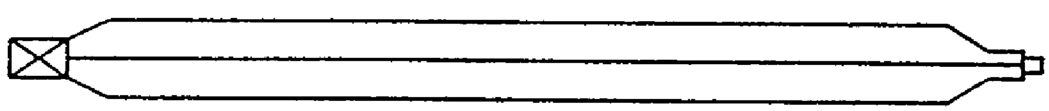

FIG. 1E shows a plate heat transfer element. One of the features of the plate element is that it creates a surface of extremely small temperature gradient, which equalizes temperature, eradicating the hot points produced by the heater. Alternatively, it can be used to produce a very effective radiator to cool the device above it. Applications of flat element lie in manufacturing thermostatic plates such as drying plates, grillers, radiators for electronic device or electric appliance of small height yet broad area, laptop CPU radiators, etc. As FIG. 1E shows, when heat absorbing components (152, 154, 156, 158 and combinations) are applied to the edge or center of a plate surface, heat will scatter along the larger surface. FIGS. 1EA and 1EB show top and side views of an application with of two assembled, piled plate elements. Plate elements can be applied to three aspects in terms of cooling electronic elements: (1) equalizing the temperature of multiple rows of elements; (2) cooling multiple rows of elements; (3) serving as the casing of instruments or installation platform.

Figure 1F:
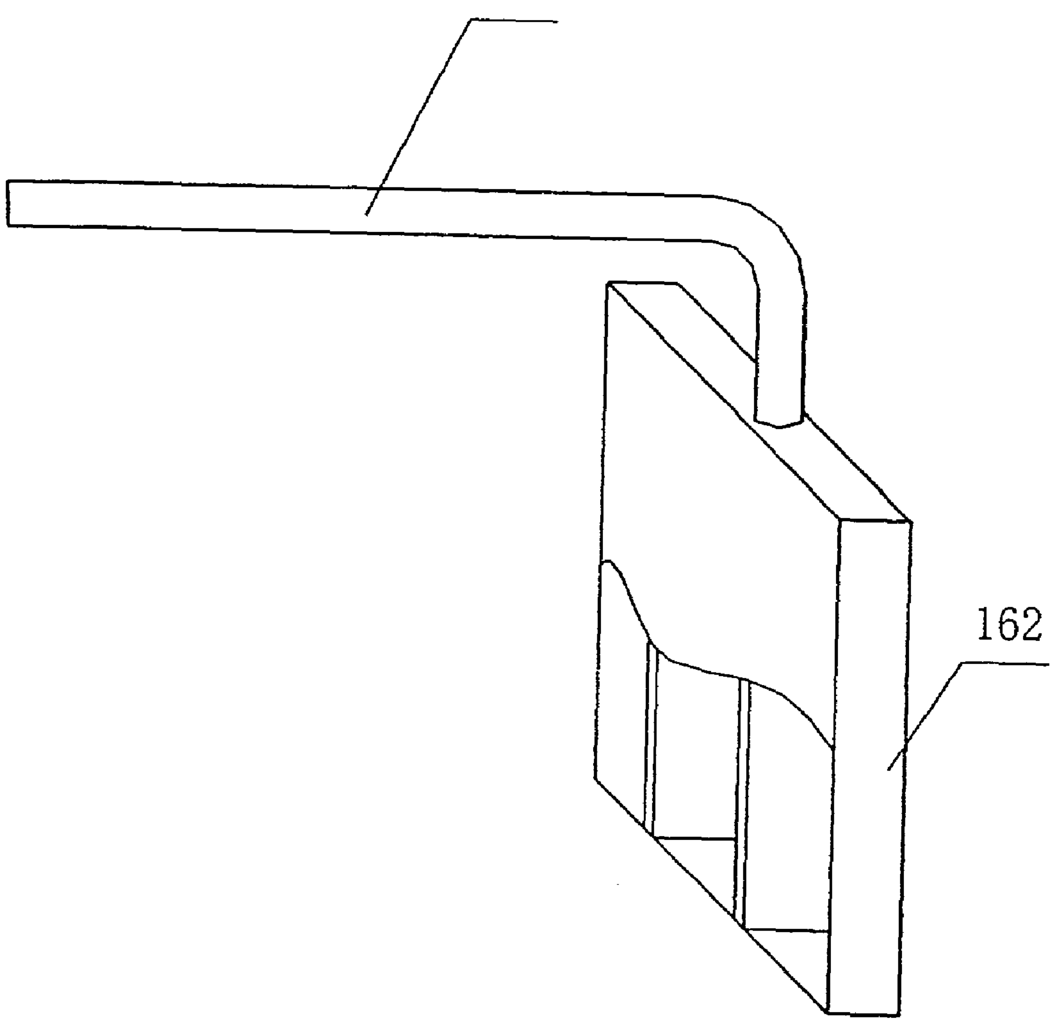
FIG. 1F shows a combined application of pipe and plate elements according to the present invention.

FIG. 1F shows a pipe-plate combination element, its intake and outlet port. The radiator is a pipe-plate combination heat transfer element. When heat flow passes through the inner cavity of the pipe, it launches the medium in the annular space so as to dissipate heat to air via the plate. The advantage of this device is that it transports heat from the pipe 160 to the plate, so as to create a surface of extremely small temperature gradient to equalize temperature. It also converges heat to the end of the pipe through the plate cavity 162.

Figure 1G:
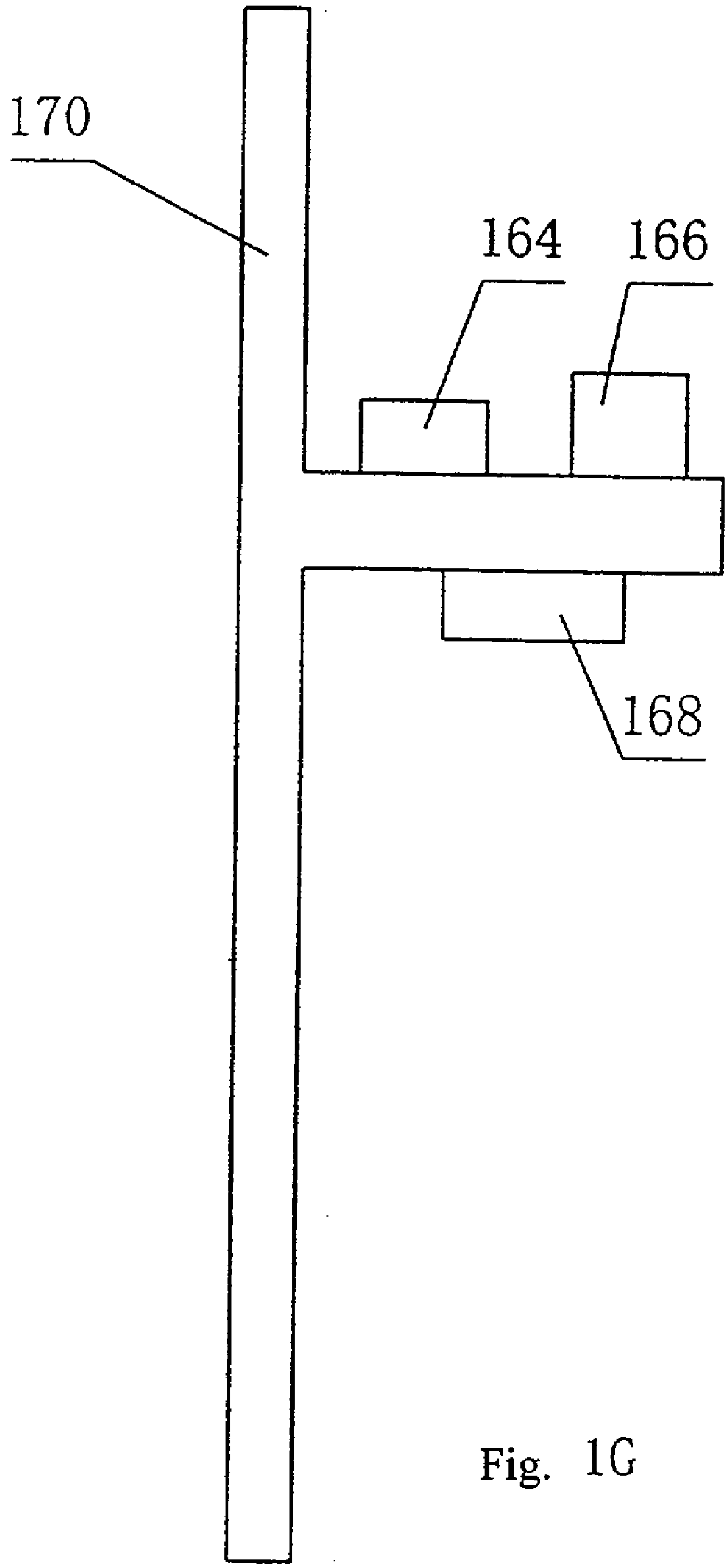
FIG. 1G shows a schematic view of a combined application of plate elements according to the present invention.

FIG. 1G is a combined application of plate-plate elements. Electronic elements 164, 166 and 168 are installed on an upright flat component 169 as a heat-receiving segment. A scattered flat component 170 that may also serve as an upper plate of the casing is used as a heat-dissipating surface for the casing. The electronic elements installed on the upright plate takes very little installation space of the object so that more elements can be installed onto the object.

Silicon carbon tubes or other electric heating elements with large power, long lifespan and small size can be used as electric heating elements to allow ease of installation and replacement. The operating temperature of the pipe-pipe combination element can be controlled effectively by simply taking the heat exchange area and control input power into consideration.

Measurement Process for Heat Transfer Efficiency

A pair of the pipe elements in Example 1 is made to demonstrate thermal conductivity and effective thermal conductance of the heat transfer medium of the present invention and to exemplify the use of the material in various processes of transferring heat.

The demonstration tubes are each dimensioned to 2.5-cm diameter (dia.)×1.2-m length, with an open cylindrical attachment of 7.5-cm dia.×10-cm length welded to one end of the tube to accommodate a close-fitting and slightly tapered heater (5-cm dia.×9-cm length). The interiors of the demonstration tubes, after cleaning, are coated with a thin coating of the heat transfer medium of the present invention made according to the procedure outlined previously.

The demonstration heat transfer tubes are each instrumented by attaching up to nine calibrated thermocouples at well-defined positions along the outer circumference of the tubes. Temperatures at these points are monitored and recorded as they respond to varying levels of electrical heat input to the heater located at a base of the tubes. In some instances, redundant temperature sensors and monitoring instruments are used, particularly at the two ends of the tube, to ensure that no significant mis-measurement of temperature occurs.

These experiments are performed in a safety-sealed vented closure approximately dimensioned to 1.2×1.6×1.0 m. To minimize temperature stratification within the test chamber, the experiment is operated with a tested demonstration heat transfer tube situated at an angle of 10° from the horizontal. Input powers and temperatures are monitored in this configuration to quantify the heat transfer rate within the tested demonstration heat transfer tube.

The various temperatures are measured using seven Type J thermocouples placed equidistantly along a tube dimensioned to 1.2-meter length and 2.5-cm diameter. Another thermocouple is placed on a larger diameter tube housing the heater. These thermocouples are held in place using steel hose clamps. The remaining thermocouple measures room temperature.

Thermocouples are connected to a Keithley #7057A thermocouple scanner card inside a Keithley 706 scanner. The junction block on the 7057A has a thermistor temperature sensor and is used to compensate for the cold-temperature junction. Standard fourth-order polynomials are used to perform the junction compensation and temperature calculations.

Power is supplied to the tube heater from a Hewlett Packard (HP) 66000A power supply, mainly configured with eight HP 66105A 125A/120V power modules. Two sets of four power supplies are wired in parallel, with the net outlet of the two sets wired in series to yield a 5 A/240 V power supply. This power supply system yields a very stable heater power over the length of the experiment. The actual current is measured as a voltage across a Kepco 0.1-Q/200 watt (W) standard current resistor in series with the heater. The heater voltage is measured by voltage sense wires attached to the heater terminals.

These two voltages are measured by a Keithley 7055 general purpose scanner card in the same model 706 scanner mentioned above. The outlet signal of the scanner boards is input to a Keithley 195A 5 ½ digital multi-meter (DMM) operating in direct current voltage mode. A Macintosh IIsi computer, using an IO Tech model SCS1488 IEEE-488 interface, controls the scanner and DMM. The results were saved on the computer's hard disk and accessed for analysis. The data acquisition software is written in Future Basic. The data, after analysis, is displayed using Microsoft Excel spreadsheet software.

Determination of Thermal Conductivity

After the tube is placed near horizontal, similar measurements are continued using up to 300 W input power, yielding a temperatures up to 150° C. above room temperature. Seven experiments are performed in the horizontal mode, including the final experiment where the power is stepped back and forth between 170 and 300 W over a 10-day period.

Several experiments are performed to measure the distribution of temperatures on the surface of the heat tube and the transient response to a step-function in heater input power. Nine identical and calibrated thermocouples are used in these experiments, among which one thermocouple monitors ambient temperature ($T_{air}$), one thermocouple is affixed to the cylindrical heater ($T_{heat}$), and seven thermocouples are placed equidistantly along the axis of the tube (at the "twelve-clock" position, designated as $T_2$ to $T_8$, with the smaller numbers closer to the heater).

Figure 1H:
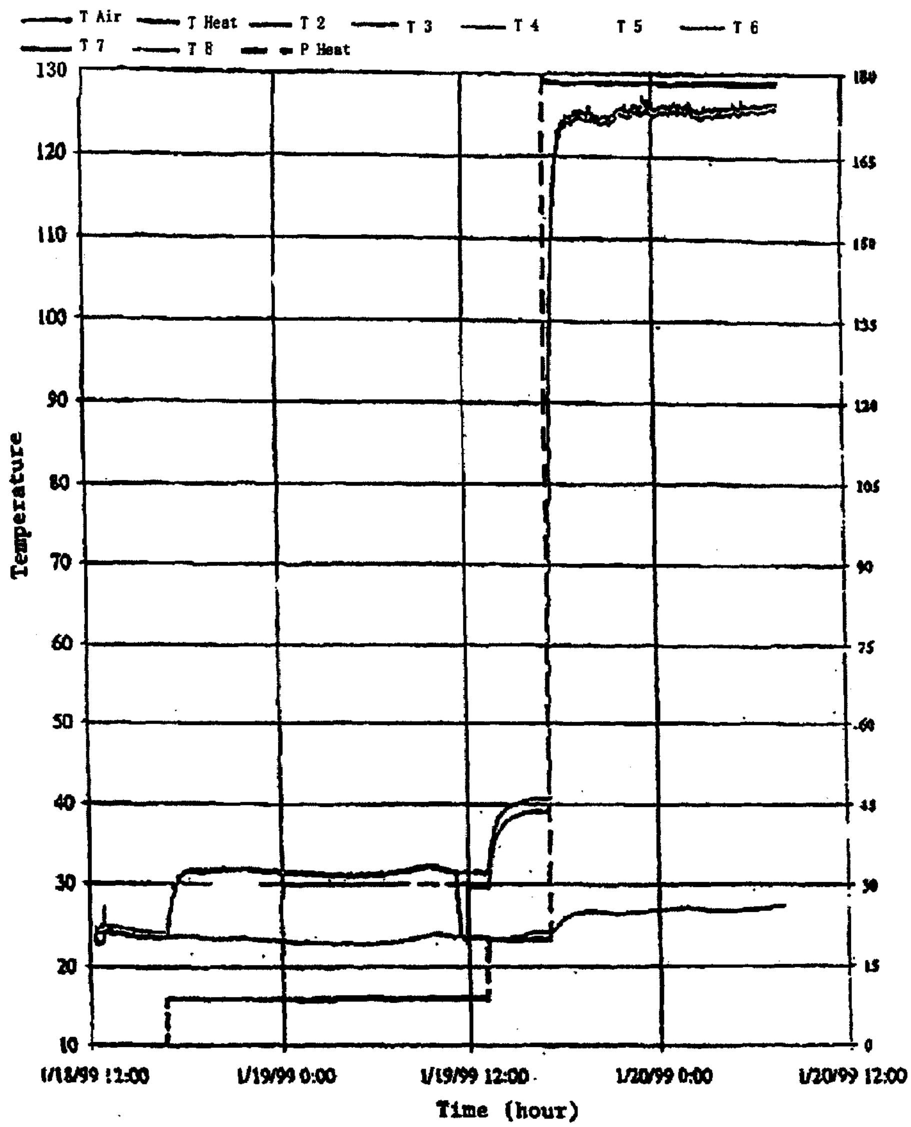
FIG. 1H shows the result of one such experiment in which the heater input power was stepped progressively from 9 to 20, and then to 178 watts.

FIG. 1H shows the result of one such experiment in which the heater input power is stepped progressively from 9 to 20 to 178 watts. FIG. 1I is a plot of the steady-state temperature difference (sensor T minus ambient T°) for each of the sensors and their mean value versus input power. The solid line in FIG. 1I is the quadratic best fit to the mean temperature values, with specified coefficients. This line displays the expected form for heat dissipation from a pipe at uniform temperature, namely, a small negative second-order departure from linear dependence. What is unexpected is the degree to which the temperatures are, and remain, uniform along the extended length of an essentially empty pipe, heated at just one end.

Examining more closely the large power step from 20 to 178 W, it is observed that the rise in temperature occurs, on the time scale of measurement, quite quickly at all points along the heated demonstration tube. Temperature sensors $T_2$–$T_8$ and their average value are plotted as lines in FIG. 1J, as a function of time for the two hours immediately following the power step. (For the first 45 minutes, data are collected every minute, following that, every 5 minutes.) On the scales presented, there is no significant positional variation of temperature; the demonstration tube behaves as if it is heated uniformly along its axis.

Figure 1J:
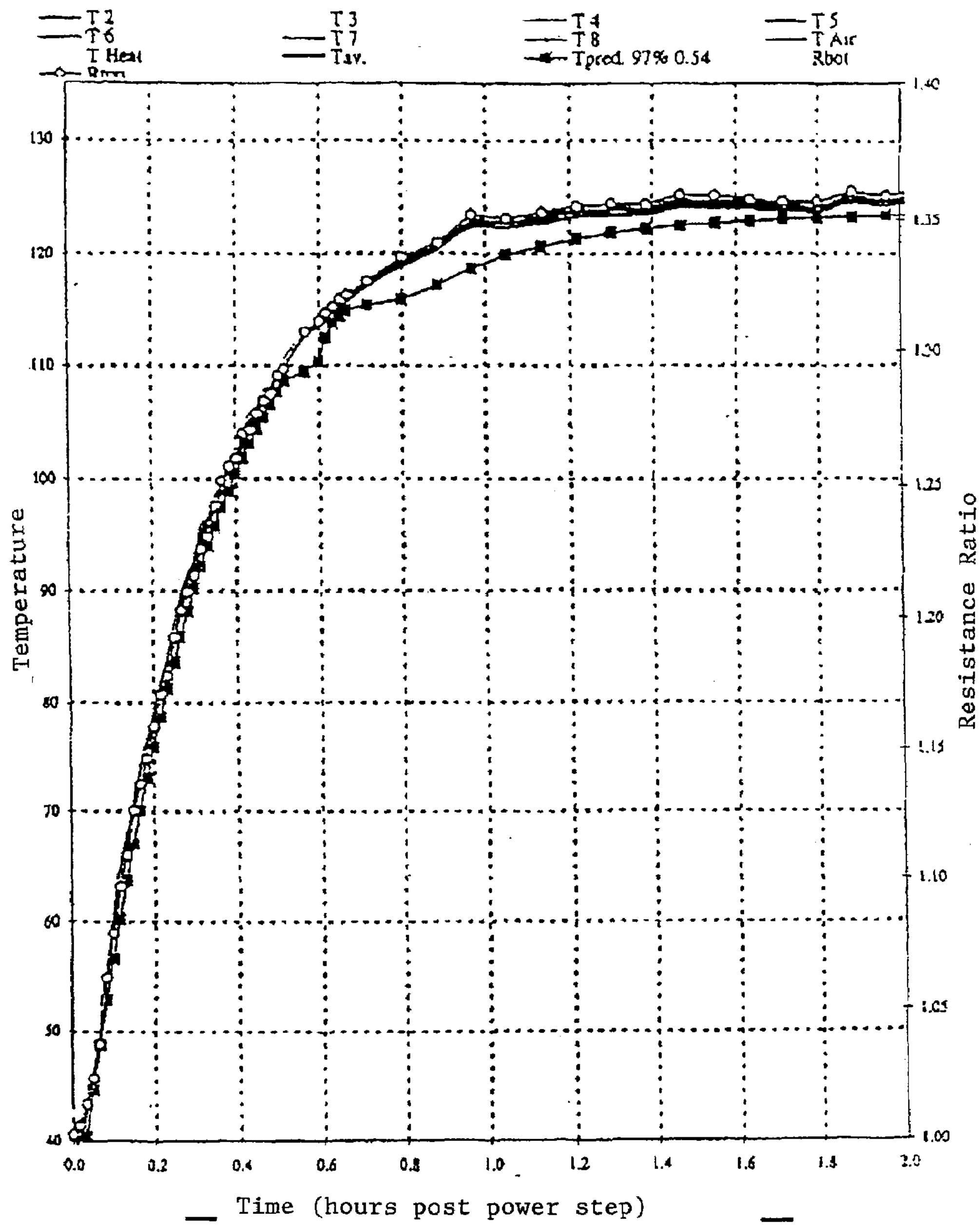
FIG. 1J shows transient temperature rise due to 20–178 watts heater power step.

Three other data sets are plotted in FIG. 1J, but they coincide so closely rendering them difficult to resolve; the asterisks are the temperatures predicted for the dissipation of the heat corresponding to a 20 to 178 W power step to a uniformly heated horizontal steel pipe of dimensions identical to that of the heat tube. The details of this model are discussed below.

The points plotted as open diamonds and circles in FIG. 1J are ratios of resistances measured in the metal phase along the axis of the pipe. The resistance of a metal changes predictably with temperature according to the formula, $$R=R^{\circ}(1+\alpha T) \quad (1)$$

So that $$T=(R/R^{\circ}-1)/\alpha$$

where R° is the resistance measured at T=0° C.

Figure 1K:
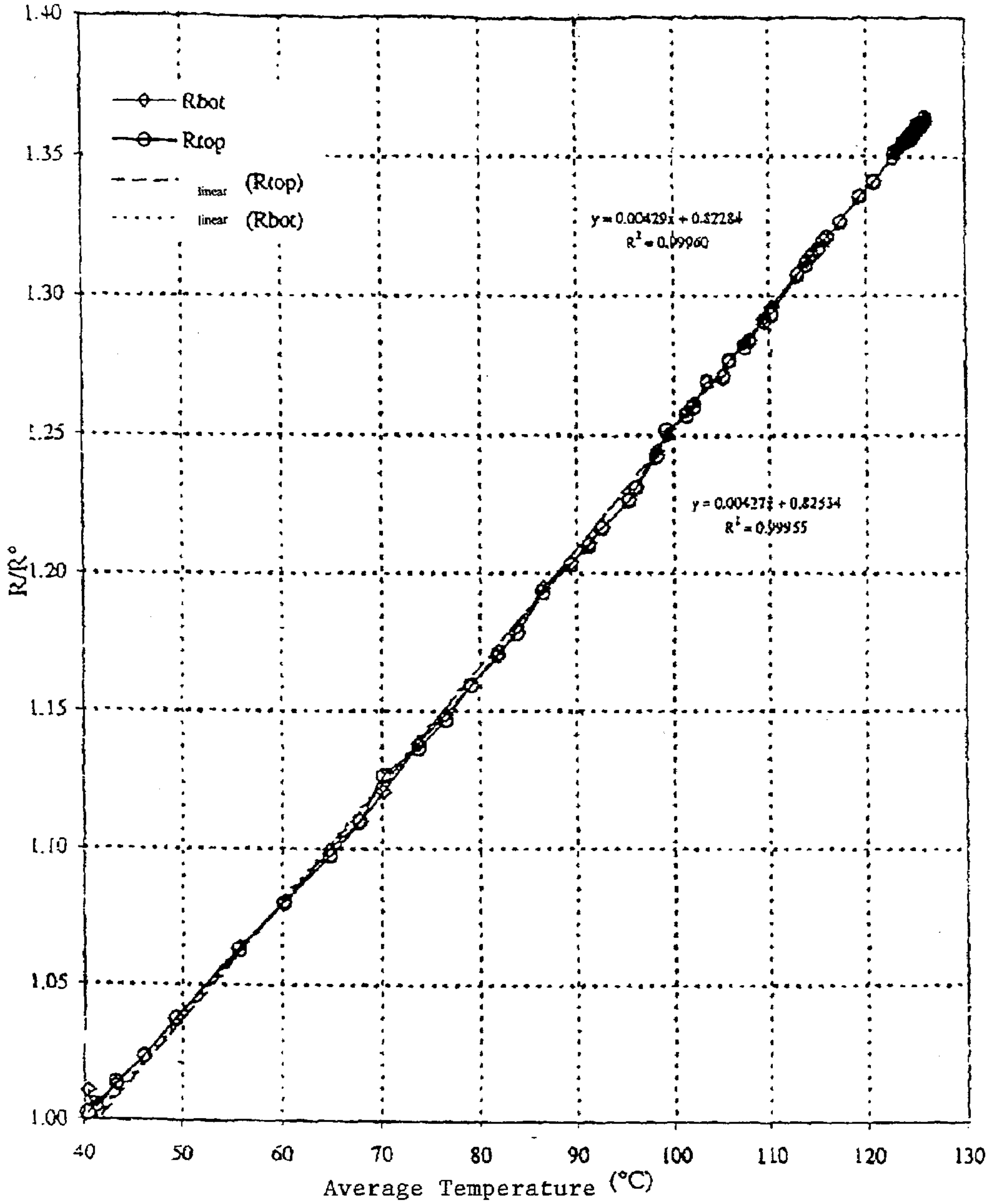
FIG. 1K shows these same resistance data plotted versus the mean temperature recorded by the thermocouple temperature sensors in the respective halves of the tube.

The data points labeled $R_{bot}$ refer to resistance measurements made in the half of the tube closest to the heater, while those labeled $R_{top}$ refer to the resistance in the upper half of the tube. FIG. 1K shows these same resistance data plotted versus the mean temperature recorded by thermocouple temperature sensors in the respective halves of the tube. From the regression lines plotted in FIG. 1K, it is clear that equation [1] above is well obeyed and that the temperature coefficient of resistance of the steel used in the tube is $0.428\pm0.001\%\ K^{-1}$.

The significance of the resistance data in FIGS. 1J and 1K is that, 1) there is no obvious error in thermocouple temperature measurements, 2) the measurements made on the surface of the tube conform closely with the volumetric temperatures recorded by the resistance ratio, and 3) at all times, the average temperatures of the tube distant from the heater are indistinguishable from those measured proximate to the heater despite the point locations of the heat source.

Effective Heat Transfer Rates

The transfer of heat from carbon steel pipes is a very well known and very well understood problem of considerable engineering significance.

Figure 1L:
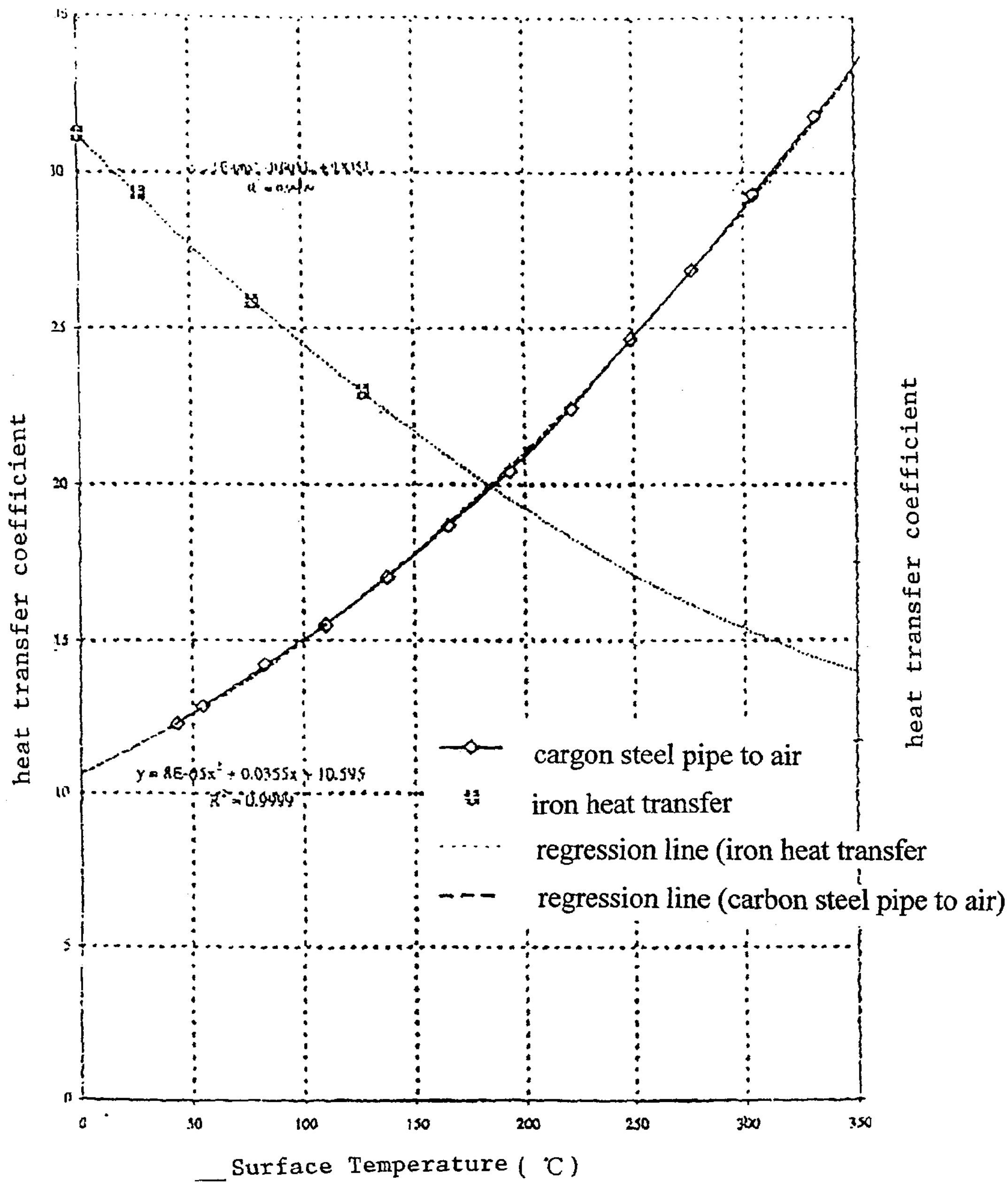
FIG. 1L shows the expected heat transfer coefficients for carbon steel pipe versus surface temperatures.

The rate of heat transfer by natural convection and radiation from the surface of a horizontal, bare, standard carbon steel pipe is well described in reference texts by a set of empirical equations and determined constants. FIG. 1L plots the expected heat transfer coefficient of a one inchdiameter carbon steel pipe, versus surface temperature. A parabolic regression line is fitted through the data points calculated from tabulated constants. This regression function us used to match the observed steady-state and transient response of the demonstration heat tube surface temperatures in response to stepped increases in the heater power.

A simple numerical model of 210×10 elements is constructed to solve the differential equation describing the rates of heat input, storage, and loss to the heat transfer tube. This model is constructed under two assumptions that: 1) the function presented in FIG. 1L accurately describes the heat loss from the tube surface, and 2) the heat input at one end reaches all parts of the metal tube quite quickly (effectively instantaneously for the purposes of this calculation).

This second assumption is consistent with observations and is, therefore, necessary to rationalize the data.

Figure 1M:
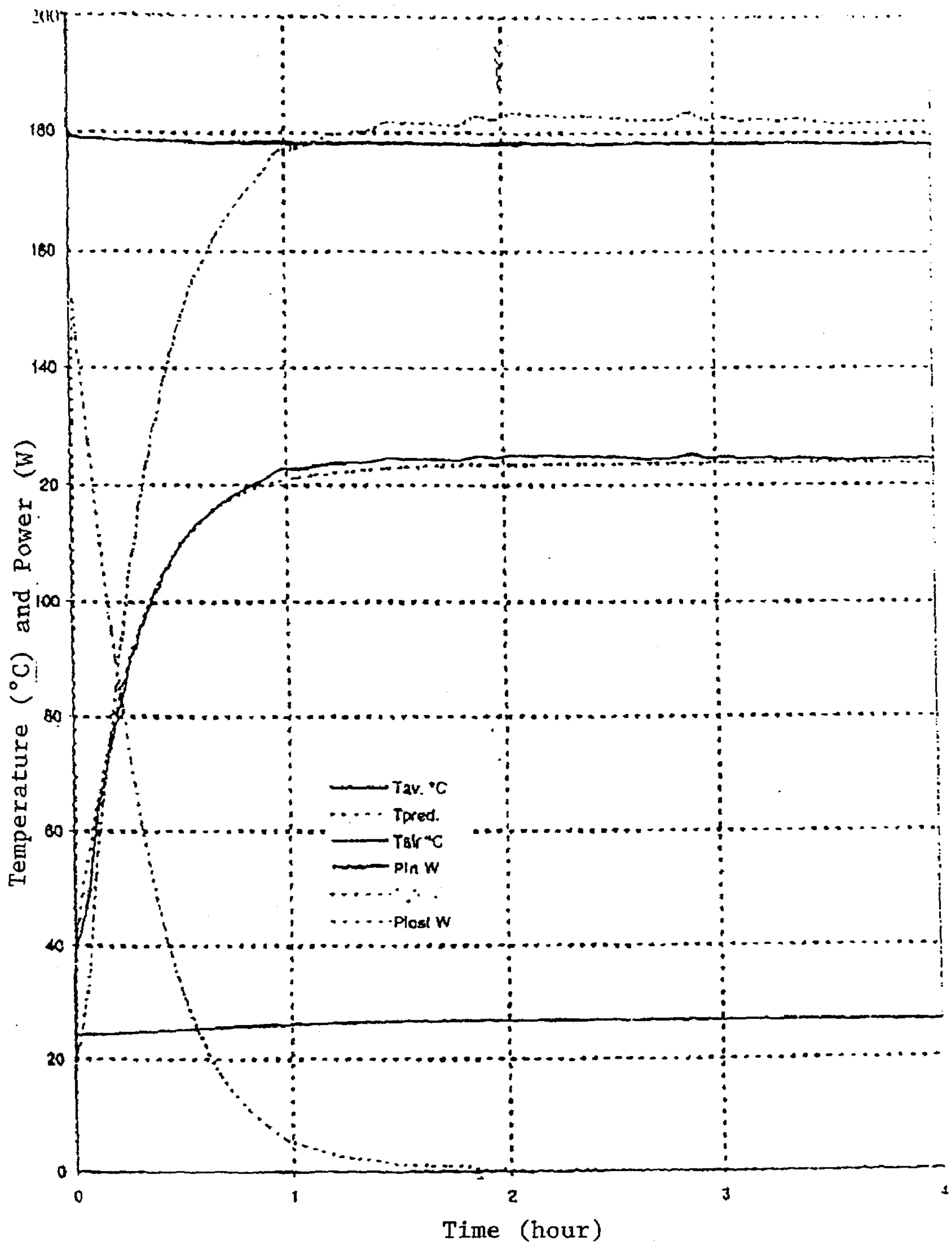
FIG. 1M shows the predicted and observed transition temperature response to a heater input power step from 20 to 170 watts.

FIG. 1M shows the results of one such numerical calculation and the heat transfer coefficients shown in FIG. 1L, with the heat capacity of steel assigned the value of 0.54 J $g^{-1}$. The (measured) input power is partitioned into an amount stored by the heat capacity of the tube ($P_{store}$) and an amount dissipated by natural convection and radiation to the ambient ($P_{lost}$). Taking into account the slight increase in the (measured) ambient temperature, the model as predicted and the average temperature responses as measured coincide closely. The predicted steady-state heat dissipation is slightly (2%) larger than the measured input power. This discrepancy is easily accommodated by model errors, the effects of temperature sensors on heat dissipation, and the 10° departure of the tube from horizontal configuration.

For the case shown in FIG. 1M, as well as several other cases tested, it is clear that the model assumptions are well obeyed. That is, the demonstration heat transfer tube acts thermally as a standard carbon steel pipe that is uniformly heated throughout.

Heat Transfer Coefficient

Above, for the purposes of the model, the assumption was made, consistent with observation, that the tube was uniformly heated. Since the demonstration heat transfer tube was actually heated only at one end, this assumption was evidently erroneous.

With the tube heated at one end, the pattern of heat flow can be modeled as a one-dimensional transmission line. Using this concept, heat is conducted, in each successive element from the heater along the tube length, in the following manners: 1) axially by whatever medium fills the inner tube volume, 2) radially through the steel wall to the outer surface (at where temperature is monitored), and 3) radially to the surrounding ambient air, the temperature of which is considered to be constant.

Taking these terms in reverse order, the rate of heat transfer from the tube surface to the surrounding air is a function described by a solid line in FIG. 1L. Also shown in FIG. 1L are known data for thermal conduction of iron (Fe), together with a parabolic regression fit and extrapolation.

Figure 1N:
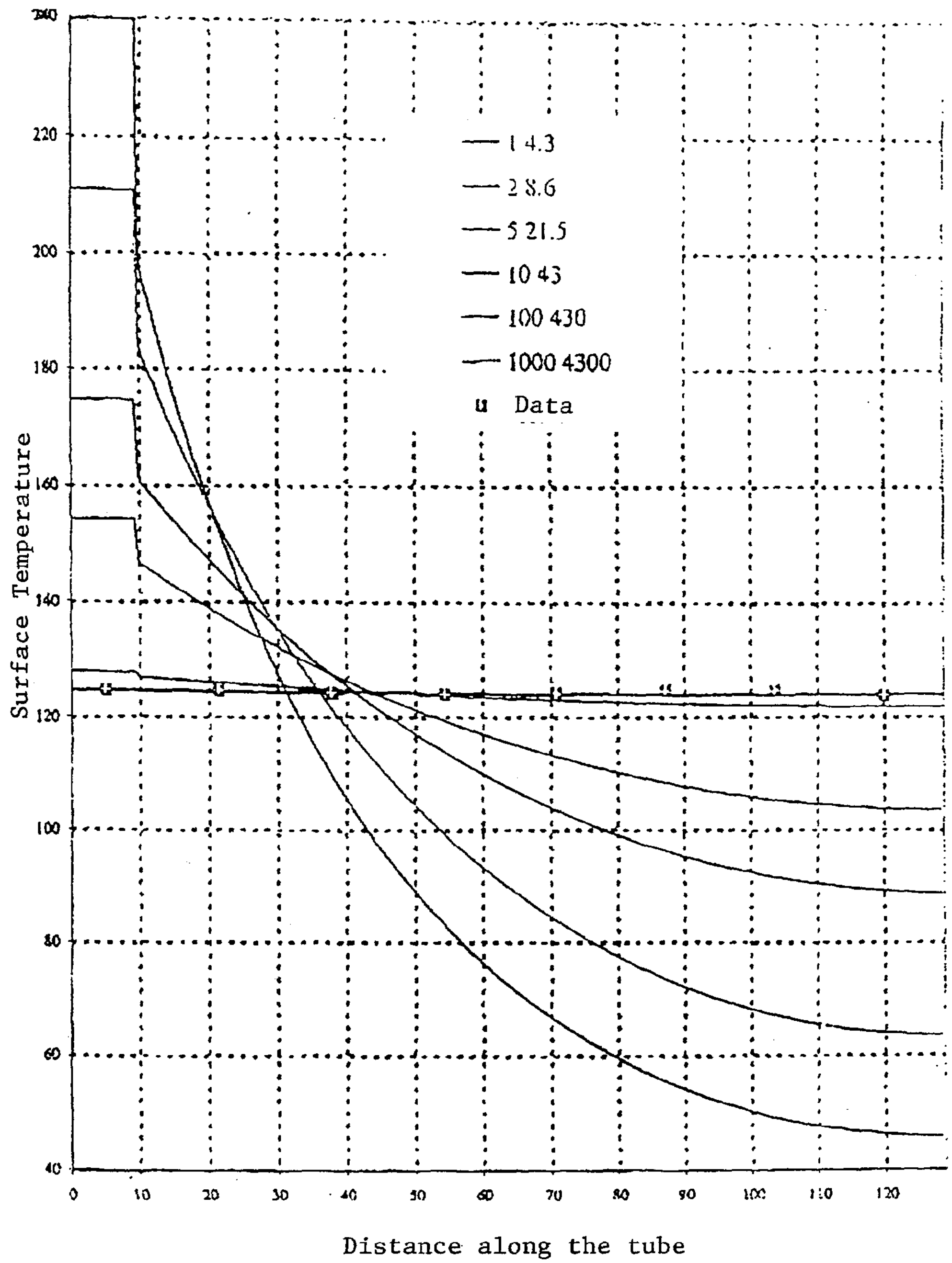
FIG. 1N shows the results of finite transmission line model calculations for the prediction of the temperature distribution along the tested heat transfer tube.

FIG. 1N presents the results of finite transmission line model calculations for the prediction of the temperature distribution along the tested heat tube, assuming that the tube is filled with silver elements. Silver is taken as a reference material because it is the best-known conductor of heat of all the elements in their normal allotropic form (diamond is superior in this regard). At 4.3 W $cm^{-1}$ $K^{-1}$, silver conducts heat about 5.5 times better than Fe (which is taken to represent the carbon steel of the pipe).

The upper line in FIG. 1N shows the expected distribution in temperature along the tube, calculated for heater input power of 178 W, presuming that the pipe is filled with a medium having the same thermal conductivity as silver (4.3 W $cm^{-1}$ $K^{-1}$). The temperatures measured under the conditions at the eight sensors placed along the axis of the tube are shown by the solid data points.

FIG. 1N clearly shows that the measured temperature profile is much flatter than that predicted if the inner volume conducted heat at the rate and with the mechanism of solid silver metal. Calculations are performed assigning successively higher thermal conductivity being 2×, 5×, 10×, 100×, and 1,000× of that of the inner volume. Only the last calculated profile is consistent with the measured profile. In other words: the tube conducts heat as if it were filled with a material having a thermal conductivity much greater than, e.g., at least 1000 times, that of silver. Although the results are shown for a single test (at 178 W of heater input power), this conclusion is consistent with the results of numerous tests of the heat tubes, in more than one configuration, and for a range of input powers.

There are no other apparent explanations of the observed axial temperature profiles. For instance, although heat pipes (in which heat transfer occurs by evaporation, vapor transport, and condensation of a working fluid) transfer heat at high rates, evidence against such a possibility may be made on the basis of the wide range of operative temperatures possible for the demonstration heat transfer tubes, because heat pipes may be operated at discrete temperature points or intervals.

Determination of Effective Thermal Conductance

A classical heat pipe's heat flux (ϕ) is calculated as the input power (W) over the pipe's cross-sectional area ($m^2$). The maximum heat flux is determined by plotting the measured temperature difference (T) between the sink and source ends of the heat pipe versus ϕ, under no-load conditions. The value of ϕ, where the T/ϕ value deviates from that measured in the normal operating region, is the maximum heat flux density ($\phi_{MAX}$). The temperatures at the source and sink of the demonstration heat transfer tube are measured as the input power (expressed as heat flux density) is increased; no maximum heat flux density ($\phi_{MAX}$) can be obtained because the T/ϕ plot shows no positive deviation in T.

A classical heat pipe's effective thermal conductance ($k_{eff}$) is calculated by treating the pipe as a monolithic thermal conductor. Hence $k_{eff}$ is defined as $$k_{eff}=[P(W)-1/A]/(T_2-T_1)(K)$$

where P in the input power, 1 is the length of the tube, A is the tube's cross-sectional area, $T_2$ is the temperature at the sink end of the tube, and $T_1$ is the temperature at the source end. Several temperatures at locations intermediate the ends are also measured while the input power increases under no-load conditions. All the experiments are performed without insulation wrapped around the pipe.

Another approach in measuring $k_{eff}$ is to perform the same studies under different loads, allowing better control of operating temperature. The same experiments described above are then performed with three different heat exchangers attached to the sink end of the demonstration heat transfer tube. Temperatures at locations intermediate the ends are also measured while varying the input power under varying load conditions. The load is supplied by circulating constant temperature water through the heat exchanger using a 6000-W recirculating chiller. (The mass flow calorimeter and the analytic approach stated above are used to measure power at the sink end.) $k_{eff}$ is calculated according to equation (1).

Figure 1O:
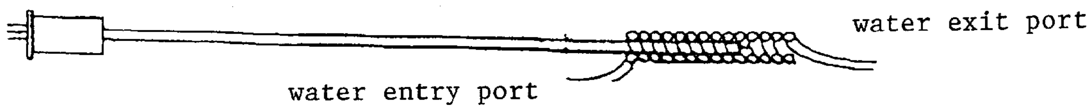
FIG. 1O shows a diagram of the demonstration heat transfer tube of the first heat exchanger attached (Diff1), designed to test the principle of measuring thermal conductivity in a differential temperature system.

FIG. 1O shows a diagram of the demonstration heat transfer tube with the first heat exchanger attached. This configuration is referred to as Diff1 and designed to test the principle of measuring thermal conductivity in a varying temperature system.

Figure 1P:
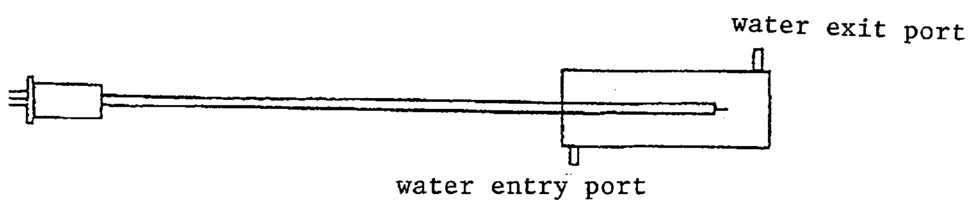
FIG. 1P shows another kind of heat transfer tube (Diff2) with a hollow acrylic cylinder attached to the end of the heat transfer tube with water flowing through the cylinder.

The first heat exchanger is a copper coil held to the demonstration heat transfer tube using Omegatherms 200 high thermal conductivity epoxy paste. However, the conductivity of this epoxy is only—about 0.003 times that of copper. Hence the epoxy presented a significant thermal resistance to heat flowing into the heat exchanger. To eliminate this thermal resistance, a second design, Diff2 using a second demonstration heat transfer tube, is made up of a hollow acrylic cylinder attached to the end of the demonstration heat transfer tube with water flowing through the cylinder. Diff2 is shown in FIG. 1P.

Figure 1Q:
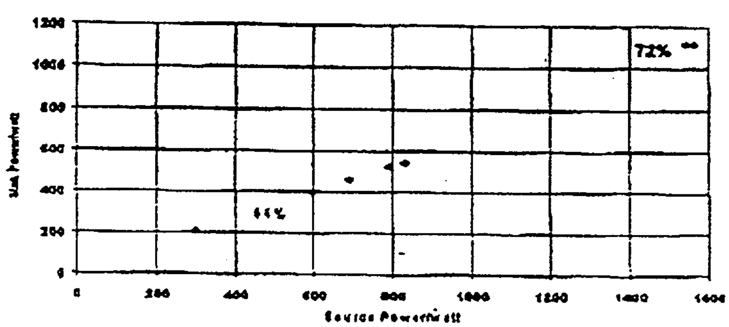
FIG. 1Q shows these two calorimeter designs, Diff1 and Diff2, operated in the range of input powers from 100 to 1500 W and flow rates from 1 to 85 g/sec. The corresponding heat flux densities (phi) range $0.11\times10^6$ to $1.7\times10^6$ W/$m^2$ and the heat recovery ranges from 300 to 1500 watts.

These two calorimeter designs, Diff1 and Diff2, are to be operated in the range of input powers from 100 to 1500 W and flow rates from 1 to 85 g/sec. The corresponding heat flux density is between $0.11\times10^6$ and $1.7\times10^6$ W/m$^2$. The heat recovery from 300 to 1500 watts is shown in FIG. 1Q.

Figure 1R:
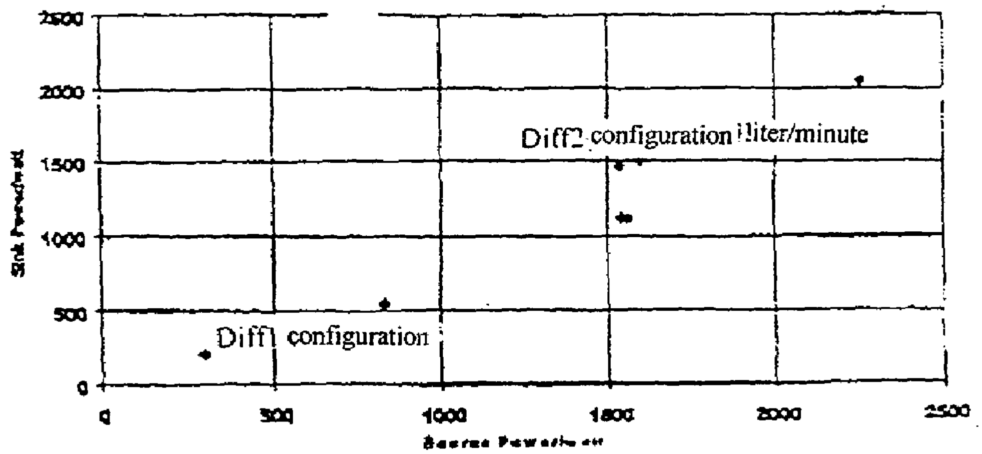
FIG. 1R shows the heat recovery profile along the demonstration heat transfer tube measured using Diff1 and Diff2.

The efficiency of using Diff1 is about 72% and using Diff2 is about 93%. This difference in efficiency is expected considering the relatively poor thermal conductivity epoxy used in Diff1. FIG. 1R shows the heat recovery profile along the demonstration heat transfer tube measured using Diff1 and Diff2.

Figure 1S:
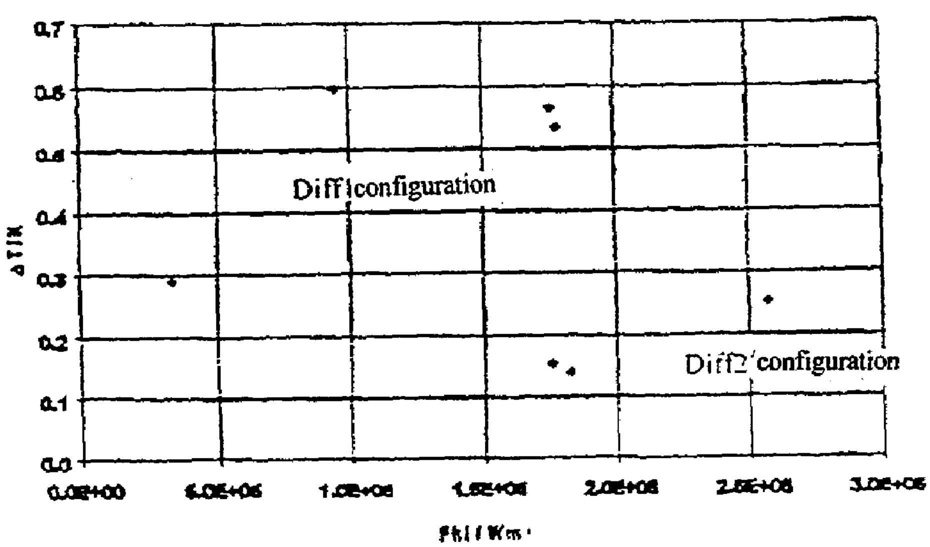
FIG. 1S is a plot of the difference of these two temperatures versus heat flux density.

Because of the higher thermal recovery efficiency, input power up to 3000 watts is used while using Diff2. In both cases the temperature at a location 27 cm from the heater is the highest. The temperature at his location is compared to the temperature at a location 107 cm from the heater because temperatures farther from the heater are lower, due to the influence of the heat exchanger. The difference of these two temperatures is plotted versus heat flux density and shown in FIG. 1S.

The effective operating range of the classical heat pipe is where the plot remains linear or shows a negative deviation. T will become disproportionately larger beyond the effective operating range, because heat is transported less efficiently to the sink end of the tube. For all conditions measured, temperature of the demonstration heat transfer tube increases with heat flux density. This shows that the maximum heat flux density is never achieved. The only exception is above 2000 W, at when the 107-cm temperature was greater than the 27-cm temperature. For this reason, data above 2000 W input power, $2.2\times10^6$ W/m$^2$ are not plotted.

Figure 1T:
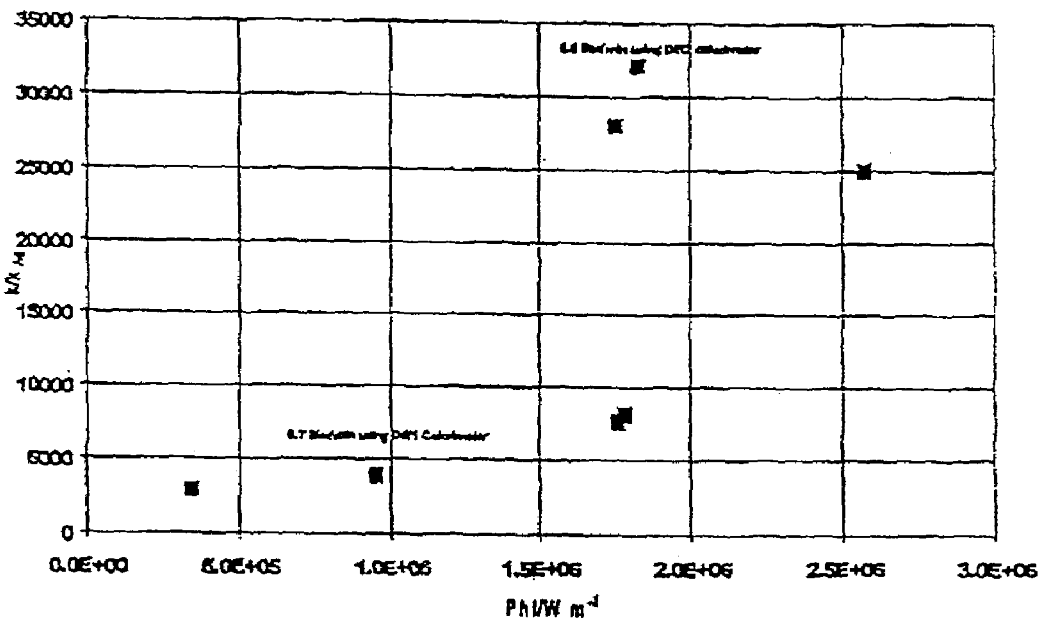
FIG. 1T shows the measurements of effective thermal conductance versus the heat flux density of all input heater power steps.

FIG. 1T summarizes effective thermal conductance relative to heat flux density for all input power under 2,000 W and heat flux density at $2.5\times10^6$ W/m$^2$. These are presented as a ratio of ($k_{eff}$) to thermal conductivity of silver (by comparing with what would be expected if the pipe was filled with solid silver—a metal having the highest thermally conductance). The maximum ratio found is greater than 30,000.

Applications in the following Examples 3 to 212 are all based on the heat transfer element made in accordance with Example 2. Then the size and appearance of these elements are modified depending on actual needs.

Heat Transfer Heating Element

Applications to Electronic Device or Electric Appliance

The following Examples 3 to 7 show applications of the heat transfer elements of the present invention being implemented to electronic device or electric appliance, such as electric heating washing machines, laundry drying and heating system, radiators, heaters and hot blast ovens.

EXAMPLE 3

Figure 2A:
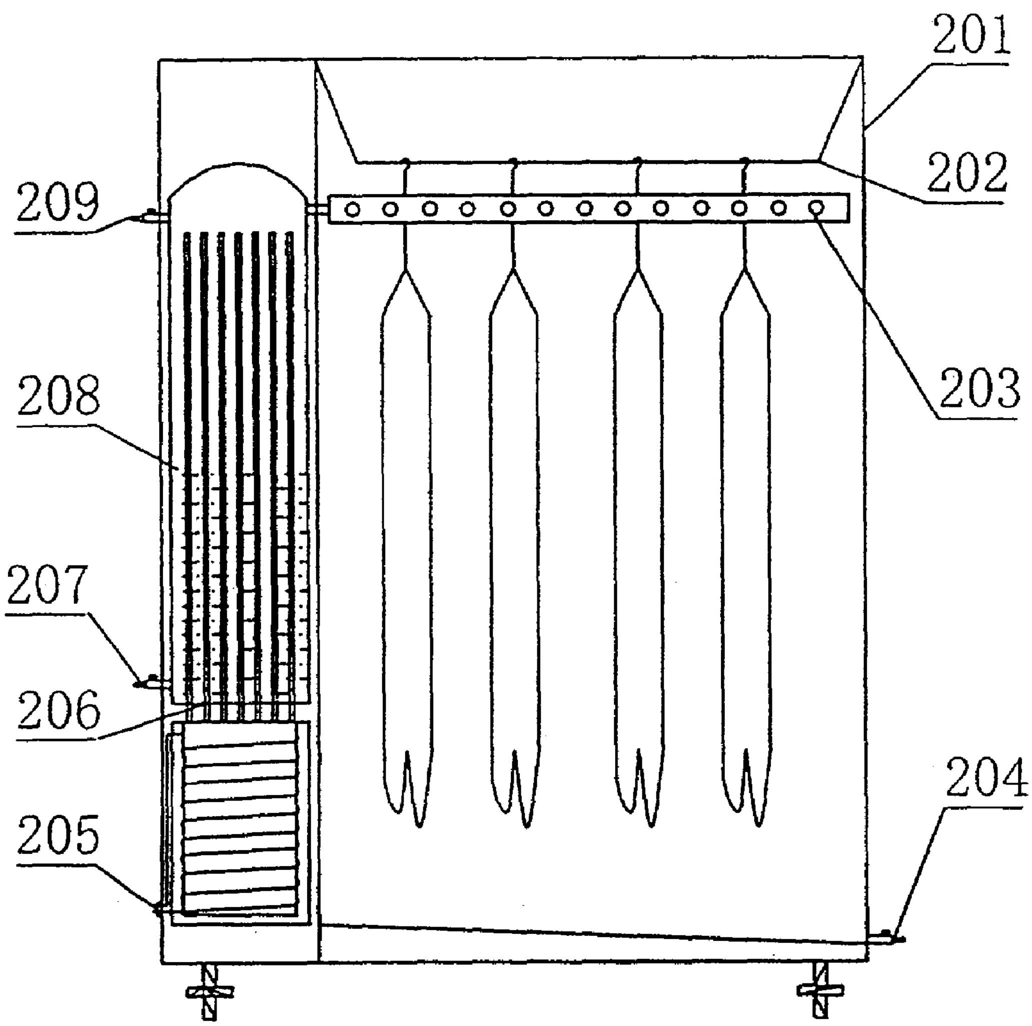
FIG. 2A shows an electric heating cabinet.

FIG. 2A shows the heat transfer heating element based on Example 2 of the present patent can be used in an electric heating washing machine, which comprises of two parts, i.e. a steam generator and auxiliary casing devices. The steam generator comprises an electronic heating system 205, a heat transfer heating element 206 and a steam generator 208. The steam generator 208 has a water intake 207, a main steam outlet and a redundant steam outlet 209. The auxiliary casing devices include a machine casing 201, a support 202, a steam distributor 203 and a condensed water outlet 204.

After powered on, the electric heating system 205 produces electro-thermal energy, which is conducted by the heat transfer heating element 206 to the steam generator 208. Through heat exchange then occurs between water in the steam generator 208 and the heat transfer element 206 to produce steam. After being heated twice, the steam goes through the main steam outlet and enters the steam distributor 203, which distributes the steam evenly in the washing machine basket. Textiles are soaked and fully heated in hot steam, which carries away a vaporized solvent of steam drops mixed with cleanser, sterilizer, dirt and bacteria. This solvent is condensed at the lower part of the machine and flows out of the condensed water outlet. The system now completes the process of high temperature textile cleaning and sterilization. It realizes efficient heat transfer and exchange by transferring thermoelectric energy to steam heat to facilitate a complete, effective and reliable cleaning and sterilizing system for textiles. Another function of the redundant steam outlet 209 is leading steam out for applications such as ironing and so on.

EXAMPLE 4

Figure 2B:
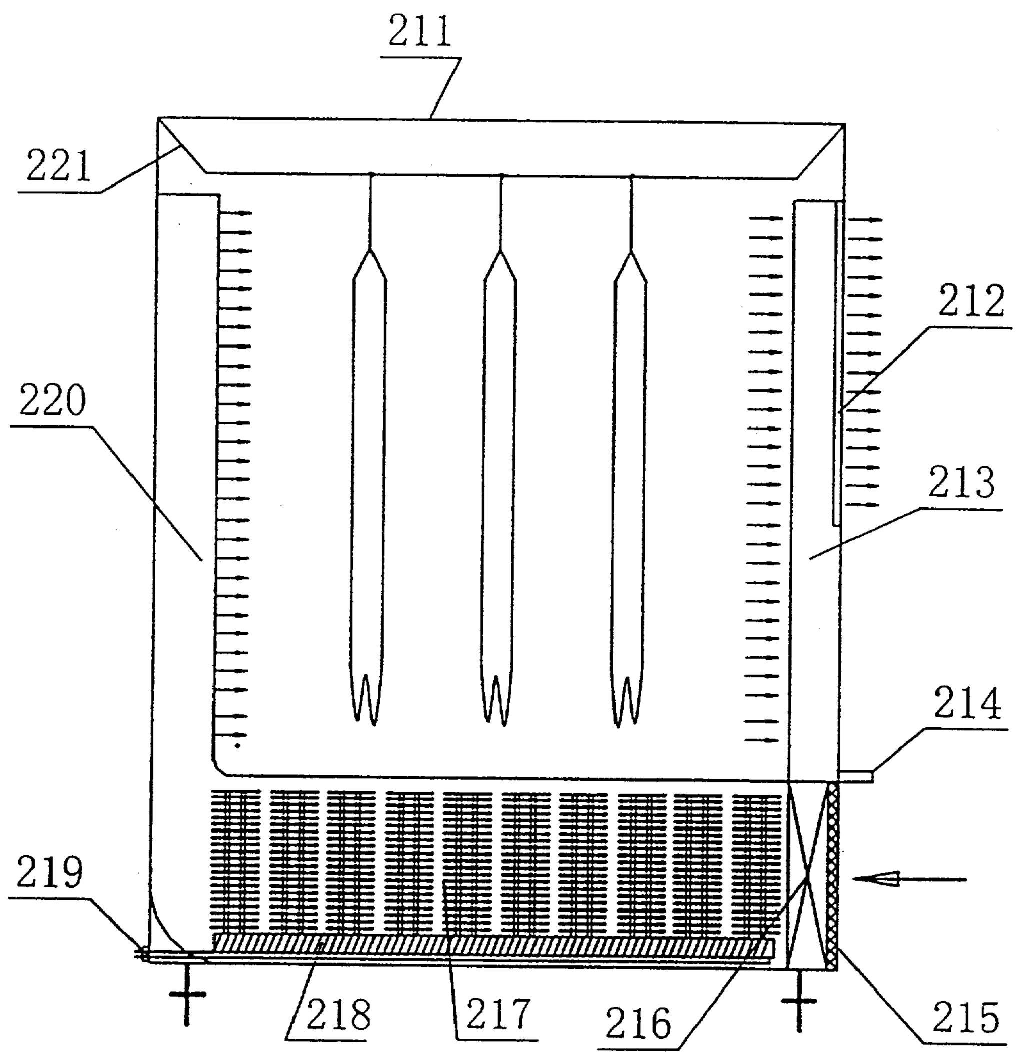
FIG. 2B shows the heating system of a dryer.

FIG. 2B shows the heat transfer heating element based on Example 2 of the present patent can be used in a heating system of a dryer, which comprises of two parts, i.e. an air heating system and auxiliary casing devices. The air heating system comprises of a heat transfer heating element 218 and an electric heating system 219. The heating element contains radiating fins 217 and the heating system has an electric temperature controller. The casing and auxiliary casing devices include a casing 211, an air outlet 212, a return air box 213, a drain 214, a filter 215, a fan 216, an air distributing box 220 and a support 221. Ventilating holes scatter evenly on the front of the air distributing box and the return air box. The whole system is a fully open hot air circulating system.

After being powered on, the electric heating system 219 produces electro-thermal energy, which is conducted efficiently and quickly to circulated air via the electric heating element 218 (the radiating fins 217 enhance heat exchanging efficiency). Driven by the fan 216, the heated air goes through the holes on the air distributing box 220 and is distributed uniformly in the drum for draining and drying clothes. The air at this time consists of three elements, i.e. (1) the temperature of the surrounding air is comparably high; (2) the relative humidity in the surrounding air is low; and (3) the surrounding air is well circulated, such that moisture in damp clothes is quickly carried away. The air then enters the return air box 213 and leaves the system from the air outlet located above the box 213 when the vapor in the air becomes saturated. Moisture condensed in to water due to cooling effect in the return air box is then discharged from the drain 214. Circulated air outside the system is drawn into the system by the fan 216, heated by the air heating system and finally sent to the drum for draining and drying clothes. This embodies a fully open cycled circulation to drain and dry clothes. Temperature of the circulated air is controlled within a certain range by the electric temperature controller throughout the process.

EXAMPLE 5

Figure 2C:
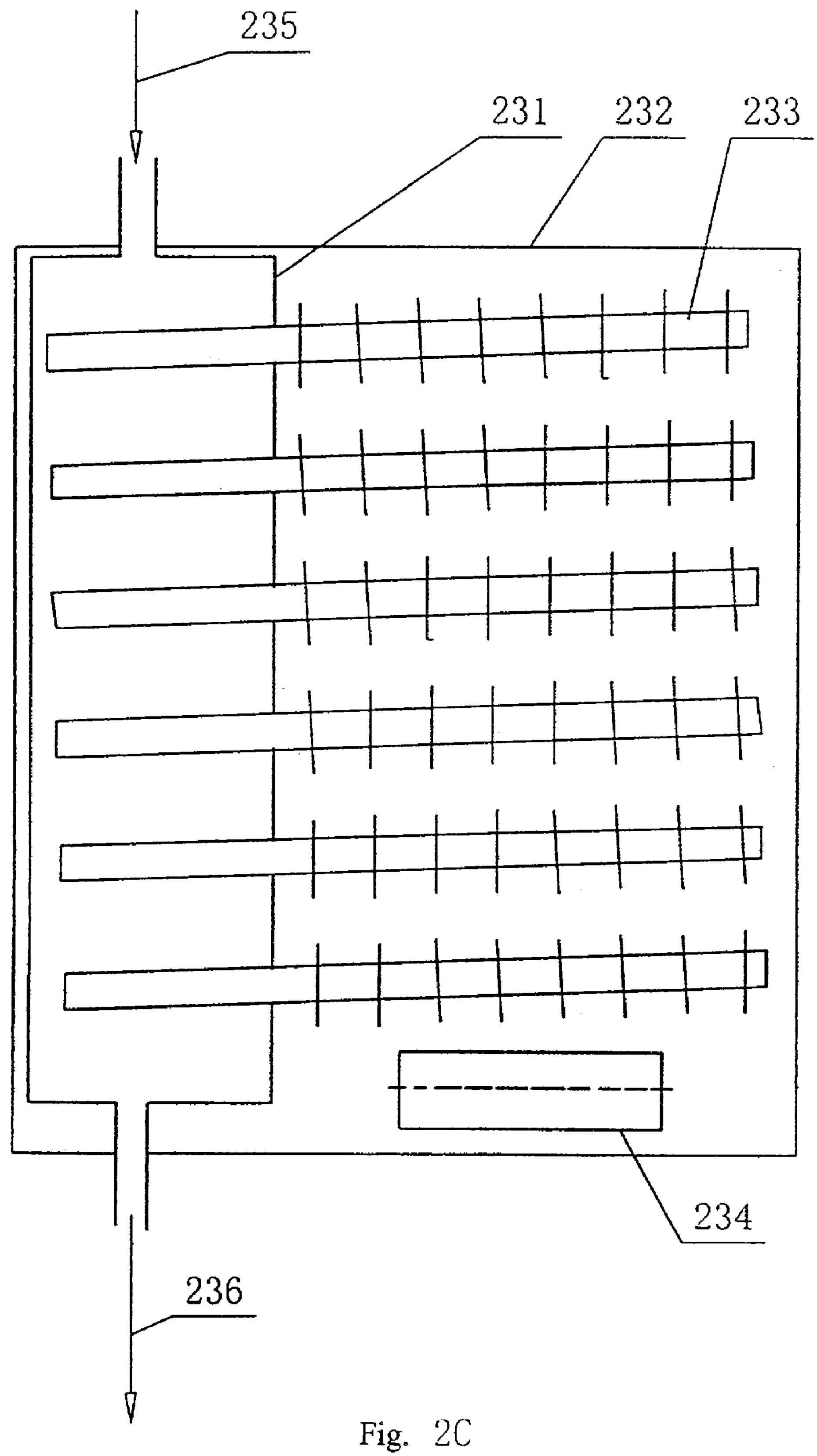
FIG. 2C shows a radiating flange.

FIG. 2C shows the heat transfer heating element according to Example 2 can be used as a radiator. One end (heat releasing end) is exposed to the air and the other (heat absorbing end) is inserted into a rectangular container. Many spiral fins are welded to the heat releasing end of the heat transfer heating element to increase the heat exchange area for better heat exchange result at the heat releasing end. A once-through blower is installed at the bottom of the heat releasing end to accelerate heat exchange by forcing air to flow from bottom to top.

The rectangular water container 231 is made by welding low carbon steel plates. Two short tubes are welded to top and bottom to link with external water supply and return-water pipes.

Several inorganic high heat transfer elements 233 are welded to the container wall. Each element is filled with inorganic conducting medium, with one end inserting into the container to absorb the heat of hot water, and the other exposed to the air to quickly transport heat absorbed to air for heating the air. Spiral fins are welded to the heat-releasing end by means of high frequency resistance welding to enlarge the heat exchange area for better heat exchange result.

Once-through blower 234 is installed at the bottom of the heat-releasing end so as to force counter airflow at the airside for higher heat exchange coefficient and rapid warming.

A cover 232 may be made by punch pressing thin iron sheet. It can be decorated and painted with various patterns to enhance its appearance. Installation of the cover strengthens heat exchange at the airside by forming a natural air passage.

EXAMPLE 6

There are two types of heating measures in cities located at temperate and frigid zones during winter seasons, namely central heating by coal boilers and by the afterheat from power plants. Central heating has completed changed traditional method of family coal burning. It contributes to higher fuel efficiency and reduces air pollution caused by exhaust. An increase in the cost of heating service in winter, however, is caused by losses of heat when it is supplied through vast heating piping and numerous gas pumping stations. Increasing heating pipes strays away from the modern trend for they take too much space. Therefore, a high-speed, comfortable, adjustable and energy-saving heating system is desired as qualify of life has improved.

Figure 2D:
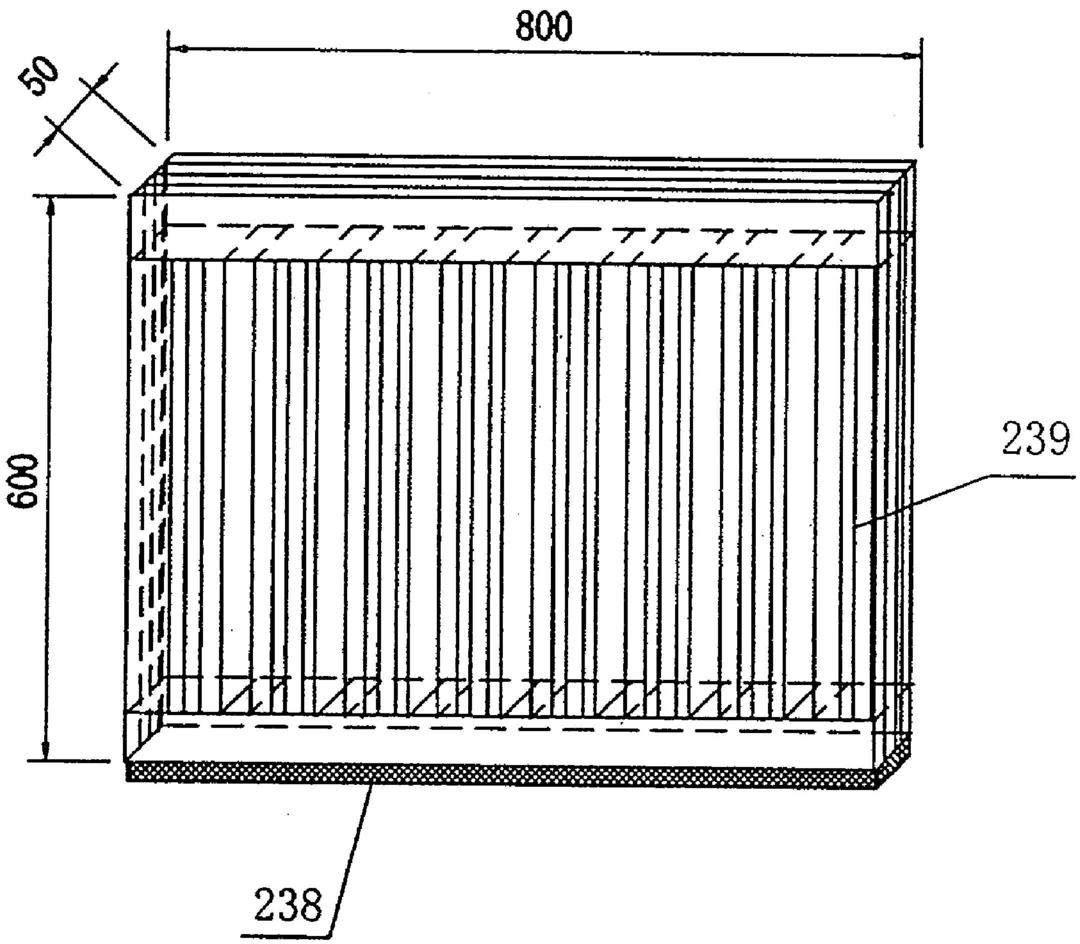
FIG. 2D shows a wall-mounted heater.

FIG. 2D shows a wall-mounted heater comprising the heat transfer element in Example 2. It comprises an electric heating body 238, a heating and heat transfer element 239 and a temperature controller. It is configured to ordinary heaters and can be mounted to the wall.

Figure 2E:
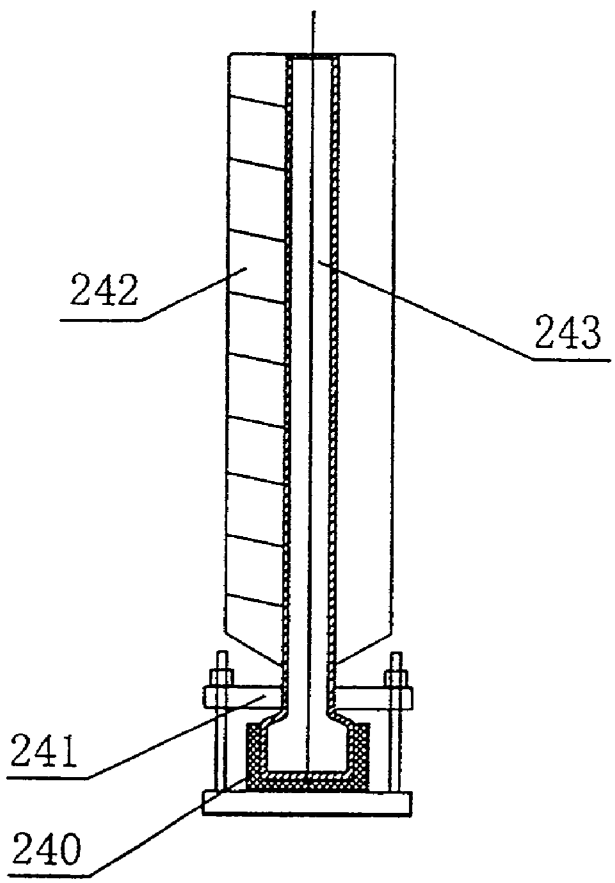
FIG. 2E shows a mobile heater.
Figure 2F:
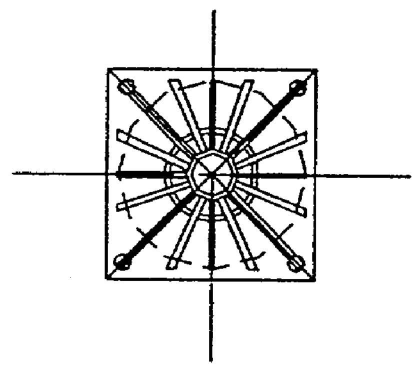
FIG. 2F shows a top view of a mobile heater.

FIG. 2E shows a mobile heater comprising the heat transfer element in Example 2. It is configured to a fan and can be placed in any place as desired. After being powered on, an electric heating body 240 releases heat first. The heat is then transported to the heating and heat transfer element 243 in a sealed cavity through the bottom of the heater. As the electric heating body maintains the entire cavity at an even temperature, radiating flanges 242 transfers heat to indoor air, leading to gradual temperature rise in the room. When achieving the desired room temperature, the controller switches the heating body off. When room temperature is lower then the set value due to heat dissipation, the heater is again powered on allowing the heating cone to start heating. The process is repeated to keep the indoor temperature constant. The configurations of the heating devices and radiators, as well as the configurations of the heat dissipating and transfer elements as implemented thereto vary. FIG. 2F is a top view of the mobile electric heater in FIG. 2E.

The power of all electric heaters in this embodiment is 1 kW. The heater is able to heat a room of 10–15 $m^2$ under normal circumstances, while improvement and changes may be made to the heater according to the present invention.

EXAMPLE 7

Figure 2G:
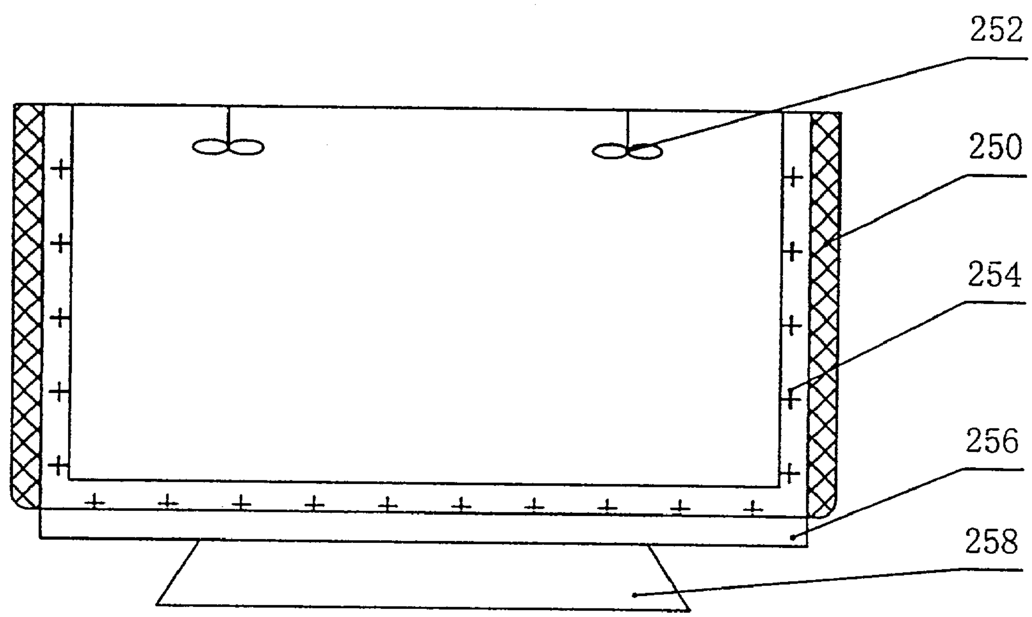
FIG. 2G shows a schematic view of hot blast oven.

FIG. 2G shows a new hot blast oven apparatus. Food in this oven is heated evenly with the heat transfer heating element of the present invention.

As shown in FIG. 2G, an electric heater 256 starts heating the oven wall after the oven is powered on. Then heat transfer heating element 254 starts operation as being heated. Fans 252 provided on the top of the oven forces counter flow, which produces hot wind of even temperature in the oven. Temperature in conventional ovens is not even due to direct heating approach. This often results in over-cooking part of the food but insufficiently cooking some other part. The other shortcoming is that grease and food crumbs left in the oven will reduce its performance after a period of time. The hot blast oven of the present invention, however, maintains an even temperature to ensure effective performance.

Applications to Daily Products

The following Examples 8 to 15 show applications of the heat transfer elements of the present invention being implemented to daily products, such as electric water heaters, fan heaters, electric heaters, kettles, Chinese hot pots, grill boards, electric irons and high performance dual-mode water boilers.

EXAMPLE 8

This embodiment is an electric water heater using electricity as a heat source and the inorganic high heat transfer element of the present invention as a heat transfer element.

Figure 3A:
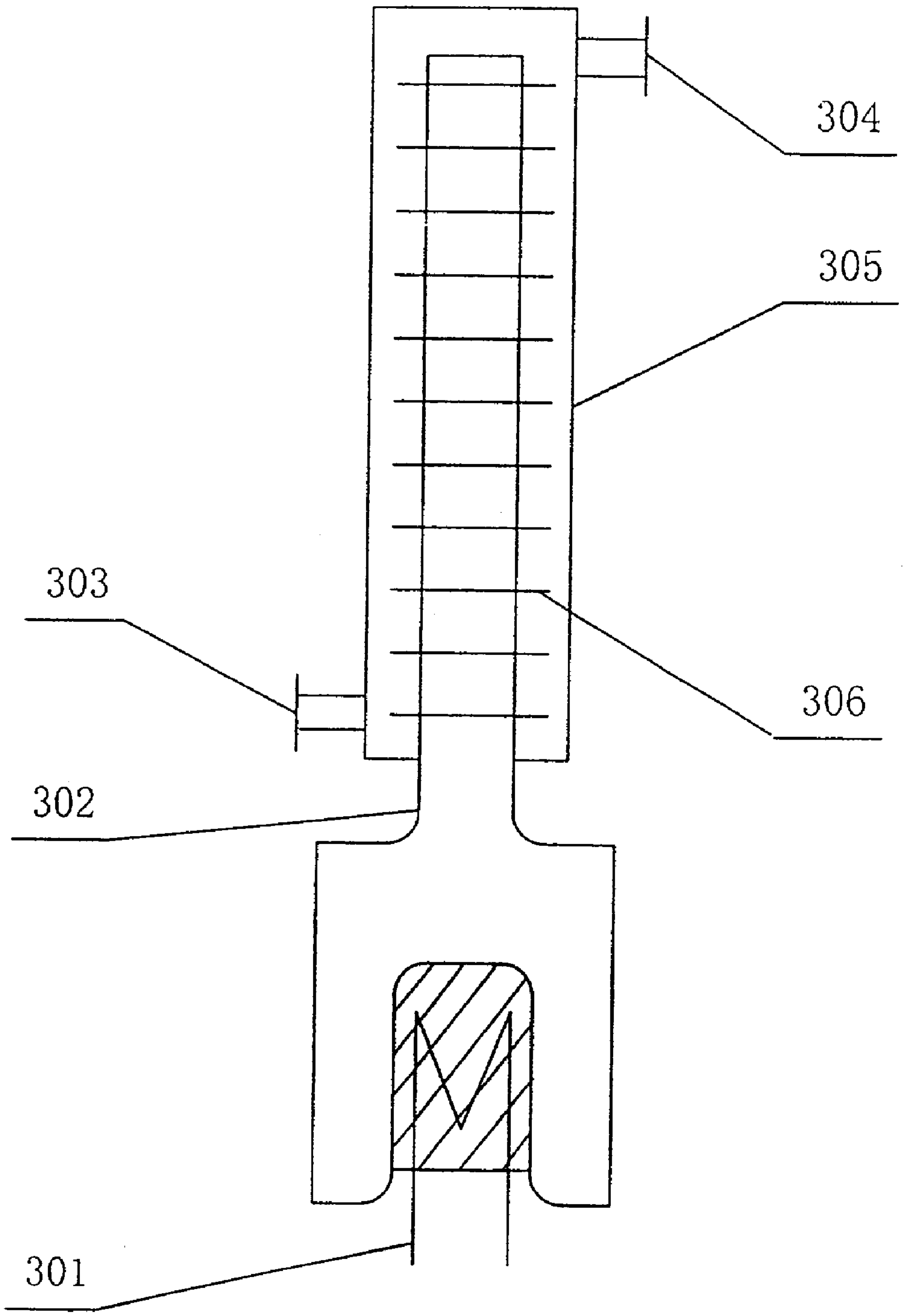
FIG. 3A shows a schematic view of the structure of a water heater with high heat transfer rate.

The inorganic high heat transfer electric water heater in FIG. 3A comprises: a heating device body 301, inorganic high heat transfer element 302, and water jacket 305. Heat released by resistance wires travels to the heat receiving end of the element via the heating device body embedded in the inorganic high heat transfer element. Inorganic medium in the element transfers heat rapidly from the heat receiving end to the heat releasing end, which is inserted into the water jacket. Flow conductors 306 wind about the heat releasing end to increase flow rate, turbulence, counter-flow heat exchange coefficient, to enhance heat transfer, and to increase the heat exchange area. Cold water enters a cold water intake 303 provided at a lower portion of the water jacket, and is heated by absorbing heat released by the inorganic high heat transfer element and then exits through a hot water outlet 304 provided at an upper portion.

The inorganic high heat transfer electric water heater of the present invention allows instant operation, quick warming, provides high heat efficiency, prolongs the lifespan, and isolates the heating device body from the heated medium, such that there is no need to discontinue or clean the heated medium.

EXAMPLE 9

This embodiment is an electric fan heater, using electricity as a heat source and the inorganic high heat transfer element of the present invention as a heat transfer element, for heating and propelling heated air.

Figure 3B:
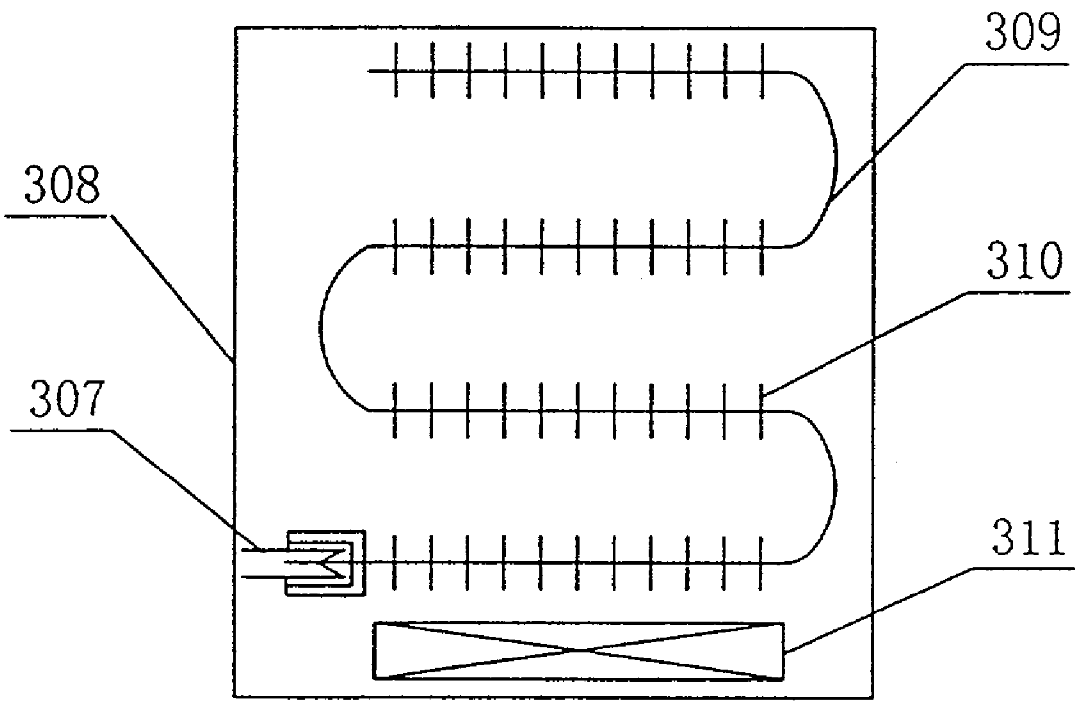
FIG. 3B shows a schematic view of the structure of a fan heater with high heat transfer rate.

The inorganic high heat transfer electric fan heater in FIG. 3B comprises a heating device body 307, an inorganic high heat transfer element 309, and a casing 308. Several rows of elements are arranged in the form of serpentine pipes in the casing so as to reduce volume and extend time for contacting with liquid. The operating theory is that: heat released by resistance wires travels to the heat receiving end of the element via the heating device body embedded in the inorganic high heat transfer element. Inorganic heat transfer medium in the element transfers heat from the heat receiving end to the heat releasing end that is exposed to air. Fins 310 wind about the heat releasing end to increase the heat exchange area and to enhance heat transfer effect. A fan is further installed at a lower portion of the heat releasing end so as to force counter-flow heat exchange by forcing out the heated air.

The inorganic high heat transfer fan heater of the present invention allows instant operation, quick warming, provides high heat efficiency, and reduces the overall dimensions and weight of the heater.

EXAMPLE 10

This embodiment is an electric heater using the inorganic high heat transfer element of the present invention as a heat transfer element.

Figure 3C:
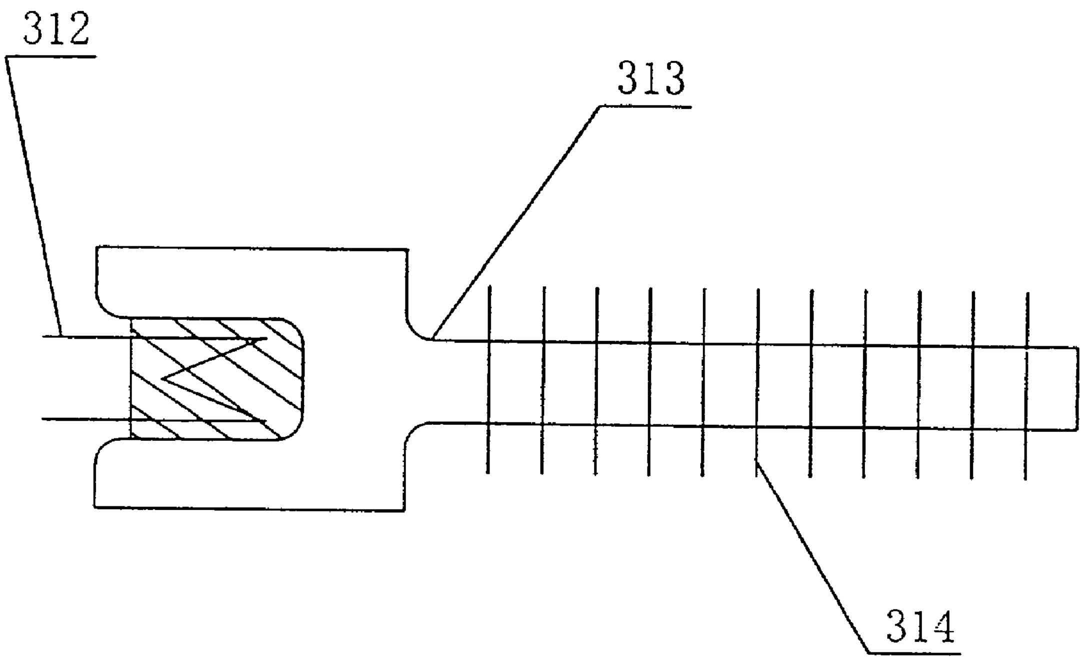
FIG. 3C shows a schematic view of the elements of an electric heater with high heat transfer rate.
Figure 3D:
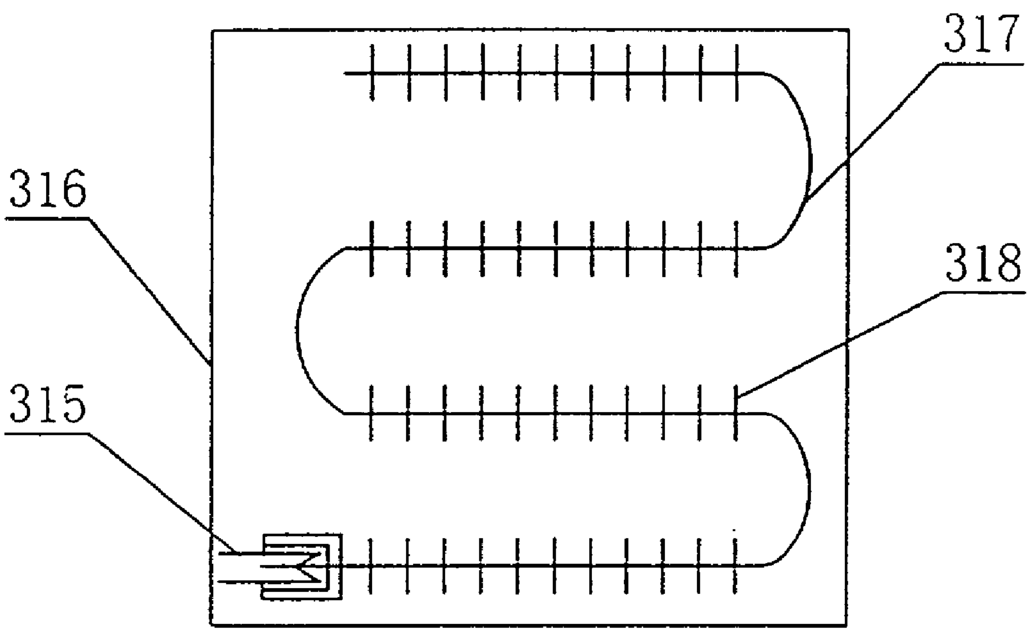
FIG. 3D shows a schematic view of the structure of an electric heater with high heat transfer rate.

The inorganic high heat transfer electric fan heater in FIG. 3D comprises an electric heater element 317 and a casing 316. The electric heater element can be made into a serpentine pipe and arranged in multiple rows. As shown in FIG. 3C, the electric heater element comprises: a heating device body 312 and an inorganic high heat transfer element 313. The operating theory is that: heat released by resistance wires travels to the heat receiving end of the element via the heating device body embedded in the inorganic high heat transfer element. Inorganic heat transfer medium in the element transfers heat from the heat receiving end rapidly to the heat releasing end that is exposed to air. Fins 314 wind about the heat releasing end to increase the heat exchange area and to enhance heat transfer effect. Air is lifted up after being heated while cold air moves downward to fill space originally occupied by the lifted air, to facilitate a natural counter-flow circulating system.

The inorganic high heat transfer electric heater of the present invention allows instant operation, quick warming, enhances heat efficiency, and reduces the overall dimensions and weight of the heater.

EXAMPLE 11

This embodiment is an electric kettle using the inorganic high heat transfer element of the present invention as a heat transfer element.

Figure 3E:
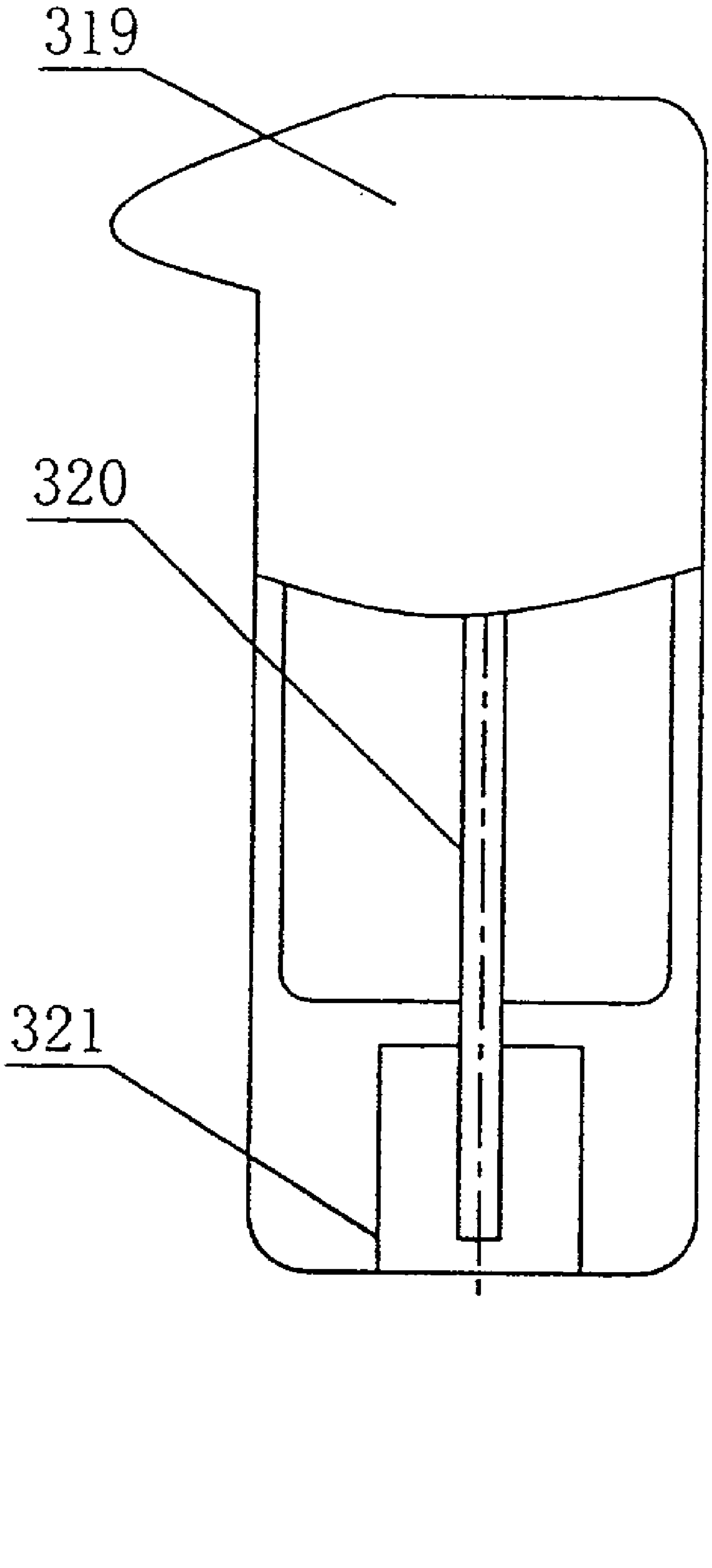
FIG. 3E shows a schematic view of the structure of a kettle with high heat transfer rate.

The inorganic high heat transfer electric water heater in FIG. 3E comprises a heating kettle 319, an inorganic high heat transfer pipe 320, and an electric heater 321. The inorganic heat transfer pipe penetrates and is welded to the kettle bottom. An end of the pipe is inserted into the kettle while the other end extends out of the kettle bottom to be heated by the electric heater. The operating process is that: the power is turned after water is poured into the kettle. The inorganic heat transfer pipe then heats the water with electro-thermal energy until the water boils.

The high heat transfer kettle of the present invention prevents fusing due to water shortage because the water is isolated from resistance wires. By doing this, it assures electric safety and prolongs the lifespan of the kettle and electric heater.

EXAMPLE 12

This embodiment is a Chinese hot pot using the inorganic high heat transfer element of the present invention as a heat transfer element.

Figure 3F:
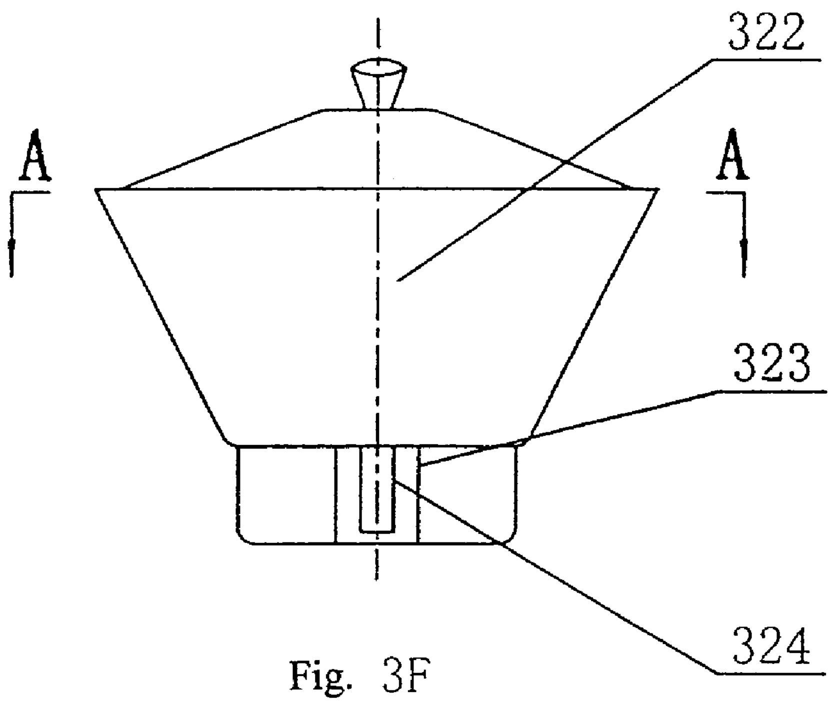
FIG. 3F shows a schematic view of the structure of a Chinese hot pot with high heat transfer rate.
Figure 3G:
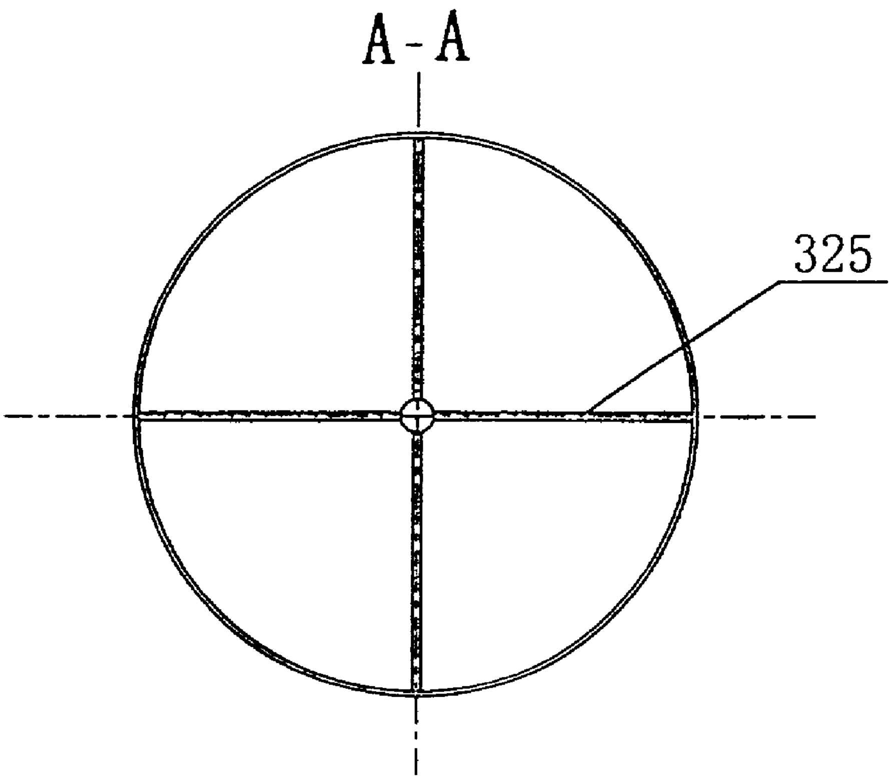
FIG. 3G shows a partial cross-sectional view of a Chinese hot pot with high heat transfer rate.

The inorganic high heat transfer electric Chinese hot pot in FIG. 3F comprises a heating pot 322, an electric heater 323, a source end of an inorganic high heat transfer pipe 324, and a sink end of an inorganic high heat transfer pipe (hollow partition) 325. The sink end of the inorganic high heat transfer being made into a hollow plate, is welded to an edge of the pot and to a ϕ20 tube at the bottom of the pot center. The ϕ20 tube penetrates and is welded to the pot bottom. The ϕ20 tube having an extended end being the source end of the inorganic high heat transfer element.

The workflow of the inorganic high heat transfer Chinese hot pot is that: power is turned on after water is poured into the hot pot; the source end of inorganic heat transfer element then absorbs heat from the electric heater and then passes the heat to the sink end (hollow partition) via the medium. The water absorbs heat from partitions that are arranged evenly in the pot until the water boils.

The high heat transfer Chinese hot pot of the present invention enlarges heat transfer area with partition walls used in heat transfer. The partitions are arranged as a cross to keep temperature even.

EXAMPLE 13

This embodiment is a grill using the inorganic high heat transfer element of the present invention as a heat transfer element.

Figure 3H:
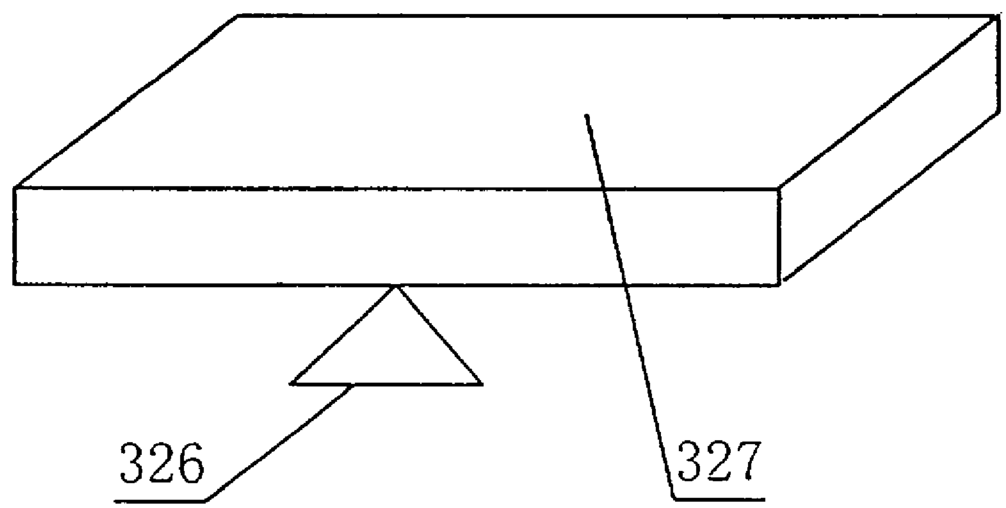
FIG. 3H shows a schematic view of the structure of a grill with high heat transfer rate.

The inorganic high heat transfer electric fan heater shown in FIG. 3H comprises a heating source 326 and a grill 327 made of the inorganic high heat transfer element. A cavity in the grill is filled with the inorganic heat transfer medium. Receiving heat from the heating source at its bottom, the grill bakes food by heating it with well-distributed heat on the surface thereof. The grill comes in all shapes, such as square, circle, or other shapes, according to food to be baked.

The inorganic high heat transfer grill features rapid operation, homogenous temperature distribution, and the color on the roasted surface of the food is essentially homogenous. The grill does not produce soot so neither the food nor the environment is polluted. Apart from this, it is small and light.

EXAMPLE 14

This embodiment is an electric iron using the inorganic high heat transfer element of the present invention as a heat transfer element.

Figure 3I:
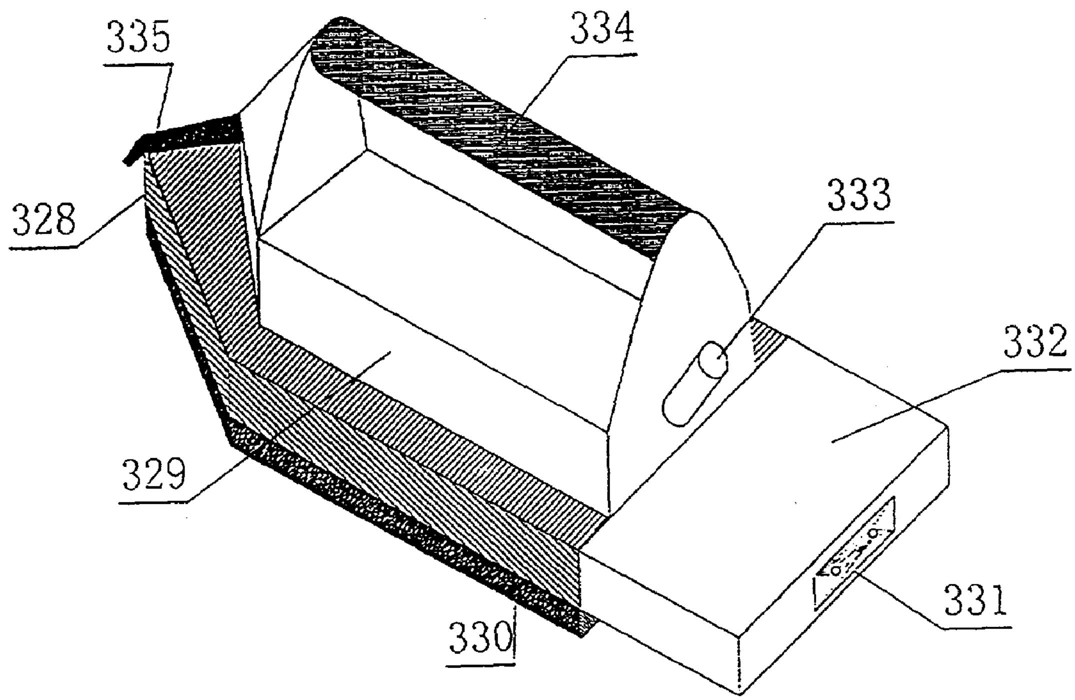
FIG. 3I shows a schematic view of the structure of an electric iron with high heat transfer rate.

As shown in FIG. 3I, the inorganic high heat transfer electric iron comprises of three layers. The first layer is composed of a stainless base plate 330; the second includes an inorganic high heat transfer plate 328, a plate cavity electric heater 332 and power intake 331. It should be certain that the plate cavity electric heater and the high heat transfer plate are well connected and in complete contact with each other for heat exchange. The stainless steel base and the inorganic high heat transfer element should be closely pressed together and the contact rate therebetween should be above 80%. If necessary, heat-transferring grease may be filled. The third layer includes a steam generator 329, a spray outlet head 335 and a handle 334. A water intake 333 is provided on the steam generator 333. It should be sure that the steam generator comes in good contact with the inorganic high heat transfer plate.

The apparatus is powered by home AC electric source through a power input 331. Then the plate cavity electric heater 332 starts dissipating the heat. After receiving heat, the absorbing segment of the inorganic high heat transfer heat plate distributes the heat rapidly and evenly to the cavity, and achieves homogenous temperature on the plate. Heat is well distributed again when it is transferred to the stainless base plate 330. The steam generator 329 also absorbs certain amount of heat from the inorganic high heat transfer plate, producing steam by heating water. The steam is exported from the spray outlet 335 for ironing clothes. The high heat transfer rate of the plate makes it possible to complete the above process in a very short period. An electric temperature control system controls the temperature on the base plate.

The base plate of the inorganic high heat transfer electric iron of the present invention features homogeneous temperature distribution and separated heating, it provides superior safety protection. The apparatus is also long-life and easy to use.

EXAMPLE 15

This embodiment is a high performance and dual-mode water boiler using the inorganic heat transfer element of the present invention as a heat transfer element.

Figure 3J:
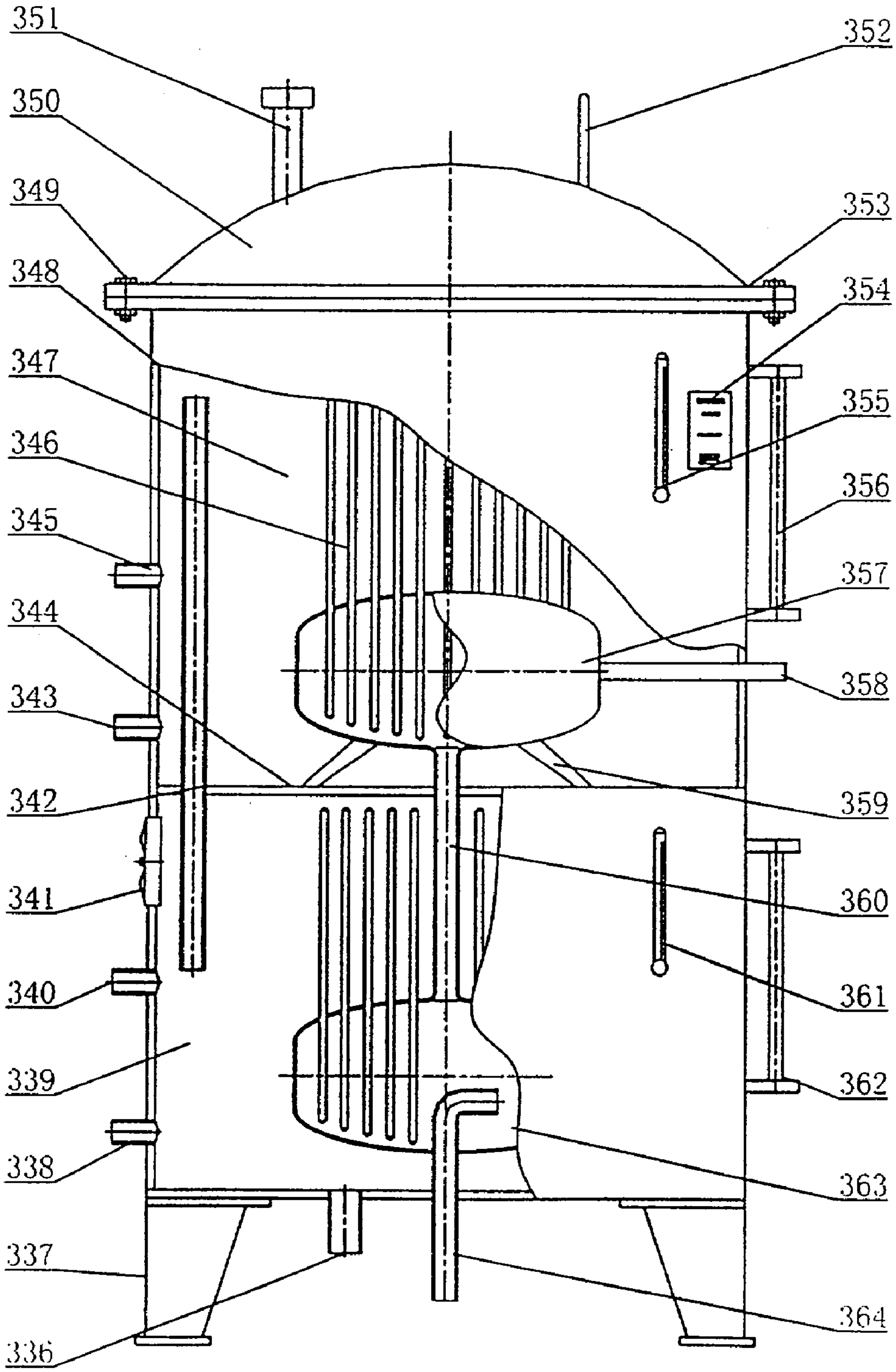
FIG. 3J shows a schematic view of the structure of a high performance and dual-mode boiler with high heat transfer rate.

As shown in FIG. 3J, the water boiler comprises an upper water chamber 347, a lower water chamber 339, a partition 344, a lower steam chamber 363, an upper steam chamber 357 and an inorganic heat transfer element. The upper water chamber 347 and lower water chamber 339 are formed by the partition 344 welded to the water chamber wall 348. A water transmission pipe 342 is welded between both water chambers and penetrates the partition 344 to communicate the chambers. When water in the lower water chamber 339 rises to a certain level or bears certain pressure, it flows automatically into the upper water chamber 347 through the water transmission pipe 342. The bottom of the water transmission pipe 342 is at the same level of the hot water outlet 340, while the top of it is at the height of ¾ of the length of a water scale 356 in the upper water chamber. Both the upper steam chamber 357 and the lower steam chamber 363 are in the inner flask of the water chambers. Inorganic heat transfer element 346 is welded to the spherical upper seal. The part of the inorganic heat transfer element 346 inside the steam chamber is one-third of the length of the whole heat transfer element 346. Both steam chambers are the same in terms of size, shape and structure. Both are made in accordance with requirements for pressurized containers. A steam transmission pipe 360 goes through the partition 344 to communicate the middle of the spherical lower seal of the upper steam chamber 357 and the middle of the spherical upper seal of the lower steam chamber 363. Thus, the cold liquid-vapor in the upper steam chamber 357 may flow to the lower steam chamber 363. An incoming steam pipe 358 is welded to one side of the upper steam chamber 357 as a communicative passage to the exterior. A holder 359 is connected with the partition 344 at the lower spherical seal. A dredging pipe 364 is welded to the middle of the lower spherical seal of the lower steam chamber 363 as a communicative passage to the exterior. A holder 359 is connected with the base of the water chamber wall 348. The dredging pipe 364 is a curved pipe forming a right angle. The length of the part of the pipe 364 inserting vertically into the steam chamber is one-fourth of the height of the steam chamber, such that some new vaporized water has longer heat exchange time and makes the most of afterheat, and to stop the steam and the water from flowing into the dredging pipe at the same time. Water chamber wall 348 is made of steel plate as a cylinder, and is provided with a water intake 338, a hot water outlet 340, a boiling water outlet 345, an upper exhaust outlet 343, a cleaning hand hole 341, a thermometer 362 in lower water chamber, a water thermometer 361, a thermometer 356 in the upper water chamber, a thermometer 355, a holder 337, a lower exhaust outlet 336 and a nameplate 355. Water chamber wall and seal 350 are connected together by a flange for sealing and dismounting. A gas exhaust valve 351 and a siren are installed on the seals. Apparatus such as automatic controllers and temperature controllers can be installed to the dual-mode water boiler, which becomes an inorganic high heat transfer automatic double chamber and dual-mode water boiler.

The inorganic high heat transfer dual-mode water boiler of the present invention produces boiling water and hot water at the same time. It contributes to high efficiency by making the most of thermal energy. This embodiment is superior to ordinary water boilers for the following reasons. First, its structure is scientifically reasonable. Secondly, it features continuous supply of boiling/hot water, easy operation, safety and reliability.

Applications to Mechanical Machining Apparatus

The following Examples show applications of the heat transfer elements of the present invention to the heating in the mechanical machining apparatus. For instance, it can be applied to an inorganic high heat transfer screw plastificator.

EXAMPLE 16

Figure 4A:
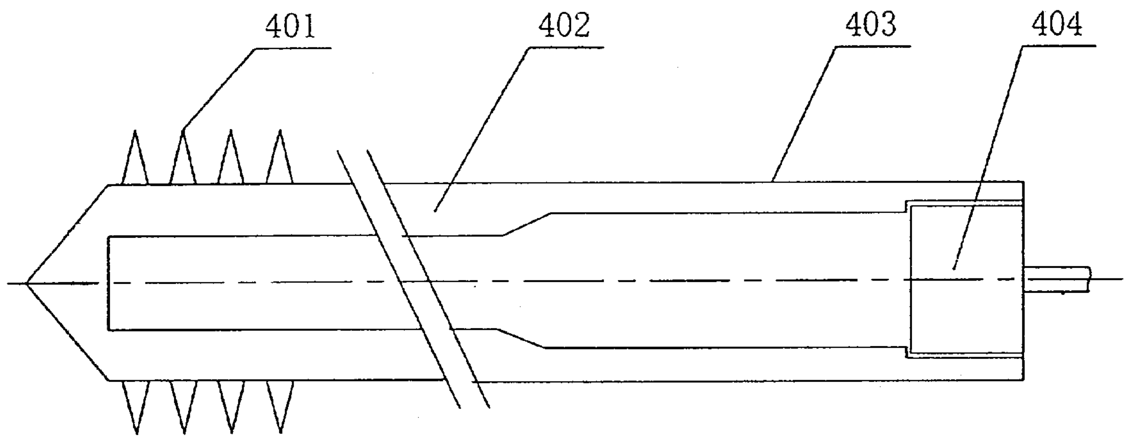
FIG. 4A shows a schematic view of a plastic injecting screw rod with high heat transfer rate.

The heat transfer element of the present invention is applicable in mechanical machining, particularly inorganic high heat transfer screw plastificators. The inorganic high heat transfer screw plastificator shown in FIG. 4A comprises a screw fin 401, inorganic high heat transfer medium 402, a screw worm body 403 and an electric heater 404. Screw worm body 403 is a crucial pat of the screw plastificator with the main functions of transporting, pressing, plasticizing and pressurizing plastic material. The inorganic high heat transfer screw plastificator comprises a material container. It contains a cylinder-cone cavity filled with a certain amount of inorganic high heat transfer medium 402. An electric heater 404 is installed on the side near the hopper.

The operating theory of the screw plastificator of this embodiment is described as follows. After the electric heater is powered on, one side of the screw worm body near the heater is heated. Then inorganic high heat transfer medium in the cavity of the screw plastificator heats the screw worm body by rapidly transporting heat to the other end of the cavity. When the screw worm body is turned around, the inorganic high heat transfer medium flows back to the heating end due to centrifugal force, such that the heat travels continuously from the electric heater to the screw worm body.

The screw plastificator of this embodiment has the following advantages: it is easy to control the temperature in the material container of the plastificator, which leads to small axial temperature gradient and obtains better plasitification of the plastics in the material container; it also achieves stable quality of products and higher performance by reducing plastic degradation; it is suitable for heat-sensitive plastic of low viscosity since it enlarges the scope of plastic-injecting applications; its simple structure contributes to reliability in terms of operation.

Applications of Heating to Heat Recovery Systems

The following Examples 17 to 72 show applications of the heat transfer elements of the present invention to heat recovery system. For instance, they are used in high heat transfer air pre-heater, high heat transfer air pre-heater in a coke furnace, integrated high heat transfer blast furnace air pre-heater, high heat transfer horizontal blast air pre-heater in a chemical fertilizer manufacturing system (with/without a liquid-vapor separator), high heat transfer up/down-route gas horizontal afterheat boiler, high heat transfer vertical and eccentric blast afterheat boiler in the chemical fertilizer manufacturing system (with/without a liquid-vapor separator), high heat transfer vertical and eccentric blast afterheat boiler in the chemical fertilizer manufacturing system (with/without a liquid-vapor separator), high heat transfer up/down-route gas upright eccentric afterheat boiler (with/without gas water separator), high heat transfer up/down-route gas upright symmetric afterheat boiler, high heat transfer afterheat boiler, high heat transfer stream generator installed in a cement kiln, high heat transfer water heater installed in a cement kiln, high heat transfer air dryer and heater in a ceramic kiln furnace, high heat transfer card exhaust heater, high heat transfer seawater distiller for oceangoing vessels, high heat transfer up/down-route gas upright symmetric afterheat boiler (with gas water separator), high heat transfer horizontal afterheat boiler, high heat transfer eccentric afterheat boiler, high heat transfer symmetric afterheat boiler, high heat transfer electric boiler air pre-heater, high heat transfer power plant boiler fuel heating system, high heat transfer water heater in the power plant boiler, afterheat water heater, air pre-heater, dual gas heater, afterheat boiler of the rotary kiln in magnesium plants, afterheat boiler of the reduction kiln in magnesium plants, afterheat boiler of the sintering machine, afterheat boiler of the coupling casting machine, heat recovery device for casting billet, heat recovery apparatus of a fuel oil industrial furnace, fuel oil industrial furnace stream generator, heat recovery apparatus of a gas industrial furnace, gas industrial furnace stream generator, exchange device in a dryer energy cycling system, heat recovery apparatus used in restaurants, high heat transfer air re-heater of the propane de-asphalt furnace, high heat transfer air re-heater of the molecular screen de-wax carrier furnace, high heat transfer blast air pre-heater in the chemical fertilizer manufacturing system, high heat transfer air pre-heater in a platinum resetting heater, high heat transfer air pre-heater in an inorganic high heat transfer Arene device constant depressurizing carrier furnace, heat transfer and recovery device installed on the continuous casting billet cold table of a continuous casting machine in the steel plant, high heat transfer glass kiln air pre-heater, high heat transfer air pre-heater installed on the top of a crude heater, high heat transfer air pre-heater in a stream instilling boiler, high heat transfer water pre-heater in a stream instilling boiler, high heat transfer afterheat boiler of the boiler, gas sensible heat device adopting a coke furnace lift pipe with an inorganic high heat transfer element, corrosion-proof heat transfer pipe of an inorganic high heat transfer anti-dew-point corrosion air pre-heater, high heat transfer soft water heater, high heat transfer bridge double channel afterheat recovery device, high heat transfer vortex scroll heat exchanger, high heat transfer air-air/air-liquid combined heat exchanger, high heat transfer afterheat processing apparatus in synthetic ammonia making technique, high heat transfer sulfur trioxide heat exchanger, total counter flow inorganic high heat transfer heat exchanger, high heat transfer heat recovery apparatus in dry coke technique, high heat transfer air pre-heater in furfural refiner, joint air pre-heater in a heating furnace with constant depressurizing devices in refinery, etc.

EXAMPLE 17

The following embodiment is shown in FIGS. 5AA to 5AC. FIG. 5AA is a partially cross-sectional top view of an inorganic high heat transfer air pre-heater. FIG. 5AB shows a partial zoom-in view of an inorganic high heat transfer pipe. FIG. 5AC shows partially cross-sectional front view of an inorganic high heat transfer air pre-heater. It is related to an air pre-heating device using heat carried by smoke for entering the boiler in the embodiment of the present invention.

It is necessary to pre-heat air going into the boiler to reduce fuel consumption. Normally, the air is preheated by means of heat exchange between hot smoke from the boiler and cold air.

As shown in FIGS. 5AA and 5AB, at least one set of the opposite walls should be plates in cylinder pipe box 501 with mouths on both ends to support the inorganic high heat transfer pipe. A plurality of holes are regularly arranged on the plates and face the external diameter of the inorganic high heat transfer pipe 502. Parallel to two supporting plates as described above, a partition 503 is provided in the pipe box to divide it into two disconnected cavities. Direction of the air and the smoke flows according to the condition on site. As shown the attached drawings, an air outlet pipe 504 is installed to the top and an air intake pipe 505 to the bottom of the air cavity. A smoke intake pipe 506 is installed to the top and a smoke outlet pipe 507 to the bottom of the smoke cavity. Soot cleaning hole 508 is attached to the pipe 507. As FIG. 5AC shows, holes are provided on the partition with the arrangement and number thereof corresponding to the holes on the two supporting plates. Each hole is inserted with an inorganic high heat transfer pipe with a fin 509 thereon. A seal flange 510 is installed between each high heat transfer pipe and the partition.

Back to FIG. 5AB, a seal box 511 with a removable lid covers the holes on the surface of the supporting plate. The bottom of partitions and plates bearing the inorganic high heat transfer pipe bundle are fixed to a bearer 512. The most preferable material for the bearer is I shaped steel beam. Both ends of each bearer are fixed to holder 513.

To ensure proper operation of the inorganic heat transfer pipe, the inorganic high heat transfer tube bundle should be inclinedly installed. A side of the air cavity should be higher than a side of the smoke cavity. When the inorganic high heat transfer tube bundle is vertical to the supporting plate, the box should be tilted toward the smoke cavity. Thus, the tube bundle in the pipe box forms a certain angle with the horizon.

As the holes on the supporting plate in the air cavity correspond the holes on the supporting plate of the smoke cavity supports, the inorganic high heat transfer tube bundle tilts to the smoke cavity, forms a certain angle with horizon. The pre-heater in the above construction may be used independently. Alternatively, two pre-heaters may be connected together in series with linking pipes 514. A soot blower 515 installed in the smoke cavity (FIGS. 5AA and 5AB). The top of the cavity is sealed and several air holes are provided on the wall of the blower so that the blower and the pressurized air pipe are connected together. It is preferable to install a thermal insulating layer 516 on the wall of the pipe box which do not have inorganic high heat transfer pipe installed.

The workflow is described as follows: the tube bundle in the smoke cavity recovers the heat carried by smoke. Then the tube bundle in the air cavity increases the temperature of air by transferring heat to it.

The device in this embodiment has the following effects: 1. high heat transfer efficiency, which reduces the size of the heat exchanger to ½ to ⅔ of the pipe casing neat exchanging system. 2. It is easy to clean soot in the apparatus because of its simple structure. 3. Air and smoke move as counter flows, which is very helpful in extending the service life.

EXAMPLE 18

The following embodiment is shown in FIGS. 5BA and 5BB. FIG. 5BA shows an appearance of an inorganic high heat transfer air pre-heater in the flue of a coke furnace. FIG. 5BB shows partially cross-sectional and zoom-in view along the line A—A in FIG. 5BA. It is related to an air pre-heater installed on the smoke discharging channel of coke furnace in oil processing. Benefiting from the heat transfer element of the present invention, this embodiment features simple structure, long service life and high heat exchange efficiency. It fully embodies high effect in energy saving heat exchange and reducing energy consumption.

In order to improve the thermal efficiency of the coke furnace and reduce energy consumption, a heat recovery apparatus is installed to the flue of the furnace to heat cold air. Smoke-gas air pre-heaters with pipe banks are usually adopted in conventional heat recovery apparatus, the heat exchange efficiency of which is poor since this apparatus can only recover partial afterheat in smoke. The other drawback is that such kind of air pre-heater has complex structure. Problems such as corrosion of heat exchange pipes, difficulty in replacement and shortening of the service life occur in using it for a certain period of time.

This paragraph describes the embodiment of application. It comprises independent channels for air and smoke, which go through a set of aligned and parallel boxes, which are separated by an intermediate sealed plate 526. One end of it is linked to the smoke channel while the other end goes through the partition between air and smoke channels and is connected with the side wall of the air channel in an upward inclined way. An inorganic heat transfer tube bundle is installed in each box. A fin radiator is attached to the heat transfer pipe. Tube sheets on both sides of the box bear both sides of the pipe. The inorganic heat transfer pipes may penetrate the intermediate sealed plate in the box. The surface thereof is connected with the partition 520 in the sealed case.

As FIG. 5BA shows this embodiment comprising a casing 523 containing an air channel 518 and a flue 521. Partition 520 is provided in the casing 523 and is connected with the sidewall of the casing so as to separate the air channel 518 and the flue 521. Inside the casing 523, there is a set of aligned and parallel boxes 519, which go through the partition 520 and into the cavities of the channels 518, 521. Both ends of the channels are connected with the two sidewalls opposite to the partition 520. The box 519 is connected with the side wall of the air channel, and the other end of the box is connected with a terminal framed connecting box. Interface flanges are installed at the cold air intake 517 and the hot air outlet 522 of the air channel 518 as well as the hot smoke intake 524 and the smoke outlet 525 of the flue, for connecting with the ventilator and the smoke extracting pipe.

As shown in FIG. 5BB, an inorganic heat transfer tube bundle is longitudinally installed in the box 519. A fin radiator 528 is attached to the inorganic heat transfer element 527. The fin absorbs heat in the smoke and transfers it to the other side of the element to fully heat the cold air. Vertical endplates 529 on both sides of the connecting box bear both sides of the pipe. Each box contains an upright sealed tube sheet 526 therein. The surface of the sealed tube sheet is connected and sealed with the partition 520 in the case so that no leak between the air channel and flue.

Compared with existing technology, the embodiment has several advantages. First, it heats the air coming into the furnace with afterheat produced by smoke. Second, it has smaller size and higher heat exchange rate than smoke-gas air pre-heater with tube banks so and thus reduces the energy consumption.

EXAMPLE 19

This embodiment is shown in FIGS. 5CA to 5CC. FIG. 5CA is a partially cross-sectional top view of an integrated inorganic high heat transfer air pre-heater. FIG. 5CB is a partial zoom-in view of an integrated inorganic high heat transfer pipe. FIG. 5CC is a partially zoom-in view of an inorganic high heat transfer air pre-heater. It is related to an air pre-heating device using the heat carried by smoke for entering into the blast furnace disclosed in Example 3 of the present invention.

It is necessary to pre-heat air going into the blast furnace to reduce fuel consumption. Normally, air is preheated by means of heat exchange between hot smoke from the blast furnace and cold air.

The integrated inorganic high heat transfer air pre-heater in this embodiment comprises of two parts. Each part is a framed structure with a partition having conical holes dividing it into two cavities (upper and lower). Air goes through the upper cavity, which is a sink end; while smoke goes through the lower cavity, which is a source end. As shown in FIGS. 5CA and 5CB, at least one set of the opposite walls should be plates in cylinder pipe box 516' with mouths on both ends to support the inorganic high heat transfer pipe. A plurality of regular arranged holes it is formed on the plates and facing the external diameter of inorganic high heat transfer pipe 514'. The pipe box has a partition parallel to the two supporting plates, which divides the pipe box into two disconnected upper and lower cavities. The flow directions of the air and the smoke depend on the condition on site. As the attached drawing, an air outlet pipe 501' is installed to the left of the air cavity and an air intake pipe 508' it installed on the right. Further, a smoke intake pipe 504' is installed to the right of the smoke cavity and a smoke outlet pipe 507' is installed on the left. An access port 503' is attached to the pipe 507'. As shown in FIG. 5CC, the partition have holes with the arrangement and number complying with the holes on the two supporting plates. Each hole is inserted with an inorganic high heat transfer pipe with a fin 509' on the surface thereof. A seal flange 510' is installed between each high heat transfer pipe and partition.

Back to FIG. 5CB, a seal box 511' with a removable lid covers the holes on the surface of the supporting plate. The partitions supporting the inorganic high heat transfer pipe bundle and the bottom of the plate are fixed to a bearer. The preferable material for the bearer is I shaped steel beam. Both ends of each bearer are fixed to a holder 516'.

To ensure proper operation of inorganic heat transfer pipe, the side of the air cavity should be higher than the side of the smoke cavity. The pre-heater with structure as stated above can be used as a single device. Alternatively, two pre-heaters may be connected in series by a partition 513'. As shown in FIGS. 5CA and 5CB, a soot blower 515' is installed in the smoke cavity. The top of the cavity is sealed and several air holes are provided on the wall of the blower so that the blower and pressurized air pipe are connected together. It is the preferable to install a thermal insulating layer 512' on the wall of the pipe box, which does not have the inorganic high heat transfer pipe installed.

The workflow of this embodiment is described as follows: the tube nest in the smoke cavity recovers heat carried by smoke. Then the tube bundle in the air cavity increases the temperature of air by sending heat thereto.

As compared with existing technology, this embodiment has several advantages. It achieves high heat transfer rates and has vast unit heat transfer area. It also reduces the size of the heat exchanger to ½ to ⅔ of the heat exchangers with tube banks and is easy to clean the soot in the apparatus because of the simple structure. Further, it extends the useful life by enhancing counter flows between air and smoke.

EXAMPLE 20

FIG. 5D shows an inorganic high heat transfer horizontal afterheat boiler, which is related to a steam generating apparatus utilizing the heat carried by a blast from the chemical fertilizer gas making system described in Example 4 of the present invention. Inorganic high heat transfer element is adapted to enhance the efficacy of heat exchange.

The temperature of the blast produced in the process of coal and synthetic ammonia making system is fairly high at about 400° C. to 500° C. It carries a considerable amount of heat. The blast contains large amount of dust and it is a waste of energy if it is discharged into air. Steam produced by the heat carried by the blast can be used within the system or transported for external applications, which promotes thermal efficiency of the system, reduces energy consumption and diminishes pollution.

As shown in the drawings, the equipment comprises three parts, namely (1) a horizontal boiler drum 523'. The boiler drum is a pressure-bearing cylinder with standard oval seals welded to both sides thereof. A liquid-vapor outlet 522' is provided on the top of the cylinder and a water intake 524' is provide at the bottom. (2) Inorganic high heat transfer element 520'. Several rows of inorganic high heat transfer elements 539H are welded evenly to the wall of the cylinder. The element is a sealed cavity filled with inorganic heat transfer medium. A metal rib is welded to one side on the surface of the element by means of high frequency resistance welding to enlarge the area of heat transfer. The other side of the element is a bored pipe. The side with a rib on the element is a heat receiving end installed in the flue box to absorb heat traveling to the pipe through the rib and the wall of the pipe. The side without the rib is an exothermal end, which transfers the heat absorbed by medium at the heat receiving end to the liquid-vapor mixture in the cylinder through the wall to produce steam. 3) Flue box 518', where the hot gas moves in the rectangular flue box.

The element is welded to the container. The end of the pipe on the side of the flue box is supported by a positioning board 519'. The end near the steam is a free end and is axially stretchable. There is no thermal stress occurred on welds in case of changes in operating temperature, which prevents welds from being pulled off by thermal stress.

There are two structural arrangements of the inorganic high heat transfer elements with respect to the horizon, namely the horizontal element (FIG. 5D) and the vertical element. The operational theory shared by both arrangements is that the channel for the blast and the channel for liquid-vapor mixture are divided into two independent boxes. Blast travels to the rectangular flue box 518' while liquid-vapor mixture goes to the pressure-bearing cylinder, i.e. boiler drum 523'. Blast intake 517' and cooled gas outlet 521' are welded to the flue box.

When the element is welded to the container as the horizontal arrangement, the angle formed between the axis of the element and the horizon should be 10°–15°. The heat receiving end is under the exothermal end. Such an arrangement has two advantages: (1) large heat transfer capability of the element; (2) extending operating duration with self-cleaning function.

When the element is welded to the container as the vertical arrangement, the angle formed between the element and the horizon should substantially be 90°. The blast end is under the boiler drum. Such an arrangement provides the advantages of integrity of the equipment, space saving and easy installation of smoke pipes.

The embodiment can also be applied to a high heat transfer horizontal blast air pre-heater in a chemical fertilizer manufacturing system with a liquid-vapor separator. The substantial characteristic of the apparatus is that a defoamer is provided on the top of the boiler drum to completely separate steam and water. Steam is discharged from the steam outlet of the defoamer to omit and the high-level gas-water separator and circulating pipe.

Advantages of the embodiment stated above include that the flue can be either horizontal or axial arrangement respecting to the equipment; fins welded on the blast side to enlarge heat transfer area; the number and rows of pipes are adjustable for various operations; the water is directed outside the pipe, which reduces flow stress to a great extent, and it is less likely to be blocked by incrustation in comparison with conventional afterheat boilers. Even there is incrustation, it can be easily removed by chemical method. Furthermore, the steam outside the pipe does not damage the heat exchange pipe due to water hammering in the pipe caused by exceeding heat load. If failure at an end of the heat transfer element does occur, it will not cause leakage. One end of the heat transfer element is a free end, which has no temperature differential stress at the weld on the boiler drum.

This structure is also applicable in up/down-route gas. In the gas maker of the coal and ammonia synthetic system, the gas carries heat and the temperature of which is between 260° C. and 320° C. Steam produced by the heat can be used internally or transferred to external applications, which not only promotes thermal efficiency of the system but also reduces energy consumption.

The flue box 518' shown in FIG. 5D is arranged such that the up/down-route gas travels to the rectangular flue box. The up/down-route gas channel and the liquid-vapor mixture channel are two independent boxes. That is, the up/down-route gas goes to the rectangular flue box 518' while the liquid-vapor mixture goes to the pressure-bearing cylinder, i.e. boiler drum 523'. UP/down-route gas intake 517' and cooled gas outlet 521' are welded to the flue box.

EXAMPLE 21

This embodiment is shown in FIGS. 5EA and 5EB. FIG. 5EA shows an inorganic high heat transfer eccentric afterheat boiler. FIG. 5EB shows an inorganic high heat transfer symmetrical afterheat boiler, which is related to a steam generating apparatus utilizing the heat carried by blast extracted from the chemical fertilizer gas making system.

The blast channel and the liquid-vapor channel are two independent boxes. Hot blast travels to the rectangular flue box 528' while liquid-vapor mixture goes to the pressure-bearing cylinder. Hot blast intake 531' and cooled gas outlet 527' are welded to the flue box. A soot cleaning hole 526' is located at the bottom of the flue box to clean solid particles of smoke and avoid soot accumulation.

The boiler drum is a pressure-bearing cylindrical container with standard oval seals welded to both upper and lower sides thereof. A liquid-vapor outlet 532' is provided on the top of the container and a water intake 535' is provided at the bottom. A plurality of rows of inorganic high heat transfer elements 529' are welded evenly to the wall of the container. The element is a sealed cavity filled with inorganic heat transfer medium. A metal rib is welded to one side on the surface of the element by means of high frequency resistance welding to increase the area of heat transfer. The other end of the element is a bore pipe. The end of the element with the rib is a heat receiving end, which is installed in the flue box to absorb the heat traveling through the rib and the wall to the pipe. The end of the element without the rib is an exothermal end, which transfers the heat absorbed by the medium at the heat receiving end to the liquid-vapor mixture in the cylinder through the wall to generate steam.

The element is welded to the wall of the boiler drum. The end of the element on the side of the flue box is supported by a positioning board 530'. The end of the element near the liquid-vapor is a free end, which is axially stretchable. No thermal stress is produced on welds in case of changes in the operating temperature, which prevents welds from being pulled off by thermal stress.

When welding the element to the container, the angle between the axis of the element and the horizon should be 10–15°. The heat receiving end is under the exothermal end. Such arrangement has two advantages: large heat transfer capability of the element and extended operating duration with self-cleaning function.

A liquid-vapor separator can also be applied to this embodiment. As for this structure, a defoamer is installed on the top of the boiler drum to separate steam and water completely so as to omit the high-level gas-water separator and circulating pipes.

Another application according to the above eccentric afterheat boiler of this embodiment is a symmetric afterheat boiler. As FIG. 5EB shows, the blast channel and the boiler drum of the equipment are separated boxes. Hot blast goes to the rectangular flue box 528' while liquid-vapor mixture goes to the boiler drum 534'. Flues are situated symmetrically on both sides of the liquid-vapor tank. Hot blast intake 531' and cooled gas outlet 527' are welded to each flue box. A soot cleaning hole 526' is located at the bottom of the flue box to clean solid particles of smoke and avoid soot accumulation.

The boiler drum which the liquid-vapor mixture moves in is a pressure-bearing container with standard oval seals welded on both the top and the bottom thereof. A liquid-vapor outlet 532' is provided on the top of the boiler drum and a water intake 535' is provided at the bottom. A plurality of rows of inorganic high heat transfer elements 529' are welded symmetrically and evenly to the wall of the cylinder. The element is a sealed cavity filled with inorganic heat transfer medium. A metal rib is welded to one side on the surface of the element by means of high frequency resistance welding to increase the area of heat transfer. The other end of the element is a bore pipe. The end of the element with the rib is a heat receiving end which is installed in the flue box, to absorb the heat traveling through the rib and the wall to the pipe. The end of the element without the rib is an exothermal end, which transfers the heat absorbed by the medium at the heat receiving end to the liquid-vapor mixture in the cylinder through the wall to generate steam.

The element in the symmetric boiler is welded to the container. The end of the element on the side of the flue box is supported by a supporting board 530'.

The structure of this embodiment adjusts the direction of gas in the flue box for various operations. For example, large gas flows can be directed to the horizontally symmetric flue box 528' by means of parallel connection. Small gas flows may pass through the horizontally symmetric flue box sequentially so that the smoke flow is kept within a proper range.

A liquid-vapor separator can be installed to the symmetric afterheat boiler. Significance of the structure of this embodiment is that a space of proper height is reserved in the upper part above the liquid level in the inner cylinder, and a defoamer is provided to separate the water from the gas completely. Steam is discharged from the steam outlet to omit the high-level gas-water separator and the circulating pipe.

The eccentric or symmetric boilers in the embodiment can also be applied to the up/down-route gas. In this case, the blast outlet 527' serves as an gas outlet while the blast intake 531' is used as a gas intake. Coming from the gas maker in the coal and synthetic ammonia making system, the gas carries certain amount of and thereof heat the temperature thereof is between 260° C. and 320° C. Steam produced by the heat can be used within the system or transferred to external applications, which not only promotes thermal efficiency of the system but also reduces energy consumption.

The eccentric or symmetric afterheat boiler with a liquid-vapor separator is also applicable to the up/down-route gas according to the same principle as mentioned above.

Advantages of this embodiment includes: long single element reduces manufacturing costs; air flows are evenly distributed so that there is less channeling to affect the heat exchange; self-cleaning function is available since there is very little soot collecting and is easy to be cleaned; the water side is directed outside the pipe, which reduces the flow resistance to a great extent; it is less likely to be blocked by incrustation in comparison with conventional afterheat boilers and even there is incrustation, it can be easily removed by chemical measure; heating steam outside the pipe does not damage the heat exchange pipe due to water hammering in the pipe caused by excessive heat load; failure at an end of the heat transfer element does not cause dew; both ends of the heat transfer element are free ends, which have no temperature differential stress at the weld on the boiler drum.

EXAMPLE 22

FIGS. 5IA and 5JA show an inorganic high heat transfer afterheat boiler. The boiler produces steam for heating fuel oil by using the smoke carrying heat in the burning furnace, such as a glass kiln furnace or a heat-storage air pre-heater, in heat exchange. Heat exchange proceeds efficiently because the inorganic heat transfer elements are adopted. It completely eliminates the circulating temperature gradient stress caused by temperature fluctuation and does not affect the operation of equipment in case that a few heat transfer elements are failed.

As shown in FIG. 5IA, the process of an air pre-heater in the glass kiln is described as follows:

Burned hot smoke from the furnace (538A, 548A) still carries heat to some extent after passing through a glass kiln furnace 536A and a heat storage air pre-heater (539A~547A). The smoke is then transported into the inorganic high heat transfer afterheat boiler to exchange heat with the water and produce steam before going into a chimney 543A to cool it. The afterheat boiler is used to heat fuel oil flowing into the furnace to replace the existing steam boiler to reduce the consumption of fuel and manpower.

Several inorganic high heat transfer elements are welded on the cylinder of the afterheat boiler. One end (exothermal end) of the inorganic high heat transfer element stretches into the cylinder and the other end thereof extends out of the cylinder. A plurality of spiral ribs are welded to the heat absorbing end of the element to increase the heat exchange area for better heat exchange effect at the heat absorbing end.

After the heat absorbing end of the inorganic high heat transfer element absorbs the heat, the hot smoke is exhausted via the chimney after its temperature is lowered. The inorganic high heat transfer element transfers the heat absorbed at the heat absorbing to the exothermal end via the medium. The exothermal end is inserted into the liquid-vapor mixture in the afterheat cylinder, and the heat absorbed at the absorbing end is transferred to the mixture in the cylinder and thus produces steam continuously.

The structure and measures of this embodiment are described below in associated with attached drawings.

A boiler drum 551A in the inorganic high heat transfer afterheat boiler shown in FIG. 5JA is a cylindrical pressure bearing container made of welded low carbon steel plates. Oval seals are welded at both sides of the cylinder. A water intake and an incoming water distributor are provided at the bottom of the boiler drum while a steam outlet and a defoamer on the top thereof. A space of proper height is reserved at the top of the boiler drum to separate water from gas and remove the mist carried by steam through the defoamer.

A plurality of inorganic high heat transfer elements are welded at the bottom of the boiler drum. The elements 553A are filled with inorganic high heat transfer medium, which enhances speedy transmission of the heat from the heat absorbing end to the exothermal end. Spiral ribs are welded to the heat absorbing end by means of high frequency resistance welding to increase the heat exchange area at the heat absorbing end. The heat absorbing end of the element 553A inserts into the hot flue box while the exothermal end thereof inserts into the liquid-vapor mixture. Water is heated by continuous heat supply from the hot smoke through the element 553A to generate steam.

The central part of the element 553A is connected with the boiler drum for sealing fixing. The suspension arms at both ends of the element are stretchable and thus, eliminates the temperature gradient stress effectively.

The element is a sealed cavity and thus, no leak age between the boiler drum and the flue box will occur even if one end of the element is mechanically damaged. It only reduces production capacity to some extent while the equipment still operates as normal. Therefore, longer service cycle of continuous operation can be achieved.

EXAMPLE 23

As shown in FIG. 5IB, an inorganic high heat transfer stream generator is installed at the end of a cement kiln. The temperature of exhaust coming from the end of the rotary kilns in usual small-scale cement plant is between 450° C. and 600° C. The amount of exhaust in these kilns is relatively small due to limited production volume. Thus, the recovered heat is generally used to produce steam for productive techniques or daily life. This efficient steam generator is based on inorganic high heat transfer elements.

In FIG. 5IB, on the right hand side there is a cylinder with oval seals at both ends to bear pressure. On the left hand side there is an exhaust channel, where the exhaust passes the inorganic high heat transfer element to conduct heat exchange with water in the cylinder. A level controlling system is installed on the top of the cylinder to ensure that there is sufficient steam space for the vaporization of water. The inorganic high heat transfer element is welded to the body of the cylinder so that fluids in both parts do not get into each other. The sink end (a water and steam end) of the element is a bare tube while fins are affixed to the source end (a smoke end) to improve heat dissipation. Space between the fins is adjustable to control the temperature of outgoing smoke. The inorganic high heat transfer element is welded to the cylinder so that there is no leak of hot and cold fluids.

EXAMPLE 24

FIG. 5IC shows an inorganic high heat transfer water heating system of a cement kiln, installed at the end of the cement kiln. It recycles heat of exhaust at the end of the kiln to pre-heat air, or produces steam or hot water as a boiler afterheat acts. With the inorganic high heat transfer element, the heat of exhaust can be efficiently recycled to produce hot water for manufacture and daily life.

As shown in FIG. 5IC, a smoke channel is on the left side and the cylinder on the right is used as a water container. The smoke travels through the channel and heats up water via the inorganic heat transfer element. Cold water is constantly supplied in from the water intake (530C) in the lower part of the cylinder so as to obtain constant hot water. There are fins on the smoke side of the inorganic heat transfer element (531C) while the end inserting into water is a bare pipe. The temperature of outgoing water is controllable by adjusting the number of heat transfer elements and the space between fins. Such approach can also control the temperatures of outlet smoke and the wall of the channel to prevent dew corrosion. The inorganic high heat transfer element is welded to the cylinder so that both liquids do not get into each other.

EXAMPLE 25

FIG. 5ID shows an inorganic high heat transfer air dryer and heater in a ceramic kiln furnace. Heat efficiency in ceramic production tend to be low no matter the furnace is a continuous (e.g. tunnel kiln) or batch one (e.g. inverse flame kiln). Causes for heat losses in the kiln furnace include burning, heat-dissipation and, most importantly, smoke discharging. It takes considerable afterheat when smoke is discharged from the kiln furnace. In addition, it is necessary to pre-heat and dry bases before baking so that a drying kiln or boiler is required for producing hot air and steam to dry these bases. Therefore, the energy is wasted in unnecessary consumption and thus the environment is polluted.

The inorganic high heat transfer air dryer and heater in a ceramic kiln furnace can solve this problem. With the installation at the end of the kiln, the dryer and heater same energy by collecting afterheat as a heat source in drying bases with hot air.

The heater in FIG. 5ID comprises two independent channels independently for smoke and air. Hot and cold fluids exchange heat with each when passing through the inorganic high heat transfer element (531D), which is fixed by two tube sheets (532D, 533D). The flange effectively seals space between the high heat transfer element and the tube sheet. Fins are installed on the sink and source ends of the inorganic high heat transfer element. Adjusting space between fins at the both ends and the number of heat transfer elements can derive reasonable ratio of heat exchange area between both ends as well as controlling temperature of discharged smoke and hot air. It can also avoid dew corrosion. The heater is able to be tilted. Should any single piece of the inorganic high heat transfer element fails, it would not lead to cold and hot fluids mixed. Another advantage of the embodiment is ease of replacement.

EXAMPLE 26

FIGS. 5IE, 5JE and 5KE show inorganic high heat transfer afterheat boilers for ships, which the afterheat boilers heat water in the boiler with hot smoke discharged from a turbine engine to produce hot water or steam for heating or other purposes so as to reduce energy consumption. Inorganic high heat transfer element is adopted to enhance efficiency in heat exchange operations.

Some modern ships do not have heat recovery devices. Similar devices available on other ships are mostly afterheat boilers based on water or fire pipes. Shortcomings of these boilers include (1) complex structure and numerous welds, (2) unstable boiling and circulation, (3) low heat transfer coefficients on the smoke side; (4) fins cannot be installed inside the pipe; (5) low heat conductivity; (6) long starting time; (7) gross heat losses as shutdown of boiler. In addition, incrustation forming inside the pipe is hard to remove.

This embodiment is a heat recovery device featuring high cooling efficiency, small size and ease of removing incrustation. The key point about the device is using inorganic thermal element for heat exchange. The structure of the afterheat boilers are shown in FIGS. 5IE and 5JE (FIG. 5IE is a vertical model while FIG. 5JE is a horizontal one).

As shown in the figures, there are several parallel pipe banks in the rectangular pipe box, namely inorganic high heat transfer pipe-pipe bank 558E. There are a number of regular and linked holes on the supporting plate for inorganic high heat transfer pipes. Direction of water and smoke flows depends on the condition on site. Smoke moves vertically in FIG. 5IE while that moves horizontally in FIG. 5JE. Soot-cleaning holes (538E in FIGS. 5IE and 560E in FIG. 5JE) are designed since afterheat boilers tend to produce soot when burning fuel oil on the ship.

Heat exchange for water takes place outside the pipe to prevent blockage caused by incrustation in ordinary pipes. There is a man-hole (546E in FIGS. 5IE and 555E in FIG. 5JE) on the cylinder for the purpose of maintenance and observing the structure of the boiler drum. A high effect screen demister is installed on the top of the boiler drum to avoid condensed steam for better steam quality.

As shown in FIG. 5KE, the inorganic high heat transfer tube nest should be installed on the tilt and the top of the re-heating water cavity should be sealed so as to ensure proper operation.

The workflow is described as follows. The tube nest in the smoke cavity recovers heat carried by smoke. Then the tube nest in the boiler drum increases the temperature of water by delivering heat to water for heat exchange.

EXAMPLE 27

FIGS. 5IF and 5JF show an inorganic high heat transfer car exhaust heater, which heats the inorganic high heat transfer pipe with hot exhaust discharged from a car engine. Installed inside a car, the inorganic high heat transfer pipe serves as a heater by heating air inside the car. The inorganic high heat transfer element is adopted to enhance efficiency in heat exchange operations. It can be used for on-board heating for long distance buses, particularly those operating in the North in winter. The heater is used not only for reducing energy consumption but also for making good use of most exhaust to protect the environment.

The key point about the device is using inorganic thermal medium for heat exchange. The structure is shown in FIG. 5IF:

As shown in the figure, 536F is directly connected to the rear exhaust pipe, which is connected to the inorganic high heat transfer car exhaust heater with a flange. The fin tube shown in FIG. 5IF is an inorganic high heat transfer fin tube, which is installed on the floor of the passage on the bus by welding it to a protective casing with holes. Alternatively, a number of thin steel reinforcements may be welded to the floor, as shown in FIG. 5JF.

The exhaust from the car exhaust heater is discharged into air via (540F).

The process of operation is stated as follows. The heating function of the device lies in that exhaust of high temperature enters the inorganic high heat transfer car exhaust heater and cause an increase in the temperature of the inorganic high heat transfer fin tube, which exchanges heat with air in the car.

EXAMPLE 28

FIGS. 5IG and 5JG show an inorganic high heat transfer seawater distiller for oceangoing vessels. Seawater is heated in the boiled powered by heat carried by hot smoke discharged by the turbine to obtain distilled water for consumption on the vessels by condensing the vapor of the seawater to reduce energy consumption and distill seawater. Inorganic high heat transfer element is adopted to enhance efficiency in heat exchange process.

Most seawater distillers on vessels are afterheat boilers based on water or fire pipes. Shortcomings of these boilers include (1) complex boiler organization and numerous welds, (2) unstable boiling and circulation, (3) low heat transfer coefficients on the smoke side; (4) fins cannot be installed inside the pipe and low heat conductivity; (5) long starting time; (6) gross heat losses when there is no operation. In addition, incrustation and salt layers forming inside the pipe is hard to remove.

This embodiment is a heat recovery device featuring high cooling efficiency, small size and ease of removing incrustation and massive amount of salt.

The key point about the device is using inorganic thermal medium for heat exchange. The structure is shown in FIG. 5IG.

As shown in the figures, there are several parallel pipe banks in the rectangular pipe box, namely inorganic high heat transfer pipe-pipe bank (544G). There are a number of regular and linked holes on the supporting plate for inorganic high heat transfer pipes. Direction of seawater and smoke flows depends on the condition on site. Smoke moves horizontally. Soot cleaning holes (546G) are designed since afterheat boilers tend to produce soot when burning fuel oil on the ship.

Heat exchange for seawater takes place outside the pipe to prevent blockage caused by incrustation in ordinary pipes. Cleaning salt and incrustation after distilling seawater is very important. In order to clean incrustation and salt in the cylinder, there are cone-cleaning holes (541G) on both sides of the cylinder, which is cleaned regularly for the proper operation of the distiller.

As shown in FIG. 5JG, the inorganic high heat transfer tube nest should be installed on the tilt and the top of the re-heating water cavity should be sealed so as to ensure proper operation.

The workflow is described as follows: the tube nest in the smoke cavity recovers heat carried by smoke. Then the tube nest in the boiler drum increases the temperature of water by sending heat to seawater for heat exchange.

EXAMPLE 29

FIG. 5IH shows an inorganic high heat transfer up/down-route gas upright symmetric afterheat boiler (with liquid-vapor separator). It produces steam with heat carried by gas going upward and downward in the gas generating system in chemical fertilizer plants. Inorganic high heat transfer element is adopted to enhance effective heat exchange as stated above.

Up/down-route gas from gas maker in the coal and synthetic ammonia making system carries heat, the temperature of which is between 260 and 320° C. Steam produced by the sensible heat can be used internally or transported to external applications, which not only promotes thermal efficiency of the system but also reduces energy consumption. A high effect screen demister is designed as installed on the top of the boiler drum to separate steam and water completely. This omits the high-level liquid-vapor separator and circulating pipe such that the operation is safer and more reliable.

Most afterheat boilers in the gas making system in chemical fertilizer plants adopt pipe bank or pipe nest. The disadvantage of these boilers is huge equipment volume, soot covering, difficulty in soot cleaning and strong smoke resistance. Larger thermal stress derived from temperature gradient between heat exchange pipe and tube sheet caused by temperature flux in operation tend to loosen or cracking welds. The equipment should be shut down and inspected/repaired in case of any crack or leak existing.

This embodiment is an afterheat boiler featuring high heat exchange efficiency, small size, easily soot removing and not pulling off pipe joints. The key point about the device is using inorganic high heat transfer element for heat exchange. As shown in FIG. 5IH, the gas channel and the boiler drum are independent units. Hot gas travels to the horizontally symmetric and rectangular flue box (538H, 545H) while liquid-vapor mixture goes to the boiler drum (540H). Flues are situated symmetrically on both sides of the liquid-vapor tank. Hot gas intake (541H, 543H) and cooled gas outlet (537H~547H) are welded to each flue box. A soot-cleaning hole (536H, 548H) is located at the bottom of the flue box to clean solid particles of smoke and avoid accumulated soot.

The boiler drum where liquid-vapor mixture move in is a pressure-bearing cylinder with standard oval seals welded to both of the top and the bottom of it. There is a steam outlet (542H) on the top of the cylinder and a water intake (549H) at the bottom. Several rows of inorganic high heat transfer elements (539H) are welded symmetrically and evenly to the wall of the cylinder. The element is a sealed cavity filled with inorganic heat transfer medium. A metal rib is welded to one side on the surface of the element by means of high frequency resistance welding to enlarge the area of heat transfer. The other side of the element is a bare pipe. The side with a rib on the element is a heat-taking end installed in the flue box. Absorbed heat travels to the pipe through the rib and the wall of the pipe. The side without the rib refers to a heat-releasing end, which transport heat absorbed by medium at the heat-taking end to the liquid-vapor mixture in the cylinder through the wall to produce steam.

The element is welded to the container. The end on a side of the flue box is supported by a batter board (546H). The end near the steam is a free end, where pipes are stretchable axially. There is no thermal stress produced on welds in case of changes in operating temperature, which prevents welds from being pulled off by thermal stress.

When welding the element to the container, the angle formed by the axis and horizon should be between 10–15°. The heat-taking end is under the heat-releasing end. Such arrangement has two advantages: (1) large heat transfer capability of the element; (2) extending operating duration with self-cleaning function.

The structure adjusts the direction of gas in the flue box for various operations. For example, large gas flows can be directed to the horizontally symmetric flue box (538H~544H) in series. Small gas flows may pass the horizontally symmetric flue box sequentially so that the smoke flow is within a proper range.

Significance of this embodiment is that a space of proper height is reserved in the upper part of the liquid level in the inner cylinder to separate water from gas as the demister (544H) separate steam from liquid absolutely. Steam is discharged from the steam outlet (542H) to omit the circulating pipe of the high-level gas-water separator.

EXAMPLE 30

FIGS. 5II and 5JI show an inorganic high heat transfer horizontal afterheat boiler, which produces steam with heat carried by hot gas. Inorganic high heat transfer element is adopted to enhance efficiency in heat exchange.

Some hot gas containing dirt, oil stain and poisonous gas should be cooled before removing dust, oil and being separated in the process of production. Steam produced by sensible heat carried by hot gas can be used internally or transported to external applications, which promotes thermal efficiency of the system, reduces energy consumption and diminishes pollution.

Most existing afterheat boilers adopt water or fire pipes. The disadvantage of these boilers is huge equipment volume, soot covering and difficulty in soot cleaning. Smoke resistance in these boilers is also large. Larger stress of temperature gradient between heat exchange pipe and tube sheet caused by temperature flux in operation tend to produce loose or partially cracked welds. The equipment should be shut down and repaired if there is any crack or leak.

This embodiment is an afterheat boiler featuring high heat exchange efficiency, small size, easily soot removing and not pulling off pipe joints due to thermal stress. The key point about the device is using inorganic high heat transfer element for heat exchange. As shown by the drawing, the equipment comprises three parts, namely (1) a horizontal boiler drum (542I). The boiler drum is a pressure-bearing cylinder with standard oval seals welded to both sides of it. There is a liquid-vapor outlet (541I) on the top of the cylinder and a water intake (543I) at the bottom. (2) Inorganic high heat transfer element (539I): Several rows of inorganic high heat transfer elements (539H) are welded evenly to the wall of the cylinder. The element is a sealed cavity filled with inorganic heat transfer medium. A metal rib is welded to one side on the surface of the element by means of high frequency resistance welding to enlarge the area of heat transfer. The other side of the element is a bare pipe. The side with a rib on the element is a heat-taking end installed in the flue box. Absorbed heat travels to the pipe through the rib and the wall of the pipe. The side without the rib refers to a heat-releasing end, which transport heat absorbed by medium at the heat-taking end to the liquid-vapor mixture in the cylinder through the wall to produce steam. (3) Flue box (537I), where hot gas moves in the rectangular flue box.

The element is welded to the container. The end on the side of the flue box is supported by a batter board (538I). The end near the steam is a free end, where pipes are stretchable along the axis. There is no thermal stress produced on welds in case of changes in operating temperature, which prevents welds from being pulled off by thermal stress.

There are two structure patterns of arrangement between inorganic high heat transfer elements and horizon, namely horizontal element (FIG. 5II) and vertical element (FIG. 5JI). The operational theory shared by both patterns is that the channel for hot gas and that for liquid-vapor mixture are divided into two independent boxes. Hot gas travels to the rectangular flue box (537I) while liquid-vapor mixture goes to the pressure-bearing cylinder, i.e. boiler drum (542I). Hot gas intake (536I) and cooled gas outlet (540I) are welded to the flue box.

In welding the element to the container on the horizontal pipe structure, the angle formed by the axis and horizon should be between 10–15°. The heat-taking end is under the heat-releasing end. Such arrangement has two advantages: 1) large heat transfer capability of the element; 2) extending operating duration with self-cleaning function.

In welding the element to the container on the vertical pipe structure, the angle formed by it and horizon should be 90°. The smoke end is under the boiler drum. Such arrangement achieves integrity of equipment, space saving and easy installation of smoke pipes.

EXAMPLE 31

FIG. 5IJ show an inorganic high heat transfer eccentric afterheat boiler, which produces steam with heat carried by hot gas. Inorganic high heat transfer element is adopted to enhance effective heat exchange as stated above.

Some hot gas containing dirt, oil stain and poisonous gas should be cooled before removing dust, oil and being separated in the process of production. Steam produced by sensible heat carried by hot gas can be used internally or transported to external applications, which promotes thermal efficiency of the system, reduces energy consumption and diminishes pollution.

Most existing afterheat boilers adopt water or fire pipes. The disadvantage of these boilers is huge equipment volume, soot covering, difficulty in soot cleaning and strong smoke resistance. Larger thermal stress derived from temperature gradient between heat exchange pipe and tube sheet caused by temperature flux in operation tends to loosen or partially cracking welds. The equipment should be shut down and inspected/repaired in case of any crack or leak existing.

This embodiment is an afterheat boiler featuring high heat exchange efficiency, small size, easily soot removing and not pulling off pipe joints due to thermal stress. The key point about the device is using inorganic high heat transfer element for heat exchange. As shown in FIG. 5IJ, the gas channel and the liquid-vapor channel are two independent boxes. Hot gas travels to the rectangular flue box. (538J) while liquid-vapor mixture goes to the pressure-bearing cylinder (544J). Hot gas intake (541J) and cooled gas outlet (537J) are welded to the flue box. A soot-cleaning hole (536J) is located at the bottom of the flue box to clean solid particles of smoke and avoid accumulated soot.

The boiler drum is a pressure-bearing cylinder with standard oval seals welded to both upper and lower sides of it. There is a liquid-vapor outlet (542J) on the top of a container and a water intake (545J) at the bottom. Several rows of inorganic high heat transfer elements (539J) are welded evenly to the wall of the container. The element is a sealed cavity filled with inorganic heat transfer medium. A metal rib is welded to one side on the surface of the element by means of high frequency resistance welding to enlarge the area of heat transfer. The other side of the element is a bare pipe. The side with a rib on the element is a heat-taking end installed in the flue box. Absorbed heat travels to the pipe through the rib and the wall of the pipe. The side without the rib refers to a heat-releasing end, which transport heat absorbed by medium at the heat-taking end to the liquid-vapor mixture in the cylinder through the wall to produce steam.

The element is welded to a wall of the boiler drum. The end on a side of the flue box is supported by a batter board (540J). The end near the steam is a free end, where pipes are stretchable axially. There is no thermal stress produced on welds in case of changes in operating temperature, which prevents welds from being pulled off by thermal stress.

When welding the element to the container, the angle formed by the axis and horizon should be between 10–15°. The heat-taking end is under the heat-releasing end. Such arrangement has two advantages: 1) large heat transfer capability of the element; 2) extending operating duration with self-cleaning function.

EXAMPLE 32

FIG. 5IK show an inorganic high heat transfer symmetric afterheat boiler, which produces steam with heat carried by hot gas. Inorganic high heat transfer element is adopted to enhance effective heat exchange as stated above.

Some hot gas containing dirt, oil stain and poisonous gas should be cooled before removing dust, oil and being separated in the process of production. Steam produced by sensible heat carried by hot gas can be used internally or transported to external applications, which promotes thermal efficiency of the system, reduces energy consumption and diminishes pollution.

Most existing afterheat boilers adopt water or fire pipes. The disadvantage of these boilers is huge equipment volume, soot covering and difficulty in soot cleaning. Smoke resistance in these boilers is also large. Larger thermal stress derived from temperature gradient between heat exchange pipe and tube sheet caused by temperature flux in operation tend to produce loose or partially cracked welds. The equipment should be shut down and inspected/repaired in case of any crack or leak existing.

This embodiment is an afterheat boiler featuring high heat exchange efficiency, small size, and ease of soot removing and not pulling off pipe joints. The key point about the device is using inorganic high heat transfer element for heat exchange. As shown in FIG. 5IK, the gas channel and the boiler drum are two separated units. Hot gas travels in the horizontally symmetric and rectangular flue box (538K, 544K) while liquid-vapor mixture goes to the boiler drum (540K). Flues are situated symmetrically on both sides of the liquid-vapor tank. Hot gas intake (541K, 543K) and cooled gas outlet (537K, 546K) are welded to each flue box. A soot-cleaning hole (536K, 547K) is located at the bottom of the flue box to clean solid particles of smoke and avoid accumulated soot.

The boiler drum where liquid-vapor mixture move in is a pressure-bearing cylinder with standard oval seals welded to both the top and the bottom of it. There is a liquid-vapor outlet (542K) on the top of the boiler drum and a water intake (548K) at the bottom. Several rows of inorganic high heat transfer elements (539K) are welded symmetrically and evenly to the wall of the cylinder. The element is a sealed cavity filled with inorganic heat transfer medium. A metal rib is welded to one side on the surface of the element by means of high frequency resistance welding to enlarge the area of heat transfer. The other side of the element is a bare pipe. The side with a rib on the element is a heat-taking end installed in the flue box. Absorbed heat travels to the pipe through the rib and the wall of the pipe. The side without the rib refers to a heat-releasing end, which transport heat absorbed by medium at the heat-taking end to the liquid-vapor mixture in the cylinder through the wall to produce steam.

The element is welded to the container. The end on the side of the flue box is supported by a batter board (545K). The end near the steam is a free end, where pipes are stretchable axially. There is no thermal stress produced on welds in case of changes in operating temperature, which prevents welds from being pulled off by thermal stress.

In welding the element to the container, the angle formed by the axis and horizon should be between 10–15°. The heat-taking end is under the heat-releasing end. Such arrangement has two advantages: (1) large heat transfer capability of the element; (2) extending operating duration with self-cleaning function.

Large gas flows can be directed in series to pass the horizontally symmetric flue box (538K, 544K). Small gas flows may pass the horizontally symmetric flue box sequentially so that the smoke flow is within a proper range. It is adjustable depending on various operations in practice.

EXAMPLE 33

FIG. 5IL show an inorganic high heat transfer air pre-heater of an electric boiler. Installed in the end of a smoke flue of the boiler in a power plant, the pre-heater features simple structure, long service life, high heat exchange efficiency and reducing energy consumption.

The air pre-heater for the power plant boiler is a necessary device for improving heat efficiency in the boiler, causing higher temperature of burning fuel and improving the burning process. Most of the plants adopt air pre-heaters have pipe banks while they have several shortcomings such as large size, low temperature, corrosion of heat exchange pipes, difficulty in replacement and short serving life.

This embodiment furnishes an air pre-heater installed in the flue of the power plant boiler with the inorganic high heat transfer element. The pre-heater features simple structure, small size, high heat transfer efficiency and long serving life.

The inorganic high heat transfer air pre-heater in this embodiment adopts a box-like structure. It is installed at the end of the boiler in the power plant, comprising independent channels for air and smoke. The channels are separated by an intermediate tube sheet (539L). An inorganic high heat transfer tube nest (537L) with fins welded to it penetrates the intermediate tube sheet (539L). Both sides of the inorganic high heat transfer tube nest (537L) support respectively a side smoke tube sheet (538L) and a side air tube sheet (542L) on the box. All the three tube sheets of each box are on the horizontal bearer.

As shown in FIG. 5IL, this embodiment comprises the inorganic high heat transfer tube nest (537L), the side smoke tube sheet (538L), the side air tube sheet (542L), the intermediate tube sheet (539L) and the pipe box door (543L). The pipe box is arranged on the tilt, above the side smoke tube sheet (538L) and under the side air tube sheet (542L). The whole pipe box is completely connected to the air and smoke channels at the tail of the boiler so that air and smoke move to separate channels. The inorganic high heat transfer tube nest (537L) is divided by the intermediate tube sheet into two segments. One is a heat-taking end on the smoke side and the other is a heat-releasing end on the air side. The inorganic high heat transfer tube nest (537L) is aligned in a staggering way. Fins can be installed to both sides of the inorganic high heat transfer tube (537L). Alternatively it can be a fin at one side and a bare pipe at the other, depending on the design. Interface flanges are installed at the air intake (544L), air outlet (541L), smoke intake (540L) and smoke outlet (536L), connecting them to the intake ventilator and the smoke pipe.

EXAMPLE 34

FIGS. 5IM, 5JM and 5KM show an inorganic high heat transfer power plant boiler fuel heating system. It heats oil to be burned in the boiler in the power plant with heat carried by smoke. The system cause high temperature of fuel oil, better atomization and higher heat exchange efficiency so as to reduce energy consumption. Inorganic high heat transfer element is adapted to enhance effective heat exchange as stated above. The fuel oil heating system features high heat efficiency, small size and ease of removing incrustations of oil.

As shown in FIG. 5IM, there are several parallel pipe banks in the rectangular pipe box with mouths at both ends, namely inorganic high heat transfer pipe-pipe bank (FIG. 5KM). There are a number of regular and linked inorganic high heat transfer pipes on the supporting plate 539M for inorganic high heat transfer pipes. Direction of fuel oil and smoke flows depends on the condition on site. As the attached figure shows, the direction of fuel oil flow is opposite to that of smoke for easy heat exchange. The inorganic high heat transfer tube banks in the smoke box are linked with those in the boiler drum. The number of tube sheets in the smoke box and the boiler drum is the same.

An inorganic high heat transfer element (538M) is applied to the main heat exchange surface. The inorganic high heat transfer afterheat recovery system is arranged horizontally. The inorganic high heat transfer fuel oil heating system is installed above the smoke and air channels to reduce space. The heat transfer elements are aligned vertically due to the limited size of the smoke and air channels. Heat exchange for fuel oil takes place outside the pipe to prevent blockage caused by oil incrustation in crude pipes. There are manholes (540M) on the front and rear surfaces of the cylinder for the purpose of maintenance and checking the status of incrustation on the boiler drum.

Smoke enters boiler of the inorganic high heat transfer fuel heating system from its front and exits from its back. The joints between the smoke intake/outlet and the fuel heating system are sealed with of fireproof and thermal insulating materials to tackle the issue of sealing the flue box. There is particularly more dust in the smoke in the boiler. In order to prevent soot covering, corrosion caused by dew at the low temperature segment and blockage caused by soot, two checking holes, 400×500 for each, should be installed in the flue and around 2 m from the front and rear end of the cylinder for the purpose of removing soot, incrustation and maintenance.

The inorganic high heat transfer tube nest should be placed on the tilt or vertically in installation for proper operation. The pre-heated side should be higher than the side of the smoke cavity. There is a soot blower installed in the smoke cavity (FIGS. 5IM and 5JM). The top of the cavity is sealed and there are several air holes on the wall of the blower so that the blower and pressurized air pipe are linked together. It is the most preferable to install a thermal insulating layer on the wall of the pipe box with no inorganic high heat transfer pipe installed.

The workflow is described as follows: the tube nest in the smoke cavity recovers heat carried by smoke. Then the tube nest in the boiler drum increases the temperature of water by sending heat to crude for heat exchange.

EXAMPLE 35

FIGS. 5IN, 5JN and 5KN show an inorganic high heat transfer water heater in the power plant boiler. It heats water in the boiler with heat carried by smoke to produce hot water, cause higher heat exchange efficiency so as to reduce energy consumption. Inorganic high heat transfer element is adapted to enhance efficiency in heat exchange process.

Most afterheat boiler water heaters are based on water or fire pipes. Shortcomings of these boilers include (1) complex boiler organization and numerous welds, (2) unstable boiling and circulation, (3) low heat transfer coefficients on the smoke side; (4) fins cannot be installed inside the pipe; (5) low heat conductivity; (6) long starting time; (7) gross heat losses when there is no operation. In addition, incrustation forming inside the pipe is hard to remove.

This embodiment is an afterheat boiler featuring high heat efficiency, small size and ease of removing incrustation.

As shown in FIG. 5IN, there are several parallel pipe banks in the rectangular pipe box with mouths at both ends, namely inorganic high heat transfer pipe-pipe bank (FIG. 5KN). There are a number of regular and linked inorganic high heat transfer pipes on the supporting plate (539N) for inorganic high heat transfer pipes. Direction of water and smoke flows depends on the condition on site. As the attached figure shows, the direction of water flow is opposite to that of smoke for easy heat exchange. The inorganic high heat transfer tube banks in the smoke box are linked with those in the boiler drum. The number of tube sheets in the smoke box and the boiler drum is the same.

An inorganic high heat transfer element (538N) is applied to the main heat exchange surface. The inorganic high heat water heater is arranged horizontally. The inorganic high heat transfer afterheat water heater is installed above the smoke and air channels to reduce space. The heat transfer elements are aligned vertically due to the limited size of the smoke and air channels. Heat exchange for water takes place outside the pipe to prevent blockage caused by incrustation in water supply pipes. There are manholes (540N) on the front and rear surfaces of the cylinder for the purpose of maintenance and checking the status of incrustation on the boiler drum.

Smoke enters the inorganic high heat transfer water heater from its front and exits from its back. The joints between the smoke intake/outlet and the water heater are sealed with of fireproof and thermal insulating materials to tackle the issue of sealing the flue box. There is particularly more dust in the smoke in the boiler. In order to prevent soot covering, corrosion caused by dew at the low temperature segment and blockage caused by soot, two checking holes, 400×500 for each, should be installed in the flue and around 2 m from the front and rear end of the cylinder for the purpose of removing soot, incrustation and maintenance.

The inorganic high heat transfer tube nest should be placed on the tilt or vertically in installation. The pre-heated side should be higher than the side of the smoke cavity. There is a soot blower installed in the smoke cavity (FIGS. 5IN and 5JN). The top of the cavity is sealed and there are several air holes on the wall of the blower so that the blower and pressurized air pipe are linked together. It is the most preferable to install a thermal insulating layer on the wall of the pipe box with no inorganic high heat transfer pipe installed.

The workflow is described as follows: the tube nest in the smoke cavity recovers heat carried by smoke. Then the tube nest in the boiler drum increases the temperature of water by sending heat to water for heat exchange.

The device in this embodiment of high heat transfer efficiency reduces the size of the heat exchanger to ½ to ⅔ of the pipe casing heating system. It is easy to clean soot in the apparatus because of the simple structure. The apparatus comprises only a boiler drum and heat tube nests and does not have components such as a connected box. Its large capacity contributes to ease of heat exchange and longer service life. The overall strength of the apparatus is fair.

EXAMPLE 36

The inorganic high heat transfer medium of the present invention can be used to manufacture high heat transfer pipes, which are applied to afterheat recovery devices for furnaces. FIG. 5QA shows an inorganic high heat transfer afterheat water heater (575), comprising back-water pipe (571), main water pipe (572), water outlet pipe (573) and inorganic high heat transfer pipe (574).

The inorganic high heat transfer pipe (574) going through the main water pipe (575) is welded to it by 45° from the central line. When being operated, the water heater (575) is above the kitchen range while the water outlet pipe (573) and the back-water pipe (571) are connected to the water circulating system, as the heating system of the afterheat water heater shown in FIG. 5QB. The arrows point to the direction of water flow.

The workflow of the inorganic high heat transfer afterheat water heater is described as follows: when the kitchen range is being used, the high heat transfer pipe absorbs the afterheat of the range and releases it to water in the main pipe. As the temperature of water there rises, cold water in water storage (575') goes continuously into the main pipe due to circulation of thermal gradient. The circulating system is eventually heated. The afterheat water heater of the present invention features low thermal resistance, high heat transfer efficiency, simple structure and easy to operate.

EXAMPLE 37

The inorganic high heat transfer pipe according to the present invention can be applied to the gas pre-heater, as FIG. 5QC shows. As shown in FIG. 5QC, there are several parallel pipe banks in cylinder gas pipe box (571') and smoke pipe box (573') with mouths at both ends, namely inorganic high heat transfer pipe-pipe bank. There are a number of regular inorganic high heat transfer pipes on it, linked with upper and lower pipe boxes. Direction of gas and smoke flows depends on the condition on site. The direction of gas flow in the embodiment is opposite to that of smoke for easy heat exchange. The inorganic heat transfer tubes in the smoke box and those in the gas box are linked together. The number of the inorganic heat transfer tube banks in the smoke box and those in the gas box is also the same. A soot-removing hole with a cover is available on each box.

The inorganic high heat transfer tube nest should be placed on the tilt or vertically in installation for proper operation. The pre-heated side should be higher than the side of the smoke pipe box and linked to lowering pipe (576') via lifting pipe (572'). There is a blowing pipe installed in the smoke and smoke pipe boxes. The blowing pipe outside these boxes can be linked with pressurized air pipe or pressurized steam pipe. It is the most preferable to install a thermal insulating layer on the wall of the pipe box with no inorganic high heat transfer pipe installed. Soot blower (574') is installed on smoke pipe (573').

A separate type inorganic high heat transfer gas pre-heater for blast furnaces enhances heat exchange between two fluids with long distance. The heating and cooling segments are placed wherever as required in the process. It avoid moving large gas flows simply by adding several linking pipes with small diameter. Distance between the heating and cooling segments come between tens and hundreds meters. This is almost impossible for ordinary heat recovery devices.

The workflow of the gas pre-heater of the present invention is described as follows. The high heat transfer tube nest in the smoke pipe box recovers heat carried by smoke. Then the tube nest in the gas pipe box increases the temperature of gas by sending heat to gas for heat exchange.

EXAMPLE 38

FIG. 5QD shows a front view of a dual gas heater with the inorganic high heat transfer element of the present invention. As shown in FIG. 5QD, there are several parallel pipe banks in cylinder air pipe box (571"), gas pipe box (572") and smoke pipe box (573") with mouths at both ends, namely inorganic high heat transfer pipe-pipe bank. There are a number of regular inorganic high heat transfer pipes on it, linked with upper and lower pipe boxes. Direction of air, gas and smoke flows depends on the condition on site. The direction of air and gas flow in the embodiment is opposite to that of smoke for easy heat exchange. These flows are linked together by lifting pipe (575") and lowering pipe (576"). Soot blower (574") is installed on smoke pipe box (573"). The inorganic heat transfer pipe bank in the smoke pipe box (573") is divided into left and right units. One unit is linked to the inorganic heat transfer pipe bank in the air pipe box (571") and that in the gas pipe box (572"). The number of the inorganic heat transfer tube banks in every unit in the smoke pipe box (573") and those in the gas pipe box (572") is also the same. A soot-removing hole with a cover is available on each pipe box.

To ensure proper operation of the inorganic high heat transfer pipe, the inorganic high heat transfer tube nest should be installed vertically. The pre-heated side of the gas and air pipe boxes should be higher than one side of the smoke pipe box. It is the most preferable to install a thermal insulating layer on the wall of the pipe box with no inorganic high heat transfer pipe installed.

This separate type inorganic high heat transfer double pre-heater for blast furnaces enhances heat exchange between two fluids with long distance. The heating and cooling segments are placed wherever they are required in the process. Large migration in gas flows can be simply avoided by adding several linking pipes with small diameter. Distance between the heating and cooling segments come between tens and hundreds meters. This is almost impossible for ordinary heat recovery devices.

The workflow of the inorganic high heat transfer dual-gas pre-heater of the present invention is described as follows: the high heat transfer tube nest in the smoke pipe box recovers heat carried by smoke. Then the inorganic high heat transfer tube nest in the air and gas pipe box increases the temperature of gas by sending heat to air and gas for heat exchange.

The dual gas heater of the present invention provides high heat transfer efficiency thereby reducing the size of the heat exchanger, simple structure, easy maintenance that allows convenient soot-cleaning, long lifespan, and solutions for potential problems caused by wall corrosion found between the flue and the air channel.

EXAMPLE 39

FIG. 5RA shows an afterheat boiler with the inorganic high heat transfer elements of the present invention, to be implemented in magnesium plants, such as serving as an afterheat boiler of the revolving tubular kiln in magnesium plants, where water in the boiler is heated by heat carried by smoke. As shown in FIG. 5RA, there are several parallel pipe banks in the rectangular flue box 577 with openings at both ends, namely inorganic high heat transfer pipe-pipe banks 578. The high heat transfer pipe banks 578 each comprise inorganic high heat transfer pipes, and sleeves and fins provided outside the high heat transfer pipes. There are numerous regularly arranged and linked holes provided on the bearing board for communicating with inorganic high heat transfer pipes. Direction of water and smoke flows depends on the condition on site. In this embodiment, smoke enters the inorganic high heat transfer water heater from its front and exits from its back. An expansion loop is installed to smoke intake/outlet to tackle the problem of expansion caused by heat in the flue box. In order to prevent soot covering, corrosion caused by dew condensation at the low temperature segment and soot blockage caused by excessive dust found in the boiler smoke, the heat exchange pipes for smoke flows are divided into two parts. A man-hole is provided on the top and a soot cleaning hole 579 on the bottom of the flue box to allow good ventilation, easy incrustation removal and maintenance.

The direction of water flow is opposite to that of smoke to enhance heat exchange. The inorganic heat transfer pipes in the flue box and those in the boiler drum are linked together. The number of the inorganic heat transfer pipe banks in the flue box and those in the boiler drum is also the same.

Water side heat exchange takes place outside the pipes to prevent blockage caused by incrustation in ordinary pipes. Man-holes are provided on the top and rear portions of the drum to allow easy maintenance and inspection of incrustation on the heat exchange pipes and the boiler drum. A high effect screen demister is installed on the top of the boiler drum to eradicate water in the steam so as to improve steam quality. The disadvantage of such a screen is that the screen is often blocked. To solve the problem, a flanged man-hole is provided over the screen to allow easy maintenance and inspection of the high effect screen demister.

To ensure proper operation of the inorganic high heat transfer pipes, the inorganic high heat transfer pipe bundle should be tilted in installation with the pre-heated water cavity being higher than the smoke cavity. A soot blower is installed in the smoke cavity, with its top located in the cavity being sealed. Several air holes are provided on the blower wall such that the blower is linked to the pressurized air pipe. It is the most preferable to install a thermal insulating layer on the wall of the pipe box at locations where inorganic high heat transfer pipes are not installed.

The workflow of the present invention is described as follows. The pipe bundle in the smoke cavity recovers heat carried by smoke; the pipe bundle in the boiler drum then elevates water temperature by transferring the heat to water to achieve the object of exchanging heat.

The above described afterheat boiler of high heat transfer efficiency reduces the size of the heat exchanger to ½ to ⅔ of the pipe casing afterheat boilers. Soot in such an afterheat boiler can be cleaned easily due to its simple structure, in which the afterheat boiler comprises only a steam dome and a heat pipe bundle without additional components. Such an afterheat boiler also provides large water capacity to allow easy generation of steam, prolongs service life, and ensures good overall strength.

EXAMPLE 40

This embodiment reveals another afterheat boiler with the inorganic high heat transfer elements of the present invention, to be implemented in magnesium plants. As FIG. 5RB shows, the afterheat boiler is applied to the reduction furnace in magnesium plants. As shown in FIG. 5RB, there are several parallel pipe banks in the rectangular pipe box with openings at both ends, namely inorganic high heat transfer pipe-pipe banks 577'. The pipe-pipe bank may adopt the same configuration as described and shown in the prior embodiment. There are numerous regularly arranged and linked inorganic high heat transfer pipes on the bearing board 578' for communicating with the inorganic high heat transfer pipes. Direction of liquid medium and smoke flows depends on the condition on site. As shown in the figure, the direction of the flow of liquid medium is opposite to that of smoke to enhance heat exchange. The inorganic heat transfer pipes in the flue box and those in the boiler drum are linked together. The number of the inorganic heat transfer pipe banks in the flue and those in the boiler drum is also the same.

The primary heat exchange region adopts inorganic high heat transfer pipes made in accordance with the invention. The inorganic high heat transfer afterheat boiler adopts a horizontal arrangement. The inorganic heat transfer afterheat boiler is installed above the flue box to reduce space required for installation. The heat transfer elements are aligned vertically due to the limited size of the smoke and air channels. Water side heat exchange takes place outside the pipes to prevent blockage caused by incrustation in ordinary pipes. A partition is installed between the vaporizing segment and the counter flow segment in the boiler drum to divide them into two independent spaces. Manholes are provided on the top, front and back sides of the drum to allow easy maintenance and inspection of incrustation on the boiler drum. A high effect screen demister is installed on the top of the boiler drum to eradicate water in the steam so as to improve steam quality. The disadvantage of such as screen is that the screen is often blocked. To solve the problem, a flanged man-hole is provided over the screen to allow easy maintenance and inspection of the high effect screen demister.

Smoke enters the afterheat boiler from its front and exits from its back. The joints between the smoke intake/outlet and the boiler are sealed with of fireproof and thermal insulating materials to seal the flue box. In order to prevent soot covering, corrosion caused by dew condensation at the low temperature segment and blockage caused by excessive dust found in the boiler smoke, two inspection holes, should be installed on the flue box at locations about 2 m from the front and rear ends of the drum to allow good ventilation, easy incrustation removal and maintenance.

The ensure proper operation of the inorganic high heat transfer pipes, the inorganic high heat transfer pipe bundle should be tilted in installation with the pre-heated water cavity being higher than the smoke cavity. In this embodiment, a blowing pipe is installed in the smoke cavity with its top located in the cavity being sealed. Several air holes are provided on the blowing pipe wall such that the blowing pipe is linked to the pressurized air pipe. It is the most preferable to install a thermal insulating layer on the wall of the pipe box at locations where inorganic high heat transfer pipe are not installed.

The workflow of the present invention is described as follows. The pipe bundle in the smoke cavity recovers heat carried by smoke; the pipe bundle in the boiler drum then elevates water temperature by transferring the heat to water to achieve the object of exchanging heat.

The structure has same advantages as mentioned in the prior embodiment.

EXAMPLE 41

This embodiment is another afterheat boiler. As shown in FIG. 5RC, it is an afterheat boiler for a sintering machine with inorganic high heat transfer elements of the present invention. In FIG. 5RC, hot air 581' in the sintering machine goes through a water pre-heater 583 and an afterheat boiler 582'. The air is exhausted from a chimney 583' after releasing its heat. Water supply absorbs heat when passing through the water pre-heater 583 to elevate water temperature. Heated water then enters a steam dome 580 through water pipes, followed by entering the afterheat boiler 582' to produce steam that eventually enters the steam dome, and is supplied for production and consumer uses. The afterheat boiler and steam dome 580 are linked together via a steam pipe 581 and a water pipe 582.

The afterheat boiler may be similar to the prior embodiments. There are several parallel pipe banks in the rectangular flue box with openings at both ends, namely inorganic high heat transfer pipe-pipe banks. The pipe banks may also adopt similar configurations as described and shown in the prior embodiments. There are numerous regularly arranged and linked inorganic high heat transfer pipes provided on the bearing board for communicating with the inorganic high heat transfer pipes. Direction of liquid medium and smoke flows depends on the condition on site. The direction of the flow of liquid medium in an exemplified embodiment is opposite to that of smoke to enhance heat exchange. The inorganic heat transfer pipes in the flue box and those in the boiler drum are linked together. The number of the inorganic heat transfer tube banks in the flue box and those in the boiler drum is also the same.

The primary heat exchange region adopting inorganic high heat transfer elements is applied to the main heat exchange surface. The inorganic high heat transfer afterheat boiler adopts a horizontal arrangement. The inorganic heat transfer afterheat boiler is installed above the flue box of the sintering machine to reduce space required for installation. The heat transfer elements are aligned vertically due to the limited size of the flue box. Water side heat exchange takes place outside the pipes to prevent blockage caused by incrustation in ordinary pipes. A partition is installed between the vaporizing segment and the counter flow segment in the boiler drum to divide them into two independent spaces. Man-holes are provided on the top, front and back sides of the boiler drum to allow easy maintenance and inspection of incrustation on the boiler drum. A high effect screen demister is installed on the top of the boiler drum to eradicate water in the steam so as to improve steam quality. The disadvantage of such a screen is that the screen is often blocked. To solve the problem, a flanged man-hole is provided over the screen to allow easy maintenance and inspection of the high effect screen demister.

Smoke enters the afterheat boiler from its front and exits from its back. The joints between the smoke intake/outlet and the boiler are sealed with of fireproof and thermal insulating materials seal the flue box. In order to prevent soot covering, corrosion caused by dew condensation at the low temperature segment and blockage caused by excessive dust found in the boiler smoke, two checking holes should be installed in the flue box at locations about 2 m from the front and rear ends of the drum to allow good ventilation, easy incrustation removal and maintenance.

To ensure proper operation of the inorganic high heat transfer pipes, the inorganic high heat transfer pipe bundle should be tilted or be placed vertically in installation, with he pre-heated water cavity being higher than the smoke cavity. In an alternative embodiment, a soot blower is installed in the smoke cavity, with its top located in the cavity being sealed. Several air holes are provided on the wall of the blower such that the blower outside the smoke cavity is linked to and the pressurized air pipe. It is the most preferable to install a thermal insulating layer on the wall of the pipe box at locations where inorganic high heat transfer pipes are not installed.

The workflow of the present invention is described as follows. The pipe bundle in the smoke cavity recovers heat carried by smoke; the pipe bundle in the boiler drum then elevates water temperature by transferring the heat to water to achieve the object of exchanging heat. The afterheat boiler in this embodiment has the same advantages as described in the prior embodiments.

EXAMPLE 42

This embodiment serves as another application of inorganic high heat transfer elements of the present invention in the afterheat boiler. FIG. 5S shows an afterheat boiler of a coupling casting machine comprising the inorganic high heat transfer elements of the present invention. Similar to the previous embodiment, there are several parallel pipe banks in the rectangular flue box with openings at both ends, namely inorganic high heat transfer pipe-pipe banks. The inorganic heat transfer pipes in the flue box are linked to those in the boiler drum. The number of the inorganic heat transfer pipe banks in the flume box and those in the boiler drum 586 are also the same. The heat carrier in the afterheat boiler of the inorganic high heat transfer coupling casting machine is solid so that it exchanges heat with the heating segments of the heat pipes by radiation. As shown in FIG. 5S, the hot and thick iron casting plate 585 leaving the coupling casting machine 584 transfers heat to the heating segments of the heat pipes by means of radiant heat exchange as the heat pipe elements 584' heat water supply, which is eventually turned into steam for commercial uses. It is required that heat pipe elements should have a relatively large absorbing area to provide the heating segments of the heat pipes with more concentrated and effective absorbance of radiant heat provided by the metal plate. A reflecting plate 585' is installed above the heating segment to reduce heat loss.

The inorganic heat transfer afterheat boiler is installed above the radiation flue box to reduce space required for installation. Water side heat exchange takes place outside the pipes to prevent blockage caused by incrustation in ordinary pipes. Manholes are provided on the drum to allow easy maintenance and inspection of the status of incrustation on the boiler drum. A high effect screen demister is installed on the top of the boiler drum to eradicate water in the steam so as to enhance steam quality. In order to prevent soot covering and soot blockage caused by excessive dust found in the boiler smoke, two inspection holes ports should be installed in the radiation flue box at locations about 2 m from the front and rear ends of the drum to allow easy soot cleaning, incrustation removal and maintenance. The workflow of the present invention is described as follows. The pipe bundle in the smoke cavity recovers heat carried by smoke; the pipe bundle in the boiler drum then elevates water temperature by transferring heat to water to achieve the object of exchanging heat. The afterheat boiler in this embodiment has the same advantages as described in the prior embodiments.

EXAMPLE 43

This is an alternative embodiment of the present invention for afterheat boilers. FIG. 5T shows a mineral plant billet afterheat boiler with the inorganic high heat transfer elements of the present invention, structured similarly to the prior embodiments. There are several parallel pipe banks in the rectangular flue box with openings at both ends, namely inorganic high heat transfer pipe-pipe banks. The inorganic heat transfer pipe banks in the radiation flue box are linked to those in the boiler drum. The number of the inorganic heat transfer pipe banks in the radiation flue box and those in the boiler drum is also the same.

The heat carrier in the inorganic high heat transfer mineral plant billet afterheat boiler is solid so that it exchanges heat with the heating segments of the heat pipes by radiation. Hot and thick iron casting plate 587 leaving the mill transferring heat to the heating segments of the heat pipes by means of radiant heat exchange as heat pipe elements heat the water supply, which is eventually turned into steam for commercial uses. It is required that heat pipe should have a relatively large absorbing area to provide the heating segments of the heat pipes with more concentrated and effective absorbance of radiant heat provided by the metal plate. A reflecting plate is installed above the heating segments to reduce heat loss. The inorganic heat transfer afterheat boiler is installed above the radiation flue box to reduce space required for installation. Water side heat exchange takes place outside the pipes to prevent blockage caused by incrustation in ordinary pipes. Manholes are provided on the drum to allow easy maintenance and inspection of incrustation on the boiler drum. A high effect screen demister is installed on the top of the boiler drum to eradicate water in the steam so as to enhance steam quality. In order to prevent soot covering and soot blockage caused by excessive dust found in the boiler smoke, two inspection holes should be installed in the radiation flue box at locations about 2 m from the front and rear ends of the drum to allow easy soot cleaning, incrustation removal and maintenance.

The workflow of the present invention is described as follows. The pipe bundle in the smoke cavity recovers heat carried by smoke; the pipe bundle in the boiler drum then elevates water temperature by transferring heat to water to achieve the object of exchanging for heat.

The afterheat boiler in this embodiment, similarly, has the same advantages as described in the prior embodiments.

EXAMPLE 44

This embodiment is a comprehensive afterheat recovery system for fuel oil industrial furnaces. FIG. 5UA shows the workflow of a heat recovery system adopting the inorganic high heat transfer, comprehensive afterheat recovery system of this present invention in a fuel oil industrial furnace. FIG. 5UB shows the structure of an inorganic high heat transfer element used in the recovery apparatus.

Smoke generated during combustion in industrial furnace 580" is taken into the inorganic high heat transfer afterheat recovery system 581", i.e. the system framed with dotted lines. The smoke entering the heat recovery system first goes into the smoke side of the air pre-heater, and then releases heat to heat the air through the inorganic high heat transfer element. Heated air serves as a combustion agent in the industrial furnace. Heat is further released by the exhausted smoke entering a coal saver 582" to pre-heat water to be used by the boiler. Smoke with heat that has been collected by the heat recovery system is then discharged from a chimney 583".

The inorganic high heat transfer air pre-heater and the coal saver in this heat recovery system are designed as an integral unit, and linked together by an intermediate connecting plate. When entering the smoke side pipe in the air pre-heater in the smoke channel, smoke transports heat to the inorganic high heat transfer element. The element is supported by tube sheets at the sink and source ends as well as the partition in the middle, which partition divides the element into two independent cavities, one being a smoke chamber, where the smoke passes heat to the inorganic high heat transfer pipe when the smoke goes through, and the other being an air chamber, where cold air takes away heat on the pipe as the cold air enters to be pre-heated. As shown in FIG. 5UB, there is a sealed flange provided between each pipe and tube sheet. Fins are used to wind around the element to enlarge heat exchange area. Smoke discharged by the air pre-heater enters the coal saver 582" located beneath the pre-heater, for further reducing the smoke temperature by releasing heat for heating water, to be used in the boiler.

The heat transfer element of the present invention is adopted in this system to enhance effective heat recovery and heat exchange. The smoke temperature discharged by the furnace is commonly between 300° C. and 400° C., which provides more afterheat. Recycling smoke before discharging it to air not only enhances efficient energy use, but also reduces air pollution and improves labor conditions significantly. Hence, installation of an air pre-heater and a coal saver prior to the smoke discharged from the industrial furnace entering the chimney effectively recycle smoke to achieve the object of preheating water and air that serves as a combustion agent in the industrial furnace.

EXAMPLE 45

Similar to the previous embodiment, FIG. 5V shows the operating process of a fuel oil industrial furnace stream generator containing the inorganic high heat transfer element of the present invention. Smoke generated by burning fuel oil in the industrial furnace is guided to the smoke side of the inorganic high heat transfer steam generator to release heat before it is discharged to the chimney. Heat is transported to the water supply side when smoke through the inorganic high heat transfer element to generate steam. Cooled smoke exits via the chimney. The essence of this embodiment is that several inorganic high heat transfer elements are welded to the drum of the steam generator. One side (heat-releasing end) of each inorganic high heat transfer element stretches into and the other side (heat-absorbing end) out the drum. Many spiral ribs are welded to the heat-absorbing end to increase the heat exchange area for enhancing heat exchanging effect at the heat-absorbing end.

After being cooled after exchanging heat, smoke is discharged from the chimney. The inorganic high heat transfer elements each transport heat absorbed at the heat-absorbing end to the heat-releasing end via medium. Inserting into the steam-water mixture in the drum, the heat-releasing end passes heat absorbed at the heat-absorbing end to the mixture in the drum to produce steam consistently. Different from the steam generator used for gas industrial furnaces, the issue of soot removal in this embodiment should be taken into consideration for the fuel oil furnace tends to produce more polluted smoke. Thus the steam generator in this embodiment is designed as a vertical and concentric model.

This embodiment is small in size, light in weight, allows self-cleaning to reduce soot covering and easy cleaning. Fins welded to the smoke side enlarge heat transfer area and guide the air to allow homogeneous distribution of air flow. The water side being outside the pipe reduces flow resistance significantly. The boiler is less likely to be blocked by incrustation in comparison with conventional afterheat boilers; even if there is incrustation, it can be easily removed by chemicals. For one thing, heating steam outside the pipes does not damage the heat exchange pipes due to water hammering in the pipes and caused by excessive heat load. For another, failure at an end of the heat transfer element does not cause leakage. Both ends of the heat transfer element are free, which cause no differential stress at the welding locations of the inner drum.

EXAMPLE 46

The embodiment of the prevent invention is used in a comprehensive afterheat recovery system for gas industrial furnaces. It is similar to the recovery system in the fuel oil industrial furnace. FIG. 5W shows the operating process of the heat recovery system process of a gas industrial furnace containing the inorganic high heat transfer elements of the present invention.

Smoke produced by burning fuel gas in an industrial furnace 589 is guided into inorganic high heat transfer afterheat recovery system, i.e. the system framed with dotted lines. Smoke in the heat recovery system first enters the smoke side of the air pre-heater, and then releases heat to heat the air through the inorganic high heat transfer element. Heated air serves as a combustion agent in the industrial furnace. Heat is further released by the exhausted smoke entering a coal saver 582" to pre-heat water to be used by the boiler. Smoke with heat that has been collected by the heat recovery system is then discharged from a chimney.

The inorganic high heat transfer air pre-heater and the coal saver in this heat recovery system are designed as an integral unit, and linked together by an intermediate connecting plate. When entering the smoke side pipe in the air pre-heater in the smoke channel, smoke transports heat to the inorganic high heat transfer element. The element is supported by tube sheets at the sink and source ends as well as the partition in the middle, which partition divides the element into two independent cavities, one being a smoke chamber, where the smoke passes heat to the inorganic high heat transfer pipe when the smoke goes through, and the other being an air chamber, where cold air takes away heat on the pipe as the cold air enters to be pre-heated. There is a sealed flange provided between each pipe and tube sheet, constructed similarly to the afterheat recovery system for fuel oil industrial furnaces. Fins are used to wind around the element to enlarge heat exchange area. Smoke discharged by the air pre-heater enters the coal saver located beneath the pre-heater, for further reducing the smoke temperature by releasing heat to heat water, to be used in the boiler.

EXAMPLE 47

This is another embodiment of the comprehensive afterheat recovery in a gas furnace. FIG. 5X shows the operating process of a stream generator of a gas industrial furnace containing the inorganic high heat transfer elements of the present invention, structured similarly to that of the steam generator comprising inorganic high heat transfer element of the present invention in the fuel oil furnace.

Smoke generated by burning gas in the industrial furnace is guided to the smoke side of the inorganic high heat transfer steam generator to release heat before it is discharged to the chimney. Heat is transported to the water supply side when smoke through the inorganic high heat transfer element to generate steam. Cooled smoke exits via the chimney. The essence of this embodiment is that several inorganic high heat transfer elements are welded to the drum of the steam generator. One side (heat-releasing end) of each inorganic high heat transfer element stretches into and the other side (heat-absorbing end) out the drum. Many spiral ribs are welded to the heat-absorbing end to increase the heat exchange area for enhancing heat exchanging effect at the heat-absorbing end.

EXAMPLE 48

This embodiment of the present invention is an application of an inorganic heat exchanger in a drying system. FIG. 5Y shows a heat transfer exchanger used in a dryer energy cycling system.

In the drying system, hot air leaving the hot air furnace can only be discharged to ambient air due to an increase in its humidity after it is cooled by the medium to be dried. Since exhaust carries afterheat, it is introduced into the inorganic heat pipe heat exchanger, where it exchanges heat with dry, fresh air. Fresh air is pre-heated as water in the exhaust regenerates through condensation. Finally both regenerated and fresh air are transported and heated in the hot air furnace. This process improves thermal efficiency in the drying system. Thus, this embodiment adds a heat exchanger with inorganic heat transfer tubes to the drying system to enhance energy recycling and promotes system performance. The inorganic heat transfer heat exchanger adopts a horizontal configuration and comprises inorganic high heat transfer pipes 590, a furnace chamber 591, exhaust entrance pipe 592*s* and fresh air entrance pipes 593.

As the drawing shows, the rectangular box with openings on its left and right sides is divided into an upper and a lower section divided by an intermediate tube sheet. The upper section is the sink end of the inorganic high heat transfer pipes while the lower section is the source end. The inorganic high heat transfer pipes vertically penetrate the tube sheet and adopt a triangular arrangement. In operation, fresh air crosses vertically the sink end of the inorganic high heat transfer pipes while exhaust from the dryer and fresh air crosses the source end of the pipe in a counter direction. Inorganic high heat transfer medium than passes heat released by the exhaust to the upper part (sink end) of the inorganic high heat transfer pipes and then to the fresh air.

EXAMPLE 49

This embodiment is another application of waste heat recovery. FIG. 5Z shows a schematic drawing of a heat recovery apparatus used in restaurants, which consists of the inorganic high heat transfer elements of the present invention.

As shown in the figure, several parallel pipe banks 596 are provided in the hot air channel 595, namely inorganic high heat transfer pipe-pipe banks. Numerous regularly arranged and holes are provided on the bearing board for communicating with the inorganic high heat transfer pipes. Direction of water and air flows depends on the condition on site. Grease outlet is available since exhaust discharged from the restaurant may contain large amount of grease.

The inorganic high heat transfer pipe bundle should be tilted in installation and the top of the re-heating water cavity 594 should be sealed so as to ensure proper operation.

The workflow is described as follows. The pipe bundle in the exhaust cavity recovers heat carried by the exhaust; then the pipe bundle in the boiler drum elevates water temperature by transferring heat to water to achieve the object of exchanging heat.

EXAMPLE 50

This embodiment is an air pre-heating device using heat carried by smoke to heat air in a furnace, which adopts inorganic high heat transfer elements of this invention to enhance heat exchange as stated above. It is necessary to pre-heat air going into the propane de-asphalt furnace in order to reduce fuel consumption. Normally air is preheated by means of heat exchange between hot smoke from the furnace and cold air.

Most conventional pre-heaters comprise pipe banks, with the shortcomings of low thermal efficiency and mixed airflows caused by corrosion of pipe banks resulted from various factors. As a result, equipment must be shut down for repair. The volume of the heat exchanger must be enlarged so as to heat air up to the required temperature. Further, it is relatively difficult to remove soot in the heat exchanger.

This embodiment provides an air pre-heater featuring with high heat efficiency, small size and easy removal of soot.

FIG. 5ZA shows a front cross-sectional view of a propane de-asphalt furnace adopting an inorganic high heat transfer air re-heater of the present invention.

Propane de-asphalt furnace is used to heat mixed raw material oil quenched from the bottom of two depressurizing towers to 230° C.; the heated mixture is then supplied to the extracting system. The furnace consists of three parts, in which fuel is burned a lower part of an furnace chamber, which also serves as a radiation segment for radiation heat exchange with the quench; the upper part of the furnace chamber is a counter flow heat exchange segment, which pre-heats the quench and cools smoke; an air pre-heater is installed above the furnace, namely the upper counter flow segment, to further reduce the smoke temperature, thereby elevating temperature of air serving as a combustion agent, improving the status of burning, promoting furnace performance, and reducing energy consumption.

The integrated inorganic high heat transfer comprises of two parts, each constructed to a frame structure. The two parts are divided by an intermediate partition with cone holes into two cavities (left and right). Air goes through the right cavity, which is a sink end while smoke goes through the left cavity, which is a source end. As shown in FIG. 5ZA, at least one set of the opposite walls should be plates in the cylindrical pipe box with openings on both ends to support the inorganic high heat transfer pipes. There are numerous regularly arranged holes corresponding to the external diameter of inorganic high heat transfer pipes, provided on the plates. Parallel to the two supporting plates as described above, the partition divides the box into two disconnected cavities (left and right). Direction of air and smoke flows depends on the condition on site. As the attached drawing shows, an air outlet pipe 2401 is installed to the top of the air cavity and an air intake pipe 2402 to the bottom. A smoke intake pipe 2403 is installed to the bottom of the smoke cavity and a smoke outlet pipe 2404 to the top. On the partition are provided with holes complying with the arrangement and number of the holes on the two supporting plates. Each hole is inserted with an inorganic high heat transfer pipe with fins provided on its surface. A seal flange is installed between each high heat transfer pipe and the partition.

The bottom of partitions and plates bearing the inorganic high heat transfer pipe bundle are fixed to a bearer. The most preferable material for the bearer is an I steel beam. Both ends of each bearer are fixed to a holder.

To ensure proper operation of the inorganic heat transfer pipes, the air cavity side should be higher than the smoke cavity side. The pre-heater with structure as stated above can be used as a single device. Alternatively, two pre-heaters may be combined in series with a partition. A soot blower may be installed in the smoke cavity. The top of the cavity is sealed and several air holes are provided on the wall of the blower so that the blower are linked to the pressurized air pipe. It is the most preferable to install a thermal insulating layer on the wall of the pipe box at locations where inorganic high heat transfer pipes are not installed.

The workflow of this embodiment is described as follows. The pipe bundle in the smoke cavity recovers heat carried by smoke; then the pipe bundle in the air cavity elevates air temperature by transferring heat to air.

This embodiment is superior to current apparatus for it has the following advantages: 1) It reduces the size of the heat exchanger to ½ to ⅔ of heat exchangers with pipe banks while featuring with high heat transfer efficiency and large unit heat transfer area. 2) Soot in such an afterheat boiler can be cleaned easily due to its simple structure. 3) Air and smoke moves as counter flows, which helps to prolong the service life. 4) No need for auxiliary power. 5) Easy installation without making major changes in the existing equipment.

EXAMPLE 51

This embodiment is another air pre-heating apparatus. To be more specific, it is an air pre-heating device using heat carried by smoke discharged from the molecular screen de-wax carrier furnace. Inorganic high heat transfer element is adapted to enhance heat exchange performance as stated above.

FIG. 5ZB shows a front view of an air re-heater of the molecular screen de-wax carrier furnace.

The air pre-heater of the molecular screen de-wax carrier furnace is composed of two boxes. Each box comes as a frame and two boxes are linked together with connecting pipes. The pipe box is divided into two cavities (left and right) by an intermediate tube sheet. Inorganic high heat transfer pipes penetrate the box horizontally via the holes provided on the intermediate tube sheet. Sealed flanges are provided to isolate the left cavity from the right one. Air goes through the left cavity, which is a sink end while smoke goes through the right cavity, which is a source end. Both ends of the element are supported by two tube sheets on both sides, which are parallel to the intermediate tube sheet. Direction of air and smoke flows depends on the condition on site. As the attached drawing shows, an air outlet pipe 2405 is installed to the top of the air cavity and air intake pipe 2406 to the bottom. A smoke intake pipe 2407 is installed to the top of the smoke cavity and a smoke outlet pipe 2408 to the bottom. Access manholes with a lid are attached to the smoke intake pipe. Inorganic high heat transfer pipes each comprise a metal tube and an inorganic high heat transfer tube with fins on its surface. A sealed flange is provided between each pipe and the tube sheet.

To ensure proper operation of inorganic heat transfer pipes, the air cavity side should be higher than the smoke cavity side. A soot blower may be installed in the smoke cavity. The top of the cavity is sealed and there are several air holes on the wall of the blower so that the blower port is linked to the external pressurized air pipe. A thermal insulating layer is installed on the wall of the pipe box.

The workflow is described as follows. The pipe bundle in the smoke cavity recovers heat carried by smoke; then the pipe bundle in the air cavity elevates air temperature by transferring heat to the air.

This embodiment has similar advantages as described in the prior embodiment.

EXAMPLE 52

This embodiment is another air pre-heating device. To be more specific, it is an air pre-heater installed on the top of the blast afterheat recovery apparatus in the gas making system for the chemical fertilizer manufacture system, for preheating air serving as a combustion agent, with heat carried by the blast. Inorganic high heat transfer element is adopted to enhance heat exchange performance as stated above. This embodiment provides high heat transfer efficiency thereby reducing the size of the heat exchanger, simple structure, long lifespan, and reduction in energy consumption and pollution.

Blast in the gas making system in chemical fertilizer plants carries minute amount of flammable elements and sensible heat. The blast is normally incombustible due to its low heat value but capable of pre-heat airing that serves as a combustion agent to more than 300° C. The blast can become flammable with gas released by the gas-making system to produce hot smoke of temperature between 850~900° C. to generate steam, pre-heat air and heat soft water, thereby promoting thermal efficiency of the system, reducing energy consumption and diminishing pollution. The device is designed to be small, simple and light in terms of structure so that it can be easily installed on the top of the blast afterheat recovery apparatus.

Most conventional pre-heaters comprise pipe banks, with the shortcomings of low thermal efficiency. The volume of the heat exchanger must be enlarged so as to heat air up to the required temperature. Further, it is relatively difficult to remove soot in the heat exchanger resulting in high smoke resistance. Larger stress of temperature gradient between heat exchange pipe and pipe sheet caused by temperature flux in operation tends to produce loose or partially cracked welds, such that the equipment must be shut down for repaired in case of any crack or leak. Other shortcomings include frequent abrasion in heat exchange pipes, difficulty in replacement, and short service life.

The apparatus in this embodiment is an air pre-heater installed on the top of the blast heat recovery apparatus, with the advantage of compact and simple structure, high heat exchange rates, easy soot removal and long service life.

FIG. 5ZC shows an inorganic high heat transfer air pre-heater in a chemical fertilizer gas making system. As shown in FIG. 5ZA, the air pre-heater comprises a rectangular box with openings on both ends and having a pair of pipe sheet supporting plates 2409 having at least one set of opposite sidewall plates and a pair of inorganic high heat transfer pipes. There are numerous regularly arranged holes corresponding to the external diameter of inorganic high heat transfer pipes 2410, provided on the pipe sheet supporting plates. Parallel to the two supporting plates as described above, an intermediate partition pipe sheet divides the box into two disconnected cavities. Direction of air and smoke flows depends on the condition on site. As the attached drawing shows, an air intake 2411 is installed to the top of the air cavity and an air outlet 2412 to the bottom. A smoke intake 2413 is installed to the bottom of the smoke cavity and a smoke outlet 2414 to the top. On the intermediate pipe sheet are provided with holes complying with the arrangement and number of the holes on the two supporting sheets. Each hole is inserted with an inorganic high heat transfer pipe with fins provided on its surface. A seal flange is installed between each high heat transfer pipe and the partition.

Pipe boxes may be installed to the outboard of the supporting sheets on both ends of the box. A movable end cover is attached to the box for the purpose of replacing inorganic heat transfer pipes. The cover is sealed with gaskets, and fixed to the pipe box by bolts and nuts.

Thermal insulating layer of a certain thickness is attached to the inner wall of the pipe box to reduce heat loss. Edges of the pipe sheet are welded to reinforced bars to prevent distortion. This embodiment is an inorganic high heat transfer air pre-heater of the blast heat recovery apparatus, comprising independent channels for air and smoke, which channels go through a set of aligned and parallel boxes separated by an intermediate sealed plate into a first end communicating with the smoke channel and the other end with the air channel. An inorganic heat transfer pipe bundle is installed in every box. Radiating fins are welded to the heat transfer pipes. Pipe sheets on both sides of the box bear both ends of the pipes. The inorganic heat transfer pipes may penetrate the intermediate sealed plate in the box, with the periphery of the sealed plate joined to the partition pf the box case.

The smoke box of the air pre-heater is installed in the hot smoke channel of the blast afterheat recovery apparatus. The air outlet communicates with to the intake ventilator via the air channel. Heated air is taken into the blast afterheat recovery apparatus through the air channel and the intake ventilator.

To improve heat exchange efficiency of inorganic heat transfer pipes, the inorganic high heat transfer pipe bundle should be tilted at installation, with the air cavity side being higher than the smoke cavity side. When the inorganic high heat transfer pipe bundle is normal to the supporting plates, the box should tilt toward the smoke cavity, in such a manner that the pipe bundle in the pipe box forms an angle between 3° and 20° with horizon.

The pre-heater with structure as stated above can be used as a single device. Alternatively, two pre-heaters may be combined in series or connected in parallel.

The workflow of this embodiment is described as follows. The pipe bundle in the smoke cavity recovers heat carried by smoke, which heat is rapidly transported to the pipe bundle in the air cavity to elevate air temperature of air and to cool smoke by transferring heat to the air.

This embodiment has the following advantages in comparison with current pre-heaters with pipe banks:

Air and smoke move as counter flows in heat exchange, contributing to high heat exchange efficiency and small heat exchanger size;

The pre-heater can be cleaned easily and reduces smoke resistance due to its freely configurable structure;

Heat transfer pipes and pipe sheets are linked together in a floating manner so as to eliminate stress of temperature gradient between them caused by temperature flux in operation;

Damage caused by corrosion is rare on heat transfer pipes; very few of them are abraded so as to eliminate the need for shutting down the apparatus for repair and to provide excellent reliability.

EXAMPLE 53

Similar to the embodiment above, this embodiment is another air pre-heater using afterheat. It is an air pre-heater installed on the top of the furnace of a platinum resetting device in an oil refinery, for pre-heating air that serves as a combustion agent, with heat carried by smoke. FIG. 5ZD shows an inorganic high heat transfer air pre-heater in the heating furnace of a platinum resetting apparatus. It is an air pre-heater installed on the top of the furnace with the advantages of compact and simple structure, high heat exchange rates, ease of soot removal and long service life.

Similar to the previous embodiment, the air pre-heater comprises a rectangular box with openings on both ends and having a pair of pipe sheet supporting plates having at least one set of opposite sidewall plates and a pair of inorganic high heat transfer pipes. There are numerous regularly arranged holes corresponding to the external diameter of inorganic high heat transfer pipes 2410, provided on the pipe sheet supporting plates. Parallel to the two supporting plates as described above, an intermediate partition pipe sheet divides the box into two disconnected cavities. Direction of air and smoke flows depends on the condition on site. As the attached drawing shows, an air intake is installed to the top of the air cavity and an air outlet to the bottom. A smoke intake is installed to the bottom of the smoke cavity and a smoke outlet to the top. On the intermediate pipe sheet are provided with holes complying with the arrangement and number of the holes on the two supporting sheets. Each hole is inserted with an inorganic high heat transfer pipe with fins provided on its surface. A seal flange is installed between each high heat transfer pipe and the partition.

Pipe boxes are installed to the outboard of the supporting sheets on both ends of the box. A movable end cover is attached to the box for the purpose of replacing inorganic heat transfer pipes. The cover is sealed with gaskets, and fixed to the pipe box by bolts and nuts. To improve heat exchange efficiency of inorganic heat transfer pipes, the inorganic high heat transfer pipe bundle should be tilted at installation, with the air cavity side being higher than the smoke cavity side. When the inorganic high heat transfer pipe bundle is normal to the supporting plates, the box should tilt toward the smoke cavity, in such a manner that the pipe bundle in the pipe box forms an angle between 3° and 20° with horizon.

The pre-heater with structure as stated above can be used as a single device. Alternatively, two pre-heaters may be combined in series or connected in parallel.

The workflow of the apparatus in this embodiment is described as follows. The pipe bundle in the smoke cavity recovers heat carried by smoke, which heat is rapidly transported to the pipe bundle in the air cavity to elevate air temperature of air and to cool smoke by transferring heat to the air.

In comparison with current pre-heaters with pipe banks, this embodiment has similar advantages as the previous embodiment does.

EXAMPLE 54

The structure of the inorganic high heat transfer air pre-heater in the propane de-asphalt furnace in this embodiment is similar to that as shown in the previous embodiment.

FIG. 5ZE shows an inorganic high heat transfer air pre-heater in an inorganic high heat transfer Arene device constant depressurizing carrier furnace.

Arene device constant depressurizing carrier furnace is used to heat mixed raw material oil quenched from the bottom of depressurizing towers to 230° C.; the heated mixture is then supplied to the extracting system. The furnace consists of three parts, in which fuel is burned a lower part of an furnace chamber, which also serves as a radiation segment for radiation heat exchange with the quench; the upper part of the furnace chamber is a counter flow heat exchange segment, which pre-heats the quench and cools smoke; an air pre-heater is installed above the furnace, namely the upper counter flow segment, to further reduce the smoke temperature, thereby elevating temperature of air serving as a combustion agent, improving the status of burning, promoting furnace performance, and reducing energy consumption.

The integrated inorganic high heat transfer comprises of two parts, each constructed to a frame structure. The two parts are divided by an intermediate partition with cone holes into two cavities (left and right). Air goes through the right cavity, which is a sink end while smoke goes through the left cavity, which is a source end. As shown in FIG. 5ZE, at least one set of the opposite walls should be plates in the cylindrical pipe box with openings on both ends to support the inorganic high heat transfer pipes. There are numerous regularly arranged holes corresponding to the external diameter of inorganic high heat transfer pipes, provided on the plates. Parallel to the two supporting plates as described above, the partition divides the box into two disconnected cavities (left and right). Direction of air and smoke flows depends on the condition on site. As the attached drawing shows, an air outlet pipe is installed to the top of the air cavity and an air intake pipe to the bottom. A smoke intake pipe is installed to the bottom of the smoke cavity and a smoke outlet pipe to the top. On the partition are provided with holes smoke cavity and a smoke outlet pipe 2404 to the top. On the partition are provided with holes complying with the arrangement and number of the holes on the two supporting plates. Each hole is inserted with an inorganic high heat transfer pipe with fins provided on its surface. A seal flange is installed between each high heat transfer pipe and the partition.

To ensure proper operation of the inorganic high heat transfer pipes, the inorganic high heat transfer pipe bundle should be tilted in installation with the pre-heated water cavity being higher than the smoke cavity. A soot blower is installed in the smoke cavity, with its top located in the cavity being sealed. Several air holes are provided on the blower wall such that the blower is linked to the pressurized air pipe. A thermal insulating layer is installed on the wall of the pipe box The workflow of this embodiment is described as follows. The inorganic heat transfer tube bundle in the smoke cavity recovers heat carried by smoke, which heat elevates the air temperature by transferring heat to air.

This embodiment is superior to current apparatus for it has the following advantages: 1) It reduces the size of the heat exchanger to ½ to ⅔ of heat exchangers with pipe banks while featuring with high heat transfer efficiency and large unit heat transfer area. 2) Soot in such an afterheat boiler can be cleaned easily due to its simple structure. 3) Air and smoke moves as counter flows, which helps to prolong the service life. 4) No need for auxiliary power. 5) Easy installation without making major changes in the existing equipment.

EXAMPLE 55

Coking plants in the worlds are striving to tackle the problem with recycling heat carried by gas in the coke furnace lift pipe. None of current approaches is satisfactory, however, due to the complex structure and limited space for the lift pipe.

The inorganic high heat transfer heat recovery apparatus succeeds in solving this problem. FIG. 5ZF shows the structure of the apparatus, which is simple and contributes to long useful life. This apparatus recycles heat produced by gas in the lift pipe by adopting inorganic high heat transfer elements of the present invention.

The temperature of gas in coke furnace life pipe 2416 is approximately between 600° C. and 700° C. Its diameter is between 600 m and 700 m. A ringed water jacket is installed to the outboard of the lift pipe. Inorganic heat transfer elements 2415 arranged in a radial pattern go straight toward the water jacket through the lift pipe.

Circulating water flows through the water jacket. The apparatus applies compulsory circulation so that the boiler drum may be situated farther from the coke furnace to produce steam or hot water.

Such a structure will definitely be the very first achievement if it proves to be successful.

Since there are roughly sixteen lift pipes in each coke furnace, application of this embodiment to coke furnaces will lead to considerable economic effectiveness.

EXAMPLE 56

As shown in FIG. 5ZG, this embodiment is an inorganic heat transfer and recovery device installed on the continuous casting billet cold table of a continuous casting machine in the steel plant.

The temperature of continuous casting blank 2419 coming out of continuous casting machine 2417 exceeds 1300° C. The surface of the blank is solid but it is still liquid inside. The blanks are transported by a roller track to the cold table. The amount of heat dissipated from the surface of the blanks on the cold table is huge but there is no apparatus for recycling the heat so far.

In normal operation, there should be 80~100 tons of blanks passing the heat reserving mask per hour in steel plant with annual production of 0.5~1 million tons per year. In the situation that the temperature inside the heat reserving mask is 500° C., steam production can reach 8~10 ton/hour as 1 ton of continuous casting blanks produces 0.1 ton of steam. Hence a heat recovery apparatus can meet the need for heating in the whole plant in winter.

The inorganic afterheat recovery apparatus comprises the following devices:

A heat-reserving mask is installed to the continuous casting base cold table. The rough size of the mask is 2000×(2000~3000)×8000 mm. The thermal insulating layer in the mask is made of ceramic fibers. An exhaust stack of Φ500×300 mm is installed on one side of the mask cover; devices used to fix the mask are designed without affecting the operation of the cold table; there are about 300 to 400 inorganic heat transfer elements 2418, which are Φ38×(2500~3000)mm; heat is conducted in both radiation and counter flow between the heat reserving mask and the heat transfer elements. The embodiment further comprises an apparatus for replacing inorganic heat transfer elements and a sealing device.

EXAMPLE 57

Similar to the air pre-heater in a chemical fertilizer manufacturing system, this embodiment is an air pre-heater installed in the glass kiln. It pre-heats the air used as a combustion agent by the afterheat carried by the smoke produced at the end of the process. Inorganic high heat transfer element is adapted to enhance the high heat exchange as stated above. This embodiment has the following advantages: simple structure; long useful life; high heat exchange efficiency; and reducing energy consumption and pollution.

The temperature of the smoke discharged from the kiln is between 200° C. and 300° C., which is still hot even though the afterheat has been recycled by the heat-storage heat exchanger. Discharging the smoke into air not only becomes a waste of energy to but also pollutes the environment. The heat carried by the smoke can be used as an agent in combustion, which promotes thermal efficiency of the system, reduces energy consumption and diminishes pollution. The device is small, simple and light in terms of structure and is easy to install.

Most of the existing pre-heaters comprise pipe banks. The disadvantages include: low heat exchange efficiency; the volume of the heat exchanger must be enlarged in order to heat the air up to the required temperature; soot in the heat exchanger can hardly be removed and smoke resistance is large; larger thermal stress due to the temperature gradient between the heat exchange pipe and the tube sheet caused by temperature fluctuation in operation and thus, produces loosing or partially cracked at the welds; the equipment should be shut down and repaired if there is any crack or leak; frequent abrasion in heat exchange pipes; difficulty in replacement; short useful life.

FIG. 5ZH shows an inorganic high heat transfer air pre-heater in a glass kiln. Similar to the above air pre-heater in a chemical fertilizer manufacturing system, there should be at least one set of opposite sidewall plates and tube sheets having inorganic high heat transfer pipes in the rectangular box with openings on both ends in this embodiment. There are a number of regularly arranged holes on the tube sheets, facing the external diameter of the inorganic high heat transfer pipe. Parallel to two supporting tube sheets as described above, a partition-intermediate tube sheet is provided in the box to divide it into two disconnected cavities. Flowing direction of the air and the smoke depend on the condition on site. As shown in the attached drawings, air intake is installed on the top of the air cavity and air outlet is installed on the bottom. Smoke intake is installed on the bottom of the smoke cavity and smoke outlet is installed on the top. Holes are provided on the intermediate tube sheet to comply the arrangement and number of the holes on the two supporting tube sheets. Each hole is inserted with an inorganic high heat transfer pipe with fins on its surface. A seal flange is installed between each high heat transfer pipe and partition.

Pipe boxes are provided at the outer side of the supporting tube sheets. A movable end cover is attached to the box for the purpose of easily replacing the inorganic heat transfer pipe. The cover is sealed with a gasket, fixed by a bolt, a nut and the pipe box.

Thermal insulating layer with a predetermined thickness is attached to the inner wall of the pipe box to reduce heat loss.

Edges of the tube sheet are welded to reinforced bars to prevent distortion.

This embodiment is described as follows. An inorganic high heat transfer air pre-heater in a glass kiln comprises independent channels for air and smoke, which go through a set of aligned and parallel boxes, which are separated by an intermediate sealed plate. One end of the boxes is connected to the smoke channel while the other end is connected to the air channel. An inorganic heat transfer tube bundle is installed in each box. A radiating fin is welded on the heat transfer pipe. Tube sheets on both sides of the box bear both ends of the pipe. The inorganic heat transfer pipes may penetrate the intermediate sealed plate in the box. The surface thereof is connected with the partition in the sealed case.

An inorganic heat transfer tube bundle is installed longitudinally in the box. A radiating fin is attached to the inorganic heat transfer pipe. The fin absorbs the heat in smoke and transfers the same to the other end of the pipe to fully heat the cold air. Vertical endplates on both sides of the connecting box bear both ends of the pipe. Each box contains an upright sealed tube sheet inside. The surface of the sealed tube sheet is connected with the sideboard of the box so that there is no leak between the air channel, flue channel and the environment.

The smoke box of the air pre-heater is installed in the flue channel of the glass kiln. Air intake is connected with the ventilating machine while the air outlet is connected with the kiln though the air channel. After heated by the air pre-heater, air from the ventilating machine is heated end transported to the burner in the kiln.

To improve the heat exchange efficiency of the inorganic heat transfer pipe, the inorganic high heat transfer tube bundle should be inclinedly installed. The side of the air cavity should be higher than the side of the smoke cavity. When the inorganic high heat transfer tube bundle is perpendicular with the supporting plate, the box should tilt toward the smoke cavity. Thus, the tube bundle in the pipe box forms an angle between 3° and 20° with the horizontal plane.

The pre-heater with the structure as stated above can be utilized as a single device. Alternatively, two pre-heaters may be combined in series or connected in parallel.

The workflow of the apparatus in this embodiment is described as follows: the tube bundle in the smoke cavity recovers the heat carried by smoke. The heat is rapidly transported to the tube bundle in the air cavity and released to the air and thereby increases the temperature of the air and cools the smoke.

This embodiment has the following advantages in comparison with current pre-heaters with tube banks: 1) Air and smoke move as counter flows in heat exchange, contributing to high heat exchange efficiency and small heat exchanger size; 2) It is easy to clean soot in the apparatus because of its simple structure; small smoke resistance; 3) Heat transfer pipe and tube sheet are connected together in a floating way so that there is no thermal stress due to temperature gradient therebetween caused by temperature fluctuation in operation; 4) damage caused by corrosion is rare on heat transfer pipes; very few of the pipes are abraded; no need for shutting down the apparatus for repair; and excellent reliability.

EXAMPLE 58

Similar to the air pre-heater in the gas making system in chemical fertilizer plants, this embodiment is an inorganic high heat transfer air pre-heater installed on the top of a crude heater. The object of this embodiment is to provide an air pre-heater on the top of the smoke afterheat recovery apparatus with the following advantages: small in size, simple structure, high heat exchange rate, easy removing of soot and long application life.

Similar to the air pre-heater in the chemical fertilizer manufacturing system in the previous embodiment as shown in FIG. 5ZJ, there should be at least one set of opposite sidewall plates and tube sheets 2409 supporting the inorganic high heat transfer pipes in the rectangular box with openings on both top and bottom ends. A plurality of holes are regularly arranged on the tube sheets and corresponding to the external diameter of the inorganic high heat transfer pipe 2410. Parallel to the two supporting tube sheets as described above, a partition-intermediate tube sheet 2422 is provided in the box to divide it into two separated cavities. Flowing directions of the air and the smoke depend on the conditions on site. As the attached drawings show, an air intake 2411 is provided on the top of the air cavity and an air outlet 2412 is provided on the bottom thereof. A smoke intake 2413 is installed to the bottom of the smoke cavity and a smoke outlet 2414 is provided on the top thereof. On the intermediate tube sheet, holes are provided complying the arrangement and the number of the holes on the two supporting tube sheets. Each hole is inserted with an inorganic high heat transfer pipe with fins on its surface. A seal flange is provided between each of the high heat transfer pipe and the partition.

Pipe boxes are provided on the outsides of the tube sheets on the box. A movable end cover is attached to the box for the purpose of replacing the inorganic heat transfer pipe. The cover is sealed with a gasket, fixed by a bolt, a nut and the pipe box.

Thermal insulating layer with a predetermined thickness is attached to the inner wall of the pipe box to reduce heat loss.

Edges of the tube sheet are welded to reinforced bars to prevent distortion.

This embodiment is related to an inorganic high heat transfer air pre-heater installed on the top of a crude heater. It comprises independent channels for the air and the smoke, which go through a set of aligned and parallel boxes, along with an intermediate sealed plate in the middle. One end of the box is connected with the smoke channel while the other end is connected with the air channel. An inorganic heat transfer tube bundle is installed in every box. A radiating fin is welded to the heat transfer pipe. Tube sheets on both sides of the box supports both ends of the pipe. The inorganic heat transfer pipes may penetrate the intermediate sealed tube sheet in the box. The surface thereof is connected with the partition in the sealed case.

A bundle of the inorganic heat transfer pipes is installed longitudinally in the box. A radiating fin is provided on the inorganic heat transfer pipe. The fin absorbs the heat and transfers it to the other end of the pipe to fully heat the cold air. Vertical endplates on both sides of the connecting box support both ends of the pipe. Each box contains an upright sealed tube sheet inside. The surface of the sealed tube sheet is connected with the sideboard of the box so that there is no leak between the air channel, the flue channel and the environment.

The smoke box of the air pre-heater is installed in the hot smoke channel of the smoke afterheat recovery apparatus. An air outlet is connected with the intake ventilator via the air channel. Heated air is directed into the smoke afterheat recovery apparatus through the air channel and the intake ventilator.

To improve the heat exchange efficiency of the inorganic heat transfer pipe, the inorganic high heat transfer tube bundle should be inclinedly installed. The side of the air cavity should be higher than the side of the smoke cavity. When the inorganic high heat transfer tube bundle is perpendicular to the supporting plate, the whole box should be tilted toward the smoke cavity. Thus, the tube bundle in the pipe box forms an angle between 3° and 20° with the horizontal plane.

The pre-heater with structure as stated above can be used as a single device. Alternatively, two pre-heaters may be combined in series or connected in parallel for application.

The workflow of the apparatus in this embodiment is described as follows: the tube bundle in the smoke cavity recovers the heat carried by the smoke. The heat is rapidly transferred to the tube bundle in the air cavity and thereby increases the temperature of the air and cools the smoke by transferring the heat to the air.

This embodiment has the following advantages in comparison with current pre-heaters with tube banks: 1) Air and smoke move as counter flows for heat exchange, contributing to high heat exchange efficiency and small heat exchanger size; 2) It is easy to clean the soot in the apparatus because of its simple structure; small smoke resistance; 3) Heat transfer pipe and tube sheet are connected together in a floating manner so that there is no thermal stress of temperature gradient therebetween caused by temperature fluctuation in operation; 4) damage caused by corrosion is rare on the heat transfer pipes; very few of the pipes are abraded; no need for shutting down the apparatus for repair; and excellent reliability.

EXAMPLE 59

This embodiment is an inorganic high heat transfer horizontal afterheat boiler. A stream-instilling boiler is the main equipment used to collect thick oil from the field. This embodiment preheats the air used as an agent in combustion in the boiler by the afterheat carried by the smoke. FIG. 5ZK schematically shows an inorganic high heat transfer air pre-heater in the stream-instilling boiler.

In this embodiment, an inorganic high heat transfer air pre-heater is installed at the smoke outlet in the counter flow section of the boiler. It heats the air used as the agent in combustion in the boiler by the afterheat carried by the smoke. The inorganic high heat air pre-heater should be inclinedly installed. The angle between the heat transfer pipe and the horizontal plane should not be smaller than 5°. The smoke side should be installed in the lower position while the airside should be in the upper position.

A ventilator for the instilling boiler should be installed between the inorganic high heat transfer air pre-heater and the burner to reduce the cold air intake channels in the air pre-heater and diminish the pressure difference between the air system and the atmospheric air to reduce air leak.

FIG. 5ZK shows the structure of the inorganic high heat transfer air pre-heater. It comprises smoke side tube sheet 2423, smoke intake 2424, inorganic high heat transfer pipe 2425, side board 2426, smoke outlet 2427, intermediate partition 2428, air outlet 2429, air intake 2430 and side air tube sheet 2431. Welding or fastening devices to form the air pre-heater box connects all parts except the inorganic high heat transfer pipes. Inorganic high heat transfer pipes 2425 penetrate the seals on the pipe and then enter the side air tube sheet 2431, the intermediate partition 2428 and the smoke side tube sheet 2423 and is floatingly connected with other three tube sheets.

The operating theory of this equipment is described as follows. Smoke enters the air pre-heater from the smoke intake 2424 and goes through the channel composed of the smoke side tube sheet 2423, the intermediate partition 2428 and the sideboard 2426. The smoke then exchanges heat with the inorganic high heat transfer pipe 2425 in the channel by transferring the heat to the tube bundle. Cooled smoke exits via the smoke outlet 2427. The inorganic high heat transfer pipe 2424 axially transfers the heat to the side air tube sheet by the inorganic high heat transfer medium therein. The air enters the air pre-heater from the air intake 2430 and goes through the channel composed of the side air tube sheet 2431, the intermediate partition 2428 and the sideboard 2426. The air then exchanges heat with the side air pipe segment of the inorganic high heat transfer pipe and heats the air by removing the heat from the smoke side. Heated air enters the boiler as an agent in combustion via the air outlet 2429.

This embodiment has numerous advantages, including: utilizing the air pre-heater to heat the air for combustion in the instilling boiler, thus, the combustion temperature of the furnace chamber is high and the fuel is combusted completely; the boiler also achieves high thermal efficiency since the afterheat produced by the boiler is recycled; the wall temperature of the inorganic high heat transfer air pre-heater is adjustable; a gate for cold air can be installed at the ventilator intake to adjust the wall temperature according to seasons and load; it can prevent dew forming on the heat exchanging surface as well as low temperature corrosion and soot accumulation; soot can be easily cleaned; the air preheater has well-arranged structure and is easy to maintain.

EXAMPLE 60

This embodiment is an afterheat water heater for instilling boilers utilizing the inorganic high heat transfer theory of the present invention. In this embodiment, water supplied from the boiler is softened and heated in the inorganic high heat transfer water pre-heater. After being deoxygenated, the pre-heated water is transported to the counter flow section in the boiler by the high-pressure plunger pump.

As FIG. 5ZL shows, the inorganic high heat water pre-heater comprises end thermal insulating layer 2432, smoke side tube sheet 2433, inorganic high heat transfer pipe 2434, smoke intake 2435, smoke outlet 2436, smoke side plate 2437, water side tube sheet 2438, water tank 2439, soft water intake 2440 and soft water outlet 2441. All the parts except the inorganic high heat transfer pipes 2434 are welded together. One end of the smoke side of the inorganic high heat transfer pipe is mounted on the smoke side tube sheet 2433. The side near the water tank 2439 is welded to the side water tube sheet 2438. The operating theory of this equipment is described as follows. Smoke enters the water pre-heater from the smoke intake 2435 and goes through the channel composed of the smoke side tube sheet 2433, the smoke side plate 2437 and the waterside tube sheet 2438. The smoke then changes heat with the surface of the inorganic high heat transfer pipe near the smoke side in the channel, transferring the heat to the inorganic high heat transfer pipe 2434. The inorganic high heat transfer pipe 2434 axially transfers the heat to the pipe sections in the water tank by the inorganic high heat transfer medium therein. Soft water enters the water tank 2439 via the soft water intake 2440 and exchanges heat with the inorganic high heat transfer pipe in the water tank on both sides. The water is heated since it receives the heat from the smoke side of the inorganic high heat transfer pipe. Heated soft water exits the water pre-heater via the soft water outlet 2441.

This embodiment has the following advantages: 1) the instilling boiler recycles the afterheat carried by smoke by the soft water pre-heater, which promotes the efficiency and reduce fuel consumption of the boiler; 2) the heat exchange area in the inorganic high heat transfer pipes on the smoke and water sides of the water pre-heater is adjustable to increase the wall temperature, prevent the formation of dew and reduce/avoid low temperature corrosion and soot accumulation; 3) each inorganic high heat transfer pipe is an independent heat conducting element, thus, the apparatus can operate safely even though one of the pipes is damaged and no water leakage will happen.

EXAMPLE 61

This embodiment is an inorganic high heat transfer afterheat boiler for heating furnaces. As FIG. 5ZM shows, several parallel pipe banks are arranged in the rectangular pipe box, namely inorganic high heat transfer pipe-pipe bank 2442. A plurality of regularly aligned holes are provided on the supporting plate for the inorganic high heat transfer pipes. The flowing directions of the water and the smoke depend on the conditions on site. As shown in the figure, the smoke flows vertically. However, the smoke flows horizontally in a horizontal boiler. Soot cleaning hole 2443 can be installed according to the amount of the soot contained in the fuel used in the furnace.

Heat exchange for water takes place outside the pipe to prevent blockage caused by incrustation in ordinary water and fire pipes. A manhole 2444 can be provided on the cylinder for the purpose of checking the conditions of incrustation and corrosion on the heat exchange pipe and the boiler drum. A high effect screen demister is installed on the top of the boiler drum to avoid the steam from carrying water droplet for better steam quality.

The inorganic heat transfer tube bundle should be inclinedly installed to ensure proper operation of the inorganic high heat transfer pipes.

The structure of the inorganic high heat transfer pipes is described as follows. The pipes are divided into the parts without fin or with fins along the high heat transfer pipe. The part without fin is installed on the waterside of the afterheat boiler while the part with fins is installed on the smoke side. The intermediate sleeve is welded to the casing of the boiler.

The workflow of this embodiment is described as follows: the tube bundle in the smoke cavity recycles the heat carried by smoke. The tube bundle in the boiler drum increases the temperature of water by transferring the heat to water for heat exchange.

This embodiment has the following advantages: 1) compact structure; 2) stable water circulation; 3) scarce incrustation; 4) the middle of the inorganic high heat transfer pipe is welded to the boiler, thus, both ends thereof can expand freely so that there is no thermal stress in operation and the weld is unlikely to be damaged; 5) each inorganic high heat transfer pipe is an independent heat conducting element, therefore, is no need for turning off the apparatus immediately for repair in case that a few pipes are damaged since no water leakage will occur and it no significant impact on heat exchange efficiency is introduced.

EXAMPLE 62

FIG. 5ZNA shows the structure of an inorganic heat transfer anti-dew-point corrosion air pre-heater, which is used to pre-heat the air used as an agent in combustion.

Most heat transfer pipes in existing air pre-heaters are made of steel. When the temperature of the pipe wall is lower than 120° C., dew occurs on the smoke side, which corrodes the pipe and shortens the service life. To tackle this problem, ND steel pipes are currently used in some pre-heaters to resist the corrosion. However, its anti-dew corrosion performance is still unsatisfactory when the temperature of smoke is lower than 150° C. due to the quality problems of the ND steel.

This embodiment provides an inorganic heat transfer anti-dew-point corrosion air pre-heater featuring excellent resistance to corrosion, long service life and high heat transfer.

The inorganic heat transfer anti-dew-point corrosion air pre-heater of this embodiment comprises heat transfer pipes, tube sheets and pipe boxes. The uniqueness is that the anti-corrosion heat pipes is formed from the organic combination of the inorganic heat transfer elements and ceramic material. The pipe comprises fin tubes and the ceramic layer on the surface of the fin tubes.

The central seal loop and holes on the intermediate tube sheet in each heat transfer pipe are sealed conically. One end of the pipe has a compressed spring, which ensures that the central seal loop always seals the holes on the tube sheet.

To tackle the problem with dew-point corrosion, this embodiment applies high heat transfer, corrosion-resist ceramic coating to the surface of the fin tube the flue channel. The ceramic material is sintered to form the anti-corrosion heat transfer tubes. Since the corrosion on the fin tubes only occurs when the smoke is at low temperature, all or some of the heat transfer pipes in the flue channel are anti-corrosion pipes. That is, these pipes may be applied only to where the smoke has lower temperature, such as the exit of the flue channel. This is to assure better heat conductivity and longer service life of the air pre-heater.

A conical seal loop is provided between the heat transfer pipe and the hole on the intermediate tube sheet to prevent the mixing of the smoke and the air caused by leakage from the hole of the intermediate tube sheet, which reduces thermal efficiency. After the pipe is fixed, the loop seals exactly the hole on the tube sheet. In order to keep the loop in place by preventing the displacement due to heat expansion, a spring is installed to one side of the heat transfer pipe so that the loops can always seal the hole. Ceramic coating can be applied to any part that might be corroded in the air pre-heater.

This embodiment has the following advantages: excellent anti-corrosion performance; long service life; large amount of recycled heat; and high thermal efficiency.

The structure and manners of implementation of this embodiment are elaborated with the attached drawings.

As FIG. 5ZNA shows, the air pre-heater may be a combined structure, namely a combination of several pipe boxes, for easy transportation and installation. This embodiment furnishes two vertically connected pipe boxes 2453 and 2456. Intermediate tube sheet 2457 and connected partition 2454 separate the box into a ventilation channel 2462 and a flue channel 2458. Smoke intake 2459 and air outlet 2461 are provided on the top of the upper pipe box; smoke outlet 2451 and air intake 2465 are installed at the bottom of the lower pipe box. The heat transfer pipe and the intermediate tube sheet are perpendicular to the tube sheets 2455, 2464 on both sides and are 10° from the horizontal plane. Soot blowing holes 2460 are provided on the upper and lower channels near the flue channel. A soot-cleaning door 2452 is provided on a side of the bottom of the lower pipe box. Heat tube 2463 is filled with the inorganic transfer medium with good heat transfer performance. Anti-corrosion heat transfer tubes are used in the lower channel as the heat transfer tubes in this embodiment (see FIG. 5ZPA) that comprises the heat tubes 2463 with fins and the ceramic layer 2466 on the fin tubes. Heat transfer tubes in the air channel of the pipe box and in the flue channel of the upper pipe box are ordinary heat transfer tubes, alternatively, anti-corrosion tubes can be used in the flue channel of the upper pipe box. A conical seal loop is welded between the middle of the heat transfer tube corresponding to the hole on the intermediate tube sheet. After the heat transfer tube is fixed, the loop exactly seals the hole on the tube sheet. As FIG. 5ZOA shows, a positioning handle 2467 is installed equally and correspondingly to tube sheet 2455 on the left side of the heat transfer tube. A spring 2469 is mounted on the handle and is fixed by a press plate 2468 and a nut 2470 penetrating therethrough. When the heat transfer tube is displaced to the right side due to thermal expansion, the tension force of the spring prevents it from such displacement. Thus, it is for sure that the seal loop always seals the hole. The spring can also be mounted on the heat transfer tube. FIG. 5ZPA schematically shows the structure of the anti-corrosion heat transfer tube of this embodiment. A ceramic coating with the thickness of 0.2 mm is applied on the surface of the heat transfer tube and the fin.

EXAMPLE 63

FIG. 5ZNB shows an inorganic high heat transfer soft water heater. In order to make the boiler system more economic, a heat recovery apparatus is often installed in the outgoing flue channel to preheat the water in the boiler. Accordingly, higher heat exchange efficiency and reduced energy consumption can be achieved. This embodiment is an inorganic high heat transfer soft water heater, which heats the soft water in the boiler by the heat carried by smoke. Inorganic high heat transfer element is adopted to enhance the efficiency in heat exchange operations.

Most afterheat boiler soft water heaters are based on water or fire pipes. Shortcomings of these boilers include complex boiler construction and numerous welds, unstable boiling and circulation of the water within the boiler, low exothermal coefficients on the smoke side; fins cannot be installed inside the pipe which results in low heat transfer rate; long starting time with large heat loss when there is no operation, and incrustation formed inside the pipe is hard to be removed.

This embodiment provides a boiler soft water pre-heater featuring high heat efficiency, small size and easy removal of incrustation. The key point about the device is utilizing the inorganic high heat transfer element for heat exchange. It has the following advantages:

Simple workflow; as shown in FIG. 5ZNB, there are a plurality sets of parallel pipe banks, namely the inorganic high heat transfer pipe bank in the rectangular pipe box with openings at both ends. A plurality of regularly arranged and connected inorganic high heat transfer pipes are provided on the boiler drum. The flowing directions of the soft water and the smoke depend on the conditions on site. As the attached figure shows, the flowing direction of the soft water is opposite to that of the smoke to facilitate heat exchange. The inorganic high heat transfer pipe banks in the smoke box are connected with in the inorganic high heat transfer pipes on the boiler drum. The number of pipe banks in the smoke box and the boiler drum is the same.

An inorganic high heat transfer element 2472 is applied to the main heat exchange surface. The inorganic high heat soft water heater is arranged horizontally. The inorganic high heat transfer afterheat soft water heater is provided on the smoke and air channels to reduce space. The inorganic high heat transfer tube bundle should be inclinedly or vertically installed. The pre-heated side should be higher than the side of the smoke cavity.

This embodiment combines perfectly the features of both flue boiler and tubular boiler. Similar to a flue boiler, the heat source end of the element is inserted into the flue channel. However, the heating area is outside the pipe. The heat sink end is in the water within the boiler drum, which is similar to the tubular boiler. The heating area is outside the pipe as well. Heat exchange for both smoke and water takes place outside the pipe and thus, soot incrustation and blockage may be avoided.

The inorganic high heat transfer element 2472 and the casing 2471 are connected by welding which can be easily done. Failure of any single element does not affect the whole operation.

The workflow of this embodiment is described as follows: the tube bundle in the smoke cavity recovers the heat carried by smoke. Then the tube bundle in the boiler drum increases the temperature of water by releasing the heat for heat exchange.

EXAMPLE 64

FIGS. 5ZNC and 5ZOC show an inorganic high heat transfer bridge double channel afterheat recovery device. As a new heat exchange approach in industrial production, the inorganic high heat transfer element will be widely applied in the future. A typical application is for vaporizing water heated by the afterheat carried by recycled industrial exhaust. This embodiment is a bridge double channel afterheat recovery apparatus, which utilizes the inorganic high heat transfer element to achieve efficient heat transfer.

This embodiment has two key points. First, the apparatus uses the inorganic high heat transfer elements as heat transferring elements for heat exchange. Second, it improves heat transfer efficiency with the unique bridge double channels structure.

Figure 52H:
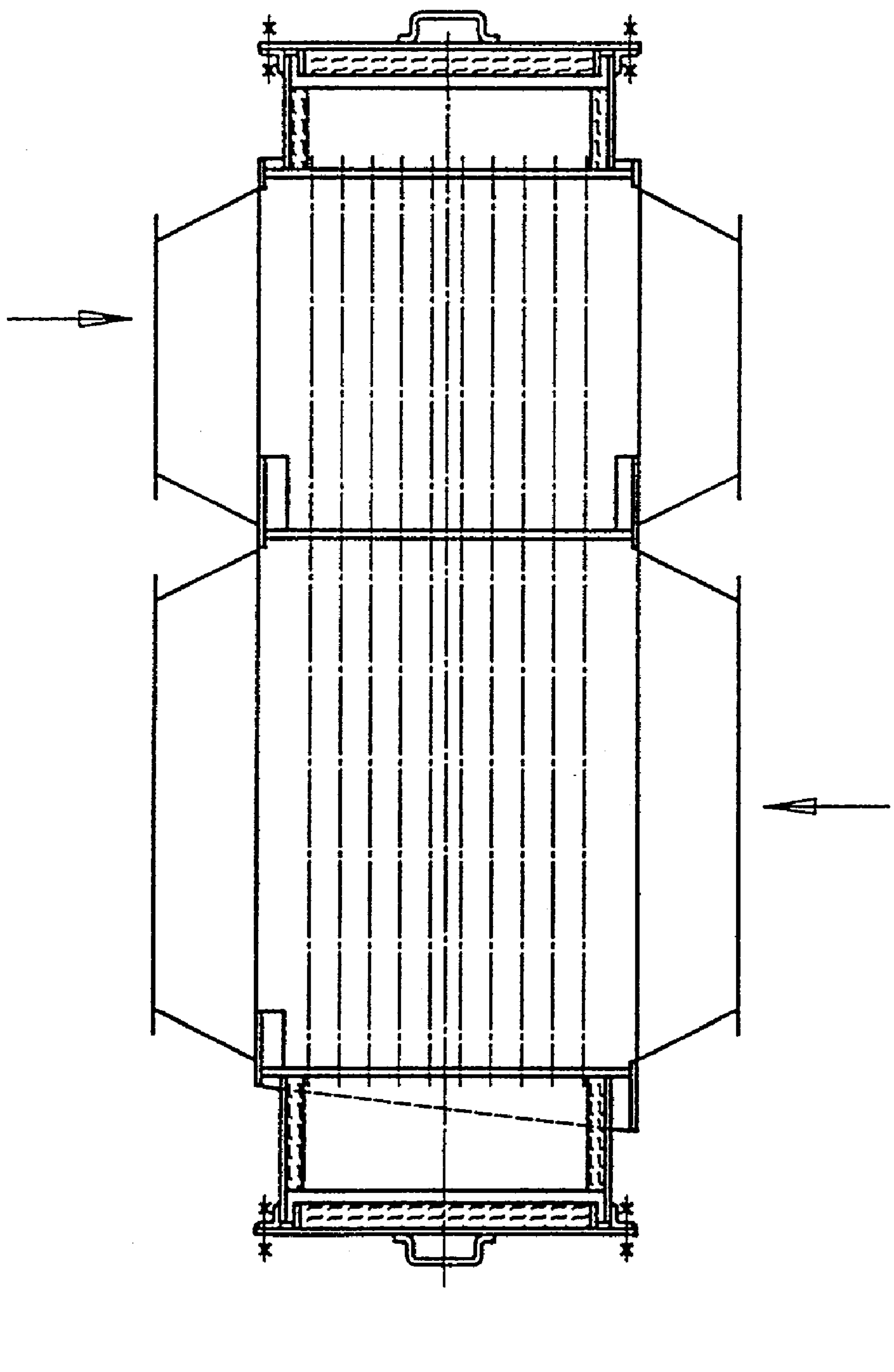
Figure 52K:
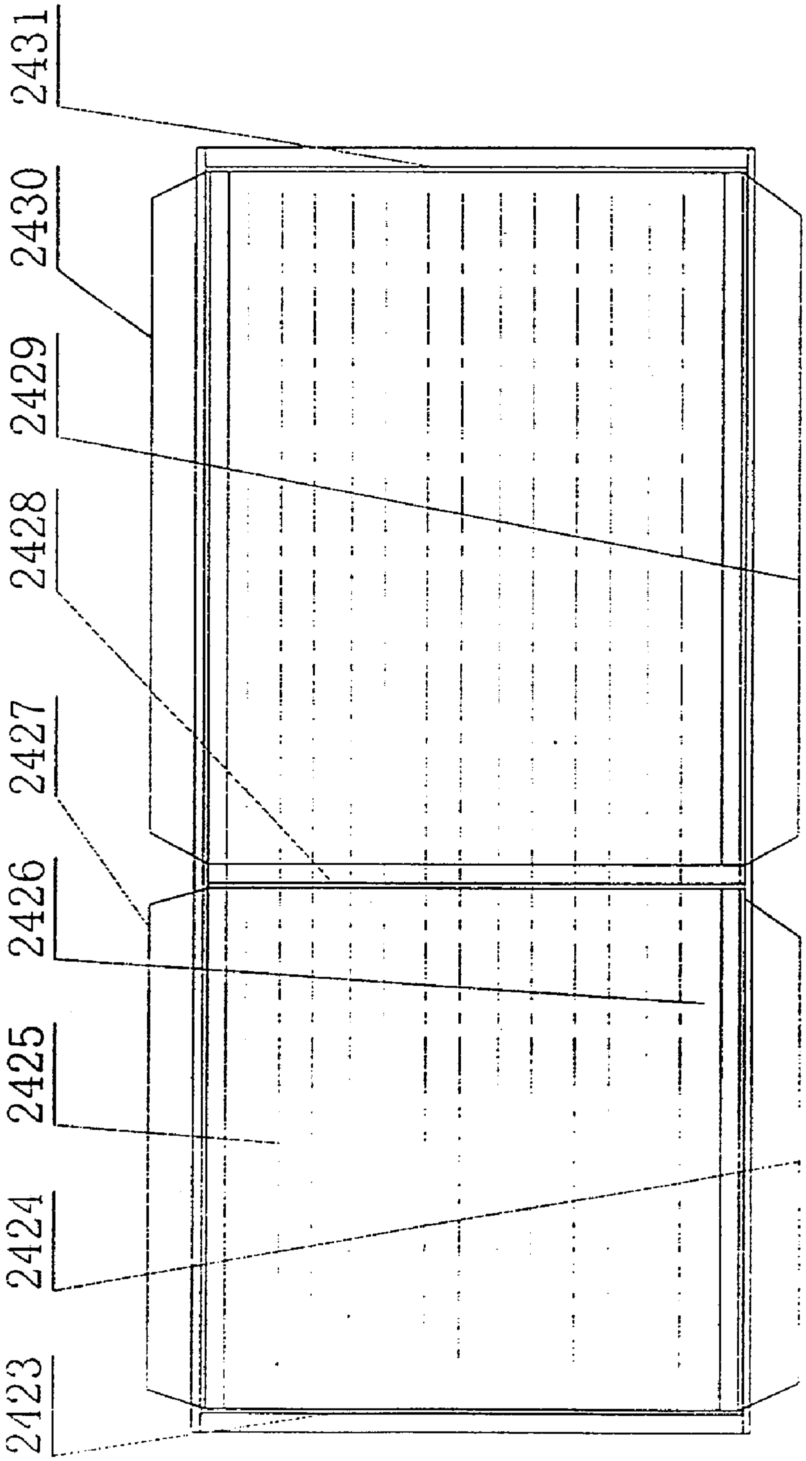
Figure 52N:
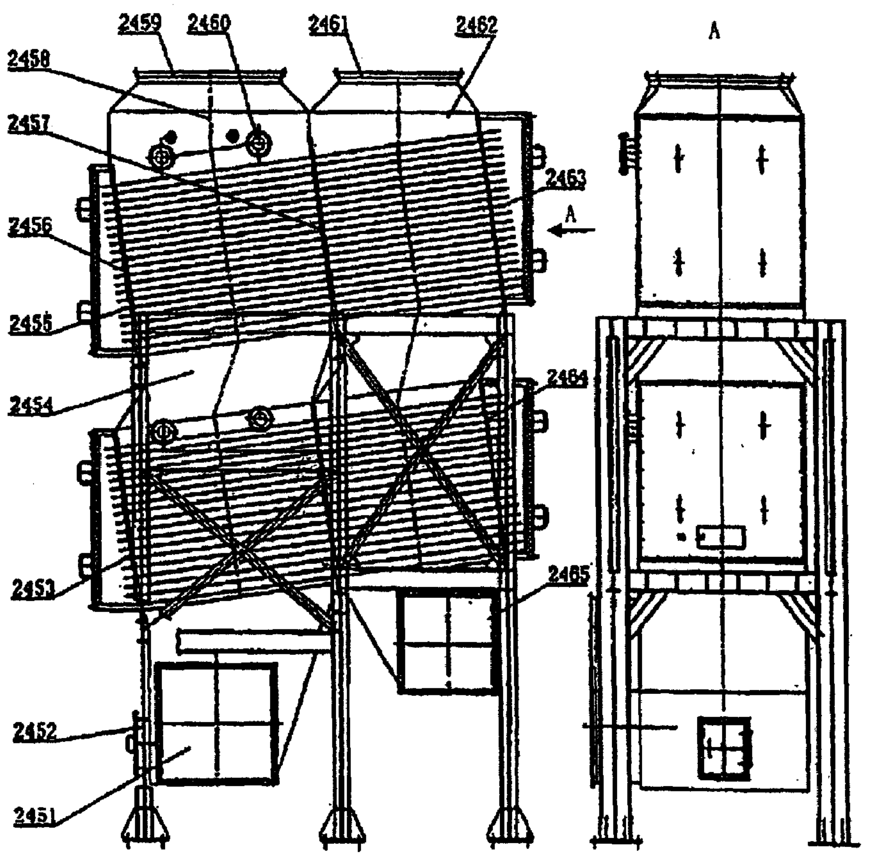
Figure 52N:
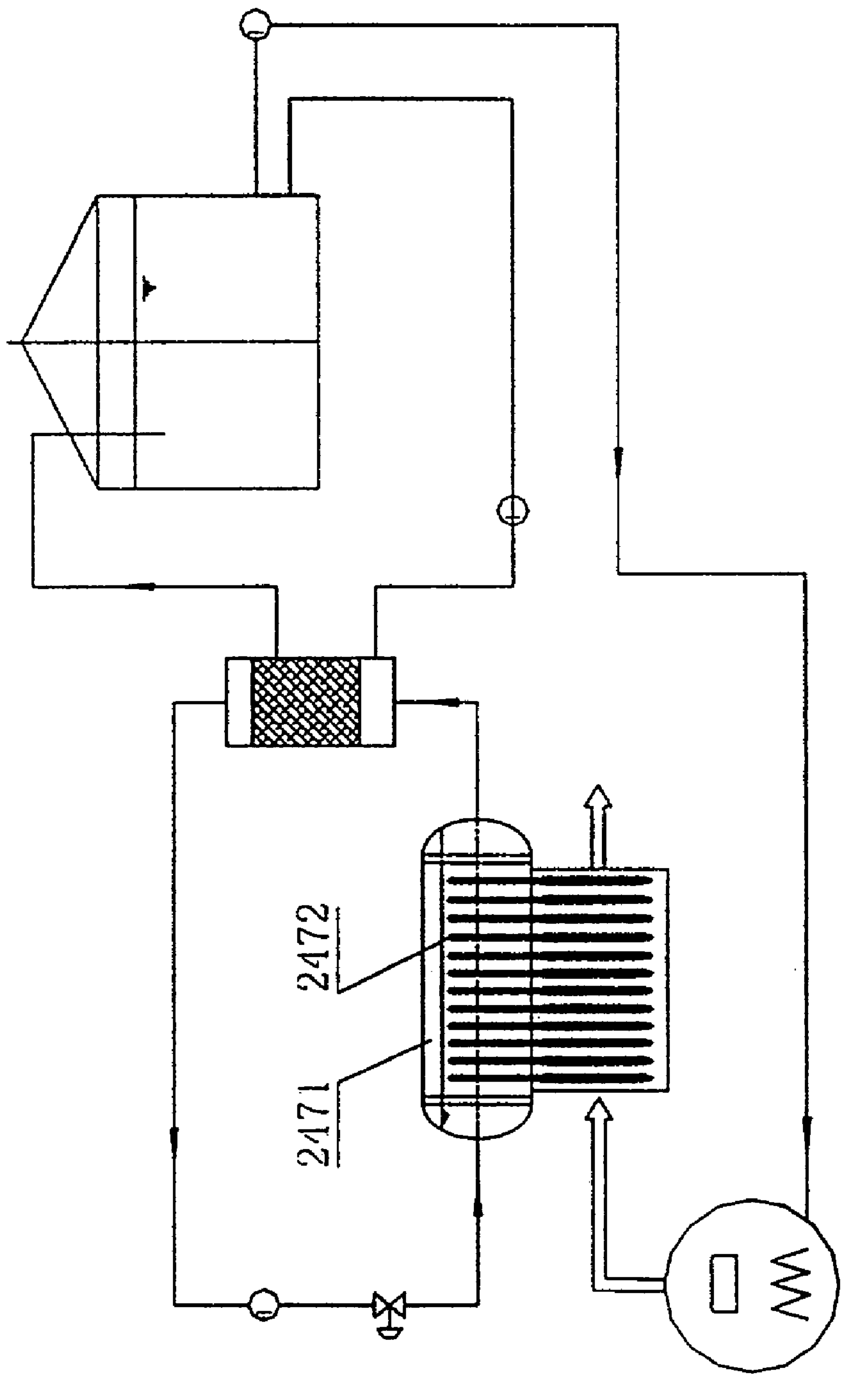
Figure 57N:
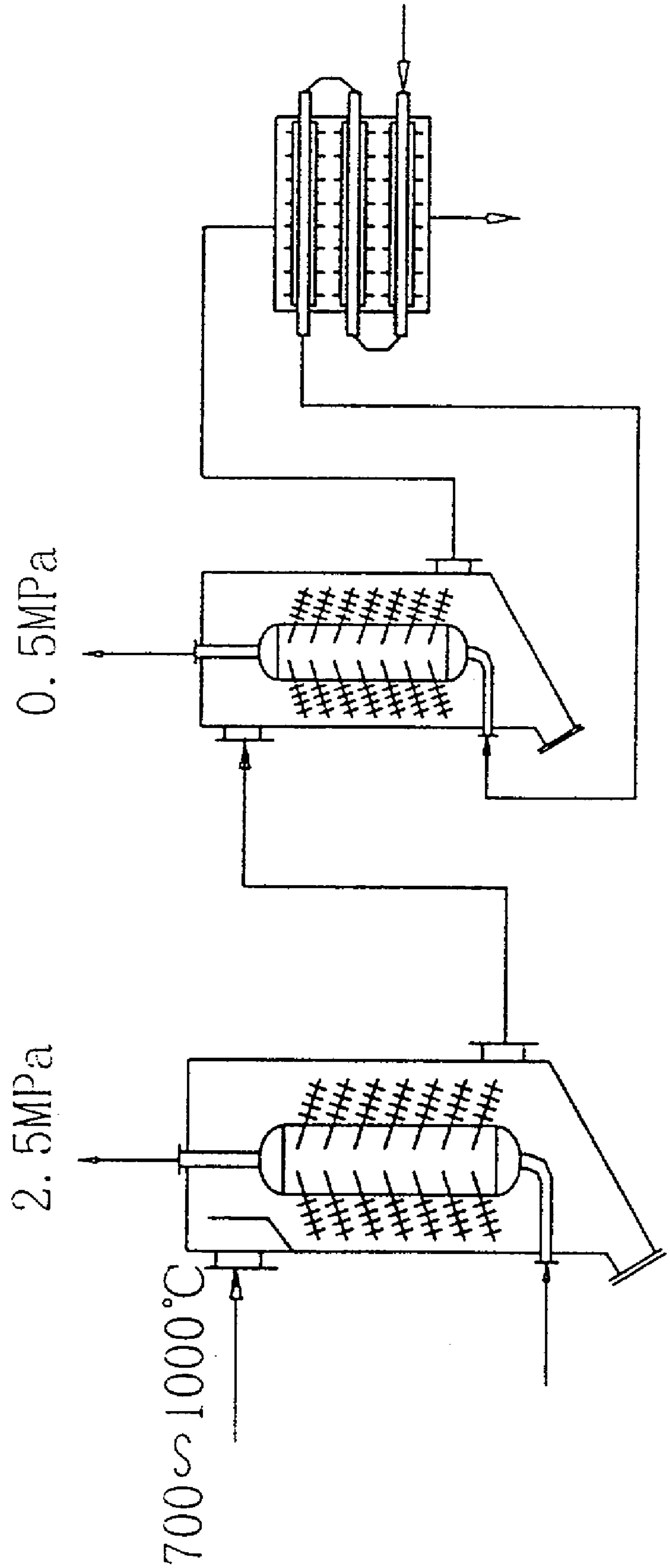
Figure 520A:
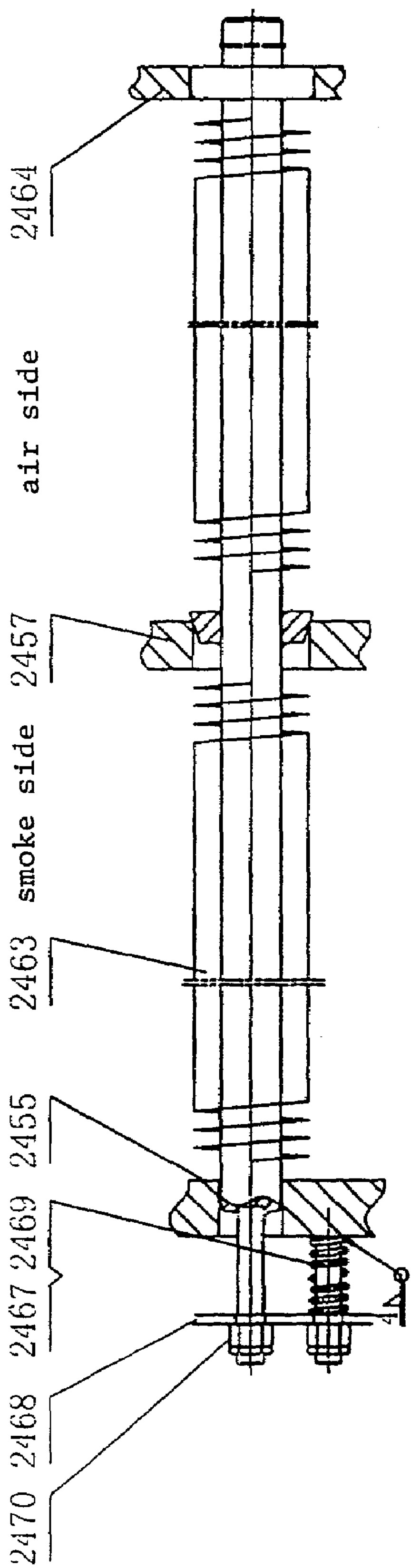
Figure 520B:
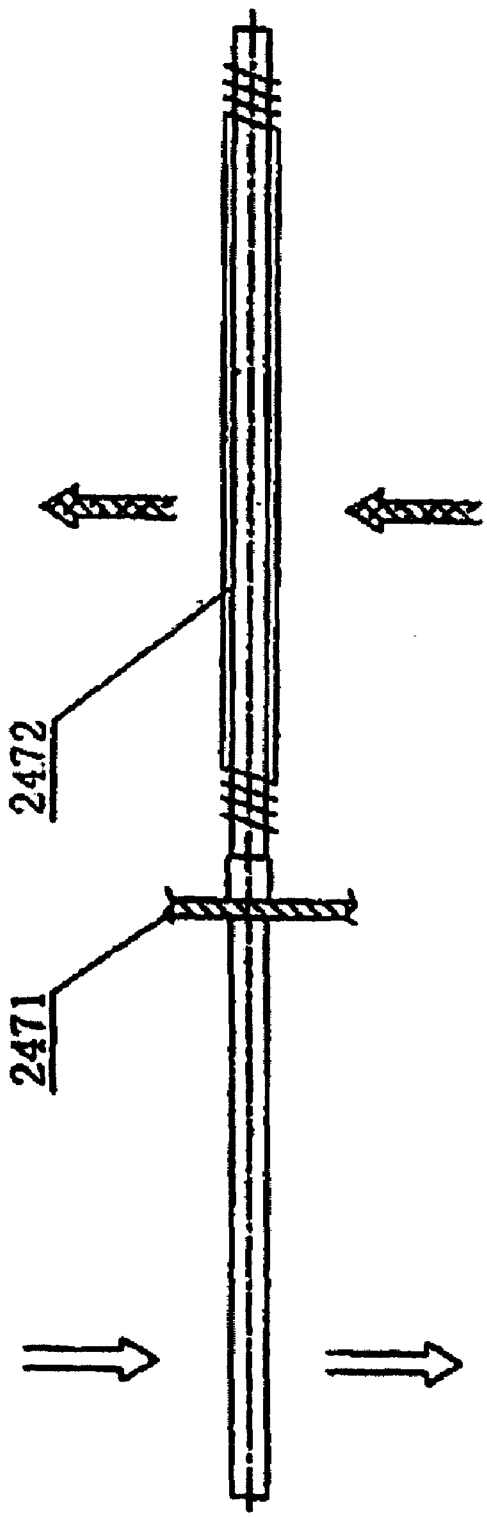

The main structure of this embodiment is shown in FIG. 52NC.

This embodiment comprises a heat sink end, including a boiler drum 2476, a low temperature water supply 2477 and a steam output 2478; together with a heat source end including a U-type channel 2473, smoke intake 2474, smoke output 2475 and an ash cylinder 2482; along with the inorganic heat transfer element. The inorganic heat transfer element produces steam by vaporizing the water at the heat sink end by the heat absorbed from the smoke at the heat source end.

This embodiment has the following features. Ordinary heat pipe afterheat recovery apparatus is saddle-type, as shown in FIG. 5ZOC. The bare pipe is inserted into the water into the boiler drum while the fin tube is inserted into the flue channel. A huge amount of smoke passes from one end to the other for horizontal cross of the fin tubes on the heat transfer element, which is fixed on the wall of the boiler drum through the intermediate sleeve. Such a structure causes considerable incrustations of soot on the smoke back side of the fins, increases thermal resistance and is harmful for heat transfer. It should also be noted that the boiler wall bears the weight of the whole element since the both ends thereof are free. Under these circumstances, the wall is easily distorted at the opening of the boiler drum where the stress is concentrated and thus, the strength and rigidity of the boiler drum is weakened. Thus, it is very unlikely to increase the number of the heat transfer elements to enhance the vaporization in the boiler. This structure is only suitable for stable operating condition instead of that with impulse heat load.

Based on the advantages of the saddle type heat recovery apparatus, this embodiment intends to improve its shortcomings. By adopting the bridged double channel structure, this apparatus comprises a boiler drum, heat transfer elements and U-type air channels (including an ash cylinder in the middle). The boiler drum is a cylinder parallel to the ground. One side of the boiler drum has a hole to supply cold water while steam travels from an outlet on the top thereof. The bare pipe section is inclined or vertical to the horizontal central line of the boiler drum. Two groups of the bare pipes are inserted into the cylinder and are connected by a U-type channel. The length of the inserted portion depends on the vaporization capacity. The fin tube and bare pipe on the element are integrated and fixed to the wall of the boiler by sleeves. The axis of the fin tube is vertical to the flowing direction of the smoke, which is parallel to the flat surface of the fin. The self-cleaning function is available since soot on the leeward side of the fins drops because of gravity. The end of the fin tube is connected to the end base while there is no ash collector in the middle and lower parts of the U-type channel. The bare pipe section of the element has a free end and is stretchable so that the wall of the cylinder is not distorted by thermal expansion. Water is boiled in a large space in the boiler, which is more suitable for the pulse heat load. The fin tube is in the U-type channel. Hot smoke vertically crosses along the axis of the inorganic high heat transfer pipe. This solves the problem with soot incrustation on fins with self-cleaning mechanism. The sectional area in the smoke intake, smoke outlet and intermediate connection in the whole U-type channel is larger and thus, the speed of the smoke flow slows down gradually and becomes the slowest in the intermediate connecting section, which makes it easier for the soot to drop into the ash cylinder. Smoke does not affect the heat transfer efficiency since its temperature is still high. Smoke without soot goes in an opposite direction (from bottom to top), and enters the straight channel with smaller sectional area. Although the temperature is lowered, the smoke flows faster to enhance the heat transfer in this area.

The smoke flowing from both sides of the U-type channel is in counter movement as one flow is above the other. The stress direction on one inorganic heat transfer element is opposite to that on the other with same amount. Thus, the combined stress acts on the wall of the cylinder is almost offset and the kinetic load is balanced to prevent system resonance due to impose load.

The end of the inorganic heat transfer element is connected to the end base, which reduces stress on the opening of the boiler drum and improves the strength and rigidity of the boiler drum. The elements are loaded in sections into the boiler so that the strength and rigidity of the boiler drum are not reduced by the holes.

EXAMPLE 65

FIGS. 5ZND, 5ZOD and 5ZPD show an inorganic high heat transfer vortex scroll heat exchanger. This embodiment improves the technique in heat exchangers by adopting the inorganic high heat transfer heat pipe elements.

Most heat exchangers produced nowadays are in rectangular or prismatic shape and installed on ordinary boilers. Large furnaces in chemical and petroleum industries, power plants and steel plants tend to produce a fair amount of smoke, such as hundreds of thousands $m^3$/hr. When there is large amount of heat exchange, it is unlikely to pile up many heat pipes on the windward of the heat exchanger because they will increase not only the resistance of smoke but also the load of the ventilator. Therefore, existing heat pipe heat exchanger is not satisfactory.

This embodiment utilizes the inorganic high heat transfer element (see figures) to form an inorganic high heat transfer vortex scroll heat exchanger, so as to enhance the heat transfer by the thermal medium.

This embodiment comprises a vortex scroll (made of welded steel plates) and a vortex heat pipe heat exchange apparatus. The vortex heat pipe heat exchange apparatus comprises partition, vortex refracting plate in the air chamber, vortex refracting plate in the smoke chamber and more than eight heat pipe heat exchange units evenly surrounding the axis of the spiral scroll. Each heat exchange unit consists more than eighty heat pipes. The edge of the partition is welded to the spiral scroll and separates the space into a smoke chamber and an air chamber. All heat pipes penetrate the partition and are welded thereon. The top of the refracting plate in the air chamber is welded to the scroll while the bottom thereof is welded to the partition. The top of the refracting plate in the smoke chamber is welded to the partition while the bottom thereof is welded to the scroll.

Smoke enters the smoke chamber via the smoke intake and produces swirling vortex around the heat pipe with the refracting plate in the smoke chamber. The vortex achieves higher heat exchange performance by extending the circulation time in the smoke chamber. Smoke eventually goes to the flue channel via the smoke outlet.

Similarly, cold air entering the air chamber via the air intake and produces swirling vortex around the heat pipe with the refracting plate in the smoke chamber. The vortex achieves higher heat exchange performance by extending the cold air circulation time in the air chamber. Cold air becomes hot and exits via the hot air outlet for various uses.

This embodiment is applicable to the afterheat recovery in large size furnaces producing a large amount of smoke and with immense heat exchange.

EXAMPLE 66

FIG. 5ZHE shows an inorganic high heat transfer air-air/air-liquid combined heat exchanger. This embodiment is a comprehensive heat exchanger combining air-air and air-liquid heat exchangers. The structural features of this embodiment reside in that the inorganic high heat transfer element is axially divided into two sections. Hot gas medium goes through the lower section, cold gas medium goes through the middle section, and cold liquid medium goes through the upper section. The whole apparatus has well-arranged structure, is easy to be installed and operated and suitable for afterheat recovery for smoke in medium and high temperature. The key point about the apparatus is utilization of inorganic high heat transfer element for heat exchange.

As FIG. 5ZE shows, the inorganic high heat transfer air-air/air-liquid combined heat exchanger comprises four parts, namely container (boiler drum), cold gas medium channel, hot gas medium channel and inorganic high heat transfer element. Hot gas medium passes through the hot gas medium channel and transfers the heat to the inorganic high heat transfer element by counter flow for heat exchange. The inorganic high heat transfer element axially transfers the heat to the exothermal section with no thermal resistance, which is divided into the gas exothermal segment and the liquid exothermal segment. Part of heat in the gas exothermal segment is exchanged to cold gas medium by means of counter flow such that the medium is heated for use. The rest of the heat keeps traveling axially with no thermal resistance and finally exchanges heat with cold liquid medium, which turns into hot liquid medium or steam for use after being heated.

This structure is suitable for heat exchange of medium/high temperature and with large amount of thermal load. The features of this embodiment lie in excellent thermal conductivity of the inorganic high heat transfer element and axial thermal load distribution in proportion. When there is large fluctuation in the thermal load of the heat exchange system, the inorganic high heat transfer element may automatically adjust the thermal load proportion to ensure that the optimal operation of the inorganic high heat transfer air-air/air-liquid combined heat exchanger in different industrial and mining conditions.

EXAMPLE 67

FIG. 5ZF is an inorganic high heat transfer synthetic ammonia gas making technique gas afterheat recovery device. Gas making section serves as the source of material supplied for ammonia synthesis in nitrogenous fertilizer plants. No matter coal or coke is used as materials in the coal-based gas making technique, or the conversion technique applying natural gas, the converted gas obtained from water gas and semi-water gas produced in conversion is called raw gas. With a high temperature between 700° C. and 1000° C., the gases must be cooled before being purified. Afterheat produced at this stage can be recycled for heating other materials.

In the traditional approach, hot gas from the gas maker or converter enters an afterheat boiler with pipe banks. Medium/high pressure steam is produced by heat exchange between the heat in the boiler and the water. Such an apparatus contains a large amount of soot and the gas usually goes through the pipe, where the soot may be cleaned regularly. The steam goes though the casing and exchanges heat with the gas in the afterheat boiler. After being cooled to 250° C. when passing the boiler, the gas is directed to the next stage, in which low pressure steam (0.5 MPa) is produced by heating the water. Since the gas, especially the water gas contains a large amount of sulfur; it often washes away the wall of the boiler drum and causes dew-point corrosion in the cooling process. Water or steam leakage due to broken pipes frequently stops the production, damages the productive continuity and safety. Another disadvantage is that the pressure of the steam produced by cooled technical gas is as low as approximately 0.3 MPa, which leads to the imbalanced system steam source due to surplus low-pressure steam and insufficient medium-pressure steam.

This embodiment applies high heat transfer capability of the inorganic heat transfer element to design a heat recovery apparatus in which medium/low-pressure afterheat boilers are connected in series with the coal saver so as to overcome the above disadvantages, make the most of high-grade heat source, and achieve the convenience in maintenance and replacement. The inorganic heat transfer element serves as a medium. The separation of hot gas and steam sides avoids the problem of water leakage due to corrosion. It also refines the steam for more efficient use of the afterheat produced from the gas.

The afterheat recovery apparatus in this embodiment utilizes the afterheat of the gas as a heat source to produce mid/low-pressure steam for the production in the synthetic ammonia system. It comprises three pieces of heat exchange equipments connected in series, namely a medium-pressure steam waste heat boiler, a low-pressure steam waste heat boiler and a coal saver.

The flowing direction of the gas is described as follows. Hot gas enters the medium-pressure steam waste heat boiler, where the temperature is cooled to 550° C. after it exchanges heat with the steam. Heated water produces steam of 2.5 MPa at 498° C., which returns to the sections of gas making or conversion for distribution. Gas of about 550° C. enters the low-pressure waster heat boiler to obtain the low-pressure steam of 0.5 MPa at 158° C., which is sent into pipe networks throughout the plant. The gas still contains low temperature afterheat when it is cooled to roughly 250° C. The heat can be used to pre-heat the water in the low-pressure waste heat boiler. That is, it is transported to the coal saver for heat exchange and then to the next process for purification. Soft water is directly directed into the low-pressure boiler after being heated in the coal saver.

After passing through three heat exchanging equipment, the heat carried by the gas is fully utilized and the gas is transported out after meeting the requirement for the next procedure.

Since the temperature of the gas source is higher in the medium-pressure waste boiler, the inorganic heat transfer elements suitable therefore should be high temperature type as the heat transfer medium. The medium-pressure boiler in this embodiment has the central circle structure. The gas flows in the external boiler drum. Ribs are provided on the surface of the heating end of the heat transfer elements for better heat transfer. A soot outlet is arranged in the lower part of the external boiler drum since the gas contains lots of soot. The steam goes through the inner boiler drum. The produced steam is directed to the equipment consuming steam after the water is separated from the steam on the top of the boiler.

The structure of the low-pressure waste heat boiler is basically the same as that of the medium-pressure waste heat boiler.

The structure of the coal saver comprises multiple sleeves. The sleeves are sealed with steel plates as the gas passes through this part. Ribs are provided on the surface of the inorganic heat transfer inner jacket tube. Water flows through the layers of jacket tubes in series. Even though the coal saver is likely to have dew-point corrosion, it can be easily maintained and replaced since it is independently installed. Hence, users may choose the applications according to their own needs.

EXAMPLE 68

FIG. 5ZNG shows an inorganic high heat transfer sulfur trioxide heat exchanger. In the process of making acids from pyrite as raw material, massive heats are produced in the chemical reactions. The heats produced include high-grade afterheat (higher than 600° C.) such as burner gas, medium-grade afterheat (150–600° C.) such as burner gas produced in conversion, and low-grade afterheat (lower than 150° C.) such as circulating acid liquids in the drying and absorbing process. Afterheat boilers are used to recycle afterheat at high and medium temperatures to produce steam, which can be used in power generation and industries. The sulfur trioxide heat exchanger recovers the afterheat at medium temperature. Sulfur dioxide gas turns into sulfur trioxide gas in oxygenation enhanced by the converter, which is exothermic reaction. The heat produced in the reaction is applied for various heat exchangers to heat up sulfur dioxide to the reaction temperature. The temperature of the obtained sulfur trioxide is about 290–300° C. as the sulfur trioxide leaves a low-temperature heat exchanger. In the past, an air cooler used to be installed between the converter and an absorbing tower to cool $SO_3$ gas with air due to technical requirement that the temperature of gas entering the absorbing tower should be between 160° C. and 170° C. However, the heated air in this system is discharged into the air and the energy is wasted. In order to recover the heat wasted in this part, an inorganic high heat transfer sulfur trioxide heat exchanger is chosen to produce steam.

The major workflow and structure:

See FIG. 5ZNG for the major workflow of sulfur trioxide afterheat recovery.

The afterheat recovery mainly involves the equipments comprising a converter, high/medium/low-temperature heat exchangers, sulfur trioxide heat exchanger, sulfur trioxide absorbing tower, steam dome, etc. A medium-temperature afterheat boiler system is built up by an inorganic high heat transfer sulfur trioxide heat exchanger, steam domes, water pumps and pipes. The heat transfer elements, in which source end and sink end are separated by a boiler drum of the sulfur trioxide heat exchanger are made of inorganic high heat transfer elements according to the present invention. Therefore, the leak on a certain element due to corrosion will not necessarily affect normal heat exchanger operation, and stopping the equipment for repairs is not needed.

FIG. 5ZOG is the structure of a heat transfer element of the inorganic high heat transfer sulfur trioxide heat exchanger.

The embodiment is structurally featured by that every single heat pipe forms an independent unit module, and multiple unit modules make a steam generator. Such design is easy to install and replace the parts; the tube nest and tube sheets for each unit are securely welded and sealed. It can replace the steam dome and double-tube-sheet structure of the sulfur trioxide cooler.

EXAMPLE 69

FIGS. 5ZNH, 5ZOH and 5ZPH all show total counter flow inorganic high heat transfer heat exchangers. Heat exchangers in current energy and dynamic engineering tend to adopt rectangular casing, which makes manufacture more complex and limits the scope of applications. In order to improve the heat transfer rate, fins are attached to heat pipes. Alternatively, a flat and straight refracting plate is added to the side with smaller flux to increase the heat exchange coefficient on this side, and to facilitate crossing the fluids with larger and smaller flux. The average temperature gradient between cold and hot fluids is eventually reduced. The flat and straight refracting plates may also caused higher losses due to local resistance.

The object of this embodiment is to overcome the shortcoming of the present technology by providing a total counter flow inorganic high heat transfer heat pipe heat exchanger in which cold and hot fluids foster counter flow. Combing advantages of ordinary heat pipe heat exchanger and casing heat exchanger, the heat exchanger of this embodiment has the following features: compact structure, high heat exchange efficiency, easy to be made, easy to be installed and suitable for various kinds of pressures and media.

The key point of this embodiment is using inorganic thermal medium for heat exchange.

The heat exchanger of this embodiment comprises a boiler drum, in which a horizontal partition divides the boiler into upper and lower parts. There are some heat pipes penetrating the partition. The heat pipes are arranged spirally. Along the spiral curve, the upper and lower parts of the boiler are both equipped with a spiral conductor.

The cold and hot fluids form counter flow in the conductors. The heat pipes carry out the heat exchange between the cold and hot fluids. Since the flowing directions of the hot and cold fluids are opposite to each other, the total counter flow exchange is achieved.

As a result, this embodiment has the following efficacies:

The installation of conductors to cold and hot fluid sides facilitates total counter flow arrangement between these fluids. It increases average heat transfer gradient between the two fluids. This arrangement improves the exchanger's performance of heat transfer and reduces the area of the exchanger with no changes in thermal load and heat transfer coefficient. It also reduces the dimension and weight of the heat exchanger, lowers costs of production and reduces row material consumption.

Since the total counter flow heat pipe heat exchanger adopts a design in swirl style, the variation in the flow direction of the fluids never exceeds 90° so the losses due to local resistance by flow thereof is less than that in the application of a flat and straight refracting plate.

The flow conductor is made of non-metal material to reduce self heat transfer in the smaller flux fluids.

The swirl flow of fluids increases heat transfer coefficient between the fluids and the heat pipes.

The casing of the total counter flow heat pipe heat exchanger could be a cylindrical shape, which is easier to make and extends the range of the applied pressure.

The structure and working principles of this embodiment are elaborated with the accompanying drawings.

As shown in FIG. 5ZOH, the heat exchanger of this embodiment comprises upper chamber 2527 and lower chamber 2537. Upper and lower chambers 2527, and 2537 are fixed to both ends of partition 2530 in the boiler through unit bolt nut 2533 and flanges 2534, 2535. There are some heat pipes 2529 penetrating the partitions 2530 while the heat pipes 2529 and the partitions 2530 are closely sealed. Upper flow conductor 2528 and lower flow conductor 2538 are installed respectively to the upper and lower parts of the heat pipe 2529. Connecting pipes 2531, and 2532 are installed to upper cylinder 2527, which is linked to the upper flow conductor 2528. Connecting pipes 2536, and 2539 are installed to lower cylinder 2537, which links to the lower flow conductor.

Referring to FIG. 5ZPH, heat pipe 2541 arranges in spiral curve. Flow conductor 2528, and 2543 are spiral-like. Both ends of the heat pipe 2541 are installed in the spiral cavity of flow conductor 2528, and 2543. A cold fluid goes into the spiral channel located in the upper cylinder 2527 via connecting pipe 2539. Crossing the sink end of the heat pipe, it absorbs heat from the vapor of medium in the heat pipe by condensation, so that the temperature of the fluid increases. The fluid then is discharged from connecting pipe 2531. On the other hand, a hot fluid enters connecting pipe 2539 and passes the lower spiral channel. Crossing the sink end of the heat pipe, it boils medium in the heat pipe. The medium lowers the temperature of the hot fluid by absorbing the heat thereof. The hot fluid then is discharged from connecting pipe 2536. The medium in the heat pipe keeps absorbing the heat from the hot fluid so as to vaporize itself. The vapor of the medium is then condensed by the cold fluid and returns to the source end. The process repeats constantly to transport continuously the heat in the heat pipes to the cold fluid. The cold and hot fluids are counterflowing so as to improve thermal conductivity of the heat pipe heat exchanger by enhancing absolute counter flow heat transfer.

EXAMPLE 70

FIG. 5ZNI shows an inorganic high heat transfer heat recovery technology used in dry coke technique. The temperature of red-hot coke discharged from the coke furnace is up to between 1000° C. and 1500° C. Fire should be put out as soon as possible to prevent the coke from combustion in air due to oxygenation. The traditional cooling approach, which sprays water on the coke to lower its temperature to 100° C., takes 1–1.5 ton of water for one ton of coke. The cooled coke contains water by 4–6%. The heat of coke in the cooling process is dissipated to the atmospheres in the form of steam, which carries a considerable amount of soot and hazardous gas into the atmospheres and thus pollutes the environment. The dissipated heat carried by the coke is also wasted.

Nowadays the dry coke technique has been adopted to reduce water consumption and pollution by recycling heat produced in coke cooling.

The accompanying drawing (5ZNI) shows the process of dry coke technique. Coke directors, coke containers, coke carriers and elevating machines are used to load red coke into the dry coke tank, where coke is left for two to three hours and cooled by inert gas to below 250° C. The discharger sends coke from the bottom of the apparatus while inert gas is discharged from the top after being heated to 600–850° C. After soot is removed from the gas in a settler, the gas enters the afterheat boiler. The temperature of the gas can be reduced to 200° C. after it goes through the afterheat boiler. The gas then goes from the ventilator, soot remover and back to the dry coke tank as a cycle.

The heat in amount of $1.34\times10^{6}$ KJ/ton coke can be recycled as the temperature of the coke reduces from 1050 to 250° C. 0.45 ton of stem per ton of coke is produced.

Dry coke approach refines the quality of coke with an increase in coke drum index M40 by 8% and a decrease in M10 by 5%. Coke contains less than 0.3% of water and the coke particles are homogenous, which helps in improving furnace production standard. This approach also surpasses the cooling by water spraying because of not polluting the atmospheres.

What is applied in the dry coke technique currently is conventional water pipe afterheat boilers. Such kind of boiler is very big and expensive, and leads to significant resistance losses and complex maintenance procedure.

On the other hand, the afterheat boiler adopting inorganic high heat transfer element has the following advantages in comparison with traditional water pipe afterheat boilers:

The weight of this boiler is only ⅓ to ⅕ of that of the traditional water pipe boiler; its size is only half to ⅓ of the water pipe boiler;

Resistance produced by smoke passing the afterheat boiler is only ½–⅓ so the ventilator consumes less energy; and Even though part of inorganic high heat transfer elements are damaged, it does not affect the operation of the afterheat boiler so there is no need for stopping the boiler for maintenance. *****

Compared with ordinary heat pipes, the inorganic high heat transfer element has the following advantages:

Great heat transfer capability: axial heat flux density is up to 27.2 KW/m$^2$; radial heat flux density is up to 158 MW/m$^2$;

Wide range of operating temperature: the range of temperature of medium suitable for the inorganic high heat transfer element is between −60° C. and 1000° C.;

Long useful life of more than 110,000 hours;

It is not cracked when the temperature drops below 0° C. so it is not necessary to consider issues about the thermal insulation of the pipes;

The tubular wall can bear higher temperature than ordinary pipes do so they do not blow up; and Excellent thermostatic feature, preventing dew-point corrosion caused by smoke.

The afterheat recovery apparatus with inorganic high heat transfer elements has achieved excellent performance in applications to large furnaces in steel industry such as blast furnace, sintering machine and steel heating furnace.

In dry coke technique, the temperature of the gas entering the afterheat boiler is between 650° C. and 800° C. while the temperature at the smoke intake in the steam generating apparatus is the same. Therefore, as far as the factor of temperature is concerned, there should be no problem with the application of the inorganic high heat transfer afterheat recovery technology to dry coke technique. As a result, the development of afterheat recovery of dry coke will have a promising future.

EXAMPLE 71

FIGS. 5ZNJ, 5ZOJ and 5ZPJ all show inorganic high heat transfer air pre-heaters in furfural refiner. This embodiment is an air pre-heating device using heat carried by hot smoke discharged from the furfural refiner furnace to heat air there. Inorganic high heat transfer element is adapted to enhance effective heat exchange as stated above.

It is necessary to pre-heat the air about going into the furnace to save fuel and improve the performance of the furnace. Normally the air is preheated by heat exchanging between the hot smoke from the blast furnace and relatively cold air.

Most of the present pre-heaters are the ones with pipe banks, which have a disadvantage of low heat exchange efficiency. In order to heat air up to the required temperature, the dimension of the heat exchanger must be increased. Moreover, it is difficult to remove soot in the heat exchanger.

The object of this embodiment is to provide an air pre-heater featuring high heat efficiency, small size and ease of removing soot.

The embodiment is mainly related to using the inorganic high heat transfer element for heat exchanging.

The air pre-heater of the furfural refiner furnace is composed of a pipe box, which is a frame structure. The pipebox is separated into two cavities (left and right) by an intermediate tube sheet. The inorganic high heat transfer pipe penetrates the box horizontally via the hole on the intermediate tube sheet. Sealed flanges are used to separate the left cavity from the right one. Air goes through the right cavity, which is a sink end while smoke goes through the left cavity, which is a source end. Both ends of the element are supported by two tube sheets on both sides, which are parallel to the tube sheet in the middle. As shown in the schematic drawing indicated below, air intake pipe 2564 is installed to the top of the air cavity and air outlet pipe 2565 to the bottom of it. Smoke intake pipe 2566 is installed to the bottom of the smoke cavity and smoke outlet pipe 2567 on the top (see FIG. 5ZOJ). Inorganic high heat transfer pipe comprises metal tube 2568 (FIG. 5ZPJ) and a fin 2569 (FIG. 5ZPJ) on the outer surface of wall of the tube 2568. There is a sealed flange 2570 (FIG. 5ZPJ) between each pipe and tube sheet.

To ensure proper operation of inorganic heat transfer pipe, the side of air cavity should be higher than that of the smoke cavity. A soot blower 2571 (FIG. 5ZNJ) is installed in the smoke cavity. The top of the cavity is sealed and there are several air holes on the wall of the blower so that the blower port 2567 (FIG. 5ZOJ) and external pressurized air pipe can be linked together. A thermal insulating layer 2572 (FIG. 5ZNJ) is installed on the wall of the pipe box.

The workflow thereof is as follows: the tube nest in the smoke cavity recovers heat carried by smoke; then the tube nest in the air cavity increases the temperature of air by sending heat to it.

EXAMPLE 72

FIGS. 5ZNK, 5ZOK and 5ZPK all show the inorganic high heat transfer air pre-heater in inorganic high heat transfer constant depressurizing devices in refinery, according to the present invention. This embodiment exemplifies an air pre-heating device using heat carried by hot smoke discharged from the depressurizing device furnace to heat joint air entering the furnace. The inorganic high heat transfer element according to the present invention is adapted to enhance effective heat exchange as stated above.

It is necessary to pre-heat air going into the furnace to save fuel consumption and improve the performance of the furnace. Normally air is preheated by heat exchanging between hot smoke from the blast furnace and cold air.

Most of the pre-heaters is the ones with pipe banks which have the disadvantage of low heat exchange efficiency. Therefore, the dimension of the heat exchanger must be sized up to heat air up to the required temperature. In addition, it is difficult to remove soot in the heat exchanger.

The object of this embodiment is also to provide an air pre-heater featuring high heat efficiency, small size and ease of removing soot.

The embodiment is related to using the inorganic high heat transfer element for heat exchanging.

The air pre-heater of the depressurizing device furnace is composed of a pipe box, which has a frame structure. The pipebox is separated into two cavities (left and right) by an intermediate tube sheet. The inorganic high heat transfer pipe penetrates the box horizontally via the hole on the intermediate tube sheet. Sealed flanges are used to separate the left cavity from the right one. Air goes through the right cavity, which is a sink end while smoke goes through the left cavity, which is a source end. Both ends of the element are supported by two tube sheets on both sides, which are parallel to the tube sheet in the middle. Direction of air and smoke flows depends on the condition on site. The attached drawing shows that air intake pipe 2573 (FIG. 5ZOK) is installed at the bottom of the air cavity while air outlet pipe 2575 (FIG. 5ZOK) is installed on the top of the smoke cavity. Smoke outlet pipe 2576 (FIG. 5ZOK) is installed at the bottom. Inorganic high heat transfer pipe comprises metal tube 2579 (FIG. 5ZPK) and fin 2580 (FIG. 5ZPK) installed on the outer surface of the wall of the tube 2579. Seal flange 2581 (FIG. 5ZPK) is installed between each high heat transfer pipe and the tube sheet.

To ensure proper operation of the inorganic heat transfer pipe, the side of air cavity should be higher than that of the smoke cavity. A soot blower 2582 (FIG. 5ZNK) is installed in the smoke cavity. The top of the cavity is sealed and there are several air holes on the wall of the blower so that the blower port 2576 (FIG. 5ZOK) and external pressurized air pipe can be linked together. A thermal insulating layer 2582 (FIG. 5ZNK) is installed on the wall of the pipe box.

The workflow of this embodiment is as follows: the tube nest in the smoke cavity recovers heat carried by smoke; then the tube nest in the air cavity increases the temperature of water by sending heat to air.

Applications of Energy Collecting Systems in Heating

The following Examples 73 to 87 show applications of the heat transfer elements used for heating in energy collecting systems, such as solar collectors and geothermal collectors. Apparatuses include solar water heater, solar hot blast tool, solar collector tube, solar collector plate, geothermal collecting apparatus, geothermal steam boiler, geothermal water temperature heater, geothermal water-air heater, inorganic high heat transfer geothermal power generating system, inorganic high heat transfer low temperature geothermal heating system, inorganic high heat transfer solar construction heating system, high heat transfer solar water heater to be installed on the balcony, plate inorganic high heat transfer solar water heater, medium heat storage device and high heat transfer solar energy collector plate.

EXAMPLE 73

The present invention furnishes a solar water heater, as shown in FIG. 6A. It comprises double-layer vacuum glass heat collecting tube 604, water tank (pressure-resist) 607 and inorganic high heat transfer element 611. The internal wall of the tube 601 thereof serves as a heat collecting layer. The inorganic high heat transfer element 611 goes through a heat absorbing plate, such as ω-type heat absorbing aluminum board 614. The element comes into close contact with the inner wall of the double-layer vacuum glass heat collecting tube 604 while the other side of the tube is in the water tank to convert solar energy into thermal energy.

To be more specific, the double-layer vacuum glass heat collecting tube 604 collects heat when penetrating the internal wall of the vacuum tube 601, reaching a high temperature of 300° C. The inorganic high heat transfer element 611 goes through the U-type heat absorbing aluminum board 614 and comes into close contact with the inner wall of the double-layer vacuum glass heat collecting tube 604. Exposed part of the inorganic high heat transfer element 611 inserts into the pressure-resist water tank 607. Connectors are jointed with water-proof sealing valve for water-proof nipple connection. Pressure-resist water tank 607 is based on a sandwich structure, which is filled with thermal insulating layer 610. Safety valve 609 is installed at the bottom to prevent explosions caused by pressurized steam due to overheated water in the water tank. Water intake 608 and water outlet 606 are installed on both sides at the bottom of the pressure-resist water tank 607 to link to water used in the cold-water source through pipes. Water thermal sensors, scale sensors and electric heating elements can be installed in the water tank. In this case, water can be heated with electricity in regions with short daytime for adequate hot water supply. A variety of water tank support 613 and heat collector support 603 are available according to different positions of installation. Reflecting plate 605 is installed under the double-layer vacuum glass heat collecting tube 604. It accomplishes in maximal use of sunlight through reflection.

EXAMPLE 74

This embodiment according to the present invention is a solar hot blast tool (see FIG. 6B), which mainly comprises solar energy collecting segment 622 and air heating segment 616. The solar energy collecting segment 622 comprises sets of vacuum heat collectors 619 with inorganic high heat transfer element tube 623 inside as well as arc polish reflector 620. The air heating segment is a box with inserted inorganic high heat transfer element tubes. Air enters the box from one side 617 and exits from the other side 615. The vacuum heat collector 619 collects solar radiant energy going through the inorganic high heat transfer element 623.

Heat is then passed from the solar collecting segment to the air in the heating segment 616.

The inorganic high heat transfer solar hot blast tool can be an integrated combination in terms of structure, also known as integrated structure. Solar energy collecting segment 622 is under air heating segment 616. These two parts are separated by a partition. The hot blast tool may be placed in a leaning position wherever there is sufficient sunlight. Heat collection and heating in the apparatus operates synchronically. The air ventilator supplies cold air while hot air is distributed to users through pipes. Since heat transfer coefficient at the air heating segment is small, ribs may be applied to the surface of the inorganic high heat transfer tube in the present invention for larger heating area.

If the tool cannot be positioned as a whole due to limited space, the solar energy collecting segment 622 and air heating segment 616 can be installed separately, namely in a separated structure. In this case, the solar energy collecting segment 622 is placed where there is sufficient sunlight while the air heating segment 616 is placed in a higher place indoors. The two parts are lined together with inorganic high heat transfer element 623, which features rapid heat transfer and better thermostatic effect. The thermal insulating surface is called thermal insulating segment 625. Heat received by the solar energy collecting segment 622 travels quickly to the distant air heating segment 616. The cold air sent by the ventilator is heated up when it passes the inorganic high heat transfer element 623. The heated air is distributed to users through pipes. To reduce resistance, the ventilator can be placed as close to the air heater as possible according to conditions on site. Ribs are installed onto the side board of the inorganic heat transfer element 623 on the air side.

EXAMPLE 75

The present invention also furnishes an inorganic high heat transfer vacuum tube of the solar water heater as shown in FIG. 6C. As part of the solar energy processing apparatus, it is used exclusively to receive solar radiant energy and is called heat collecting segment 626. It comprises an array of vacuum tube nest with inserted inorganic high heat transfer elements with heat collecting lugs 628 together with arc polish reflector. Vacuum tube 630 is made of special glass; inorganic high heat transfer elements coming in a tube structure is made of copper. The side of the element inserting into the vacuum heat collector stands for heating end 629 while the other side is called cooling end 624. The cooling end extends to another part of the solar apparatus, i.e. heat receiving segment 625. When the vacuum heat collector (heat collecting segment 626) is placed in a leaning position under sufficient sunlight, the inserted inorganic high heat transfer elements 629 absorb solar radiating heat, which comes through the vacuum tubes on the surface of the apparatus. Featuring excellent thermal conductivity and thermostatic performance, the element transports rapidly absorbed heat to the heat receiving segment 625.

Heat collectors based on tube structure have better performance in terms of tracking and receiving solar radiating beams in various directions. By applying inorganic high heat transfer elements, heat received at the heat collecting segment 626 is soon transported to the heat receiving segment 625. This promotes the use rate of heat received to a great extent. Heat collecting lug 633 and arc polish reflector can also be applied to reflecting light not absorbed by inorganic high heat transfer elements to the tube wall so that the element can absorb it again, which improves the access rate of solar energy. Adopting a gravity-type structure without a tubular core, the inorganic high heat transfer element is self-locked when the temperature of the heating segment is lower than that of the cooling one.

Rib 645 may also be installed to the cooling end of the inorganic high heat transfer element to transport heat promptly to the cold source.

EXAMPLE 76

This embodiment illustrates a plate inorganic high heat transfer solar water heater 644 according to the present invention, as shown in FIG. 6D. For exclusively receiving solar radiant energy, it normally serves as the heat collecting segment of the solar energy apparatus. It comprises hollow cavity (e.g. rectangular) filled with inorganic high heat transfer medium 643. Its radiation receiving surface 642 may range from a flat surface to a camper in order to help the heat collector receive solar radiating beams in all directions to the maximal extent and facilitate better performance in tracking sunlight. Plate type inorganic high heat transfer solar collector 644 can receive solar radiation directly and convert it into thermal energy when being placed in a leaning direction under the sun.

The heat collecting segment and heat receiving segment in solar energy apparatus are linked together and separated with a partition. The structure is called an integrated structure. Efficiency in using solar energy depends on the process of heat receiving, dissipation and exchange. Sometimes there is a need for long-distance thermal transmission so distance between the heat collecting segment and the heat receiving segment is long. This embodiment realizes such demand by applying inorganic high heat transfer elements. An array of inorganic high heat transfer pipes are installed between and linked to both the heat collecting segment and heat receiving segment.

EXAMPLE 77

The inorganic high heat transfer element of the present invention can also be used to collect geothermal energy. Geothermal energy comes in various forms as it can be collected in seawater, river, hot spring, etc. Backwater has better competence in continuous heat supply at the heat source and larger heat transfer coefficient because of fluidity or rapid heat supply. The structure of heat collecting apparatus is simpler since the collecting segment comprises only several single straight tube inorganic high heat transfer elements. This is the heating segment 629 of the inorganic high heat transfer element. When it is plugged into flowing water, heat from warm water is soon transported to the distant heat receiving segment 625 through the element. The heat receiving segment in geothermal energy apparatus is cooling end of the inorganic high heat transfer element 624. When heat is transported to distant destination, the inorganic heat transfer element can be extended by adding another heat insulating segment 630, which is the transmitting part of the element. There will be no heat loss to affect heat transfer efficiency if this segment is well insulated. (See FIG. 6E(a))

Soil heat collection has a problem with poor continuous heat supply at the heat source and lower heat transfer coefficient, so that rib 645 should be added to the inorganic high heat transfer element of the heating end 629 in the warm water collector in the geothermal collecting apparatus. (See FIG. 6E(b))

EXAMPLE 78

The present invention also provides an inorganic high heat transfer geothermal steam generating system, as shown in FIG. 6F. It comprises heating well or oil/gas waste well 632, separate type inorganic high heat transfer afterheat heat exchanger 633, storage container 634, steam generator 635, safety valve 609, leveler 636 and water intake 637. The installation of the separate type inorganic high heat transfer afterheat heat exchanger is described as follows. One serves the heating end in the hot or oil gas waste well; the other is the cooling end in the container. Both are linked together with a connecting pipe. A system modeled on a steam boiler comprises container, steam generator 635, safety valve 609, leveler 636 and water intake 637. Water in the container becomes liquid of low boiling point after a certain solute is added it. The liquid vaporizes after being heated, producing low-pressure steam. Filtered by the screen demister in the steam dome, the steam is sent to users via distributing pipes.

EXAMPLE 79

The present invention also provides an inorganic high heat transfer geothermal water temperature exchanger as shown in FIG. 6G. It comprises three parts: heat collecting segment 626, heat insulating segment 630 and heat receiving segment 625. The heating segment 629 on the inorganic high heat transfer element absorbs heat from water in the heat collecting segment 626. Heat is transported from the transmitting end 631 in the heat insulating segment 630 to the heat receiving segment 625. Cooling end of the inorganic high heat transfer element 624 sends heat to cold sources in contact with it in the heat receiving segment, such as cold water.

EXAMPLE 80

The present invention also furnishes an inorganic high heat transfer geothermal air heater as shown in FIG. 6H. This embodiment uses the inorganic high heat transfer element of the present invention to absorb thermal energy from geothermal heat, which is given to cold air to heat it.

In this embodiment, geothermal water uses heat receiving segment 625 is the geothermal water-air heater. The inorganic high heat transfer element in the heater must heat cold air entering the heater by passing heat to it. The heat receiving segment 625 is exactly cooling end of the inorganic high heat transfer element 624. Ribs may be added to the cooling end of the inorganic high heat transfer element of the present invention since the counter flow heat exchange coefficient between air and inorganic high heat transfer element is comparably small while it requires large heating area. When cold air crosses inorganic high heat transfer elements with ribs, its temperature rises as it receives heat. The heated air is distributed to users through the other end.

EXAMPLE 81

The heat transfer element of this embodiment can be used in energy collecting system, particularly in the inorganic high heat transfer geothermal power generating system. As FIG. 6I shows, the inorganic high heat transfer geothermal power generating system comprises separate type inorganic high heat transfer afterheat heat exchanger 650, heating well or oil/gas waste well 651, vaporizer 652, expansion pump 653, compressor 654, condenser 655, circulating pump 656, condenser 657 and power generating module of the team turbine 658. The separate type inorganic high heat transfer heat exchanger as described above serves as the core of the inorganic high heat transfer geothermal power generating system. It is mainly used to collect and transmit geothermal energy in the system. The apparatus achieves safe and reliable operation of distant thermal transmission, in which massive heat goes through an extremely small area without any extra driving force.

The installation of the separate type inorganic high heat transfer afterheat heat exchanger 651 is described as follows. One serves the heating end in the heating or oil gas waste well 651; the other is the cooling end in the vaporizer 652. Both are linked together with a connecting pipe. Heat in the heating or oil/gas waste well 651 continuously travels to the vaporizer 652. The heat pump system is the circuit composed of vaporizer 652, condenser 655, compressor 654 and expansion pump 653. The circulating power generating system of low boiling point medium comprises condenser 655 in the heat pump system, power generating module of the team turbine 658, condenser 657 and circulating pump 656. Liquid in the heat pump system vaporizes after it absorbs heat as it passes by; circulation caused by condensation and heat release heats liquid in the condenser. Medium of low boiling point is applied to condenser 655 in the heat pump system, which serves as a boiler filled of low boiling point. Steam produced there enters the power generating module of the steam turbine via pipes to power on the turbine for electricity generation.

The inorganic high heat transfer geothermal power generating system in this embodiment has the following advantages: efficient use of geothermal energy; environmental protection and reduction of energy consumption; the above described and shown heat transfer of inorganic high heat transfer elements is uni-direction, i.e. heat can only travels one way from the heating segment to the cooling one, not in both ways; the use of heat pump explores possibilities of the development of geothermal energy of low temperature; the adopted circulating power generating system of low boiling point medium utilizes low-grade heat efficiently.

EXAMPLE 82

The heat transfer element of this embodiment can be used in energy collecting system, particularly in the inorganic high heat transfer low temperature geothermal heating system. As FIG. 6J shows, the inorganic high heat transfer geothermal power generating system comprises heat well or hot spring 659, separate type inorganic high heat transfer afterheat heat exchanger 660, vaporizer 661, compressor 662, condenser 663, expansion pump 664, high hot water tank 665, nozzle 666, water pipe 667 and indoor heating system 668. The separate type inorganic high heat transfer heat exchanger as described above serves as the core of the inorganic high heat transfer low temperature geothermal heating system. It is mainly used to collect and transmit geothermal energy in the system. The apparatus achieves safe and reliable operation of distant thermal transmission, in which massive heat goes through an extremely small area without any extra driving force.

The source and sink ends in the separate type inorganic high heat transfer heat exchanger 660 are separated. One serves the heating end in the heating well or hot spring 659; the other is the cooling end in the vaporizer 652. The position of the apparatus is adjustable, depending on actual conditions on site. The lift pipe and lower pipe go between the heating and cooling ends, constructing a circular circuit.

Heat in the heating well or hot spring travels continuously into vaporizer 661, which achieves distant thermal transmission by heating water without any extra driving force. This exchanger also accomplishes safe and reliable operation and does not pollute water. The heat pump system is the circuit composed of vaporizer 661, condenser 663, compressor 662 and expansion pump 664. The warm water passing the heat pump is heated as it absorbs heat in vaporization and release heat in condensation in the process of circulation. The pump distributes heated water to users' heating and water system to meet their needs for heating and hot water.

The inorganic high heat transfer low temperature geothermal heating system: efficient use of geothermal energy; environmental protection and reduction of energy consumption; the above described and shown heat transfer of inorganic high heat transfer elements is uni-direction, i.e. heat can only travels one way from the heating segment to the cooling one, not in both ways; the use of heat pump explores possibilities of the development of geothermal energy of low temperature.

EXAMPLE 83

The heat transfer element of this embodiment is designed for the applications in energy collecting system, particularly in the inorganic high heat transfer rate solar construction heating system. The system is shown in FIG. 6K, comprising indoor heating system 669, solar energy collector 670, storage container 671, heat storage 672 and heat pump 673. Solar energy container 670 is the key equipment in the solar construction heating system. To ensure proper operation of the inorganic high heat transfer elements, the collector should tilt in installation. In other words, the cooling section should be higher than the heating section on the other side as the whole solar collector forms a downward tilting angle roughly equivalent to the latitude in the local area.

The solar energy collector 670 can be either in pipes (as shown in FIG. 6L) or of a slab-warping style (FIG. 6M). The solar collector tube in FIG. 6L comprises tube clip 674, inorganic eat transfer tube 675, heating segment 676, plate heat collector 677, thermal insulating layer 678, base 679 and cooling segment 680. The slab-warping solar collector in FIG. 6M consists of thermal insulating layer 681, fin plate 682, partition 683, flange 684, cooling segment 685 and heating segment 686.

The outer surface of the heating segment of the solar energy collector 670 is coated with selected material. Alternatively, the inner surface is plated with gold to turn it into a reflex mirror. Then the heat travels from the cooling segment to the water in the container. When the heating segment is exposed to the sunlight, the coating or partition absorbs radiant heat from the sun and passes heat to the cooling segment via medium to heat water in the container. Hot water is transported and stored to heat container. The compressive heat pump may transport heat to a user's heating system if there is a need. Indicators of scale and water temperature as well as automatic apparatuses that supply water, stop water supply and alarm low water level are all available on request of users' various needs for easy operation.

Features of the solar collector tube in FIG. 6L are as follows: inorganic high heat transfer tubes and heat collecting plates are coated with a selected material to absorb solar radiant heat. Based on an L-type structure, the plate heat collector absorbs the sunlight in the reflex area so that the energy collector can absorb almost all incident sunlight. The plate heat collector and the heat transfer rate element are closely linked together. Solar energy is transported to the heated medium through the heat collector and heat transfer rate element.

Features of the solar collector of a slab-warping style in FIG. 6M are as follows: the inorganic high heat transfer element is based on a slab-warping structure. When the warped surface is exposed to the sunlight, which goes through the surface and the heated medium. This apparatus achieves small thermal resistance and excellent thermal efficiency.

The inorganic high heat transfer solar construction heating system in this embodiment has the following advantages: efficient use of solar energy; environmental protection and reduction of energy consumption; high thermal efficiency, large storage and easy, flexible installation; the heat transfer of inorganic high heat transfer elements is uni-direction, i.e. heat can only travels one way from the heating segment to the cooling one, not in both ways. Consequently, heat in the container does not go to the external environment via heat transfer elements when temperature outside is lower than that in the container. Inorganic high heat transfer medium works well in low temperature so it is not broken due to extremely low temperature in cold seasons. Each heat transfer element is independent and replacement does not affect the system, contributing to easy maintenance and long useful life. Heat is stored in the heat container so as to reduce temperature flux caused by changes in seasons and solar radiation. Congealment in containers in operation is well prevented. The thermal layer made of foam PU as integrated embodiment features good thermal insulation.

EXAMPLE 84

The present invention also provides an inorganic high heat transfer solar water heater for installing on the balcony, as shown in FIG. 6N. Vacuum glass tubes absorb solar energy, turning it into thermal energy. The energy is then transported to inorganic high heat transfer tube 675 through aluminum plates. After heated, the medium in the heated inorganic high heat transfer tube 675 rapidly transfers the heat to tap water 696 in the pipe and heats it up. The pipe is wrapped with thermal insulating layer 681 to avoid thermal losses. The heated water enters water reservoir 687 for future use.

EXAMPLE 85

The present invention also provides a plate inorganic high heat transfer solar water heater, as shown in FIG. 6O. The water heater should tilt in installation. In other words, the cooling section should be higher than the heating section on the side exposed to sunlight so that the whole solar collector forms a downward tilting angle roughly equivalent to the latitude in the local area.

The outer surface of heating segment 676 in the plate solar water heater is coated with the selected material. Alternatively, the inner surface is plated with gold to turn it into a reflex mirror. Cooling segment 680 is inserted into water in the container. When the heating segment 676 is exposed to the sunlight, coating or partition 683 absorbs radiant heat from the sun and passes heat to the cooling segment 680 via a medium to heat water in the container. The heated water circulates because of thermal gradient. Features of the solar collector plate are as follows: when fin plate 682 is exposed to the sunlight, heat goes to the heated medium through the fin plate. This apparatus achieves small thermal resistance and excellent thermal efficiency.

EXAMPLE 86

The present invention further provides an inorganic high heat transfer medium heat storage device as shown in FIG. 6P. This device is composed of a fin heat pipe 689, a plastic flange cover 690, a heat insulating sleeve 691, a heat flask 692, external walls 693, internal walls 694 and a heat storage medium 695. The heat pipe 689 with fins penetrates the plastic flange cover 690, to be inserted into the internal walls 694 of the heat flask 692. The plastic flange cover 690 is a part sealing the opening of the device and affixing the heat pipe. The heat insulating sleeve 691, which is made of plastic or fiber boards, is situated on the external walls 693 of the heat flask 692, which is made of fiberglass or ceramic material. The heat storage device is filled with medium 695. To store heat, the heat storage device is placed at wherever there is heat source (e.g. solar energy, afterheat, gas furnace, etc.). The fins of the heat pipe absorb heat, which heats the medium 695 in the heat flask via the heat pipe 689 with fins. The medium 695 in the internal wall 694 stores heat because of latent heat effect. The heat pipe 689 is removed from the sealed opening for later use. To obtain heat supply, the fin heat pipe 689 is inserted into the medium in the heat flask 695, where heat is directed out by the fin heat pipe 689. The repetitive procedures of heating, storage and heat release achieve heat storage and cutting energy consumption.

EXAMPLE 87

The present invention further provides an inorganic high heat transfer plate solar energy water collector as shown in FIG. 6Q.

The heat receiving segment 625 of the solar energy apparatus serves as the heat receiving segment of the substance to be heated, which can be gas, liquid or solid. The device for heating air is referred to as an air heater that generates hot blast to serve as the heat source for family heating in winter or drying medium in industrial production. The device for heating water is referred to as a warm water exchanger, which produces warm water for bath, laundering and heating. The heat can also serve as a heat source in seawater distillation. In order to send heat quickly from the heat receiving segment to the substance to be heated, ribs may be applied to the surface of the inorganic high heat transfer pipe provided on external walls of the heat receiving segment 625 according to various needs to enlarge the heat transfer area. Apart from this, the inorganic high heat transfer element adopts a gravity-type structure without a tubular core so that it will stop operation when the temperature at the heating segment is lower than the cooling end at night or under weak sunlight to avoid heat losses caused by counter conduction. Hence, such a separate type inorganic high heat transfer solar energy collector plate allowing long distance heat conduction is capable of achieving almost the same thermal effect as an integrated type.

Applications of Heating to Electrical Machinery Equipment

The following Examples 88 to 95 show applications of the heat transfer elements of the present invention to electrical machinery equipment, such as a high heat transfer air heater for an electric boiler, a high heat transfer heating reactor used in electrical heating, a high heat transfer steam heating reactor, a homogeneous temperature distribution epitaxial furnace, an electric water heating system, a high heat transfer PVC thermal sealer, a high heat transfer gas water boiler, and high heat transfer gas burning water heater.

EXAMPLE 88

The heat transfer element of the present invention is applicable in electrical machinery equipment, particularly in an inorganic high heat transfer air heater for an electric boiler. The inorganic high heat transfer air heater for an electric boiler as shown in FIG. 7A comprises a port flange 701, an inorganic high heat transfer tube nest 702, a steam chamber 703, a casing 704, a dredger 705, a condenser liquid outlet 706, and a steam intake valve 707. The aforesaid inorganic high heat transfer tube nest 702 is divided into two segments, one of which is a heat-absorbing end on the steam side and the other a heat-releasing end on the air side, aligned in a staggering way. The heat-absorbing segment of the inorganic high heat transfer tube nest 702 is a bare pipe while there are fins on the heat-releasing segment. Steam is the heat source of the aforesaid inorganic high heat transfer air heater for an electric boiler while air serves as its cooling source. The air heater comprises independent channels for air and steam.

The inorganic high heat transfer air heater for an electric boiler in this embodiment has the following advantages: the heat transfer element has low internal pressure, high heat transfer performance, allows quick operation, provides great maximal heat transfer capability, but generates no pollution. The other advantages include that, the heat transfer process is significantly improved because ribs are attached to the air side, the approach of total counter flow heat exchange boosts logarithmic-mean temperature and pressure and achieves high heat transfer rates. Applied to heating cold air in the boiler of a power station, the inorganic high heat transfer air heater for an electric boiler of this embodiment features simple structure, compactness, high heat exchange efficiency, and long lifespan. The inorganic high heat transfer air heater for an electric boiler fully embodies an effective heat exchanging mode that conserves energy and reduces the fundamental energy consumption.

EXAMPLE 89

The heat transfer element of the present invention is applicable in electrical machinery equipment, particularly in an inorganic high heat transfer heating reactor. In the process of some endothermic chemical reactions, more rigorous temperature control is required in various stages of the reactions. That is, the heat transfer element should be sensitive and thermostatic in the process of temperature control. Based exactly on such a feature, the inorganic high heat transfer heating reactor of this embodiment solves effectively the problem with temperature control in a precise chemical process.

The inorganic high heat transfer heating reactor in FIG. 7B comprises a reactor vessel 708, an electric control box 709, a support 710, an electric heating system 711, inorganic high heat transfer pipes 712, reactor solvent 713, and, a cover 714. The heating system comprises the inorganic high heat transfer pipes 712 and the electric heating system 711. Strict requirement applies to temperature in various stages of precise chemical engineering. In a pre-configured program controlling reaction process, different control commands are applied to temperature control in various stages. Commands are sent via the electric control box 709 to control the output power of the electric heating system 711. Heat in the electric heating system 711 travels homogenously to the reactor solvent 713 in the reactor vessel 708 to keep the temperature of the solvent within a certain range. Changes in temperature in various reaction stages are instantaneous. Thermal resistance in the heat transfer process found in the inorganic high heat transfer pipe can be disregarded since it is highly adjustable to sudden changes in temperature.

The electric heat inorganic high heat transfer heating reactor of this embodiment has the following advantages: the sensible system is adjustable to rapid changes in temperature; the system produces good thermostatic effect and excellent temperature control; the heating mechanism of this system is very safe because of its independent control.

EXAMPLE 90

The heat transfer element of the present invention is applicable in electrical machinery equipment, particularly in an inorganic high heat transfer steam heating reactor. The operational theory of the reactor of this embodiment is similar to that of the aforesaid inorganic high heat transfer electric thermal heating reactor.

The inorganic high heat transfer heating reactor in FIG. 7C comprises a reactor vessel 715, a flow controller 716, a support 717, an electric heating system 718, a steam channel 719, inorganic high heat transfer pipes 720, reactor solvent 721, and a cover 722. The heating system comprises the flow controller 716 and the steam channel 719.

Strict requirement applies to temperature in various stages of precise chemical engineering. In a pre-configured program controlling reaction process, different control commands are applied to temperature control in various stages. Commands act on the flow controller 716 through a control system. When passing through the steam channel 719, steam fully exchanges heat with the inorganic high heat transfer pipes 720. Then heat travels homogenously to the reactor solvent 721 in the reactor vessel 715 via the inorganic high heat transfer pipes 720 to keep the temperature of the solvent within a certain range. Changes in temperature in various reaction stages are instantaneous. Thermal resistance in the heat transfer process found in the inorganic high heat transfer pipes can be disregarded since it is highly adjustable to sudden changes in temperature.

The advantages of the steam reactor of this embodiment are basically the same as those of the aforesaid inorganic high heat transfer electric thermal heating reactor of the previous embodiment.

EXAMPLE 91

This embodiment is a homogeneous temperature distribution epitaxial furnace using the inorganic high heat transfer element of the present invention.

As FIG. 7D shows, the homogeneous temperature distribution epitaxial furnace of this present invention has a concentric-tube structure. Gaps between inner and outer tubes are filled with inorganic high heat transfer medium. To use the furnace, the furnace is placed in a heater to allow temperature distribution of high thermostatic accuracy in the epitaxial furnace.

The homogeneous temperature distribution epitaxial furnace of this present invention features high thermostatic accuracy, fast heating and easy operation.

EXAMPLE 92

This embodiment is an electric water heating system using the inorganic high heat transfer element of the present invention.

The inorganic high heat transfer electric water heating system of the present invention in FIG. 7E comprises an electric heater, and inorganic radiating flanges. The inorganic high heat transfer element of this embodiment has a tube-nest structure. The bottom of the nest is connected, similar to the tube sheet of conventional tube heat exchangers. Special coating may be applied to the surface of the tube nest to avoid incrustation, depending on the quality of water in the operation area. The water storage and the inorganic heat transfer element are linked together with flanges to enhance ease of manufacture and maintenance.

The water heating system of the present invention features quick operation, high heat transfer efficiency, simple structure and reliability.

EXAMPLE 93

The heat transfer element of the present invention is applicable in electrical machinery equipment, particularly in an inorganic high heat transfer PVC thermal sealer. The inorganic high heat transfer PVC thermal sealer in FIG. 7F comprises an upper heating seal 731, inorganic high heat transfer elements 732, an electric heater 733, plastic wrapping material 734, a thermal sealing face 735, and a lower heating seal 736. The core component of the PVC heating sealer of this embodiment is several inorganic high heat transfer elements in the electric heater. These heat transfer elements are introduced to foster good thermostatic effect along the extended length of upper and lower heating seals. They also enlarge the thermal capacity of the heating seals to boost the strength of heat sealing. Apart from this, it is easy to control and modify the temperature of heating seals with this structure.

The inorganic high heat transfer PVC thermal sealer of this embodiment has the advantages of allowing high heat sealing strength, a variety of applications, enhancing easy operation, and providing reliability.

EXAMPLE 94

The heat transfer element of the present invention is applicable in electrical machinery equipment, particularly in an inorganic high heat transfer gas water boiler. As shown in FIGS. 7G and 7H, the vertical inorganic high heat transfer gas water boiler comprises a boiler drum 737, a counter current flue 738, a furnace flask 739, a burner port 740, a hot water outlet 741, a counter current segment inorganic high heat transfer pipe 742, radiating segment inorganic high heat transfer pipes 743, a smoke outlet 744, a water intake 745 and a furnace bottom 746. All these parts are welded together.

The operational theory of the furnace is stated as follows. The gas burner installed at the burner port 740 injects burning gas and air into the furnace chamber defined by the furnace flask 739, a bottom base of the counter current flue 738, the radiating segment inorganic high heat transfer pipe 743 and the furnace bottom 746 for combustion to convert chemical energy of burning gas into thermal energy carried by hot smoke. Hot smoke transfers part of heat to water in the boiler via the radiating segment inorganic high heat transfer pipe 743, the furnace flask 739 and the bottom base of the counter flow flue 738. The hot smoke then enters the counter flow flue 738 after radiating heat exchange in the furnace flask. Heat is transmitted to water by means of counter flow via the counter current segment inorganic high heat transfer pipe 742 and the wall of the counter flow wall 738 when smoke goes through the flue 738. Finally the smoke is discharged into the chimney via the smoke output 744.

The heat transfer process between the radiating segment inorganic high heat transfer pipe 743 and the counter current segment inorganic high heat transfer pipe 742 is described as follows. Hot smoke transfers heat to the outer surface of the inorganic high heat transfer pipes in the form of radiation or counter current while to the inner surface in the form of heat conduction. After receiving heat, temperature in the inner surface rises to stimulate the inorganic heat transfer medium inside the pipes. The inorganic heat transfer medium passes heat to the inner surface on the water side, which inner surface passes heat to the outer surface on the water side by means of heat conduction. The outer surface then transfers heat to water through counter current.

Water enters the boiler from the water intake 745 at the bottom of the boiler and leaves through the hot water outlet after being heated.

The inorganic high heat transfer gas water boiler can adopt a horizontal arrangement or any other structures.

The inorganic high heat transfer gas water boiler of this embodiment has the following advantages. Even if the pipe wall is cracked as cold and hot medium leaks, it is not necessary to stop the boiler for repairs; the boiler adopts a compact structure; the boiler is unlikely to be blocked by incrustation, which contributes to stable performance; and the boiler adopts a simple and stable water circulation.

EXAMPLE 95

The heat transfer element of the present invention is applicable in electrical machinery equipment, particularly in an inorganic high heat transfer gas water heater. The inorganic high heat transfer gas water heater in FIG. 7I comprises s chimney 747, a water tank 748, inorganic high heat transfer pipes 749, fins 750, a casing 751, a burner 752, a burning gas intake 753, a cold water intake 754 and a hot water outlet 755. The structure of the water tank 748 is pressed and welded so it can sustain an operative pressure of 0.60 Mpa. Fins 750 penetrate the high heat transfer pipes 749, which are expanded hydraulically or mechanically to ensure that the inorganic high heat transfer pipes 749 and fins 750 are closely linked. Both ends of the inorganic high heat transfer pipes 749 are inserted into and welded to the water tank. The casing 751 is screwed to the water tank 748 and the burner 752 is fixed inside the casing.

The key point of the inorganic high heat transfer water heater of this embodiment is that it uses inorganic high heat transfer elements as the heat exchange element between the smoke and water in the water heater.

The operational theory of the water heater is stated as follows. The burner 752 equipped with automatic control and protecting devices converts chemical energy of fuel gas into thermal energy carried by hot smoke, which hot smoke flows through the heat transfer element composed of the inorganic high heat transfer pipes 749 and fins 750 to pass heat to the outer surface of the heat transfer element. Heat carried by smoke is absorbed by the outer surface and transferred to the inner surface of the inorganic high heat transfer pipes 749. After receiving heat, temperature in the inner surface rises to stimulate the inorganic heat transfer medium inside the element. The inorganic heat transfer medium transfers heat to the inner surface on the water side, which passes heat to the outer surface on the water side by means of heat conduction. The outer surface then transfers heat to water to be heated through counter current. This is the process of heat transfer in the water heater.

The present invention uses the inorganic high heat transfer element as the heat exchange element of the water heater. Heat exchange between hot smoke and water takes place outside the heat exchange element. The volume of the water side is larger so that the area of water flow is not affected by incrustation produced in heat exchange. In addition, the heater features self-cleaning function since heat exchange of water takes place outside the element, which expands when being heated and shrinks when not in use. This ensures long-term high performance of heat exchange and the comfortness of bath.

Heating Applications to Civil Engineering Facilities and Infrastructure

The following Examples 96 to 99 show applications of the heat transfer elements of the present invention to civil engineering facilities or infrastructure, such as roadside heating system, runway heating system, solar pool heating system and blind pipe heater.

EXAMPLE 96

Airports in cities in the North during winter tend to be covered by snow, which causes negative impact on the safety of aircraft takeoff and landing, automobiles and pedestrians and causes inconvenience in outdoor activities due to uneven and slippery road surface.

However, snow melting in winter usually involves a clear target, broad snow area, takes up a great amount of heat consumption with low heat transfer efficiency. Snow melting is even less energy efficient if quality energy is used. Since it can be somewhat difficult to operate ordinary heating equipment, there have been problems with snow melting on the roadside that can hardly be solved in terms of either the structure of the equipment or proper use of energy. Methods of removing snow used for hundreds of thousands of years include exhausting manual snow shoveling, mechanical snow shoveling and natural melting. These methods require intensive labor, large energy consumption and rely heavily upon the intensity of sunlight and a rise in temperature, with relatively low possibility of human control of snow melting.

It is generally understood that the temperature inside the earth rises with the depth. The temperature of the soil of more than 7 m from the earth surface is almost constant around the year, with a rough, average annual temperature, usually between 110° C. and 14° C. This is regarded as one of the reasonable green environmental-sensitive heat source used for melting snow. This embodiment takes advantage of the high heat transfer performance of the high heat transfer element prepared in Example 2 to tackle problems with snow melting on the airport runway, high way and roadside. An application to be applied to an airport runway serves as an example for further explanation.

According to FIG. 8A, the runway heating system of the present invention comprises a heat collecting segment 801, a heat insulating segment 802 and a heat receiving segment 803 (i.e. the airport runway). The heat collecting segment 801 consists a source end of the high heat transfer heating element 807. The heat insulating segment 802 is composed of a transmitting end of the high heat transfer element 805 and an insulated thermal insulating layer 806 wrapped about the high heat transfer element. The heat receiving segment 803 comprises a cooling end of the high heat transfer element 804.

The high heat transfer heating element 807 goes into soil 809 for 7 to 20 m in depth to collect heat there. There is almost no heat loss when heat is transferred from the heat insulating segment 802 to the heat receiving segment 803 because of the quick heat transfer enhanced by the high heat transfer element of the present invention and the heat insulating segment 806, for heating the runway to melt snow on the runway. Ribs 808 may be added to the source end 807 as a supplement since the heat transfer coefficient between the soil and the high heat transfer element is comparably low such that it involves more difficulty in collecting heat. Similarly, ribs should also be added to the cooling end 804 to help melt the snow.

The snow melting system of this embodiment has the following advantages:

No fuel, no waste of resources while allowing continuous snow melting;

No running parts, noise-free, simple structure, little investment and no need for maintenance;

Allowing long distance heat transfer with very few heat losses;

Cost-sensitive operation based on automatic snow melting instead of manual management;

Allowing self-locked to avoid heat losses caused by counter heat transfer;

No air pollution and free from the impact of the weather.

EXAMPLE 97

See FIG. 8B for the heating system of another embodiment of the present invention. It is basically the same with the aforesaid embodiment yet comprises mainly T-type high heat transfer elements 812. To make it more specific, several T-type high heat transfer elements 812 are buried in the soil 813. The vertical high heat transfer elements go under the earth for 7 to 20 m in depth while the horizontal high heat transfer elements are spread along the surface of the runway 810.

EXAMPLE 98

The future development of community will be based on green concepts and environmental protection. One feature is pollution-free and regenerative energy used in daily life. Solar energy is exactly such a kind of energy. Appropriate developing and using solar energy brings not only considerable environmental benefit but also profit. However, presently available solar collectors have the shortcoming of poor heat exchange rates. This embodiment takes advantage of the high heat transfer performance of the high heat transfer element prepared in Example 2 to provide a solar pool heating system featuring high heat efficiency and ease of installation.

As FIG. 8C shows, the high heat transfer solar pool heating system comprises an indoor water supply system 814, a solar energy collector 815, a water storage tank 816, a circulating water pump 817 and a water storage 818. The solar energy collector 815 is a key part of the system. It comes either in pipe or plate style.

FIG. 8D(a) shows an explicit drawing of a pipe solar collector. The collector comprises a thermal insulating layer 819 and heat transfer pipes 822, both of which are linked together with a tube clip 825. Heat transfer tubes 822 are each divided into a heating segment 820 and a cooling segment 821. The heating segment 820 is situated outside the water storage tank while the cooling segment 821 is plugged into water storage.

As FIG. 8D(b) shows, a plate heat collector comprises a thermal insulating layer 819, a fin plate 826, a partition 827 and a lug edge 828. Similar to FIG. 8D(a), it has a heating segment 820 and a cooling segment 821.

The surface of the heating segment 820 is coated with the selected material. Alternatively, the inner surface is plated with gold to turn it into a reflex mirror. When the heating segment 820 is exposed to sunlight, the coating or partition absorbs radiant heat from the sun and transfers heat to the cooling segment 821 via the medium to heat water in the water storage tank 816. The circulating water pump 817 sends hot water to the water storage 818. The water pump 817 may transport water to users' water supply system 814 if there is a need. Of course the heating system of this embodiment needs installing indicators of water level and water temperature as well as automatic apparatus that each supplies water, stops water supply and generates insufficient water alarm on request at the users' desire.

As shown in FIG. 8E, the collector should be tilted in installation to ensure proper operation of the inorganic high heat transfer elements. In other words, the cooling section on the waterside should be higher than the heating section located on the side exposed to sunlight.

The solar pool heating system of this embodiment has the following advantages:

More effective use of solar energy helps environmental protection and saves energy;

The heat transfer of the high heat transfer elements is single-way, i.e. heat can only travels one way from the heating segment to the cooling one, not in both ways. Consequently, heat in the water storage tank does not go to the external environment via heat transfer elements when temperature outside is lower than that in the water storage tank;

The inorganic high heat transfer medium works well in low temperature such that extremely low temperature in cold seasons does not result in fracturing;

Each heat transfer element is independent and replacement of malfunctioned element does not affect the system, contributing to easy maintenance and long useful life; and Heat is stored in the water storage tank so as to reduce temperature flux caused by changes in seasons and solar radiation, so as to effectively prevent congealment in the storage tank operated in winter.

EXAMPLE 99

This embodiment provides a blind pipe heater adopting high heat transfer elements prepared in Example 2. In medium transmission via plant pipes in cold seasons (or areas), the heat source surrounding the blind end (e.g. a pipe in which fluid is stored and static) is conducted into the cold (or freezing) blind end. By doing this, fluids can flow at the blind end and the normal production is assured.

FIGS. 8F and 8G show that the high heat transfer blind pipe heater of this embodiment comprises two sets of heat transfer elements and heat transfer paste, which are linked together in arc circulation. According to the actual application, heat transfer elements of befitting diameter and length are closely attached to the designed channel and bended to the static blind end. Next, the heat transfer elements and the designed channel are fastened to the blind pipe with a heat transfer paste. Finally the subassembly is fixed and totally wrapped by an external, thermal insulating material.

Applications of Heating to Dehydrating Apparatus

The following Examples 100 to 107 show applications of the heat transfer elements of the present invention to heating in dehydrating apparatus, such as a crude oil heater, an oil tank heater, a crude oil heater of an oil tank at the entrance of the oil well, a crude oil heater of an oil carrier, a vehicular oil tank heater, an inner heat exchange heater at the entrance of the oil well, an electric-thermal crude oil heating apparatus, an endothermic chemical reactor, a thermostatic bathtub, an oil pipe heating furnace, a chemical reactor vessel, a heater for heavy oil tanks, etc.

EXAMPLE 100

Hot air of various temperatures and qualities need to be used to dry grains, food, vegetables, wood, tealeaves and chemical products. The hot air is usually supplied by being heated indirectly by low-pressure steam or directly by the hot air furnace. Regardless of the approaches being taken, the process of dehydration can be very long and complex since it requires apparatus combining drying boxes, hot air producing devices and auxiliary equipment.

This embodiment produces hot air as dehydrating medium and dries material in one piece of apparatus at the same time by adopting high heat transfer elements prepared in Example 2.

As shown in FIGS. 9A, 9B and 9C, air supplied by a circulating ventilator 903 goes through a circulating air intake 906 and into a circulating air outlet pipe 904. The circulating air outlet pipe 904 is linked to several hot blast distributors 909 as the circulated wind goes into the distributors 909 via a circulate air intake 914. Linked to electric heater 913, a heat transfer element 910 is plugged into the hot blast distributors 909. There are several circulating hot blast holes 911 formed on the wall of the distributors. An electric heating controller 902 commands an electric heater 913 to heat the air. The heat transfer element 901 in the distributors 909 transfers heat produced by the electric heater 913, which is controlled by the controller 902, to incoming the cold air to cause a rise in air temperature. Heated air is puffed to a drying box 907 through the hot blast holes 911. When material is carried by a conveyer 908 into the drying box 907 via the material intake 901, it is gradually dried by the hot air puffed from the hot blast distributors 909 thereabove and therebelow. The dehydrating process is finished when the material leaves from a material outlet 905. Used air is pumped by the ventilator 903 to be compressed, part of which air is discharged while the rest enters the air intake 906 for circulation. The recycling of the used air has two purposes; one of which is to control humidity in the drying box for proper dehydrating quality; the other is to conserve energy.

This embodiment has the following advantages:

Simple dehydrating process, easy operation and control and low costs;

Low number of equipment, simple structure, easy production and one-time investment;

No air pollution by smoke;

Little space is needed; and

Excellent heat transfer performance and heat efficiency.

EXAMPLE 101

Hot air of various temperatures and qualities need to be used to dry grains, food, vegetables, wood, tealeaves and chemical products. The hot air is usually supplied by being heated indirectly by low-pressure steam. A module of boiler steam production apparatus is needed if there is no low-pressure steam supply. Heating air by steam produced by the boiler has a number of disadvantages. First, there is a need of a fully integrated boiler steam production apparatus, coupled with an air heater as auxiliary equipment. Secondly, the process takes a long time. Thirdly, operation of the compressed boiler requires complex technique. Fourthly, smoke may pollute air if coal is used as fuel.

This embodiment combines an air heater and a gas hot air furnace based on the high heat transfer element prepared in Example 2 in place of hot blast production equipment in the boiler steam heating system.

As FIG. 9D shows, when the required air temperature is low, e.g. 200° C., crude oil and combustion air comes in via a crude oil and air intake 920 is burned by a burner 921 in a combustion chamber 919, which is composed of fire-resistant bricks 922. A smoke returning fan 915 tunes the temperature of smoke produced by burning and sends it as a heat source to the lower part of an air heater 917. An air ventilator 916 sends air into the upper part of the air heater 917 as heat exchange between the smoke and air is enhanced by heat transfer elements 923. Heated air becomes hot air of low temperature 918 and is sent to the drying box as medium of dehydrating material. It is the same as the blast used by most dryers to dehydrate food, vegetables and dried products. A chimney 924 is used to discharge part of the leaked smoke.

The structure of the hot air furnace is basically the same as shown in FIG. 9D when hotter air is demanded, e.g. higher than 250° C. The feature that distinguishes the two structures is that low-temperature air is not sent directly into the air heater 917. Instead, as FIG. 9E shows, hot air of low temperature 925 that is preliminarily heated is heated in the hot smoke segment until the temperature rises to the demanded value prior to entering the air heater 917.

The structure of the combustion chamber is reconstructed to ensure good heat transfer between smoke and airflows in the combustion chamber 919, to boost heat transfer coefficient and to enlarge heat transfer area. The thermal expansion characteristic of metal in the hot smoke segment is also taken into account. As FIG. 9F shows, the improved combustion chamber comprises a double counter current structure. Hot air of low temperature 925 goes through the serpentine pipe and tube banks and smoke 927 goes through outside the aforesaid pipes. All the pipes and tubes are round with ribs thereon to produce hot air of high temperature 926.

When the hot air furnace is used in place of steam air heating system in the process of drying packed meal boxes to obtain vast blast, there is no source of scarce low-pressure steam produced by the boiler system for formed hubbing. Thus the aforesaid structure is improved, as FIG. 9G shows. Smoke produced by the burner 921 enters a steam dome 930 and exchanges heat with cold water entering from a water intake 929 to produce low-pressure steam or hot water 931. The temperature of the smoke is adjusted by a smoke returning ventilator 915 after heat exchange and sent as a heat source into the air heater 917. Air heated by heat transfer elements 923 is discharged from a hot air outlet 928.

Parts in the drawings of the aforesaid description that are identical are marked with same numbers, descriptions regarding with such parts are omitted.

Although crude oil is used as fuel in this embodiment, gas or coal can also be used as an alternative.

EXAMPLE 102

It is necessary to dry paper in paper processing industry. The existing paper dryer basically dries paper indirectly with thermal oil. The disadvantage of such a method is low heat transfer rate because the thermal oil is stickier and its quality is degrading with long-term circulation, leading to a smaller counter current coefficient. Further, the sealed structure of thermal oil circulating apparatus causes leakage easily. This embodiment uses the high heat transfer medium in Example 2 to achieve a paper dryer with good heat exchange performance, simple structure and high reliability.

The inorganic high heat transfer paper dryer of this embodiment in FIG. 9H comprises a cylinder 932, a cylinder cover 935 and swivels 936. A conical cavity is formed inside the cylinder 932. The cavity is filled with the high heat transfer medium 933. An electric heater 935 is installed on an end of the cavity.

After the electric heater 935 is powered on, one end of the cylinder 932 near the heater is heated. Then high heat transfer medium 933 in the cavity rapidly transfers heat the other end. When the cylinder 932 rotates, the high heat transfer medium 933 flows back to the source end due to centrifugal force.

The structure of this embodiment has the following advantages:

High heat transfer rates and easy temperature adjustment;

The cylinder does not bear static pressure of the thermal oil such that there is no need for reinforcing punched openings;

No need for a thermal oil circulating apparatus.

EXAMPLE 103

It is necessary to dry pencil wood case in the process of pencil making. Wood is basically dried in a kiln in present pencil plants. The disadvantage of such a method is that it is hard to control the moisture rate of wood due to large temperature gradient and low heat efficiency in the kiln. This embodiment uses the high heat transfer medium in Example 2 to achieve a pencil wood case dryer with good heat exchange performance, simple structure and high reliability.

As FIGS. 9I and 9J show, hot smoke produced by a burner 942 and in a combustion chamber 941 is directed into the lower part of a pipe box 939. A ventilator 940 directs air into the lower part of the pipe box 939. Air and hot smoke exchanges heat through high heat transfer pipes 938 in the pipe box 939 to produce hot air for drying wood located on a wood conveyer 943. Used air is discharged from a chimney 937.

The wood case dryer of this embodiment adjusts dehydration by controlling temperature and wind speed while featuring high heat efficiency.

EXAMPLE 104

Dehydration is an extremely essential step in wood production, in which adequate hot air is needed. This embodiment provides sufficient hot air by adopting high heat transfer elements prepared in Example 2.

As FIG. 9K shows, the dehydrating apparatus of this embodiment comprises a furnace 944, a heat exchanger 945 and a drying box 947. Hot smoke in the furnace 944 goes into the heat exchanger via pipes. The heat exchanger 945 includes two channels are disconnected. Smoke and air that goes into the heat exchanger 945 from its lower part flows through the channels and exchanges heat through the high heat transfer elements 946 therein for heating the air. Three tube sheets fix the high heat transfer elements 946 and a steel board is provided on one side. The high heat transfer elements 946 and tube sheet are sealed with lug edges therebetween to ensure that cold and hot flows do not leak to each other. Fins are installed on both source and sink ends of the heat transfer elements 946. The number of and distance between the fins are adjustable so as to avoid dew-point corrosion by controlling the temperature of hot air and smoke intake.

The dust remover and chimney discharge cooled smoke. Heated air enters the drying box 947 via the pipe when it reaches the required temperature. A wood conveyer is in the lower part of the drying box. Wood is placed on the conveyer and enters the drying box 947 in the counter direction against the hot airflow. Moisture in the wood vaporizes after being heated and is discharged from the drying box along with the air. Dehydrated wood is available at the wood outlet.

Coal, oil or gas can be used as the fuel of the furnace. Other afterheat in industrial production can also be used.

EXAMPLE 105

Hot blast of higher temperature is needed in spray dehydration, which is often used to produce many powdery products. Powdery material should not be contaminated by pollutants if the color of the powdery products is rigorously demanded. Smoke produced by burning coal generally serves a heat source in spray dehydration. This will become a problem in areas where there is no coal resource or such a fuel is very expensive. Other heat sources such as liquefied gas or fuel oil will affect the color of products by polluting them. Heating air by heat exchange fails to meet the requirement due to low heat efficiency and low temperature at the heat source of ordinary heat exchangers configured to of plate, tube banks or fin plate. This embodiment provides sufficient heat sources for spray dehydration by adopting high heat transfer element prepared in Example 2.

As FIG. 9L shows, the spraying dryer of this embodiment comprises a furnace 948, a heat exchanger 949 and a sprayer tower 950. Hot smoke in the furnace 948 goes into the heat exchanger 949 via pipes. The heat exchanger 949 includes two channels that are disconnected. Smoke and air that goes into the heat exchanger 949 from its lower part flows through the channels and exchanges heat through the high heat transfer elements 951 therein for heating the air. Hot air of high temperature enters the sprayer tower 950.

Three tube sheets fix the high heat transfer elements 951 and a steel board is provided on one side. The high heat transfer elements 951 and tube sheet are sealed with lug edges therebetween to ensure that cold and hot flows do not leak to each other. Fins are installed on both source and sink ends of the heat transfer elements 951. The number of and distance between the fins are adjustable so as to avoid dew-point corrosion by controlling the temperature of hot air and smoke intake.

The spraying dryer of this embodiment may use coal instead of gas as fuel to save costs and avoid affecting the color of products.

EXAMPLE 106

The products of many plants of calcium carbonate and relevant products are in powdered form. The last step is dehydration to dehydrate the material. Turret dryers, also known as rotary kilns, are used for dehydration. Since hot smoke is not allowed to exchange heat with material through direct contact, material in the dryer must be heated by the smoke from outside. In traditional heating approach, smoke goes by the casing of the rotary kiln to transfer heat to the material inside. Such an approach shows a series of problems in operation such as: (1) material is heated unequally since the temperature of smoke drops sharply from one side of the rotary kiln to another, i.e., from 1000° C. to 200–300° C. Unequal heating causes difference in temperature on the surface of the kiln, affecting the dehydration performance of material and productive capacity. (2) Smoke in the high temperature side is too hot so the metal casing of the kiln tends to be burned. The high temperature also causes corrosion, which shortens the useful life of the kiln to a great extent. (3) Low energy efficiency due to the gap between the furnace of the rotary kiln and the fixed thermal insulating layer in the high temperature side is too huge, thereby causing severe heat losses. In the low temperature side, soot can hardly be removed so it affects heat transfer and causes problems of low heat efficiency and environmental pollution.

This embodiment applies the high heat transfer medium in Example 2 to the rotary kiln to improve present drying equipment and tackle the aforesaid drawbacks.

The inorganic high heat transfer dryer of this embodiment in FIGS. 9M and 9N is a gigantic and low-speed rotary kiln. The kiln consists of a cooling segment 954 and a heating segment 952, supported by rotary supports 956 during rotation. A smoke heating part is arranged in the heating segment, comprising a smoke intake 957 and a smoke outlet 953. There is a crevice formed between the segment and the heat transfer element 963, through which crevice the smoke 962 goes for heating material flowing through the rotary kiln to dehydrate the material. Rotary fins 959 are welded to the heating surface of the high heat transfer element 963 to enhance heat exchange on the smoke side. The smoke channel is enveloped with a thermal insulating layer 961 to minimize heat losses when smoke goes through the heating segment 952.

The heating segment 952 should not be too short with a length being approximately 30% of the total length of the heat transfer element. The axle of the heat transfer element should form an angle of 2° with respect to the horizon to ensure the reflux of the condenser liquid on the rotary surface. Liquid distributors 960 are welded to the vaporizing surface of the heat transfer heating segment to make sure that the vaporizing surface is covered by a liquid film. The condensing surface has been specially treated to be expendable so that there is more space for condensation of steam and that more heating surface is in contact with the rotary powdery material in rotation.

The smoke channel in the heating segment keeps rotary and static parts sealed. Both soot removal and access ports are installed.

EXAMPLE 107

This embodiment provides a high heat transfer hot blast dryer combining the hot air furnace and the drying box of the previous embodiments. As FIG. 9O shows, hot blast produced in an air heater 965 is conducted by pipes into a material dryer 966. The description of other parts is omitted by referring to the two aforesaid embodiments for more information.

Applications of Heating to Chemical Engineering Apparatus

The following Examples 108 to 118 show applications of the heat transfer elements of the present invention to heating in chemical engineering apparatus, such as a crude oil heater, an oil tank heater, a crude oil heater of an oil tank at the entrance of the oil well, crude oil heater of oil carrier, a vehicular oil tank heater, an inner heat exchange heater at the entrance of the oil well, an electric-thermal crude oil heating apparatus, an endothermic chemical reactor, a thermostatic bathtub, an oil pipe heating furnace, a chemical reactor vessel, a heater for heavy oil tanks, etc.

EXAMPLE 108

Oil containers, crude oil in pipes or other oil material is often heated during storage and transport to meet the respective technical, operative requirements. Heat can be quickly transported to these products by adopting the high heat transfer medium of the present invention or heat transfer elements prepared according to the present invention to avoid exceeding temperature in a localized area. Hence, using the heat transfer of the present invention to heat oil products saves energy and allows safe production.

This embodiment is a kind of apparatus that heats crude oil in the crude oil transport pipe. Adopting the heat transfer elements as described in Example 2, the apparatus enhances high performance heat exchange in the heating process.

FIG. 10A is a schematic drawing of the apparatus, in which 1001 represents a crude oil pipe, 1002 represents a high heat transfer pipe of the crude oil transport pipe heating apparatus, 1003 represents a lug port, and 1004 represents an electric heater.

The workflow of this embodiment is described as follows. When the electric heater 1004 is in operation, the high heat transfer pipe in the heater transfers heat to the high heat transfer pipe outside the crude oil pipe. The high heat transfer pipe then releases heat to the crude oil to increase its temperature.

Currently crude oil heaters adopt water jacket furnaces or an electric heating zone. These devices have the following drawbacks: complex boiler construction and resulting in numerous weld seams; low heat transfer rate; long starting time causing gross heat losses when there is no operation; the electric heating zone easily fails but hard to repair. Compared to present technology, the crude oil pipe heater of this embodiment has the following advantages:

Compact structure: it is linked to the crude oil pipe so the whole process is thermostatic and well heated;

Easy installation: the connection is the same with ordinary piping so there is no need for updating the existing arrangement;

High heat efficiency: the heat transfer thermal resistance is basically null so that heat conversion rates can be maximized;

Easy operation: the heater is easy to use since temperature configuration and overheating protection devices are available;

Safe operation: the electric heater is absolutely separated from the crude oil. Heat exchange is achieved through the heat transfer medium so defects found in combustion of the crude oil caused by electricity are eliminated.

This embodiment is especially suitable for transporting and heating crude oil in the oil field. The manufacture and operation cost is less than water jacket furnaces while taking less area at the same.

EXAMPLE 109

This embodiment is an oil tank apparatus heater adopting the high heat transfer element of the present invention. It comprises the high beat transfer element, a tube sheet 1014 and a pipe box 1012.

To ensure proper operation of the heater, the tube nest of high heat transfer element 1013 should be tilted in installation. In other words, the tube nest at the inner side of the oil tank should be higher than that at the outer side. When the tube nest is normal to the tube sheet 1014, the pipe should slope downward to ensure that the whole tube nest forms a certain angle with horizon, as shown in FIG. 10B.

After its source end absorbs heat from heat medium, the high heat transfer element 1013 transfers heat to the sink end of the high heat transfer element 1013 for heating oil in the tank. The pipe is welded to the tube sheet 1014, which is linked to pipe box 1012 with lugs, so that the whole tube nest can be removed in installation and dismounting. A track support 1011 is installed in the oil tank for easy installation. The size as shown in FIG. 10B should be determined according to the actual design conditions.

Most of present oil tank heaters are arranged in banks of light tubes, or polygon serial mode. The source of heating mainly lies in steam. The main drawback of these heaters is leakage at lugs and weld joints at connections. Causes of leakage include quality of weld joints, water hammering, steam decay, corrosion, etc. Leakages in the heater have a direct impact on the use and operation of the oil tank. Maintenance and cleaning also lead to unnecessary waste. It is hoped that the structure and design of the heater can be designed to make improvements so as to extend the useful life and maintenance cycle. The heater of this embodiment features high heat transfer, safety and high reliability. Compared to current oil tank heaters, the hater of this invention has the following advantages:

Fin tube nests can be arranged, so as to feature high heat transfer, safety and reliability;

Leakages caused by water hammering, steam decay and high temperature corrosion can be eliminated;

The heater can operate even though leakage is found in a single heat transfer element leaks, thereby extending the useful life and maintenance cycle of the oil tank.

It is necessary to maintain and clean the damaged oil lank, leading to a waste of manpower and resources. The value of this embodiment lies in extending the maintenance cycle and reducing operation and management costs.

EXAMPLE 110

This embodiment is proposed to tackle the problem with loading/unloading crude oil in low temperature in distant oil wells or oil mining stations in industrial and residential areas so as demanded by the oil field.

This embodiment uses the high heat transfer element as described in Example 2 to enhance easy crude oil loading/unloading by transferring heat produced by electricity, gas, fuel oil or steam to heat crude oil to reduce stickiness of the crude oil.

As FIG. 10C shows, the crude oil heater of an oil unloading tank at the entrance of the oil well of this embodiment comprises a heat source 1036 being a heater, a high heat transfer pipe, a fix lug 1033 and a thermometer 1034. The high heat transfer pipe consists of a source end pipe 1035, a sink end pipe 1032 and fins 1031. To ensure proper operation of the inorganic heat transfer pipe, the sink end pipe 1032 of the high heat transfer element forms an angle of 10° in relation with the horizon. The source end pipe 1035 is connected to the heat source while the sink end pipe 1032 is plugged into the heated crude oil, and fixed by the fixed lugs welded on the high heat transfer element to the unloading tank at the entrance of the well.

The source end pipe 1035 in the heat source 1036 of the heater transfers heat gained from the heat source to the sink end pipe 1032. Heat is then released to the crude oil through the pipe wall and fins 1031 to increase the temperature of the crude oil.

The crude oil heater of the oil-unloading tank at the entrance of the oil well or oil station of this embodiment has the following advantages:

Flexible choice of heat sources, suitable for occasions of vigorous working conditions such as oil mining stations and oil wells in oil fields;

Adopts ordinary lug connection for easy installation and replacement;

The thermal resistance of the high heat transfer pipe is almost null, featuring high heat efficiency;

The heat source is absolutely separated from the crude oil so as to eliminate the common pollution to crude oil or combustion of the crude oil caused by accidental ignition.

EXAMPLE 111

This embodiment is designed for heating highly sticky liquid such as crude oil in the process of loading/unloading and transport.

Steam and electricity is used as traditional approaches to heat onboard oil cans. Jacket steam heating has been gradually replaced by electric heating since due to its difficulty in obtaining the heat source in jacket steam heating and due to the large effective storage space required by the jacket. However, electric heating causes much inconvenience in installation and operation due to numerous concerns and safety hazards that need to be considered in operation and production.

This embodiment uses the high heat transfer element of Example 2 to prepare a high heat transfer pipe crude oil heater, which solves the technical problem by effectively separating oil from electricity.

FIG. 10D shows the onboard oil can of the crude oil heater according to the present invention, comprising an oil carrier 1041, a connecting pipe 1042, fixed lugs 1043, a heating device 1044, a power supply 1045, and a switch 1046. FIG. 10E shows the high heat transfer pipe crude oil heater. The heater comprises heat transfer elements 1051, a tube sheet 1052, magnesium oxide 1053, a thermal insulating layer 1054 and casing element 1055. After being powered on, resistance wire produces vast heat, which is sent by magnesium oxide to the high heat transfer element 1051. According to the heat transfer function featured by the high heat transfer elements of the present invention, heat is efficiently transferred to the crude oil in the can. The operational theory above shows that electrical energy is transported through the high heat transfer element. The resistance wire is not in direct contact with oil products to avoid fire hazards occurred when the surface temperature of the heating element in low oil level is high than the flash point of oil.

The electric crude oil heater in FIG. 10E tackles the following problems of conventional heaters of the same category including strict demands for operational voltage and environmental humidity, high tendency of soot accumulation on the heating surface, reduction of heat efficiency due to soot, and surface temperature of the heating element being higher than the flash point of oil when the oil level is lower than the heater. This embodiment can replace existing electric crude oil heaters and steam heaters for it has the following advantages:

Safety and reliability since oil is completely separated from electricity;

High heat transfer efficiency, quick starting, little space required for installation, and easy and flexible installation;

Independent operation of each heat transfer element such that replacement of the damaged element does not affect the system, contributing to easy maintenance and long useful life.

EXAMPLE 112

This embodiment is a kind of apparatus that heats vehicular oil tanks. Adopting the high heat transfer element of the present invention, this apparatus boosts heat exchange rates in the process of heating the vehicular oil tank.

Sometimes it is necessary to heat oil during the transportation of crude oil and heavy oil to prevent oil from getting sticker and less fluidic. The current approach to heating vehicular oil tanks basically adopts coil steam tubes, which are installed in the tank. The drawback of this approach is unequal heating and inability to heat oil during transportation due to the limited supply steam sources.

The heater in FIG. 10F applies a heat transfer element to heat crude oil or oil material in the oil tank. FIG. 10G is a sectional drawing of the oil tank as described. The heater comprises an electric heater 1061, a high heat transfer element 1062, and mineral oil heat carrier 1064, the mineral oil heat carrier 1064 is installed into the jacket outside the casing of the oil tank. The heat-releasing end of the tubular high heat transfer element 1062 is soaked in mineral oil heat carrier while the source end is placed out of the jacket. After the electric heater 1061 is powered on, the source end of the high heat transfer element 1062 is heated. Then heat is quickly transferred to the heat-releasing end. The mineral oil heat carrier 1064 in the jacket is heated and then heats oil in the tank by releasing to the oil in the tank. The temperature of heating is easily adjusted by changing the wattage of electric heating. This heating method has the following advantages: even heating temperature; high heat transfer rates; easy temperature adjustment; and ability of heating oil in transportation.

EXAMPLE 113

Present heaters at the entrance of the oil well tend to be blocked by sand, causing blockage to pipes and risks of explosion. Current heaters also waste resources due to its large size.

This embodiment furnishes an inner heat exchange well heater to solve the problem with sand blockage. The heater has the following advantages: elimination of coke in the crude oil; high heat transfer rates up to 90%; compact structure; small size; little material consumption; and reduction of costs.

As FIG. 10H shows, the inner heat exchange well heater of the present invention comprises a high heat transfer vaporizing segment, an inner heat exchange cavity, a high heat transfer diluted heat exchanger, a dense oil heat exchanger, and an oil-preheating heat exchanger.

The high heat transfer vaporizing segment is made by welding the inner cylinder 1065, the bottom of which being configured to an S-shaped bottom loop, to a lower seal 1066. The vaporizing segment is also linked to numerous curved distilling pipes 1067 to form a furnace flask. The bottom of the high heat transfer cylinder 1068 is welded to the S-shaped bottom loop at the bottom of the inner cylinder 1065, while the top of the high heat transfer cylinder is welded to an upper seal 1072. The bottom of bellows 1071 is welded to the lower seal 1066, and the top of the bellows is welded to the upper seal 1072, to construct an inner heat exchange cavity combining the high heat transfer segment having an inner flue and a condensing segment. A diluted heat exchanger 1070 with a set of multiple coil tubes is installed in the upper part of the high heat transfer cavity. A dense heat exchanger 1069 with a set of multiple coil tubes is installed in the middle part of the cavity. A deflecting ball 1073 and a set of coil tube 1074 are installed in the upper part of the high heat transfer cavity. The top of the coil tube 1074 serves as a dense oil intake while the bottom of the tube is linked to the upper sphere of the deflecting ball 1073 by welding; the lower sphere of the deflecting ball 1073 is connected to the upper port of the dense oil heat exchanger 1069 with a linking pipe 1078 by welding, so as to form a hot smoke layer of an integrated oil pre-heating heat exchanger. The lower port of the dense oil heat exchanger 1069 serves as an outlet. The diluted oil heat exchanger 1070 has an intake and outlet. The hot smoke cavity comprises an outer seal 1076 and an outer cylinder 1077, which are linked together. One side of the hot smoke cavity is linked and welded to an outer flue 1075. A thermal insulating layer and an outer casing is located on the outer side of the outer cylinder. A base 1079 is installed at the bottom.

In operation, diluted oil goes into via the intake of the diluted oil exchanger and is heated to the preset temperature. Then the oil is sent underground to mix with and dilute extra dense oil. The diluted crude oil mixture is transported by an oil extractor from underground to the coil tube heater intake and the deflecting ball 1073 via the coil tube 1074 of the preheated heat exchanger. The crude oil goes into the dense oil heat exchanger 1069 via the linking pipe 1078 and eventually goes into the piping network via the oil outlet after it is heated to the preset temperature.

EXAMPLE 114

When crude oil is being extracted from an oil field, the extracted oil should be transported from the wells to the storage tanks through pipes. The oil is then collectively dehydrated and sent to the refinery. Distance between the wells and the storage tanks can be tens or hundreds of meters, causing difficulty in transmission due to stickiness of crude oil, oil cooling resulting from gross heat losses in piping, de-wax and congealment. Such problems are particularly critical in transmitting oil in winter or freezing areas, forcing oil fields all over the to take the following measures to tackle the problems:

Adding additives or pouring hot water or steam into crude oil to make it less sticky.

Heating crude oil indirectly in a water jacket furnace using gas, coal, quench or heavy oil as heat sources. Crude oil is not transmitted until being heated to a certain temperature high enough to make up for heat losses. The water jacket furnace is the main equipment of crude oil heating at oil wells since it can work continuously and stably. To install and operate the furnace, however, there is a need for water and gas sources. Further, there must be someone caring for flames but the working conditions of the workers are harsh and the workload of maintenance can be heavy. In addition, the heater causes a waste of resources and air pollution since some useful ingredient in fuel is not recycled after combustion.

Heating crude oil with electricity by surrounding the pipes with the electric heating zones so that heat is continuously delivered to crude oil as it is being transported. Such an approach needs few costs and is very cheap in terms of construction so that it was rather popular several years ago. However, it has been seldom used recently due to the following reasons: the heating subject has small heat flux density; large heating area; the electric heating zones have short useful life and involves difficulty in inspection, maintenance and replacement since it is buried with pipes under the ground;.

Hence there has not been any method that is simple, easy, convenient to maintain, cheap and environment-friendly so far in terms of crude oil heating. Many enterprises have been trying to tackle this problem for years.

This embodiment provides a high heat transfer electric crude oil heater, which comprises a jacket type heat transfer pipe element 1083, an electric heater 1082 and an intelligent temperature controller 1084.

The jacket type heat transfer pipe element 1083 features high heat transfer capability, good thermostatic effect and outstanding compatibility. It is coupled with an electric heating device as heat transfer medium between the electric heating source and oil to solve the aforesaid problems such as difficulty in heat transfer and maintenance.

As shown in FIG. 10I, the structure of the jacket type heat transfer pipe element is composed of an inner and outer straight carbon steel pipes that are welded and envelop each other, namely an inner jacket pipe 1080 and outer an jacket pipe 1081.

Differences between heat sources provided by electric heating apparatus and heating apparatus of other types, such that the operation temperature affect directly the useful life of the heating device. The reliability of temperature control in this apparatus is correlated with the stability and safety of the whole module when it is coupled with the heat transfer element. Hence this heating apparatus may be selectively equipped with a high performance intelligent temperature controller.

The high heat transfer crude oil heating apparatus of the present invention does not rely only upon the electric heating device and the jacket type heat transfer pipe element to work stably, the temperature controller should not be ignored. Only when the three parts comply with each other and work together can the whole apparatus operate safely. As FIG. 10J shows, the high heat transfer electric crude heater of the present invention comprises an electric heater 1082, a jacket type heat transfer element 1083 and an intelligent temperature controller 1084.

As shown in FIG. 10J, the working principle of the whole apparatus is described as follows: after the electric heater on the outside wall of the jacket type heat transfer pipe element is powered and heated, it first heats the medium in the heat transfer element first through the wall at the bottom of the element. Heated medium transfers heat by distributing it rapidly to the cavity of the jacket tube so that the temperature of the whole tube rises. When crude oil keeps coming in from the jacket tube, heat is sent to the crude oil flowing via the inner tube wall of the jacket. Thus, the crude oil flowing out of the other side of the jacket is warmed by absorbing heat. That is, the heating process is completed when the crude oil goes through the jacket tube of higher temperature in normal transmission. The installation of the heating apparatus does not change existing crude oil transporting process so the resistance in the piping system will not be increased.

The jacket type heat transfer pipe element can be arranged on the top of the crude oil pipe to ensure the reliability of the complete heating apparatus. A port for checking temperature is installed at the outlet of the apparatus to achieve chain control between the electric heater and the water temperature at the outlet by the temperature controller. The temperature controller calculates by comparing the feedback and setting values so as to promptly and automatically control the heating rate of the electronic heater. This is to prevent the crude oil from being overheated in the heating process.

The heating capacity of this apparatus is 25 kw. The apparatus can automatically control the heating of the pipes and the temperature during operation after the user simply sets the temperature of the output crude oil according to the flow rate of the crude oil, intake temperature and target heating capacity.

The crude oil heating apparatus of the present invention is a heating system in the oil field using electricity as the heat source. As compared with traditional water jacket furnaces and electric heating zone crude oil heating process, the apparatus of the present invention has the following features:

Small size, simple structure and suitable for crude oil pipe heating in the wells of oil fields;

Easy to install without changing the existing transporting process of existing medium and without increasing the resistance in the existing piping system;

Changing the heating area can solve the problems of coke in oil in electric heating caused by centralized heating area, overheat in partial area and unequal thermal distribution;

It also solves the problems of low heat transfer coefficient and insufficient heat exchange area for the oil products;

Solving the problems of the electric heater, such as short service life and inconvenience in maintenance and replacement;

Highly automatic operation since the remote electric transmission of the intelligent instrument achieves remote monitoring of the heating apparatus and avoids complicated on-site operation;

The output power is adjustable for heating as required in different seasons.

A computer can be connected to several temperature controllers to boost working efficiency, reduce labor and promote the accuracy of temperature control.

Devices of the apparatus are well arranged, stable and cheap so the apparatus is suitable for small-capacity well heating.

The crude heating apparatus of the present invention has a promising future because it can replace conventional gas-firing or oil-firing water jacket furnaces in oil field.

Various heating power and structures of the crude oil heating apparatus of the present invention can be selected according to the parameters such as the distance from the well, geographic location, quality of the oil and required heating capacity. The settings can be arranged in a series of options for users. Applications in other similar occasions may also refer to the present invention.

EXAMPLE 115

This embodiment shows a new endothermic chemical reactor. FIG. 10K shows the structure of an endothermic chemical reactor of the present intention. The reactor described comprises a material intake 1085, a heat transfer element 1086 made of the heat transfer medium of the present invention with fins 1087, a catalyst bed 1088, a raw material outlet 1089 and a heater 1090. The heat transfer element 1086 transfers the heat required in reaction to the catalyst bed 1088. There are longitudinal fins 1087 outside the heat transfer element 1086 in the catalyst bed 1088. The purpose is to increase the heat transfer area where the heat transfer element supplies the heat to the catalyst. The larger the area is, the smaller the temperature gradient between the heat transfer element and the catalyst. In addition, the heat transfer element has excellent axial temperature uniformity so it reduces the temperature gradient on the radial catalyst layer inside the reactor to promote conversion rate and reaction capacity.

It is well known that heat from the environment should be continuously supplied to the reactor to maintain the temperature required in the endothermic reaction. Most traditional endothermic chemical reactors use the heat exchangers with pipe banks. These reactors have larger temperature gradient between the longitudinal and axial directions of the catalyst bed, causing low conversion rates and reaction capacity. On the contrary, the reactor of the present invention can ensure that the temperature uniformity along the longitudinal direction of the catalyst bed of the reactor to enhance the conversion rate and reaction capacity.

EXAMPLE 116

Thermostatic bathtubs are widely used in engineering as a kind of thermostatic apparatus. Existing thermostatic approaches are circulating circuit structure using water or oil. On the one hand, such a structure has low heating efficiency and the temperature thereof tends to fluctuate. On the other hand, water or oil incrustation is produced on the surface of the heat exchanger of the boiler and water and oil in the bathtub tends to cool down when the combustion in the boiler stops.

As FIG. 10L shows, this embodiment is a new thermostatic bathtub. The bathtub comprises a boiler 1091, a heat transfer element 1092 made of the heat transfer medium of the present invention and an oil bathtub 1094 filled with silicon oil 1093. Compared with present bathtubs, the high heat transfer thermostatic bathtub of the present invention replaces the circulating circuit with the heat transfer element 1092 to separate the heating part in the bathtub from the burning part in the boiler. Heat transfer element 1092 transports the heat produced by combustion in the boiler 1091 to the bathtub 1094 to increase the temperature of the water or oil in the bathtub and keep it steady. By doing this, there will be no water or oil incrustation attached on the surface of the heat exchanger on the boiler. In addition the water or oil in the bathtub does not cool down very easily after the boiler stops burning since the heat transfer element transfers heat in one direction.

EXAMPLE 117

Existing heating furnaces in pipe transmission of crude oil have disadvantages such as low heating efficiency, high daily operation costs and unsatisfactory safety and reliability such that long-term production can hardly be ensured. This embodiment concerns a kind of high performance, safe, long-term and stable concept for the crude oil heater. The key point of the present invention is to directly transport the radiation heat in the furnace chamber to the oil pipe by the heat transfer element of the present invention to increase the temperature of crude oil during transmission.

As shown in FIGS. 10M and 10N, the heater of the present invention comprises a radiation room 1096, a counter current room 1097, a heat recovery crude oil heating pipe and chimney 1099. The radiation room includes a burner 1095 and a heat transfer element 1098. One side of the element transfers the heat in the radiation room to the heating pipe on the other side to heat the crude oil. After absorbing the heat, the temperature of the crude oil reaches the desired application value for transmission. To ensure the normal operation of the heat transfer element, the crude oil pipe is installed above the radiation room.

The working process of the invention is: the heat transfer element in the radiation room in the crude oil heater raises the temperature of the crude oil for transmission by rapidly transferring the heat to the oil pipe.

Radiation heat in the heater, heat in the counter current room and afterheat produced by smoke can be sufficiently utilized by the design of the present invention. The process of heating is effectively controlled to reduce costs and increase profit. The heating measures of the heater merely depend upon the temperature gradient between both ends of the element.

EXAMPLE 118

Reactor vessels with mixers are often used in the medical, food, petroleum and chemical industries. Heat caused by chemical reaction is always transferred in and out of the vessel. Routine reaction heat is transported by sleeves or auxiliary tubes outside the vessel, therefore, the heat exchange area provided by the outer sleeve fails to meet the requirement in intensive exothermic or endothermic reaction. The present invention shows a new heating chemical reactor vessel, which can fulfill such a need. As FIG. 10O shows, the reactor vessel 2802 of the present invention comprises a mixer 2801, a heat transfer element 2803, a jacket 2804 and a heater 2805. The heat transfer element 2803 may be various shapes. It is plugged into the vessel to increase the heat exchange area therein and is used as a stop plate to accelerate reaction.

The reactor vessel of the present invention has the advantages of simple structure, high heat transfer rates and reliability.

EXAMPLE 119

This embodiment shows a high heat transfer heater for heavy oil tanks. As FIG. 10P shows, heavy oil 2807 is in the canister body 2806 of the oil tank. The heater comprises two parts, one is a heat source outside the oil tank and the other is the heat transfer element 2808 in the tank. Heat sources outside the oil tank may be in various forms so that the tank may be kept away from electricity or steam as the heat transfer element in the tank transfers the heat to the heavy oil in the tank. Natural circulation is facilitated when the heated heavy oil goes upward from the bottom while the cold heavy oil in the top of the oil tank goes down to the bottom. Thus, all the heavy oil in the tank can be heated. Outer heating stops automatically when the heavy oil in the oil tank reaches 70° C.

The heavy oil in existing heavy oil tanks is heated by connecting the stream pipes into the tank. Production is severely affected by stopping the operation for checking and cleaning the tank due to steam leak caused by water hammering. The heater of the present invention uses the heat transfer element of the present invention for heat exchange in the tank in place of steam medium. It features high heat transfer rates, large unit heat transfer area and the smaller size of the heater. It saves energy, reduces steam consumption by ½ to ⅓, has long service life and saves the costs for routine maintenance.

The high heat transfer element should be tilted for a certain angle in the installation of the heater.

Heat Transfer Heat Dissipating Element

Applications to Heat Dissipation in Agriculture & Fishery

The following Example 120 shows an application of the heat transfer elements of the present invention to dissipating the heat in agriculture & fishery applications, such as a heat dissipater preventing spontaneous ignition and heating.

EXAMPLE 120

Gross economic losses are caused by fire or degraded quality as a result of spontaneous ignition and heating for the stored material such as granaries and mines of coal ores. However, no convenient or feasible solution has been founded so far. Bamboo tubes are plugged into granaries but the result is still not satisfactory. Lime, flame alkalis and slurry are instilled into coal mines. However, this often introduces eruption and thus threatens the safety for the operators. To solve this problem, it is necessary to prevent material from spontaneous ignition and heating by developing a new and practical high heat transfer and heat dissipating apparatus.

This embodiment utilizes the thermostatic feature of the high heat transfer element to effectively and safely dissipate the heat from substance to avoid spontaneous ignition and heating.

As shown in FIG. 10R, the high heat transfer apparatus of heat-dissipating comprises high heat transfer medium 2810, an elevating ring 2811, a metal pipe 2812 and radiating flanges 2813. It can be made as a single tube, tube bank, V-type tube or U-type tube according to various occasions.

Based on the heat transfer features of the high heat transfer element, the bare pipe of the apparatus is buried in the material that may involve spontaneous ignition or heat production. The elevating ring and radiating flanges are exposed to the air. After absorbing heat, the source end transfers the heat to the sink end through the high heat transfer medium. Heat is then dissipated to the air via the radiating flanges. The process continues to help the heat contained in substance that tends to spontaneously ignite or produce heat dissipate to the exterior to avoid damage caused by spontaneous ignition or heating.

The heat-dissipating approach by the high heat transfer element of the present invention ensures the safety of material storage and production by effectively dissipating the heat from the substance, which involves spontaneous ignition and heating. The high heat transfer heat dissipation of the present invention features one-way heat transmission, i.e. the heat can only travels from the source end to the sink end, not the other way around. This apparatus is a high-tech product that is friendly to environment with low energy consumption. Different from traditional heat-dissipating apparatus, the present apparatus can be customized in terms of various specifications or models for users' installation and application since the structure thereof is not complex and it does not consume power.

Heat-Dissipating Applications to Computers and Peripherals

The following Examples 121 to 131 show the applications of the heat transfer elements of the present invention for dissipating the heat in computers and peripherals, such as CPU cooler for desktop PCs, plate CPU cooler under the keyboard for notebook computer, plate CPU cooler behind the display for notebook computer, IC cooler, semiconductor cooling device, IC board carried cooler for notebook computer CPU, CPU cooler in the keyboard of notebook computer, chip sets cooling device and EMI dissipation device.

EXAMPLE 121

The heat transfer element of the present invention can be applied to computers and peripherals to dissipate the heat produced in the working process of computers and peripherals. For example, it serves as a heat-dissipating element of CPU for desktop PCs, CPU cooler of notebook computers, IC cooler, semiconductor cooling device and other heat-dissipating apparatus of other computing devices.

There are many types of CPU coolers of desktop computers available and known in the market. These coolers are basically made by stretching metal, with the additional of a CPU fan that dissipates the heat by wind. The heat-dissipating apparatus has a number of disadvantages such as large size and high thermal resistance; it gets out of order easily and produces much noise due to short service life of the fan. These drawbacks restrict the development of CPU. FIG. 11A shows a CPU cooler for desktop PCs, using the heat transfer element of the present invention. FIG. 11B is a left side view of the cooler in FIG. 11A. As shown in FIGS. 11A and 11B, the CPU cooler for desktop PC comprises a heat absorbing brick 1101, a heat transfer element 102 of the present invention and fins 1103. The heat transfer element 1102 is made as a serpentine pipe. Rectangular or round fins 1103 are installed to the outer wall of the heat transfer element 1102. The fins 1103 and the wall of the heat transfer element 1102 are linked together by excessive coupling, gluing or welding. The endothermic end of the heat transfer element 1102 is plugged into the holes of the heat absorbing brick 1101. After the cooler is installed onto the CPU of a desktop PC, the CPU releases heat to the heat absorbing brick 1101, which transfers the heat to the heat transfer element heat transfer element 1102. The heat is transferred to the fins 1103 according to the thermostatic heat transfer characteristic of the heat transfer element 1102. Heat is finally dissipated by natural airflow circulation to cool the CPU. By replacing the CPU fan, the heat transfer element of the present invention reduces noise and vibration and achieves the long service life and reliability of CPU coolers. It improves heat-dissipating capability and accomplishes the stable and reliable operation of the whole system. Hence this embodiment furnishes a new high performance cooler.

EXAMPLE 122

FIG. 11C shows another embodiment of the CPU cooler for desktop PCs, using the heat transfer element of the present invention. FIG. 11D is a left side view of the cooler in FIG. 1C. As shown in FIGS. 11C and 11D, the CPU cooler for the desktop PC comprises a heat transfer element 1104 of the present invention, fins 1105 and a fan 1106. The heat transfer element 1104 is made as a plate. A plurality of fins 1105 made of machined plate material are provided on the heat transfer element 1104. The fins 1105 is perpendicular to or inclined with some degrees off from the vertical with respect to the heat transfer element 1104. The fan 1106 is fixed to the heat transfer element 1104 with support 1107 and screws. The cooler is directly installed on the CPU. A thermal grease or thermal matt is applied to the contact surface between the cooler and the CPU. Heat produced by CPU is transferred to the fins 1105 through the heat transfer element 1104, while the fan 1106 blows to dissipate the heat. With proper design, the heat-dissipating capacity of this cooler can be ten times more than that of ordinary coolers. The heat transfer element of the present invention reduces the size and provide a better arrangement for the cooler. It improves the heat dissipation by reducing the thermal resistance. The temperature on the CPU becomes more even so that the performance of the processor is more stable.

EXAMPLE 123

FIGS. 11E and 11F show a CPU external cooler for desktop PC, using the heat transfer element of the present invention. The cooler shown in FIG. 11E is used for horizontal models while the one shown in FIG. 11F is used for vertical models. As shown in FIGS. 11E and 11F, the CPU cooler for the desktop PC comprises a heat absorbing brick 1108, a heat transfer element 1109 of the present invention and fins 1110. The shape of the heat absorbing brick 1108 depends on that of the CPU. The heat transfer element 1109 is plugged into the heat absorbing brick 1108 in close contact. The fins 1110 are installed at the end of the heat transfer element 1109 and near a power fan 1111. The heat transfer element 1109 can be bended into any shape, depending on the arrangement inside the computer. When the cooler is installed to the CPU, the heat from the CPU is transferred to the fins 1110 near the power fan 1111 by the heat absorbing brick 1108 and the heat transfer element 1109. The fan 1111 dissipates the heat through air circulation. By replacing the CPU fan, the heat transfer element of the present invention reduces noise and vibration by using the power fan only. It improves the stability of the processor system by reducing the thermal resistance, dissipating more heat produced by CPU and improving the thermostatic distribution on the CPU. The system is more stable since the CPU fan is omitted. The cooler also features a well-arranged structure and can be manufactured easily.

EXAMPLE 124

Portable notebook computers are very popular. However, its demanding requirement of high performance seems to contradict the trend of minimization. The heat dissipation of CPU is particularly important for the notebook computers. The heat transfer element of the present invention successfully solves the problem with heat dissipation for high capacity CPU within the tiny space in the notebook computer. FIG. 11G shows a CPU cooler for the notebook computers, using the heat transfer element of the present invention. FIG. 11H is a top view of the cooler in FIG. 11G. As shown in FIGS. 11G and 11F, the CPU cooler for the notebook computer comprises the heat transfer element 1112 of the present invention and a connector 1113. The heat transfer element 1112 is made in the shape of a plate. The connector 1113 is used to connect the CPU with the heat transfer element 1112. Situated under the keyboard of the notebook computer, the cooler utilizes the high heat transfer capacity of the element of the present invention for the effective heat dissipation of the CPU. The notebook CPU cooler adopting the heat transfer element of the present invention saves much space since it is light and its thickness is less than 1.5 mm. In addition, it features excellent heat transfer capability, high heat dissipation and reliability.

EXAMPLE 125

FIG. 11I shows another application of the CPU cooler for the notebook computers using the heat transfer element of the present invention. FIG. 11J is a bottom view along the arrow A—A in FIG. 11I. Adopting the high heat transfer soft pipe element and the heat transfer plate element, the cooler succeeds in solving the heat transmission from the keyboard of the notebook computer to the rear side of the display. As shown in FIGS. 11I and 11J, the notebook CPU cooler comprises a heat transfer element 1114, a heat transfer element 1115, a heat transfer element 1116, a heat transfer element 1117 and an endothermic connector 1118. The heat transfer element 1114 can be made as a tube. It can also be bended into any shape, depending on the arrangement inside the computer. The heat transfer element 1115 is made as a soft tube to form a sealed cavity by connecting the heat transfer pipe element 1114 and the heat transfer pipe element 1116. The he at transfer element 1116 is arranged behind the display. As FIG. 11J shows, part of the exothermal segment is sealed inside the heat transfer plate element 1117 by welding. Arranged under the keyboard of the notebook computer, the endothermic connector 1118 is used to connect the CPU and the heat transfer pipe element 1114. The soft tube heat transfer element 1115 provides smooth heat transmission regardless the rotation of the display. Heat released by the CPU in operation is transferred to the heat transfer pipe element 1114 through the endothermic connector 1118. The heat is then transferred to the soft pipe heat transfer element 1115 and the surface of the heat transfer element 1116 by the heat transfer medium in the cavity thereof. The heat transfer element 1116 homogenously transfers the heat to the heat transfer plate element 1117 so that the heat is dissipated to the environment by natural circulation. The cooler of the heat transfer element of the present invention maximizes its heat dissipation capability. The cooler has the following advantages: fan-free heat dissipation for reducing electricity consumption; more heat from the CPU is dissipated to improve the system stability; no noise and vibration; well-arranged structure and easy to be manufactured.

EXAMPLE 126

Electronic and electric apparatus, such as computers has been rapidly developed recently. Electronic parts used in these apparatus, especially semiconductor, feature high integration, large capacity, high speed and large heat flux density. Traditional heat pipe cooling approaches are applicable to the cooling of the thyratron, diode, inverter and converter of electric machines. There are more than eight million heat pipes produced per year for cooling electronic devices in the audio apparatus. The heat transfer element of the present invention can solve the technical problem existed in the present technology. FIG. 11K shows an IC cooler using the heat transfer element of the present invention. As FIG. 11K shows, the IC cooler comprises a heat transfer plate element 1119 and longitudinal fins 1120 arranged on the sides of the heat transfer element 1119. The IC cooler is arranged between the IC and the electronic element 1121. Pins of the electronic element 1121 are inserted into the IC through the holes made on the heat transfer element 1119. The bottom of the electronic element 1121 and the heat transfer element 1119 are in close contact. When the IC is in operation, the heat from the electronic element 1121 is transferred to the high heat transfer plate element 1119 at the bottom. The heat is then passed to the longitudinal radiating fins 1120 on both sides of the high heat transfer plate element 1119 through the high heat transfer medium in the element. The heat is carried away by natural air circulation or cold water. The cooler can be arranged in series for the heat dissipation of the IC box. Since the heat transfer element of the present invention has extremely high heat flux density, its heat transfer capability is dozens of times of common heat pipe in the case of identical shape, size and application conditions. This enhances the heat-dissipating capacity to a great extent. The IC cooler adopting the heat transfer element of the present invention has the advantages of simple structure and can be formed in various shapes according to different IC.

EXAMPLE 127

It is impossible to rely upon a fan for extraordinary CPU cooling performance. An unconventional measure must be taken. Chips are usually cooled by the radiating flange and fan. It is impossible to lower the temperature of the chip under the room temperature in this way since the heat gradient is quickly balanced when the temperature of both devices becomes the same. At this time, the temperature can hardly be lowered any further; it can only be lowered to near the room temperature. The semiconductor cooling of this invention does not pollute the environment since there is no compressors and conventional cooling agent. Thermal balance is broken by powering on a specially designed semiconductor. The semiconductor cooler brings a new idea of heat dissipation such that the temperature of CPU is further controlled. When the semiconductor cooler is powered on, substrates on both ends produce certain temperature gradient. Thus its condensing surface provides a low temperature environment for the CPU. FIG. 11L is a schematic drawing of the installation of a semiconductor cooling device. FIG. 1M shows the semiconductor cooler of the device shown in FIG. 11L. As FIG. 11L shows, the separate type semiconductor cooling device comprises an axial-flow fan 11122, an aluminum radiator 1123 and a semiconductor cooler 1124. The bottom of the semiconductor cooler 1124 is in close contact with the upper surface of the radiator 1125 (microprocessor). Thermal glue is applied to both surfaces for better contact. Powered by DC, the micro axial-flow fan 1122 produces wind with the speed higher than 3.5 m/s to dissipate the heat of the radiator 1123. The aluminum radiator 1123 is a fin type heat exchanger for large heat-dissipating area and better heat dissipation performance of the air. Darkening treatment is applied to the surface to further enhance the radiation of the heat dissipation. The semiconductor cooler 1124 is a high heat transfer semiconductor cooler comprising upper and lower heat transfer elements 1126 and the heat transfer element 1127 connecting the two heat transfer elements 1126. The heat transfer elements 1126 are in a plate shape. Radiating plates with different sizes can be made according to various occasions. The heat transfer element 1127 is in the form of a soft tube connector for separate-type heat transfer. The heat from the radiator 1125 is transferred to the high heat transfer medium in the lower heat transfer element 1126 of the cooler 1124 through the upper surface of the radiator 1125. Then the heat is dissipated to the environment by the axial-flow fan 1122 and the aluminum radiator 1123. Thus, the heat is continuously transferred to provide excellent conditions for heat dissipation of the radiator 1125. The surface temperature of the micro-processor can remain low in summer. The micro-processor is cooled if the heat at the exothermal end can be dissipated and the low temperature end is consistently cooled. Heat is transferred from one side to the other side of the semiconductor, causing considerable temperature gradient between the two sides. The colder side keeps absorbing heat from the hotter side. The temperature on the cold side can even be lowered below room temperature or under 0° C. if the radiating flanges and a heavy-duty fan are arranged at the hot side to prevent the temperature from rising. The semiconductor cooling device using the heat transfer element of the present invention has the following advantages: low price, high performance, flexible accessory structure, easy to install, well-arranged structure and light, easy maintenance, long service life up to twenty years, anti-corrosion, explosion-resistant, anti-pollution and accepting both AC and DC power supply.

EXAMPLE 128

The CPU chip of notebook computers tends to be high-speed and highly integrated resulting in increase of power consumption. Thus, cooling and thermostatic strategies become fairly important. The allowed temperature increase at the heat transfer surface of the CPU chip is around 40° C. A conventional approach to notebook CPU chip cooling is air circulation cooling forced by thin plate copper cooler coupled with a micro electric device. Heat-dissipating capacity is restricted by the small size, delicate structure and limited airflow within the notebook computer. Therefore, high performance seems to contradict the trend of minimization. FIG. 11N shows an IC carried cooler for the notebook computer CPU, using the heat transfer element of the present invention. As FIG. 11N shows, micro rectangular or plate heat transfer element 1129 is embedded on IC 1130 to receive and transfer the heat from CPU chip 1128. When the notebook computer is operating, the heat produced by the CPU chip 1128 is sent to the heat transfer element 1129 through the contact area between the heat transfer surface of the chip and the heat transfer element 1129. After being heated by this process, the high heat transfer medium in the heat transfer element 1129 immediately transfers the heat to the checked and fence-like radiator on the side of the notebook computer. Finally, the heat is transferred to the surroundings by the micro fan. This IC carried cooler for the notebook computer CPU has the following advantages: enhancing the heat-dissipating capacity of the notebook computer; reducing the thickness of the cooler; simpler and better arranged structure; applicable design; solving the problem of contradiction between the high-speed and highly integrated development of the notebook CPU chip and the difficulty in heat dissipation due to increasing heat produced by the CPU chip; and stabilizing the whole system.

EXAMPLE 129

Fins and micro fans are widely used to cool the notebook CPU. Such approach has limited heat-dissipating capacity. Conventional heat-dissipating approaches can hardly satisfy the cooling requirement due to the rapid development of computer technology and increased heat produced by CPU. The heat transfer element of the present invention turns the keyboard plate of the notebook computer into a heat-dissipating area to solve the problem of heat dissipation without enlarging the size of the computer. FIG. 11O shows a notebook computer using the heat transfer element of the present invention. As the drawing shows, the notebook computer comprises a display 1131 and a keyboard 1134. The heat transfer plate element 1132 is installed below the keyboard 1134 as the lower part of the heat transfer element 1132 is in close contact with CPU 1133 of the notebook computer 1133. Featuring small thermal resistance and thermostatic effect, the heat transfer element 1132 of the present invention can transfer the heat immediately to the keyboard without thermal resistance. The keyboard becomes the heat-dissipating area for rapid heat release. This cooling device has advantages such as great heat-dissipating capacity, small size, no noise and reliability.

EXAMPLE 130

Heat dissipation in the chip modules of computers and some automatic control systems is a problem cannot be ignored. The working and heat-dissipating areas should be separated to ensure safety in operation. FIG. 11P is a 3-D view of a chipset cooling device using the heat transfer element of the present invention. As shown in the figure, the chipset cooling device comprises a heat transfer element 1136 and radiating flanges 1137. The heat produced by chip module 1135 is centralized and transferred to the heat transfer element 1136, which transfers the heat axially with no thermal resistance from the electric appliance device box to the radiating flanges 1137 outside the box. The radiating flanges 1137 distribute heat to the air by circulation to cool the chipset. This chipset cooling system is suitable for remote heat dissipation to a small heat-dissipating space. With the high axial heat distant transmission of the heat transfer element, it transfers the heat in limited chipset space to a distant destination to enhance the heat dissipation and ensure the normal operation of the chipset. The chipset cooling device has the following advantages: flexible structure, easy installation, well-arranged structure, low price, high performance, easy maintenance and long service life.

EXAMPLE 131

The most effective way to reduce the EMI of a central processing system (e.g. micro-computer or automatic processing systems) is to dissipate the surplus heat produced from the operation of central processing system. Since the heat can hardly goes out from the limited heat dissipating space, it is crucial to solve the problem with heat dissipation by transferring the heat to a larger external space. FIG. 11Q is a 3-D view of an EMI-reducing cooling device using the heat transfer element of the present invention. As FIG. 11Q shows, the EMI-reducing heat dissipation device comprises a heat transfer element 1138 and radiating flange 1140. The EMI produced by the central processing system 1139 affects the normal function of the CPU. The heat dissipating apparatus in the drawing collects the heat from the CPU effectively by the heat transfer element 1138 and then transmits the same to the radiating flange 1140 outside the central processing system 1139. The radiating flange 1140 transfers the heat to cold air in the large space by circulation to dissipate the heat and cool the CPU of the central processing system. The EMI reducing and heat dissipating system shown in the drawing is applicable to the occasions of limited heat dissipating space. By the feature of high and distant axial heat transfer, the heat transfer element transfers the heat produced from the operation of the central processing system CPU from the small space to the large space outside the central processing system. Thus, the EMI of the central processing system is reduced to ensure the normal function of the system. The EMI-reducing and heat-dissipating device has the following advantages: low price, high performance, flexible accessory structure, well-arranged structure, light and easy to be installed, easy maintenance, long service life up to twenty years, anti-corrosion, explosion-resistant and anti-pollution.

Applications to Heat Dissipation of Electronic or Electric Mechanic Appliance

The following Examples 132 to 143 show the applications of the heat transfer elements of the present invention in the field of the heat dissipation of electronic and electric mechanic apparatus. For example, top-mounted sealed radiator for electronic controllers, wall-mounted sealed radiator for electronic controllers, embedded sealed radiator for electronic controllers, sealed radiator for industrial displays, enclosed cooler for televisions, cooler of silicon controlled devices, radiator for thyristers, compressed gas intermediate stage cooler, large power cooler of the silicon controlled device in an explosion-proof casing, cooler for power modules, storage battery radiator, thermoelectric cooler, refrigerator radiator, projector heat dissipating system, cooling plate radiator, scanner cooling system and waste heat air conditioning system.

EXAMPLE 132

The heat transfer element of the present invention is applicable in electronic and electric mechanic equipment as a heat-dissipating element for, such as the radiators/coolers of sealed radiator for electronic controllers, sealed radiator for industrial displays, enclosed cooler for televisions, cooler of silicon controlled devices, radiator for thyristers, compressed gas intermediate stage cooler, large power cooler of the silicon controlled device in an explosion-proof casing, cooler for power modules, storage battery radiator, thermoelectric cooler, refrigerator radiator, projector heat dissipating system, cooling plate radiator and other electronic and electric mechanic heat dissipating apparatus.

The current electric apparatus control cabinets, the casing of the industrial display and that of the television are an opening system, such that dirt, oil, moisture and corrosive gas in the air tend to stick on the surface of electronic apparatus. This causes the disadvantages of electric apparatus, such as the temperature rising, reduced sensitivity, retarded reaction, reduced stability, shortened service life, parts be easily burned and likeness of accidents. Accordingly, there is a need for extremely clean and air-conditioned rooms for the controllers of highly precision and large-power electric elements and the casing of the industrial display to ensure proper temperature, humidity and air quality. This is not only a huge investment but also cannot be easily used. In some cases of explosion-proof applications (e.g. petroleum refining and petroleum plants), it costs a great deal of money to manufacture, design and install the anti-explosion treatment of the casing of electric apparatus control cabinets and industrial displays.

The sealed radiator has the heat transfer element of the present invention placed on the casing of the electric apparatus control cabinet, industrial display and television to transfer the heat from the elements inside the casings, thereof out. FIGS. 12A, 12B and 12C are schematic drawings of the installation of a sealed radiator using the heat transfer element of the present invention for the electric control cabinets. FIG. 12D is a partially cross-sectional view of the radiator shown in FIGS. 12A–C. As FIG. 12D shows, the sealed radiator of the electric apparatus control cabinet 1202 comprises a base-tube heat transfer element 1203, an aluminum piece 1204 and a partition 1205. FIG. 12A shows that the sealed radiator 1202 is installed on the top of the casing of the electric control cabinet 1201. FIG. 12B shows that the sealed radiator 1202 is installed on the side of the casing of the electric control cabinet 1201. FIG. 12C shows that the sealed radiator 1202 is embedded in the casing of the electric control cabinet 1201. One side of the heat transfer element is inside the electric apparatus control cabinet. FIG. 12E is a schematic drawing showing the installation of a sealed radiator for industrial displays, using the heat transfer element of the present invention. FIG. 12F is a partially cross-sectional view of the radiator shown in FIG. 12E. The sealed industrial display radiator 1207 is installed on the top of the casing of the industrial display 1206. As shown in FIG. 12F, the radiator 1207 comprises a base-tube heat transfer element 1208, an aluminum piece 1209 and a partition 1210. FIG. 12G is a schematic drawing showing the installation of an enclosed cooler for televisions, using the heat transfer element of the present invention. FIG. 12H is a partially cross-sectional view of the radiator shown in FIG. 12G. The sealed television radiator 1212 is installed on the top of the casing of the television 1211. As shown in FIG. 12H, the radiator 1212 also comprises a base-tube heat transfer element 1213, an aluminum piece 1214 and a partition 1215. The sealed radiator transfers the heat produced by the elements inside these casings out. Since the joint of casing and the radiator adopts a sealed structure, all heat dissipation is finished independently and externally. It ensures the total separation for the inside and the outside of the casing to reach the goals of safety, cleanness and electric insulation since the air flows inside and outside are not in contact with each other.

This heat-dissipating approach eliminates the heat-dissipating holes and the fans on the casing. Clean air in the control cabinet facilitates inner circulation to transfer the heat therein through the heat transfer element so that the cabinet, industrial display and television are not affected by any external factors. The sealed radiator can be used to cool most of control cabinets, industrial display and television by providing the cooling states with the temperature slightly higher (air-air dissipation mode) or lower (air-cold medium) than that of the environment. This sealed radiator even features adequate cooling capability when the temperature is up to 40° C. in summer. When the radiator is operating, the heat transfer element tube bundle situated inside or beside the control cabinet, industrial display and television absorbs and transfers the heat carried by air in the box. The heat transfer element tube bundle on the heat-dissipating side exchanges the heat with the air outside. The heat transfer element of the present invitation for the sealed radiator in the electric apparatus control cabinet, industrial display and television has the following advantages: low price, high performance, flexible accessory structure, easy installation, well-arranged integrated structure, light, no need for maintenance, long service life up to twenty years; only the ventilator requires simple maintenance every four to five years; the radiator does not compress air in the cabinet; anti-corrosion, explosion-resistant and anti-pollution; allowed working temperature is 4° C.~40° C.; the radiator accepts both AC and DC power sources.

EXAMPLE 133

Silicon controlled device (i.e. ordinary thyristers) is widely used in electrical current transformation technology to switch and control the electric energy. The feature is that the more kinds of the apparatus there are, the more control power it can be. Under these circumstances, the requirement for the radiators is becoming rigorous as the consumption of the elements increase. One side of the regular plate silicon controlled device is a positive terminal while the other side thereof is a negative one. The extension line therebetween is a door pole. The heat-dissipating mechanism of the radiator is that the element is sandwiched between two mutually insulating radiators. Larger silicon controlled devices tend to adopt a plate structure because of better heat-dissipating effect. Existing medium and large power silicon controlled devices usually use a casted aluminum radiator for heat dissipation. The element is sandwiched between two radiators and the heat dissipation is reinforced by forced fan cooling. The drawback to this casted aluminum radiator is that the radiator installed to large-power silicon controlled device must be large to increase the area of heat dissipation for proper performance since it consumes much power. The other factor is that due to the constraint of the heat transfer coefficient of aluminum, the effective heat-dissipating area on the radiator is reduced, which results in too much temperature rise to the element and affect the service life of the element. The present invention aims to provide a radiator applying the heat transfer technology to solve the problem with heat dissipation in large-power silicon controlled devices. FIG. 12I is a front view of a radiator of silicon controlled devices using the heat transfer element of the present invention. FIG. 12J is a top view of the cooler shown in FIG. 12I. As FIGS. 12I and 12J show, the silicon controlled device has two parallel substrates, namely the positive substrate 1216 and the negative substrate 1223. Plate silicon controlled device 1225 is situated in the center of the base by a centering pin. Press plate 1224 and four bolt rods 1219 are installed onto one side of the negative substrate 1223. The four bolt rods 1219 are insulated from the press plate 1224 by an insulated jacket tube 1220. Ball 1218 and spring press plate 1217 are installed onto one side of the positive substrate 1216. The press plate 1224, spring press plate 1217 and ball 1218 press the silicon controlled device 1225 lightly between the two substrates 1216 and 1233 by the pressure from the bolt rod 1219. The level of the pressure depends on the product type of the silicon controlled device to ensure that the heat transfer surfaces of the device and radiator is in good contact with each other for reducing the contact thermal resistance. One side of heat transfer element 1222 is connected with the positive and negative substrates by squeezing or expansion connection. On the other side of the heat transfer element 1222, a punched radiating flange 1221 is integrated with the heat transfer element by squeezing to ensure that the radiator and the heat transfer element are in good contact with each other and thus, reduce contact thermal resistance. The heat transfer element is made in tube shape. It can be shaped in other proper forms if necessary. The quantity and specifications of the heat transfer elements, the area of the radiating flanges and the distance between the flanges depend on the consumption of the silicon controlled devices and the heat-dissipating conditions outside the radiator. The shape of the radiating flange depends on the distance between the positive and the negative substrates after assembling the radiator that should meet the requirement for electric insulation. After the radiator of the silicon controlled device is assembled, users may arrange several radiators as a cabinet according to their needs. Insulation and connection should also be taken into account. In the working process, the heat produced by the consumption of the silicon controlled device is transferred to the vaporizing section of the heat transfer element in the positive/negative substrates through the substrates. The medium in the vaporizing section rapidly transfers the absorbed heat to the condenser section on the radiating flange through the heat insulating section. Then the heat is dissipated to the air by means of thermal radiation of the radiating flange and compulsory air circulation. Condensed medium returns to the vaporizing section and such a cycle repeats. This prevents a raise in the temperature of the casing of the silicon controlled device from exceeding the regulated value. The silicon controlled device radiator using the heat-dissipating element of the present invention features high dissipating efficiency and reduces the size of the radiator. A comparison between the silicon controlled devices with the same power consumption shows that the silicon controlled radiator adopting the heat-dissipating element of the present invention is roughly ⅔ of the shaped radiator in size. This kind of radiator has the following advantages: well-arranged structure; easy installation, replacement and cleaning; effectively reducing the raise in temperature of the silicon controlled device and extending the service life of the device.

FIG. 12K shows another application of a cooler for silicon controlled device, using the heat transfer element of the present invention. As the drawing shows, the upper surface of the silicon controlled device 1226 is in close contact with the bottom of the plate heat transfer element 1227. Radiating fins 1228 are scattered on the surface of the plate heat transfer element 1227. The heat from the silicon controlled device 1226 is transferred to the plate high heat transfer element 1227 through the surface thereof. The heat is then transferred to the longitudinal radiating fins 1228 on the plate high heat element 1227 through high heat transfer medium therein. The heat is carried away by natural air circulation or forced airflow enhanced by the fan. As FIG. 12K shows, the silicon controlled device radiator adopting the heat transfer element of the present invention has very high heat flux density. Its heat transfer capability is dozens of times higher than that of common heat pipe in the case of same shape, size and application conditions.

The radiators in the aforesaid FIGS. 12I and 12J are also applicable for the heat dissipation in thyrister. Silicon controlled device 1125 may be replaced with the thyrister.

EXAMPLE 134

In order to save power and ensure the normal operation of the compressor, gas compressors with higher compression ratio usually adopts multi-level compression supported with intermediate stage coolers. The working condition of the intermediate stage cooler correlates directly with the operation of the whole compressor module because the temperature of incoming air is directly related with the function of the compressor. Although the intermediate stage cooler has become part of the key component of various compressors, many users still choose the heat exchangers with pipe banks instead because they cannot afford the expensive price of the intermediate stages cooler. After practical operation for some time, the following problems were found in the heat exchangers with pipe banks: the cooling water treatment system is not accurate enough, which causes poor water quality and blockage inside the cooling water pipe due to incrustation; the temperature of outlets exceeds the standard value and fails to meet the requirement of the compressors, which often affects the production by causing automatic power-off of the compressors; since the cooling water pipes are made of copper and have small diameter and thin pipe wall ($\phi 9.5\times 0.75$), they may leak easily and may not be used again as they are often damaged during dredging; when the temperature of the cooling water becomes high in summer, it tends to stop the machine by making the air temperature at the outlet over the standard value.

Taking advantage of the highly homogenous temperature of the heat transfer element of the present invention, this apparatus change the condition in the heat exchanger with pipe banks that the gas goes outside the tube and the cooling water goes inside. Instead, both gas and cooling water go outside the tube. The other point is that the heat exchange area on the source and sink ends of the compressed air intermediate stage cooler is adjustable. Cleaning ports may be installed according to the quality of the water to solve the problems of poor quality of water and unendurable tubes. This arrangement also improves the efficiency in cooling of the intermediate stage cooler and ensures the proper operation of the compressor. FIG. 12L shows the structure of a box-like compressed gas intermediate stage cooler using the heat transfer element of the present invention. FIG. 12M is a top view of the cooler shown in FIG. 12L. As shown in the drawings, the central cavity of the compressed gas intermediate stage cooler is divided into two cavities by a partition. In one cavity, the air goes downwardly from the compressed gas intake 1231 to the compressed gas outlet 1236, which is an air cooler side 1229, namely the source end. In the other cavity, the cooling water goes upwardly from cooling water intake 1235 to the cooling water outlet 1232, which is a cooling water side 1233, namely the sink end. Both cavities are connected together with the heat transfer pipe element 1234. The air cooler side 1229 serves as the heating end of the heat transfer element 1234 wherein the heat carried by the air is transferred to the heat transfer element. The heat transfer element functions as a bridge by transferring the received heat to the incoming water at the cooling water side 1233, which is the heat dissipating side of the heat transfer element. The heat transfer element receives, transfers the heat and repeats this process to continuously cool the air and ensure the proper operation of the compressor. A number of cleaning holes may be installed on the box at the cooling water end in light of various water qualifies to clean the apparatus, resume the heat exchange area and maintain high heat exchange performance. Ribs 1230 should be wound around the surface of the heat transfer pipe element 1234 since the air cooler side 1229 has lower heat transfer rates. Condensed water is produced after the gas is compressed. Accordingly, a condenser water discharge 1237 is installed on the bottom of the intermediate stage cooler to avoid water hammering caused by the water into the compressor at the next level. Because the heat transfer element of the present invention is the core and the cooling water is the medium, the compressed gas intermediate stage cooler achieves the heat transfer between the air and the cooling water by means of the high homogenous temperature of the heat transfer element. This apparatus solves the problems with the performance of intermediate stage cooler with tube banks due to poor water quality as well as difficulty in pipe cleaning. It also provides safety and reliability to the compressor. The compressed intermediate stage cooler has the following advantages: simple structure leads to easy installation and modification; the whole equipment may still work even if one pipe fails; little investment, long service life and highly adjustable according to various water qualities; high heat exchange efficiency and easy to operate and clean the channels; low operation and production costs. The compressed gas intermediate stage cooler can be used not only as a selective multiple air compressor solution in new plants but also as a solution to the improvement of existing intermediate stage coolers in the plants having the aforesaid problems. There is no need for changing the existing production processes or other equipments since the compressor is easy to be replaced. It is suitable for both ordinary gas compressors and other industrial compressors using other gas as medium so that the users may choose proper material according to the gas they use.

EXAMPLE 135

Power equipment in the mining industry often adopts an anti-explosion structure. That is, the power and electronic apparatus is installed in a sealed casing, the structure of which is strong enough to prevent gas explosion inside the casing due to overheat or other reasons from going outside so as to avoid explosion of external combustible gas. Large-power silicon controlled devices are widely used in the electrical current transformation equipment in mining to switch and control the electric energy. The feature is that the electrical current transformation equipment is well sealed and the control power is large. Under these circumstances, the requirement for radiators is gradually becoming rigorous as the consumption of the silicon controlled element is high. The plate silicon controlled device is often used in the electrical current transformation equipment in mining. One side of the regular plate silicon controlled device is a positive terminal while the other side thereof is a negative one. An extension line in between is a door pole. The heat-dissipating mechanism of the radiator is that the element is sandwiched between two mutually insulating radiators. Larger silicon controlled devices usually adopt a plate structure because of its better heat-dissipating effect. Since the electrical current transformation equipment in mining is well sealed, it has poor air circulation therein. Accordingly, ordinary shaped aluminum cast radiators can hardly transfer the heat produced by the consumption of the silicon controlled device outside the sealed casing. This affects the operation and service life of the electrical current transformation equipment by increasing the temperature in the sealed casing.

Figure 120:
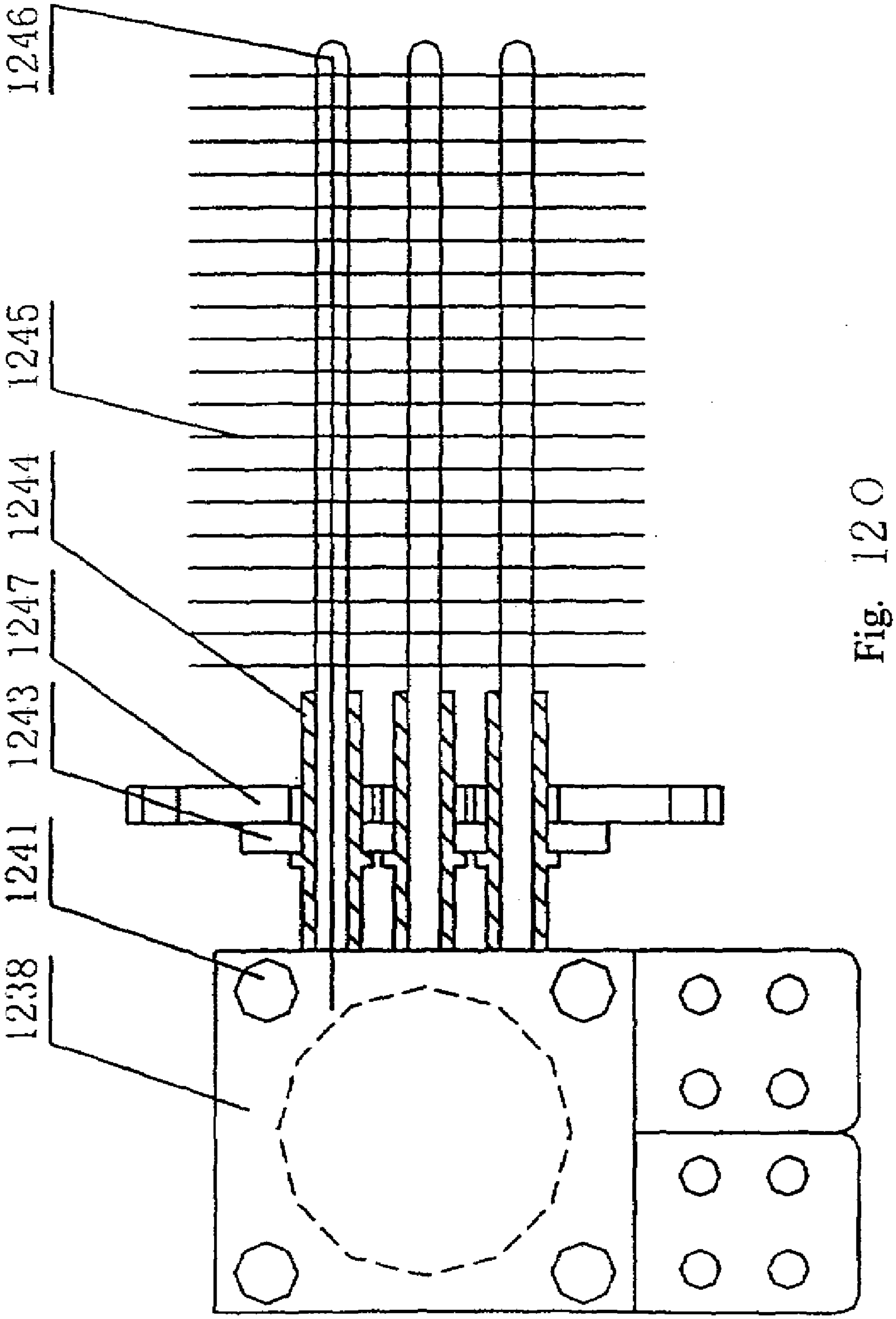

FIG. 12N is a front view of a radiator of the anti-explosion and large-power silicon controlled device inside the casing, using the heat transfer element of the present invention. FIG. 12O is a top view of the radiator in FIG. 12N. As FIGS. 12N and 120 show, the large-power silicon controlled device has two parallel substrates, namely a positive substrate 1238 and a negative substrate 1248. Plate silicon controlled device 1250 is situated in the center of the substrates by a centering pin. A press plate 1249 and four bolt rods 1241 are installed on one side of the negative substrate 1248. The four bolt rods are insulated from the press plate 1249 through an insulated jacket tube 1242. Ball 1238 and spring press plate 1239 are installed on one side of the positive substrate 1240. The press plate 1249, spring press plate 1239 and ball 1240 press the silicon controlled device 1250 tightly between the two substrates by the pressure from the bolt rods 1241. The degree of pressure depends on the types of the silicon controlled device to ensure that the heat transfer surfaces of the device and radiator is in good contact with each other for reducing contact thermal resistance. One side of the heat transfer element 1246 is connected with the positive and negative substrates by squeezing or expansion connection. On the other side of the heat transfer element, a pre-punched radiating flange 1245 is integrated with the heat transfer element by squeezing to ensure that the radiator and the heat transfer element are in good contact with each other for reducing the contact thermal resistance. The heat transfer element is made in tube shape. It can be shaped in other proper forms if necessary. The quantity and specifications of the heat transfer elements, the area of the radiating flanges and the distance between the flanges depend on the consumption of silicon controlled devices and the heat-dissipating conditions outside the radiator. The shape of the radiating flange depends on the distance between the positive and the negative substrates after assembling the radiator and should meet the requirement for electric insulation. A heat-proof and insulated jacket tube 1244 is installed on each of the heat transfer elements between the radiating flange and the substrate to enhance the insulation between the radiator, anti-explosive board 1247 and slip hole brake 1243. The anti-explosive board 1247 is fasten to the heat transfer element on the negative side through the heat-proof and insulated jacket tube 1244. The bore of the anti-explosive board on the positive side should be larger than the external diameter of the heat transfer element so as to create certain space between the positive and negative substrates for installation. The slip hole brake 1243 is tightly fastened to the heat transfer element on the positive side through the heat-proof and insulated jacket tube to seal the apparatus. The anti-explosive board 1247 separates the large-power silicon controlled device from the radiating flange to prevent a raise in temperature of the casing of the silicon controlled device from exceeding the regulated value. When assembling this kind of radiator of the silicon controlled device, users may arrange several radiators and other electric equipment as sealed anti-explosive electrical current transformation equipment according to their needs. Insulation inside and connection should also be taken into account. In the working process, the heat produced by the consumption of the large-power silicon controlled device is transferred to the vaporizing section of the heat transfer element in the positive/negative substrates through the substrates. The medium in the vaporizing section rapidly transfers the absorbed heat to the condenser section on the radiating flange through the heat insulating section. Then the heat is dissipated to the air outside the anti-explosive casing by means of thermal radiation of the radiating flange and air circulation. Condensed medium returns to the vaporizing section and such cycled circulation repeats. This prevents a raise in the temperature of the casing of the silicon controlled device from exceeding the regulated value. This kind of radiator has the following advantages: high heat-dissipating efficiency helps solving the problem of heat dissipation inside the anti-explosive large-power silicon controlled device; well-arranged structure; easy installation, replacement and cleaning; reducing the raise in temperature of the silicon controlled device and extending the service life of the device.

EXAMPLE 136

Power systems in PBX and digital communication equipments are designed in modulization, which can be divided into AC-DC and DC-DC modules. Both modules adopt a switch voltage stabilizer instead of heavy 50 Hz power frequency transformer. Technologies such as direct AC transformation, high-frequency fluctuate switch and PWM (pulse width modulation) are used to convert AC into DC 48V for power output. Then the oscillator converts DC 48V into high-frequency rectangular wave or sinusoidal wave voltage, which is supplied for various cables in communication equipments after being converted into various low-voltage DC through high frequency and stable voltage filtering.

The modular design in power supply features high efficiency and a wide range of voltage stabilization. The voltage of input currents in the AC-DC module can be either 220V or 380V while output voltage is 48V. Currents may range between 10A and 200A, with power conversion efficiency of from 88% to 90% and power consumption of from 60 W to 1,100 W. Thus the crux of this technology is tackling the problem with heat dissipation in power modules. Based on shape or physical structures, current DC-AC module radiators have low heat transfer efficiency and a large size. Once the module consumes more than 500 W of power, these radiators can scarcely fulfill the demand for heat dissipation.

FIG. 12P is a front view of a cooler for power modules using the heat transfer element of the present invention. FIG. 12Q is a top view of the cooler in FIG. 12P. As shown in FIGS. 12P and 12Q, structurally there should be two bases 1258 on the power module box 1251 for the installation of module power devices. The surface for installation of the bases should be clean enough to a certain extent to reduce contact thermal resistance. On each side of the base, a controller and auxiliary IC 1252 should be installed parallel to the base. Distance between the device and the IC should meet the requirement for electrical connection therebetween. One side of heat transfer element 1256 is linked to the base by expansion connection while the other is linked to fin by pressing to embody the cooler as integrity. The design in diameter and number of the heat transfer elements and the area of fins should depend on the maximum power consumption. Ventilation channel 1255 is installed behind the power module box, as shown in FIG. 12P. Air inlet and outlet locate respectively below and above the air channel. Axial-flow fan is installed above the air channel. The blast scale and stable pressure of the fan should meet the maximum in heat dissipation of the cooler. There is a sealed fixer 1253 between the base and the air channel. The fixer may be processed with phenolic boards. The sealed fixer should be assembled with the two bases as an integrated device to seal the apparatus and support the base. This structure allows the parallel installation of several coolers according to the need for enlarging power capacity. By adopting this structure, the size of power modules in large communications witch equipment can be reduced greatly and the weight of the cooler can also be reduced. In operation, heat produced by friction of the power module travels to a vaporizing segment of the heat transfer element on the base of power module 1258 via the base. The medium in the heat transfer element rapidly sends heat to a condenser segment on the heat transfer element through an insulating segment. The condenser segment then transfers heat to the surface of fins 1257. The heat is then discharged to the air by means of compulsory counter airflow enhanced by the fan. This prevents a raise in temperature of the casing of the power devices on the board from exceeding the regulated value. The power module cooler according to the present invention has the following advantages: small size and light weight, which is only ½ to ⅔ of the mechanical cooler; easy to install, which makes it convenient to replace and clean the device and install the base; high heat-dissipating rates, which help reduce both in temperature raise of the power module device and an temperature increase in environmental of other electronic devices nearby, and thus extend the useful life of the power and electronic devices.

EXAMPLE 137

The storage batteries available in the current market and in service tend to adopt on small current and long recharging time to avoid overheating the central plate during recharging. The storage battery radiator with the heat transfer element of the present invention facilitates rapid heat dissipation in high-current recharging, and thus reduces recharging time and achieve fast high-current recharging. The radiator is coupled with a full range of storage batteries. The design is described as follows. A partition or casing is placed inside the storage battery in the original structure to form a sealed casing, the material of which is treated specially to make it insulated. The radiator inserts into the casing so that heat produced by high-current electricity is sent rapidly to the top (see the side view) outside the casing of the store battery via the heat transfer element of the radiator. Heat dissipation may be facilitated by natural or forced counter airflow outside the casing of the storage battery according to the recharging current and the extent of heating.

FIG. 12R is a 3-D drawing of the installation of a water-based storage battery radiator for televisions, using the cooling element of the present invention. FIGS. 12R', 12R'' and 12R''' in turn stand for front, side and top views of the radiator in FIG. 12R. FIG. 12'''' is a partially cross-sectional view of a part cut along the arrow AA in FIG. 12R'. As the figure shows, plate heat transfer element 1259 and clamping wall pipe heat transfer element 1262 in the sandwich cavity are welded together to make five sealed cavities (the number of cavities varies with the specifications of storage batteries). The casings insert into space between the battery pieces in the storage battery casing 1260 as a key component of heat transfer. Both sides of the inner pipe of the clamping wall pipe heat transfer element 1262 are welded to water intake 1261 and water outlet pipe 1263 respectively to make a circulating waterway. When the storage battery is being recharged with high current, plate heat transfer element 1259 absorbs heat inside the battery and soon transfers it into the sandwich cavity in the clamping wall pipe heat transfer element 1259. Finally heat is carried away by cold circulating water in the inner tube of the clamping wall pipe heat transfer element 1259.

FIG. 12S is a 3-D schematic diagram of a forced/natural air radiator for storage battery, according to the cooling element of the present invention. FIGS. 12S' and 12S'' stand for front and top views of the radiator in FIG. 12S FIG. 12S''' is a zoom-in view of circle A in FIG. 12S'. As the figure shows, the external casing comprises sealed outer casing of the plate heat transfer element 1264 and inner casing of the plate heat transfer element 1265. Inner casing of the heat transfer element 1265 (bottom) is divided into five homogenous plate heat transfer elements 1266 (the number of cavities varies with the specifications of storage batteries). The inner cavity of the plate heat transfer elements 1266 are linked with that of the inner casing of the heat transfer elements. In recharging with high current, plate heat transfer element 1266 absorbs heat inside and soon transfers it to the air via the inner casing of the heat transfer element 1265 and the outer casing of the heat transfer element 1264.

FIG. 12T is a 3-D drawing of another embodiment of the forced/natural air radiator for storage battery, using the cooling element of the present invention. FIGS. 12T', 12T'' and 12T''' stand for front, side and top views of the radiator in FIG. 12T. FIG. 12T''' is a zoom-in view of circle I in FIG. 12T'. As shown in the figure, the heat transfer cavity 1268 is composed of six vertical plate heal: transfer elements (the number of cavities varies with the specifications of storage batteries) and a horizontal plate transfer element, which are welded together. The cavity inserts into space between the battery pieces in the storage battery casing 1267 as a key component of heat transfer. Fins 1269 are arranged on the upper surface of heat transfer element cavity 1268 to enlarge the heat-dissipating area and boost high exchange performance. When the storage battery is being recharged with high current, heat transfer element cavity absorbs heat inside and soon transfers it into the environment via fin 1269. The storage battery radiator in FIGS. 12S–12T has the following advantages: compact structure; excellent heat transfer and heat-dissipating performance; reduces recharging time; suitable for a full range of applications by coupling the radiator with various storage batteries.

EXAMPLE 138

Technology of thermoelectric cooling was discovered at the beginning of the 20 century. Applications for the technology came out in the 1950s and have become a new branch of cooling technology with wider options in all technical domains as long as the development of semiconductor materials. FIG. 12U shows the theory of the operation of a thermoelectric cooler. As shown in the figure, a p-type semiconductor element 1270 and an n-type semiconductor element 1273 are linked together with copper piece 1274 into a thermocouple. After connected to power supply 1272 via electric wire 1271, temperature gradient and heat transfer are produced at the port. The electric current goes in the direction of n→p on the upper connector. It is a sink end since temperature drops and heat is absorbed here. The electric current goes in the direction of p→n on the lower connector. It is a source end since temperature rises and heat is released here. Heat transfer is enhanced by the heat exchanger as the source end keeps dissipating heat and stabilizes temperature while the sink end lowers temperature by absorbing heat. The operational theory of the thermoelectric cooler shows that using the heat exchanger for effective heat transfer serves as a crux of thermoelectric cooling. FIG. 12V shows a portable thermoelectric cooler using the heat transfer element of the present invention. FIG. 12W is a 3-D schematic drawing of the thermoelectric cooler. As shown in FIG. 12V, stain-less small roll 1276 forms working volume, surrounded by stainless steel shell 1278. The sandwich between the small roll 1276 and the stainless steel shell 1278 is filled with PU thermal insulating layer 1277 for good insulating effect. The stainless steel casing is wrapped with lid 1275 filled with PU. Semiconductor devices are arranged below the small roll 1276, constructing thermopile 1280. The sink end of thermopile 1280 is closely linked to the small roll 1276 as thermal methicone is applied over the contact surface. The source end and heat transfer element 1279 are linked together. The tube nest goes out from the top into the air to construct the radiator at the source end. According to the heat transfer theory of heat transfer element 1279, heat is continuously sent to the external environment to provide thermopile with good heat-dissipating conditions. The thermoelectric cooler is easy to carry since it has a handle. This kind of thermoelectric cooler has the following advantages: high heat exchange efficiency; small size, light weight, easy to carry and flexible; the heat transfer of inorganic high heat transfer elements is single-way, i.e. heat can only travels one way from the heating segment to the cooling one, not in both ways; the heat transfer is not poisonous, polluting and corrosive. The thermal layer made of foam PU as integrated embodiment features good thermal insulation. The cooler is particularly suitable for transporting and storing small-amount products since it is minimized, without the cooling solution, complex mechanic equipment and piping system.

EXAMPLE 139

The existing refrigerator radiators are based on coil tubes in structure to enhance heat dissipation with natural counter current. There are a number of disadvantages such as complex structure, low heat transfer intensity and failure frequently caused by leak due to external force or corrosion. More severely, the leak of cooling solution probably pollutes air, threatening users' personal safety. FIG. 12X shows a refrigerator radiator using the heat transfer element of the present invention. FIG. 12X' is a left side view of the radiator in FIG. 12X. As shown in the figure, the refrigerator radiator comprises pipe heat transfer element 1281 and heat exchange container 1283. The heat transfer element outside the refrigerator cools the cooling solution by means of air natural counter current. The heal: exchange container is composed of small linking cavities to ensure that the pressure of the cooling solution from the compressor is stable. After cooled by heat transfer element 1281, the cooling solution comes from cooling solution intake 1284 to cooling solution outlet 1285, entering the next procedure. The heat-dissipating segment adopts fin 1282 to enlarge the heat transfer area for better heat exchange effect. Heat transfer element pipe 1281 and heat exchange container 1283 are linked together by welding. The heat exchange container is made as an integrated structure to seal it more perfectly. During the working process, the temperature of the compressed cooling solution increases. The cooling solution transfers heat to the heat transfer element via the heat exchange container. Then the heat transfer element sends heat to the surrounding environment via fins. The refrigerator radiator has the following advantages: simple structure seals better; enhancing better sealing and isolating features, i.e. separation from the source and the collecting end. The separated refrigerator cooling solution and cooling substance conduct heat transfer in two places so that flows from both ends will not get mixed.

EXAMPLE 140

The system of a projector produces considerable heat after it runs for a period of time. It is necessary to dissipate part of heat to stabilize the system. FIG. 12Y shows a projector using the heat transfer element of the present invention. As the figure shows, the projector is composed of projecting and heat-dissipating systems. Similar to ordinary projectors, the projecting system comprises circuit controlling system 1286, concoctive reflecting plate 1287, light source 1288 and lens 1290. Film 1289 goes in front of concoctive reflecting plate 1287 and light source 1288. The heat-dissipating system comprises heat transfer element 1291, cooling air channel 1292 and fin 1293. Different from conventional elements, the concoctive reflecting plate 1287, film partition and the endothermic segment of the heat transfer element are closely linked as an integrated sealed cavity. During the operation of the projector, electricity goes through the light source 1288, where most energy is converted into optical energy. A small amount of energy goes into the projector system in the form of thermal energy. Heat tends to get together in existing projectors due to poor heat-dissipating conditions. With the heat transfer element of the present invention, heat given by the light source 1288 is transferred to heat transfer element 1291 by means of radiation and counter current. Then the heat transfer element quickly sends heat out and spreads it evenly on the fin 1293. Air in the cooling air channel 1292 is forced to produce counter airflow. The air becomes hot wind and is taken away after fully exchanging heat with the fin. As the process repeats itself, the system will not overheat as the projector is in a stable thermal condition. It boosts the function and useful life of the apparatus by avoiding film damage due to overheat and preventing other devices from system overheating. The projector heat dissipating system has the following advantages: small thermal resistance, high heat-dissipating performance, well-arranged and flexible structure and more adaptable for thermal flux.

EXAMPLE 141

In order to achieve heat dissipation under the circumstances that no increase allowable in the latitudinal heat-dissipating section, it is necessary to extend the heat-dissipating section longitudinally on the existing cooling plate radiators. The higher the longitudinal section is, the lower the heat transfer efficiency becomes and thus reduces the heat-dissipating efficiency of the whole radiator. The heat transfer element of the present invention boosts heat-dissipating efficiency on the longitudinal section. It reduces the size of the radiator and makes the most of space with proper heat dissipation load. FIG. 12Z shows a cooling plate radiator using the heat transfer element of the present invention. FIG. 12Z' is a left side view of the radiator in FIG. 12Z. As shown in the figure, the cooling plate radiator comprises heat transfer element 1294, aluminum plate radiator 1295 and aluminum radiator 1296. Make sure that the contact surface of the linked aluminum plate radiator and the aluminum radiator should top 80% to reduce contact thermal resistance. When temperature difference between the base and the air is stable, heat-dissipating efficiency is between 40% and 50% when the longitudinal section is between 70 and 80 mm in height. The heat-dissipating efficiency drops further when the height of the heat-dissipating section increases. As shown in FIGS. 12Z and 12Z', the cooling plate radiator comprises aluminum plate radiator and heat transfer element radiator. The height of aluminum radiating ribs should not exceed 20 mm so that the thermal efficiency of the ribs may reach 70%–80%. The high heat transfer efficiency of the heat transfer pipe element of the present invention is used to link the heat transfer pipe element and aluminum radiating base board. Aluminum pieces are installed to the sink end of the pipe element as sleeves so the heat-dissipating efficiency of the pieces is ensured as between 70% and 80%. The combination of both parts ensure the heat-dissipating efficiency of the current cooling plate radiator between 70%–80%, which is more than existing cooling plate radiators by 20–30%. In other words, the total heat exchange coefficient K of the radiator in FIGS. 12Z and 12Z' is 20–30% higher than that of existing cooling plate radiators. To transfer heat, the cooling plate radiator sends heat given in the working process of electric and electronic devices to the aluminum heat-dissipating base first. The base divides heat into parts that one is discharged by the ribs on the aluminum dissipating board and the other is transferred to the aluminum radiators via heat transfer pipe elements. Heat is soon taken away in forced air cooling. The cooling plate radiator has the following advantages: small thermal resistance and high heat-dissipating performance; compact structure and flexible structure; more adaptable for thermal flux. As large-power electric devices will become one of crucial directions in rapid industrial development, problems with heat dissipation for electric appliance will be more significant. Traditional approaches may hardly achieve heat dissipation. The aforementioned high heat transfer cooling plate radiator effectively tackles the problem. It features a promising future and considerable potential application and business values.

EXAMPLE 142

The increasing temperature of the scanning head and electronic parts of a scanner not only affect the function of the scanner but also its useful life. Thus the heat dissipation of the scanning head and electronic parts of the scanner is extremely crucial. FIG. 12ZA is a schematic drawing of a scanner cooling system using the heat transfer element of the present invention. As shown in the figure, the scanner cooling system comprises scanning head and electronic parts 1297, heat transfer tube element 1298 and fin 1299. The scanner cooling system comprises scanning head and electronic parts 1297 produces heat in operation. Heat travels to the heat transfer element 1298 via heat transfer tube 1298, which continues to transport heat axially to the fin 1299 on surface of the scanner casing with no thermal resistance. The flange 1299 dissipates heat by counter current heat exchange to cool the scanner. This scanner cooling system is suitable for limited heat-dissipating space. Applying high axial heat operation of the heat transfer element, it transport heat in the small space of the scanner to the surface of the casing for dissipation. The scanner heating solution has the following advantages: flexible structure, easy installation, compact structure, low price, high performance, easy maintenance, long comprehensive useful life and high heat-dissipating performance. These achieve better scanner performance and longer useful life.

EXAMPLE 143

Air conditioning systems achieve a wide range of applications. Most of current cooling and air condition equipment is based on steam compression or absorb cooling, which causes massive energy consumption. Statistics regarding summer power supply show that 20–30% of total electricity consumption lies in cooling and air condition. The scope of these applications is much limited since the cooling solution (fluoride) used in the steam compression approach does not comply with the environment. The other thing is that vast heat is wasted in all businesses. For example, afterheat carried by smoke is discharged into the air in various furnaces and afterheat produced by internal combustion power plants, etc. The use of the heat transfer element of the present invention achieves cooling by afterheat by means of fostering cooling circulation with afterheat. The key component of the absorbing cooling system is an absorbing bed coupled with a heat intake. The total cooling capability and the size of the whole cooling system depends on the circulating rates of the cooling medium in the absorbing bed and the performance of heat transfer medium. FIG. 12ZB shows part of a heat recovery cooling system using the heat transfer element of the present invention. As the drawing shows, the heat recovery cooling system comprises absorbing bed 2601, upper linking pipe 2602, heat intake composed of fin tubes 2603 and lower linking pipe 2604. All these parts are linked together as a sealed cavity. Absorbing bed 2601 contains absorbing and cooling solutions 2606. The absorbing bed, upper linking pipe, heat intake and lower linking pipe are heat transfer elements based on the present invention. The cavity is filled with heat transfer medium 2605 of the present invention. After the heat intake 2603 absorbs afterheat, high heat transfer medium 2605 transports heat to the absorbing bed 2601, making the absorbing solution in it absorbing bed stripping the cooling solution. In other words, the cooling solution absorbs heat and stripping. When air of the room temperature goes through the heat intake composed of fin tubes 2603, high heat transfer medium makes cool the absorbing solution in the absorbing bed as the steam pressure of the cooling solution in the system is lowered. This helps the vaporizer cool air by absorbing heat outside and constructs a basic cooling cycle. In addition to the advantages of the absorbing system, the waste heal: recovery cooling system have the following advantages: absorbing bed transfer medium; excellent heat transfer feature;

compact in structure; small size; light weight; suitable for various absorbing-cooling solution medium pairs.

Applications to Heat Dissipation of Medical Treatment Apparatus

The following Examples 144 and 145 show applications of the heat transfer elements of the present invention to heat dissipation in medical apparatus, such as doze-preventing cold hat and thermoelectric cooling beauty device.

EXAMPLE 144

Drivers of cars, trains and ships tend to doze when it is too warm in the cabin. This will probably cause grave traffic accidents. A doze-preventing cold hat consuming no or very little electricity is developed since it should not take too much valuable energy in the storage batteries used in transport means. The hat is necessary for it cools drivers' forehead or temples to keep them awake.

The high heat transfer doze-preventing cold hat developed by this embodiment achieves in partial cooling of the head and promotes drivers' safety in driving.

FIG. 13A shows the following structure of the high heat transfer doze-preventing cold hat: one high heat transfer heat transfer tube 1305 and two high heat transfer heat conducting boards 1304 are linked together as a sealed system. The external wall of the high heat transfer tube 1305 is enveloped by fins 1308. P-n semiconductor thermoelectric cooler 1302 is the core cooling part comprising copper plate 1301 and several pairs of combined p-n insulating material 1303. The thermoelectric cooler is designed exclusively according to power source voltage and details are not described here. Fan 1307 is an optional component, reinforcing heat exchange by creating enough wind blowing the fins 1308. The storage battery in the vehicles or ships supplies electricity.

The sink end of the hot point cooler is in close contact with the temples. Bodily heat is carried to the source end and sent to medium in the high heat transfer plate element. With the fan 1307 in light of the feature of high-efficiency heat transfer elements of the present invention, heat is transported to the fin 1308 and then to the environment through natural counter current or heat exchange forced.

The doze-preventing cold hat of the present invention has the following advantages: well-arranged structure, great cooling capacity and little electricity consumption. Suitable for drivers of all kinds of transportation, the hat reduces traffic accidents by preventing drivers from dozing. It may also be used to lower the temperature of a patient's head and in spacecraft and tanks to improve control and force.

EXAMPLE 145

Technology in thermoelectric cooling first developed at the beginning of the last century. Applications regarding the technology came out after the 1950s and have become a new branch of cooling technology with wider options in all technical domains as long as the development of semiconductor materials.

The high heat transfer portable thermoelectric cooling beauty device of this embodiment is a high performance cooler concerning thermoelectric cooling, a perfect combination of semiconductor electronic technology and high heat transfer elements according to the present invention.

Advantages of the high heat transfer portable thermoelectric cooler include small size, outstanding cooling performance and easy to carry. It is used for normal skin care to tackle the problem with a large wound area caused by liquefied nitrogen technology. When used in beauty treatment after the surgery, it emerges as a new star in beauty apparatus by preventing the wound from being inflamed and helping it heal.

FIG. 13B shows the following operational theory of the thermoelectric cooler: a p-type semiconductor 1309 and an n-type semiconductor 1312 are linked together with copper piece 1313 into a thermocouple. After connected to power supply 1311, temperature gradient and heat transfer are produced at the port. The electric current goes in the direction of n→p on the upper connector. It is a sink end since temperature drops and heat is absorbed here. The electric current goes in the direction of p→n on the lower connector. It is a source end since temperature rises and heat is released here. Pairs of semiconductor thermopiles are arranged in series on the circuit, making a cold-preventing thermopile. The upper side is the sink end and the upper one is the heat end after DC power is connected according to the drawing. Heat transfer is enhanced by the heat exchanger as the source end keeps dissipating heat and stabilizes temperature while the sink end lowers temperature by absorbing heat. The operational theory of thermoelectric cooling reveals that using the heat exchanger for effective heat transfer serves as a crux of thermoelectric cooling. One of the features of high heat transfer elements is high heat transfer rates, which make the combination of thermoelectric cooling and high heat transfer rate possible.

As shown in FIG. 13C, the high heat transfer portable thermoelectric cooling beauty device comprises cold end 1317, which is closely linked to the bottom of the sink end of thermopile 1318. A layer of thermal methicone is applied to the contact surface. Cold setting ring 1315 and cold insulating sleeve 1316 effectively keep the low temperature at the cold end. High heat transfer element 1319 and water tank 1320 are linked to the source end of thermopile 1318 to improve cooling performance by high heat transfer elements, which are quick to start and have high heat transfer rates. Water pipe connector 1321 and the water tank are linked together as a water supply circuit. Handle 1314 imitates the shape of the hand so that it is easy to use. The cold end of the device may be made in various shapes according to the needs in surgery and skin treatment.

The high heat transfer portable thermoelectric cooling beauty device of the present invention is a kind of high-tech products. Different from traditional cooling beauty solutions, it does not cause any side affect or poison the skin because it does not use any cooling solution. This apparatus sounds like good news to patients since it is flexible, easy to operate and can be used in various applications.

Applications to Heat Dissipation in Daily Products

The following Examples 146 to 151 show applications of the heat transfer elements according to the present invention to heat dissipation in daily products such as drink cooling stick, cooling cup, lamp radiator, food container, thermoelectric cooling food container and drink cooler.

EXAMPLE 146

It is absolutely necessary to develop a kind of cooling stick for drinks to protect consumers, esp. children, from being burned and save dining time.

The high heat transfer cooling stick for drinks in FIG. 14A comprises high heat transfer heat conducting element 1401, fan 1404, electric mechanics 1405, battery 1406 and casing 1402. One side of the high heat transfer element is a smooth tube, which is plugged into drink to absorb heat. Then the medium inside the element transports heat rapidly to the other end (exothermal end). There are ribs 1403 along the axis, the structure of which is shown as A—A, to enlarge the area of counter current heat exchange with air. A small fan powered by battery is installed above the exothermal end to boost heat exchange rates by blowing air for heat exchange with the end plugged into the drink. Air is also blown to the surface of the drink to lower its temperature by speeding up heat exchange via vaporization there.

The high heat transfer drink cooling stick of the present invention has the following advantages: slim and smart shape; powered by battery instead of external power supply; quick heat dissipation; easy to use and carry.

EXAMPLE 147

Enjoying scenery in nature has become a fashion as the progressive development of civilization and improvement of people's living standards. It can be unpleasant, however, that packed cool drinks become warm on an outing due to the rising temperature in hot days.

A kind of high heat transfer cooling cup adopting the present invention is developed in this embodiment. It succeeds in controlling and reducing the temperature of drinks.

The high heat transfer cooling cup of the present invention in FIG. 14B applies a traditional structure, comprising cup 1407 and lid 1411. The cup 1407 has a double-layer structure. Space between internal wall 1408 and the external wall is treated to be a vacuum so it is thermal insulated. The bottom of the lid 1411 comprises high heat transfer element 1409 and high heat transfer heat conducting plate element 1410. Inside the lid 1411 is a gully-like space 1414. There is a round top cover 1413 that can be screwed on and off on the top of the lid. The circumference inner wall of the lid 1411 and the lower surface of the top cover 1413 are composed of insulating materials 1412.

To use the product, someone has to screw off the top cover 1413 first, and then put edible ice cubes in the space 1414 and screw on the top cover 1413. Pour the drink to be cooled into the cup 1407 and screw off the lid 1411. The high heat transfer element 1409 soon takes the heat of the drink to the gully-link high heat transfer plate element, where the ice cubes in the top cover 1413 absorb heat. The drink is kept cooled since the heat of it is continuously sent away by means of high heat transfer element.

The high heat transfer cooling cup of the present invention has the following advantages: simple structure, easy to use and carry and significant cooling performance.

EXAMPLE 148

As large-power electric devices will become one of crucial directions in rapid industrial development, problems with heat dissipation for electric appliance coming along will be more significant. Traditional approaches may hardly achieve heat dissipation. Since lamps have larger normal power, power consumed also increases. This causes overheat, safety concerns and shorter useful life. The high heat transfer lamp radiator of the present invention accomplishes effective heat dissipation, improving the performance of lamps.

As FIG. 14C shows, heat of large-power lamps is often given out from both ends of light tube 1415. High heat transfer heat conduit 1417 transports heat at both ends to above lamp cover 1416, where fin 1418 dissipates heat. The high heat transfer lamp radiator 1417 comprises an endothermic ring and an exothermal tube, which are sealed and linked together. The endothermic ring enveloping the exothermal end of the light tube absorbs heat. Fins envelope the tube and dissipate heat by fan and natural cooling. Fan cooling is suitable for industrial applications while natural cooling befits family use.

The high heat transfer lamp radiator of the present invention effectively tackles the problem with heat dissipation of large-power lamps since it has advantages such as compact, flexible structure and high heat-dissipating performance. It features a promising future and considerable potential application and business values.

EXAMPLE 149

This embodiment is related to an application of high heat transfer elements of the present invention to food containers. It keeps food fresh by reducing the temperature of food storage through heat exchange enhanced high heat transfer pipe between a certain sink source (e.g. ice) and food.

As FIG. 14D shows, a high heat transfer food container consists of four parts, namely box lid 1419, cold medium container 1420, high heat transfer heat conduit 1421 and embodiment of the food container 1422.

The embodiment of the food container 1422 is below the container as the cold medium container 1420 is above the container 1422. High heat transfer conduit 1421 penetrates vertically and is welded to the bottom of the cold medium container. The food container 1422 and the box lid 1419 are made of non-metal material of high insulating performance. The cold medium container 1420 is made of metal so that it can be properly welded to the high heat transfer heat conduit. The container and the lid are linked together with a quick cassette structure.

The working process of the high heat transfer food container is described as follows. When a certain cooling source is placed in the cold medium container, which is put on the top of the food container, the high heat transfer conduit inserts into food to be cooled. The cooling source absorbs continuously the heat of food and eventually keeps food fresh by lowering the temperature.

The cooling source and food in the high heat transfer food container of the present invention are totally separated to prevent food from being polluted. The high heat transfer conduit contributes to the excellent thermostatic performance of the food container by transporting heat quickly and distributing it evenly throughout food.

EXAMPLE 150

This embodiment is a novel device combining high heat transfer and thermoelectric cooling technologies. Using high heat transfer tubes instead of fins at the source end of the traditional thermoelectric cooler, it reduces the temperature of food storage and keeps food fresh by releasing heat absorbed by semiconductor devices from the working space to the air through high heat transfer tube.

The thermoelectric cooler is made in light of the theory that materials of thermoelectric energy conversion cool things when powered by DC. Thermoelectric cooling is often called semiconductor cooling since semiconductors have the best thermoelectric converting performance. The theory of the operation of a thermoelectric cooler is already shown in FIG. 13B so it is not repeated here.

The present invention applies high heat transfer tube to the heat-dissipating apparatus in the thermoelectric cooler so as to release heat produced at the source end of the cooler to the air. By repeating the process above, it reduces the temperature of the working space and keeps food fresh.

As FIG. 14E shows, a high heat transfer thermoelectric food container consists of four parts, namely working space 1423, semiconductor element 1424, exothermal end 1425 and high heat transfer heat conducting tube 1426.

The high heat transfer thermoelectric food container of the present invention provides good transfer performance since it uses high heat transfer tubes instead of fins at the source end of the traditional thermoelectric cooler. In case of the same heat-dissipating area, the high heat transfer tube needs smaller volume than that of the conventional fin. The deduction in size of the radiator makes it highly portable.

EXAMPLE 151

This embodiment quickly cools scalding drinks by adopting the high heat transfer element according to the present invention. To make drinks of the proper temperature for babies, drinks such as hot milk made of boiling water are usually cooled by soaking the container into cold tap water or let it cooled naturally. These methods take a long time so that babies or children tend to get impatient and unsettled.

Therefore this embodiment furnishes a kind of cooling equipment, namely high heat transfer drink cooler, which cools drinks quickly since it features high heat transfer rates.

As shown in FIG. 14F, the high heat transfer drink cooler of the present invention comprises three parts: (1) the heat transfer element is divided into upper and lower parts. The former contains fin 1431 and the latter is heat transfer element 1429 in the bottle; (2) the fixer of the bottle; (3) fan 1432.

To cool the drink quickly, the high heat transfer drink cooler is plugged into the container and screw it on. The fan is powered on by connecting the wire to the power supply. The speed of heat transfer of the element is tens of thousands times than that of silver and the fan moves heat away rapidly so that hot drinks can be cooled in a short time.

The high heat transfer drink cooler according to the present invention has high practicability since it has high heat transfer rates and speed heat transfer performance.

Heat-Dissipating Applications to Mechanic Processing Apparatus

The following Examples 152 to 158 show applications of the heat transfer elements of the present invention to heat dissipation in mechanic processing, such as machine center guiding tracks, the main axis of the machine centers, drills, cutting tools, plastic-injecting molds, high-polymer extruding machine screws and mining drills.

EXAMPLE 152

The high heat transfer medium of the present invention or heat transfer elements based on it can be applied to mechanic processing or tools to dissipate heat produced by mechanic processing apparatus or tools in the working process. For instance, it can be used in machine center guiding tracks, the main axis of the machine centers, cutting tools, plastic-injecting molds, high-polymer extruding machine screws, mining drills and other apparatus or tools for quick heat dissipation.

The machine center guiding track slides at high speed, producing vast heat due to abrasion in operation. The machine center guiding track should be cooled or dealt with thermostatic treatment to avoid lowered processing precision. FIG. 15A is a side view of machine center guiding tracks using the high heat transfer element of the presented invention. FIG. 15B is a cross-sectional view of the track in FIG. 15A. Machine center guiding track 1501 comes in a triangle or other shapes. There is a circular cavity 1502 inside track 1501 near the sliding surface. The inner surface of the circular cavity 1502 comprises heat transfer medium of the present invention. Featuring outstanding heat conductivity, the high heat transfer medium of the present invention transports longitudinally frictional heat produced by the sliding track so that the temperature is distributed evenly along the track. The high heat transfer medium of the present invention achieves a machine center guiding track with good thermostatic effect, simple structure and reliability. According to current technology, lubricating oil piping is usually arranged in the track gap so as to cool the track with lubricating oil. Obviously, the machine center guiding track of the present invention tackles the following disadvantages: poor cooling efficiency; difference in cooling performance due to the constrained extent to which the cooling oil piping can reach; after the cooling oil is used for a while, the track tends to be abraded by accumulating carbon.

EXAMPLE 153

The main axis is one of the key parts of the machine center. The performance of the main axis has an important impact on quality of processing and machine center operation, esp. precise and highly precise machine centers. The main axis produces heat due to abrasion when the machine center is running. If the temperature of the main axis is too high, it affects directly the accuracy of process since the position of the pivot center of the main axis and other parts of the machine center may change. The high temperature also changes set the space between elements such as the main axis bearing and normal lubricating conditions. This not only affects the normal function of the bearing but also may cause the problem of failure caused by blockage. FIG. 15C is a side view of the main axis of the machine center using the high heat transfer element of the presented invention. For the main axis of the machine center guiding track 1503, front bearing 1504 and rear bearing 1506 serve as the source heat of abrasion. The temperature in other locations is relatively lower. If the frictional heat produced at the front bearing 1504 and the rear bearing 1506 can be sent to other parts of the main axis, the heat-dissipating area is enlarged so that the temperature of the main axis 1503 is lowered. As shown in FIG. 15C, a circular cavity 1505 is formed in the center of the main axis of the machine center 1503. The inner surface of the circular cavity 1505 comprises heat transfer medium of the present invention. When the machine center is running, the frictional heat produced at the front bearing 1504 and the rear bearing 1506 of the main axis 1503 is sent to other parts of the main axis through high heat transfer medium on the inner surface of the ring cavity 1505 in the center of the main axis 1503. Since the whole surface of the main axis serves as a heat-dissipating surface, the temperature of the front bearing 1504 and rear bearing 1506 on the main axis is lowered. The high heat transfer medium of the present invention achieves a machine center main axis with good cooling effect, simple structure and reliability. The machine center main axis is basically cooling by oil cooling in the present. Obviously, the machine center main axis of the present invention tackles the following disadvantages in current cooling approaches: the constrained extent to which the cooling oil piping can reach; difference in cooling performance; after the cooling oil is circulated and used for a while, the main axis tends to be abraded by accumulating carbon.

EXAMPLE 154

It is necessary to cool cutting tools in the process of metal cutting and machining. The current cooling approach relies on the use of a cutting liquid. The disadvantage of this approach is that chlorine, sulfur and phosphorus ions in the cutting liquid tend to diffuse into the work piece and affect its quality. In addition, cutting liquid cannot be used in some cutting tools such as hard alloy cutters and ceramic ones. 40% of metal cutting lies in punching in the process of cutting processing. A drill is frequently used as a processing tool. The drill works inside the work piece so its structure and size are limited. It can be more difficult to cool a drill than ordinary cutting tools since the drill is used in a closed space. Particularly, when the diameter of the hole to be drilled exceeds 60 mm, the cooling solution should be distributed to several parts around the circumference. Under this circumstance, the design in the drill structure becomes complicated. FIG. 15D is a cross-sectional view of a drill using the high heat transfer element of the presented invention. As FIG. 15D shows, the drill comprises cutting blade 1507, directing segment 1508 and handle 1509. The directing segment 1508 and the handle 1509 contain a hollow structure 1510. The inner surface of the hollow structure contains the high heat transfer medium of the present invention. The cutting blade 1507 is heated in the process of cutting processing. When its temperature is rising, the high heat transfer medium in the hollow structure 1510 quickly sends heat from the blade to the directing segment 1508 and the handle 1509, which transport heat to the environment. A drill of excellent cooling efficiency, long useful life and no cooling solution becomes available by adopting the high heat transfer medium of the present invention. It can also reduce pollution on the work piece and improves its quality.

EXAMPLE 155

Since work of plastic deformation and the friction of cutting tools soon converts into heat in the process of metal cutting, heat tend to concentrate on the cutting part of the tool and the surface of the work piece. The temperature of part of the metal rises due to large thermal resistance. The high temperature not only speeds up the abrasion of tools but also affect the quality of the surface of the work piece and accuracy. FIG. 15E is a cross-sectional view of a cutting tool using the high heat transfer element of the presented invention. As FIG. 15E shows, the drill comprises cutting segment 1511 and handle 1512. The cutting segment 1511 and the handle 1512 contain a hollow structure 1513. The inner surface of the hollow structure contains the high heat transfer medium of the present invention. The cutting segment 1511 is heated in the process of cutting processing. When its temperature is rising, the high heat transfer medium in the hollow structure 1513 quickly sends heat from the cutting segment to the handle 1512, which transports heat to the environment. A cutting tool of excellent cooling efficiency, long useful life and no cooling solution becomes available by adopting the high heat transfer medium of the present invention. It can also reduce pollution on the work piece and improves its quality to tackle and avoid drawbacks in current technology.

EXAMPLE 156

Plastic injection is often applied to manufacturing parts of electric appliance, toys and daily products. Dealing with irregular parts such as the hollow and slim neck shape, shells, etc., or parts with a flux of thickness, a plastic-injecting mold has great temperature gradient since there is a partial heating area in it. This area will produce significant thermal stress, influencing the quality of plastic-injecting products and the capacity of plastic-injecting technology. FIG. 15F shows a plastic-injecting mold using the heat transfer element of the present invention. As FIG. 15F shows, plastic-injecting mold 1514 comprises plastic-injecting port 1515 and cooling water sink 1516. To cool the partial heating area around plastic-injecting product 1519, heat transfer element 1517 of the present invention in plastic-injecting mold 1514. The endothermic end of heat transfer element 1517 is in the partial heating area, where the cooling solution cannot flows or it is not convenient to go through, of the plastic-injecting mold 1514. The exothermal end in the water sink. There is no fin at the endothermic while there are fins 1518 on the exothermal end. In the working process, heat transfer element 1517 transports heat in the partial heating area in the mold 1514 to the cooling water tank to reduce the temperature in the partial heating area. In order to remove the partial heating area in the plastic-injecting mold, the existing technology arranges a cooling water tank in the mold to speed up the coagulation of melted plastic in the heating area. In many occasions, the water tank should not be too near the border between the plastic-injecting mold and melted plastic otherwise the mold might break due to high temperature gradient. Obviously, the heat transfer element of the present invention achieves in eradicating partial thermal stress in the plastic-injecting mold, reducing temperature gradient in the mold, improving the quality of plastic-injecting products, accelerating stripping and promoting the capacity of plastic-injecting production.

EXAMPLE 157

It is necessary to cool the screw in the process of high-polymer extrusion to avoid overheat of plastic in the material cylinder or degradation/dissolution of resin due to rapidly cooled plastic in the cylinder when the machine is turned off. FIG. 15G is a cross-sectional view of a high-polymer extruding machine screw using the high heat transfer element of the presented invention. As FIG. 15G shows, screw fins 1521 are installed on the front end of high-polymer extruding machine screw 1520 while fins 1522 are installed on the rear end of the screw. A cylinder-cone cavity 1523 is formed inside the screw rod 1520. The cylinder-cone cavity 1523 is filled with the high heat transfer medium of the present invention. The embodiment of the screw rod 1520 serves as an endothermic end as heat travels to the tail of the screw rod through high heat transfer medium. Heat given by the endothermic end can be used as a heat source for material drying or pre-heating. It can also be sent out via fin 1522. The fin may also use forced air-cooling or water spray cooling according to various design requirements. When plastic in the cylinder is overheated or the machine is turned off in the working process, the ventilator on the exothermal end of the screw rod 1520 should be turned on to prevent plastic in the cylinder from degrading or desolating so as not to affect the performance of products. Alternatively, the valve of the cooling water spray should be opened. The high heat transfer medium in the cylinder-cone cavity 1523 sends part of heat out via the screw rod 1520 to lower the temperature of the melted plastic resin in the cylinder. When the screw rod is spinning, the high heat transfer medium flows back to the endothermic end due to centrifugal force. The current technique is basically letting cooling water go through the center of the screw rod. The range of temperature control in this approach is limited. The approach also tends to cause rush cooling, incrustation and rust. Obviously, the high-polymer extruder screw rod adopting the high heat transfer medium has the following advantages that: the temperature of the screw rod is easy to control; the homogenously distributed temperature along the axis avoids quenching; no incrustation and rust will occur in the screw rod; heat sent from the cylinder can be recycled. Thus, the invention provides a high-polymer extruder screw rod having a simple structure and reliability in operation.

EXAMPLE 158

Mining drills produce a considerable amount of heat in operation. Heat should be dissipatedly promptly to extend the useful life of the drill. FIG. 15H shows a mining drill using the high heat transfer element of the presented invention. As FIG. 15H shows, the mining drill comprises support 1524, axle 1525 and holder support 1526. The holder support 1526 forms a cavity 1527. The cavity 1527 is filled with the high heat transfer medium of the present invention. The axle 1525 may come in a hollow structure filled with high heat transfer medium to increase heat transfer. The mining drill produces a great amount of heat, which travels to the holder support 1526 via the axle 1525 and the support 1524. High heat transfer medium in the cavity 1527 supported by the support sends out heat. The current mining drill basically adopts two cooling approaches, namely compressed blast cold channel system and rig liquid jet circulation. This kind of mining drill needs a ventilator, pumping system or other auxiliary structures. Its disadvantages such as complexity in terms of structure, low heat transfer capability, difficult to cool the axle and bearing of the support. On the contrary, the mining drill adopting the high heat transfer medium of the present invention for heat exchange has the following advantages: high heat transfer rates, simple structure and reliability in terms of sealing.

Heat-Dissipating Applications to Audio-Visual Equipment

The following Examples 159 to 162 show applications of the heat transfer elements of the present invention to heat dissipation in audio-visual equipment, such as audio output equipment, output device and crystal triode in the amplifier.

EXAMPLE 159

The wattage of output devices is rapidly increasing for the fast development of audio technology. However, the existing shape radiators can no longer fulfill users' demand. This embodiment describes a new radiator made of the high heat transfer element of the present invention. It boosts significantly the heat-dissipating capacity of the output device and extends the useful life of the device by solving the problem of high thermal resistance in previous shape radiators.

FIG. 16A shows a segment radiator of the high heat transfer sound output element according to the present invention. The radiator comprises metal heat absorber 1601, fin 1602 and heat transfer pipe element 1603. The source end of the heat transfer element 1603 inserts into the heat absorber 1601 while fins 1602 envelopes its sink end. The output device is tightly screwed to the surface of the heat absorber 1601. The space between the heat absorber 1601 and the output device is treated with electric insulation and heat transfer.

When the audio equipment is running, the output device transports heat to the heat absorber 1601, which passes heat quickly to the sink source with the inserted source end of the high heat transfer pipe element 1603. Then the fin 1602 gives heat to the surrounding space. The heat absorber 1601 has two functions. The first function is heat storage, which neutralizes peak heat produced passively by the output element. The second is heat circulation. The radiator should be placed horizontally or vertically and upward. The number of heat transfer pipe elements 1603 varies with the wattage of the output device.

The radiator of this embodiment enhances long useful life to a great extent since it is small, light but accomplishes great heat dissipation.

EXAMPLE 160

This embodiment relates a tube radiator of the high heat transfer audio power output device. FIGS. 16B and 16C both show the tube radiator, namely the crystal triode radiator of an audio power amplifier. FIG. 16B is a front view of the radiator; FIG. 16C shows a top view of it.

As shown in FIGS. 16B and 16C, the radiator comprises a base 1604, which is used to fix four crystal triodes and IC. Micro tube heat transfer element 1605 is embedded on the base, below one side of which there is a flat surface. A piece of isinglass 1609 is added to each of the four crystal triodes 1607 for insulation. Then the triodes are fixed under the base with screws 1608. An IC element 1610 is fixed to the center of the base and a fin 1611 is affixed to the other side of the base. The fin is a thin aluminum piece pressed into the shape as shown in FIG. 15C and lead welding welded to the base as integrity. The specifications and the quantity of devices and the area of the aluminum piece depend on the total consumption of four crystal triodes and the IC. There are tap holes on both sides of the fixing ear 1606 for installation. The radiator is fixed to the read panel of the amplifier 1612 with the fixing ears. A row of holes is arranged on the panel according to the position of the radiator as channels of thermal radiation from the radiator and counter airflow.

The working process is: the tube heat transfer elements on the base absorb heat produced by crystal triodes and IC at the bottom. Then they pass heat up to the top of the heat transfer elements and then to fins. The repeating process increases the temperature of the fins and improves the thermal radiation and heat dissipation of the radiator. This prevents a raise in temperature of the crystal triodes and the IC from exceeding the regulated value.

The maximal power consumption of each of the four crystal triodes, which are used to amplify various signals, in the amplifier is known as approximately 12 W. Hence a radiator should be installed to prevent the temperature of the crystal triodes from exceeding the allowed value. Currently heat is dissipated by affixing a piece of isinglass to each crystal triode and fastening them to the shape radiator with M3 screws. The drawback of this radiator is low heat-dissipating efficiency. To achieve proper heat dissipation, the size of the radiator has to be bigger so installation needs more space. Compared with the conventional radiator, the radiator of the present invention features high heat-dissipating performance. It is smaller than the conventional one by ⅓ and is easy to install.

EXAMPLE 161

This embodiment describes a plate radiator of the high heat transfer sound output device adopting the high heat element of the present invention. FIG. 16D is a schematic diagram of the radiator. The radiator is composed of heat transfer plate element 1613 and fin 1614, both of which are made of the heat transfer element according to the present invention. The fin 1614 is made by machining the surface of the plate element 1613 or by welding.

The output device is arranged or installed anywhere under the plate, depending on the space. The device should be in close contact with the plate. Heat given by the output device is distributed evenly to the surface of the plate element 1613 by adopting the thermostatic and high heat transfer features of the heat transfer element of the present invention. The fin 1614 enlarges the area of heat dissipation and dissipates heat eventually.

Compared with radiators based on existing technology, the radiator of the present invention has the following advantages: compact structure; lighter; it boosts heat-dissipating capacity; it extends the useful life of the output device.

EXAMPLE 162

This embodiment is related to a plate radiator of audio power output device with high heat transfer rate. FIGS. 16E and 16F show a tube radiator, namely the crystal triode radiator of a power amplifier. FIG. 16E is a front view of the radiator; FIG. 16F shows a top view of it.

As shown in FIGS. 16E and 16F, the radiator comprises a base 1615, which is used to fix four crystal triodes 1618 and IC 1621. The base is a plate cavity, which embodies plate cavity heat transfer element 1616. One side below the base is a flat surface. A piece of isinglass 1620 is added to each of the four crystal triodes for insulation. Then the triodes are fixed evenly under the base with screws 1619. The base situated at the fix ears is a physical body. An IC element 1610 is fixed to the center of the base 1621. A fin 1611 is affixed to the other side of the base. The fin is a thin aluminum piece pressed into the shape as shown in FIG. 16F and lead welding welded to the base as integrity. The size of the plate cavity in the base and the area of the aluminum piece depend on the total consumption of the four crystal triodes and the IC. There are tap holes on both sides of the fixing ear 1617 for installation. The radiator is fixed to the read panel of the amplifier 1623 with the fixing ears. A row of holes is arranged on the panel according to the position of the radiator as channels of thermal radiation from the radiator and counter airflow.

The working process of the radiator of this embodiment is: the tubular heat transfer elements in the flat cavity on the base of the radiator absorb heat produced by the crystal triodes and the IC from the bottom Of the heat transfer elements, which transfer heat up to the top of the flat cavity and then to radiating fins. The repeating process increases the temperature of the radiating fins and improves the thermal radiation and heat dissipation of the radiator. This prevents a raise in temperature of the crystal triodes and the IC from exceeding the regulated value.

The maximal power consumption of each of the four crystal triodes, which are used to amplify various signals, in the conventional amplifier is known to be approximately 12 W. Hence a radiator should be installed to prevent the temperature of the crystal triodes from exceeding the allowed value. Currently heat is dissipated by affixing a piece of isinglass to each crystal triode and fastening them to the shape radiator with M3 screws. The drawback of this radiator is its low heat-dissipating efficiency. To achieve proper heat dissipation, the size of the radiator needs to be enlarged thereby requiring additional installation space. Compared to the conventional radiator, the radiator of the present invention features high heat-dissipating performance with a smaller size that is approximately ⅔ of the conventional one and is easy to install.

Applications of Heat Dissipation to Electric Machinery Equipment

The following Examples 163 to 190 show applications of the heat transfer elements of the present invention to heat dissipation in electric machinery equipment, such as the exhaust steam condenser of a power plant boiler, adapter radiator, electric magnet core radiator, heat-dissipating system for electric machinery, tri-phase asynchronous adjustable motor, intensive magnetic unit radiator, X-ray machine radiator, motor radiator, hydraulic system hydraulic oil radiator, radiating system for the transmission shaft system, radiator for the pivot of precise machines, welding for part assembly, pumping cooling system, thermoelectric reactor cooling system, steam reactor cooling system, high-current off-phase close bus air-cooler, heavy machine linkage part cooling system, radiator of the heavy machine braking system, diesel engine cooling system, bearing, turbo charger cooling system, gasoline engine cooling system, car radiator, heat absorber and dissipater of energy storage, pressurized gas water cooler, heat collector and, non-crystal material preparation device.

EXAMPLE 163

This embodiment is an exhaust steam condenser of a power plant boiler. The exhaust steam condenser of a power plant boiler cools exhaust from the turbine with cold air. It collects condensed steam and pumps it into the water supply system of the boiler for circulation. It is appropriate for places with a lack of water resources since cooling is based on blast.

The condenser of this embodiment adopts heat transfer elements as prepared in Example 2. FIG. 17A shows its structure. Several angled high heat transfer heat tubes 1704 form Y-shape units. A ventilator 1703 is installed on the top of each unit. Cold wind is ventilated into both sides of and discharged out from the top of the Y-shape heat tubes 1704. These units may be connected in series at desire. Exhaust from the turbine is sent into the exhaust channel 1702 located beneath the condenser along the tubings. The heat tubes 1704 condense exhaust by removing heat from it. The condensed liquid is pumped into the water supply system of the boiler for circulation. The aforesaid inorganic high heat transfer tube nest 1704 is divided into two ends. One is a heating end located on the steam side and the other is a heat-releasing end located on the air side, aligned in a staggering way. Since vapor condensation has a very high heat transfer coefficient, the heating end of the inorganic high heat transfer 1704 is a bare pipe while there are fins on the air-cooling end.

Compared to current technology, the exhaust steam condenser of this embodiment has the following advantages. First, the heat transfer element features low inner pressure, high heat transfer rates, quick operation, excellent extreme heat transfer capability and no pollution. Secondly, the heat transfer process on the air side is enhanced by ribbing due to the very high heat transfer coefficient of ribs. Applied to condensing exhaust from the boiler in the power plant, the apparatus of this embodiment features small size, high heat exchange efficiency and long lifespan.

EXAMPLE 164

The core in power and electric equipment produces magnetic hysteresis consumption and vortex consumption. They are often referred to a combination of consumption in electric machinery and transformers and called core wear. There is a positive correlation between the degree of core wear and the amplitude of flux alternate frequency and magnetic sensitivity through the core.

Heat dissipation for a core in conventional electric equipment is based on heat transfer served by the core per se, in which heat is dissipated as it exchanges heat with air or heat transfer medium through the surface of the core. Heat inside the core cannot be dissipated quickly in cases of high flux alternate frequency and high magnetic induction strength for the core has a very small heat transfer coefficient. This causes an increase in the core temperature with heat accumulation.

Targeting at exothermic in the core of ordinary power equipment, this embodiment applies the heat transfer technology of the present invention to allow fast heat transfer from inside the core to the surface for the purpose of boosting heat-dissipating performance. An approach to the safe and reliable operation of power equipment lies in boosting core heat transfer efficiency and lowering the temperature at the core.

This embodiment adopts heat transfer elements as prepared in Example 2 to transfer heat rapidly from the core to the surface of the radiator, which heat is dissipated to the ambient by thermal radiation and natural air convection. FIG. 17B is a front view of an electric magnet core radiator on a tri-phase core transformer according to the present invention. FIG. 17C is a top view of an electric magnet core radiator on a tri-phase core transformer according to the present invention. The characteristic of the core is that an iron hoop 1706 leans toward the top and bottom of the coil without wrapping the side of the coil. Such a simple core structure makes it easier to arrange and insulate the coil so that common dry cooling transformers of medium and small power tend to adopt such a structure.

As FIG. 17C shows, there are silicon steel pieces dividing the core 1707 in the coil into levels in order to fully utilize the cylinder space inside the coil. The core wear of a dry cooling tri-phase core transformer of 20 KW is about 100 W without load and 600 W with load. The core 1707 in low voltage coil 1710 has a smaller heat transfer coefficient due to the narrow gap between core surface and the coil thereby resulting in small airflow. This makes temperature on part of the core surface higher than that on the top of the coil and at the bottom of the iron loop.

A number of heat transfer elements 1708 prepared in light of Example 2 may be embedded in the center of the core or along its trapezium area in order to reduce temperature on the core surface and improve cooling conditions. The diameter, number and length of the elements depend on the core wear and the size of the core. The part plugged into the core serves as a vaporizing end while the part near the iron loop serves as a heat-insulating end. The part exposed out of the top of the loop is used for heat dissipation and condensation. Aluminum pieces are pressed to the condensing end as radiating fins 1709 at the radiating end of the high heat transfer pipe, to increase the heat-dissipating area and improve heat dissipation.

The height of the radiating fins should befit the installation of the core and be electrically insulated. The overall cross section of the radiating fins should not exceed that of the core so that the coil and the loop can be properly installed.

In this embodiment, the heat transfer element 1708 in the center or the side of the core transfers heat produced by core wear from the core to the radiating fins 1709 located on the top of the core, which heat is released to the ambient by thermal radiation and air convection to lower the temperature of the core 1707, improve insulation and extend the lifespan.

The core radiator of this embodiment has the following advantages: simple structure; extremely practical application; reduction in the size of the core by improving its heat-dissipating performance.

EXAMPLE 165

A transformer tends to cause wear of copper, iron and other additional wear in operation as heat produced by wear increases temperature in some parts of the transformer. The cooling of conventional oil-bath transformers is based on transferring heat inside the coil and core to the surface, which heat is carried to the wall of the oil tank and oil pipes by means of the convection of transformer oil. Then heat travels from internal to external surfaces aided by heat transfer on the wall oil tank and in the oil pipes. Finally, the transformer gives heat to the ambient via radiation and convection. This cooling approach has a few disadvantages such as low heat-dissipating rates and larger transformer size and weight due to the large heat-dissipating area required for keeping temperature below the limit in all parts of the transformer.

This embodiment applies heat transfer technology of the present invention to the cooling of the electric transformer. That is, the cooling system is composed of high heat transfer elements of Example 2. FIG. 17D shows the front and partially cross-sectional views of an adapter radiator made of the high heat transfer tube of the present invention. FIG. 17E shows a side and partially cross-sectional view of an adapter radiator made of the high heat transfer tube of the present invention. FIG. 17F shows the structure of the heat transfer tube.

There are at least one set of long, opposite sidewall plates in the oil tank lid of the transformer 1713, namely the installation plates of the high heat transfer pipes 1714. A number of holes regularly arranged from top to bottom on the installation plates, and having diameter corresponding to the external diameter of the high heat transfer pipes 1714 are formed on the installation plates. A high heat transfer pipe 1714 formed with fins on one side is plugged into each hole. As FIG. 17F Shows, each pipe 1714 is provided with a fixed lug 1718.

As FIG. 17D shows, the locations of the holes depend on the insulating distance between the coil and insulator of the transformer 1716 and core 1715. Distance between the holes depends the size of fins 1719 at the radiating end of the high heat transfer pipes 1714. The number of the high heat transfer pipes 1714 depends on unloaded wear and loaded wear. The surface of fins 1719 at the radiating end is electroplated for corrosion resistance and decent appearance. The high heat transfer pipes 1714 and the holes on the oil tank 1713 are linked together by the welded fixed lug 1718. A support for the high heat transfer pipes 1714 may be installed in the side of the oil tank, if necessary.

As FIG. 17E shows, the heat-absorbing end should be tilted during installation to ensure proper operation of the inorganic high heat transfer pipes 1714. As FIG. 17D shows, the heat-releasing end located on the wall of the transformer should form an angle of certain degrees with the horizon.

The high heat transfer tube nest 1714 in the transformer quickly transfers heat from the coil, core 1715 and other parts to the heat-releasing end of the high heat transfer pipes on the oil tank 1713 through the transformer oil 1717. Fins at the heat-releasing end of the high heat transfer pipes 1714 located on both sides of the box keep temperature within a certain range by releasing heat to the ambient via thermal radiation and natural convection.

The radiator of this embodiment has the following advantages: boosting heat transfer performance of oil-bath transformers; reducing the cooler size to be ⅕–¼ of conventional radiators; providing simple structure so as to allow easy cleaning; extending the lifespan due to the higher heat transfer rate and reduced temperature elevation at the oil surface.

EXAMPLE 166

This embodiment quickly cools electric machines by adopting the high heat transfer elements of the present invention. Temperature of parts on the machines rises as energy consumed in operation turns into heat. It is necessary to cool the machines in order to keep temperature below the allowable limit.

There are two cooling methods for machines at the moment, i.e. external and internal cooling. External cooling relies upon air in which a fan is used to produce airflow, which air flow can only come into contact with the core, the rotor module and the casing. Thus heat must be transferred from inside to these parts so as to be taken away by the fan. Composed of parts of various physical characteristics, these machines have very complex internal heat-generating and heat transfer mechanism. Hence promoting heat transfer of all parts in the machines serves as an effective method of improving the heat-dissipating capability and enhancing the cooling effect of the machines. Thus heat transfer technology of the present invention is applied to cooling electric machines to improve current cooling approach by improving the heat transfer capability of the stator and rotor of the heat-generating source.

FIG. 17G is a partially cross-sectional view of an asynchronous motor that cools the stator and rotor with the heat transfer element as prepared in Example 2. In this embodiment, several rotor heat transfer elements 1723 are concentrically arranged between a core 1720 on both sides of a squirrel-cage rotor and the rotor fan blades 1725. The elements, which are higher in the center and slightly lower at both ends, from a certain angle with the pivot. When the rotor is working, working liquid in the rotor heat transfer element 1723 absorbs heat from the rotor core 1720 and rotor strip. The working liquid than passes heat to the turning rotor fan blades 1725 as wind takes heat away. Driven by axial force component of the centrifugal force, the condensed liquid returns to the vaporizing end of the rotor heat transfer element, which recollects heat from the rotor core 1720 and strip. The cycle keeps repeating itself so that heat travels quickly from the core 1720 and strip onto the rotor fan blades 1725. Temperature on the rotor drops significantly since heat transfer efficiency inside the rotor increases significantly.

Several stator heat transfer elements 1722 are embedded at both ends of electric machinery stator core 1721 axially and concentrically to lower temperature at the stator core 1721 and the stator winding 1724 in normal operation. Copper wear and iron wear from the stator core 1721 are the main heat source in operation, causing a rise in stator temperature. The heat transfer elements 1722 help heat travel rapidly from inside the stator to the exothermic end on heat elements on both sides of the stator. Finally cooling fan 1726 on the motor bearing takes heat away. The heat transfer element 1722 boosts the heat transfer performance of the stator core 1721. This helps lower temperature increase at the stator core wear 1721 and winding 1724, promote overload capacity and extend the lifespan.

When the machine is operating, heat transfer elements. 1722 and 1723 in rotor 1720 and stator 1721 send heat, which comes from wear in operation, from the rotor and the stator to their surface. Finally the fooling fan 1726 on motor bearing releases heat to keep the temperature of the solvent within a certain range.

Using heat transfer elements, the machine in this embodiment promotes heat transfer efficiency of the rotor and stator, lowers temperature increase inside the machine, improves insulation and extends the lifespan. The flexibility of high heat transfer elements in terms of shape facilitates flexible and easy arrangement in the rotor and stator as well as simple structure. It also promotes performance by lowering temperature inside the machine.

EXAMPLE 167

This embodiment adopts a rotating heat transfer motor bearing in place of ordinary ones so that heat produced by rotor wear in a three-phase asynchronous adjustable motor to the exothermic end on the motor bearing. By doing this, the embodiment achieves reduction in temperature increase in core and winding in electric machinery, and increase of pivot output power.

The structure of a three-phase asynchronous adjustable motor rotor comes in two types, namely a squirrel-cage rotor conductor and a winding rotor conductor. When the motor is running, temperature in the rotor rises due to heat coming from copper and iron wear produced in flux alternation between the rotor conductor resistance and rotor core.

The rotor of the present three-phase asynchronous adjustable motor is now installed on a physical transmission shaft. There is more temperature increase on the motor bearing than other parts since the three-phase asynchronous motor produces more copper and iron wear in speed adjustment as compared to wear in constant speed, due to frequent speed adjustment and the mechanical inertia of the rotor.

FIG. 17H shows a partially cross-sectional view of the rotor of a tri-phase asynchronous adjustable motor and the pivot of a heat transfer pipe machine. A heat transfer pipe pivot 1730 serves as the transmission shaft of the three-phase asynchronous adjustable motor. The inner cavity of the pivot is made as a cone. The dotted lines in the drawing represent working liquid 1728 in the heat transfer pipe. When the motor bearing is rotating, the working liquid 1728 in the heat transfer pipe pivot 1730 absorbs heat produced by the rotor core and conductor 1727. The working liquid 1728 is then vaporized, traveling to the other end of the pivot for transferring heat to the heat-releasing part on the pivot. Driven by axial force component centrifugal force on the cone, the condensed liquid 1728 returns to the vaporizing end of the heat transfer pivot 1730, which recollects heat from the rotor core and winding. The cycle keeps repeating itself to reduce temperature increase on the rotor by transferring heat inside the rotor out through the heat transfer pipe pivot 1730.

In the case of three-phase asynchronous adjustable motors with same input wattage, the temperatures increase on the pivot 1730 is significantly reduced along with the increase in the rotational speed of the motor.

The heat transfer motor bearing of the present invention achieves the objects of boosting heat transfer performance of the rotor of three-phase asynchronous adjustable motor, and reducing temperature increase on the rotor to a great extent. Compared to ordinary asynchronous motors, motors with the heat pipe pivot of this embodiment have the following advantages: reduced rotor pivot diameter, lighter rotor and better speed adjusting performance.

EXAMPLE 168

This embodiment is an intensive magnetic unit radiator in a mineral plant, which cools hot circulating oil in the intensive magnetic unit with cold water, while using the high heat transfer elements of the present invention to enhance efficiency in heat exchange operations.

Present intensive magnetic unit radiators are based on plate heat exchangers. Partitions in these exchangers are made of thin stainless steel plates. Such kind of partitions, however, tends to be badly corroded for they cannot resist corrosion caused by hydrofluoric in water. Once a partition is corroded, cooling water is mixed with hot oil and goes into the intensive magnetic unit, thereby shorting and blowing the coil.

FIG. 17I shows the operational theory of the intensive magnetic unit oil radiator using the high heat transfer elements of the present invention in a mineral plant. FIG. 17J shows a front and cross-sectional view of the intensive magnetic unit oil radiator using the high heat transfer elements of the present invention in the mineral plant. FIG. 17K shows the heat transfer tube bank used by the intensive magnetic unit oil radiator in the mineral plant. As FIG. 17I shows, there are several parallel pipe banks in the rectangular flue channel with openings at both ends in the afterheat boiler, namely inorganic high heat transfer tube banks (see FIG. 17K). Direction of liquid medium and oil flows depends on the condition on site. As the attached figure shows, the direction of the flow of liquid medium is opposite to that of smoke for easy heat exchange. The number of heat tube banks on the water side in the radiator is the same as those on the oil side. The main heat exchange area comprises heat transfer elements 1733. Heat exchange between the cold and hot medium takes place outside the pipe to prevent blockage caused by incrustation found in ordinary pipes. Hot oil is cooled in an oil-water heat exchanger before entering the intensive magnetic unit. The apparatus cools oil by heating circulating water with heat carried by the hot oil to extend the lifespan of the apparatus.

In operation, the high heat transfer tube nest in the smoke cavity recovers heat carried by smoke, the tube nest in the boiler drum elevates water temperature by transferring heat to water for exchanging heat.

The intensive magnetic unit oil radiator of this embodiment has the following advantages: high heat transfer rate, small size, simple structure, resistance to corrosion, ease of cleaning and excellent overall integrity and performance.

EXAMPLE 169

This embodiment discloses an apparatus for cooling an X-ray machine. Adopting the high heat transfer elements of the present invention, this apparatus achieves the object of effective cooling of X-ray tubes.

The metal target of the X-ray machine produces vast, instantaneous heat in operation. The heated metal target may melt causing failure of the X-ray machine if the heat is not quickly dissipated. Thus it is necessary to transfer heat out to ensure normal operation of the X-ray machine. Copper anode is installed on the back of the metal target in present X-ray machines, which anode is cooled by liquid. The drawback of this method lies in low cooling efficiency, rush cooling and incrustation.

This embodiment furnishes an X-ray machine radiator featuring high cooling performance, simple structure and reliability. FIG. 17L shows an X-ray machine radiator adopting the high heat transfer element of the present invention. The X-ray radiator comprises: a copper anode 1742, high heat transfer heat transfer medium 1743, and radiating fins 1744. The copper anode 1742 is of a tubular structure, filled with high heat transfer medium 1743. Radiating fins 1744 are installed at the end of the tube. Once the X-ray machine starts working, heat produced by an electron beam colliding into the metal target travels to the copper anode 1742. Once heated, high heat transfer medium 1743 in the tube starts to transfer heat to the radiating fins 1744, which transport heat to the environment.

The high heat transfer X-ray machine of this embodiment features high cooling performance, simple structure and reliability.

EXAMPLE 170

This embodiment applies the heat transfer technology of the present invention to heat dissipation in motors for boosting the heat-dissipating performance of motors, reducing temperature increase in motors, and extending lifespan.

Servo-motors, also known as AC servo-motors, are widely implemented in automatic control system and use electronic signals on the control winding to derive certain rpm or declination.

Small or micro double-phase asynchronous motors are frequently used as AC servo-motors. These motors may either adopt squirrel-cage or cup-shape rotors. It is necessary to enlarge electric resistance of the rotors in design to allow automatic braking of the motors. Advantages of the cup-shape rotor motors include lightness, small inertia and sensitivity in starting, rotation and pausing. However, the disadvantages may also include: air space between stator and rotor is somewhat large so that the no-load current of the motor is huge while power factor and efficiency is low, there is accumulated iron wear on the rotor since the motor frequently adjusts speed. Such factors are causes of increasing heat on the motor.

Under normally circumstances, the cooling of a servo-motor is based on external cooling, as ordinary motors do. This approach dissipates heat by air circulation yet the heat-dissipating area is rather small due to the small size and compact structure of the motor. Another issue is that the surface temperature of the motor can be comparably high since the motor often operates in a sealed closure under high working temperature.

As FIGS. 17M and 17N show, the motor radiator of this embodiment adopts the heat transfer elements as prepared in Example 2. FIG. 17M shows a front and partially cross-sectional view of a motor radiator adopting the high heat transfer elements of the present invention. FIG. 17N is a side view of the motor radiator in FIG. 17M. The four flat or spherical surfaces on the casing of the motor serves as an erection surface of the motor radiator 1750. There are several threading screw holes on each surface for fastening four bases 1755 of the motor radiator.

As FIG. 17M shows, there are four heat-dissipating units on the radiator 1750. One side of each unit is a base 1755, on which several plate heat transfer elements 1753 are embedded or pressed. The number of the elements depends on the extent of motor wear. On the other side, the heat transfer elements 1753 and venetian-blind radiating fins 1754 on each unit are joined together by pressing to form an integrated structure of the radiator. An end cover 1752 is installed to cover the radiating fins. The venetian-blind radiating fins 1754 enhance ventilation and enlarge the heat-dissipating area for better heat heat-dissipating performance. The width (along the motor) of the base of the radiator 1755 and the radiating fins 1754 in the axial direction depends on the size of casing and the amount of wear.

When the motor is running, the heat transfer elements 1753 joined to the base absorbs heat from the casing through the base 1755 at the vaporizing end of the heat transfer elements 1753, and then transfers heat from the insulated end on the heat transfer elements 1753 to the radiating fins 1754 welded to the condensing end of the elements 1753. Finally the motor fan sends heat to the ambient to keep temperature increase within a certain range.

The radiator of this embodiment adopting the heat transfer elements of the present invention has the following advantages: promoting heat-dissipation on the motor, reducing the size of the casing; providing a simple structure allowing easy assembly and disassembly of the motor; and extending the lifespan of the motor by lowering temperature increase of the motor.

EXAMPLE 171

This embodiment provides an apparatus for radiating hydraulic oil in a hydraulic system adopting the heat transfer technology of the present invention for effective control of the temperature of hydraulic oil to improve reliability in operation.

The performance of hydraulic oil is correlated to temperature increase of hydraulic apparatus in operation. Rising temperature degrades the quality of oil and increases carbon content in the oil, causing abrasion in such parts as valves, cylinders, servo valves and compensation pumps. Hence controlling hydraulic oil temperature serves as a crux of improving reliability in the hydraulic system.

FIG. 17O shows an apparatus for radiating hydraulic oil in a hydraulic system of this embodiment. A jacket filled with condensing oil is installed outside a hydraulic cylinder. The heat-absorbing end of high heat transfer element 1757 is soaked in the cooling oil in the jacket while the heat-releasing end stretches out of the jacket allowing heat dissipation by means of natural convection. Fins are installed on the heat-releasing end to increase the heat-dissipating area.

The temperature of hydraulic oil starts rising once the hydraulic apparatus starts working. The temperature of the cooling oil in the jacket rises at the same time. At this time, the high heat transfer element 1757 also starts working as its heat-absorbing end transports heat obtained from the cooling oil to the heat-releasing end. The element restricts temperature increase in the hydraulic oil by releasing heat to the ambient via natural convection.

The hydraulic oil radiator in this embodiment has the following advantages: a simple structure simplifying the process and apparatus of filtering and purifying oil; reliable operation to effectively restrict temperature increase in oil; preventing from degradation of oil quality; reduction in carbon content; and promoting reliability of the hydraulic system.

EXAMPLE 172

Apparatus running continuously in a long haul tends to produce heat in rapid shaft rotation. In order to assure normal operation of such equipment as compressors, it is necessary to remove heat produced in industrial production. The most common method for removal the heat is air-cooling. In other words, blast from the ambient or produced by machines takes heat away by blowing towards the bearing. Although achieving the subject of providing a simple structure, this approach takes only little heat away. It may work well with small equipment yet auxiliary facilities such as water-cooling or oil-cooling system is definitely essential for cooling the shaft in equipment of large size running under high rpm and generating gross heat production. This approach requires additional space, numerous equipment, high operating costs and tedious working process since an additional, independently operated cooling circulator is needed.

The primary problem with conventional cooling approaches is their slow heat transmission and dissipation. Thus the high heat transfer element of the present invention is the best way to tackle the problem as it boosts transmission with its high thermostatic and high heat transfer characteristics. This embodiment produces a high heat transfer transmission shaft system adopting the high heat transfer medium of the present invention. The system transports heat from the rotary shaft to the outer surface of the shaft by means of the rotary centrifugal force of the shaft per se to achieve the intended thermostatic effect. The shaft is cooled as air carries the heat away.

FIG. 17P is a schematic drawing of the structure of a high heat transfer transmission shaft system. The mechanic transmission shaft is usually of a hallow structure. This embodiment turns this shaft into a high heat transfer thermo conductive shaft by making the hallow structure a tapered, conical sealed cavity, which is filled with the high heat transfer medium. When the shaft is turning rapidly, medium carries heat from the bearing to surfaces of the shaft by means of centrifugal force. This leads to a thermostatic state in all parts of the shaft and lowers temperature on the bearing. All the surfaces become heat-releasing areas, where air takes away a considerable amount of heat when flowing through the surfaces. Thus, the rotating equipment can work properly since the bearing is cooled again as its temperature is lowered.

No tubular core is installed inside the cone-shape hallow wall of the shaft since it relies upon centrifugal force. The heat-releasing part on the bearing serves as the source end of the high heat transfer element, while the air-cooling part is a sink end. The inner diameter of the source end is slightly greater than that of the cooling end subjecting the shaft rotating under a high speed to generate centrifugal force for proper operation. If the shaft still cannot provide the cooling capacity as needed due to exceeding heat production, the problem can be tackled by adding radiating blades to one or two sides of the shaft, increasing blast volume or speed of the air flow.

The mechanic transmission thermal conductive shaft serves as the core of the high heat transfer transmission shaft system. With a simple and light structure, it looks quite similar to ordinary shafts while allowing easy operation and installation. Using air as the heat-dissipating medium, the apparatus adopts the high heat transfer element as heat transfer medium so as to achieve the objects of better cooling performance as compared to ordinary transmission shafts without requiring any particular operation processes. The radiator serves as an additional option allowing safe and reliable operation of such transmission equipment as compressors, and has the following advantages:

High cooling efficiency and extensive cooling range;

Simple structure and easy installation and manufacture;

Low production and transportation costs;

Low one-step investment and long useful period;

Little installation space and conservation of water resources;

Simple working process, easy operation and reliability; and

Pollution-free.

The simple air-cooling technology of this embodiment can be used in most apparatus rotating continuously, such as motors, compressors, engines and screw extruder. It features such benefits as high cooling efficiency, extensive air-cooling range, various applications, and pollution-free, while saving a great amount of cooling water at the same time.

EXAMPLE 173

This embodiment is an apparatus using the high heat transfer element of the present invention to cool the main pivot of precise machines.

The main pivot is an important part of machinery equipment, particularly precise machines. The main pivot produces heat due to mechanical abrasion in operation. Excessive rise in temperature in the main pivot will affect operation of the machine since the relative position between the pivot center of the main axis and other parts may change. The rise in temperature also changes the configured space between such elements as the main axis bearing, and normal lubricating conditions. This not only affects the normal function of the bearing, but may also cause the problem of failure caused by blockage. The current approach for cooling main pivots is based on oil cooling. The disadvantages of this approach are described as follows: the constrained extent to which the cooling oil piping can reach causes difference in cooling performance; after the cooling oil is circulated and used for a while, the main pivot tends to be abraded by accumulated carbon content.

FIG. 17Q shows a high heat transfer radiator for the pivot of precise machines of this embodiment. It cools main pivot of the precise machine 1767 with high heat transfer medium.

Bearings 1768 and 1770 are heat sources generated by abrasion, on the main pivot 1767. Temperature in other parts is comparatively low. Transporting abrasive heat produced at the bearings 1768 and 1770 to other places on the main pivot 1767 can reduce the pivot 1767 temperature by using the surface on the pivot serve as the heat-dissipating area. As FIG. 17Q shows, the high heat transfer radiator is a circular cavity in the center of the main pivot. The cavity is filled with a certain amount of high heat transfer medium 1769 of the present invention.

When the machine is running, the high heat transfer medium 1769 in the center of the main pivot 1767 carries abrasive heat produced by the bearings 1768 and 1770 to other parts of the pivot to reduce temperature on the bearings.

The high heat transfer radiator for the pivot of precise machines of this embodiment has the following advantages: high cooling efficiency, even temperature distribution along the pivot; simple structure; reliability; preventing lubricating oil from degradation due to local temperature increase at the bearings of the main pivot.

EXAMPLE 174

It is usually necessary to cool the melting pot rapidly when welding thick plates in order to ensure decent quality of task. This embodiment is a new type of welding assembly using the high heat transfer element of the present invention. This welding assembly achieves rapid and effective heat dissipation.

Most present welding assembly is based on water traveling in the copper cavity, in which water carries part of heat generated during welding by means of circulation. The disadvantage of this apparatus is its low heat exchange rate. Consequently, water sometimes does not carry heat produced by welding in time, leading to defects in welding task.

FIG. 17R shows a high heat transfer welding assembly, comprising heat transfer elements 1775, 1776 and a water heat exchange container 1774. The high heat transfer elements are made of high heat transfer pipes 1775 and a heat transfer block 1776, which are welded together. The pipes 1775 and block 1776 are connected to one another. The water heat exchange container 1774 comprises a cooling water intake 1772, a cooling water outlet 1773 and a water container.

To enhance sufficient heat exchange, the water exchange container 1774 is made into a device with many serially connected small cavities, as shown in FIG. 17R, so as to improve heat exchange by enhancing better contact between water and the heat transfer pipes 1775.

Similar to the present assembly, the welding assembly of this embodiment is provide with two devices on both sides of the weld seam and the assembly moves with the bonding tool together from bottom to top. The working theory is described as follows: the heat transfer block 1776 absorbs heat produced in welding and carries the heat to the heat transfer pipes 1775. Water in the water heat exchange container 1774 carries part of heat produced in welding away by means of circulation to cool the weld seam.

The structure of welding part assembly of this embodiment features a simple structure, provides high heat transfer and better cooling effect.

EXAMPLE 175

Cooling is needed during operation of a large-power pump since its bearings produces vast heat. Lubricating oil should also be applied generously for lubrication. Normally a radiator is implemented in the lubricating oil circulating system to cool the lubricating oil so as to ensure that lubricating oil works well without being overheated as the lubricating oil is cooled as soon as heat is taken away when the lubricating oil lubricates the bearings.

This embodiment is a high performance cooling and circulation system adopting the heat transfer element of the present invention. What makes a difference between the system and others is the radiator. As FIG. 17S shows, the system comprises a radiator 1778, an oil pump 1780, and a filter 1779. The lubricating oil in the pump bearing box enters the radiator 1778 that is provided with a high heat transfer element 1781 therein. The lubricating oil is cooled when exchanging heat with ambient through the high heat transfer element 1781 in the radiator 1778. Then the oil pump 1780 carries the oil through the filter 1779 and then returns to the bearing box to complete a cycle.

FIG. 17T shows a high heat transfer radiator for the pump cooling system. As the drawing shows, the radiator 1778 has two different channels, in which oil flows in the lower channel while air goes through the upper one. The two channels are divided by a partition, into which high heat transfer elements 1781 are plugged. The high heat transfer elements are welded to the partition. There are fins provided on one side of the elements 1781 while a bare pipe is plugged into the other side. The lubricating oil enters through the intake, carries heat to ambient through the high heat transfer elements 1781. The cooled lubricating oil returns the bearing box through the oil pump 1780. A fan 1783 is installed at the entrance of the air channel to accelerate airflow and improve heat transfer. The application of high heat transfer element 1781 has the following advantages: quick starting, high heat efficiency, and fair heat exchange even under small temperature gradient.

EXAMPLE 176

This embodiment adopts the high heat transfer elements of the present invention to control temperature and speed of reaction by dissipating heat evenly from the reactor vessel.

In the process of certain heat absorbing chemical reactions, a certain amount of heat must be absorbed to enhance the reactions. The process becomes exothermic once the reactions start. Thus afterheat must be effectively dissipated for proper control of temperature and reaction speed. The process of temperature control is very demanding in terms of sensibility and thermostatic effect of heat transfer elements. The design of the high heat transfer cooling reactor vessel of this embodiment is based on the high heat transfer element to solve the problem with temperature control in precise chemical reactions.

FIG. 17U shows a thermoelectric high heat transfer arid cooling reactor. The thermoelectric high heat transfer cooling reactor comprises three parts, i.e. heating system, cooling system, a reactor vessel and auxiliary equipment. The heating system comprises high heat transfer pipes 1787 and an electric heating system 1790. The cooling system comprises high heat transfer pipes 1787 and a cold medium channel 1789. The reactor vessel and auxiliary equipment comprises a reactor vessel 1784, supports 1785, and a cover 1788.

Strict requirements are applied to temperature in various stages of a precise chemical reaction. In a predesigned program for controlling the reaction process, different control commands are applied to temperature control in various stages. Commands act on the heating and cooling systems through the controlling system to complete the entire control process. In the aforesaid reaction process, the high heat transfer pipes 1787 carries heat produced by the electric heating system 1790 and distributes the heat evenly to the reactor solvent 1786 in the reactor vessel 1784 in the early stage of reaction. The reacting process is exothermic in the early stage. This is followed by the controlling system activating the cooling system for proper control of temperature and reaction speed. The high heat transfer pipes 1787 transport heat produced in reaction to the cooling system, which discharges heat in a certain proportion in view of the commands as provided, to keep temperature and reaction speed within a certain range. In addition, changes in temperature in different reaction stages tend to be instantaneous, such that the thermal resistance existed in the heat transfer process of the high heat transfer pipes 1787 may be neglected since the pipes are highly adjustable to sudden changes in temperature.

The thermoelectric high heat transfer cooling reactor of this embodiment has the following advantages: high sensitiveness, good thermostatic effect, highly adjustable to rapid temperature shifts and excellent temperature control.

EXAMPLE 177

This embodiment is a high heat transfer steam cooling reactor, which adopts the high heat transfer elements of the present invention to control temperature and reaction speed by discharging heat evenly from the reactor vessel, and converting heat produced in reaction into quality, useful energy.

Afterheat must be discharged for proper control of temperature and reaction speed in an exothermic reaction, which afterheat should also be converted into quality, useful energy. The process of temperature control is very demanding in terms of sensibility and thermostatic effect of heat transfer elements. Based exactly on such a feature, the high heat transfer steam cooling reactor of this embodiment solves effectively the problem with temperature control in a precise chemical reaction.

FIG. 17V shows a high heat transfer steam cooling reactor of this embodiment, comprising two parts, namely cooling system, a reactor vessel and auxiliary equipment. The cooling system comprises high heat transfer pipes 1795, a steam channel 1797 and a steam flow controller 1799. The reactor vessel and auxiliary equipment comprises a reactor vessel 1792, supports 1793, and a cover 1796.

In this embodiment, a preconfigured program for controlling reacting process continues changing commands according to feedback information. Commands act on the steam flow controller 1799 through the controlling system to control steam flow and complete the controlling process. The high heat transfer pipes 1795 carry heat produced in the reaction evenly to the steam cooling system. Saturated steam enters the cooling heat exchange system via the steam flow controller 1799. After fully exchanging heat with the high heat transfer elements 1795, the saturated steam becomes supersaturated steam and is discharged through the steam outlet for other use. The cooling system discharges heat in a certain proportion in view of the commands as provide to keep temperature and reaction speed within a certain range. Changes in temperature in various reaction stages are instantaneous. Thermal resistance in the heat transfer process enhanced by the high heat transfer pipes can be neglected since the pipes are highly adjustable to sudden changes in temperature.

EXAMPLE 178

Part of electricity produced by a high-current off-phase close bus of power generating modules over 200 MW becomes heat in transmission. Forced blast-cooling modules are often used to dissipate heat from such heat. However, such huge and complex apparatus tends to waste electricity and produces much noise.

Thus this embodiment replaces the forced blast-cooling system with a high heat transfer air-cooler, which boosts cooling efficiency to a great extent and reduces costs.

FIG. 17W shows a high-current off-phase close bus air-cooling system using heat transfer elements. A ventilator propels blast of 60° C. into Phases A and C respectively in the high-current off-phase close bus air cooling system 2700. Then the blast is imported into Phase B via connected pipes and enters the hot blast intake 2703 of a heat transfer air cooler 2701. The ventilator sends 40° C. air into the heat transfer air cooler 2701 via an air side intake 2704 and then dissipates heat to the ambient via hot an air side outlet 2705.

Using the heat transfer cooler instead of the forced blast cooling system, this apparatus reduces consumption of raw material, contributes to smaller close bus, reduces space taken by the cooler, and making the cooling system smaller, in place of the forced blast cooling system, which is huge in size and consumes much electricity.

EXAMPLE 179

High temperature takes place between coupling elements in heavy-duty mechanical equipment due to accumulated heat produced by abrading elements. Since coupling elements of heavy-duty machinery tend to bear heavier load particularly along the axial and radial directions, crystalline phase change will take place inside the material of these elements, which change accelerates aging. If this situation is getting worse, the coupling elements may become distorted and cause the malfunction of the system.

This embodiment adopts the high heat transfer elements of the present invention to enhance rapid and efficient heat dissipation of abrasive heat produced by coupling elements to ensure the normal operation of heavy-duty mechanical system.

FIG. 17X is a schematic drawing of a cooling system for a heavy-duty machine linkage part that adopts heat transfer elements. The cooling system comprises radiating fins 2707, a heat transfer element 2709, heavy-duty machinery coupling elements 2710, and a cooling medium channel. Vast abrasive heat produced in the continuous operation of the heavy machine coupling element 2710 accumulates on the universal driving shaft. The universal driving shaft transfers heat to the heat transfer element 2709, which carries heat along the universal driving shaft to the radiating fins 2707 outside the machine. Cooling medium continues flowing through the channel to exchange heat with the radiating fins 2707 by means of counter current. By doing this, the abrasive heat produced by coupling elements 2710 in operation is dissipated to the environment outside the mechanical system.

The heat dissipating system of this embodiment is appropriate for heavy-duty link gears of limited heat-dissipating space. With the high and distance heat transfer features of the heat transfer element along the axial direction, abrasive heat produced by the mechanical coupling system is dissipated of out the system to provide a compact structure and high efficiency for the system, to avoid failure and to extend the lifespan.

EXAMPLE 180

Braking systems tend to produce vast heat in operation due to intensive abrasion. If heat cannot be dissipated rapidly, it may affect the system's braking performance and reduce reliability and lifespan. Present approaches rely upon air-cooling and water-cooling. Disadvantages of these approaches include low heat-dissipating efficiency and unreliability.

This embodiment achieves high performance heat dissipation of the braking system by adopting the high heat transfer elements of the present invention.

FIG. 17Y is a schematic drawing of a speedy radiator of a braking system adopting heat transfer elements of the present invention. The radiator comprises a brake 2712, heat transfer elements 2713, a and low temperature heat source 2714. The heat transfer elements 2713 come in tubular structure are filled with heat transfer medium, and include radiating fins at the end of the tubes.

When the braking system is operating, the high heat transfer elements 2713 on the brake 2712 carry heat to the low temperature heat source 2714 to attain rapid heat dissipation.

Brakes adopting the braking system of the present invention have the following advantages: high heat transfer efficiency and performance, stable and reliable operation and long lifespan.

EXAMPLE 181

Temperature in the combustion chamber can be extremely high when a diesel engine is working. The engine must be cooled since the large heat load that parts surrounding the combustion chamber experience, affects their function and reduces reliability and lifespan. Thus good cooling system serves as an important factor in full and good combustion. The existing method is circulating water in accompaniment with blast cooling. Such a method involves some disadvantages such as poor cooling performance and boiling risk.

This embodiment achieves high performance heat dissipation of diesel engines and recycles afterheat by adopting the high heat transfer elements of the present invention.

FIG. 17Z is a schematic drawing of a diesel engine cooling system adopting the heat transfer element. The diesel engine cooling system comprises three parts, namely a circulating waterway, a heat transfer element 2717, and a low temperature heat source 2718. The heat transfer element 2717 is configured to a tube, flat or complex structure, filled with high heat transfer medium, and includes radiating fins at the end.

When operating the engine to perform combustion, the heat transfer element 2717 located outside the cylinder sleeve quickly takes away part of heat, so as to construct a simplified diesel engine cooling system of higher performance by reducing temperature of heated parts in the engine, lowering the pressure of circulated water and improving the function of the cooling system. The low temperature heat source 2718 may also be afterheat recovery apparatus to allow recycle of energy.

EXAMPLE 182

The reliability and lifespan of high-speed rotary pivots and bearings serve as a crux of the reliability and duration of the whole apparatus since they are frequently used in all kinds of machines. Thus, a bearing should be well designed, properly lubricated, and absolutely cooled. Current cooling approaches for these parts rely upon either lubricating oil (for lubrication and cooling) and/or blast cooling. Disadvantages of these approaches include low cooling performance, heavy abrasions and much oil consumption.

This embodiment improves a variety of bearings. In other words, it applies the high heat transfer elements of the present invention for cooling bearings, improving their reliability and lifespan to a great extent.

FIG. 17ZA shows a bearing adopting the heat transfer element of the present invention. The heat transfer bearing comprises three parts, namely a bearing 2719, a heat transfer element 2720 and a low temperature heat source 2721. The heat transfer element 2720 is configured to a tube or flat structure, filled with high heat transfer medium, and includes radiating fins at the end. When the pivot is turning at high speed, the heat transfer element 2720 rapidly transfers abrasive heat to the low temperature heat source 2721 to reduce the temperature of the bearing and abrasions so as to extend the lifespan of the bearing and the pivot.

The new bearing model furbished by this embodiment has a number of advantages such as high cool performance, fewer abrasions, small lubricating oil consumption, reliability and long lifespan.

EXAMPLE 183

As people have more rigorous standards for more powerful, economical and less polluting engines, applications of turbo chargers are getting increasingly wider. High performance and reliable long-term operation of turbo chargers has much to do with performance of the whole apparatus. Hence, turbo chargers should be well-designed, provides high performance and well cooled. If not properly cooled, turbo chargers tend to have a rise in temperature during continuous operation, leading to not only lower performance but also shorter lifespan. Existing cooling methods are based on blast and water cooling. Disadvantages of these methods include low cooling performance and consumption of certain effective work.

This embodiment achieves high performance heat dissipation of turbo chargers and boosting their performance by adopting the high heat transfer elements of the present invention.

FIG. 17ZB shows a cooling device for turbo chargers, adopting the heat transfer elements. The high heat transfer cooling device comprises three parts, namely a turbo charger 2722, heat transfer elements 2723 and a low temperature heat source 2724. The heat transfer elements 2723 are each configured to a tube or flat structure, filled with high heat transfer medium, and includes radiating fins at the end. When a turbo charger is operating, the heat transfer elements 2723 can take way part of heat produced by the turbo charger and compressed gas in a rapid and effective way, and carry heat to the low temperature heat source 2724, where heat can be recycled.

This embodiment furnishes a turbo charger featuring high cooling performance, simple structure and reliability, in which that afterheat as produced may serve as alternative thermal energy.

EXAMPLE 184

Gasoline engines have very high RPM in operation. The combustion system on these engines tends to have a very large mechanical load due to its high speed and acceleration. The system should be well cooled for a large heat load produced in combustion may affect reliability and lifespan of all parts. There has been a wide range of applications of vehicles with gasoline engines. Since combusting performance of gasoline engines has become one of the most crucial indicators of the whole vehicular module, an outstanding cooling system serves as an important factor in good combustion. The existing cooling approach is based on circulating water in accompaniment with blast cooling. This approach has a drawback of low cooling performance such that the engine sometimes needs to be shut down for cooling, which affects normal operation.

This embodiment achieves high performance heat dissipation of gasoline engines and recycles afterheat by adopting the high heat transfer elements of the present invention.

FIG. 17ZC is a schematic drawing of a gasoline engine cooling system adopting the heat transfer element of the present invention. The gasoline engine cooling system comprises three parts, namely a circulating waterway 2725, a heat transfer element 2727 and a low temperature heat source 2728. The heat transfer element 2727 is configured to a tube, flat or complex structure, filled with high heat transfer medium, and includes fins at the end. When operating the engine to perform combustion, the heat transfer element 2727 efficiently carries pail of heat to the low temperature heat source 2728 so as to provide a base for constructing a simplified gasoline engine cooling system of higher performance by lowering the pressure of circulated water, improving the function of the cooling system, where as the dissipated heat may be recycled.

This embodiment furnishes a gasoline engine cooling system featuring high cooling performance, high capacity and reliability so as to simplify normal cooling system.

EXAMPLE 185

Car radiator ensures a good working environment for car engines. Traditional car radiators are composed of copper serpentine tubes attached with radiating fins. The most important drawback of such radiators is that they cannot resist collisions such that there is an increasing possibility that car radiators are damaged in car crashes. The other disadvantage is incrustation, which is very difficult to remove.

This embodiment improves radiators (see FIG. 17ZD) technically by adopting the high heat transfer heat pipe element.

FIG. 17ZD shows the high heat transfer heat tube used in this embodiment. The heat tube comprises a heat transfer element 2729, a sleeve 2730 and radiating fins 2731. FIG. 17ZE shows the car radiator adopting the heat tubes. A water tank 2732 is linked to a water outlet 2733 and a water intake 2738 in the radiator while a pipe box 2737 is linked to the water intake/outlet 2733 and 2738. There are eight to ten heat tubes 2734 being provided on the pipe box 2737. One side (source end) of each the heat tube 2734 is placed in the pipe box 2737 while the other side (sink end) is outside the pipe box 2737. The fins penetrate the sink end of each the heat tubes 2734, which are screwed into the pipe box 2737 via sleeves 2736.

Hot coolant in the water tank 2732 enters the pipe box 2737 via the copper water outlet 2733. The coolant washes the source end of the heat tubes 2734. High heat transfer medium in the heat tubes 2734 carries heat to the sink end on the heat tubes 2734 with radiating fins 2735 to dissipate heat to the environment by radiation and heat transfer. In the pipe box 2737, coolant in the water tank 2732 carries heat to medium on the heat tube 2734. Cooled coolant returns to the water tank 2732 via the copper water intake 2738. The structure of this embodiment has the following advantages:

Using high heat transfer heat tubes for heat dissipation makes radiating tubes much shorter. Even if a heat tube is broken in the event of car crashes, coolant does not leak from the water tank since every heat tube works independently and is filled independently with heat transfer medium, such that car engines can work as usual. This improves shock-resistance of car radiators to a great extent.

Heat transfer tubes are used to accelerate the flow of coolant and prevent incrustation.

The high heat transfer heat tubes can be removed from the pipe box to allow easy installation, cleaning, maintenance and removal of incrustation in the radiator.

The use of the high-tech high heat transfer heat tube improves the heat-dissipating performance of car radiators to a great extent.

EXAMPLE 186

In many occasions, electronic devices have to be put in a sealed casing to avoid damage caused by dust, corrosive gas and rain to these devices. Heat produced by electronic devices per unit volume is rapidly increased due to high frequency and high-speed electronic devices and concentrated and compact IC. The normal operating temperature for electronic devices is between −5 and +65° C. Temperature exceeding the aforesaid range causes a decrease in performance and unstable operation. Hence heat in the electronic devices in the sealed casing should be dissipated outside in time to maintain a stable working environment.

FIG. 17ZF shows electronic equipment with a single pipe combination heat transfer exchanger installed on its top. FIG. 17ZG shows electronic equipment with a separated heat transfer exchanger installed on its top. As FIG. 17ZG shows, a medium size fan 2743 is installed inside the casing to enhance inner circulation of hot air produced by the heat-generating devices. Then heat travels to a heat-absorbing segment 2744 in a small size high heat transfer heat tube heat exchanger 2740. Heat then goes to a heat-releasing element segment 2745 outside the casing via the heat tube as the fan 2743*a* dissipates heat to the environment. The small size high heat transfer tube heat exchanger 2740 may either be configured to a single-tube combination (FIG. 17ZF) or separate-type (FIG. 17ZG).

There are two ways of installing the heat transfer tube heat exchanger 2740, i.e. to the top and to the side. As FIG. 17ZF shows, a fan is installed at the air intake of the heat-absorbing segment in a sealed electric appliance cabinet. Hot air in the cabinet is dissipated continuously through the heat tubes, which transmit heat carried by the hot air to the ambient. The heat-releasing segment of the heat transfer tubes can be cooled either by blast or water.

The cabinet and the radiator are linked together with a sealed structure. All heat dissipation is completed absolutely exterior of the cabinet to maintain environmental temperature required by normal operation of electronic devices in the cabinet.

EXAMPLE 187

Rotary elements such as motor rotors and motor bearings have to operate non-stop in many occasions. Abrasions tend to produce heat in long-term, continuous process of operation. If heat cannot be properly dissipated, heated parts tend to be distorted so that they cannot fit in the apparatus, become less flexible and fail to achieve their expected performance. At worst, the machine has to be shut down due to part adhesion.

This embodiment adopts the high heat transfer element of the present invention to rapidly carry heat from a motor bearing to the casing of the motor through heat transfer heat radiator to cool motor winding.

FIG. 17ZH shows a mixing radiator adopting heat transfer elements. The high heat transfer heat radiator comprises a rotary pivot 2749 and heat transfer tubes 2748 installed to the pivot 2749. This embodiment achieves circulation of working liquid with centrifugal force produced in rotation. The turning radiator stirs airflow to reinforce heat transfer. This is particularly effective in dusty occasions.

The element is made as a cone, and filled with heat transfer medium. When the rotary pivot 2749 is turning, heat transfer medium on the pivot 2749 absorbs heat released by the rotor winding on the motor pivot. Heat is dissipated from the heat-releasing segment. By doing this, the heat transfer radiator carries heat produced by the rotary pivot to the environment during rotation.

EXAMPLE 188

Compressed gases are implemented in many aspects of industry, such as welding protection and compressed air wrench. These gases have various parameters. There are many methods of obtaining various compressed gases. Cooling is the best approach to obtain compressed gases since such an approach is less difficult and reduces costs to a great extent. It can be very difficult and expensive to achieve parameters as required if gases are not cooled. Existing cooling methods are based on blast and water cooling. Disadvantages of these methods include low cooling performance. Special cooling approaches such as liquid cooling result in a significant increase in costs.

This embodiment achieves high performance water cooling of compressed gases and recycles afterheat by adopting the high heat transfer elements of the present invention.

FIG. 17ZI shows a compressed gas water cooler adopting the heat transfer elements. The high heat transfer compressed gas water cooler comprises three parts, namely compressed gas 2750, heat transfer elements 2752 and a low temperature heat source 2753. The heat transfer elements 2752 are each configured to a tube or other structure, filled with high heat transfer medium, and include radiating fins at the end.

When the compressed gas 2750 flows through the heat transfer elements 2752 provided on the pipe surface and within the pipe, part of heat carried by the compressed gas travels quickly and efficiently to the low temperature heat source 2753 to cool the compressed gas. Heat in the low temperature heat source 2753 can be recycled. Circulating water is used as an auxiliary cooling tool.

This embodiment furnishes a compressed gas water cooler featuring high cooling performance, simple structure and reliability, where as the dissipated heat may be recycled.

EXAMPLE 189

Many apparatus needs to work in thermostatic conditions in industrial production. Heat reactant or waste heat is often released during such operation as chemical reactors, catalyst regenerator and gas converter. If heat cannot be discharged, production can hardly proceed and possibly cause accidents.

There are two measures of absorbing heat in the industry to discharge waste heat and keep equipment thermostatic, namely external heat intake and internal heat intake. A common way of external heat intake is letting material carrying heat go through pumps, ventilators and other power equipment to remove the heat. Then material goes through cooling such equipment as coolers, steam generators and blast coolers to remove the heat before returning to the equipment or proceeding to the next step. Circulating power equipment and heat exchange equipment work together to absorb heat. Although this measure may control heat to be absorbed, the process is tedious and needs numerous equipment. It may sometimes consume much power and require higher operational standards to deliver the hot material in and out of the cooling apparatus. Such a measure also increases operational costs and working area. The internal heat intake approach implements serpentine pipes and/or tube banks that are plugged into the heat-generating equipment as flowing coolant carries out heat. This measure has advantages such as simple structure, no need for single heat exchange equipment, simple process and small equipment investment. However, it can be difficult to adjust the amount of heat to be absorbed by adopting such a measure. The other drawback is that cracks in pipes due to corrosion or other reasons can hardly be detected and repaired such that leaks happen very often to affect normal productive operation.

Hence this embodiment provides a new type heat intake using high heat transfer element as the heat transfer medium to separate the heat-generating equipment from the cooling equipment. The heat transfer elements feature high heat transfer rates, excellent thermostatic performance and good transmission along its axial direction. One end of each of the high heat transfer elements is placed in the heat-generating equipment and the other end is in the distant cooling equipment. Here, the high heat transfer elements serve as the medium and bridge to carry heat produced by the heat-generating equipment to the cooling equipment. There is no need for power consumption and it saves operational costs in heat intake.

The high heat transfer heat intake comprises high heat transfer elements and a cooling equipment. Joined by the heat transfer elements, the heat-generating and cooling equipments can be arranged either close to each other or in certain distance. FIG. 17ZJ shows the structure of a high heat transfer heat absorber. The heat-generating equipment 2754 can be either a chemical reactor, a converter, a boiling furnace or a contact agent regenerator. The cooling equipment 2759 can be a water cooler, a steam generator, a ventilator or other heat exchangers. The heat-generating equipment 2754 can be any equipment in which heat should be removed. The cooling equipment 2759 is any equipment capable of absorbing heat. Temperature of the exothermic material may vary. High-grade heat may be coupled to a steam generator while low-grade heat can be linked to water coolers or blast coolers. Alternatively, several devices can be arranged in series. The choice of coolant depends on the required heat exchange effect.

The physical structure of the high heat transfer elements can be arranged into two or several modules in heat-generating and cooling equipment, depending on space required for installation of the heat exchange equipment, material, temperature, and the amount of heat intake. The apparatus can be placed vertically and in a slanting position.

The sink end of the high heat transfer elements 2755 is in full contact with the hot material and absorbs heat through the tube wall. Medium in the high heat transfer elements carries heat quickly along the inner cavity to the other end. Heated cold material (e.g. water or wind) at the other end produces steam of certain pressure and is discharged upon absorbing the heat. Heat is dissipated continuously as the heat transfer elements take removed heat, leading to a thermostatic reaction or conversion.

One thing to be noted during operation is that the cooling equipment should be arranged at a location much higher above the heat transfer elements to ensure that the heat transfer elements can function properly and continuously and render higher heat transfer capability. If steam generators are used as the cooling equipment, a steam-water separator should be installed on the top of the equipment.

The structure of the heat intake of this embodiment has the following advantages:

The process of heat intake is simplified and the quantity of equipment is reduced;

The cold and hot equipment can be arranged separately for flexible arrangement;

The cold and hot equipment can be coupled to achieve a wide range of applications;

The cost for obtaining heat is low since there is no need for increasing power consumption in heat transmission;

The apparatus reduces cost investment in equipment, requires less area of installation so as to further reduce the cost;

Separated arrangement contributes to safe production by reducing the possibility of accidents caused by damage to pipes that results in mixing of the cold and hot material.

EXAMPLE 190

Large-size crystalline alloy is a material developed in the recent decade and having a new structure. Breaking through the limitation in the size of traditional laminated non-crystalline alloy, the large-size crystalline alloy possesses excellent mechanical and physical characteristics and is widely used in national defense and private sectors. Rush cooling is one of the basic conditions of preparing non-crystalline alloy. Applying high thermal conducting material such as be-bronze, the present manufacture apparatus has limited thermal diffusion coefficient, such that the present manufacture apparatus can only prepare small-size non-crystalline alloy and tends to have disadvantages such as air hole expansion.

Adopting the high heat transfer element of the present invention, this embodiment furnishes a new apparatus, which shortens period of preparation and improves homogenous quality of alloys.

Improving the rush cooling rate is a gist of this embodiment. FIG. 17ZK shows the structure of a high heat transfer heat conducting non-crystalline material preparing device. As the drawing shows, coolant flows through cooling pipes 2764 while the gap between tube nests is filled with the high heat transfer medium 2763 of the present invention. The medium carries heat carried by the molten metal rapidly to the tube nests, resulting the effect equivalent to expansion of the heat exchange area so that it can achieve very high-speed cooling by using coolant.

The apparatus of this embodiment consists of a high heat-dissipating coefficient, allows high-speed cooling, and is suitable for preparing stick-shaped non-crystalline materials.

Heat-Dissipating Applications to Civil Engineering Facilities and Structure

The following Example 191 shows an application of the heat transfer elements of the present invention to heat dissipation in civil engineering facilities and structure, such as the furnace arc hanger of boilers.

EXAMPLE 191

Current furnace arcs have the problems of aging due to long-term heating and high temperature or distortion and collapse due to expanded furnace arc hangers caused by heat. This leads to short service life of boilers.

This embodiment furnishes a high heat transfer furnace arc hanger for boilers. The high heat transfer tubes are used as hanging parts of the furnace arc as the high heat transfer tubes for hanging the furnace arc are welded to the boiler drums or the upper collecting box. The heat transfer tubes prevent the furnace arc from aging and extend the service life of the boiler by heat transferring and cooling the arcs with water in the boiler.

FIG. 17ZL schematically shows the furnace arc hanger of a high heat transfer furnace arc hanger of the present invention. Heat tube 2767 serves as a hanging part of the front arc 2770 and the rear arc 2769 as the tube 2767 is welded to the boiler drum 2766. FIG. 17ZM shows the connection between a heat transfer tube and a boiler drum.

The high heat transfer furnace arc hanger of the present invention uses the water in the boiler for effective cooling of the arc so that the arc will not burn down. In addition, the furnace arc may act as part of the heat-dissipating area in the boiler. Furthermore, the furnace arc is not damaged by heat expansion since the heat tubes feature has smaller sectional area; lower operating temperature and less heat expansion.

Applications of Heat Dissipation to Chemical Engineering Apparatus

The following Examples 192 to 194 show applications of the heat transfer elements of the present invention to heat dissipation in chemical engineering apparatus, such as oil tank coolers, plate radiators and distributed cement radiators.

EXAMPLE 192

FIG. 18A shows a vehicle oil tank cooler adopting the heat transfer elements. FIG. 18B is a sectional view showing the oil tank of FIG. 18A. To cool the vehicle oil tank, the cooler of this embodiment comprises radiating fins 1801, a tube type high heat transfer element 1802 prepared according to Example 2 and a mineral oil heat carrier 1804. The mineral oil heat carrier 1804 is instilled into the jacket outside the oil tank casing 1803. The endothermic end of the tube type high heat transfer element 1802 is dipped in the mineral oil heat carrier 1804 while it's the exothermic end thereof is outside the jacket. The exothermic end is formed with radiating fins to enlarge the heat-dissipating area. The apparatus is cooled by natural air circulation. When there is a rise in the temperature of the oil in the tank during transportation, the mineral oil heat carrier 1804 is heated as the endothermic end of the high heat transfer element 1802 is heated. The heat is then transferred quickly to the exothermic end and dissipated to the environment through the radiating fins 1801. Accordingly, the apparatus cools the oil to prevent the temperature from rising in the tank and changes in physical property due to the temperature rising.

This embodiment furnishes a vehicle oil tank cooler featuring high cooling performance, simple structure, reliability, high heat exchange rate and suitable for long-distance transportation. The present technology, which cools the vehicle oil tanks indirectly with water jackets (i.e. instilling cold or freezing water into the jacket), is not suitable for cooling the oil in long-distance transportation.

EXAMPLE 193

Independently packed cement is often transported in long distance at a temperature of 70~80° C., which may scald people and is over the standard of environmental protection and hygiene.

Adopting the high heat transfer of the present invention, this embodiment cools the hot cement produced by cement kiln to a normal temperature in transportation to satisfy the requirements for environmental protection, hygiene and safe unloading.

FIG. 18C is an elevational view of a high heat transfer distributed cement radiator. FIG. 18D is a front view of the high heat transfer distributed cement radiator. The high heat transfer cement radiator comprises a cover 1807 and heat transfer elements 1808. Each of the heat transfer elements 1808 is plugged into the independently packed cement 1805 loaded into the carrying vehicles. The independently packed cement 1805 under the cover 1807 is a heat source end. The heat goes from the bottom to the top along the heat transfer tubes 1808 and then to the fins 1806. The cement is cooled by wind in during the transportation and the temperature inside thereof drops. The cover 1807 in between separates the heat sink end from the heat source end. To plug the heat transfer element 1808 into the independently packed cement 1805 smoothly, the heat transfer element tube is a bare pipe and its end is in the form of a pin.

When the independently packed cement 1805 produced in the kiln is loaded into the vehicle, the high heat transfer distributed cement radiators (with covers) are plugged separately into the independently packed cement 1805. Cold air will transfer the heat of the hot cement by the fins 1806 when the vehicles are moving.

EXAMPLE 194

The pressure of the plate heat exchangers used to cool ammonia, resin, acid, alkalis, dye in the present chemical industry as well as steel, machinery, power, paper-making, textile and pharmaceutical industries is below 1.5 Mpa and the operating temperature is lower than 250° C. They are more suitable for small-capacity heat exchangers due to smaller spaces between the plates.

This embodiment improves conventional plate radiators by adopting the high heat transfer elements prepared in Example 2.

FIG. 18E shows the structure of the heat transfer tube used by this embodiment. The high heat transfer tube comprises a heat transfer pipe body 1810, a sleeve 1811 and radiating fins 1812. FIG. 18F shows a front view of the plate radiator adopting the aforesaid high heat transfer plate radiator. FIG. 18G shows a top view of the plate radiator. The plate radiator includes two rectangular tipping-edge seals welded together forming a cavity 1813 in the middle. A plurality of the heat transfer tubes 1814, which are arranged across, are welded to the two seals. A plurality of fins are provided on the heat transfer tubes 1814 to increase the heat exchange area and improve heat dissipation. The heat source end of the heat transfer tube is inside the cavity as the whole radiator is vertically installed.

Hot fluid goes into the inner cavity including a left seal 1815 and a right seal 1817 through a hot flow intake 1816. The fluid horizontally washes rows of the high heat transfer tubes 1814 and the medium in the tubes 1814 absorbs the heat and contact the cold air in the environment. The heat is dissipated by circulation and radiation.

The plate radiator of this embodiment has the following advantages: Since the heat sink end of the high heat transfer tube 1814 achieves the heat dissipation, there is no limit for the thickness of seals 1815 and 1817. Thus, they can be thicker to sustain higher pressure.

There is no restriction to the use of material. Without non-metal material, the apparatus is suitable for various temperature ranges in petroleum chemical engineering and other industries.

The apparatus features high heat-dissipating rates by adopting the high heat transfer material.

With flexibility in application, it is possible to connect one or several plate heat exchangers in parallel according to the flow of the hot fluid to form a standard product.

Heat Transfer Heat Exchange Element

Applications to Heat Exchange in Agriculture and Fishery

The following Examples 195 to 196 show the applications of the heat transfer elements of the present invention to the heat dissipation in agriculture and fishery such as heat circulation system, heat transfer thermostatic apparatus for greenhouses, geothermal energy collectors and agricultural plastic canopies.

EXAMPLE 195

The inorganic high heat transfer element of the present invention can also be used in the fields of agriculture and fishery. For instance, a greenhouse is an artificial, small-scale climate made for plants. The greenhouse is established to fulfill the conditions of plant growth, namely proper temperature, humidity and sunlight, to eliminate the impact of weather on the plant growth. However, the greenhouses have a large temperature difference at daytime and night-time. In other words, temperature and humidity is high in daytime and low at night-time. Thus, storing the heat is an effective approach to balance the temperature difference and supply the heat loss at night-time. Furnaces are currently used to heat the greenhouses, but the temperature is not homogeneous and it is inconvenient to operate the apparatus. Using the inorganic high heat transfer-pebble heat-accumulation circulation of the present invention for heating is pollution-free and thus, creates a clean environment for the plants and enhances proper use and development of energy.

FIG. 19A shows the inorganic heat transfer element-pebble heat-accumulation circulation system of the present invention. FIG. 19B shows the solar collector in the system. The system comprises a thermal insulating layer 1901, pebbles 1902, inorganic heat transfer elements 1903, a mobile thermal insulating layer 1904, a PE film 1905 and a solar energy collector 1906. The heat-accumulation circulation system comprises the solar energy collector 1906 and the pebbles 1902. The heat circulating system is evenly distributed along the wall with a distance of 1 m between each other. The heights of the walls on both sides of the greenhouse must be different so that the PE film faces the sun and is on the leeward. The solar collector should be tilted and installed to face the sun to ensure proper operation of the inorganic heat transfer elements.

The operating theory of the present invention is described as follows. The solar energy collector 1906 is an evacuated tube with the heating segments 1909 and 1912 thereof are in the evacuated tube 1911 and the greenhouse. The heat transfer element in the evacuated tube is coated with selected material. Spiral fins are welded to the heat transfer element 1912 in the greenhouse as the cooling segment is buried in the pebbles 1902. When the sunlight hits the greenhouse at daytime, the coated heating segment in the solar collector absorbs radiating heat from the sunlight while the heating segment 1912 in the greenhouse absorbs redundant heat in the greenhouse. The medium transfers the heat to the cooling segment 1907 to heat the pebbles 1902 for storing the heat. The user activates the mobile thermal insulating layer 1904 and the pebbles 1902 give the heat to the greenhouse as temperature drops at night-time. This keeps the greenhouse warm. Each inorganic heat transfer-pebble heat-accumulation circulation system is aligned in parallel and operates independently so the replacement of damaged parts does not affect the overall system. This contributes to safe operation, easy maintenance and long service life.

EXAMPLE 196

The inorganic high heat transfer element can be used in agricultural plastic canopies, which apply the inorganic heat transfer technology and elements to transferring geothermal energy to the ground surface so as to allow the vegetables and fruit trees in the canopies keep growing in winter.

Seasonal distinction in growing and supplying vegetables and fruit is becoming less significant along with the economic development and improved living standards. Existing plastic canopies for growing vegetables and fruit in winter must be heated by electricity or other means to maintain the required temperature. This approach has two disadvantages. First, it consumes electricity or thermal energy. Second, the temperature in the canopy drops when power or heat source failure occurs; thus, the growth of plants in the canopy is affected.

The inorganic heat transfer agricultural plastic canopy heating system according to the present invention furnishes a plastic canopy with no power or thermal consumption. It is particularly useful in remote places where the electricity or heat cannot be supplied or where there is a lack of electricity or thermal energy.

FIG. 19C shows an inorganic high heat transfer agricultural plastic canopy heating system according to the present invention. The working process is described as follows. The canopy 1913 is closed before the winter comes. The inorganic heat transfer element 1914 buried underground keeps sending geothermal energy to the surface of the ground. Puffy soil 1915 transfers the thermal energy to the canopy 1913 to ensure that the temperature therein is higher than that outside.

Applications to Heat Exchange of Medical Treatment Apparatus

The following Example 197 shows an application of the heat transfer elements of the present invention to the heat exchange in medical treatment such as acupuncture instruments.

EXAMPLE 197

The inorganic high heat transfer element of the present invention can also be used to medical treatment apparatus. A hot/cold acupuncture instrument is one embodiment of applications. As a traditional Chinese medical treatment, the acupuncture is used to treat headache. It is also significantly useful for muscular relaxation and releasing other symptoms and is accepted and applied by the medical profession all over the world. An acupuncturist inserts a sterilized solid metal needle (mostly made of silver) into a patient's body, at the depth between several millimeters to several meters. The acupuncturist stimulates points where the needle is inserted by turning, shaking or pushing/pulling the needle for treatment. However, the acupuncture has less significant effect in treating diabetes, neuritis and glaucoma. The reason is that special hot/cold stimulation must be applied to these parts while traditional needles cannot achieve it. Thermoelectric hot/cold acupuncture instruments are usually used with a thermoelectric thermostatic controller in associated with a thermopile for the cold or hot sources. The cooling instruments with single-level thermopile can reach the temperature between −30° C. and −50° C. (depending on the temperature of the cooling liquid). The temperature can be −60° C. to −80° C. if a secondary level thermopile is used. The heating temperature can be up to 100° C. The instrument has the following disadvantages: complex structure, little cooling capacity and expensive; accidents tend to occur due to the discrepancy in the temperature between the tip and the end of the needle. The hot/c old acupuncture instrument made of the inorganic heat transfer material of the present invention succeeds in eradicating the aforesaid disadvantages.

FIG. 20A is a schematic drawing showing an ordinary inorganic heat transfer hot/cold acupuncture instrument according to the present invention. The inorganic high heat transfer element 2001 is formed in a needled shape. A cavity is formed between the tip and a round heat-insulating handle 2003 and is filled with the heat/cold storage medium 2002 according to various needs. A rear cover 2004 is screwed to the heat-insulating handle 2003. When treating patients, the acupuncturist inserts the needle 2001 into the patients' skin. The temperature of the heat/cold storage medium 2002 is that of the needle tip because of the heat transfer characteristic of the present inorganic heat transfer technology. It enhances the treatment by stimulating the point to be treated with desired heat and coldness.

FIG. 20B is a schematic view showing an electric-heating inorganic heat transfer hot/cold acupuncture instrument with a controller according to the present invention. The apparatus can be used for the acupuncture treatment requiring higher temperature. A sealed cavity is formed between the needle tip 2008 and inorganic heat transfer pipe element 2007. An electric heating cone 2006 with an electric insulating surface is embedded into and in close contact with the inorganic heat transfer pipe element 2007. A controller 2009 connected with electric wires and conductive wires 2005 controls the heating temperature. When treating the patients, the acupuncturist inserts the needle 2001 into the patients' skin. The heat of the electric heating cone 2006 is transferred to the point to be treated through the inorganic heat transfer pipe element 2007 and the needle tip 2003 because of the thermostatic heat transfer feature of the present inorganic heat transfer technology. It improves the treatment by stimulating the point to be treated with thermostatic heat.

Applications of Heat Exchange to Electric Mechanic Equipment

The following Examples 198 to 199 show the applications of the heat transfer elements of the present invention to the heat exchange in electric mechanic apparatus, such as target furnaces, industrial exhaust recycling apparatus and vibrating dust removing heat exchangers.

EXAMPLE 198

The inorganic high heat transfer element of the present invention can be used in target furnaces to target the temperature sensors.

FIG. 20C shows an inorganic heat conducting target furnace according to the present invention. Applying the inorganic heat transfer technology and elements, the furnace is easy to use with good thermostatic performance and accuracy. The target furnace comprises a working cavity 2014, an electric heater 2015, an inorganic heat transfer element 2012 and a gas box. The lower part of the inorganic heat transfer element 2012 is heated externally while the upper part of the element is connected with the gas box, which is kept thermostatic by a mixture of ice and water. The drawing shows the ice cubes 2011 and a thermal insulating layer 2010 outside the gas box.

A plurality of tubes with one end sealed are plugged into the inorganic heat transfer element. The gap between the tubes and the inorganic heat transfer element is the working cavity 2014. A connecting pipe 2013 connects the inorganic heat transfer element in the gas box and that in the working cavity. Another thermal insulating layer 2016 is provided outside the working cavity. This structure controls the temperature deviation in the working cavity within a very small range.

EXAMPLE 199

The inorganic high heat transfer element of the present invention can be used in electric mechanical equipment. An inorganic heat transfer vibrating dust-removing heat exchanger is one embodiment of the applications.

The inorganic heat transfer heat exchangers serve as a new method of heat exchange in industrial production. They can be used for heat exchange between two media, particularly the gas phase media. The typical application is for recycling the afterheat from industrial exhaust. The hot exhaust contains dust in usual industrial conditions. Dust may seriously affect the heat efficiency of the heat exchanger due to dust incrustation between the fins in the inorganic heat transfer element. The present soot blowers, such as steam soot-blowing, compressed gas blowing and impulse blowing are used to reduce the impact of incrustation on the efficiency of the heat exchangers. To enhance soot-blowing, the blowing apparatus should be installed on the heat exchanger to make the dust fall from the inorganic heat transfer element by high pressure, air, steam or impulse waves produced by explosion. This approach needs a compressed ventilator. The heat efficiency of the inorganic heat transfer element decreases due to increased dust incrustation when the apparatus stops blowing the dust. The heat transfer rate decreases significantly when the amount of the dust is large and the dust is small and sticky. It is thus necessary to blow the dust frequently to maintain good heat transfer rate. However, frequent soot blowing reduces the heat transfer rates of the heat exchanger.

The inorganic heat transfer dust removing heat exchanger of the present invention uses the inorganic heat transfer elements for heat exchange. Removing dust by mechanical vibration, the apparatus avoids the aforesaid technical drawbacks and improves the heat exchange efficiency of the heat exchanger by removing the dust incrustation on the elements and fins in an easy and efficient way.

As FIG. 20D shows, the inorganic heat transfer vibrating dust removing heat exchanger comprises a box 2028, an inorganic heat transfer element 2027 and an intermediate partition 2034 as the support of the inorganic heat transfer element. It also includes a spherical seal 2033, a vibrating plate 2019, a vibration-transmission guiding rod 2017 and a compressive spring 2023, which are situated between the inorganic heat transfer element and the intermediate partition 2034 to allow the inorganic heat transfer element to swing in a certain conical angle that is vertical to the intermediate partition and seal the cavity. It further includes a vibrating apparatus to cause vibration on the inorganic heat transfer element and a balancing apparatus that keeps the element in balance. The inorganic heat transfer element produces forced vibration by taking the spherical seal on the intermediate partition as a static fulcrum.

The operational theory of the present invention is described as follows.

A spherical insulating ring 2037 is welded to the middle of the inorganic heat transfer element 2027, which penetrates the intermediate partition 2034. A lug base 2035 with an indented half sphere is provided in a hole of the intermediate partition. The inorganic heat transfer element goes through the half protuberant sphere on the central hole of the lug base. The insulating ring sticks closely to the half indented sphere in dynamic coupling to form a spherical seal 2033. Relying upon the seal, the inorganic heat transfer element may swing within the conical angle situated on its central line. There are two ring grooves 2036 on the half protuberant sphere on the insulating ring, in which ring-shaped fill is embedded to prevent exhaust on the heat side from leaking into the clean medium on the cold side.

Bearing sleeve 2030 is installed closely on both ends of the inorganic heat transfer element to prevent the element from damage in forced vibration and extends the service life thereof. The heat sink end of the element goes through a compressive spring (tower type) 2032 and stretches out of the hole on the angle steel 2031, which is used as the base of the compressive spring. The diameter of the holes on the angle steel 2031 is slightly larger than the external diameter of the bearing sleeve. The bottom of the compressive spring 2032 fits in the centering loop welded to outside the angle steel hole. The top of the compressive spring envelops the base of the first fin at the end of the element as the angle steel 2031 collects the elements at the same horizontal position as an element module. Several inorganic heat transfer elements on various horizontal positions form inorganic heat transfer element modules of the heat exchanger. Both ends of the horizontal angel steels are screwed tightly to the vertical angle steel 2029 on the inner wall of the heat transfer box 2028.

A vibrating plate 2019 is installed near the hot side of the heat exchanger. A hole slightly bigger than the bearing sleeve is arranged on the vibrating plate according to the intermediate partition hole. The heat source end bearing sleeve of the element goes through the hole as the vibrating plate collects the inorganic heat transfer elements together. There are two axle pins 2021 on the vibrating plate while there are two vibration-transmission guiding rods 2017 at the bottom of the plate. The axle pins and the guiding rods are tightly connected with the vibrating plate by screwing the welded plate connector. The vibrating plate is installed in parallel with the intermediate partition. The axle pin on the top of the plate goes through the bush and seal ring 2022 on the external casing of the heat exchanger box. The top of the axle of the compressive spring 2023 is made as spiral ridges and two adjusting screw caps 2024 are used to adjust and fasten the compressive spring 2023. The vibration-transmission guiding rod 2017 at the bottom of the vibrating plate goes through the bush and seal ring 2018 on the outer casing in the bottom of the heat exchanger with the end thereof being connected with the source of vibration. The axle pins 2021 and compressive spring 2023 are used to bear the load of the vibrating plate so that the two screw caps 2024 should be adjusted before connecting the vibration-transmission guiding rod and the source of vibration together. The compressive spring supports the vibrating plate and keeps it at a proper height with distortion force produced by compression. Consequently, the inorganic transfer elements do not bear significant force for going through the holes on the vibrating plate. The vibration-transmission guiding rod should bear no force along the axis thereof when connected to the source of vibration. A space is reserved between the vibrating plate and the box so that the vibration does not contact the box. When the vibration produced by the source travels to the vibrating plate through the connected vibration-transmission guiding rod, the plate strikes the bearing sleeve so that the element produces vibration with the spherical seal on the partition as a fulcrum. The amplitude, frequency and duration of the vibration may be adjusted in light of the concentration of the dust in the exhaust and the nature of the dust remover. The heat source end must be above the heat sink end in installation and operation since the dust-removing heat exchanger applies the inorganic heat transfer technology. The apparatus should be 5~15° upward inclined to maintain the best heat transfer effect.

Applications of Heat Exchange to Thermostatic Apparatus

The following embodiments 200 to 208 use the heat transfer elements of the present invention to the heat exchange in thermostatic apparatus, such as artificial crystal growing thermostat box, ventilating system, air cleaners, indoor air exchangers, air conditioners, ventilators in the air conditioning system, thermostatic controlling systems, fermentation thermostat controllers, thermostatic equipment, biochemical reaction thermostats, geothermal collecting systems, urban heating systems, roadside snow melting systems, thermostats, quartz growing thermostat control apparatus, thermostats, star thermostat devices, air conditioners and integrated energy-saving air conditioners.

EXAMPLE 200

The inorganic high heat transfer element of the present invention can also be used in thermal insulating apparatus. This embodiment furnishes a kind of apparatus for keeping the temperature of an artificial crystal growing thermostat boxes. Adopting the inorganic heat transfer technology and elements, the apparatus provides good temperature environment for crystal growing. Artificial crystal is widely applied to the optical data processing and storage, color laser display, laser work, laser treatment and high temperature semiconductor while the cultivation of the artificial crystal is a bottleneck of the technical development in the field. It is very important to control the temperature of the crystal-growing furnace in the process of artificial crystal cultivation. The present crystal growing apparatus such as crucible rotation, descent approach and Czochralski method adopts intermediate frequency induction or resistance wire as a heating method. Temperature control, such as thermal insulation and thermostat, lies in empirical approaches. It is well known that most materials for preparing crystal have high fusion point. Crystal growing is hot gas and solid phase reaction so it demands high reactive temperature. If the temperature is not controlled properly in the process of crystal growing, it is rarely to produce high quality large-size crystal since the crystal grows very slowly and significant defect such as wrapped structure may occur.

The inorganic heat transfer element of the present invention features thermostatic and offers nearly thermostatic temperature environment for the crystal growth.

FIG. 21A shows an artificial crystal growing thermostat box. The apparatus is placed on a lifting mechanism 2106. The crucible is wrapped with a thermal insulating layer 2105. The thermal insulating layer 2105 is enveloped with a zirconium oxide insulation cap. Inorganic heat transfer medium 2101 in the ring cavity starts working when the electric heater 2103 is powered on. The heat from the heater 2103 travels to the insulation cap 2104 around the crucible 2102 to provide the crystal growing with proper temperature environment.

EXAMPLE 201

The inorganic high heat transfer element of the present invention can also be used in ventilating equipments. This embodiment is a home energy-saving ventilation system.

Due to limits of indoor air cleaners, the existing indoor air cleaners can hardly be regarded as effective solutions. As the problem of degrading air quality is getting more serious, there is an urgent need for an effective way to improve indoor air quality. The best way is actually the simplest traditional approach, i.e. improving indoor ventilation. The approach improves the indoor air quality by continuously supplying fresh air and extracting the air with poor quality at the same time. The improvement of ventilation should also reduce the energy consumption and avoid causing too much difference in indoor temperature (when there is large temperature gradient inside and outside the room). Huge changes in the indoor temperature due to ventilation may cause uncomfortable feeling and health problems while resuming the temperature increases the energy consumption. The ventilating system of the present invention is mainly used for ventilation and air exchange. It has two additional functions other than ventilation. First, it separates and removes the dust in the air coming from outdoors for ventilation with high performance in filtering material. In other words, it serves as an air cleaner. Second, it provides air exchange by making the incoming and outgoing airflows exchange heat with each other when the former forces the latter out of the room. As FIGS. 21C and 21D show, when the indoor temperature is higher than the outdoor one, hot air outside enters the room through the ventilating system and transfers the heat to the cold air indoors, which is forced out. The temperature of the incoming air drops since the outgoing cold air takes the heat outdoors, and vice versa. As the ventilator keeps working, the indoor air and outdoor air continue exchanging to achieve proper indoor air quality. It does not cause great changes in the indoor temperature. This ventilating system achieves two-way heat exchange and ventilation. When extracting the indoor air, the ventilator filters the outdoor air and sends it into the room. Turning wheel heat recovery apparatus stabilizes the indoor temperature by providing a heat exchange rate of 68%. The inorganic high heat transfer element is adopted to enhance high performance heat exchange as stated above.

FIG. 21E is a partially sectional view of an inorganic heat transfer enclosed radiator for electronic controllers. It comprises an inorganic heat transfer base pipe 2112, an aluminum piece 2113 and a partition 2114. The inorganic heat transfer element is placed within the box (see FIG. 21D) to facilitate the heat exchange between indoor air and outdoors air. Since the connection of the casing and the radiator adopts a sealed structure, all the heat dissipation is finished independently and externally. Consequently, the ventilating system extracts the dirty air from the room to outdoors while the fresh air outdoors comes in. It cleans the air in the room by ventilation without any heat loss.

EXAMPLE 202

The inorganic high heat transfer element of the present invention can also be used in ventilating systems. This embodiment is related to a complex building energy-saving ventilation system.

The structure of buildings varies according to social and natural environments. The more firmly a building is sealed, the more it demands for ventilating systems, which require greater capacity along with higher energy consumption. By using the inorganic transfer technology and elements, the present invention recycles the lost power in the building ventilation to reduce the power consumed by the air conditioning modules and save energy.

Air-conditioning ventilating systems play an important role in buildings with large mobile population or other special conditions. As FIG. 21F shows, the inorganic heat transfer complex building energy-saving ventilation system 2118 recycles the energy carried by blast. After being treated by an air condition module 2117, the blast is directed to the ventilation opening in the canopy 2115 through the outlet pipes 2119 and goes into the room. The air in the room that is not fresh anymore should be ventilated. The ventilator drives the air to the air intake through a return air pipe 2120 and sends the air to the inorganic heat transfer complex building ventilation system 2118 for energy exchange. The air is then discharged. The process repeats to achieve good indoor air circulation.

The description above is the operating theory of the whole system. The following paragraphs explain the structure and operating theory of the inorganic heat transfer complex building ventilation system. The inorganic heat transfer complex building ventilation system comprises an inorganic heat transfer heat exchange system and auxiliary equipments on the casing. The inorganic heat transfer system comprises an inorganic heat transfer pipe 2123, fins 2122 and a tube sheet 2124. Auxiliary equipments on the casing includes a casing 2121, an intake ventilator 2125, a filter 2126 and an outlet ventilator 2127.

Driven by the intake ventilator 2125 and the outlet ventilator 2127, fresh air goes into one side of the inorganic heat transfer heat exchange system through the filter 2126 while the old air goes into the other side. The fresh air and old air fully exchanges the heat with each other by the inorganic heat transfer pipe 2123. Then the old air is discharged while the fresh air goes indoors after being treated by the air condition module. Energy in the old air is fully recycled in the process since the inorganic heat transfer pipe features high performance in heat transfer and heat exchange.

EXAMPLE 203

The inorganic high heat transfer element of the present invention can also be used in thermostat controllers. This embodiment is a fermentation thermostat controller. It uses the inorganic heat transfer technology and element of the present invention to create a thermostatic environment for the fermentation by reducing temperature fluctuation in the fermentation container.

The container must be thermostatically controlled in fermentation to activate the yeast for better quality and production rates. The existing thermostatic approaches for the containers are preceded in the mixers or liquid circulation by flow conducting drums. The drawback of these approaches is that the yeast tends to be inactive due to difficulty in temperature control.

As FIG. 21H shows, the present invention furnishes a fermentation thermostat controller 2128 featuring excellent thermostat control, simple structure and reliability. It comprises a jacket and an electric heater 2130. The jacket is filled with certain amount of inorganic heat transfer medium 2129. When the electric heater 2130 is powered on, the inorganic heat transfer medium 2129 in the jacket transfers the heat rapidly around the fermentation container 2128. To control the temperature of the container 2128, one simply needs to adjust the input power of the electric heater 2130.

EXAMPLE 204

The inorganic high heat transfer element of the present invention can also be used in biochemical equipments. The temperature of biochemical reaction should be strictly controlled and the reactor should have good thermostatic performance so as to keep the cells and the enzyme active in the biochemical process to achieve the best rate of reaction. The heat produced in biochemical reaction, which is normally exothermic, makes the temperature control of the reaction somewhat difficult. The container must be thermostatic for the biochemical reaction such as cell culture. The existing thermostatic approaches for the biochemical reactors are preceded in the mixers or liquid circulation by flow conducting drums. The drawback of these approaches is that the cells or the bacteria tend to be inactive due to difficulty in temperature control. This embodiment provides a biochemical reactor featuring high thermostatic performance, simple structure and reliability. By using the inorganic heat transfer technology, the apparatus creates a stable environment for the biochemical reaction by reducing the temperature fluctuation in the container of fermentation.

FIG. 21I shows an inorganic heat transfer biotechnological thermostat device of the present invention. It comprises a jacket and an electric heater 2133. The jacket is filled with certain amount of inorganic heat transfer medium 2132. When the electric heater 2133 is powered on, the inorganic heat transfer medium 2129 in the jacket transfers the heat rapidly around the reactor 2131. To control the temperature of the reactor 2131, one simply needs to adjust the input power of the electric heater 2133.

EXAMPLE 205

The inorganic high heat transfer element of the present invention can also be used to melt snow in cities. In other words, it creates an automatic snow-melting equipment to achieve a city that never gets frozen.

Houses, streets and highways in cities in the North in winter tend to be covered by snow, which has great negative impact on the safety of automobiles and pedestrians due to uneven and slippery road surface. It also causes inconvenience in traveling and living since there is a thick layer of frozen soil and the piping networks tend to be broken. Thus removing the snow and keeping roadside and street clean and dry is not only a precondition of smooth and safe traffic, but also ensures reliable supply of various energies in the urban area. This is particularly important in the current thriving traffic development for the freeway networks in modem cities. However, snow melting on streets, highways and underground piping involves broad snow area, great heat consumption and low heat transfer efficiency. It will waste a great amount of power if the high-grade energy is used. It is also difficult to apply the ordinary heating equipment. Thus, the problems of snow melting in the urban area can hardly be solved in terms of either the structure of the equipment or proper use of energy.

The Earth has been providing living creatures with endless and free geothermal energy since it came to existence. Like solar energy, it is one of the cheapest green energies that human beings can acquire easily. It is not poisonous, not harmful, of great amount and easy to get. The present invention is related to automatic snow-melting equipment using the geothermal energy as a heat source in association with the thermostatic nature of the inorganic heat transfer elements. FIG. 21J shows an inorganic heat transfer roadside heating system. It is described in detail as follows.

It is generally understood that the temperature inside the earth rises with the depth. The temperature of the soil under more than 7 m from the surface is almost constant around the year. It is roughly the same with the average annual temperature, usually between 10° C. and 14° C. at the depth of 7~20 meters. This is regarded as one of the idea green environmental-sensitive heat source used for melting snow. The heat transported by the inorganic heat transfer elements achieves the automatic snow melting or anti-freezing in the cities to ensure driving and pedestrian safety and normal power supply.

The inorganic heat transfer urban heating system is invented according the aforesaid theory. The heat source, which is hereby referred as heat collecting segment 2134, is used for snow melting and it can be either geothermal water or soil 2142. Ice, snow or frozen soil on the roadside or street is the cold source, which is also referred as heat-receiving segment 2136. One end of the inorganic heat transfer element is connected to the heat source while the other end is connected to the cold source. With great heat transfer and thermostatic performance, it carries the heat of several or dozens of meters in depth underground to the street and highway on the surface to melt the snow. In fact, the inorganic heat transfer pipe elements plugged into the geothermal water or soil are the core of the geothermal snow-melting facilities. First, they transfer the heat between the heat-collecting segment and the heat-receiving segment. Second, they can transfer the heat continuously to the ground surface under thermal insulation. Third, the heat is collected from the geothermal water or soil at the heat-collecting segment 2134 while the heat-receiving segment 2136 transfers the heat to the snow.

As FIG. 21J shows, the ribs 2141 should be used to wind around the surface of the heat transfer pipe element 2140 at the heat-collecting segment 2134. The ribs 2141 are also used to wind around the heat-receiving segment 2136. The reason for doing this is that the heat transfer coefficient between the soil and the inorganic high heat transfer element is relatively low and it is not easy to collect the heat from the static soil 2142 as the heat source. Thus, the ribs are added to the present invention to increase the heat transfer area. When the heat source is fluid, such as seawater, river and hot spring, the inorganic heat transfer pipes at the heat-collecting segment 2134 can have no ribs because that the flowing water features better continuous heat supply, the heat transfer coefficient between the hot water and the inorganic heat transfer element is larger and it is easier to collect heat.

In order to reduce the heat losses in the transfer process and improve the heat utilization rate, the present invention applies good thermal insulating material to the heat transmitting end of the inorganic heat transfer element 2138. That is, an insulated thermal insulating layer 2139 provided at the heat-insulating segment 2135 is necessary.

The cooling segment 2137 is exactly where the snow is heated and melted. The inorganic high heat transfer element at heat-receiving segment 2136 must transfer all the collected heat to the frozen surface on the roadside or street. Similar to the soil heat supply, the ribs must be added to the inorganic heat transfer elements at this segment since the heat transfer coefficient between the elements and the snow/frozen soil on the roadside is small.

The process of collecting, carrying and transferring the geothermal energy is repeated until the snow on the roadside is melted.

The geothermal snow-melting apparatus of the present invention applies the inorganic heat transfer elements with gravity-type structure without a tubular core. They have automatic locking function so as to stop working when the temperature on the ground is higher than that of the soil. Thus, there is no heat loss caused by reversed heat transfer in summer.

A combination of heat collection, heat transfer and heat dissipation, the inorganic heat transfer elements utilize the geothermal energy for non-manual snow-melting for roadsides and sidewalks in the city. These elements melt the snow by transferring the geothermal energy from several and dozens of meters underground to achieve automatic snow melting with no energy consumption. It not only serves as a new way of utilizing the natural energy but also ensures the traffic safety for automobiles and pedestrians in winter. The cheap and high performance apparatus keeps melting the snow automatically in various weather conditions.

The invention can be applied to the cities where the frozen streets and roadsides threaten the driving safety and pedestrians' safety. Proper modification should be made in operation since the depth and the structure of the heat elements vary with geographic locations, climate and the form and temperature of geothermal sources in different cities.

EXAMPLE 206

The inorganic heat transfer element of the present invention can be used in thermostat controlling devices. This example is a kind of the thermostat apparatus for controlling the temperature of quartz growth. Adopting the inorganic heat transfer technology and elements, the simple and reliable apparatus provides good temperature environment for quartz growth.

It is very important to control the temperature of the quartz-growing furnace in the process of quartz growth. The existing crystal growing apparatus such as crucible rotation and elevating approach adopts intermediate frequency induction or resistance wire for heating. The temperature control measures include thermal insulation and pressure resistance thermostat.

The rapid development of laser, electricity, electronics, instruments and materials science contributes to wide applications of quartz products to optical data processing and storage, color laser display, laser work, laser treatment, high temperature semiconductor, precise instruments and fireproof materials. However, how to produce quality crystal and products with high quality is still a bottleneck in the technical field.

Quartz products include quartz sand, silica sand, silica, quartzite, fused quartz powder, silica flour and natural crystal powder. Raw materials used to prepare these products tend to have high fusion point. Quartz growth is hot and pressurized gas and solid phase reaction and demands higher reactive temperature. If the temperature is not controlled properly in the process of quartz growth, it is very unlikely to produce large-size quality quartz products since the quartz may grow very slowly, and significant defect such as wrapped structure may occur.

FIG. 21K shows a thermostat apparatus for a quartz growing thermostat box adopting the inorganic heat transfer technology. The main theory is that the inorganic heat transfer element of the present invention is thermostatic in hot environment so it offers almost constant temperature environment for quartz growth. The apparatus comprises a quartz growing box, an elevator 2148 and a bearing elevating platform 2147. A thermal insulating shield 2144 is provided to cover the quartz growing box. The working process is described as follows. After the sensitive electric heater 2146 is powered on, the inorganic heat transfer medium 2143 in the loop cavity of the heated furnace transfers the heat inputted by the electric heater to around the wall of the quartz growing box, so as to provide proper temperature environment for the quartz growth.

EXAMPLE 207

The inorganic heat transfer element can be used in satellite thermostat devices. This embodiment furnishes a thermostat device used inside a satellite. The thermostat device reduces the temperature difference between the northern and southern sides on the satellite. It can be applied to the satellites controlled by triaxle posture.

The structure of a static triaxle posture controlled satellite is described as follows. The northern and southern panels serve as the main exothermic and endothermic areas since the conditions are the most stable there. Accordingly, most heat sources inside the satellite are installed under the panels. The angle of incidence of the sun in different seasons varies and thus, the heat transfer capacity on the south panel 2149 and the north panel 2150 varies accordingly. The sun only hits the north panel 2150 from vernal equinox to autumnal equinox while it only hits the south panel 2149 from autumnal equinox to vernal equinox. Several U-shaped inorganic heat transfer elements 2151 are installed on the south panel 2149 and the north panel 2150. As the drawing shows, these heat transfer elements keep both panels thermostatic so that temperature in the satellite can be homogeneous in various seasons.

EXAMPLE 208

The inorganic high heat transfer element of the present invention can be used in thermostat apparatus. This embodiment provides an integrated energy-saving air conditioner. It saves energy and improves the indoor air quality by using the inorganic heat transfer technology and elements of the present invention to enhance the heat exchange between the exhaust from the air conditioner and fresh air.

Ordinary air conditioners can only adjust the temperature and humidity. The best way to improve the air quality in air-conditioned rooms is to ventilate the air. Traditional air conditioners cannot achieve good air quality and save energy at the same time because of the coldness/heat leak during ventilation.

This is possible, however, if the heat can be recycled when the ventilated air and the fresh air fully exchange the heat with each other.

FIG. 21M shows a schematic view of an inorganic heat transfer integrated and power-saving air conditioner. By using temperature difference between the ventilated air and the fresh air in the room, the air conditioner carries coldness (in summer) or heat (in winter) of the ventilated air to the fresh air. The drawing shows the operating process of the present invention in which the fresh air enters the room through the heat exchanging apparatus. This reduces the load of the indoor air conditioner and saves a considerable amount of energy. The power-saving air conditioner is required to have higher heat efficiency and lower pressure losses when the temperature difference between the air-conditioned room and the environment is small (less than 20 degrees in summer and less than 35 degrees in winter). The integrated power-saving air conditioner makes the most of the advantages of the inorganic heat transfer elements such as rapid heat transfer and great axial heat transfer capability.

Heat Exchange Applications to Chemical Engineering Apparatus

The following Example 209 shows an application of the heat transfer elements of the present invention to the heat exchange in chemical engineering apparatus, such as the thermostat device for petroleum chemical equipment and cracking furnaces.

EXAMPLE 209

The inorganic heat transfer element of the present invention can be used in petrochemical industry. For example, the thermostatic feature of the inorganic heat transfer pipes is used to satisfy the requirements of high temperature, intensive heat absorbance, homogenous temperature distribution, short material staying time and low arene partial pressure in arene hot cracking.

FIG. 21B shows an inorganic heat transfer cracking furnace according to the present invention. The key point thereof lies in adopting the inorganic heat transfer technology and elements of the present invention. The inorganic high transfer element ensures safety in use with the features of high heat transfer capability, excellent thermostatic effect and independent, adjustable heat transfer areas in the sink/source end for modifying the heat flux density. Based on the present invention, the inorganic heat transfer cracking furnace comprises the following parts (see FIG. 21B): an inorganic heat transfer tube 2107, a furnace chamber 2108, a smoke entrance connector 2109, a cracked gas access pipe 2110 and a tube sheet 2111. As shown in the figure, the rectangular furnace chamber with openings on the left and right thereof is divided into an upper section and a lower section by the tube sheet 2111 in the middle. The upper section is the heat sink end of the inorganic high heat transfer tube 2107 while the lower section is the heat source end. The inorganic high heat transfer tube 2111 penetrates the tube sheet 2111 vertically and is arranged as a triangle. In operation, the cracked gas vertically crosses the heat sink end of the inorganic high heat transfer tube while the hot smoke from the burner and the fresh air cross the heat source end of the tube in counter movement. The inorganic high heat transfer medium then transfers heat from the hot smoke to the upper section of the inorganic high heat transfer tube (that heat sink end) to keep the wall and fins of the tube thermostatic. This provides perfect conditions for the cracking reaction, in which the gas is cracked after absorbing the heat.

Heat Transfer Element System

Heat Transfer Element System of Agriculture and Fishery

The following Example 210 shows an application of the heat transfer elements of the present invention to agriculture and fishery so that the coupled elements can improve the heat exchange. Applications include plant heating apparatus and fishery heating system.

EXAMPLE 209

The inorganic high heat transfer element of the present invention can be used in agriculture and fishery. This embodiment illustrates a plant heating apparatus and a fishery heating system.

It is well known that solar energy and geothermal energy is clean, environmental friendly and always available in nature. Both are not poisonous, not harmful, of great amount and easy to get. They provide living creatures on earth with free low-grade thermal energy in the form of light and heat. Plants in the northern region can hardly grow similar to those in the southern region due to geographic location. It is cold in fields in the northern region during winter as the soil is frozen. Traditional one sowing season per year can no longer fulfill the demand in a growing society with increasing population. In order to improve the utilization of the soil and the production rate, greenhouse planting, represented by canopies, has been rapidly developing in the northern region recently. This approach makes possible of sowing throughout the year in the northern region by extending the growth cycle of plants, however, it still has problems with heating for the canopies in winter.

Canopies usually belong to different people and it is difficult to manage them as a unit, users tend to heat them with traditional methods such as burning wood or leaves or small coal boilers. This increases the number of boilers, lowers the fuel use rates, and increases energy consumption, productive costs and intensive labor. Consequently, smoke becomes everywhere in farming areas, where the air quality supposed to be good with little pollution. Although solar and geothermal energy features infinite supply, there has not been any simple and workable method of heating canopies except heating the wall by sunlight since the energy is low grade.

FIG. 22A shows a plant growing canopy heating system, which applies the inorganic transfer elements to improve the solar absorbance and makes the most of geothermal energy. The apparatus solves the heating problems of the canopy by using the solar and geothermal energy, which is cheap, clean and environmental friendly, for energy conversion. This embodiment avoids the direct/indirect combustion of fuel such as oil, gas, coal and wood, it neither wastes raw materials nor pollutes the air. It also reduces low-temperature hot gas, which causes heat pollution to the environment.

The integrated inorganic heat transfer heating apparatus combines a solar energy system and a geothermal system. It comprises an inorganic solar water heater 2203, a geothermal water heater 2208 and an air radiator 2206. Other auxiliary devices include a water storage 2209, a pump 2210, a supply pipe 2201, a water intake valve 2202, a water outlet valve 2204 and a solar collector 2205.

As FIG. 22A shows, the inorganic heat transfer element heating apparatus of the present invention may be a solar or a geothermal system. The circulating medium is water. The inorganic heat transfer heat collector 2205 collects the solar energy to heat the water in the solar water heater 2203. The heated water is sent into the air radiator 2206 as a heat source in the canopy 2207 for vegetable planting. Geothermal energy 2212 may be hot springs, preferably, or it may also be river, sea or soil deep underground. The inorganic tube type heat transfer element 2211 collects the heat form the aforesaid sources and transfers it to the water in the geothermal water heater 2208. The heated water is also sent into the air radiator 2206 as another heat source for the canopy 2207. In the canopy 2207 for vegetable planting, the heat carried by warm water goes to the air through the inorganic heat transfer air radiator 2206 having ribs thereon to provide the proper temperature for plant growing.

Two water intake and outlet switch valves are added to the process to fully receive and use the solar energy and properly collect and accumulate the geothermal energy. By doing this, the solar energy or the geothermal energy is used by turns, depending on availability of light. The apparatus uses the solar energy mainly at daytime or in sunny days while the geothermal energy is stored. When the solar energy decreases at night-time or in cloudy days, the geothermal system is activated for heating. The cycle repeats so as to provide consistent heating for the canopy and let the plants grow well around the year.

The inorganic heat transfer elements play an important role in the collection, transfer and dissipation of the heat in both the solar and geothermal water heaters. Keeping the water circulation system unblocked is also important in operation. The combination of the inorganic heat transfer elements, which feature high heat transfer and homogenous temperature distribution, and the circulating water achieves the heat conversion between low-grade natural energy and the heat source for the canopy in an economical way.

The solar collector applies vacuum heat collectors in the structure. It has better performance in terms of tracking and receiving the solar energy from the radiating beams in various directions. Since the inorganic high heat transfer elements have the high-speed heat transfer, the heat received at the heat-collecting segment is soon transferred to the water in the heat-receiving segment. This promotes the utilization rate of the received solar energy to a great extent.

When the heat source of the geothermal water heater is hot spring or other water sources, the heating end of the inorganic heat transfer element can be without ribs since it is easier to collect and transport the heat. When soil is the heat source, however, ribs should be added to the heating end on the inorganic heat transfer element since it is relatively difficult to collect the heat.

The inorganic high heat transfer elements in the aforesaid systems adopt a gravity-type structure without a tubular core so that they are locked automatically when it is cloudy or the temperature at the heating segment is lower than that at the cooling segment at night. This avoids heat losses in the canopy caused by sending the heat outside.

FIG. 22B is a schematic drawing of the workflow of an inorganic heat transfer fishery heating system according to the present invention. It is basically similar to that shown FIG. 22A. The only difference is that FIG. 22A shows a canopy for vegetable planting while FIG. 22B shows a fishery heating system. This embodiment heats the pond 2219 by a pound heater 2218 instead of the air radiator 2206, which is used to heat the canopy 2207 in the former embodiment. Other devices such as a supply pipe 2213, a water intake valve 2214, a solar energy water heater 2215, a water outlet valve 2216, an inorganic tube type solar collector 2217, a geothermal water heater 2220, a water storage 2221, a pump 2222, a tube heat transfer element 2223 and a geothermal energy 2224 correspond with those parts shown in FIG. 22A. The present invention shortens the growing period of fishery creatures and improves the fishery productivity by successfully solving the problems of heating for fishery pounds in winter.

Applications to Heat Transfer Element Systems of Electronic or Electric Appliance The following Example 211 shows an application of coupling the heat transfer elements of the present invention to the heat exchanger, such as dehydrators in electronic or electric appliances.

EXAMPLE 211

The inorganic high heat transfer element of the present invention can also be used in dehydration apparatus. This embodiment is related to a dehydrator.

Too much humidity in the air tends to cause poor product quality in some cases. Hence, it is necessary to lower the humidity in the air by certain dehydration apparatus. By adopting the inorganic high heat transfer elements and elements of the present invention, the dehydrator can solve the problem effectively.

As FIG. 23A shows, the inorganic heat transfer dehydrator comprises four parts, namely a cooling and moisture trapping system 2301, heating system 2309, semiconductor cold production system 2308 and fan 2310. The cooling and moisture trapping system 2301 comprises a drain 2302, a water collecting tank 2303, a radiating fin 2304, an inorganic heat transfer element 2305 and a heat filler 2306. The heating system 2309 is the same with the cooling and moisture trapping system 2301. The semiconductor cold production system 2308 comprises a power interface 2307, a semiconductor cold production system and an electric controlling system. The user can choose the ventilating capacity of the whole system according to the amount of moisture to be dehydrated.

There are many ways of dehydration. For instance, absorbing chemicals may be used to collect the moisture in the air. However, the problem of recycling the used chemicals and providing new chemicals can hardly be overcome in a continuous and repetitive dehydration process. The usual process of dehydration is described as follows. First, the air becomes over supersaturated after cooling. Then, the air becomes saturated as surplus moisture goes out. Finally, the air is heated to the original temperature so it becomes unsaturated. The inorganic heat transfer dehydrator applies the same operational theory. The working process includes: the semiconductor cold production system 2308 and the fan 2310 start operation after being powered on. The temperature on the cold area of the semiconductor cold production element drops while that on the hot area rises. The cold area rapidly carries the coldness to the inorganic heat transfer element 2305 through the heat transfer surface. Then the heat transfer element 2305 distributes the coldness and to the radiating fins 2304. The fan drives the air with moisture through the radiating fins 2304 for cooling and dehydration. The hot surface carries the heat to the heating system 2309 in the same way. The cooled and dehydrated air is then heated to normal temperature when it goes through the heating system 2309 so as to unsaturated it. The apparatus dehydrates the air in the environment by reducing its relative humidity in the repetitive and cycled process stated above.

Applications to Heat Transfer System in Daily Products

The following Example 212 shows an application of coupling the heat transfer elements of the present invention to the heat exchange in daily products such as an inorganic heat transfer geothermal cooling system.

EXAMPLE 212

The inorganic high heat transfer element of the present invention can be used in daily products. This embodiment is related to an inorganic geothermal cooling system.

The modern agricultural technology provides a variety of foods products. Hence, surplus fruits and vegetables should be stored soon. People gradually develop a fine taste about the fruits and vegetables because of rising living standards. They can no longer feel satisfied with the food stored at room temperature. Keeping stored fruits and vegetables fresh by retaining their nutrition and moisture has become the mainstream of storage technique.

The current storage techniques includes low-temperature refrigeration, chemicals or both. The chemical spray destroys the nutrition of fruits and vegetables and introduces new pollution. This approach does not genuinely keep food fresh from the environmental perspective. On the contrary, cold temperature refrigeration becomes increasingly popular since it is environmental friendly.

Various tests show that the best temperature of low temperature refrigeration is around 5° C. The growth and respiration of the plants slows down but does not stop at this temperature. They taste good because of the moisture contained therein which is not frozen.

Actually, the earth is a thermostatic refrigerator. The temperature deeper than 7 meters under the ground surface is above the average temperature at the local area around the year. For example, the temperature at this depth in Northeast China is around 10° C. all the time. If the heat can be recycled in winter and discharged in summer, the temperature in the refrigerator can be maintained at 5° C. with very little energy consumption. The problem is that it is difficult to access geothermal energy in the deep stratum in winter and discharge the heat in summer.

The present invention uses the inorganic heat transfer element with excellent thermostatic performance and axial transmission capability to access the geothermal energy in winter. The food is refrigerated by means of a cooling machine in summer.

As stated above, the cooling refrigeration system of the present invention includes a winter system and a summer system.

The temperature in winter is usually below 0° C. in some regions. Even if the refrigerator has perfect cooling performance, there is still a need for supplying the heat to keep the temperature in the refrigerator at 5° C. (the most preferable), otherwise the refrigerator cannot keep food fresh. The inorganic heat transfer element is the best choice for a geothermal collector because of the high thermostatic performance and excellent heat transfer capability. When plugged into the soil underground, the element transfers the geothermal energy from several to dozens meters underground to the refrigerator on the ground surface with no extra power consumption. See FIG. 23B for a schematic drawing of geothermal collection.

As FIG. 23B shows, when the temperature in the refrigerator 2313 is below 5° C. in winter while the temperature in the soil 2211 is about 10° C. Since temperature in the lower part of the inorganic heat transfer element 2312 is higher than that in the upper part, the heat keeps moving along the inner cavity of the inorganic heat transfer element 2312 into the refrigerator 2313. This makes up for heat losses in the refrigerator. The temperature difference between the soil 2311 and the refrigerator 2313 gradually becomes smaller in summer. When the temperature in the refrigerator is close to that under the ground, the inorganic heat transfer element 2312 stops working since the temperature difference at both ends of the element is almost zero.

When the element 2312 is working, temperature of part of soil drops due to the outgoing heat. It forms a circulating supply as the heat keeps coming from surrounding soil to the apparatus since the area of the soil is much bigger than that of heat collection. The heat transfer speed may be faster and better if groundwater or hot spring is available in the deep stratum.

When the temperature in the refrigerator 2313 becomes above 5° C. due to a rise in the environmental temperature, it should be controlled and adjusted by refrigerating machines and air conditioners. Hence, the secondary equipment of a refrigerator should be a cold-producing machine, such as an ice-making machine.

The inorganic heat transfer geothermal cooling system is an application of power-saving and environmental friendly technology. The heat transfer elements are plugged into the soil all together so there is no need for manual control. The use of the geothermal energy in winter is free of charge, with no pollution, no noise and no power consumption. The system achieves genuine food preservation and is superior to a full powered refrigerator even though the system does not work around the year.

We claim:

1. A heat transfer element consisting essentially of a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5%–1.0%, the heat transfer medium is positioned on a substrate.

2. A heat transfer element according to claim 1, wherein the weight percentages in the heat transfer product are:

(1) Cobaltic Oxide (Co2O3), 0.7–0.8%;
(2) Boron Oxide (B2O3), 1.4–1.6%;
(3) Calcium Dichromate (CaCr2O7), 1.4–1.6%;
(4) Magnesium Dichromate (MgCr2O7.6H2O), 14.0–16.0%;
(5) Potassium Dichromate (K2Cr2O7), 56.0–64.0%;
(6) Sodium Dichromate (Na2Cr2O7), 14.0–16.0%;
(7) Beryllium Oxide (BeO), 0.07–0.08%;
(8) Titanium Diboride (TiB2), 0.7–0.8%;
(9) Potassium Peroxide (K2O2), 0.07–0.08%;
(10) A selected metal or Ammonium Dichromate (MCr2O7), 7.0–8.0%; where "M" is selected from the group consisting of potassium, sodium, silver, and ammonium;
(11) Strontium Chromate (SrCrO4), 0.7–0.8%; and
(12) Silver Dichromate (Ag2Cr2O7), 0.7–0.8%.

3. A heat transfer element according to claim 1, wherein the weight percentages in the heat transfer medium product are:

(1) Cobaltic Oxide (Co2O3), 0.723%;
(2) Boron Oxide (B2O3), 1.4472%;
(3) Calcium Dichromate (CaCr2O7), 1.4472%;
(4) Magnesium Dichromate (MgCr2O7.6H2O), 14.472%;
(5) Potassium Dichromate (K2Cr2O7), 57.888%; Sodium Dichromate (Na2Cr2O7), 14.472%; Beryllium Oxide (BeO), 0.0723%;
(8) Titanium Diboride (TiB2), 0.723%;
(9) Potassium Peroxide (K2O2), 0.0723%;
(10) A selected metal or Ammonium Dichromate (MCr2O7), 7.23%; where "M" is selected from the group consisting of potassium, sodium, silver, and ammonium;
(11) Strontium Chromate (SrCrO4), 0.723%; and
(12) Silver Dichromate (Ag2Cr2O7), 0.723%.

4. A heat transfer element according to claim 1, wherein the heat transfer element is a heating element.

5. A heat transfer element according to claim 1, wherein the heat transfer element is a heat-dissipating element.

6. A heat transfer element according to claim 1, wherein the heat transfer element is a heat exchange element.

7. A heat transfer element for use in heating of electronic or electric equipments which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

8. A heat transfer element according to claim 7, wherein the heat transfer element is the heating element of a steam washing machine.

9. A heat transfer element according to claim 7, wherein the heat transfer element is the heating element of a heating system of a drying machine.

10. A heat transfer element according to claim 7, wherein the heat transfer element is a heating radiator.

11. A heat transfer element according to claim 7, wherein the heat transfer element is the heating element of a heater.

12. A heat transfer element according to claim 7, wherein the heat transfer element is the heating element of a fan oven.

13. A heat transfer element for use in heating of daily necessities which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

14. A heat transfer element according to claim 13, wherein the heat transfer element is the heating element of an electric water heater.

15. A heat transfer element according to claim 13, wherein the heat transfer element is the heating element of a radiator.

16. A heat transfer element according to claim 13, wherein the heat transfer element is the heating element of an electric heater.

17. A heat transfer element according to claim 13, wherein the heat transfer element is the heating element of a kettle.

18. A heat transfer element according to claim 13, wherein the heat transfer element is the heating element of a Chinese hot pot.

19. A heat transfer element according to claim 13, wherein the heat transfer element is the heating element of a grill.

20. A heat transfer element according to claim 13, wherein the heat transfer element is the heating element of an electric iron.

21. A heat transfer element according to claim 13, wherein the heat transfer element is the heating element of a high performance dual-mode water boiler.

22. A heat transfer element for use in heating of a mechanical processing apparatus which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

23. A heat transfer element according to claim 22, wherein the heat transfer element is the heating element of a heat transfer rate injection molding screw rod.

24. A heat transfer element for use in heat recovery systems which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;

(10) A selected metal or Ammonium Dichromate ($MCr_2O_7$), 5.0–10.0%; where "M" is selected from the group consisting of potassium, sodium, silver, and ammonium;

(11) Strontium Chromate ($SrCrO_4$), 0.5–1.0%; and

(12) Silver Dichromate ($Ag_2Cr_2O_7$), 0.5–1.0%.

25. A heat transfer element according to claim 24, wherein the heat transfer element is the heating element of a high heat transfer rate air pre-heater.

26. A heat transfer element according to claim 24, wherein the heat transfer element is the heating element of a high heat transfer rate air pre-heater in a coke furnace.

27. A heat transfer element according to claim 24, wherein the heat transfer element is the heating element of an integrated inorganic high heat transfer air pre-heater in a blast furnace.

28. A heat transfer element according to claim 24, wherein the heat transfer element is the heating element of a high heat transfer rate horizontal blast air pre-heater in a chemical fertilizer manufacturing system.

29. A heat transfer element according to claim 24, wherein the heat transfer element is the heating element of a high heat transfer rate horizontal blast air pre-heater in a chemical fertilizer manufacturing system with a steam-water separator.

30. A heat transfer element according to claim 24, wherein the heat transfer element is the heating element of an inorganic high heat transfer rate up and down-route gas horizontal symmetric afterheat boiler.

31. A heat transfer element according to claim 24, wherein the heat transfer element is the heating element of an inorganic high heat transfer rate up and down-route gas horizontal symmetric afterheat boiler with a steam-water separator.

32. A heat transfer element according to claim 24, wherein the heat transfer element is the heating element of a high heat transfer rate vertical eccentric blast afterheat boiler in a chemical fertilizer manufacturing system.

33. A heat transfer element according to claim 24, wherein the heat transfer element is the heating element of a high heat transfer rate vertical blast eccentric afterheat boiler in a chemical fertilizer manufacturing system with a steam-water separator.

34. A heat transfer element according to claim 24, wherein the heat transfer element is the heating element of a high heat transfer rate symmetrical blast afterheat boiler in a chemical fertilizer manufacturing system.

35. A heat transfer element according to claim 24, wherein the heat transfer element is the heating element of a high heat transfer rate vertical blast symmetrical afterheat boiler in a chemical fertilizer manufacturing system with a steam-water separator.

36. A heat transfer element according to claim 24, wherein the heat transfer element is the heating element of an inorganic high heat transfer rate up and down-route gas vertical eccentric afterheat boiler.

37. A heat transfer element according to claim 24, wherein the heat transfer element is the heating element of an inorganic high heat transfer rate up and down-route gas vertical eccentric afterheat boiler with a steam-water separator.

38. A heat transfer element according to claim 24, wherein the heat transfer element is the heating element of an inorganic high heat transfer rate up and down-route gas vertical symmetrical afterheat boiler.

39. A heat transfer element according to claim 24, wherein the heat transfer element is the heating element of an afterheat boiler in the glass kiln.

40. A heat transfer element according to claim 24, wherein the heat transfer element is the heating element of a high heat transfer rate steam generator in the cement kiln.

41. A heat transfer element according to claim 24, wherein the heat transfer element is the heating element of a high heat transfer rate water heating system in the cement kiln.

42. A heat transfer element according to claim 24, wherein the heat transfer element is the heating element of a high heat transfer rate air dryer and heater in a ceramic kiln.

43. A heat transfer element according to claim 24, wherein the heat transfer element is the heating element of an afterheat boiler in the ship.

44. A heat transfer element according to claim 24, wherein the heat transfer element is the heating element of a car exhaust heater.

45. A heat transfer element according to claim 24, wherein the heat transfer element is the heating element of a high heat transfer rate seawater distiller for oceangoing vessels.

46. A heat transfer element according to claim 24, wherein the heat transfer element is the heating element of an inorganic high heat transfer rate up and down-route gas vertical symmetrical afterheat boiler with steam-water separator.

47. A heat transfer element according to claim 24, wherein the heat transfer element is the heating element of a high heat transfer rate horizontal afterheat boiler.

48. A heat transfer element according to claim 24, wherein the heat transfer element is the heating element of a high heat transfer rate eccentric afterheat boiler.

49. A heat transfer element according to claim 24, wherein the heat transfer element is the heating element of a high heat transfer rate symmetrical afterheat boiler.

50. A heat transfer element according to claim 24, wherein the heat transfer element is the heating element of a high heat transfer rate electric boiler air pre-heater.

51. A heat transfer element according to claim 24, wherein the heat transfer element is the heating element of a high heat transfer rate power plant boiler fuel heating system.

52. A heat transfer element according to claim 24, wherein the heat transfer element is the heating element of a high heat transfer rate power plant boiler water heating system.

53. A heat transfer element according to claim 24, wherein the heat transfer element is the heating element of an afterheat water heater.

54. A heat transfer element according to claim 24, wherein the heat transfer element is the heating element of an air pre-heater.

55. A heat transfer element according to claim 24, wherein the heat transfer element is the heating element of a dual gas heater.

56. A heat transfer element according to claim 24, wherein the heat transfer element is the heating element of an afterheat boiler of the rotary kiln in magnesium plants.

57. A heat transfer element according to claim 24, wherein the heat transfer element is the heating element of an afterheat boiler of the reduction furnace in magnesium plants.

58. A heat transfer element according to claim 24, wherein the heat transfer element is the heating element of the afterheat boiler of a sintering machine.

59. A heat transfer element according to claim 24, wherein the heat transfer element is the heating element of the afterheat boiler of a coupling casting machine.

60. A heat transfer element according to claim 24, wherein the heat transfer element is the heating element of a heat recovery device for casting billet.

61. A heat transfer element according to claim 24, wherein the heat transfer element is the heating element of a heat recovery device for oil-firing industrial furnaces.

62. A heat transfer element according to claim 24, wherein the heat transfer element is the heating element of a steam generator for oil-firing industrial furnaces.

63. A heat transfer element according to claim 24, wherein the heat transfer element is the heating element of a heat recovery device for gas-firing industrial furnaces.

64. A heat transfer element according to claim 24, wherein the heat transfer element is the heating element of an afterheat steam generator for gas-firing industrial furnaces.

65. A heat transfer element according to claim 24, wherein the heat transfer element is the heating element of an energy cycling system in a dryer.

66. A heat transfer element according to claim 24, wherein the heat transfer element is the heating element of a heat recovery apparatus used in restaurants.

67. A heat transfer element according to claim 24, wherein the heat transfer element is the heating element of a high heat transfer rate air pre-heater of the propane de-asphalt furnace.

68. A heat transfer element according to claim 24, wherein the heat transfer element is the heating element of a high heat transfer rate air pre-heater of the molecular screen de-wax carrier furnace.

69. A heat transfer element according to claim 24, wherein the heat transfer element is the heating element of a high heat transfer rate blast air pre-heater in a chemical fertilizer manufacturing system.

70. A heat transfer element according to claim 24, wherein the heat transfer element is the heating element of an integrated high heat transfer air pre-heater in a platinum-resetting heater.

71. A heat transfer element according to claim 24, wherein the heat transfer element is the heating element of an air pre-heater of heat transfer Arene device constant depressurizing carrier furnace.

72. A heat transfer element according to claim 24, wherein the heat transfer element is the heating element of a heat recovery device on the continuous casting billet cold table of a continuous casting machine in the steel plant.

73. A heat transfer element according to claim 24, wherein the heat transfer element is the heating element of an air pre-heater in a glass kiln.

74. A heat transfer element according to claim 24, wherein the heat transfer element is the heating element of a high heat transfer rate air pre-heater installed on the top of a crude heater.

75. A heat transfer element according to claim 24, wherein the heat transfer element is the heating element of a high heat transfer rate air pre-heater of a steam instilling boiler.

76. A heat transfer element according to claim 24, wherein the heat transfer element is the heating element of a high heat transfer rate water pre-heater of a steam instilling boiler.

77. A heat transfer element according to claim 24, wherein the heat transfer element is the heating element of an afterheat boiler in a heating furnace.

78. A heat transfer element according to claim 24, wherein the heat transfer element is the heating element of a gas sensible heat device using a coke furnace lift pipe with an high heat transfer element.

79. A heat transfer element according to claim 24, wherein the heat transfer element is the heating element of a heat transfer anti-dew-point corrosion air pre-heater.

80. A heat transfer element according to claim 24, wherein the heat transfer element is the heating element of a soft water boiler.

81. A heat transfer element according to claim 24, wherein the heat transfer element is the heating element of a high heat transfer rate bridge double channel afterheat recovery device.

82. A heat transfer element according to claim 24, wherein the heat transfer element is the heating element of a vortex scroll heat exchanger.

83. A heat transfer element according to claim 24, wherein the heat transfer element is the heating element of a high heat transfer rate air-air/air-liquid combined heat exchanger.

84. A heat transfer element according to claim 24, wherein the heat transfer element is the heating element of a high heat transfer rate afterheat processing apparatus in synthetic ammonia making technique.

85. A heat transfer element according to claim 24, wherein the heat transfer element is the heating element of a sulfur trioxide heat exchanger.

86. A heat transfer element according to claim 24, wherein the heat transfer element is the heating element of a total counter flow high heat transfer heat exchanger.

87. A heat transfer element according to claim 24, wherein the heat transfer element is the heating element of a high heat transfer rate heat recovery apparatus in dry coke technique.

88. A heat transfer element according to claim 24, wherein the heat transfer element is the heating element of an integrated high heat transfer air pre-heater in a furfural refiner.

89. A heat transfer element according to claim 24, wherein the heat transfer element is the heating element of an integrated high heat transfer joint air pre-heater in a heating furnace with constant depressurizing device in refinery.

90. A heat transfer element for use in heating of energy collecting systems which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;

(2) Boron Oxide (B2O3), 1.0–2.0%;

(3) Calcium Dichromate (CaCr2O7), 1.0–2.0%;

(4) Magnesium Dichromate (MgCr2O7.6H2O), 10.0–20.0%;

(5) Potassium Dichromate (K2Cr2O7), 40.0–80.0%;

(6) Sodium Dichromate (Na2Cr2O7), 10.0–20.0%;

(7) Beryllium Oxide (BeO), 0.05–0.10%;

(8) Titanium Diboride (TiB2), 0.5–1.0%;

(9) Potassium Peroxide (K2O2), 0.05–0.10%;

(10) A selected metal or Ammonium Dichromate (MCr2O7), 5.0–10.0%; where "M" is selected from the group consisting of potassium, sodium, silver, and ammonium;

(11) Strontium Chromate (SrCrO4), 0.5–1.0%; and

(12) Silver Dichromate (Ag2Cr2O7), 0.5–1.0%.

91. A heat transfer element according to claim 90, wherein the heat transfer element is the heating element of a solar water heater.

92. A heat transfer element according to claim 90, wherein the heat transfer element is the heating element of a solar hot blast tool.

93. A heat transfer element according to claim 90, wherein the heat transfer element is the heating element of a solar energy collector tube.

94. A heat transfer element according to claim 90, wherein the heat transfer element is the heating element of a solar energy collector in plate form.

95. A heat transfer element according to claim 90, wherein the heat transfer element is the heating element of a geothermal collecting equipment.

96. A heat transfer element according to claim 90, wherein the heat transfer element is the heating element of a geothermal steam boiler.

97. A heat transfer element according to claim 90, wherein the heat transfer element is the heating element of a geothermal water temperature exchanger.

98. A heat transfer element according to claim 90, wherein the heat transfer element is the heating element of a geothermal water-air heater.

99. A heat transfer element according to claim 90, wherein the heat transfer element is the heating element of a high heat transfer rate geothermal power generating system.

100. A heat transfer element according to claim 90, wherein the heat transfer element is the heating element of a high heat transfer low temperature geothermal heating system.

101. A heat transfer element according to claim 90, wherein the heat transfer element is the heating element of a high heat transfer rate solar energy collecting building heating system.

102. A heat transfer element according to claim 90, wherein the heat transfer element is the heating element of a high heat transfer rate solar water heater to be installed on the balcony.

103. A heat transfer element according to claim 90, wherein the heat transfer element is the heating element of a high heat transfer rate plate form solar water heater.

104. A heat transfer element according to claim 90, wherein the heat transfer element is the heating element of a heat transfer medium heat reservoir.

105. A heat transfer element according to claim 90, wherein the heat transfer element is the heating element of a high heat transfer rate solar energy collector plate.

106. A heat transfer element according to claim 7, wherein the heat transfer element is the heating element of a high heat transfer rate electric boiler air heater.

107. A heat transfer element according to claim 7, wherein the heat transfer element is the heating element of an electrothermal high heat transfer rate heating reactor.

108. A heat transfer element according to claim 7, wherein the heat transfer element is the heating element of a steam 1 high heat transfer rate heating reactor.

109. A heat transfer element according to claim 7, wherein the heat transfer element is the heating element of a homogeneous temperature distribution epitaxial furnace.

110. A heat transfer element according to claim 7, wherein the heat transfer element is the heating element of an electrothermal water heating system.

111. A heat transfer element according to claim 7, wherein the heat transfer element is the heating element of a high heat transfer rate thermal sealer for plastic package.

112. A heat transfer element according to claim 7, wherein the heat transfer element is the heating element of a high heat transfer rate gas-firing boiler.

113. A heat transfer element according to claim 7, wherein the heat transfer element is the heating element of a high heat transfer rate gas-firing water heater.

114. A heat transfer element for use in heating of civil engineering facilities and structures which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

115. A heat transfer element according to claim 114, wherein the heat transfer element is the heating element of a pavement heating system.

116. A heat transfer element according to claim 114, wherein the heat transfer element is the heating element of an airport runway heating system.

117. A heat transfer element according to claim 114, wherein the heat transfer element is the heating element of a solar energy pool heating system.

118. A heat transfer element according to claim 114, wherein the heat transfer element is the heating element of a cul-de-sac heater.

119. A heat transfer element for use in heating of drying apparatus which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

120. A heat transfer element according to claim 119, wherein the heat transfer element is the heating element of an electric dryer.

121. A heat transfer element according to claim 119, wherein the heat transfer element is the heating element of an oil-firing hot air furnace.

122. A heat transfer element according to claim 119, wherein the heat transfer element is the heating element of a gas-firing hot air furnace.

123. A heat transfer element according to claim 119, wherein the heat transfer element is the heating element of a coal-firing hot air furnace.

124. A heat transfer element according to claim 119, wherein the heat transfer element is the heating element of a paper dryer.

125. A heat transfer element according to claim 119, wherein the heat transfer element is the heating element of a pencil wood drying apparatus.

126. A heat transfer element according to claim 119, wherein the heat transfer element is the heating element of a timber dryer.

127. A heat transfer element according to claim 119, wherein the heat transfer element is the heating element of a spraying dryer.

128. A heat transfer element according to claim 119, wherein the heat transfer element is the heating element of a turret dryer.

129. A heat transfer element according to claim 119, wherein the heat transfer element is the heating element of a hot blast dryer.

130. A heat transfer element for use in heating of chemical engineering apparatus which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

131. A heat transfer element according to claim 130, wherein the heat transfer element is the heating element of a crude oil heater.

132. A heat transfer element according to claim 130, wherein the heat transfer element is the heating element of an oil reservoir heater.

133. A heat transfer element according to claim 130, wherein the heat transfer element is the heating element of a crude heater of oil tank at the entrance of the oil well.

134. A heat transfer element according to claim 130, wherein the heat transfer element is the heating element of a crude oil heater of onboard oil can.

135. A heat transfer element according to claim 130, wherein the heat transfer element is the heating element of a vehicle oil tank heater.

136. A heat transfer element according to claim 130, wherein the heat transfer element is the heating element of an inner heat exchange heater at the entrance of the oil well.

137. A heat transfer element according to claim 130, wherein the heat transfer element is the heating element of electric-thermal crude oil heating apparatus.

138. A heat transfer element according to claim 130, wherein the heat transfer element is the heating element of an endothermic chemical reactor.

139. A heat transfer element according to claim 130, wherein the heat transfer element is the heating element of a thermostatic bathtub.

140. A heat transfer element according to claim 130, wherein the heat transfer element is the heating element of a crude oil heating furnace for oil pipes.

141. A heat transfer element according to claim 130, wherein the heat transfer element is the heating element of an endothermic chemical reactor vessel.

142. A heat transfer element according to claim 130, wherein the heat transfer element is the heating element of a crude oil heater for heavy oil reservoirs.

143. A heat transfer element for use in agriculture & fishery which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

144. A heat transfer element according to claim 143, wherein the heat transfer element is the heat-dissipating element of a heat-dissipating apparatus preventing spontaneous ignition and heating.

145. A heat transfer element for use in computers and peripherals which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;

(10) A selected metal or Ammonium Dichromate (MCr2O7), 5.0–10.0%; where “M” is selected from the group consisting of potassium, sodium, silver, and ammonium;

(11) Strontium Chromate (SrCrO4), 0.5–1.0%; and

(12) Silver Dichromate (Ag2Cr2O7), 0.5–1.0%.

146. A heat transfer element according to claim 145, wherein the heat transfer element is the serpentine-shape heat-dissipating element of CPU coolers for desktop computers.

147. A heat transfer element according to claim 145, wherein the heat transfer element is the plate heat-dissipating element of CPU coolers for desktop computers.

148. A heat transfer element according to claim 145, wherein the heat transfer element is the external heat-dissipating element of CPU coolers for desktop computers.

149. A heat transfer element according to claim 145, wherein the heat transfer element is the heat-dissipating element of the plate CPU cooler of laptop computer under the keyboard.

150. A heat transfer element according to claim 145, wherein the heat transfer element is the heat-dissipating element of the plate CPU cooler of laptop computer behind the LCD display.

151. A heat transfer element according to claim 145, wherein the heat transfer element is the heat-dissipating element of an IC cooler.

152. A heat transfer element according to claim 145, wherein the heat transfer element is the heat-dissipating element of a semiconductor cooler.

153. A heat transfer element according to claim 145, wherein the heat transfer element is the heat-dissipating element of an IC carrying cooler for laptop computer CPU.

154. A heat transfer element according to claim 145, wherein the heat transfer element is the heat-dissipating element of the plate CPU cooling apparatus of laptop computer in the keyboard.

155. A heat transfer element according to claim 145, wherein the heat transfer element is the heat-dissipating element of a chipset-cooling device.

156. A heat transfer element according to claim 145, wherein the heat transfer element is the heat-dissipating element of an EMI-reducing cooling device.

157. A heat transfer element according to claim 7, wherein the heat transfer element is the heat-dissipating element of a top-mounted sealed radiator for electronic controllers.

158. A heat transfer element according to claim 7, wherein the heat transfer element is the heat-dissipating element of a wall-mounted sealed radiator for electronic controllers.

159. A heat transfer element according to claim 7, wherein the heat transfer element is the heat-dissipating element of an embedded sealed radiator for electronic controllers.

160. A heat transfer element according to claim 7, wherein the heat transfer element is the heat-dissipating element of a sealed radiator for industrial displays.

161. A heat transfer element according to claim 7, wherein the heat transfer element is the heat-dissipating element of a sealed cooler for television sets.

162. A heat transfer element according to claim 7, wherein the heat transfer element is the heat-dissipating element of a silicon-controlled device radiator.

163. A heat transfer element according to claim 7, wherein the heat transfer element is the heat-dissipating element of a radiator for thyristers.

164. A heat transfer element according to claim 7, wherein the heat transfer element is the heat-dissipating element of a compressed intermediate stage cooler.

165. A heat transfer element according to claim 7, wherein the heat transfer element is the heat-dissipating element of a large power cooler of the silicon controlled device in an explosion-proof casing.

166. A heat transfer element according to claim 7, wherein the heat transfer element is the heat-dissipating element of a cooler for power modules.

167. A heat transfer element according to claim 7, wherein the heat transfer element is the heat-dissipating element of a radiator for storage battery.

168. A heat transfer element according to claim 7, wherein the heat transfer element is the heat-dissipating element of a thermoelectric cooler.

169. A heat transfer element according to claim 7, wherein the heat transfer element is the heat-dissipating element of a refrigerator radiator.

170. A heat transfer element according to claim 7, wherein the heat transfer element is the heat-dissipating element of a projector heat dissipating system.

171. A heat transfer element according to claim 7, wherein the heat transfer element is the heat-dissipating element of a cooling plate radiator.

172. A heat transfer element according to claim 7, wherein the heat transfer element is the heat-dissipating element of a scanner cooling system.

173. A heat transfer element according to claim 7, wherein the heat transfer element is the heat-dissipating element of a waste heat air conditioning system.

174. A heat transfer element for use in heat dissipation in medical treatment apparatus which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;

(2) Boron Oxide (B2O3), 1.0–2.0%;

(3) Calcium Dichromate (CaCr2O7), 1.0–2.0%;

(4) Magnesium Dichromate (MgCr2O7.6H2O), 10.0–20.0%;

(5) Potassium Dichromate (K2Cr2O7), 40.0–80.0%;

(6) Sodium Dichromate (Na2Cr2O7), 10.0–20.0%;

(7) Beryllium Oxide (BeO), 0.05–0.10%;

(8) Titanium Diboride (TiB2), 0.5–1.0%;

(9) Potassium Peroxide (K2O2), 0.05–0.10%;

(10) A selected metal or Ammonium Dichromate (MCr2O7), 5.0–10.0%; where “M” is selected from the group consisting of potassium, sodium, silver, and ammonium;

(11) Strontium Chromate (SrCrO4), 0.5–1.0%; and

(12) Silver Dichromate (Ag2Cr2O7), 0.5–1.0%.

175. A heat transfer element according to claim 174, wherein the heat transfer element is the heat-dissipating element of an anti-dozing cold hat.

176. A heat transfer element according to claim 174, wherein the heat transfer element is the heat-dissipating element of a thermoelectric cooling beauty device.

177. A heat transfer element according to claim 13, wherein the heat transfer element is the heat-dissipating element of a drink cooling stick.

178. A heat transfer element according to claim 13, wherein the heat transfer element is the heat-dissipating element of a cooling cup.

179. A heat transfer element according to claim 13, wherein the heat transfer element is the heat-dissipating element of a lamp radiator.

180. A heat transfer element according to claim 13, wherein the heat transfer element is the heat-dissipating element of a food container.

181. A heat transfer element according to claim 13, wherein the heat transfer element is the heat-dissipating element of a thermoelectric cooling food container.

182. A heat transfer element according to claim 13, wherein the heat transfer element is the heat-dissipating element of a drink cooler.

183. A heat transfer element according to claim 22, wherein the heat transfer element is a machine center guiding track.

184. A heat transfer element according to claim 22, wherein the heat transfer element is a machine center main pivot.

185. A heat transfer element according to claim 22, wherein the heat transfer element is a drill.

186. A heat transfer element according to claim 22, wherein the heat transfer element is a cutting tool.

187. A heat transfer element according to claim 22, wherein the heat transfer element is the heating element of an injection mold.

188. A heat transfer element according to claim 22, wherein the heat transfer element is a high-polymer extruding machine screw.

189. A heat transfer element according to claim 22, wherein the heat transfer element is a mining drill.

190. A heat transfer element for use in heat dissipation in an audio-visual equipment which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

191. A heat transfer element according to claim 190, wherein the heat transfer element is the heat-dissipating element of a sound reproducing output system.

192. A heat transfer element according to claim 191, wherein the heat transfer element is the heat-dissipating element of an output system.

193. A heat transfer element according to claim 192, wherein the heat transfer element comes in a segment or plate type.

194. A heat transfer element according to claim 191, wherein the heat transfer element is the heat-dissipating element of a transistor in a power amplifier of a sound reproducing system.

195. A heat transfer element according to claim 194, wherein the heat transfer element comes in a tube or plate type.

196. A heat transfer element for use in heat dissipation in electric mechanical equipments which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

197. A heat transfer element according to claim 196, wherein the heat transfer element is the heat-dissipating element of an exhaust stream condenser of a power plant boiler.

198. A heat transfer element according to claim 196, wherein the heat transfer element is the heat-dissipating element of a transformer radiator.

199. A heat transfer element according to claim 196, wherein the heat transfer element is the heat-dissipating element of a magnetic core of a transformer.

200. A heat transfer element according to claim 196, wherein the heat transfer element is the heat-dissipating element of a heat dissipating system of an electrical apparatus.

201. A heat transfer element according to claim 196, wherein the heat transfer element is the heat-dissipating element of a tri-phase asynchronous velocity adjustable motor.

202. A heat transfer element according to claim 196, wherein the heat transfer element is the heat-dissipating element of an intensive magnetic oil cooler.

203. A heat transfer element according to claim 196, wherein the heat transfer element is the heat-dissipating element of an X-ray machine cooler.

204. A heat transfer element according to claim 196, wherein the heat transfer element is the heat-dissipating element of a heat dissipating system of a motor radiator.

205. A heat transfer element according to claim 196, wherein the heat transfer element is the heat-dissipating element of a hydraulic oil radiator of a hydraulic system.

206. A heat transfer element according to claim 196, wherein the heat transfer element is the heat-dissipating element of a heat dissipating system of a transmission shaft system.

207. A heat transfer element according to claim 196, wherein the heat transfer element is the heat-dissipating element of a cooler for the pivot of machines.

208. A heat transfer element according to claim 196, wherein the heat transfer element is the heat-dissipating element in welding for part assembly.

209. A heat transfer element according to claim 196, wherein the heat transfer element is the heat-dissipating element of a cooling system of a pump.

210. A heat transfer element according to claim 196, wherein the heat transfer element is the heat-dissipating element of an electrothermal reactor cooling system.

211. A heat transfer element according to claim 196, wherein the heat transfer element is the heat-dissipating element of a steam reactor cooling system.

212. A heat transfer element according to claim 196, wherein the heat transfer element is the heat-dissipating element of a high-current off-phase close bus air-cooler.

213. A heat transfer element according to claim 196, wherein the heat transfer element is the heat-dissipating element of a cooling system of heavy machine linkage parts.

214. A heat transfer element according to claim 196, wherein the heat transfer element is the heat-dissipating element of a radiator of the heavy machine braking system.

215. A heat transfer element according to claim 196, wherein the heat transfer element is the heat-dissipating element of a cooling system of a diesel engine.

216. A heat transfer element according to claim 196, wherein the heat transfer element is the heat-dissipating element of a bearing cooling system.

217. A heat transfer element according to claim 196, wherein the heat transfer element is the heat-dissipating element of a cooling system of a turbo charger.

218. A heat transfer element according to claim 196, wherein the heat transfer element is the heat-dissipating element of a cooling system of a gasoline engine.

219. A heat transfer element according to claim 196, wherein the heat transfer element is the heat-dissipating element of a cooler for car radiators.

220. A heat transfer element according to claim 196, wherein the heat transfer element is the heat-dissipating element of a heat absorber and dissipater of energy storage.

221. A heat transfer element according to claim 196, wherein the heat transfer element is the heat-dissipating element of a stirring type heat dissipating device.

222. A heat transfer element according to claim 196, wherein the heat transfer element is the heat-dissipating element of a pressurized gas water cooler.

223. A heat transfer element according to claim 196, wherein the heat transfer element is the heating element of a heat intake.

224. A heat transfer element according to claim 196, wherein the heat transfer element is the heat-dissipating element of an amorphous material preparation apparatus.

225. A heat transfer element according to claim 114, wherein the heat transfer element is a furnace arc hanger of a boiler.

226. A heat transfer element according to claim 130, wherein the heat transfer element is the heat-dissipating element of an oil tank cooler.

227. A heat transfer element according to claim 130, wherein the heat transfer element is the heat-dissipating element of a plate radiator.

228. A heat transfer element according to claim 130, wherein the heat transfer element is the heat-dissipating element of a bulk cement cooler.

229. A heat transfer element according to claim 143, wherein the heat transfer element is the heat exchange element of a heat circulation system.

230. A heat transfer element according to claim 143, wherein the heat transfer element is the heat exchange element of a heat transfer apparatus for keeping the room temperature constant.

231. A heat transfer element according to claim 143, wherein the heat transfer element is the heat exchange element of a geothermal collection system.

232. A heat transfer element according to claim 143, wherein the heat transfer element is the heat exchange element of agricultural plastic canopies.

233. A heat transfer element according to claim 174, wherein the heat transfer element is the heating or heat-dissipating element of an acupuncture instrument.

234. A heat transfer element according to claim 196, wherein the heat transfer element is the heat exchange element of a target furnace.

235. A heat transfer element according to claim 196, wherein the heat transfer element is the heat exchange element of an industrial exhaust recycling apparatus.

236. A heat transfer element according to claim 196, wherein the heat transfer element is the heat exchange element of a vibrating dust removing heat exchanger.

237. A heat transfer element for use in heat exchange in a thermostatic equipment which is characterized in that it comprises a high heat transfer medium, wherein the high heat transfer medium is formed by dissolving the following compounds in water to produce a mixture, and drying the resulting mixture to produce said heat transfer medium product with said compounds in the following weight percentages:

(1) Cobaltic Oxide (Co2O3), 0.5–1.0%;
(2) Boron Oxide (B2O3), 1.0–2.0%;
(3) Calcium Dichromate (CaCr2O7), 1.0–2.0%;
(4) Magnesium Dichromate (MgCr2O7.6H2O), 10.0–20.0%;
(5) Potassium Dichromate (K2Cr2O7), 40.0–80.0%;
(6) Sodium Dichromate (Na2Cr2O7), 10.0–20.0%;
(7) Beryllium Oxide (BeO), 0.05–0.10%;
(8) Titanium Diboride (TiB2), 0.5–1.0%;
(9) Potassium Peroxide (K2O2), 0.05–0.10%;
(10) A selected metal or Ammonium Dichromate (MCr2O7), 5.0–10.0%; where "M" is selected from the group consisting of potassium, sodium, silver, and ammonium;
(11) Strontium Chromate (SrCrO4), 0.5–1.0%; and
(12) Silver Dichromate (Ag2Cr2O7), 0.5–1.0%.

238. A heat transfer element according to claim 237, wherein the heat transfer element is the heat exchange element of an artificial crystal cultivation thermostatic box.

239. A heat transfer element according to claim 237, wherein the heat transfer element is the heat exchange element of a ventilation system.

240. A heat transfer element according to claim 237, wherein the heat transfer element is the heat exchange element of an air cleaner.

241. A heat transfer element according to claim 237, wherein the heat transfer element is the heat exchange element of an indoor air exchanger.

242. A heat transfer element according to claim 237, wherein the heat transfer element is the heat exchange element of an air-conditioning system.

243. A heat transfer element according to claim 237, wherein the heat transfer element is the heat exchange element of the ventilator of an air-conditioning system.

244. A heat transfer element according to claim 237, wherein the heat transfer element is the heat exchange element of a thermostatic system.

245. A heat transfer element according to claim 237, wherein the heat transfer element is the heat exchange element of a thermostatic controller of a fermentation container.

246. A heat transfer element according to claim 237, wherein the heat transfer element is the heating element of thermostatic equipment.

247. A heat transfer element according to claim 237, wherein the heat transfer element is the heating element of a thermostatic device for a biochemical reaction.

248. A heat transfer element according to claim 237, wherein the heat transfer element is the heating element of a geothermal collection system.

249. A heat transfer element according to claim 237, wherein the heat transfer element is the heating element of an urban heating system.

250. A heat transfer element according to claim 237, wherein the heat transfer element is the heating element of a pavement snow-melting system.

251. A heat transfer element according to claim 237, wherein the heat transfer element is the heating element of a thermostatic apparatus.

252. A heat transfer element according to claim 237, wherein the heat transfer element is the heating element of a quartz formation thermostatic apparatus.

253. A heat transfer element according to claim 237, wherein the heat transfer element is the heat exchange element of a thermostatic apparatus.

254. A heat transfer element according to claim 237, wherein the heat transfer element is the heat exchange element of a satellite thermostatic apparatus.

255. A heat transfer element according to claim 237, wherein the heat transfer element is the heat exchange element of a thermostatic apparatus.

256. A heat transfer element according to claim 237, wherein the heat transfer element is the heat exchange element of an air conditioner.

257. A heat transfer element according to claim 237, wherein the heat transfer element is the heat exchange element of an integrated power-saving air conditioner.

258. A heat transfer element according to claim 130, wherein the heat transfer element is the heat exchange element of a thermostatic apparatus for petroleum chemical equipments.

259. A heat transfer element according to claim 130, wherein the heat transfer element is the heat exchange element of a thermostatic cracking furnace.

260. A heat transfer element system according to claim 143, wherein the system comprises the heat transfer element for heating of a plant heating system.

261. A heat transfer element system according to claim 143, wherein the system comprises the heating element of the solar energy water heater in a plant heating system.

262. A heat transfer element system according to claim 143, wherein the system comprises the heating element of the geothermal water heater in a plants heating system.

263. A heat transfer element system according to claim 143, wherein the system comprises the heat-dissipating element of a plants heating system.

264. A heat transfer element system according to claim 143, wherein the system comprises the heat-dissipating element of the air radiator in a plants heating system.

265. A heat transfer element system according to claim 143, wherein the system comprises the heat transfer element for heating of a fishery cultivation heating system.

266. A heat transfer element system according to claim 265, wherein the system comprises the heating element of the solar energy water heater in a fishery cultivation heating system.

267. A heat transfer element system according to claim 265, wherein the system comprises the heating element of the geothermal water heater in a fishery cultivation heating system.

268. A heat transfer element system according to claim 265, wherein the system comprises the heating element of the pond heater in a fishery cultivation heating system.

269. A heat transfer element system according to claim 7, wherein the system comprises the heat exchange element of a dehydrating apparatus.

270. A heat transfer element system according to claim 13, wherein the system is the heat exchange element of a geothermal energy refrigerating system.

271. A heat transfer element according to claim 2, wherein the heat transfer element is a heating element.

272. A heat transfer element according to claim 2, wherein the heat transfer element is a heat-dissipating element.

273. A heat transfer element according to claim 2, wherein the heat transfer element is a heat exchange element.

274. A heat transfer element according to claim 3, wherein the heat transfer element is a heating element.

275. A heat transfer element according to claim 3, wherein the heat transfer element is a heat-dissipating element.

276. A heat transfer element according to claim 3, wherein the heat transfer element is a heat exchange element.

* * * * *